United States Patent [19]

Sharrit et al.

[11] Patent Number: 4,661,767

[45] Date of Patent: Apr. 28, 1987

[54] VECTOR NETWORK ANALYZER WITH INTEGRAL PROCESSOR

[75] Inventors: David D. Sharrit; Michael J. Neering, both of Santa Rosa; S. Bruce Donecker, Sebastopol; Mark D. Roos, San Carlos; Wayne C. Cannon, Forestville; John T. Barr, IV, Santa Rosa, all of Calif.

[73] Assignee: Hewlett-Packard Company, Palo Alto, Calif.

[21] Appl. No.: 569,081

[22] Filed: Jan. 9, 1984

[51] Int. Cl.[4] ........................ G01R 23/16; G06F 15/34

[52] U.S. Cl. ................................ 324/57 R; 324/77 C; 364/482

[58] Field of Search ............... 364/483, 482, 484, 485; 324/77 C, 77 B, 77 CS, 57 R, 58 A, 58 B, 58 R, 58.5 A, 58.5 B, 58.5 C, 58.5 R

[56] References Cited

U.S. PATENT DOCUMENTS

| | | | |
|---|---|---|---|
| 4,093,989 | 6/1978 | Flink | 324/77 B |
| 4,244,024 | 1/1981 | Marzalek et al. | 364/485 |
| 4,257,104 | 3/1981 | Martin | 324/77 B |

FOREIGN PATENT DOCUMENTS

| | | |
|---|---|---|
| 848088 | 4/1957 | United Kingdom . |
| 1147154 | 3/1966 | United Kingdom . |
| 1428776 | 3/1976 | United Kingdom . |
| 1429858 | 3/1976 | United Kingdom . |
| 1457747 | 12/1976 | United Kingdom . |
| 1596377 | 8/1981 | United Kingdom . |

OTHER PUBLICATIONS

Theory and Application of Digital Signal Processing, by Lawrence R. Rabiner and Bernard Gold, pp. 393–398, 1975.

Automatic Network Analyzer 8542, Section IV Fundamentals, Hewlett-Packard Operating and Service Manual, Oct. 1969.

Tektronix Catalog–1976 edition–p. 190.

Donecker: "Determining the Measurement Accuracy of the hp 8510 . . . ", HP RF & Microwave Symposium–Oct. '84.

*Primary Examiner*—Reinhard J. Eisenzopf
*Assistant Examiner*—Jose M. Solis
*Attorney, Agent, or Firm*—Jeffery B. Fromm; Joseph H. Smith

[57] ABSTRACT

A precision vector network analyzer which is suitable for a wide range of applications including both laboratory and automated production measurements and testing is disclosed. New measurement capabilities, greater ease of use, and nearly complete automation are provided. Contributions include fully coordinated communications between subsystem modules; real time, two channel, precision vector measurements with complete, internal error correction; wide frequency capability from RF to millimeter bands; combined time and frequency domain analysis and display; measurements either in the swept or step frequency modes; and user definable test functions and calibration device sets.

4 Claims, 411 Drawing Figures

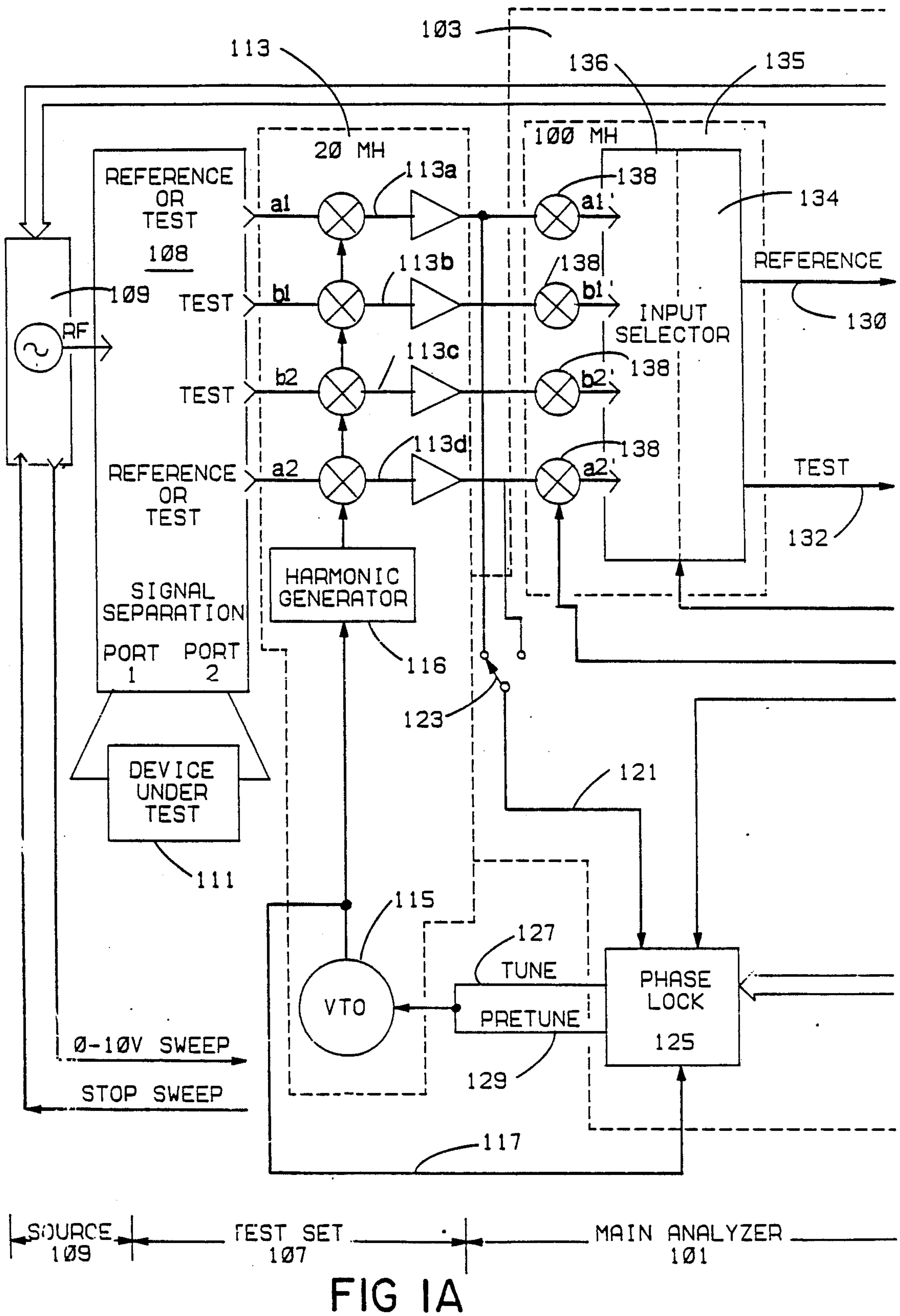
FIG IA

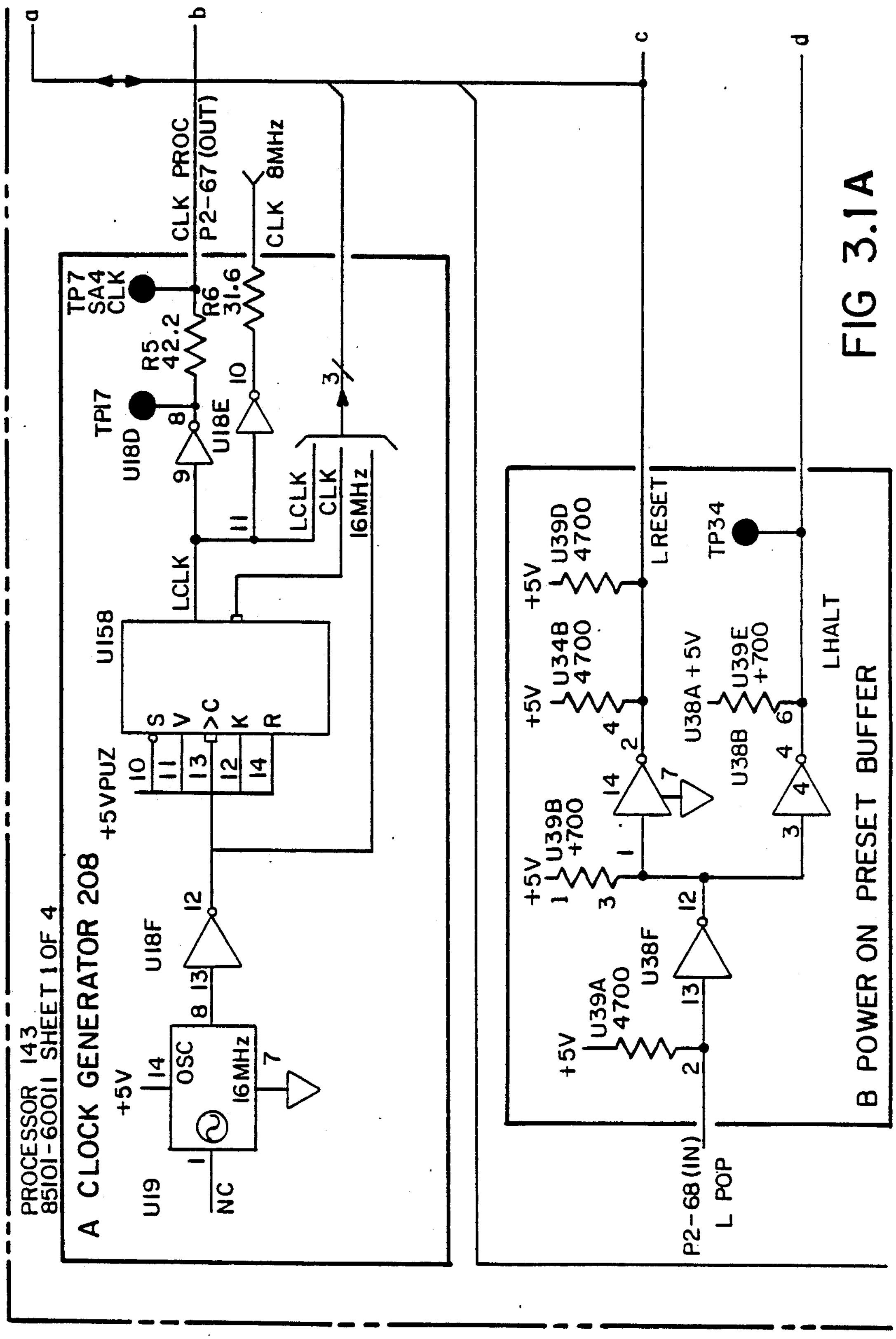
FIG 3.1A

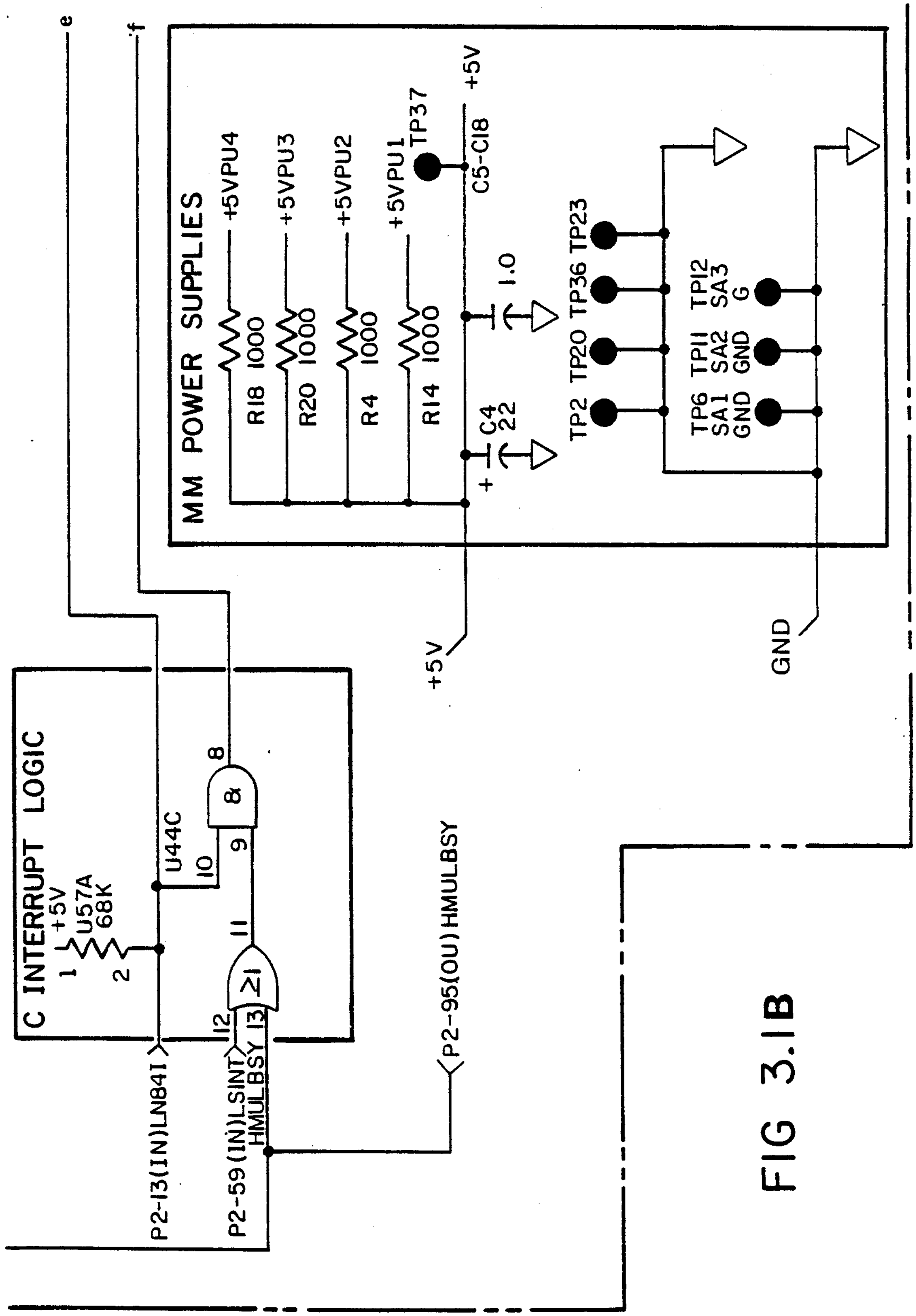
FIG 3.1B

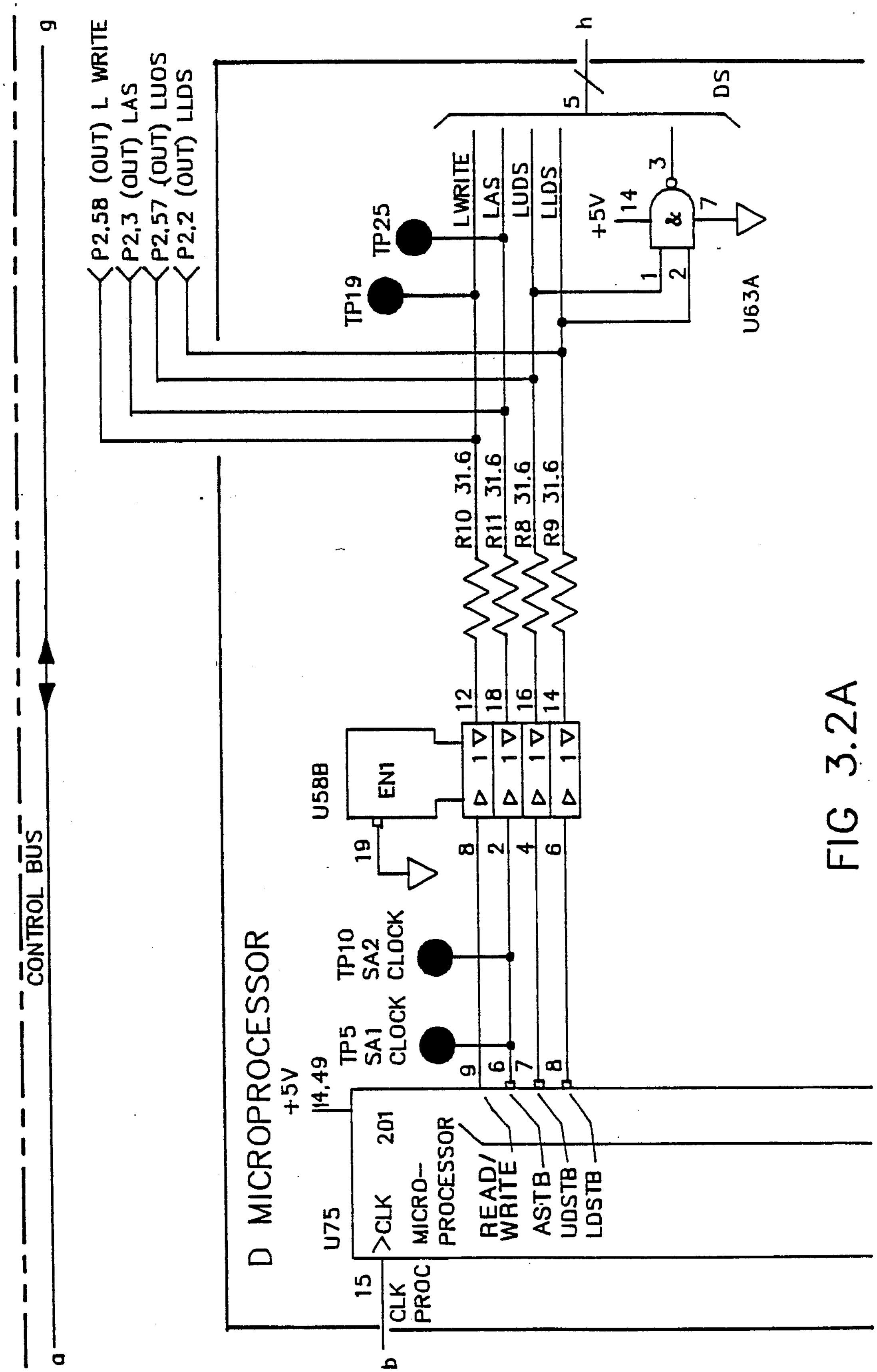
FIG 3.2A

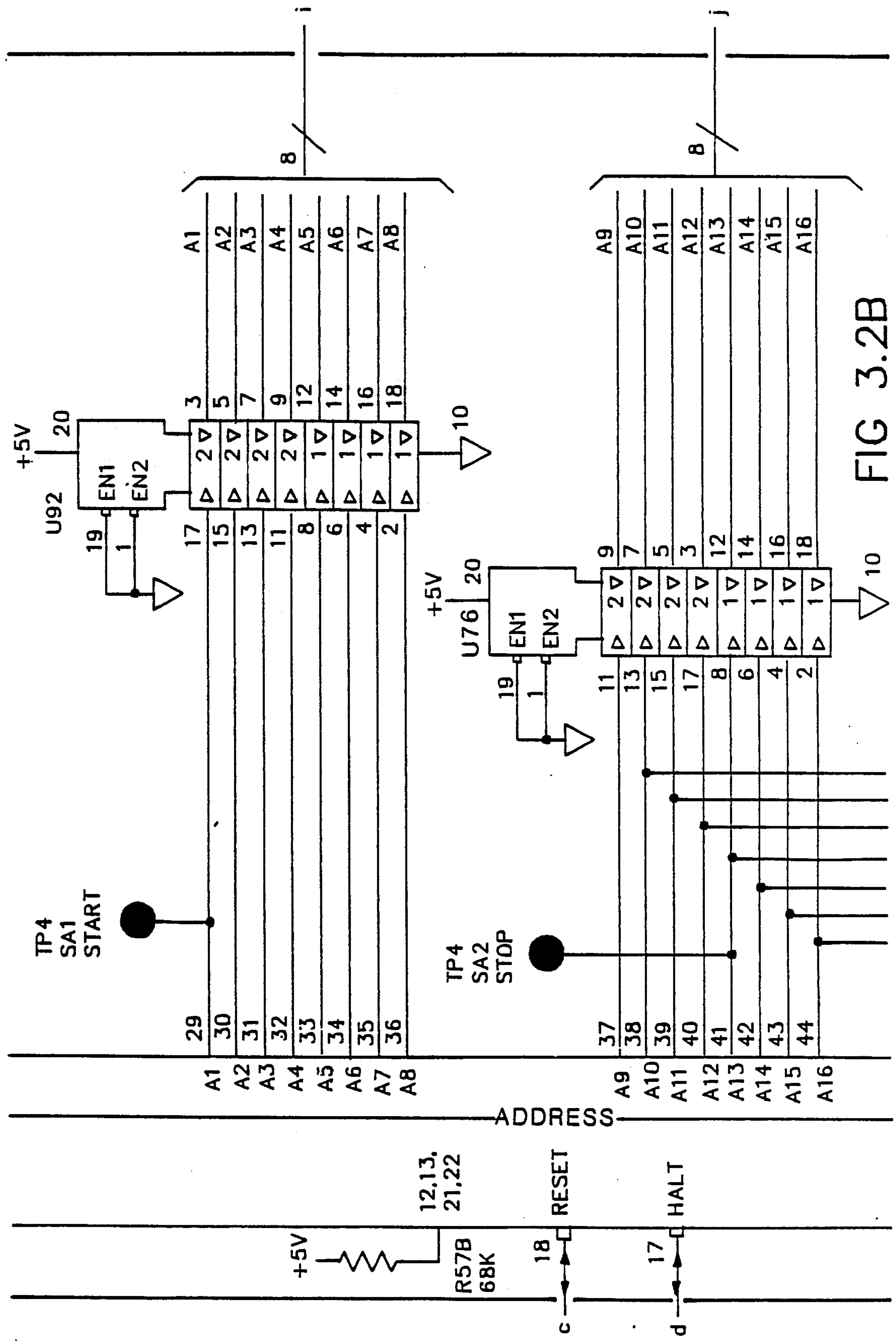
FIG 3.2B

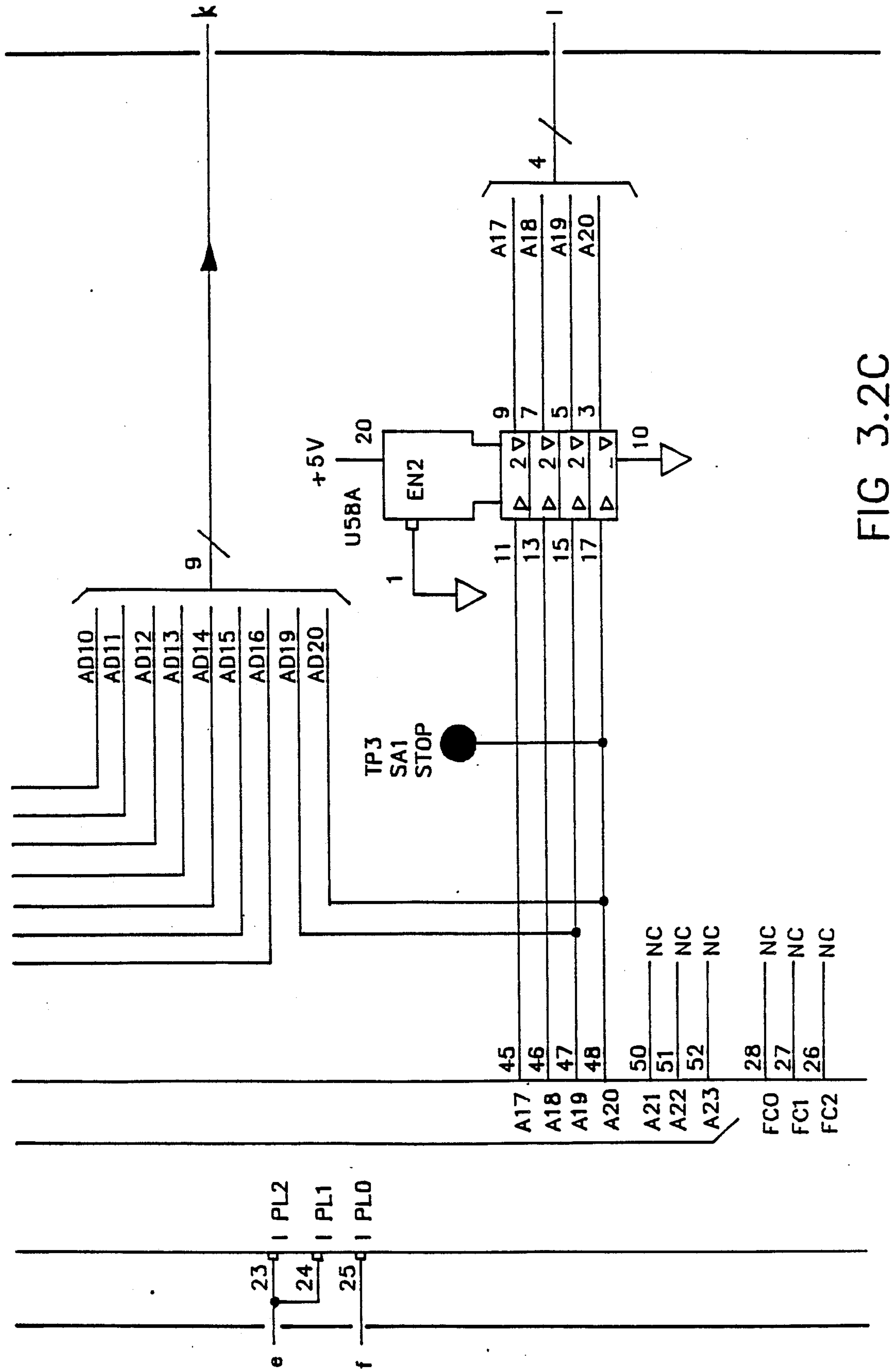
FIG 3.2C

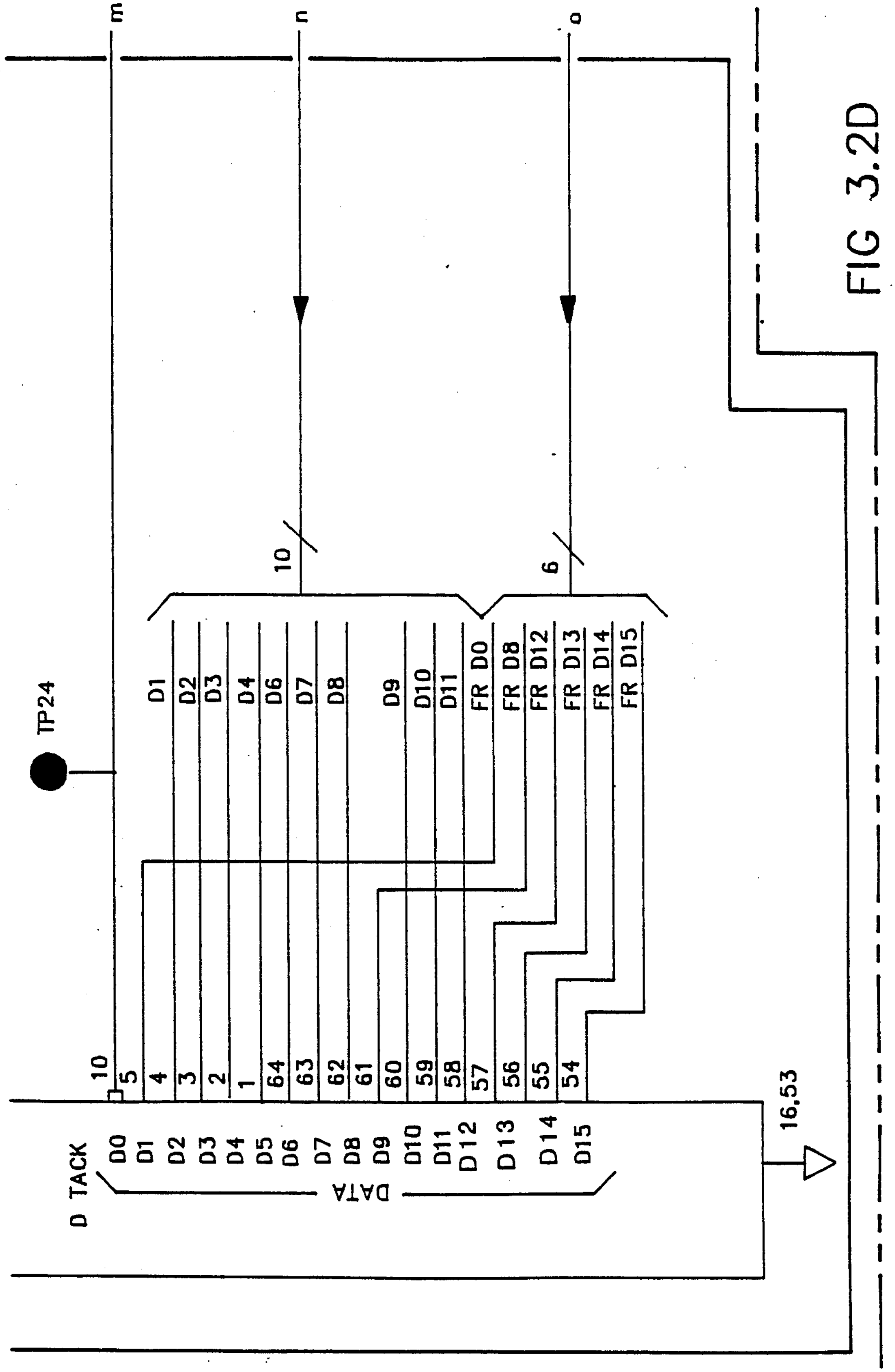
FIG 3.2D

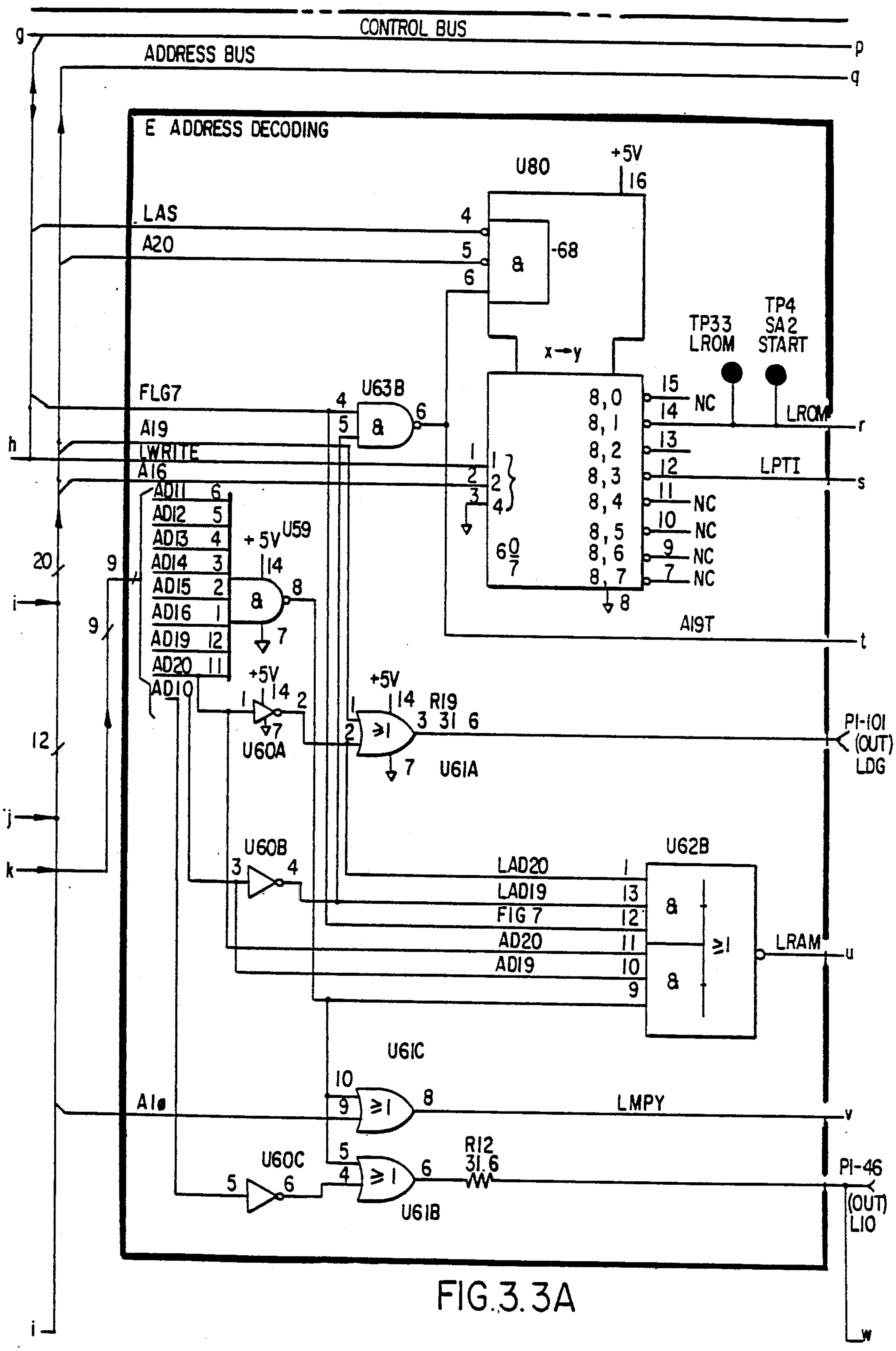
FIG.3.3A

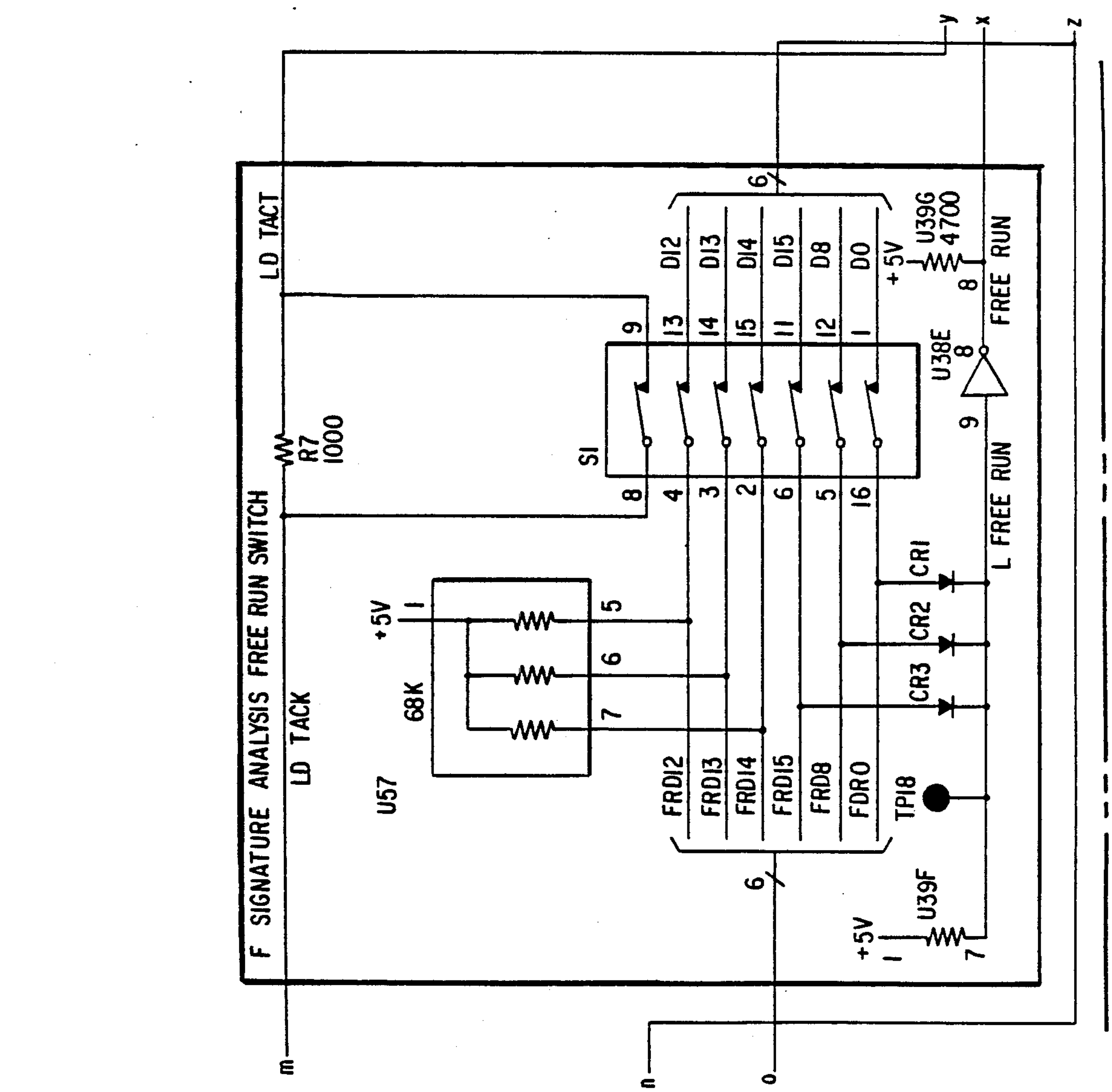
FIG. 3.3B

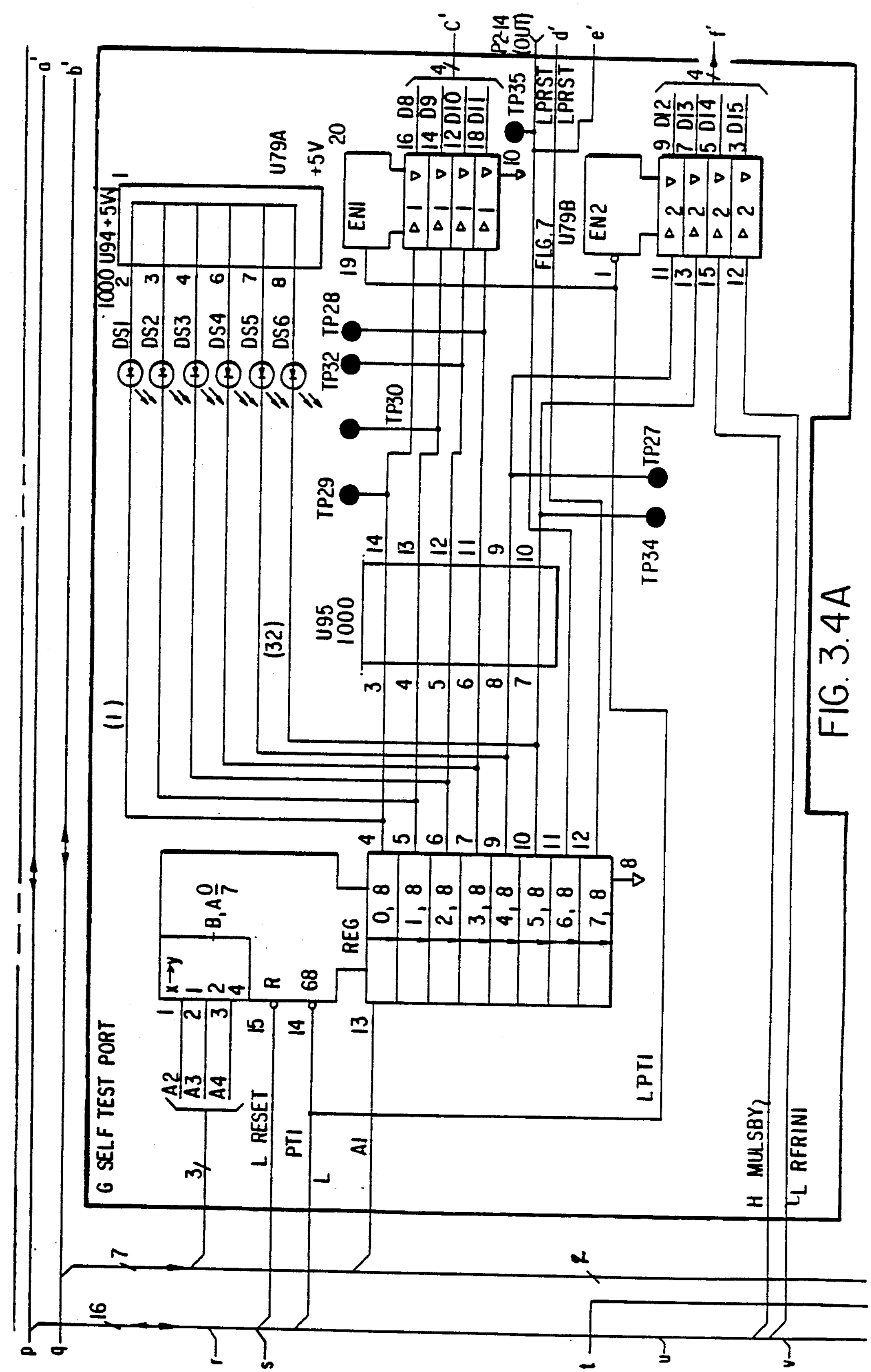
FIG. 3.4A

FIG. 3.4B
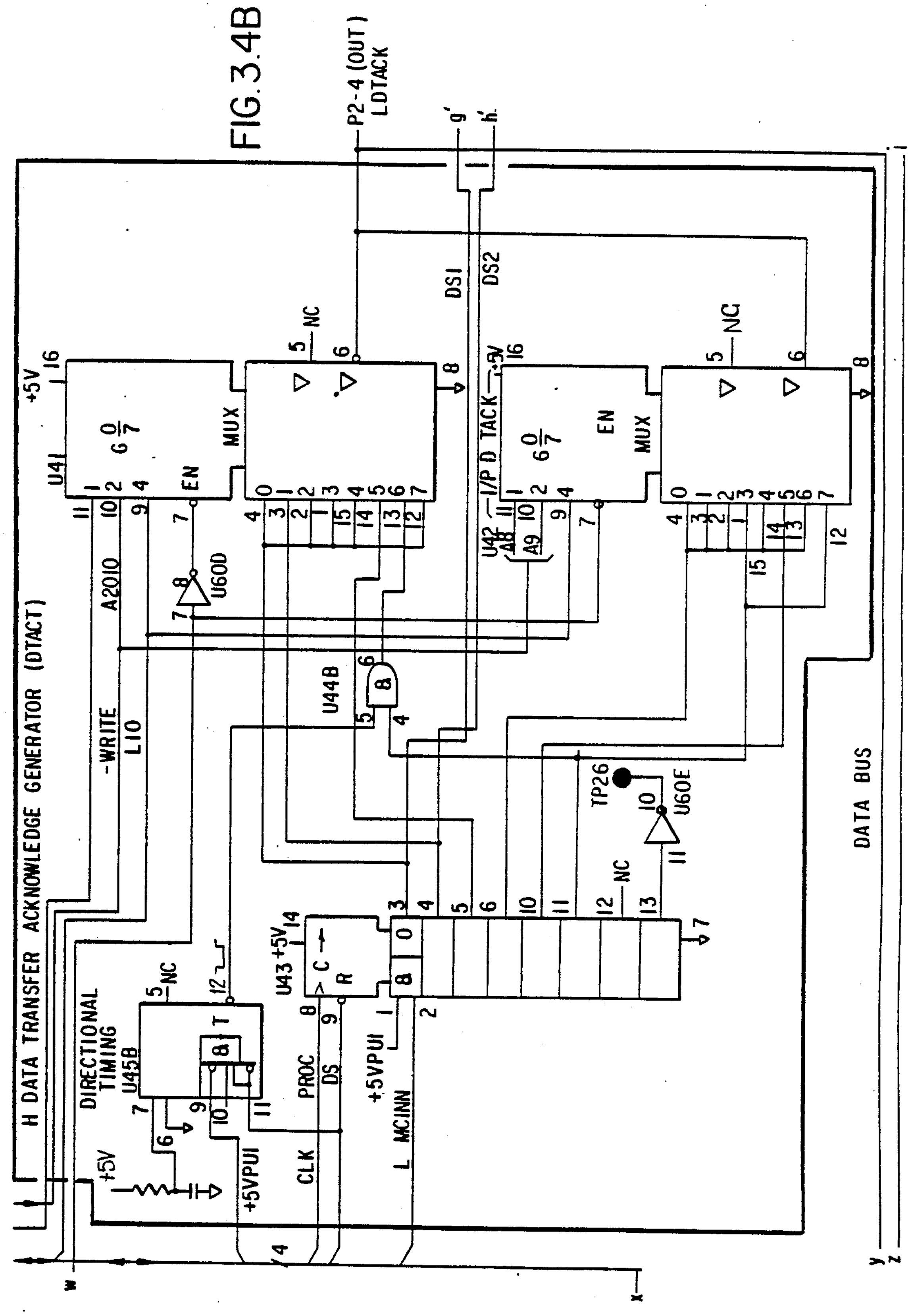

FIG. 3.5
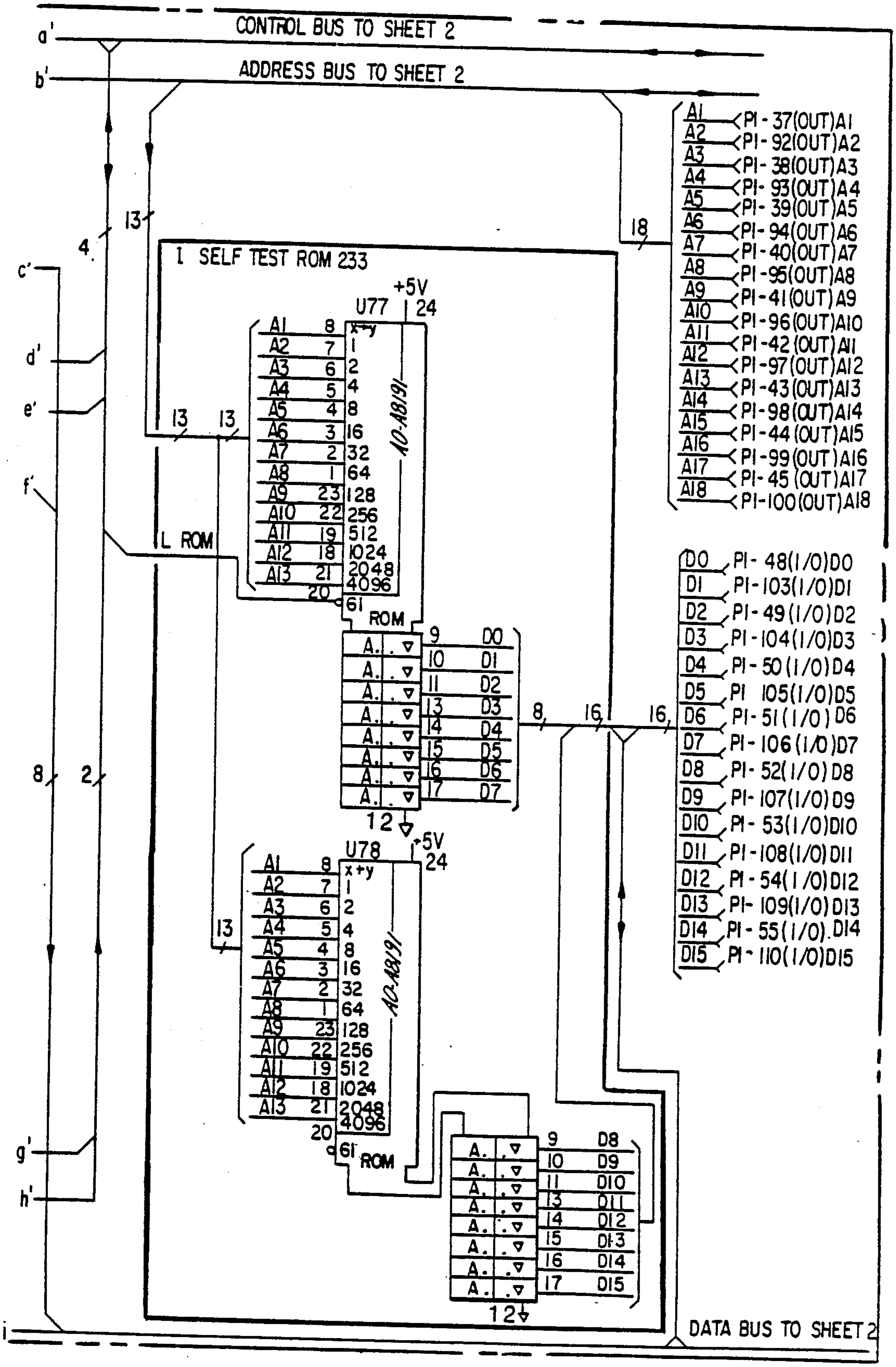

UNLESS OTHERWISE INDICATED,:
RESISTANCE VALUES SHOWN ARE IN OHMS,
CAPACITANCE IN MICROFARADS,
AND INDUCTANCE IN MICROHENRIES.
SIGNALS ENTER AT LEFT SIDE AND EXIT AT
RIGHT SIDE OF FUNCITON BLOCKS.

ROMS SUPPLIED IN MATCHED SETS
U10,12,13, REPLACED AS A SET.
U77 AND U78 REPLACED AS A SET

ACTIVE COMPONENTS APRTS LISTS (U's and Q's)

| REFERENCE DESIGNATORS | PART NUMBER | MANUFACTURER'S PART NUMBER |
|---|---|---|
| U1-8,20-27 | 1818-3005 | RAM 64KX1 |
| U9 | 1820-2076 | I 3242 |
| U10 NOTE 3 | 85010-80001 | PROM 512X8 |
| U11,31,32 | 1820-1858 | 74LS377 |
| U12 NOTE 3 | 85101-80002 | PROM 512X8 |
| U12 NOTE 3 | 85101-80003 | PROM 512X8 |
| U14,33 | 1820-1432 | 74LS163 |
| U15,49 | 1820-0629 | 74S112 |
| U16,29,30,80 | 1820-1216 | 74LS138 |
| U17,18,48 | 1820-0683 | 74S04 |
| U19 | 1813-0130 | 16 MHz OSC |
| U28,52,61 | 1820-1449 | 74S32 |
| U34 | 1820-0681 | 74S00 |
| U35 | 1820-1440 | 74LS279 |
| U36 | 1820-0648 | 74S20 |
| U37 | 1820-1191 | 74S175 |
| U38 | 1820-1200 | 74LS05 |
| U39 | 1810-0205 | RES 4.7K OHM |
| U40 | NOT USED | |
| U41,42 | 1820-1298 | 74LS251 |
| U43 | 1820-1433 | 74LS164 |
| U44 | 1820-1201 | 74LS08 |
| U45 | 1820-1423 | 74LS123 |
| U46 | NOT USED | |
| U47,54,55,96 | 1820-1367 | 74S08 |
| U50,63 | 1820-1197 | 74LS00 |
| U51 | 1820-1322 | 74LS02 |
| U53,56,74,97 | 1820-0998 | 74S153 |
| U57 | 1810-0208 | RES 68K OHM |
| U58,76,79,92 | 1820-2024 | 74LS244 |
| U59 | 1820-1207 | 74LS30 |
| U60 | 1820-1199 | 74LS04 |
| U62 | 1820-1210 | 74LS51 |
| U64,81 | 1820-2075 | 74LS245 |
| U65-68,82-85 | 1820-2120 | 25LS14 |
| U69-72,86084 | 1820-2906 | 25LS299 |
| U73,90 | 1820-3217 | 74ALS569 |
| U75 | 1820-2505 | 63000 |
| U77 NOTE 3 | 55101-80004 | PROM 8KX 8 |
| U78 | 35101-80005 | PROM 8KX 8 |
| U91 | 1820-2220 | 74LS385 |
| U93 | 1820-1729 | 74LS259 |
| U94 | 1810-0204 | RES 1K ohm |
| U95 | 1810-0037 | RES 1K ohm |
| U98 | 1820-0694 | 74S86 |
| | | |
| | | |
| | | |

FIG 3.6

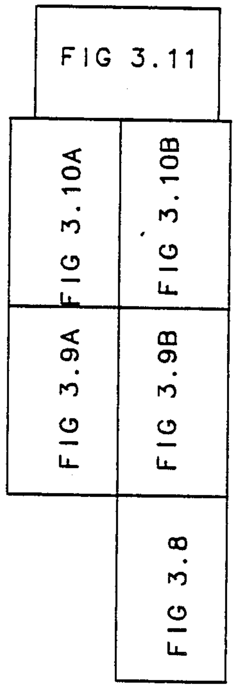
FIG 3.12
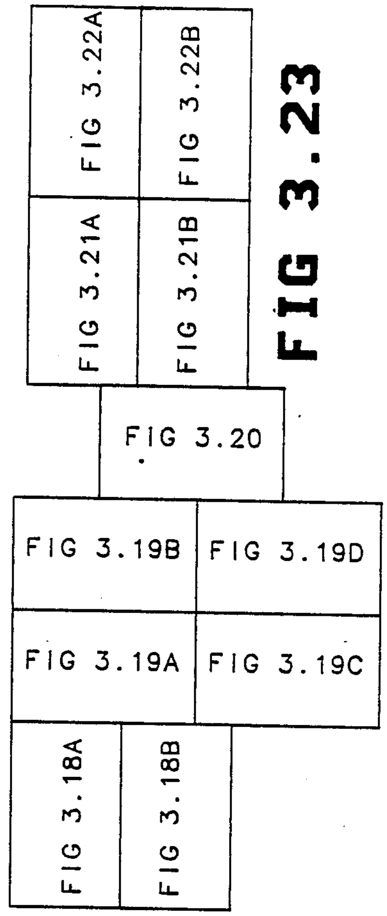
FIG 3.23
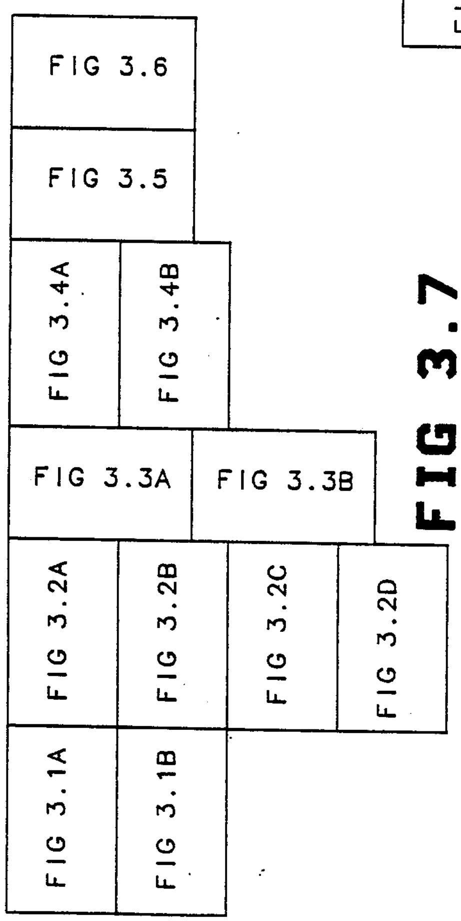
FIG 3.7
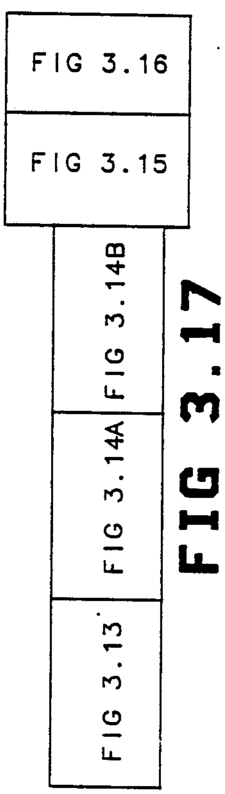
FIG 3.17

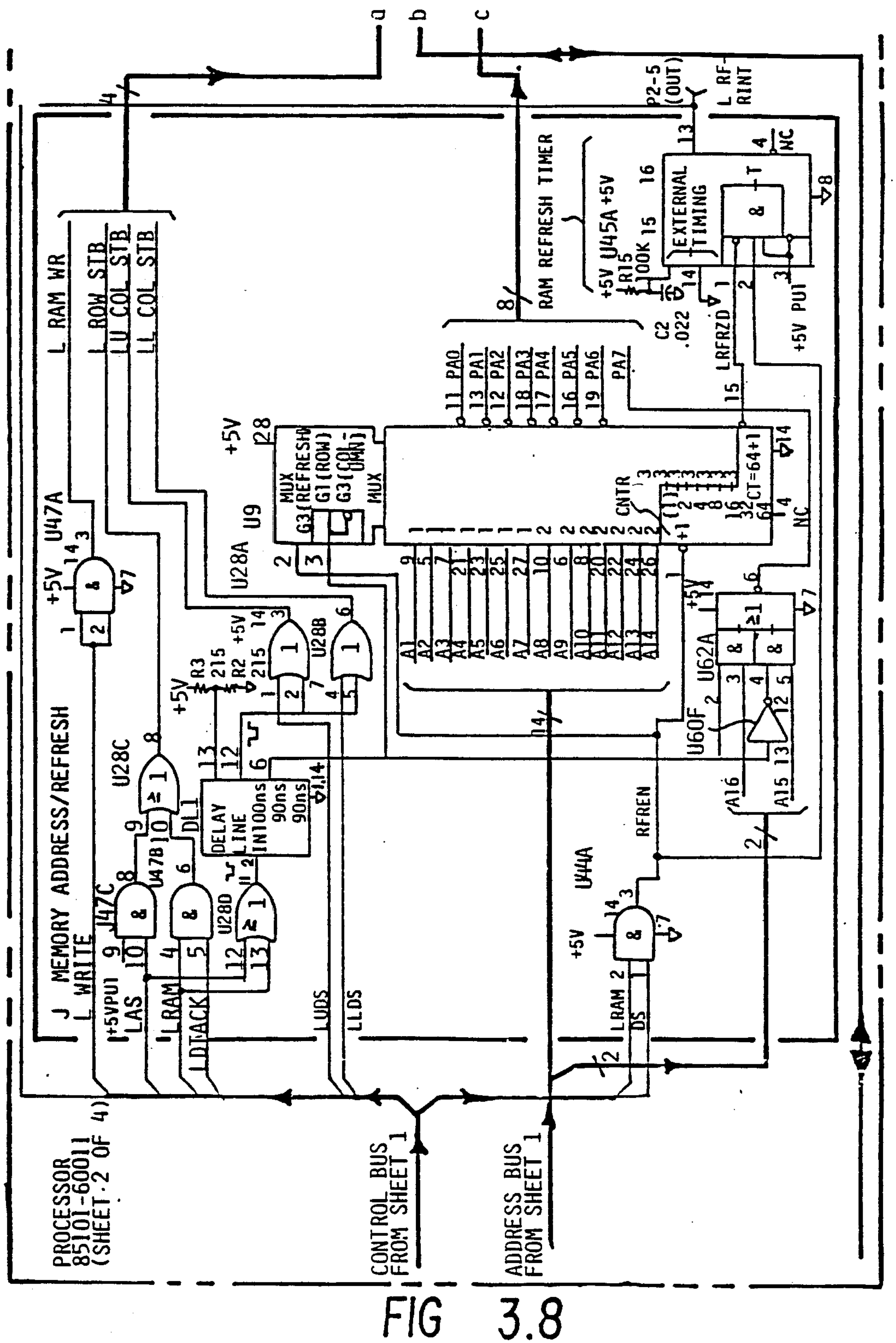
FIG 3.8

FIG. 3.9A
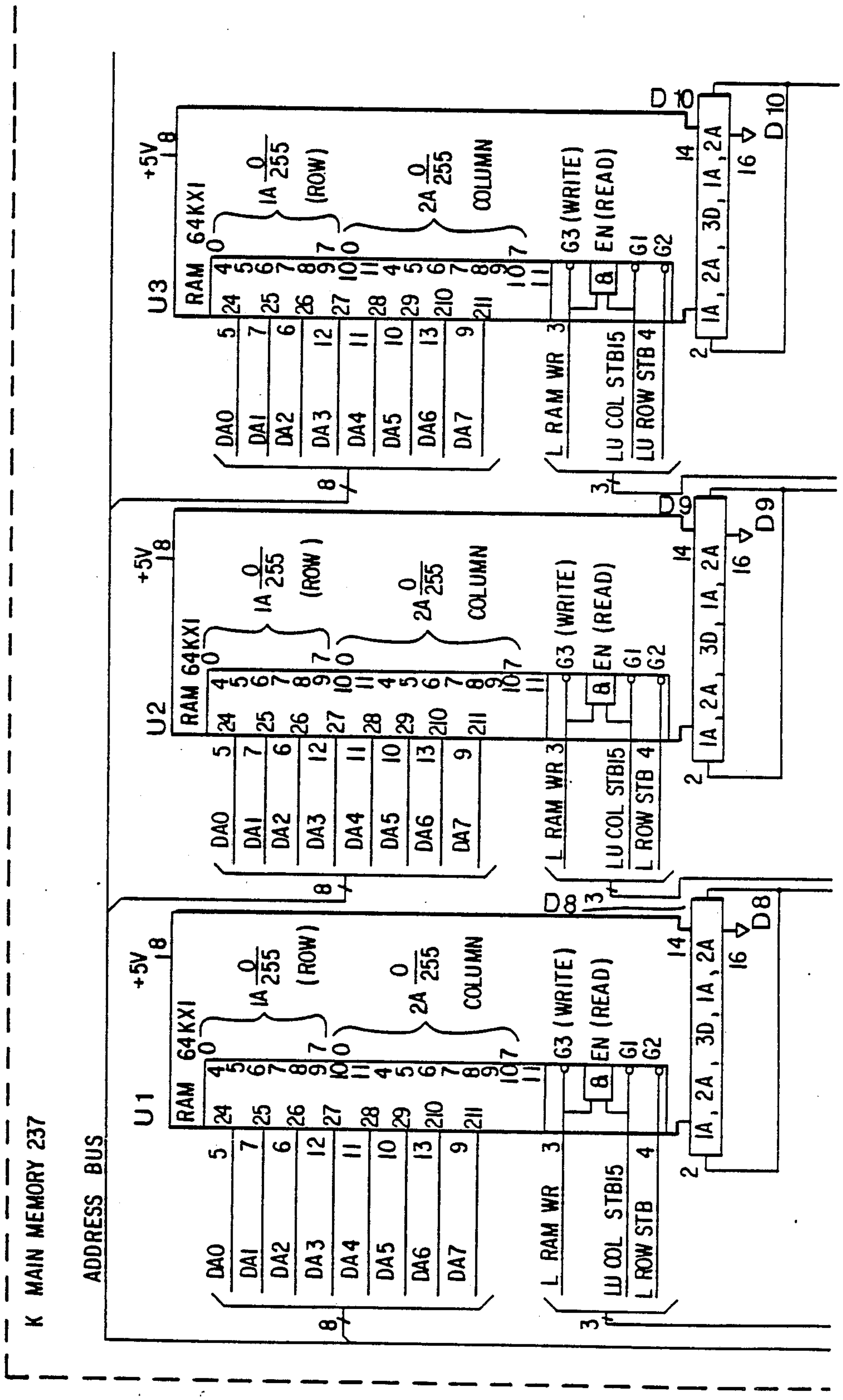

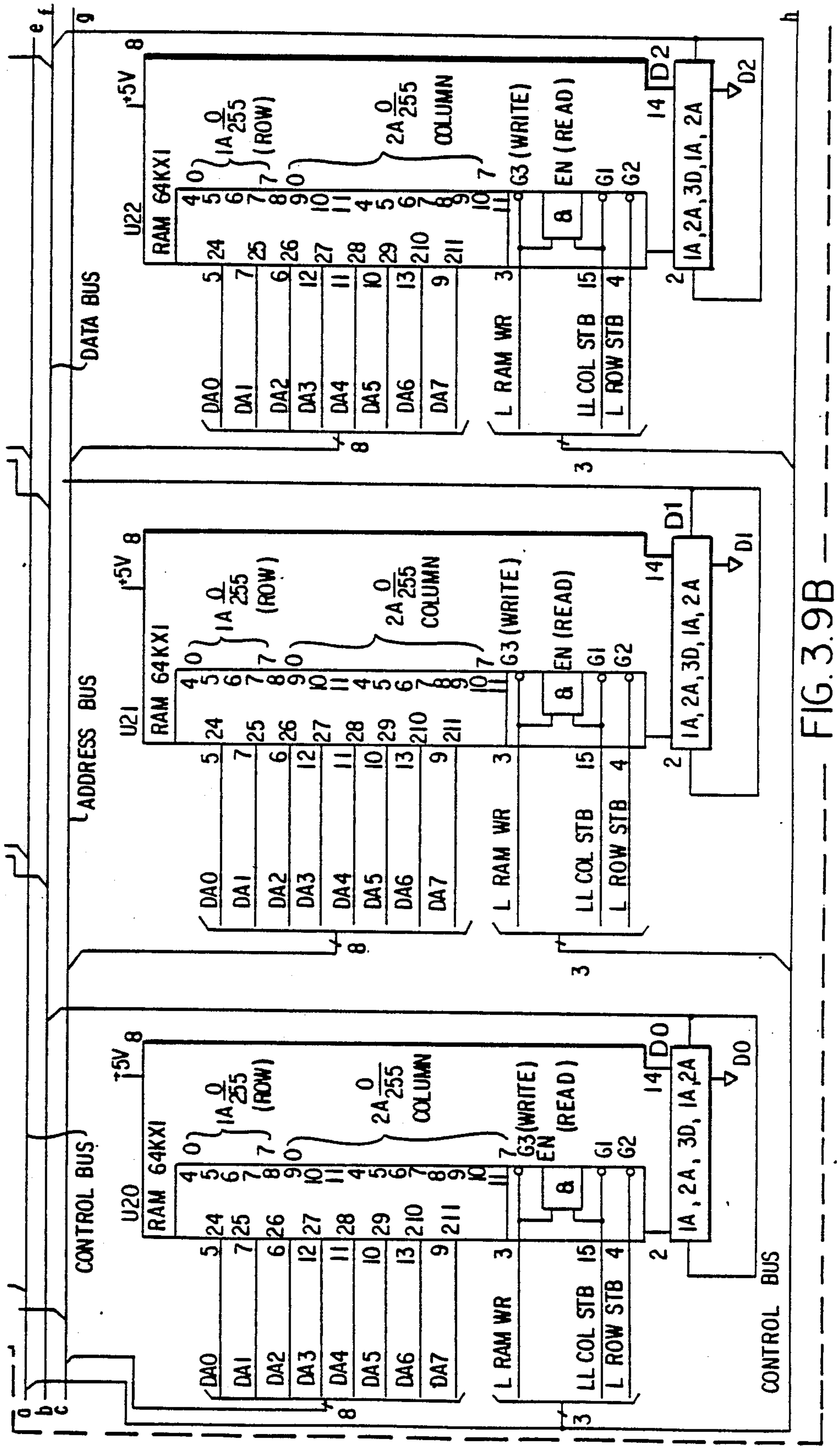
FIG. 3.9B

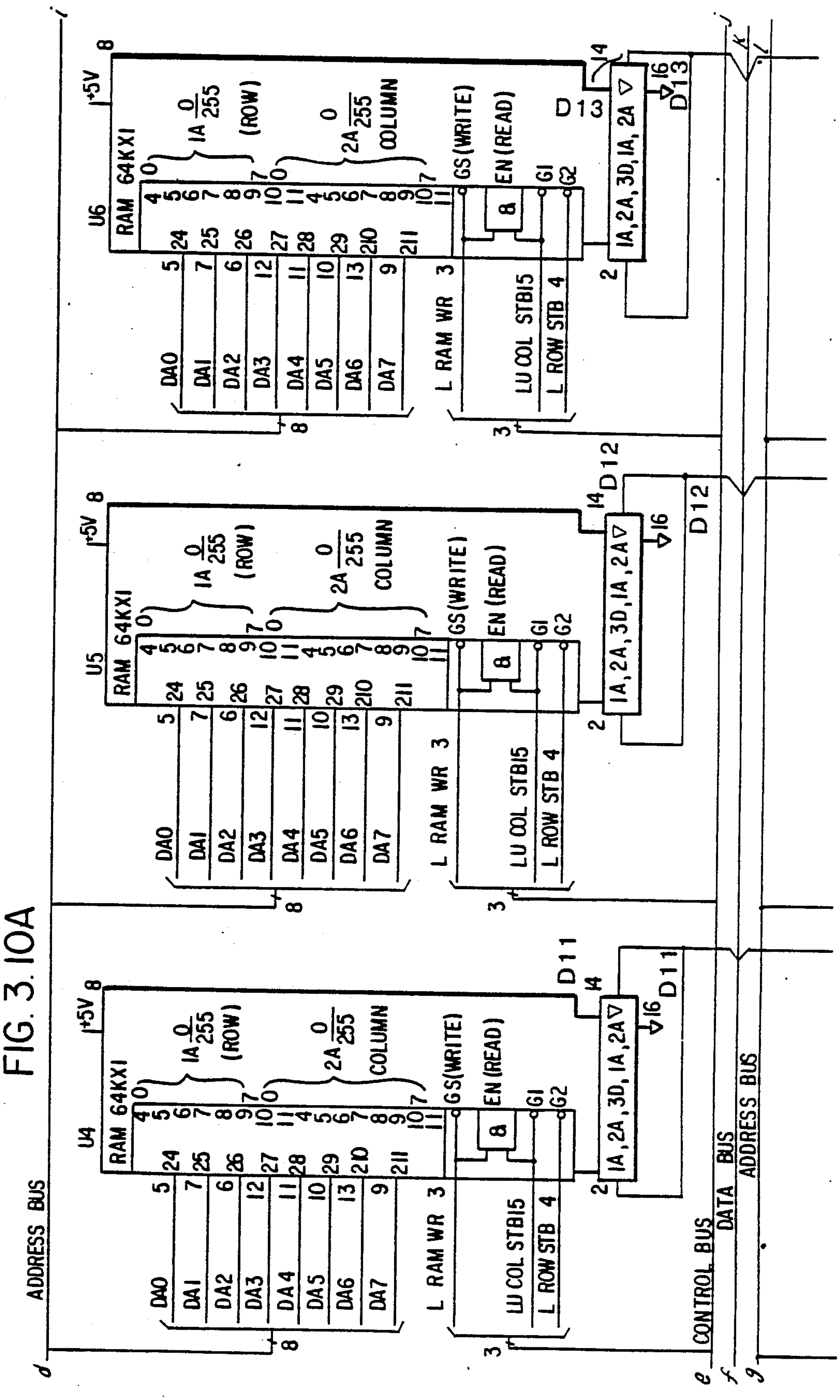
FIG. 3.10A

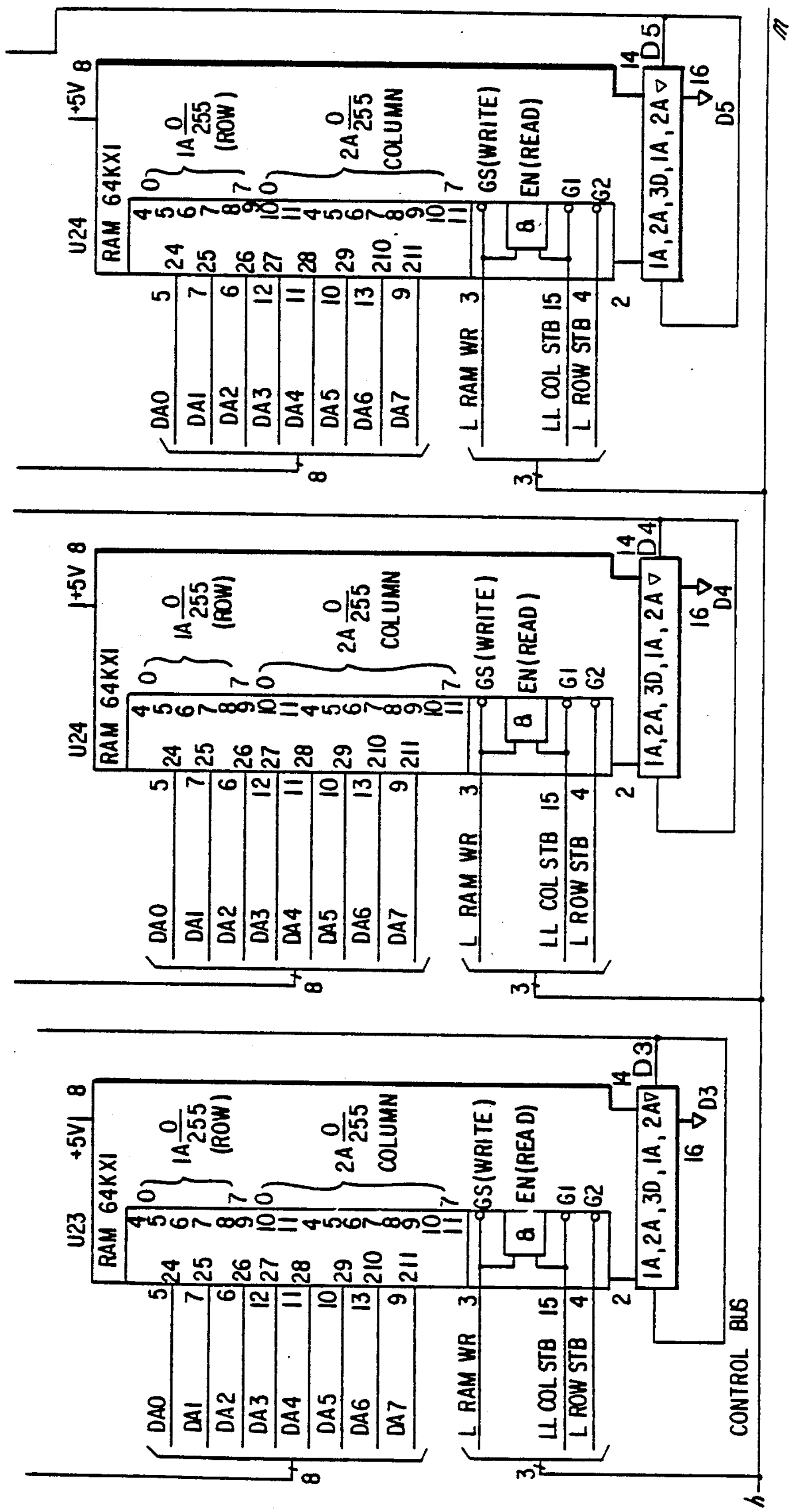
FIG. 3.10B

FIG 3.11
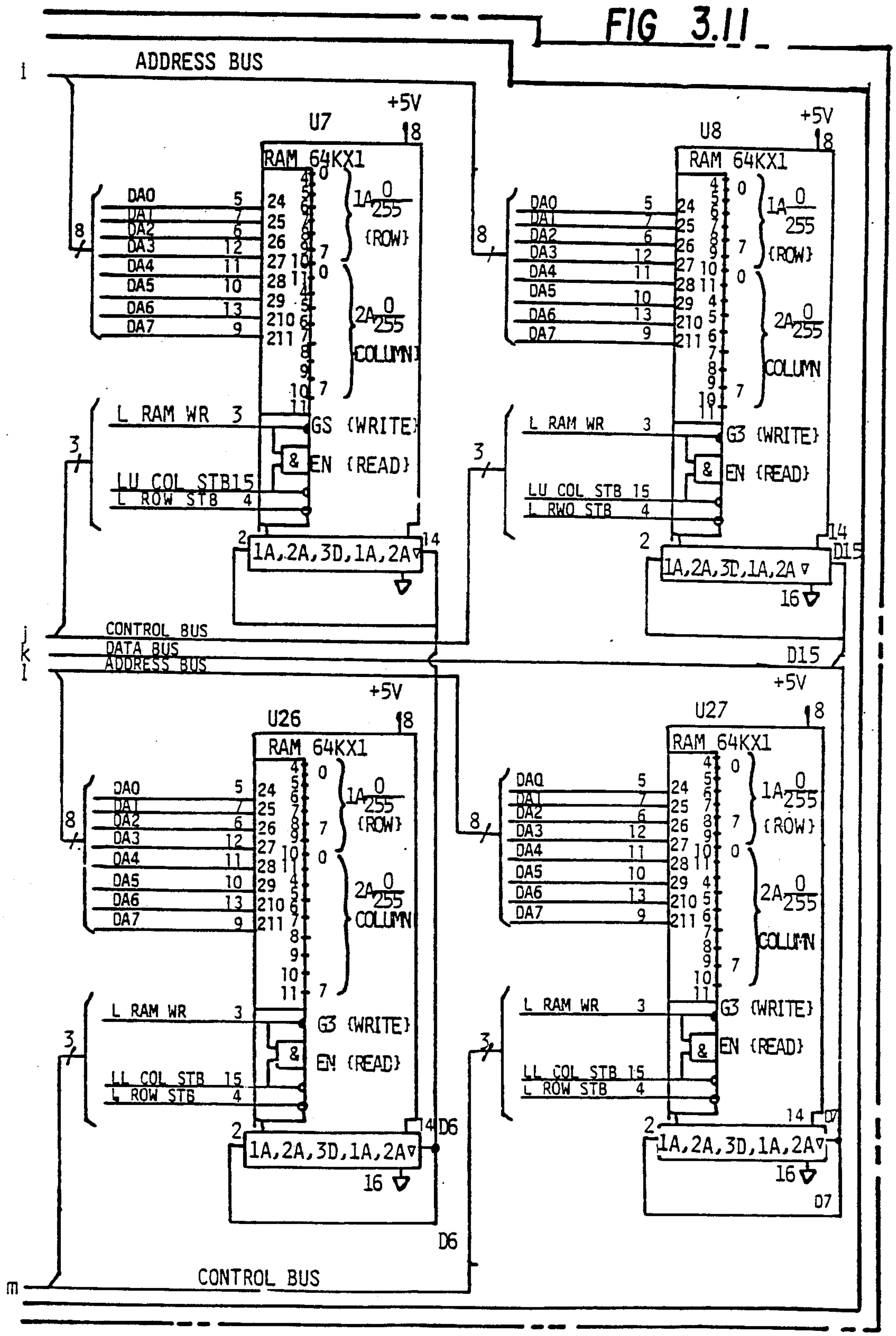

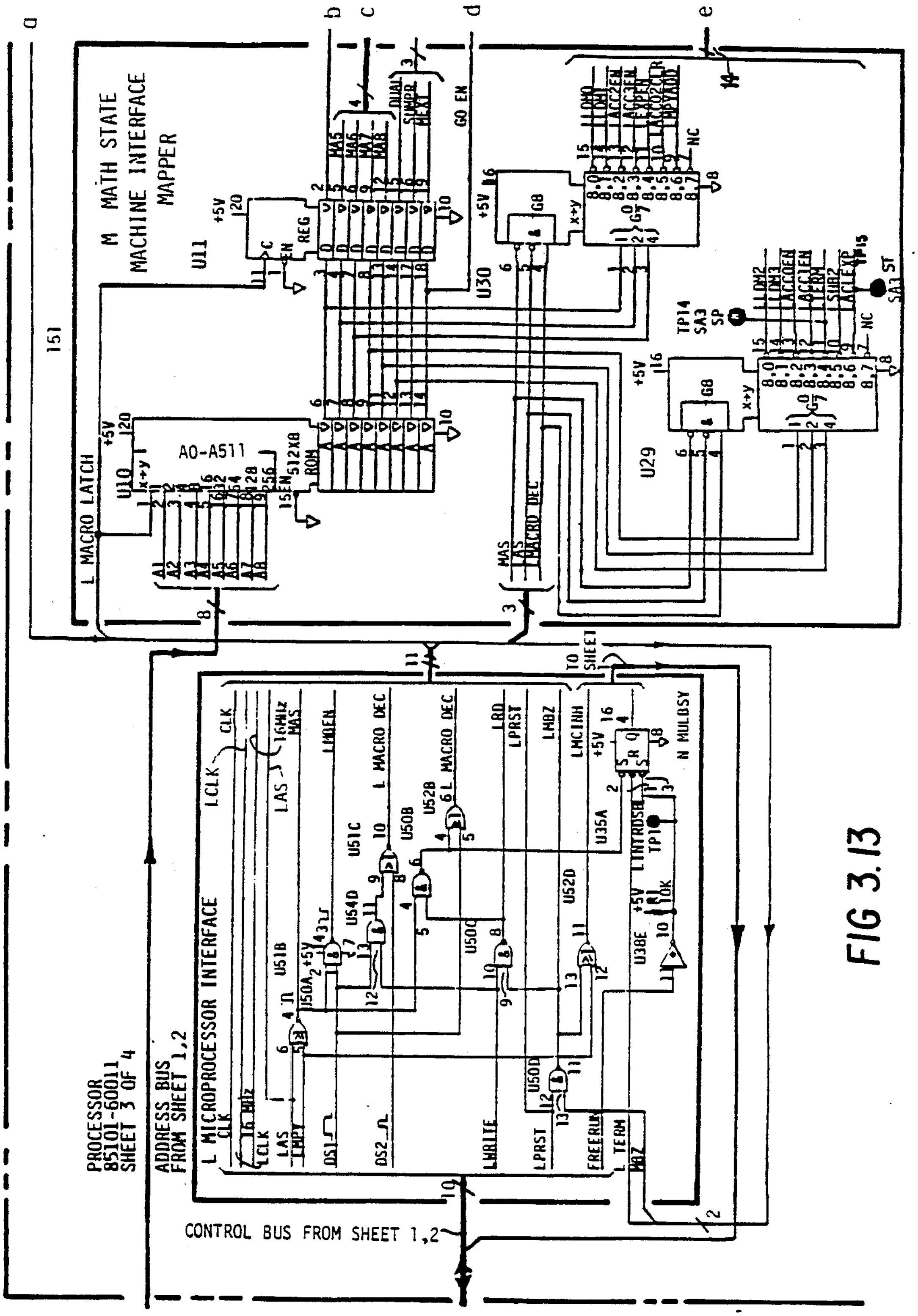
FIG 3.13

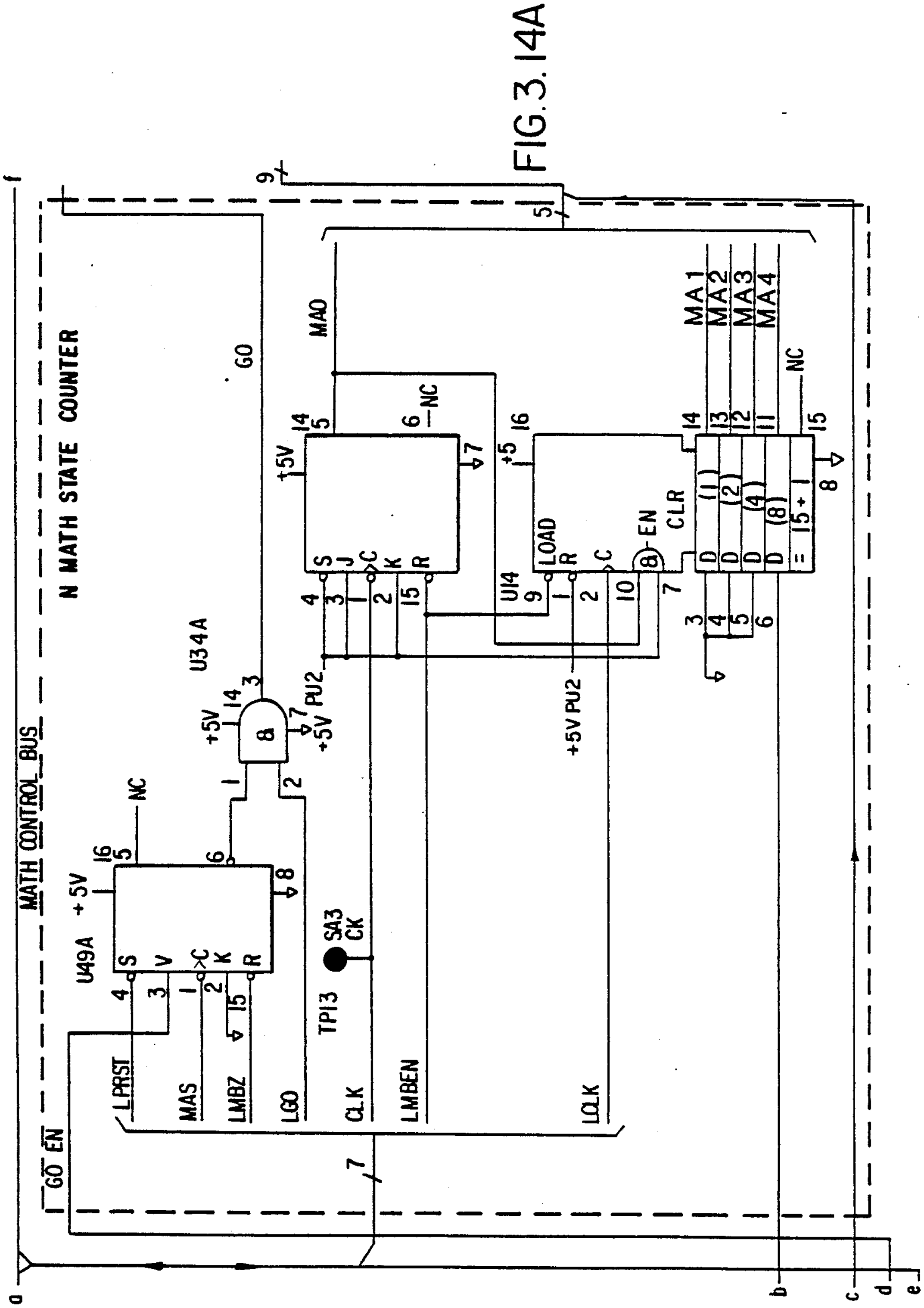
FIG.3.14A

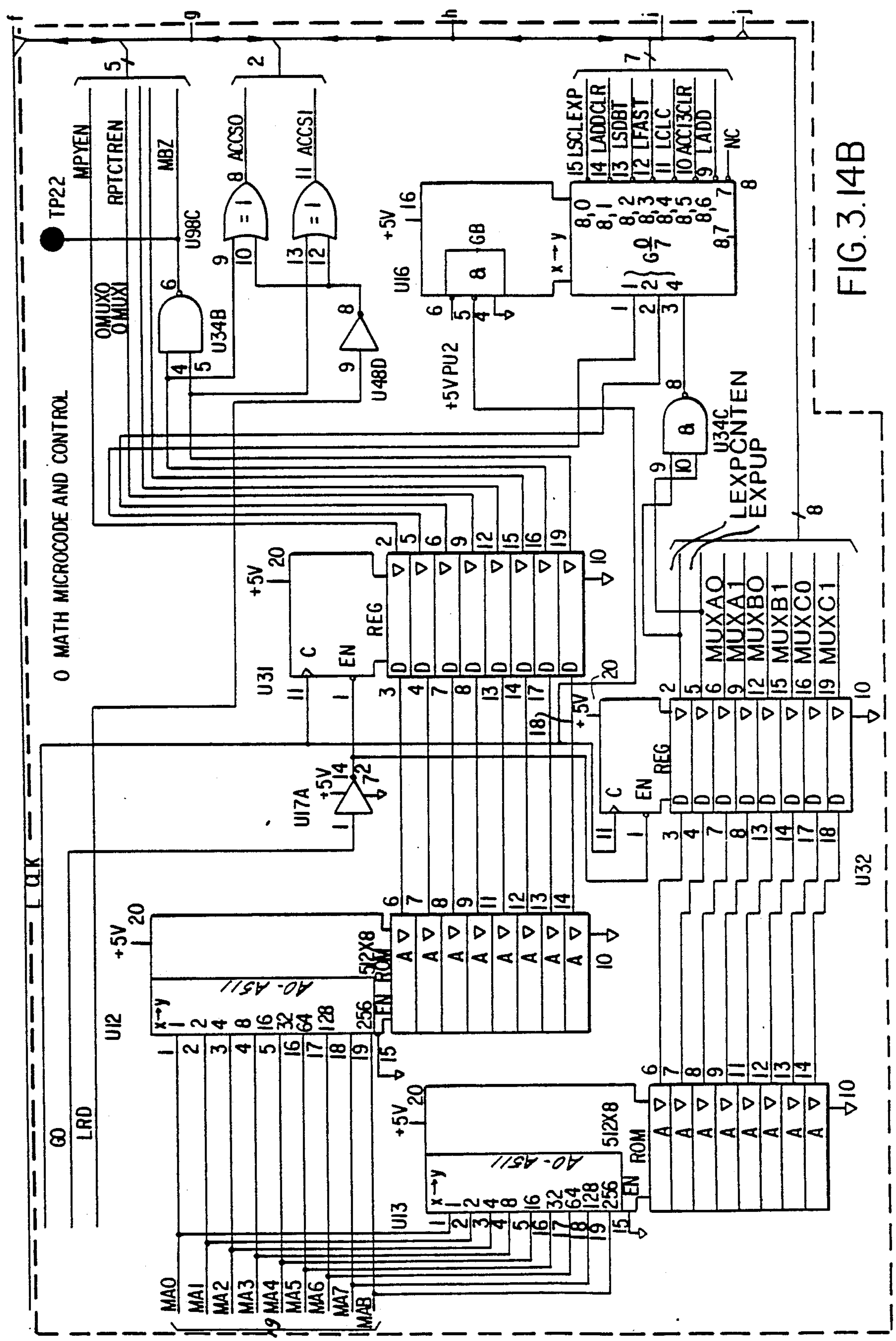
FIG. 3.14B

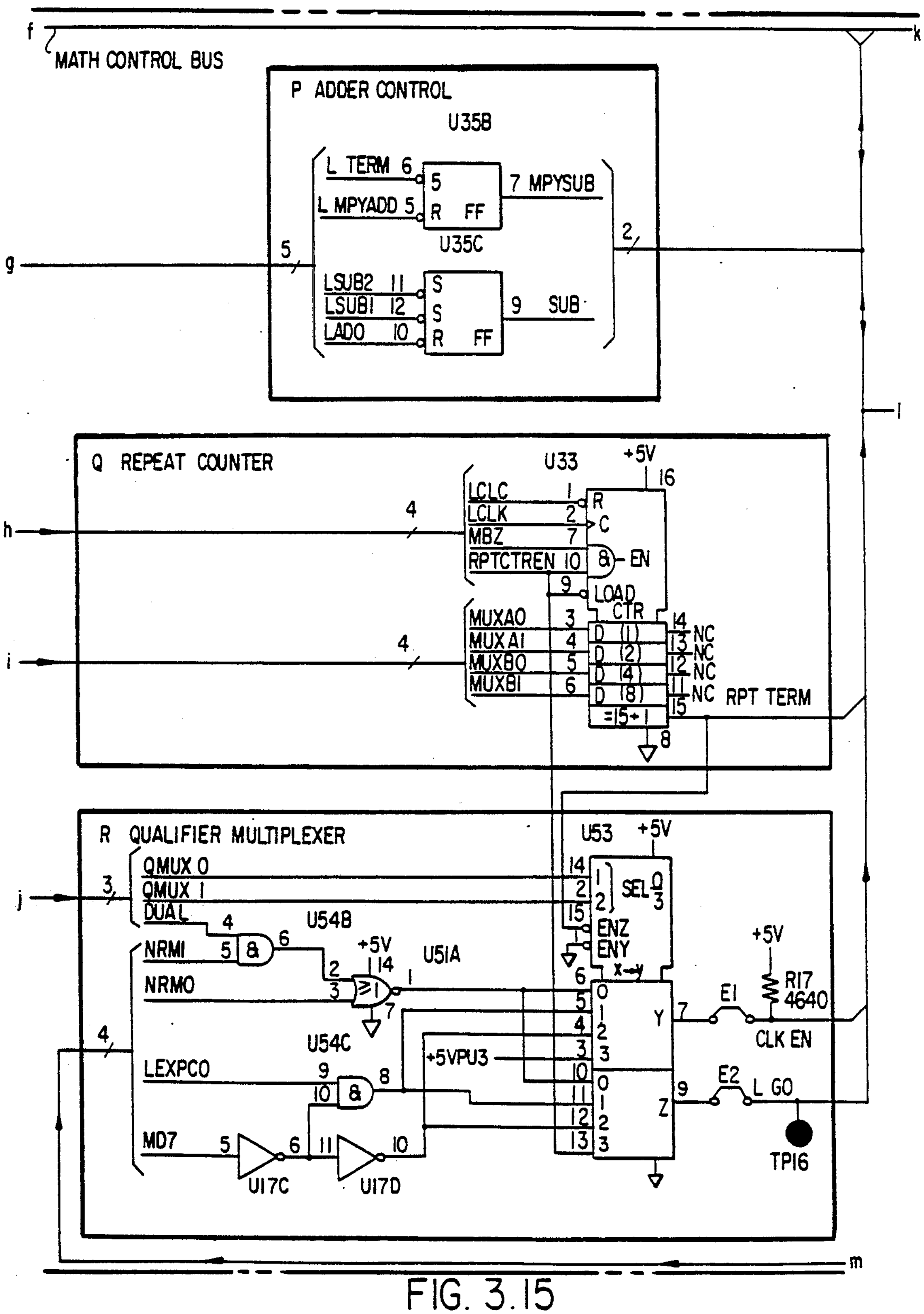
FIG. 3.15

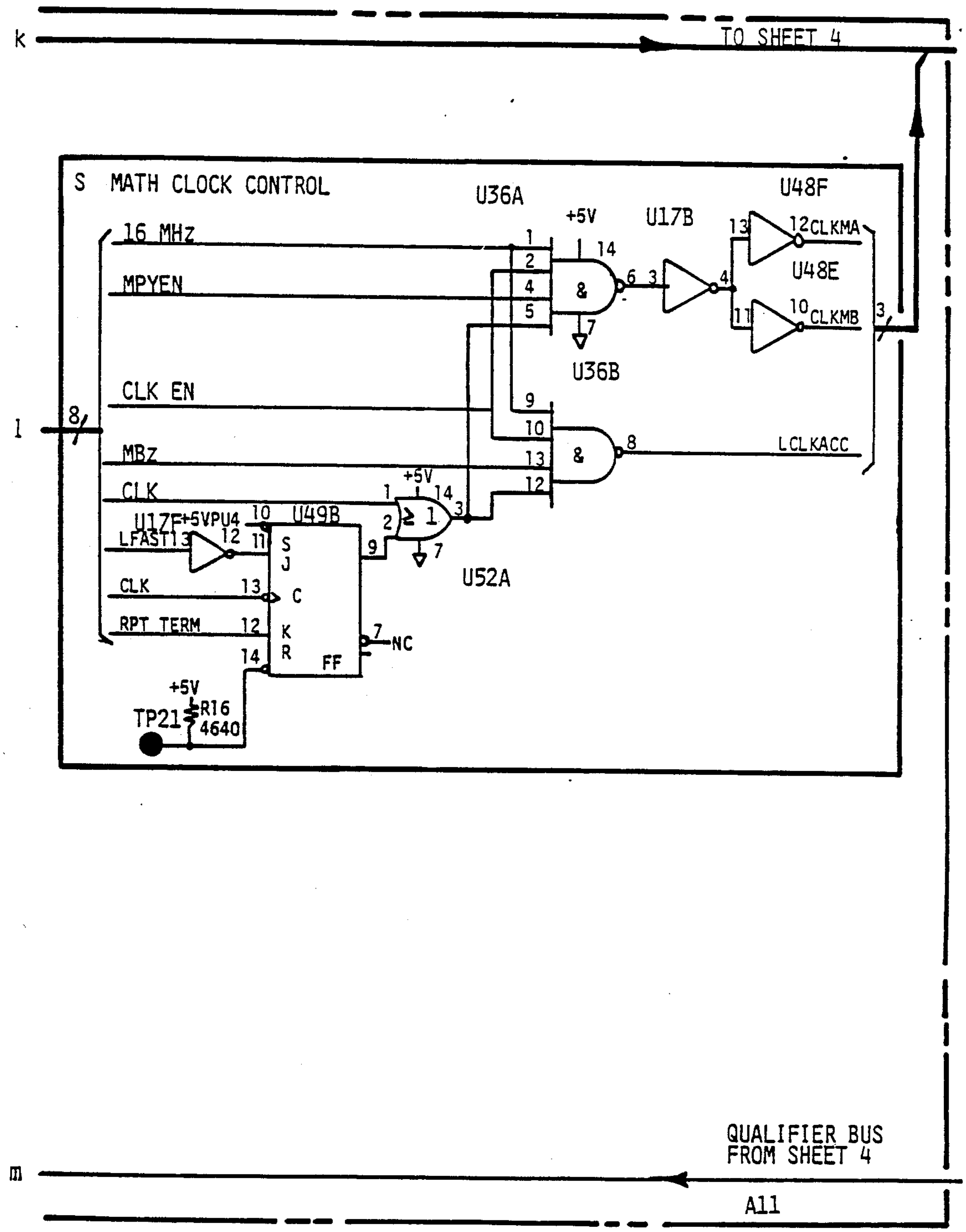
FIG 3.16

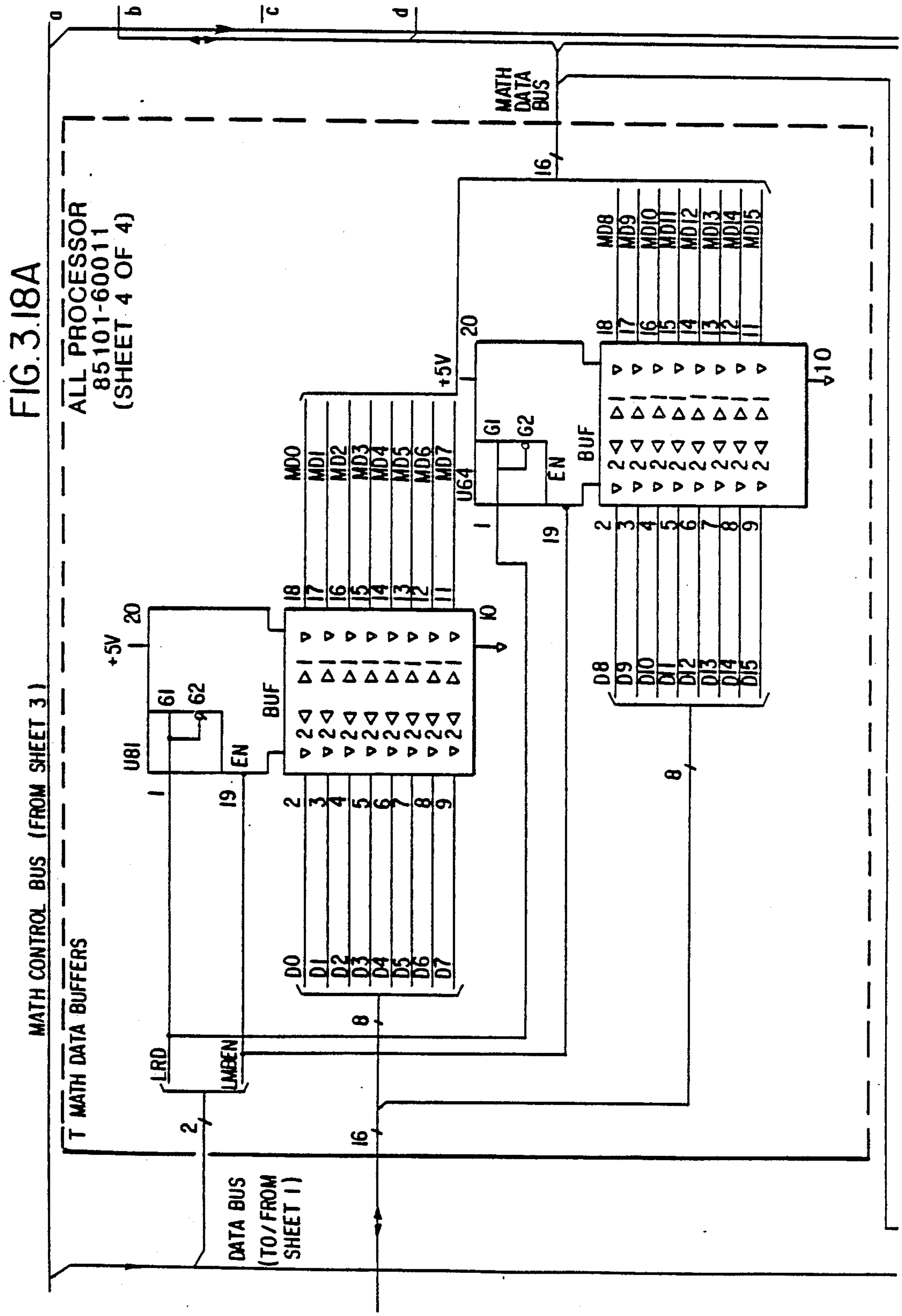
FIG. 3.18A

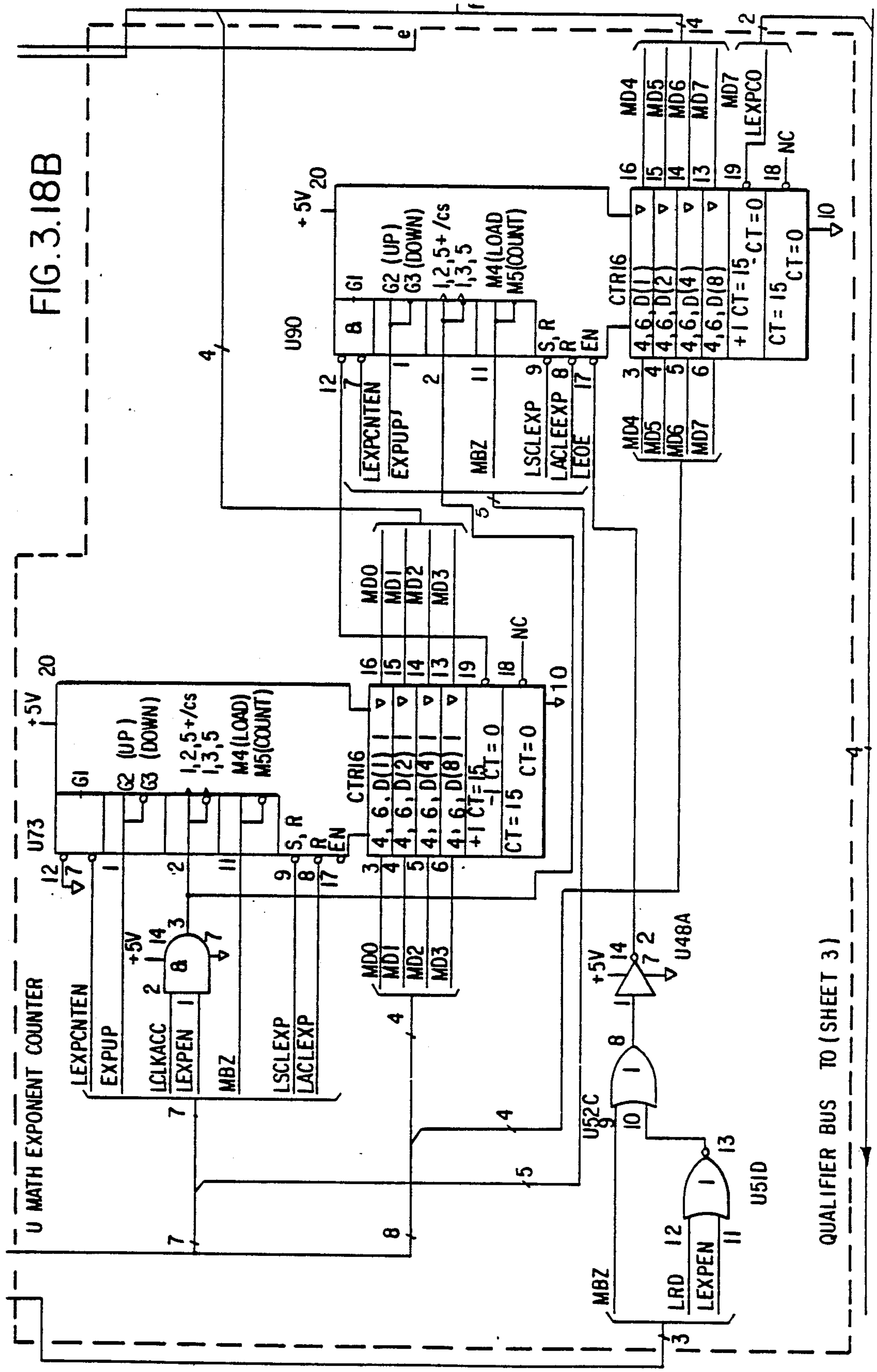
FIG. 3.18B

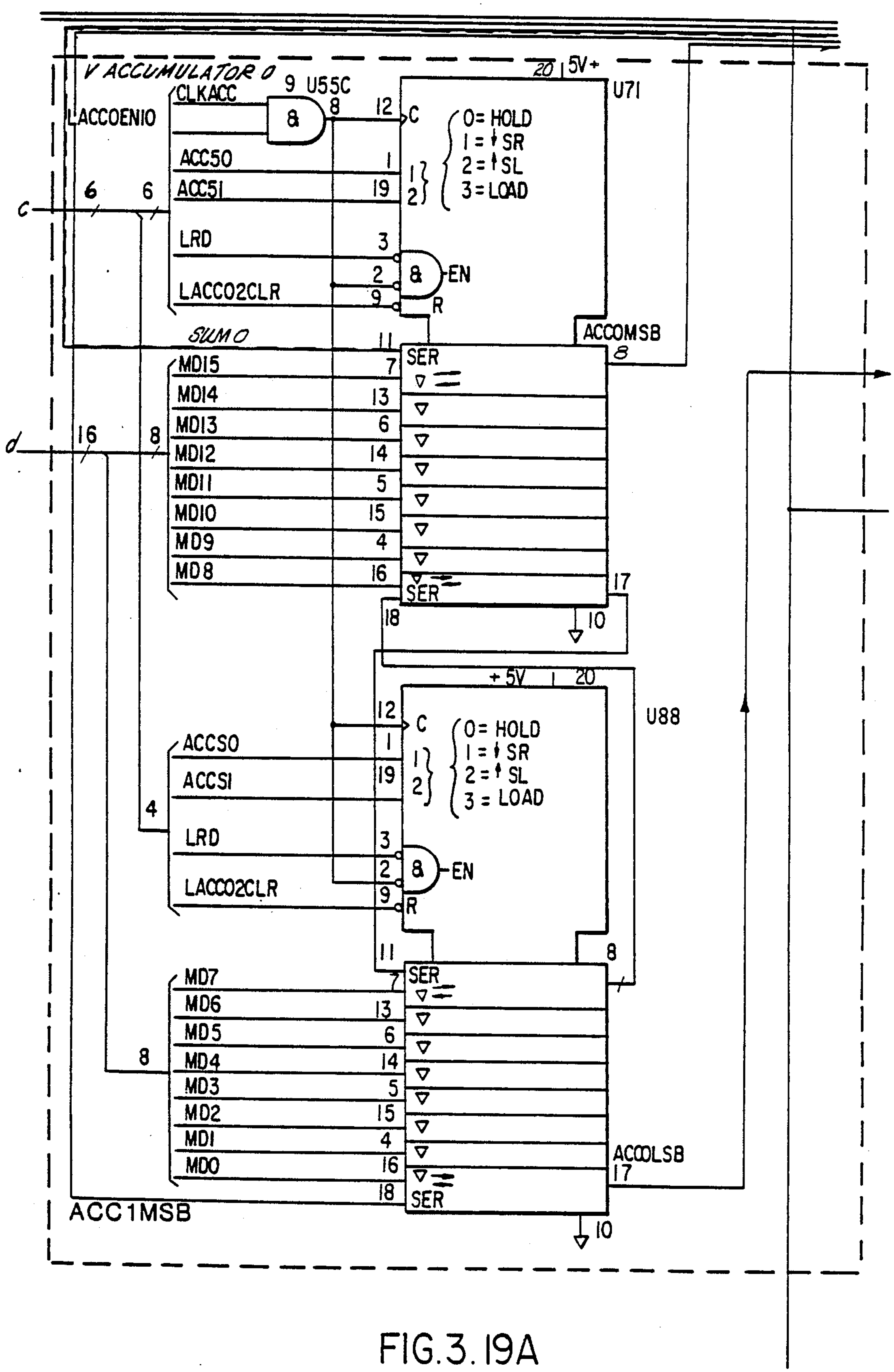
FIG.3.19A

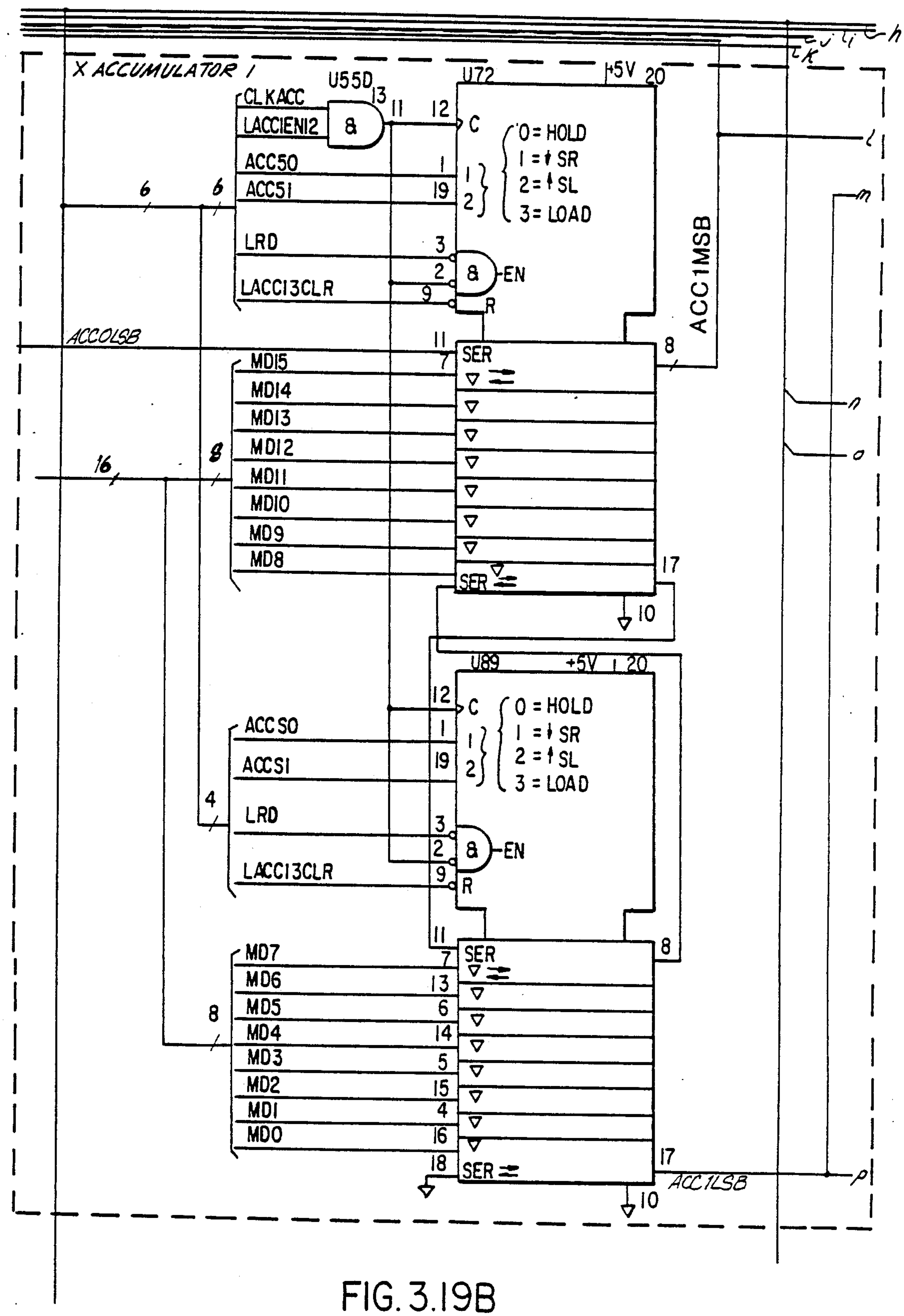
FIG. 3.19B

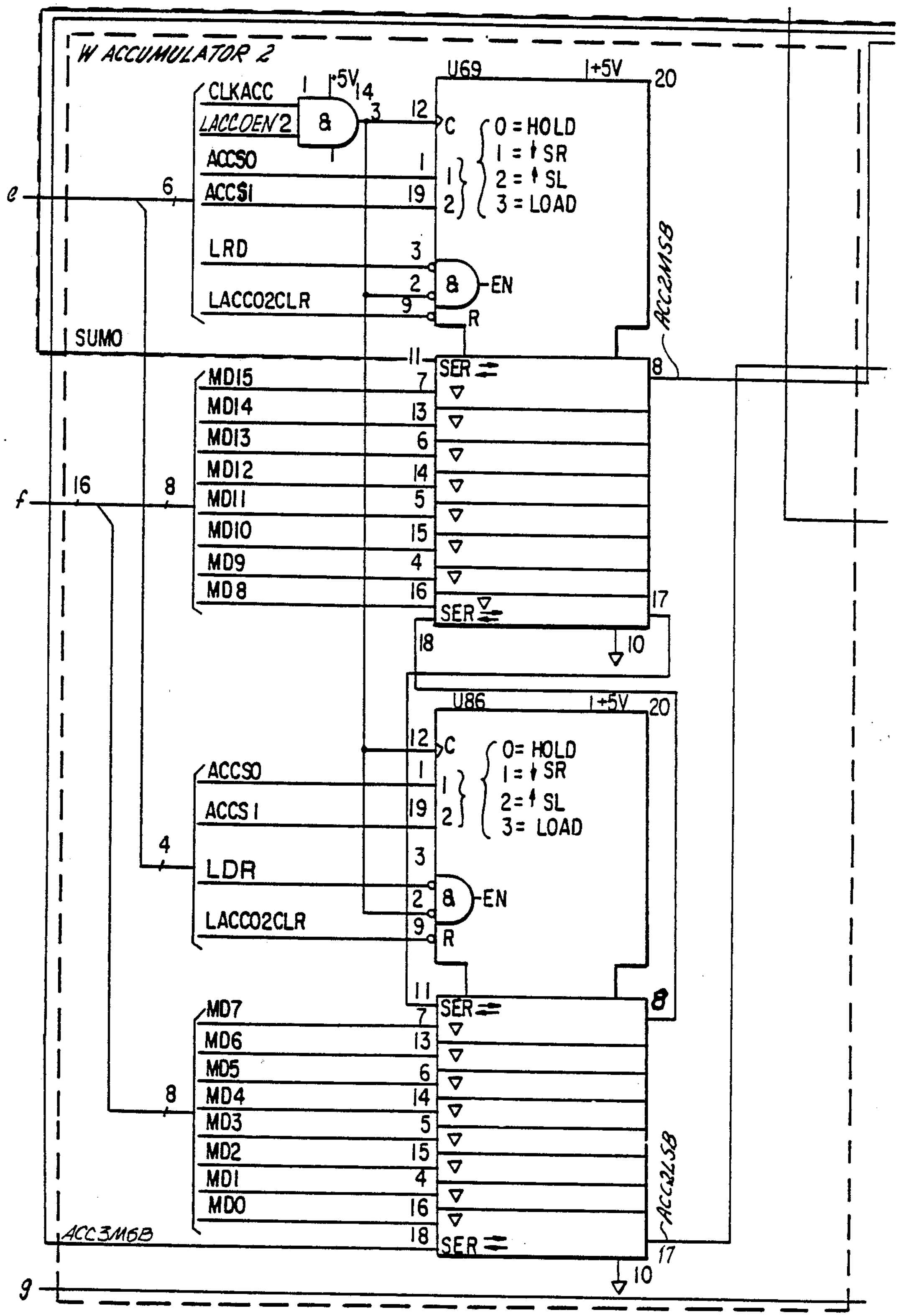
FIG. 3.19C

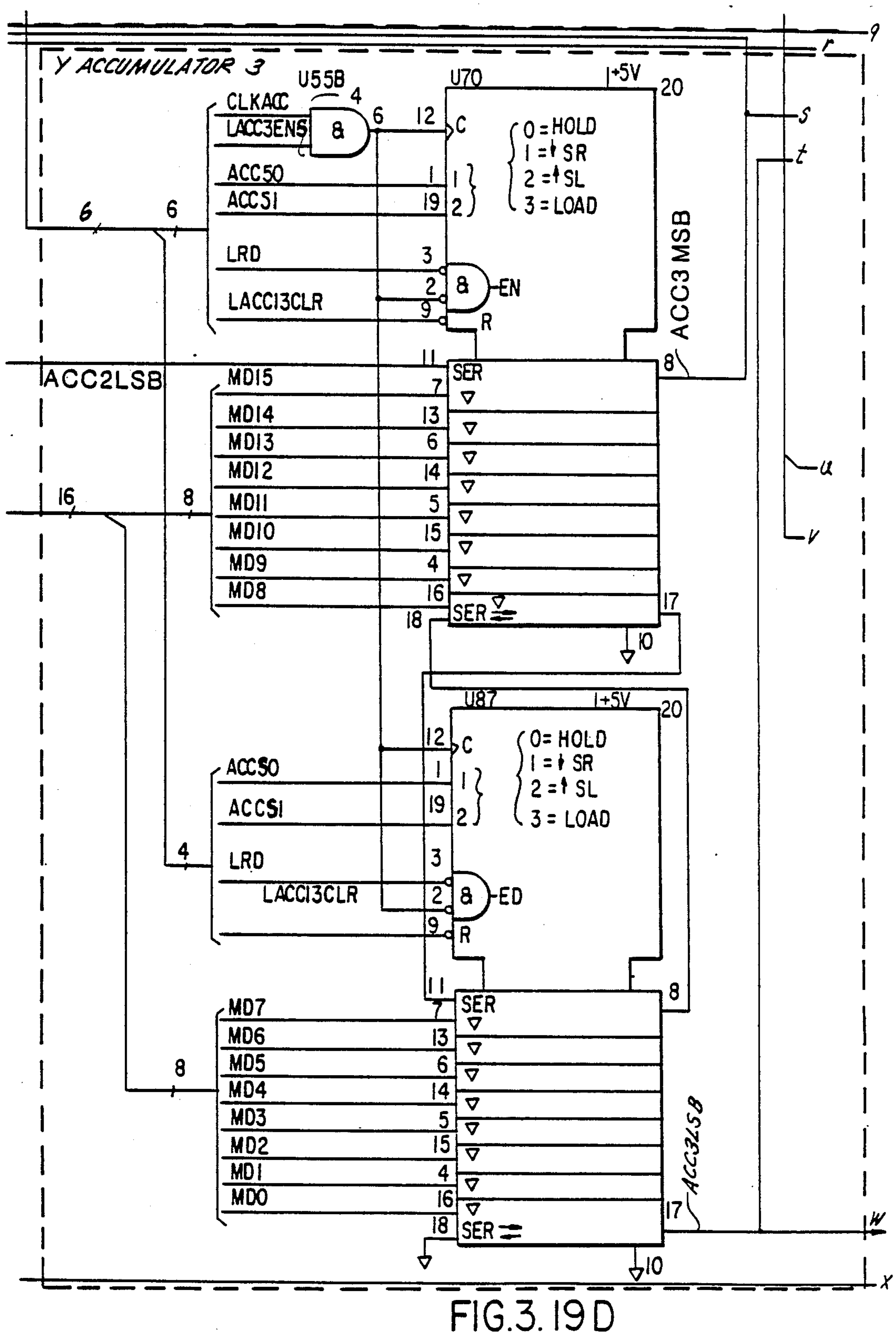
FIG. 3. 19 D

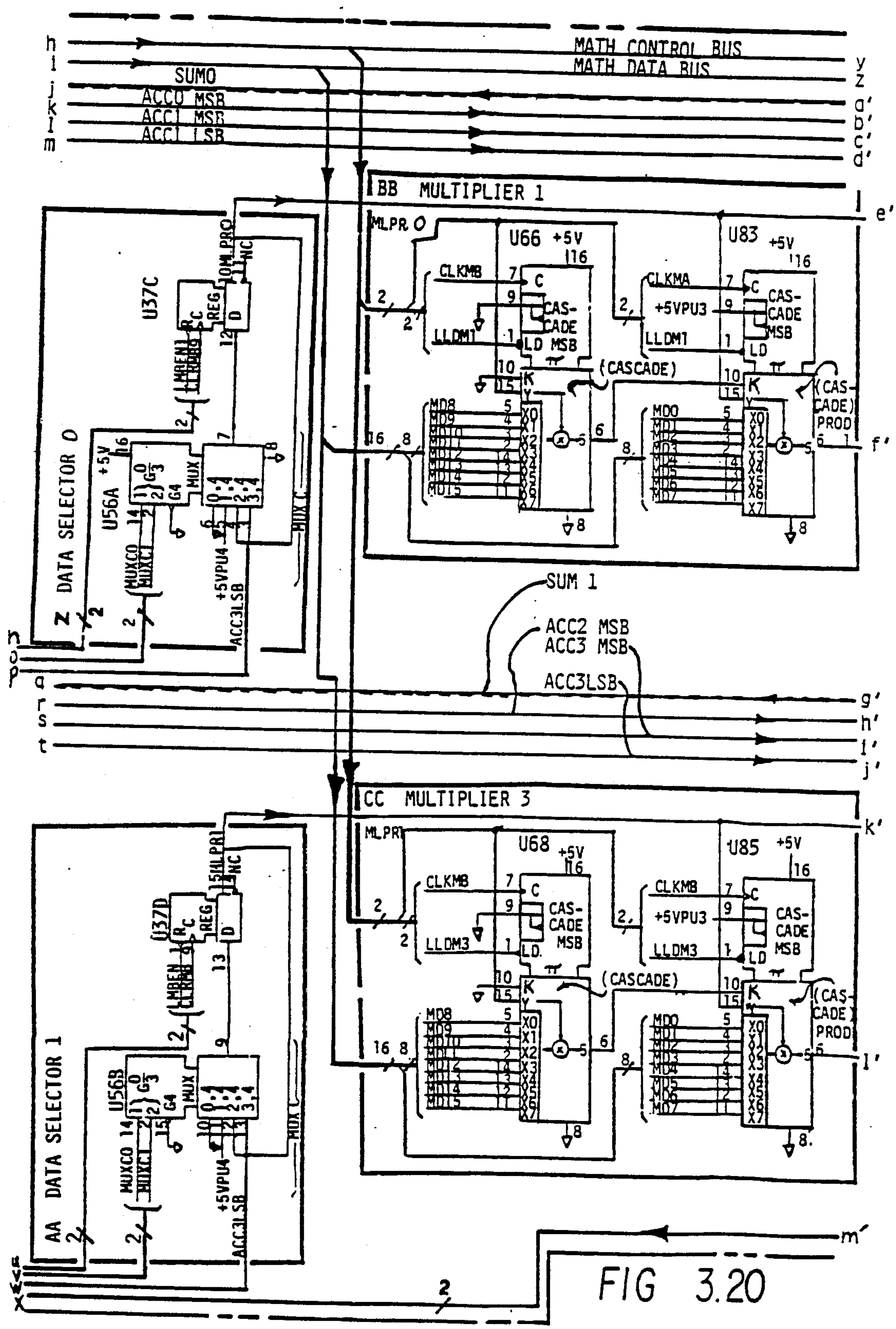
FIG 3.20

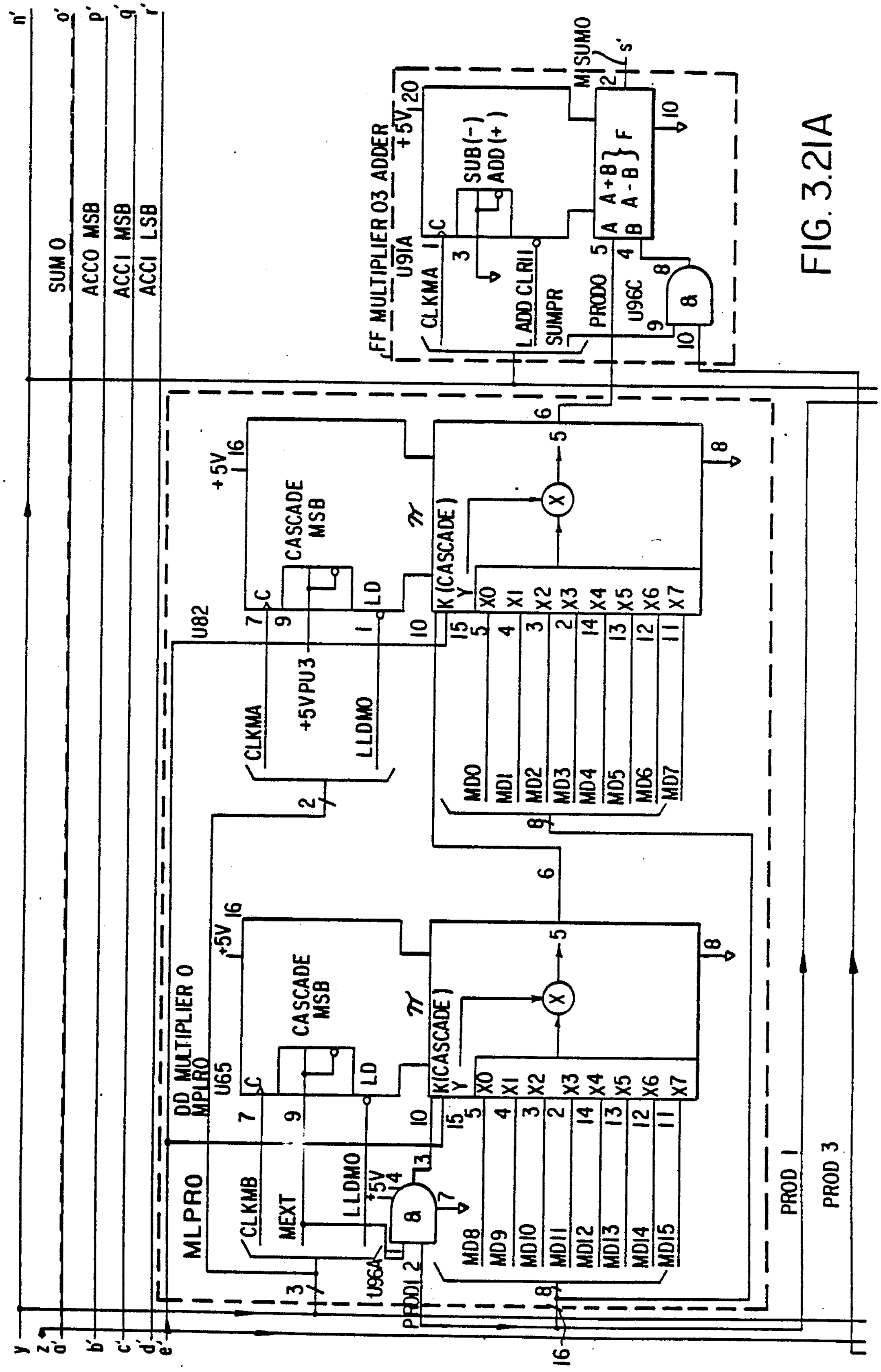
FIG. 3.21A

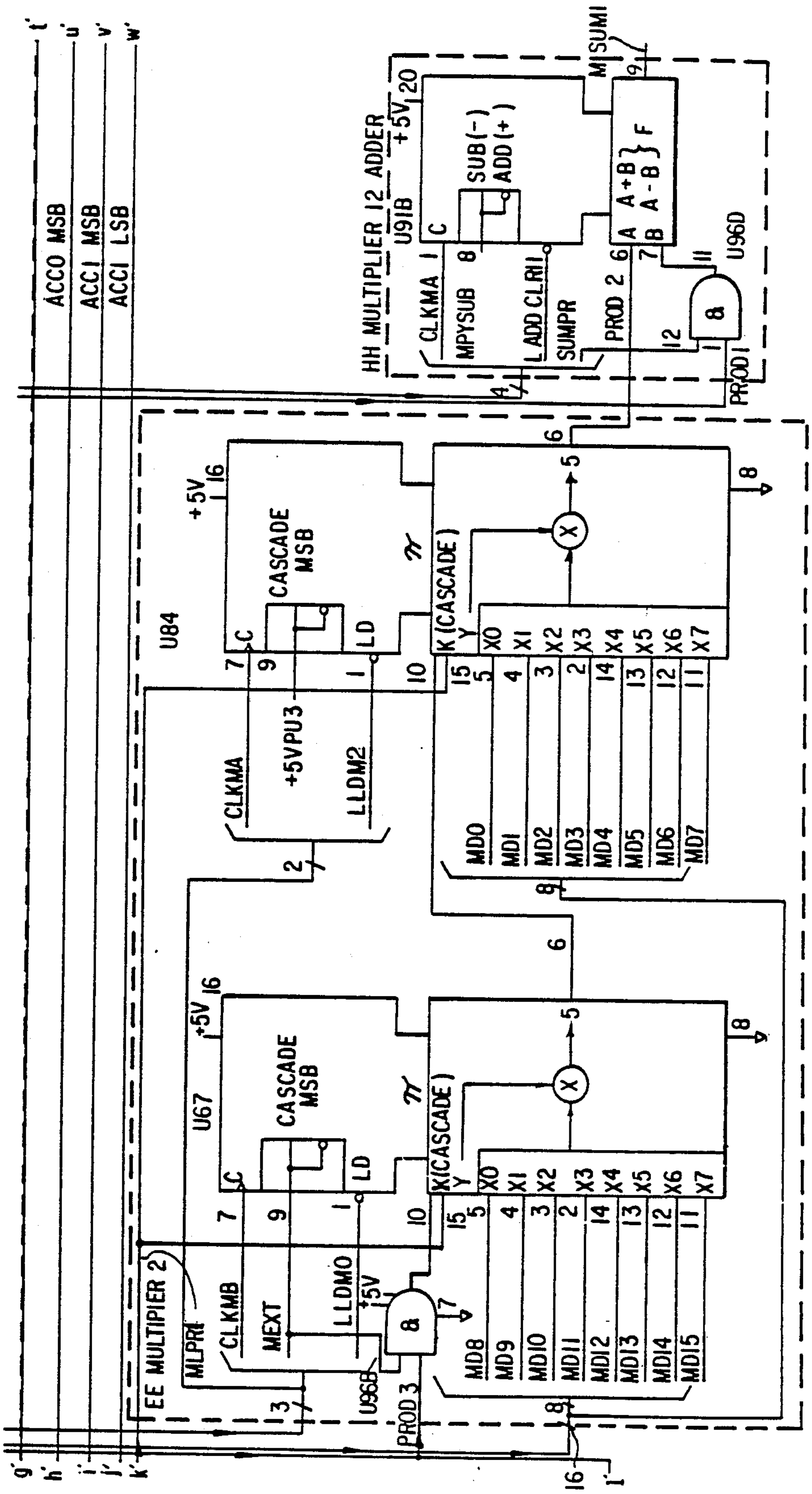
FIG. 3.21B

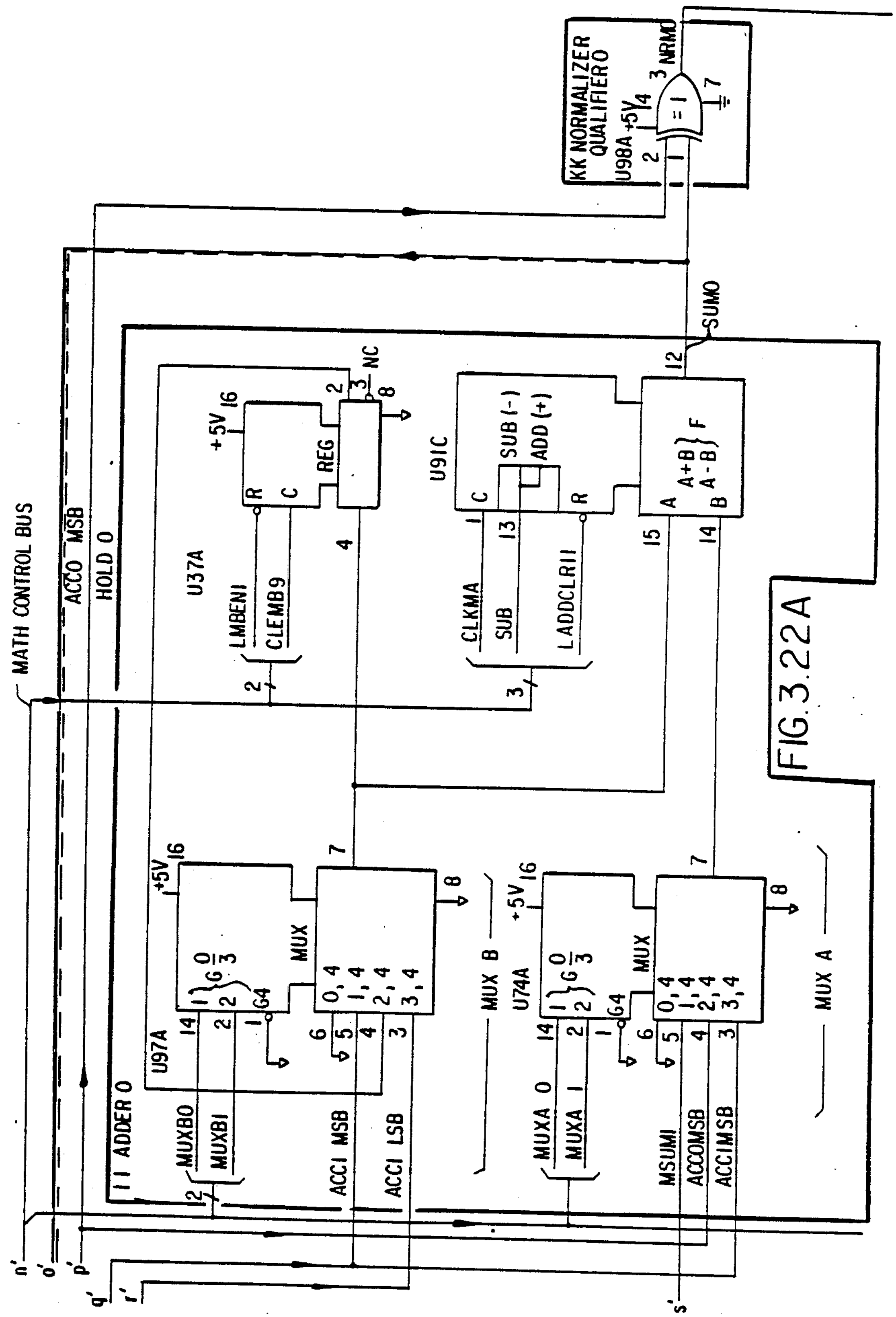
FIG. 3.22A

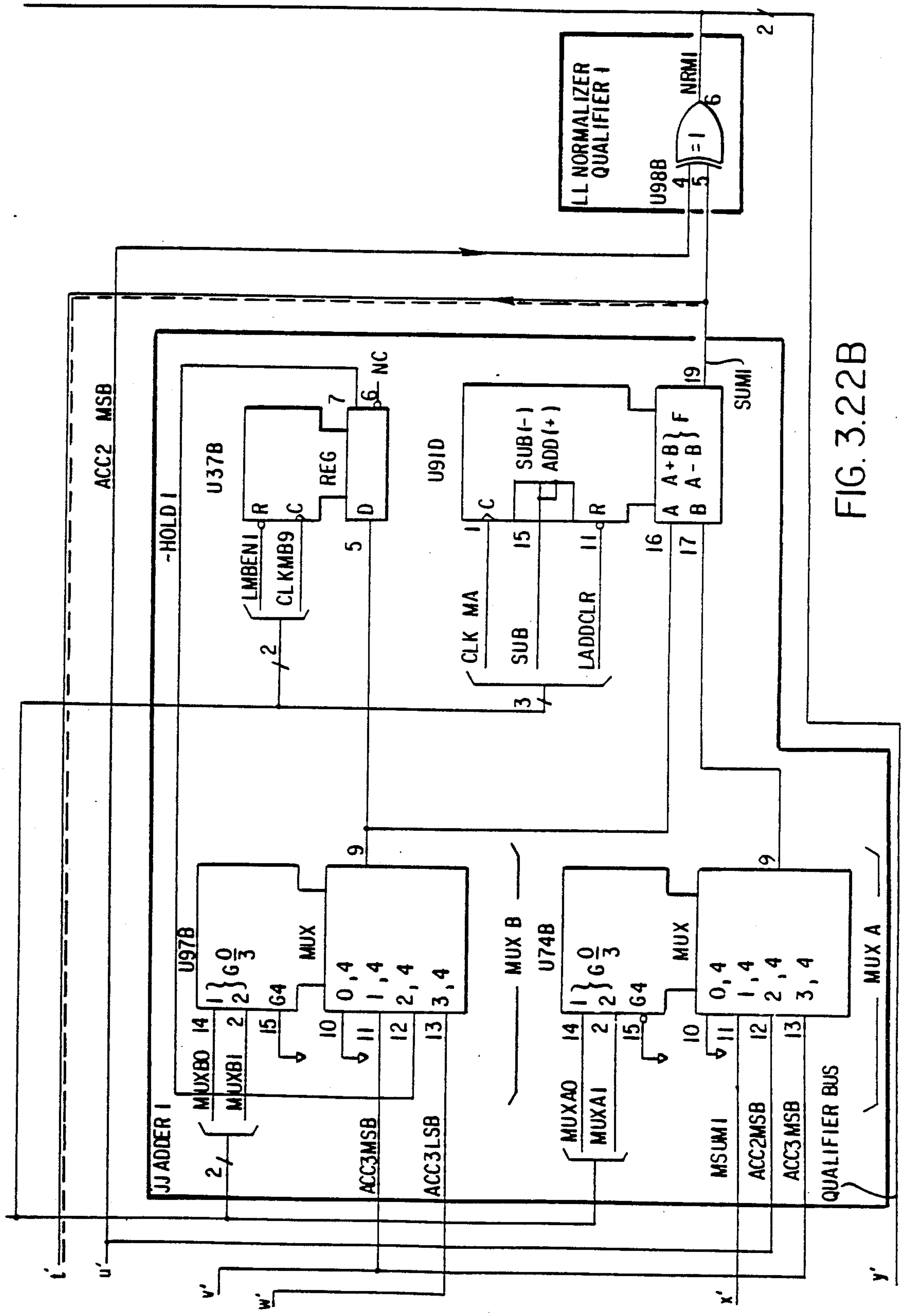
FIG. 3.22B

A13 BUBBLE MEMORY 147
08510-60013

ACTIVE COMPONENTS PARTS LISTS (U's and Q's)

| Reference Designators | Part Number | Manufacturer's Part Number |
|---|---|---|
| Q1 | 1854-0477 | 2N2222A |
| Q2, Q3 | 1855-0423 | |
| U2,4,23,25 | 1858-0081 | I7254 |
| U1 | 1820-2520 | 75463 |
| U3,24 | 1820-2816 | I7250 |
| U5, 19 | 1820-2817 | I7242 |
| U7, 17 | 1820-2807 | BUBBLE 1MX1 |
| U8, 16 | 1820-2818 | I7230 |
| U9 | 1820-1197 | 74LS00 |
| U10 | 1820-2806 | I7220 |
| U11 | 1820-2024 | 74LS244 |
| U12 | 1820-1730 | 74LS273 |
| U13 | 1820-2075 | 74LS245 |
| U14 | 1820-1112 | 74LS74 |
| U15 | 1820-1216 | 74LS138 |
| U20, 21 NOTE 3 | 1818-0850 | PROM 4KX8 02732 |
| U22 | 1820-1144 | 74LS02 |
| | | |
| | | |
| | | |
| | | |
| | | |
| | | |
| | | |
| | | |

FIG 3.24

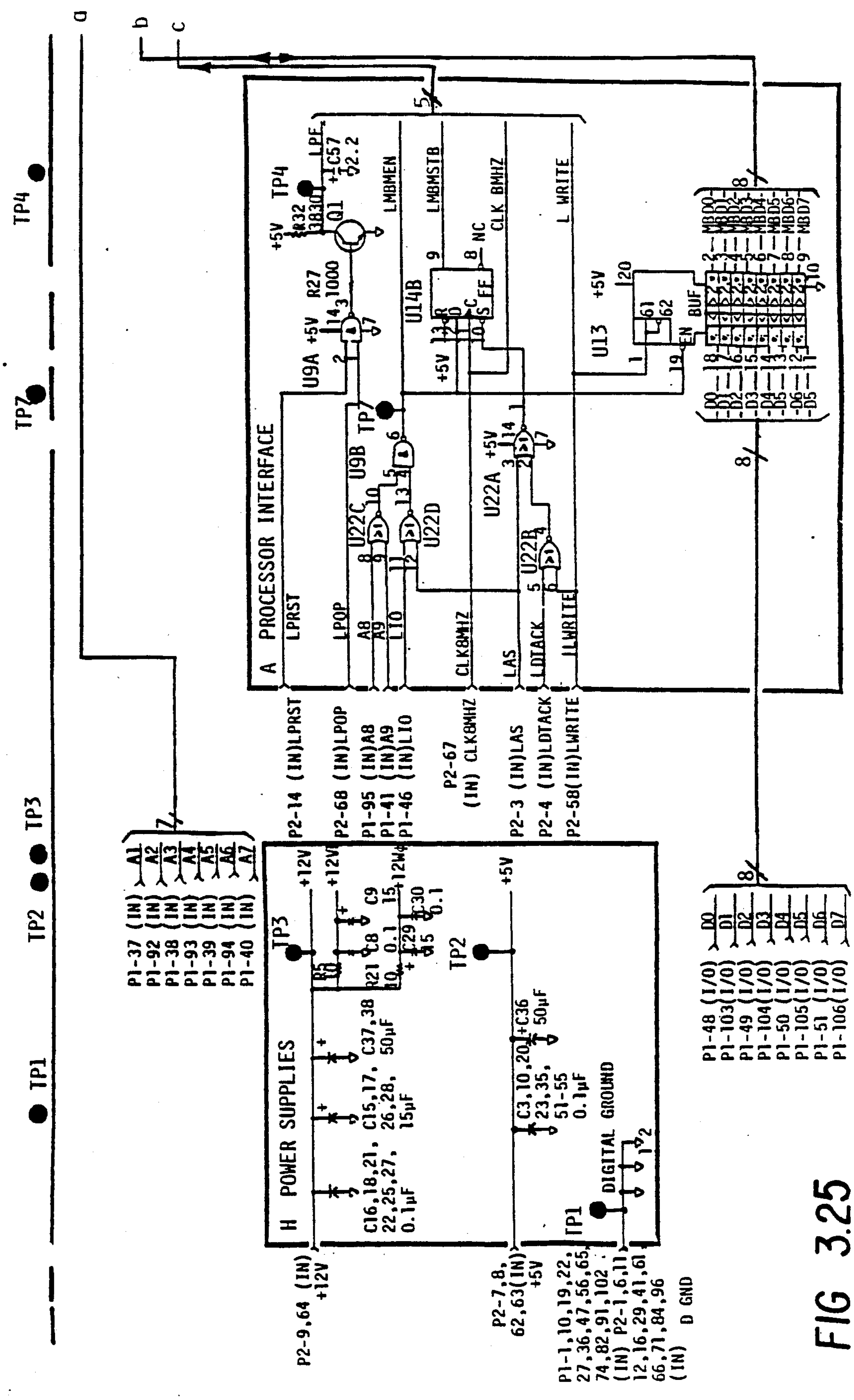
FIG 3.25

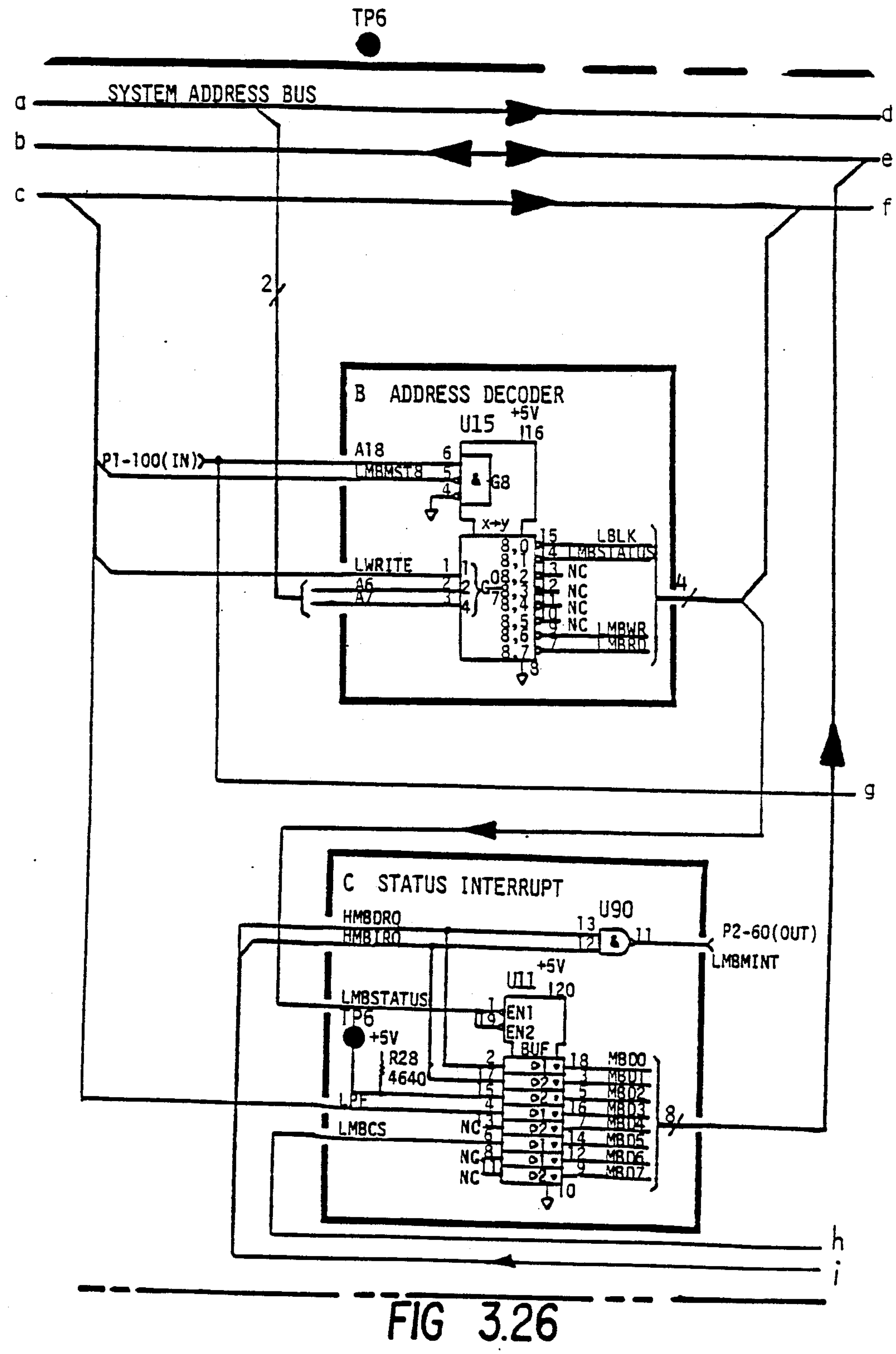
FIG 3.26

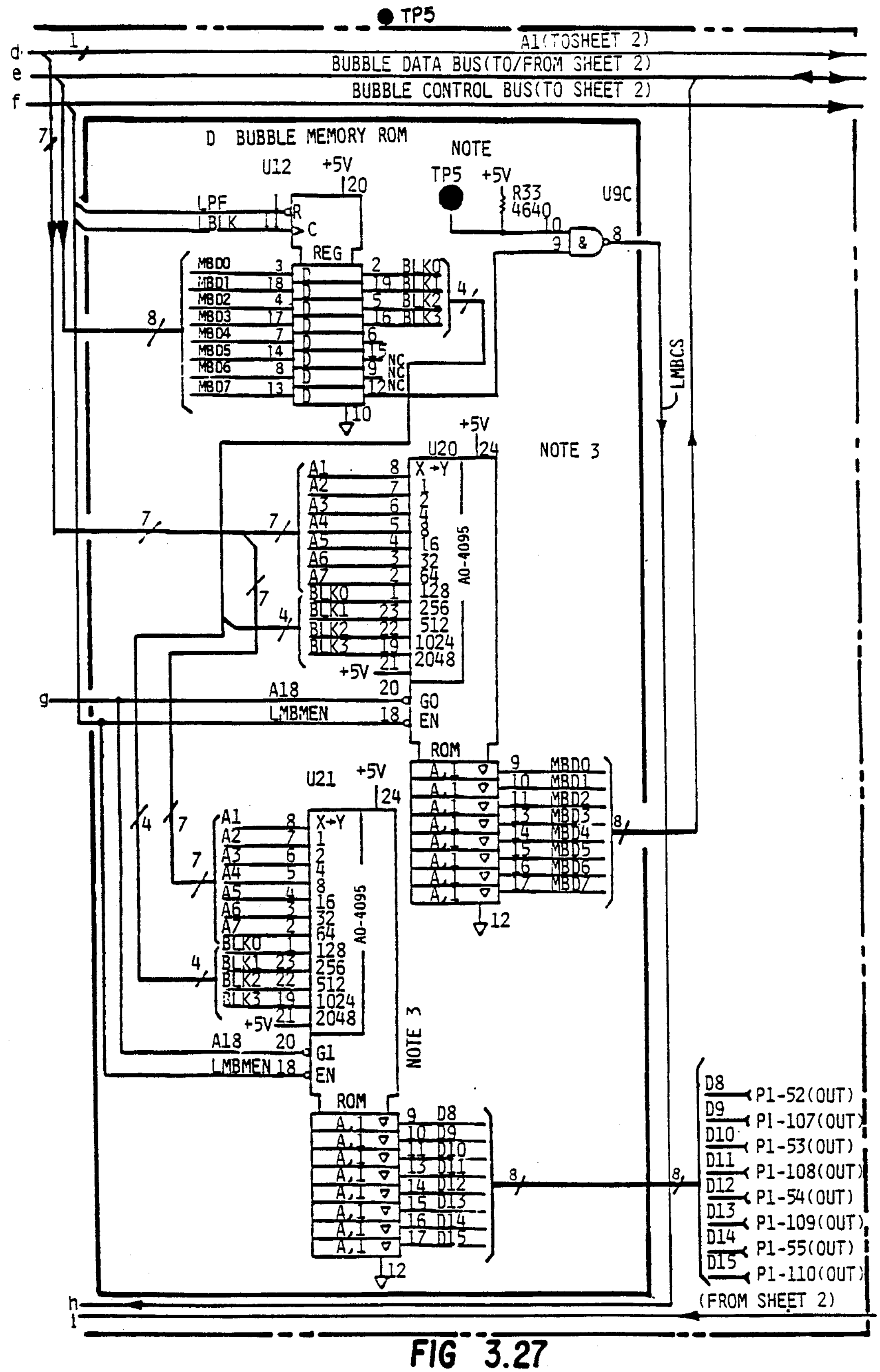
FIG 3.27

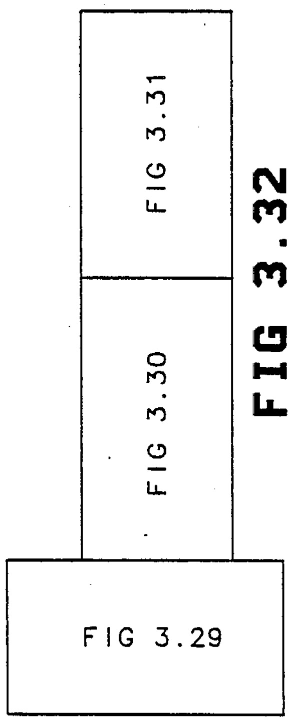
FIG 3.32
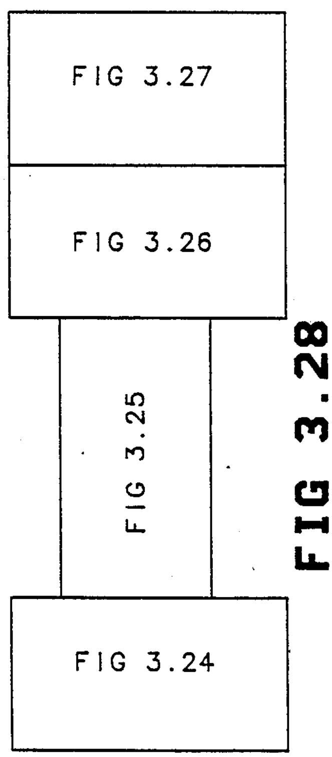
FIG 3.28
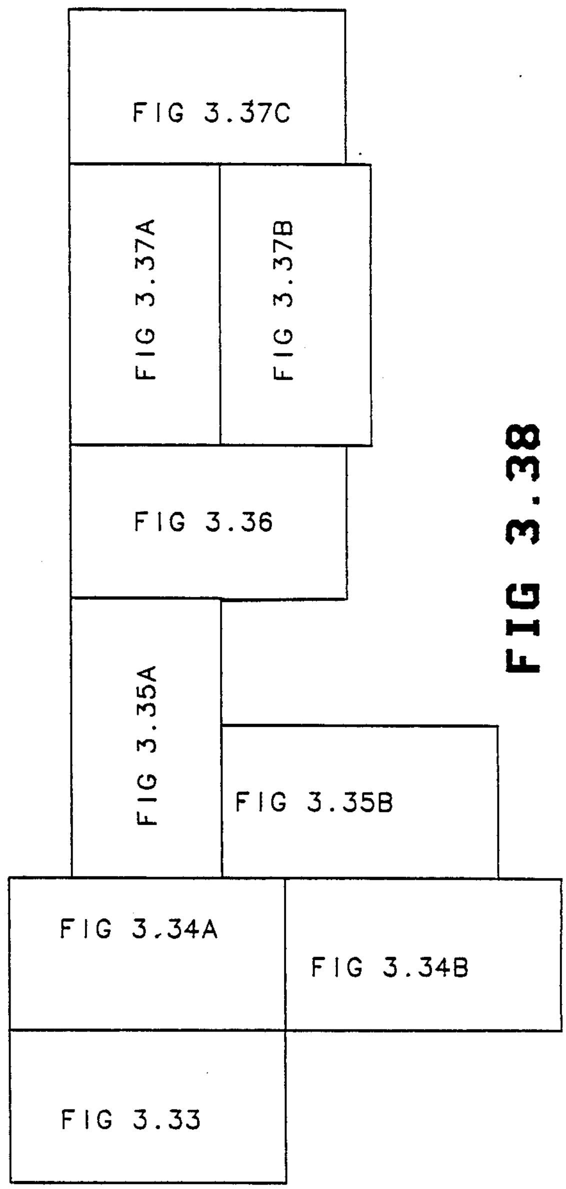
FIG 3.38

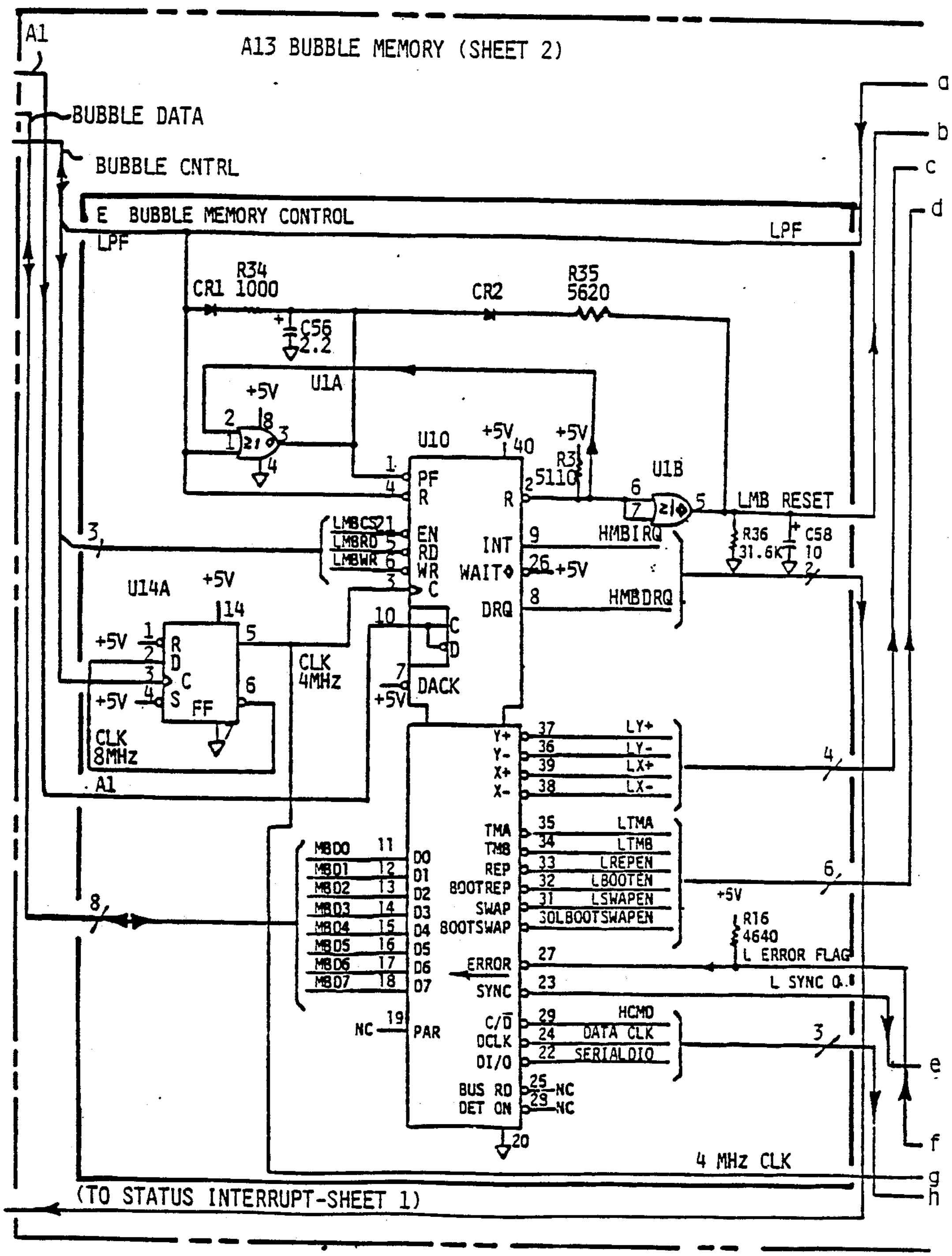
FIG 3.29

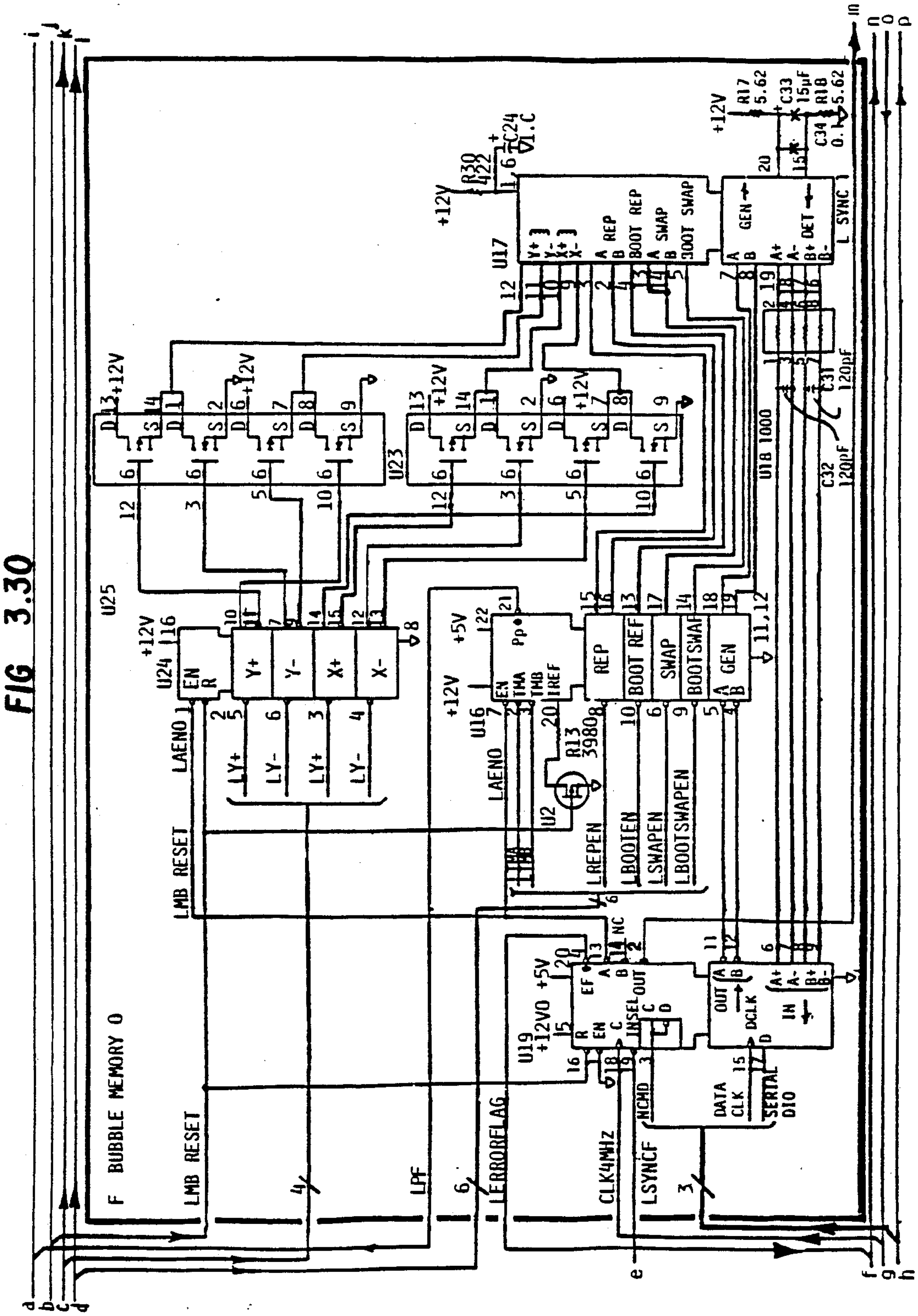
FIG 3.30

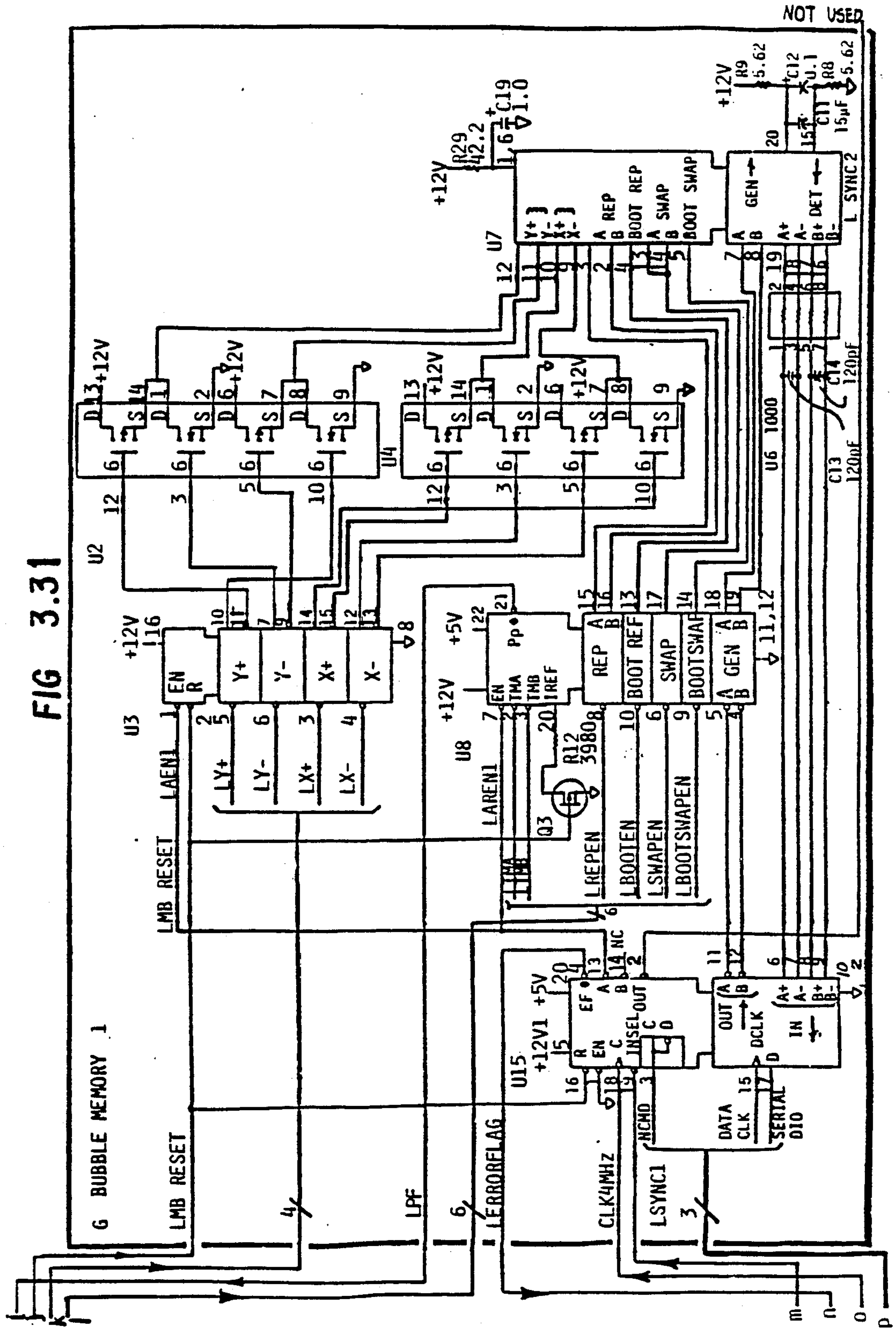
FIG 3.31

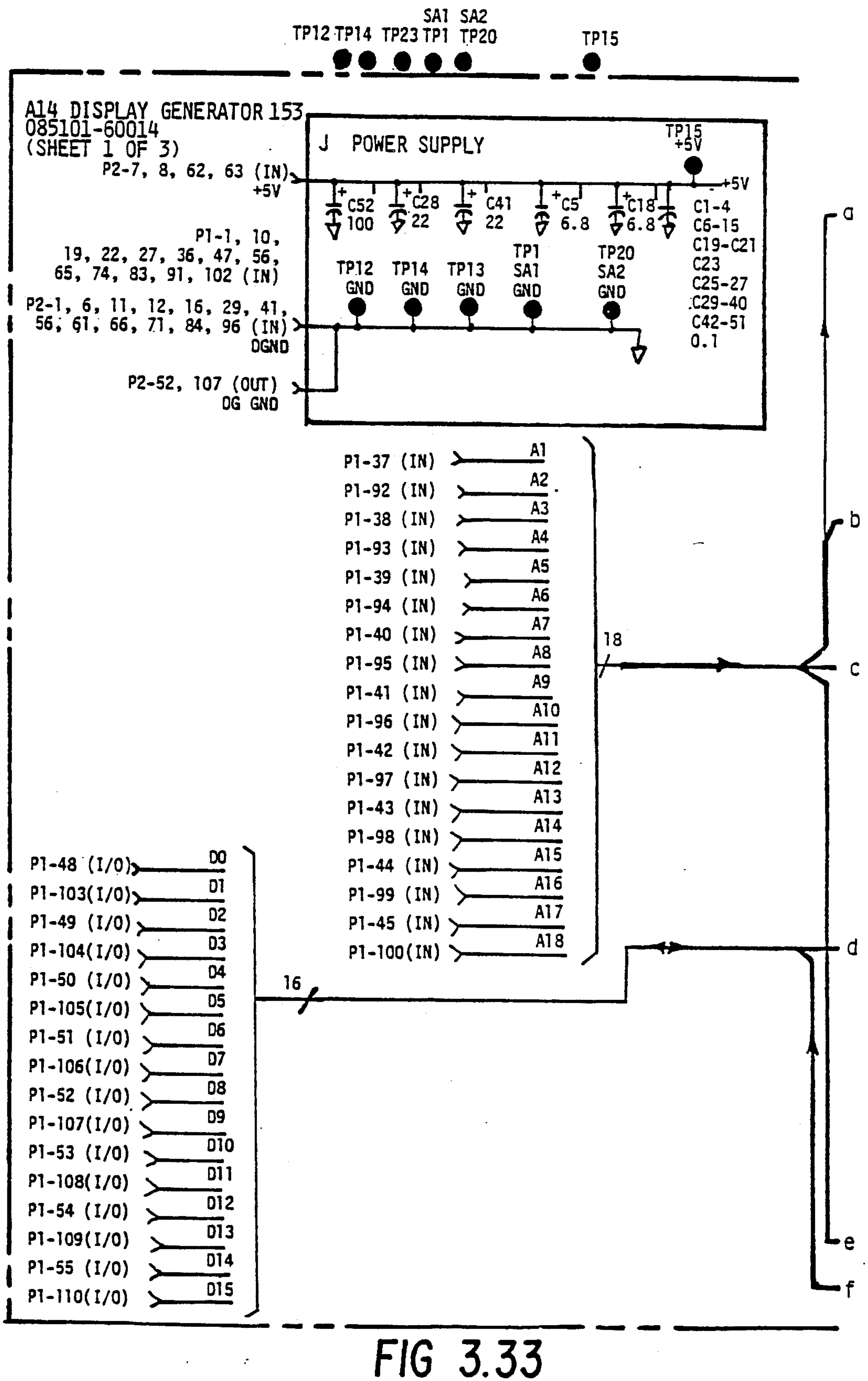
FIG 3.33

FIG. 3.34A
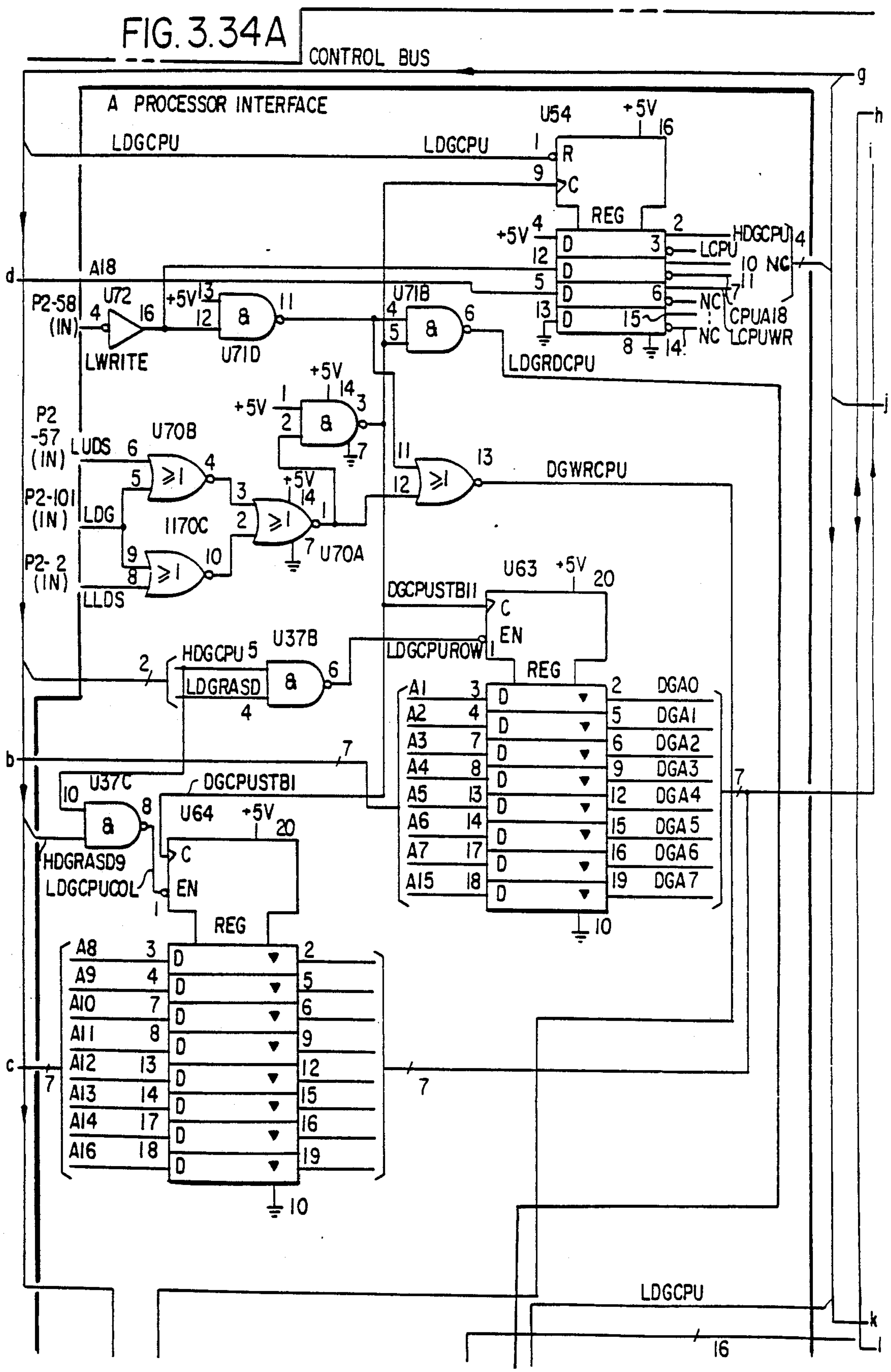

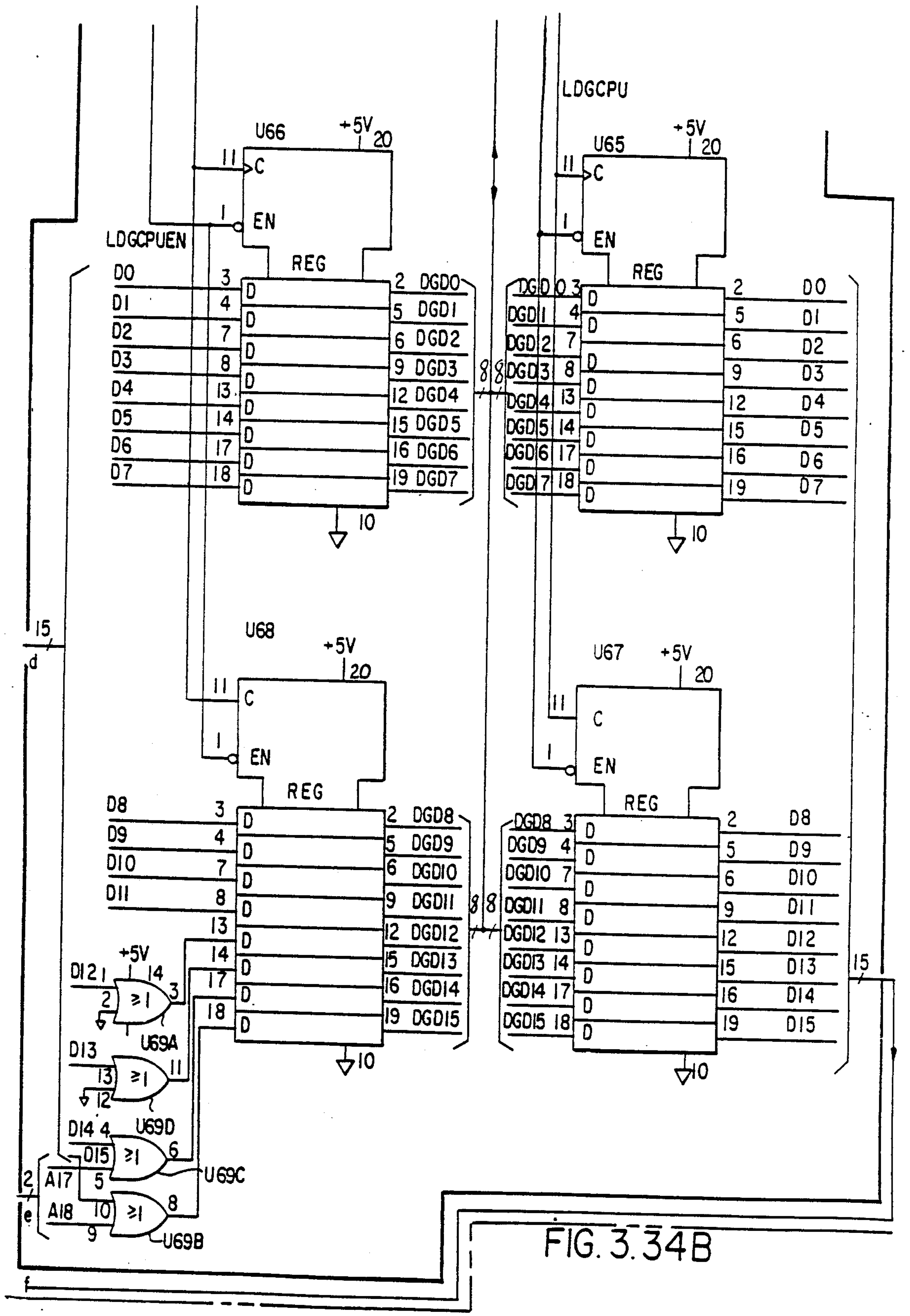
FIG. 3.34B

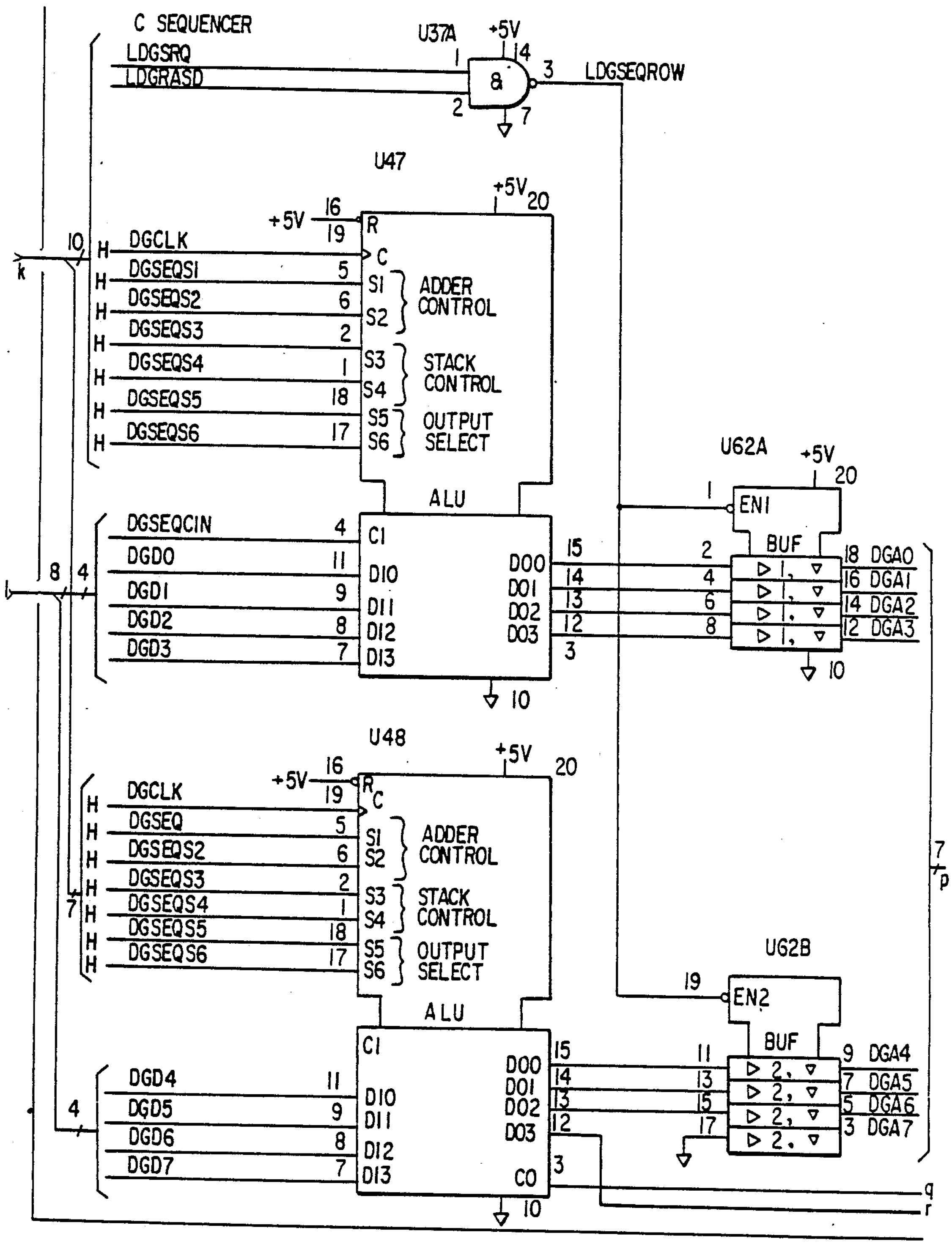
FIG. 3.35B

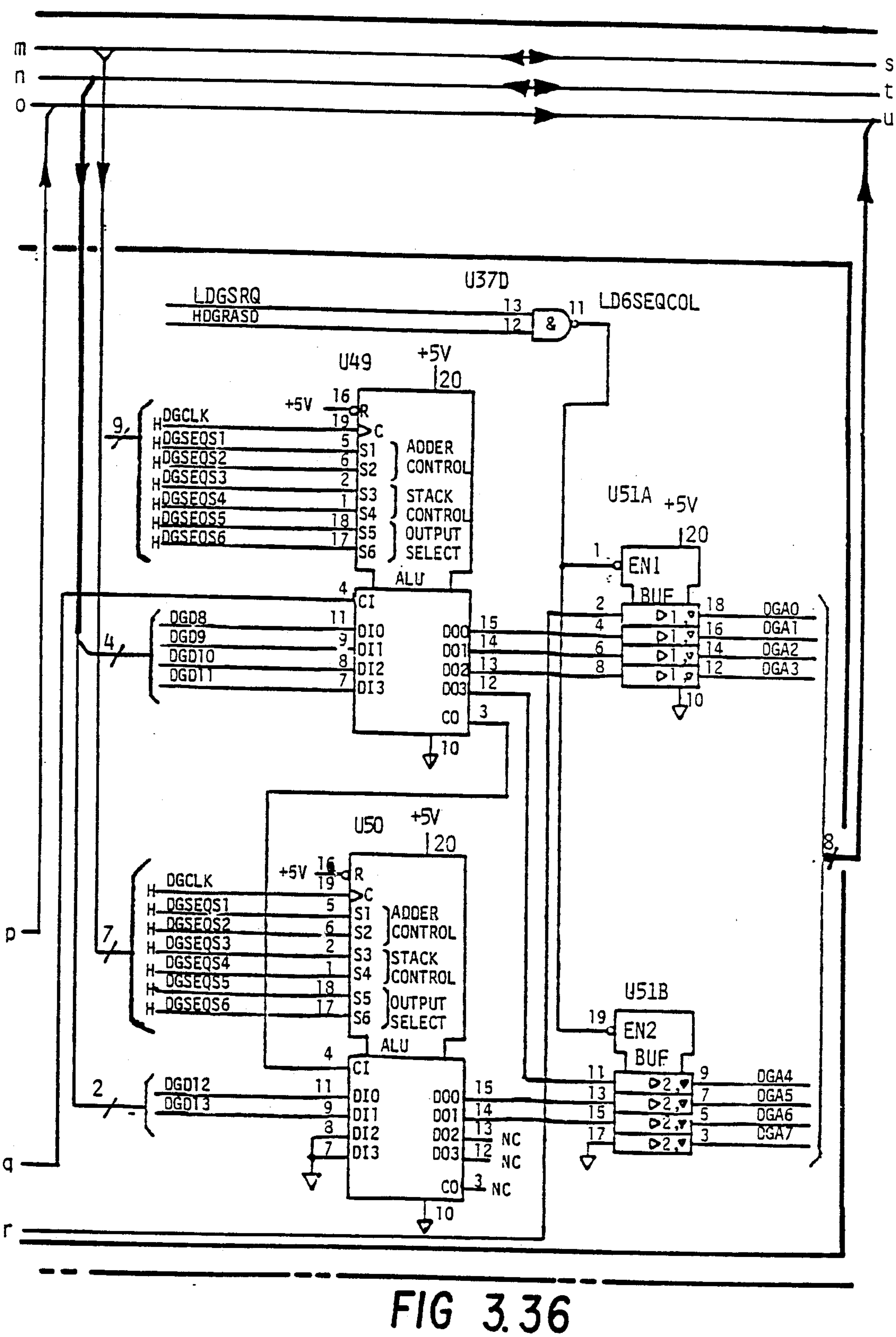
FIG 3.36

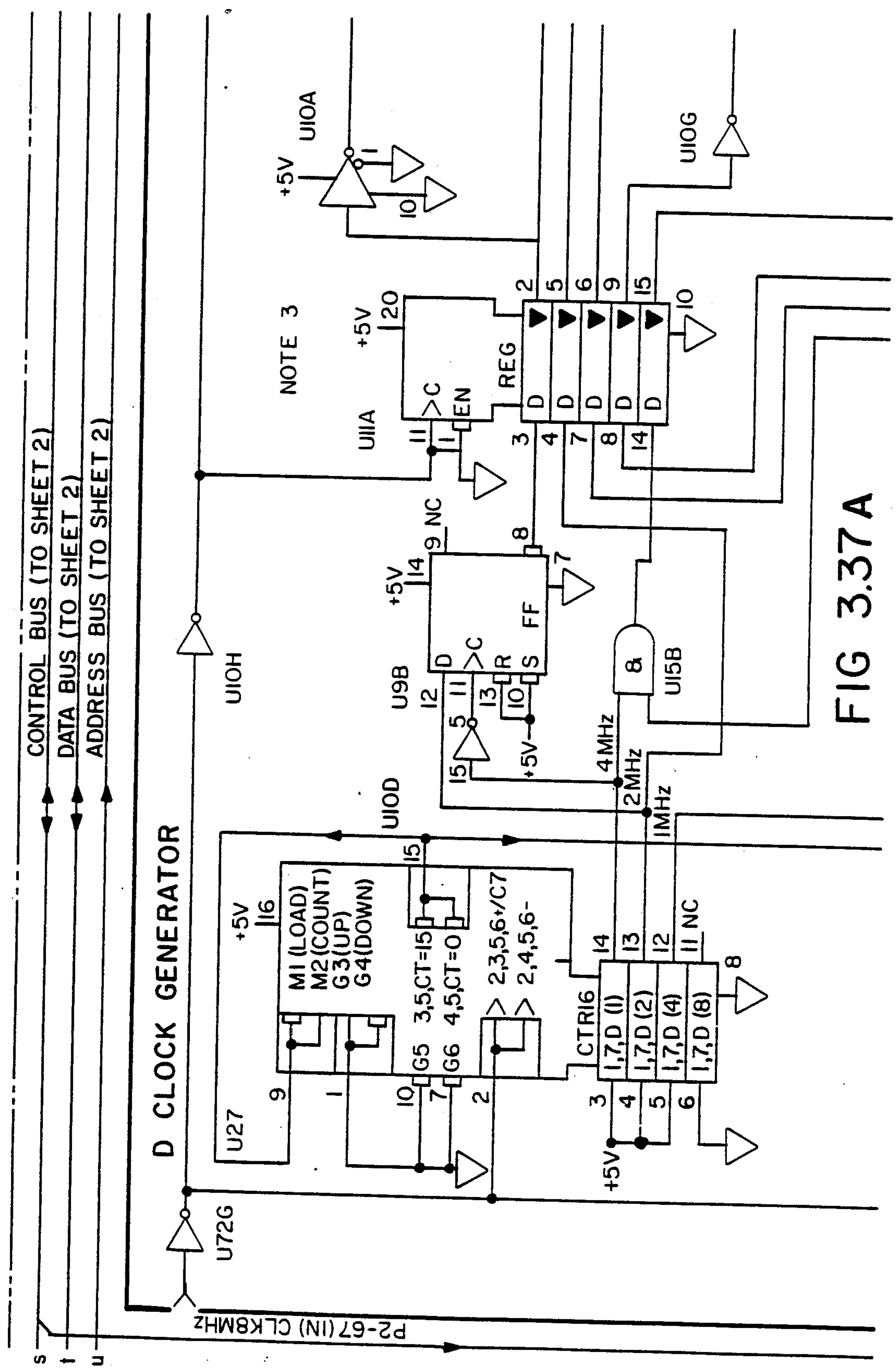
FIG 3.37A

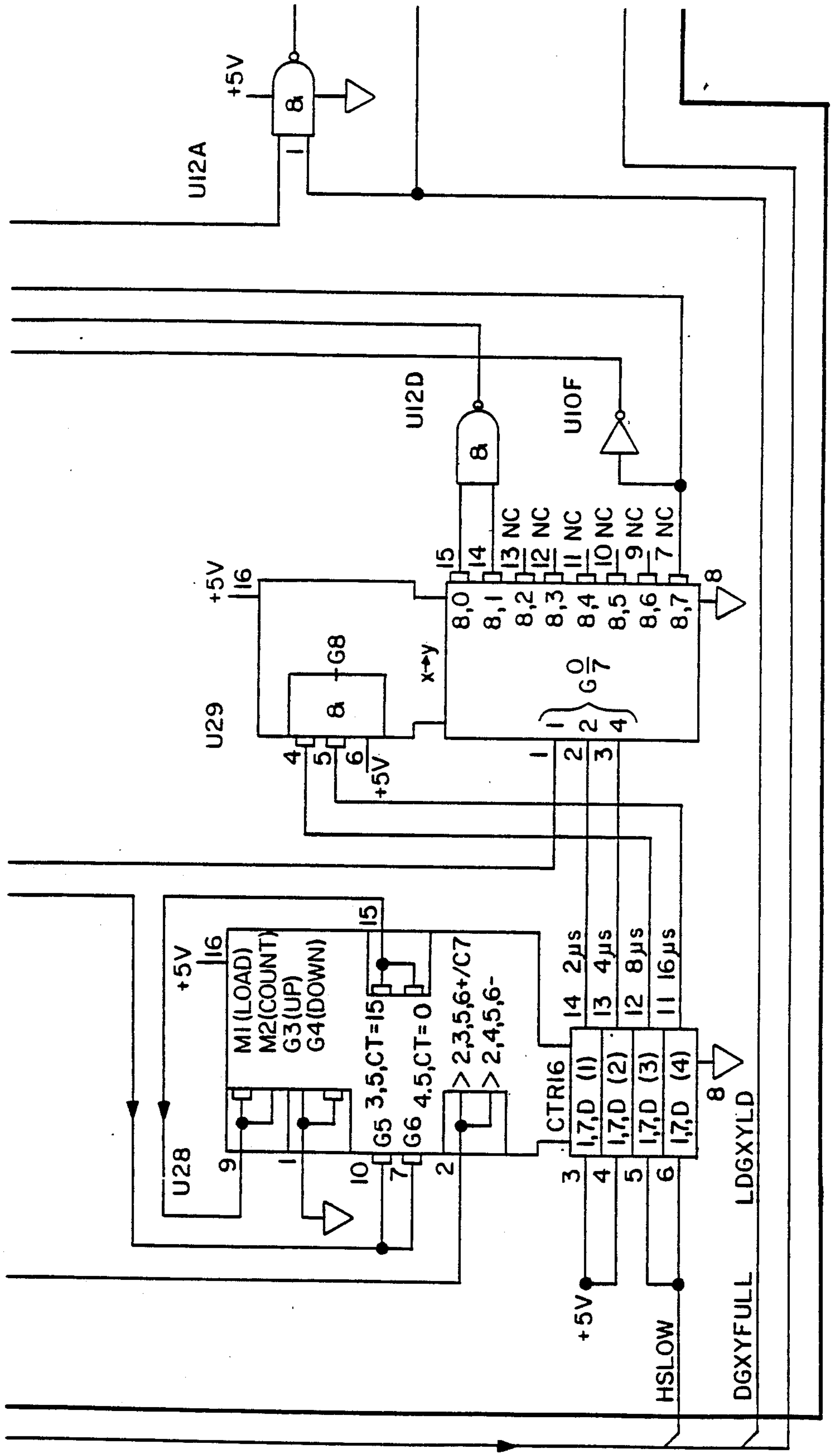
FIG 3.37B

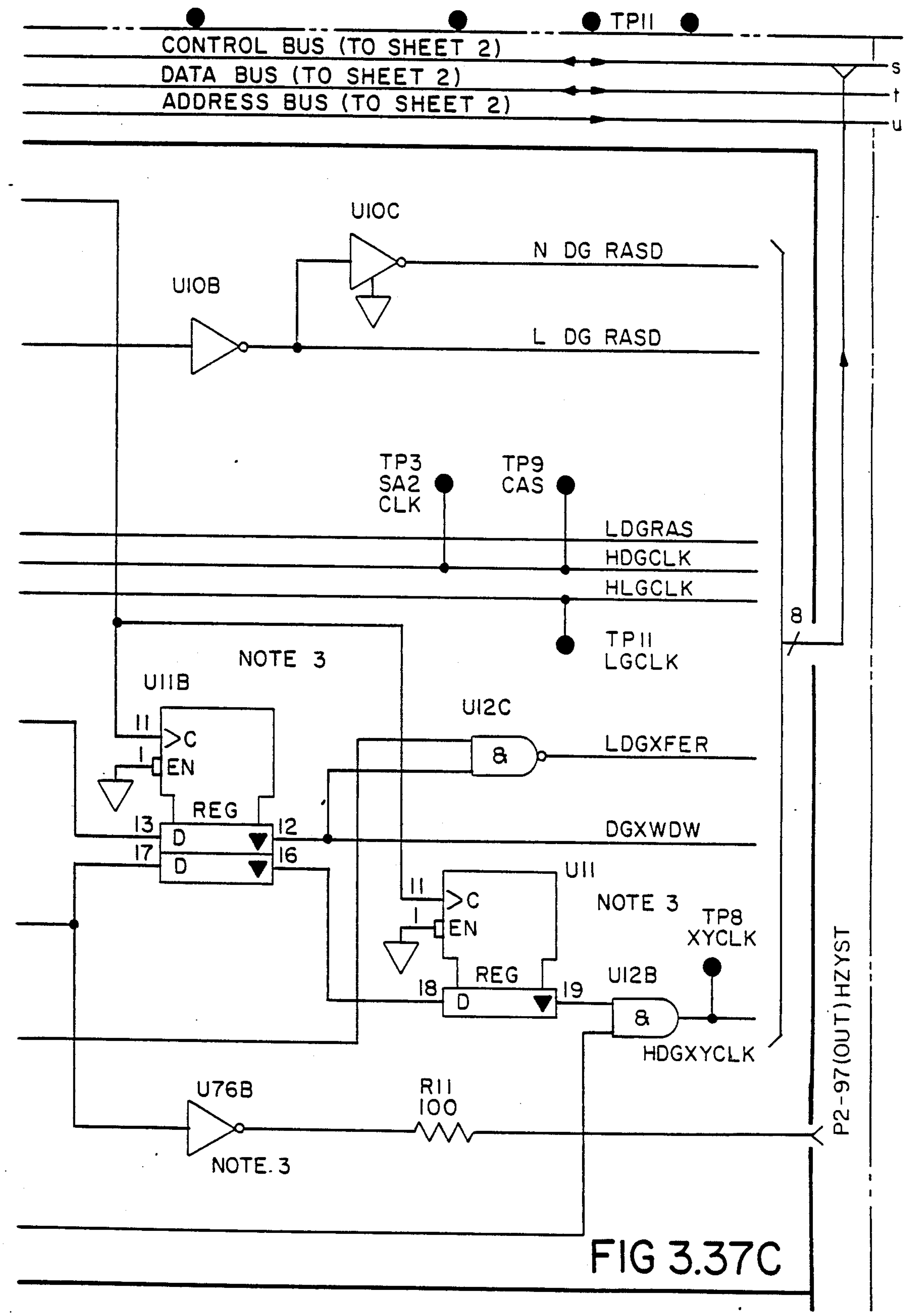
FIG 3.37C

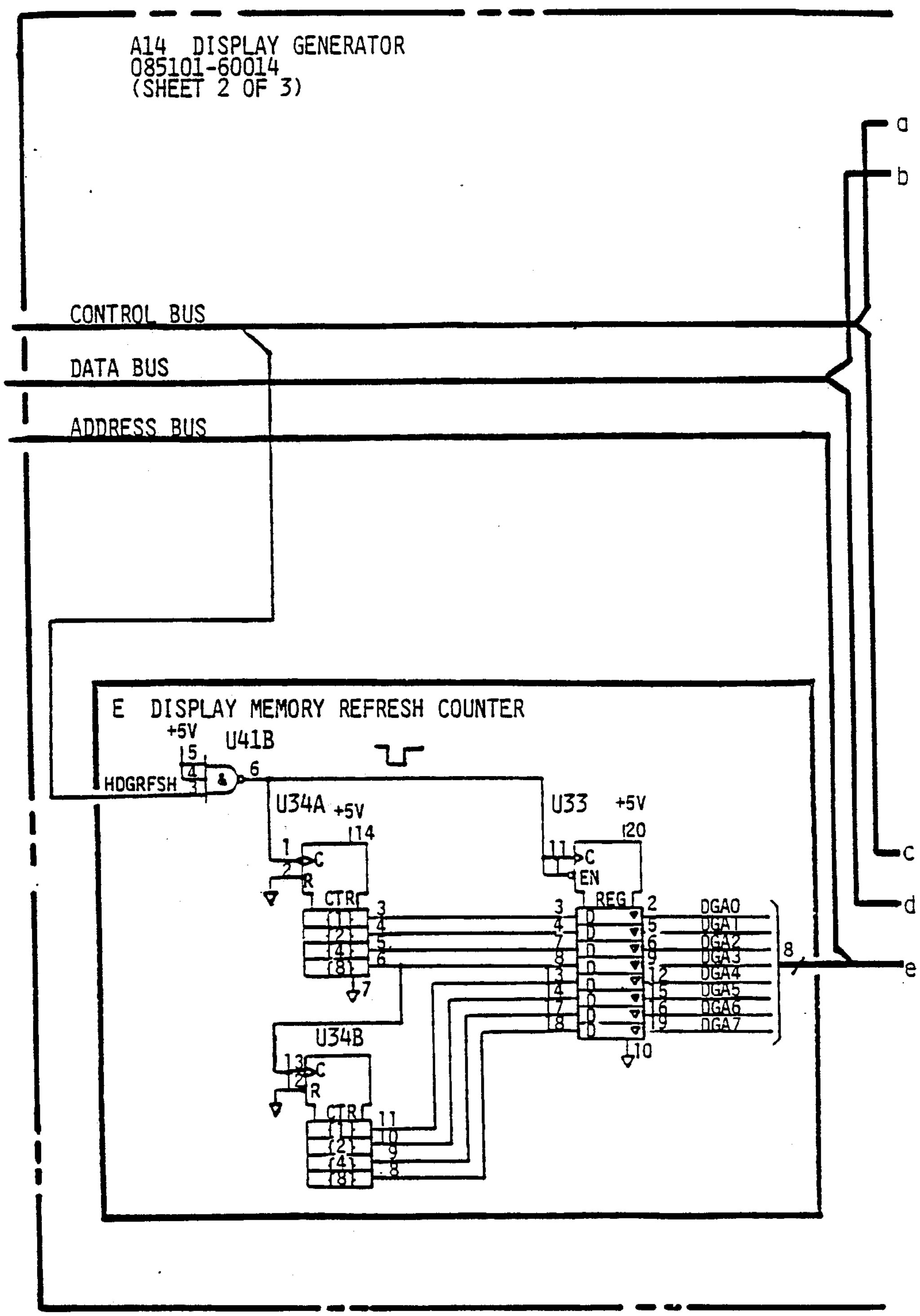
FIG 3.39

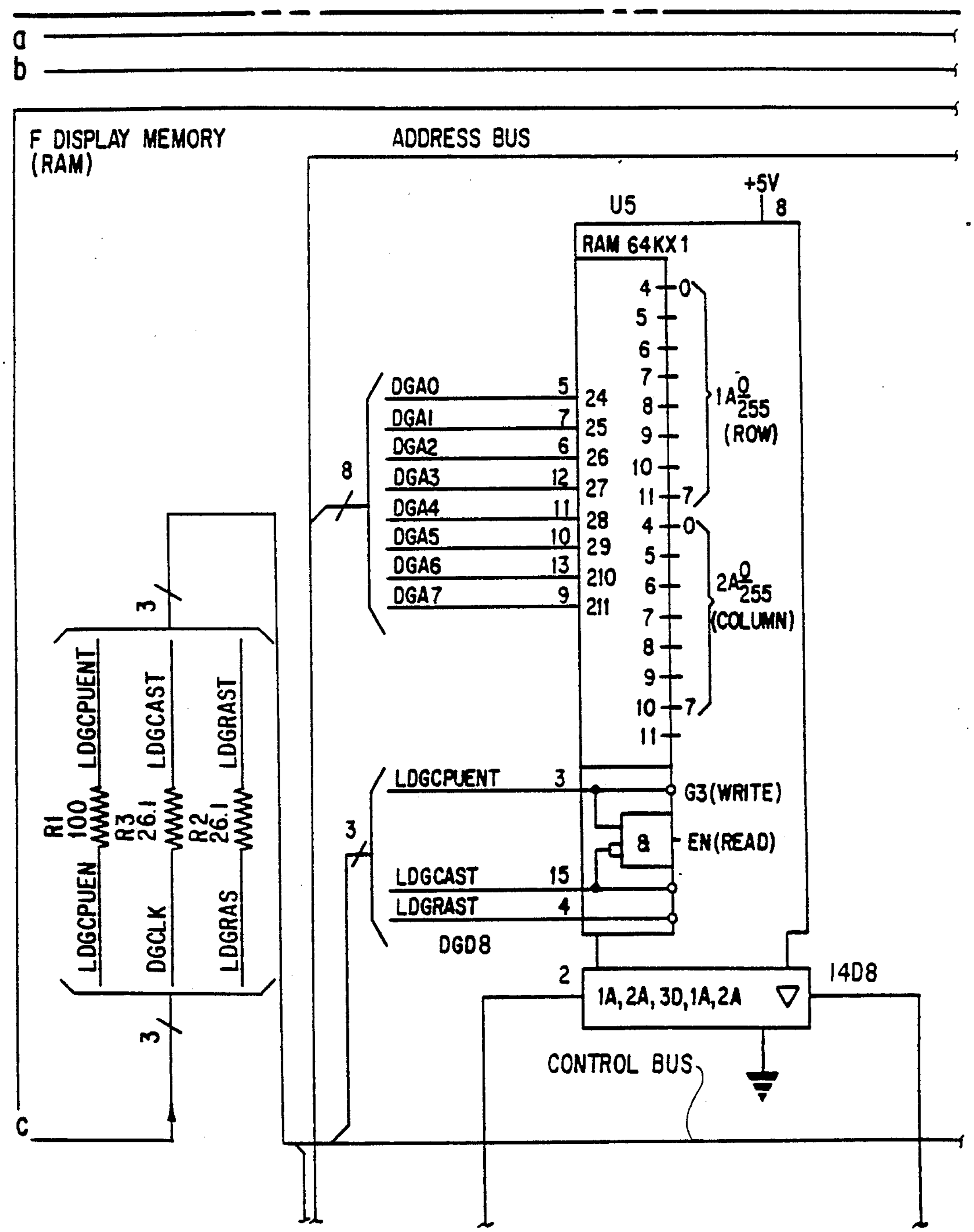
FIG. 3.40A

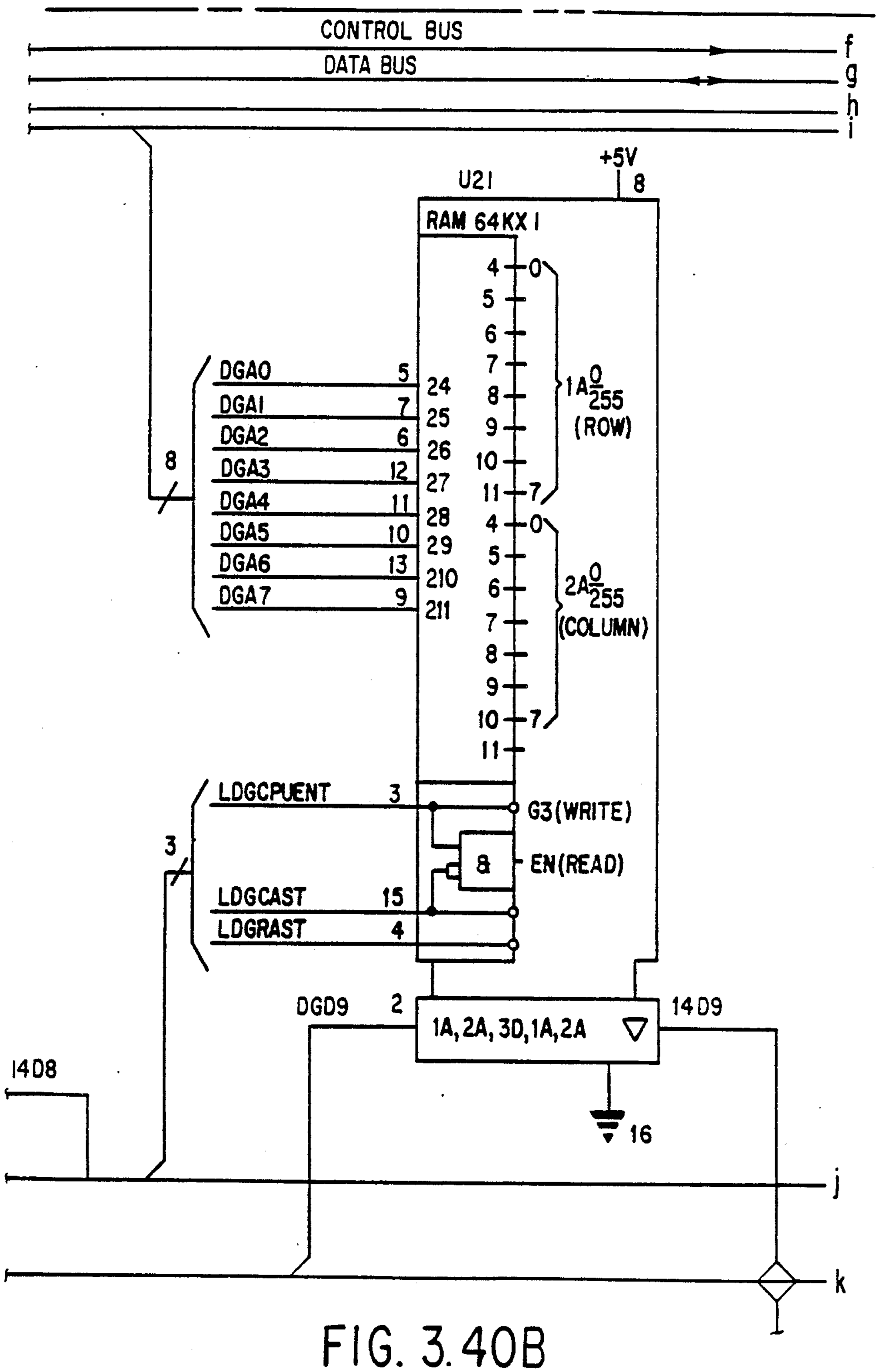
FIG. 3.40B

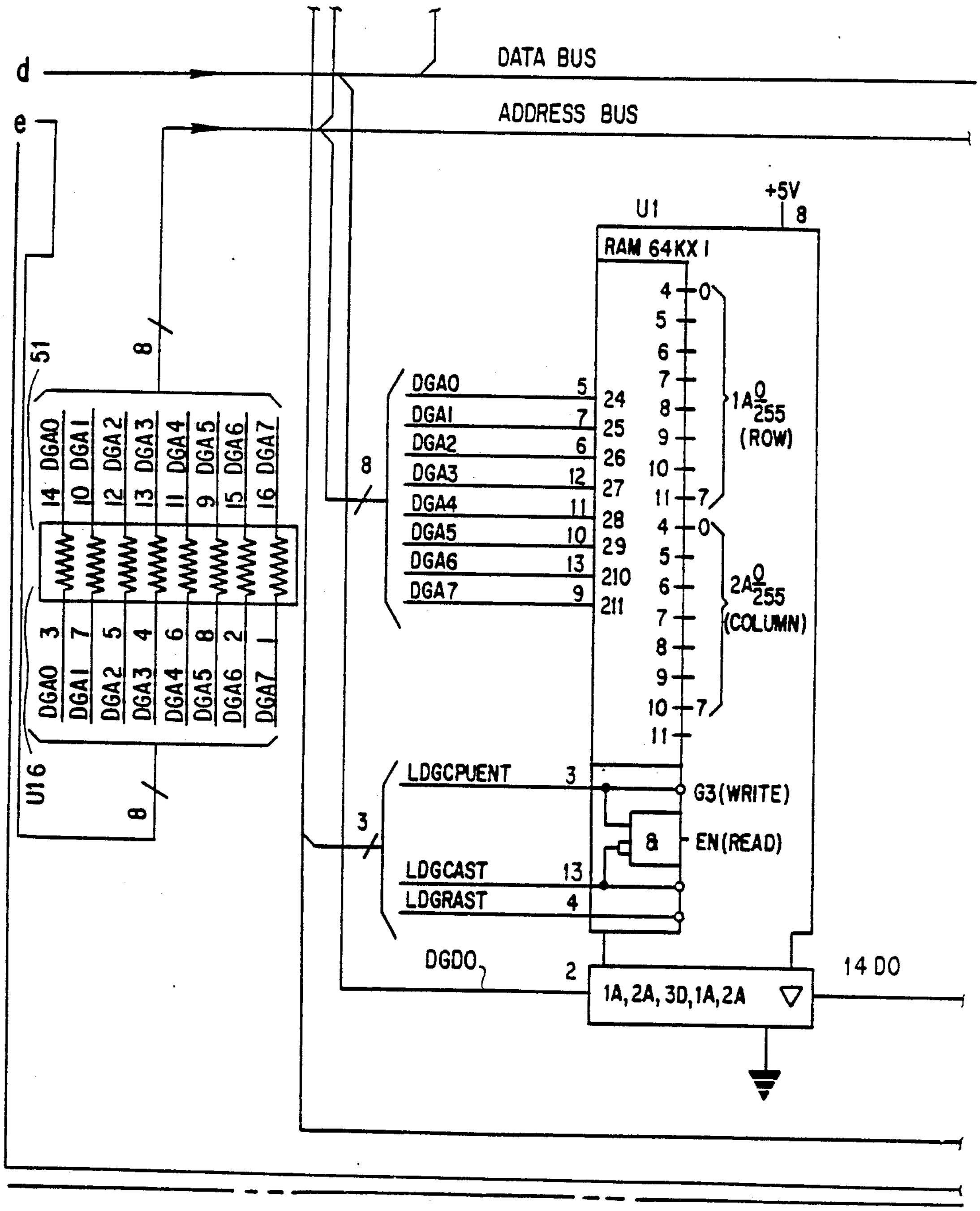
FIG. 3.40C

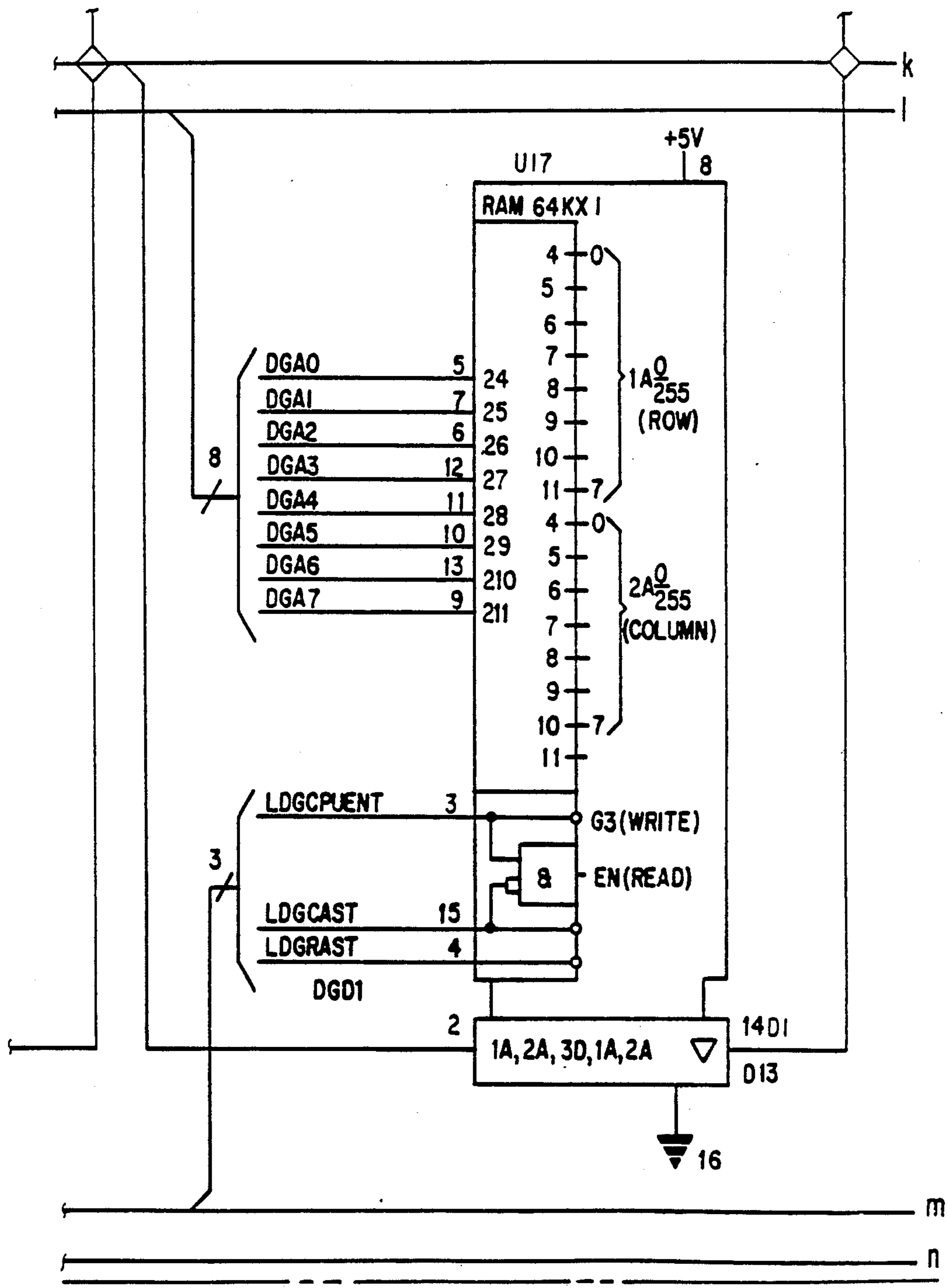
FIG. 3.40D

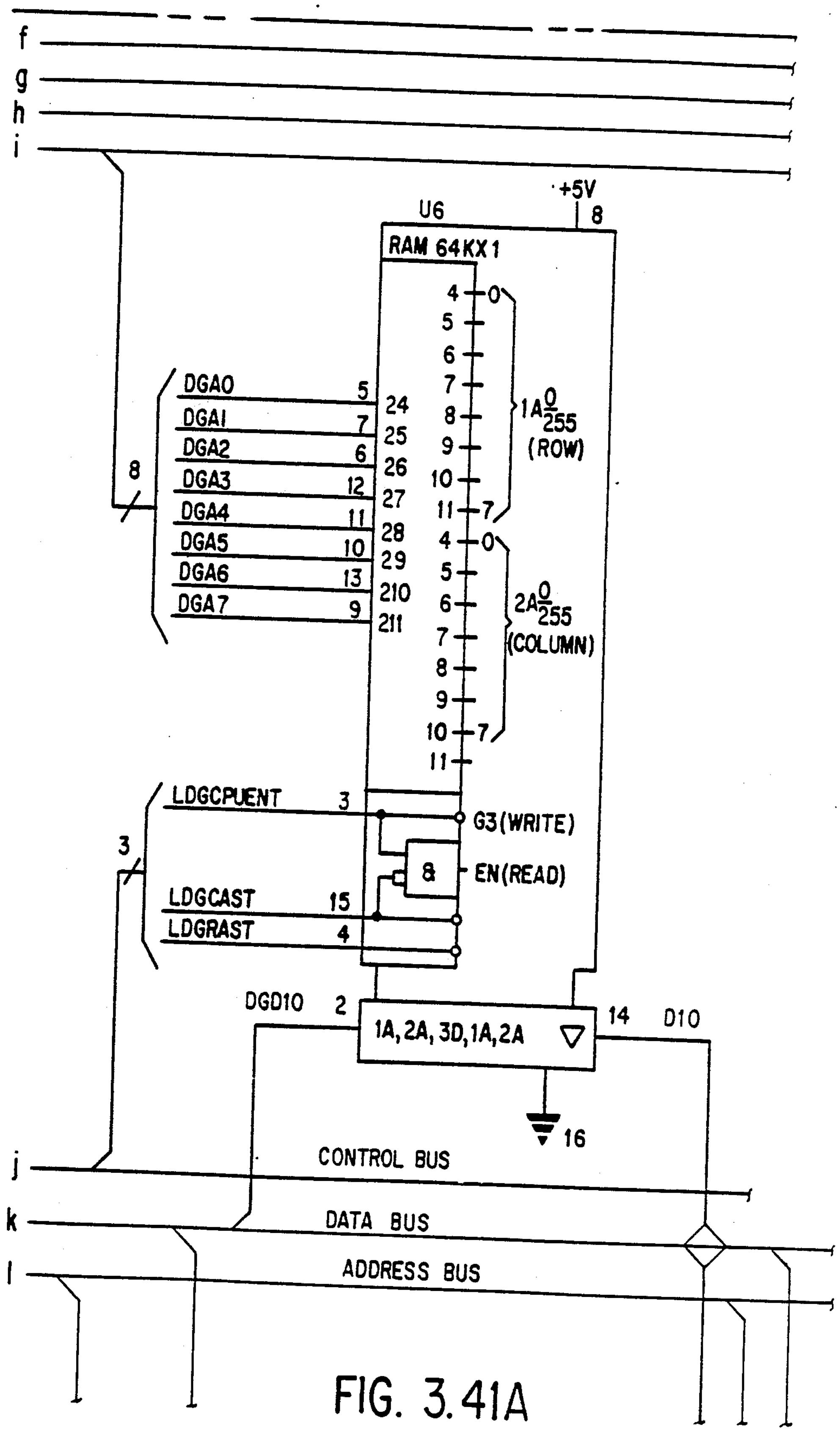
FIG. 3.41A

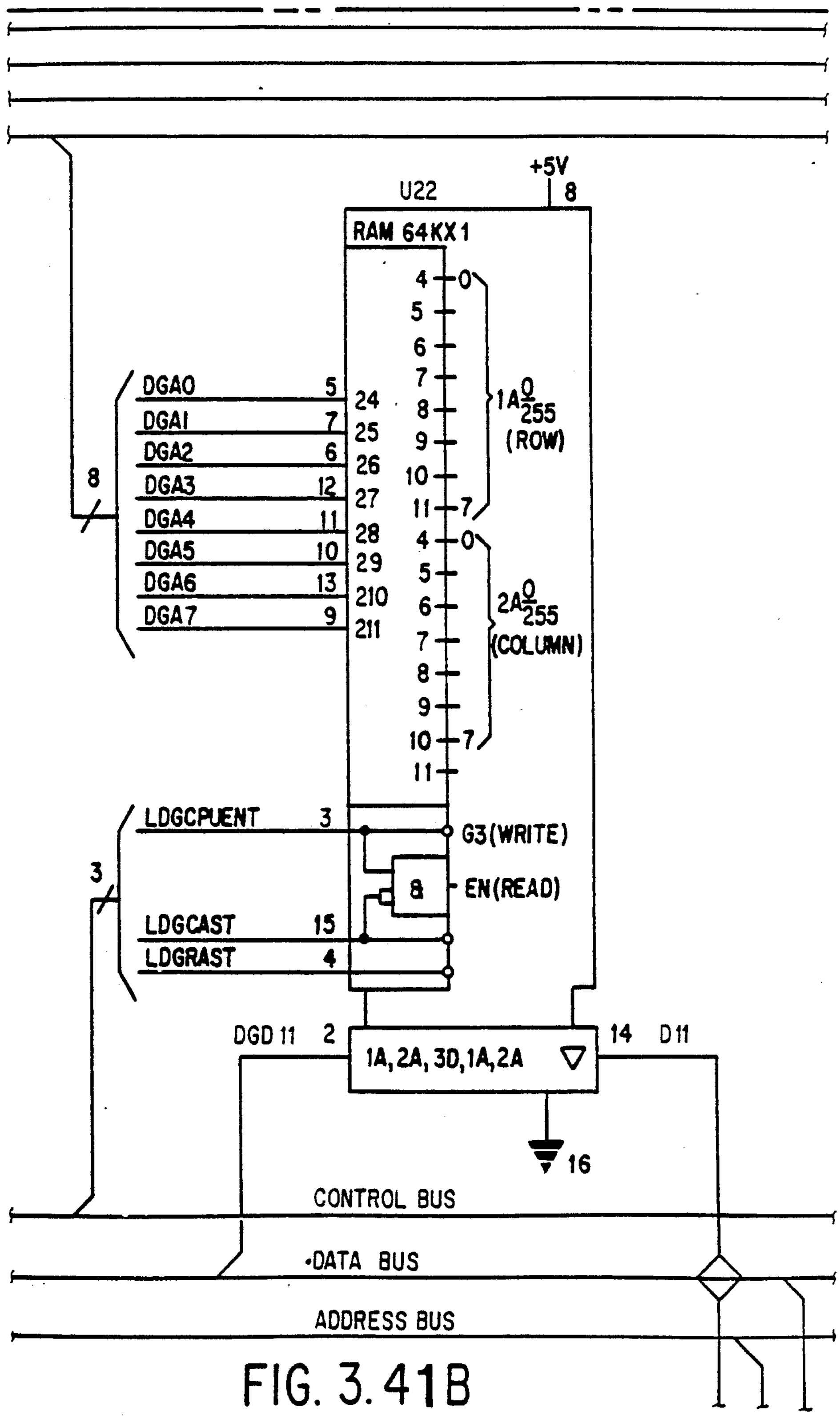
FIG. 3.41B

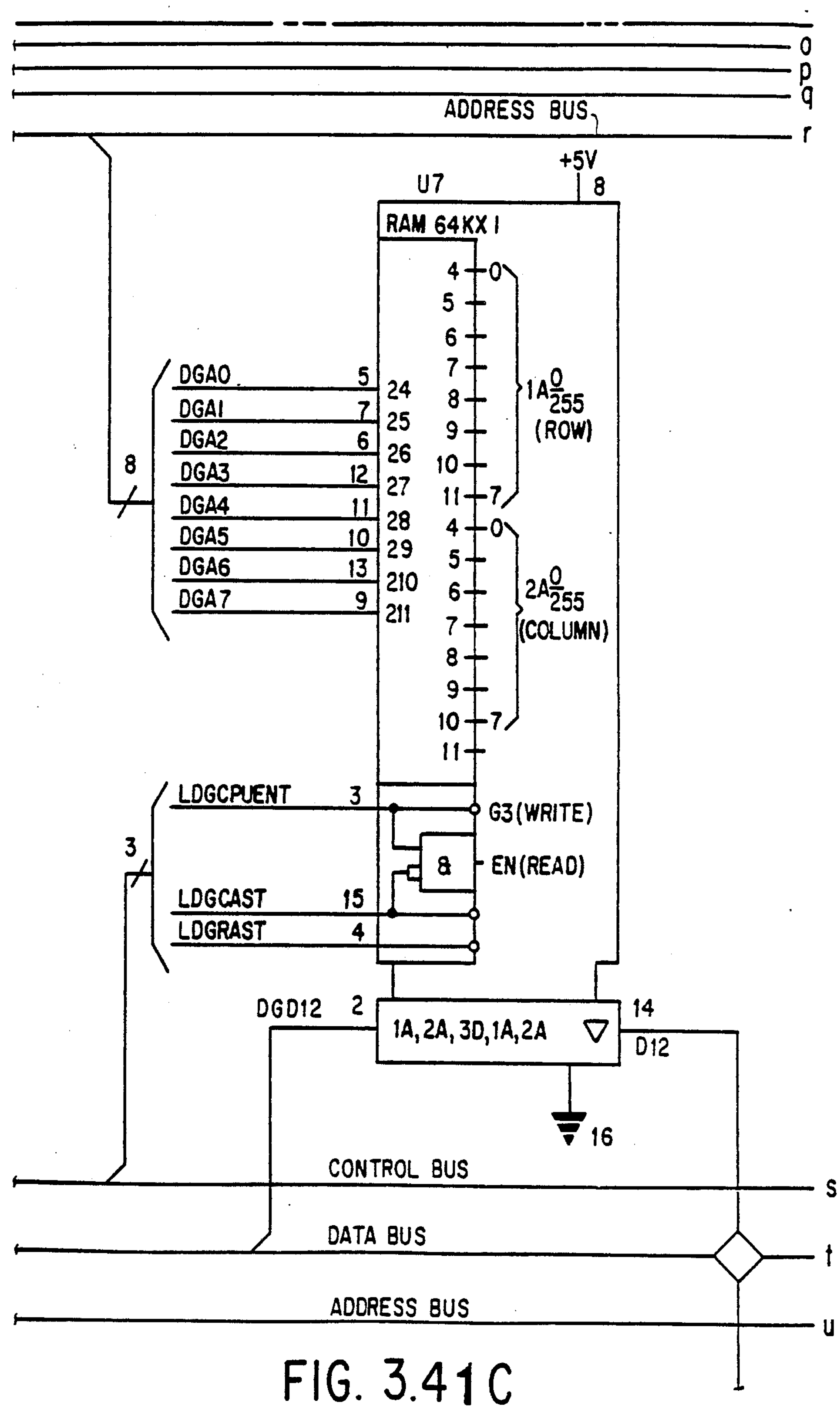
FIG. 3.41C

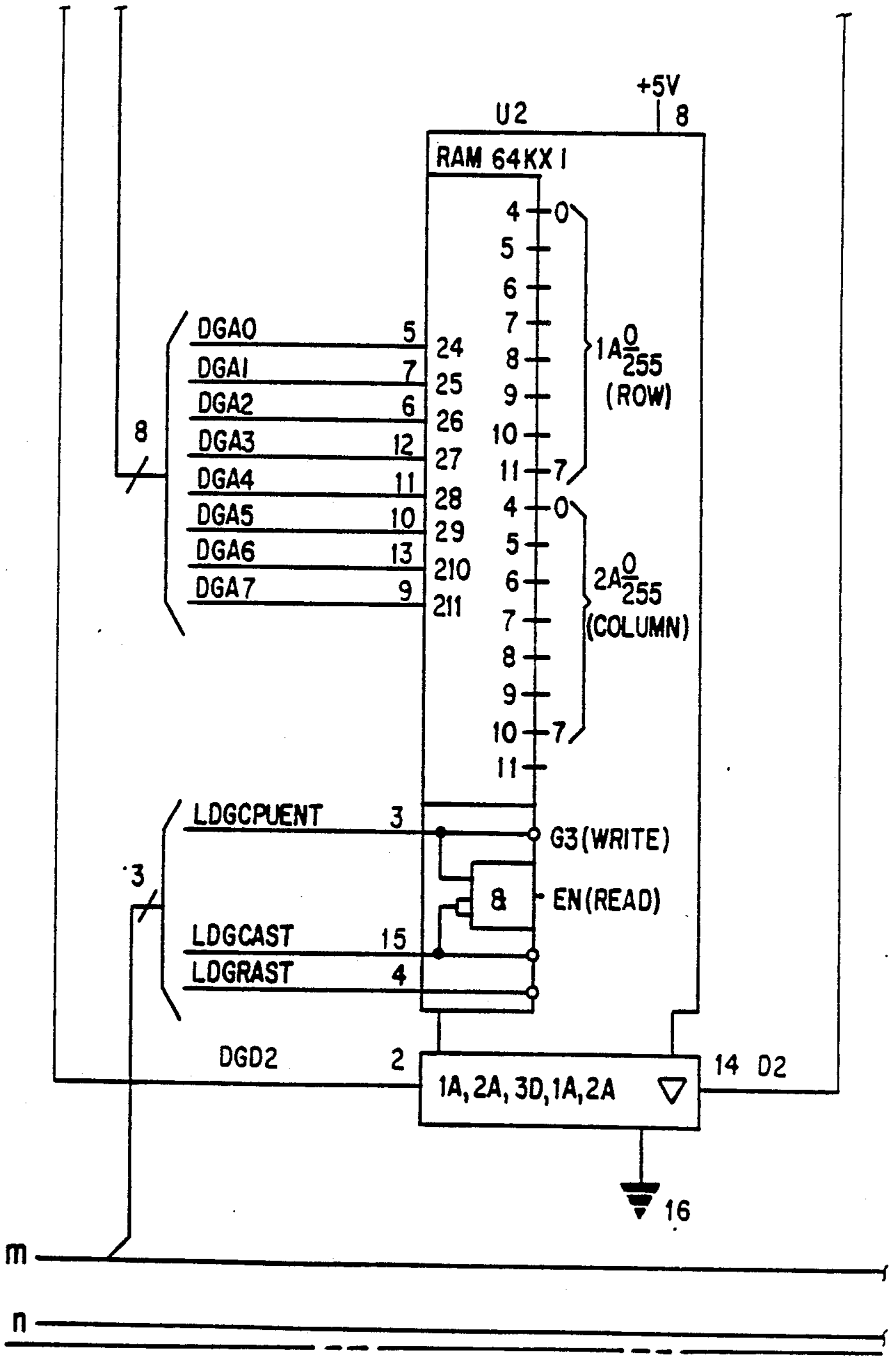
FIG. 3.41D

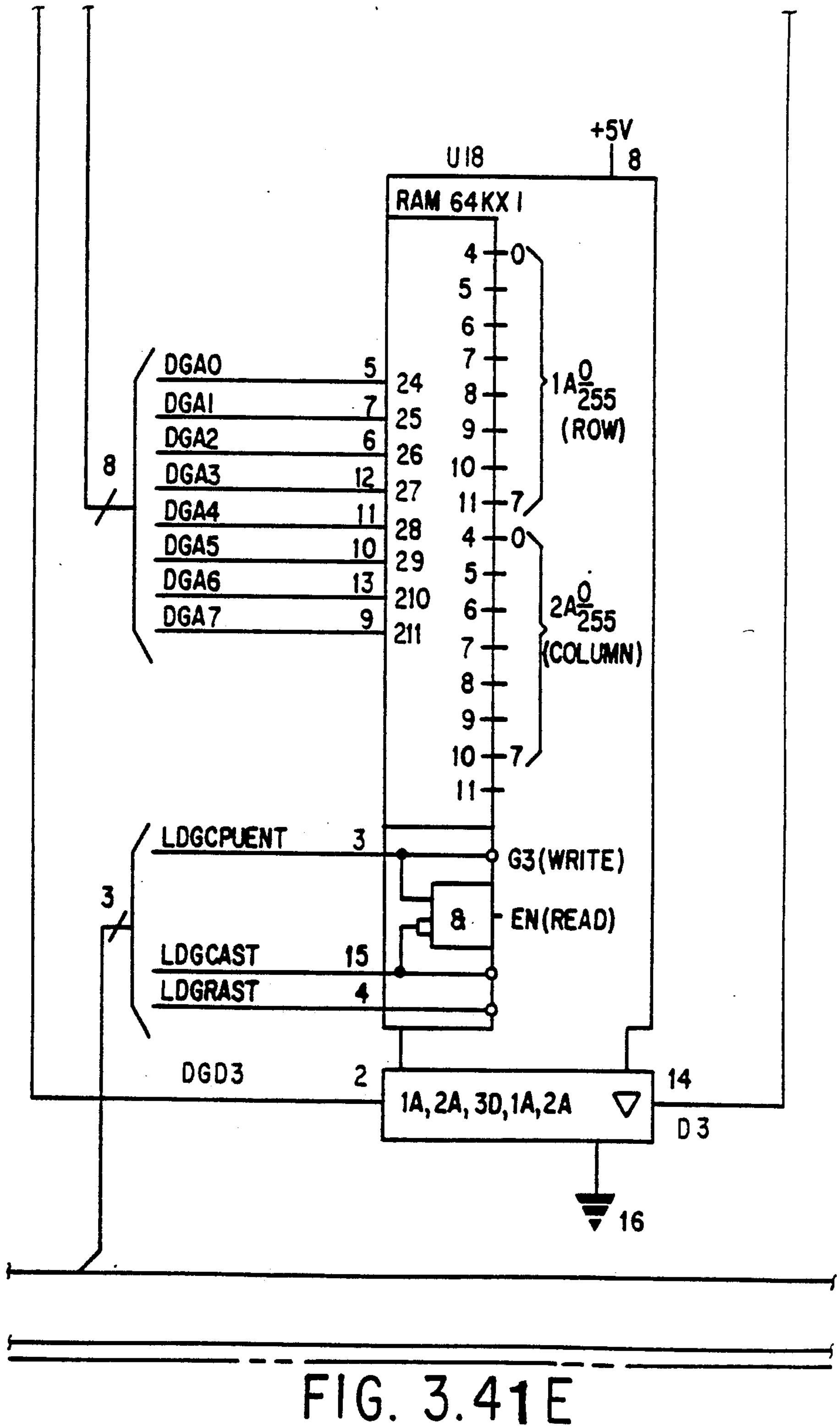
FIG. 3.41E

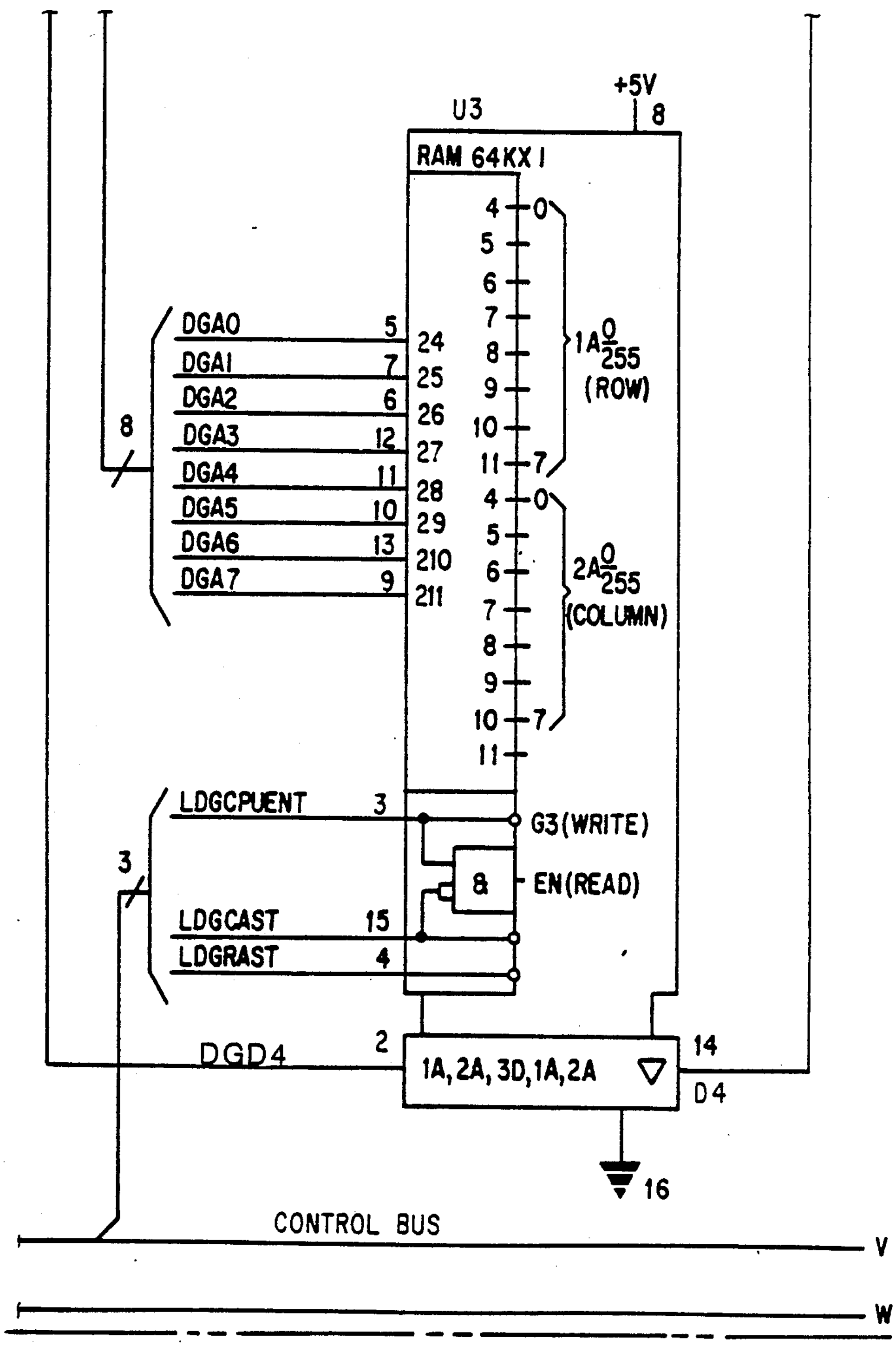
FIG. 3.41F

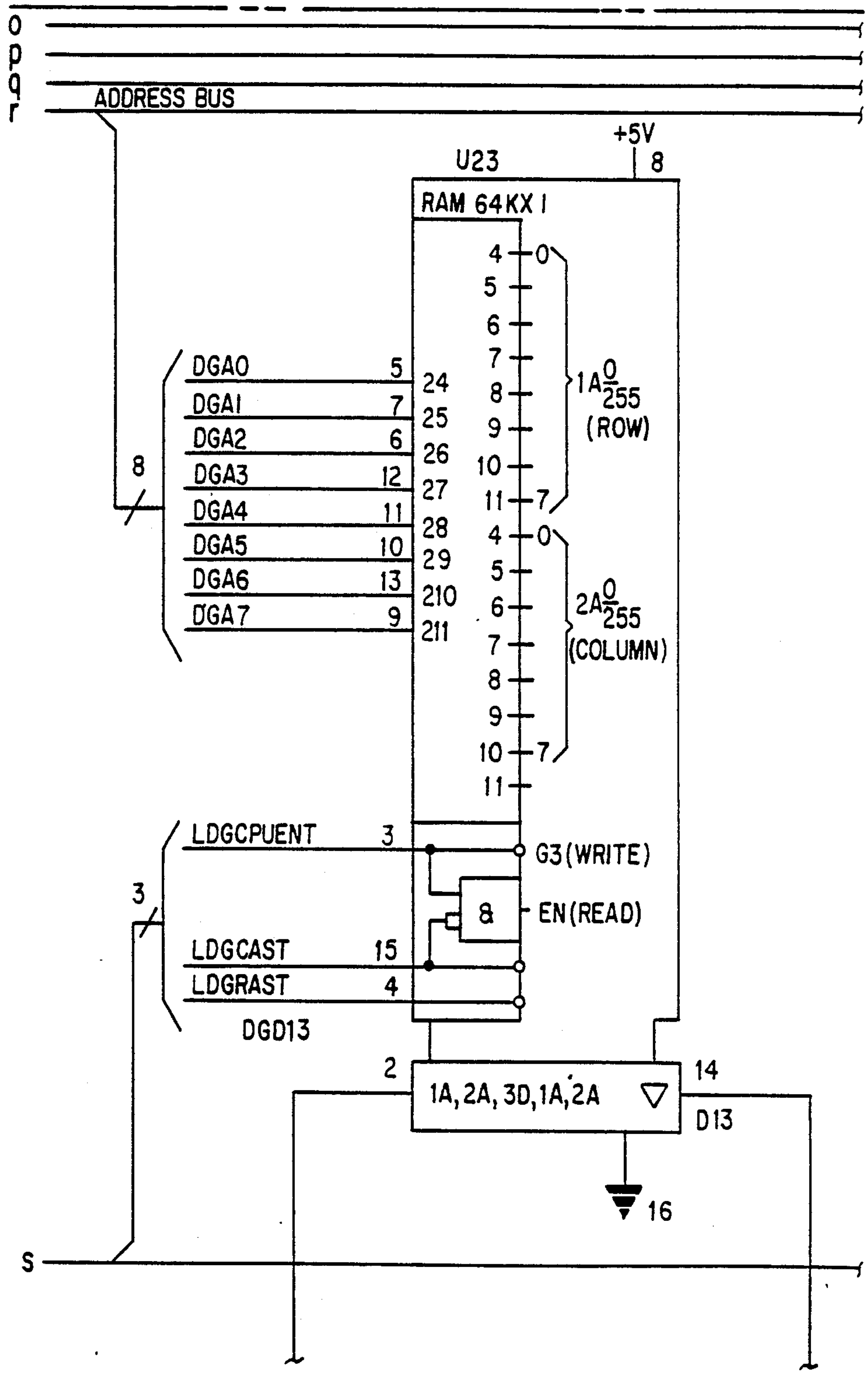
FIG. 3.42A

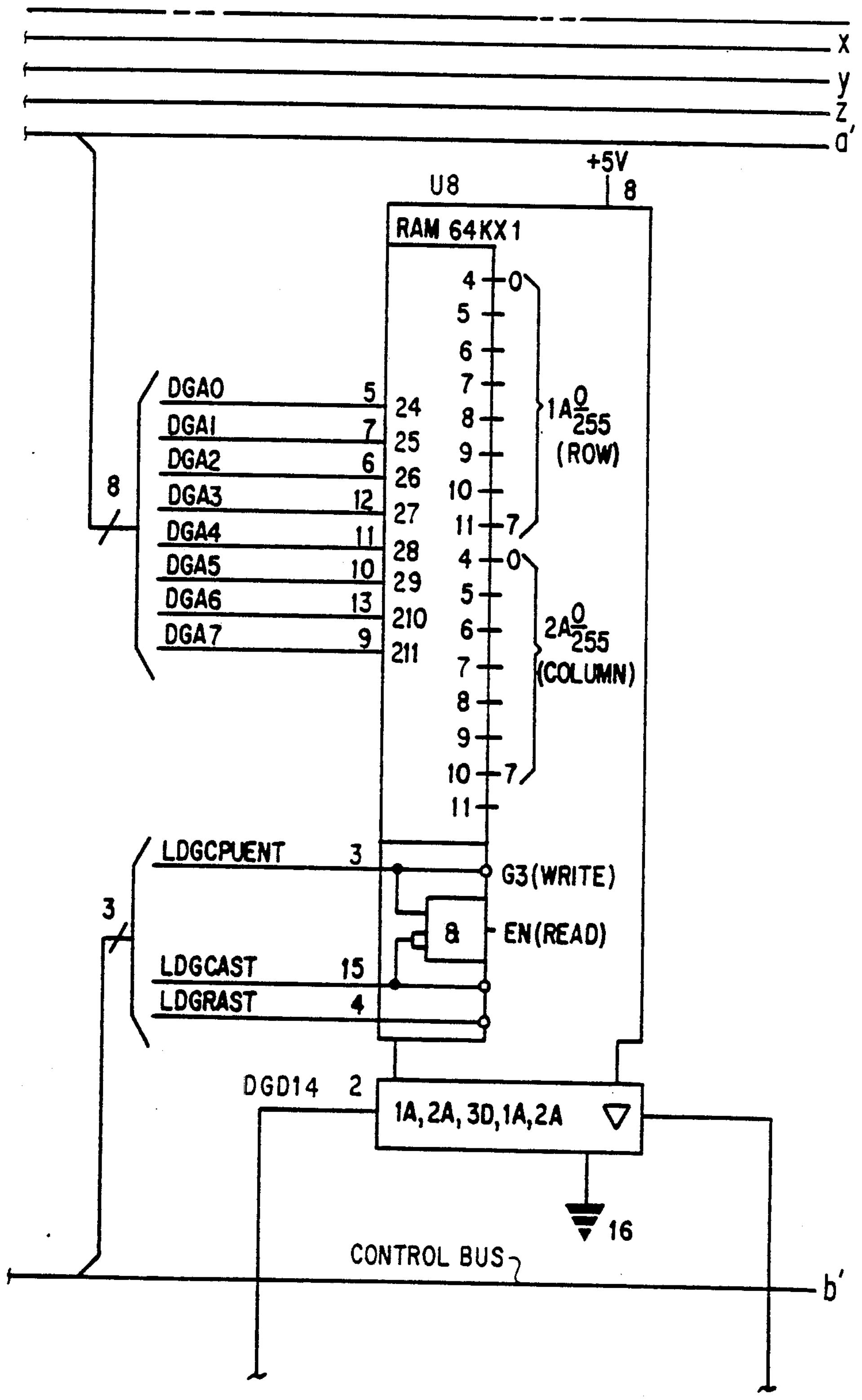
FIG. 3.42B

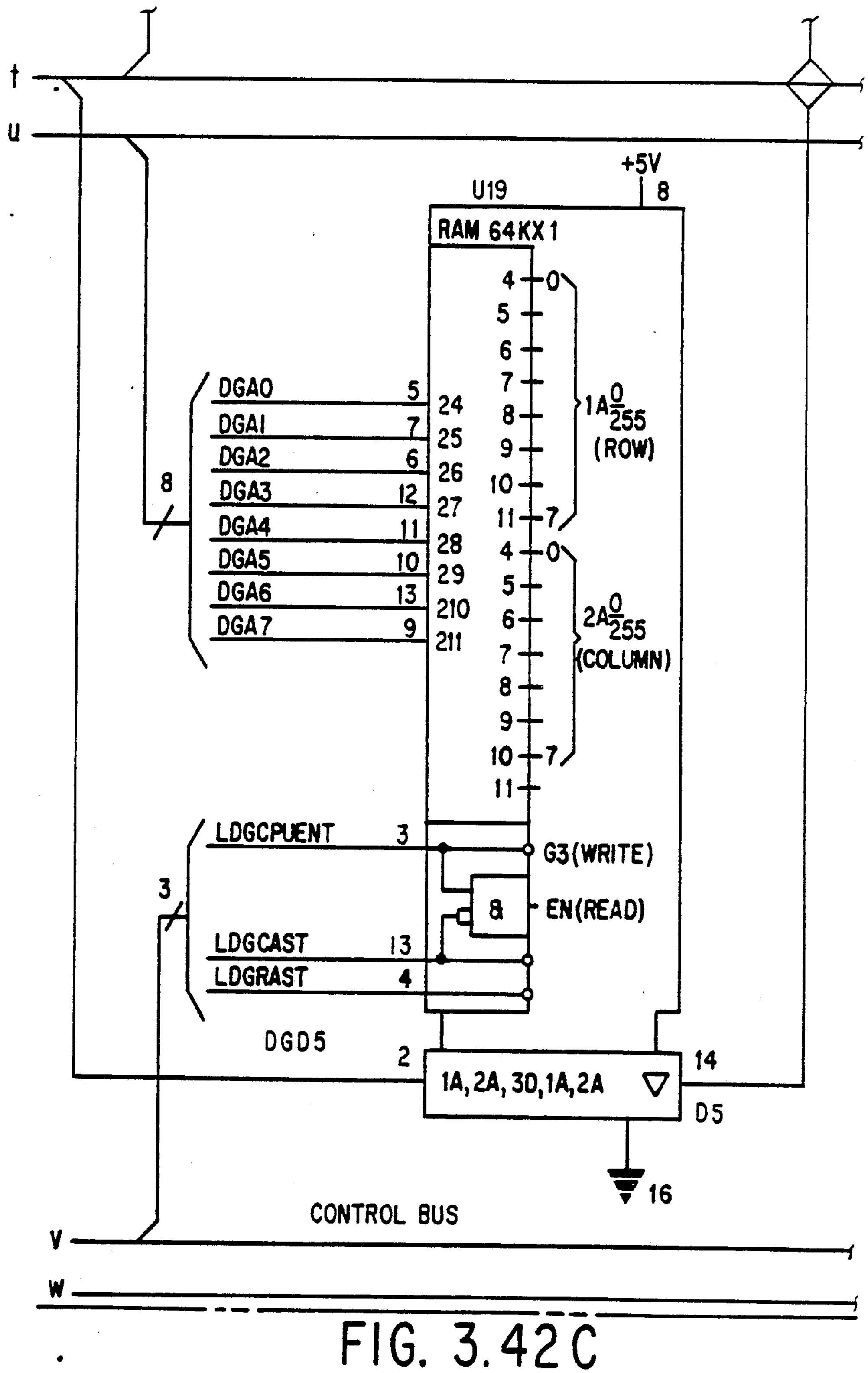
FIG. 3.42C

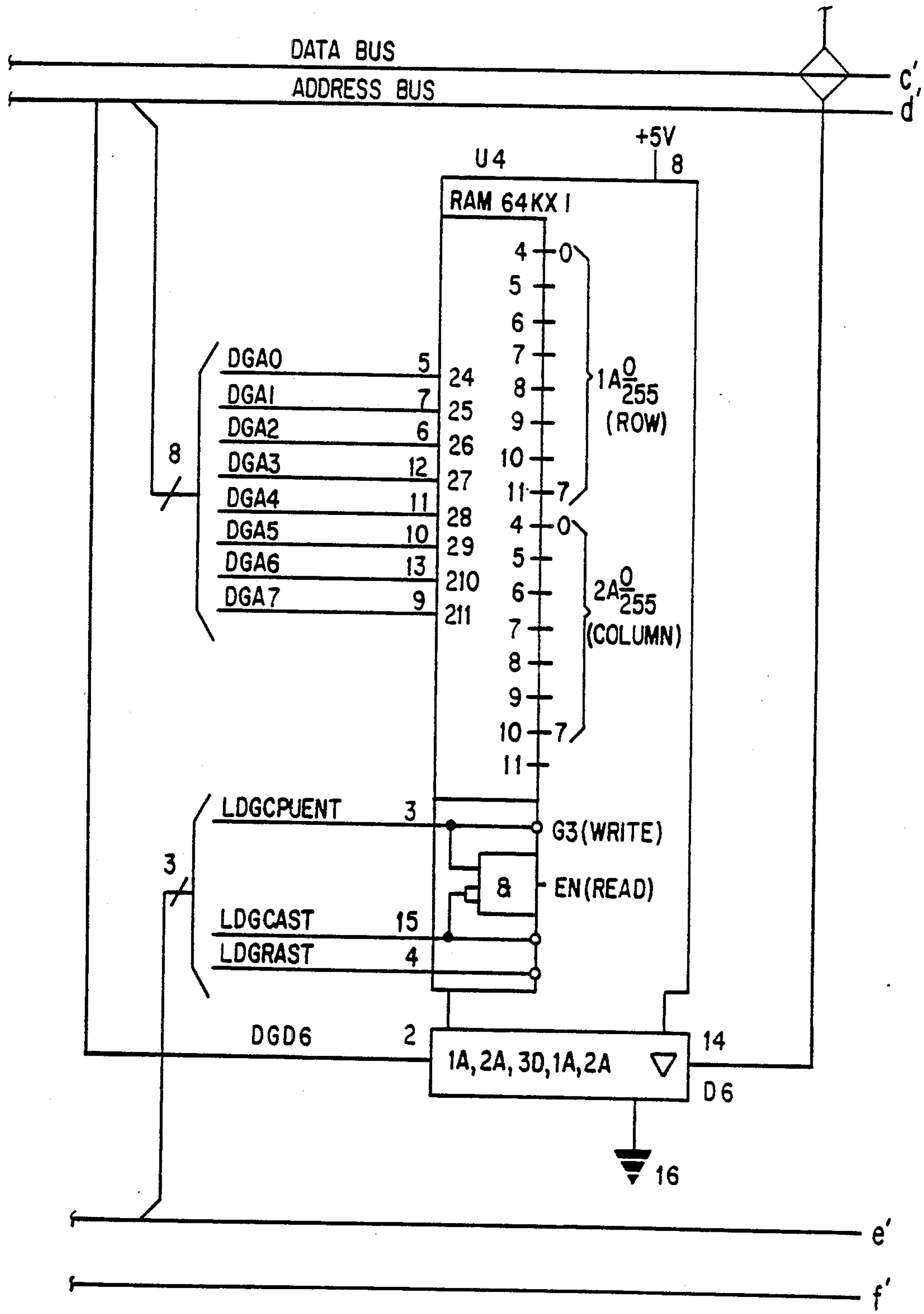
FIG. 3.42D

FIG. 3.43A
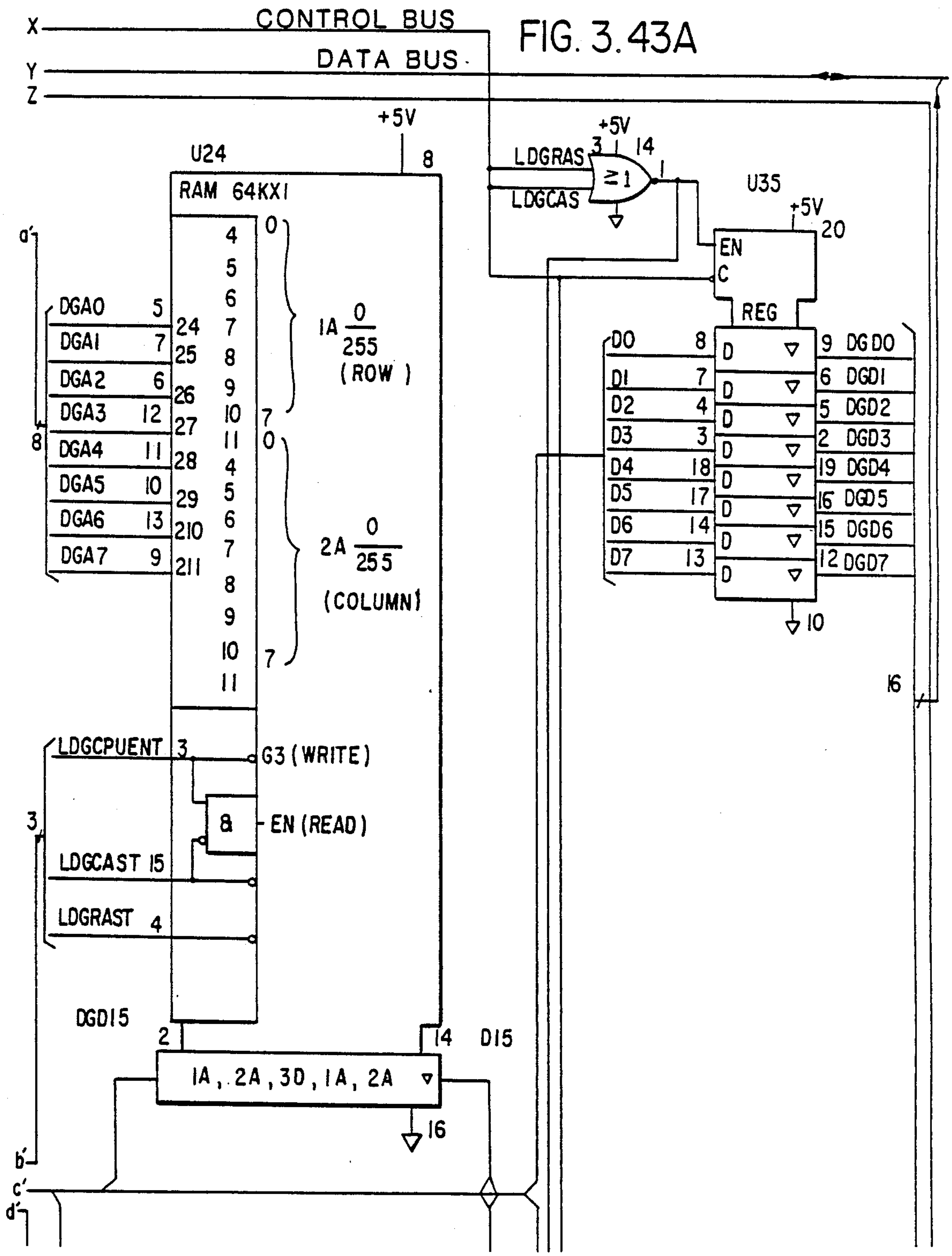

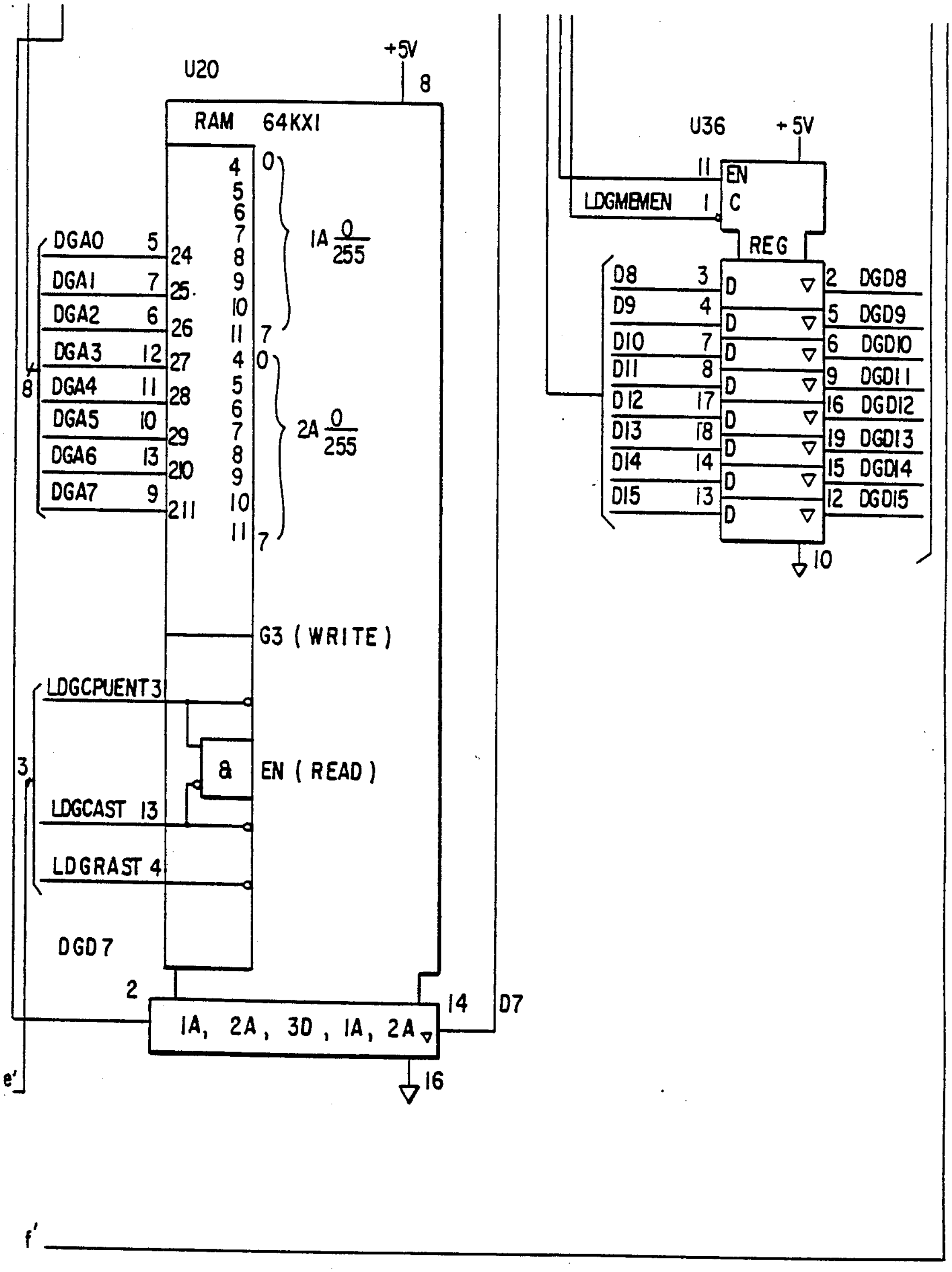
FIG. 3.43B

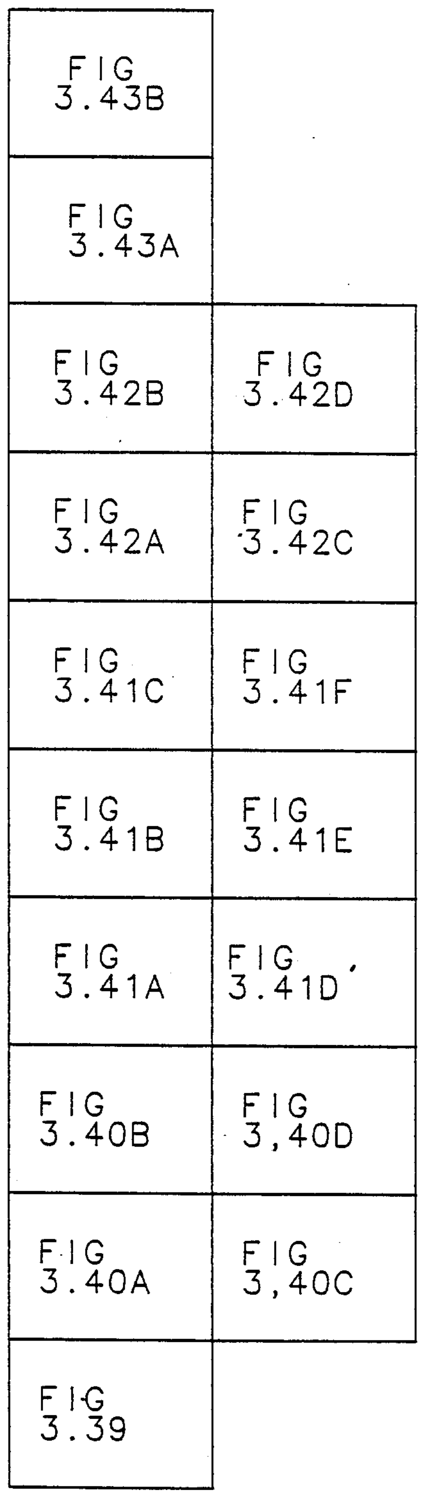
FIG 3.44
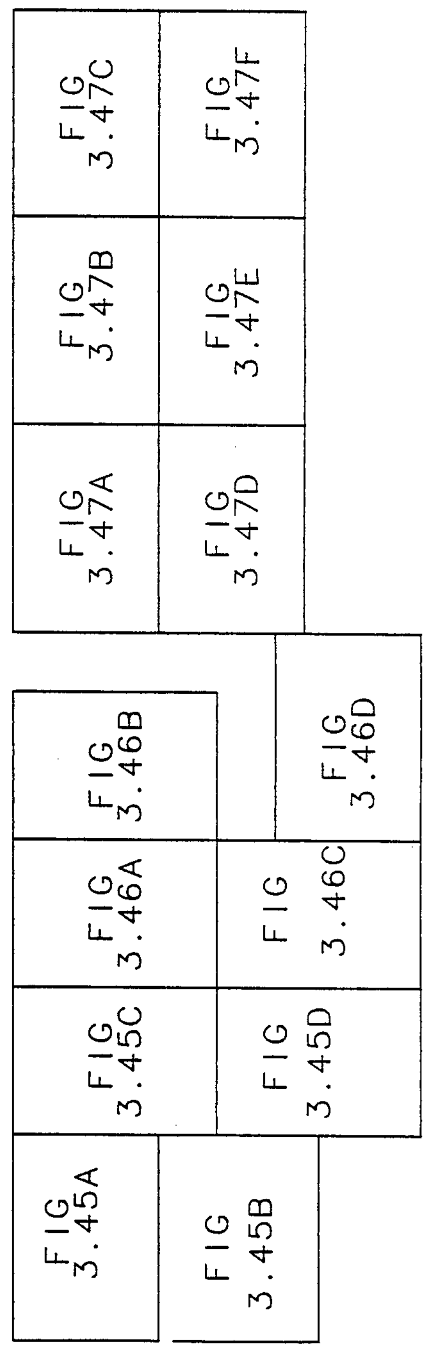
FIG 3.48

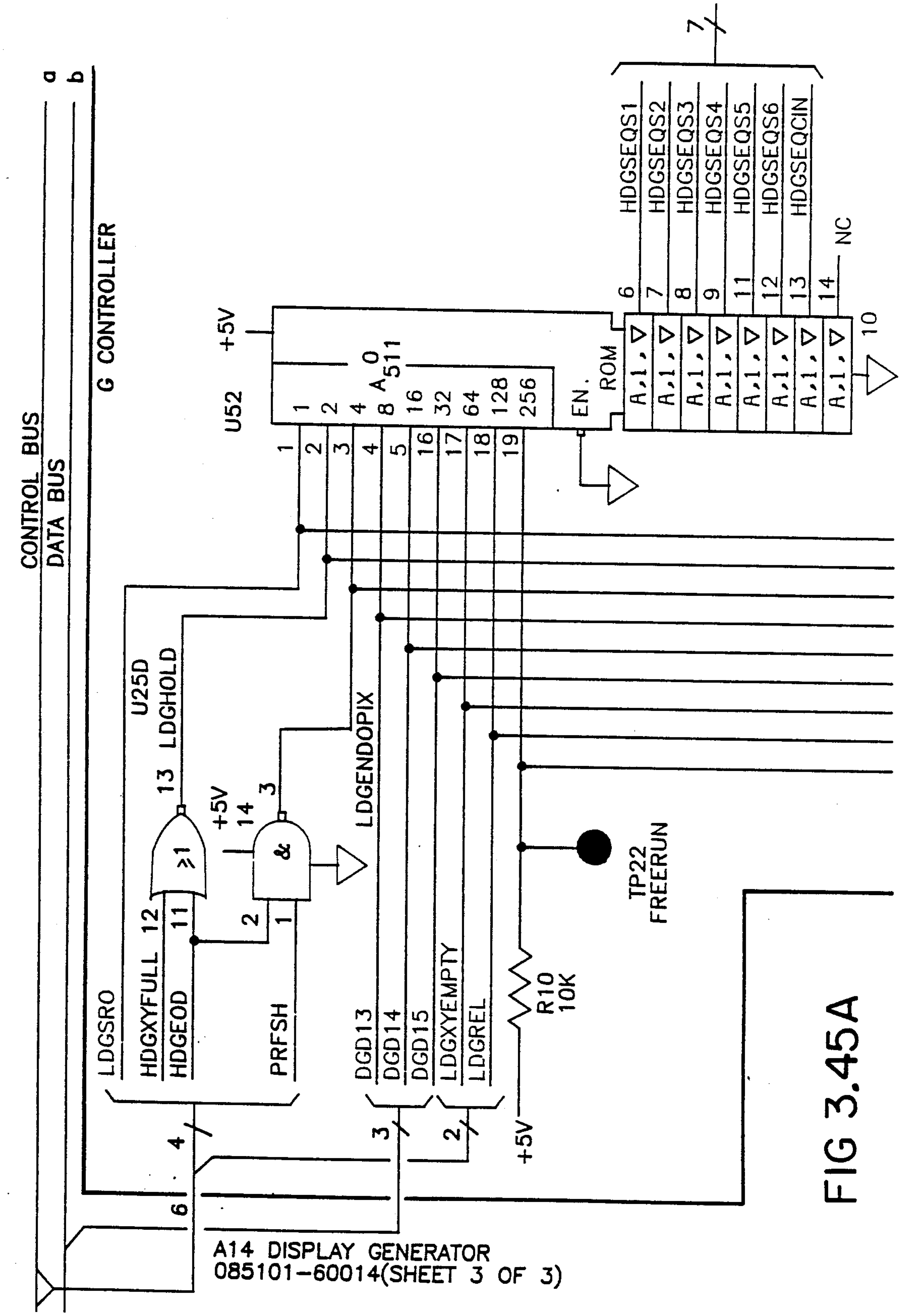
FIG 3.45A

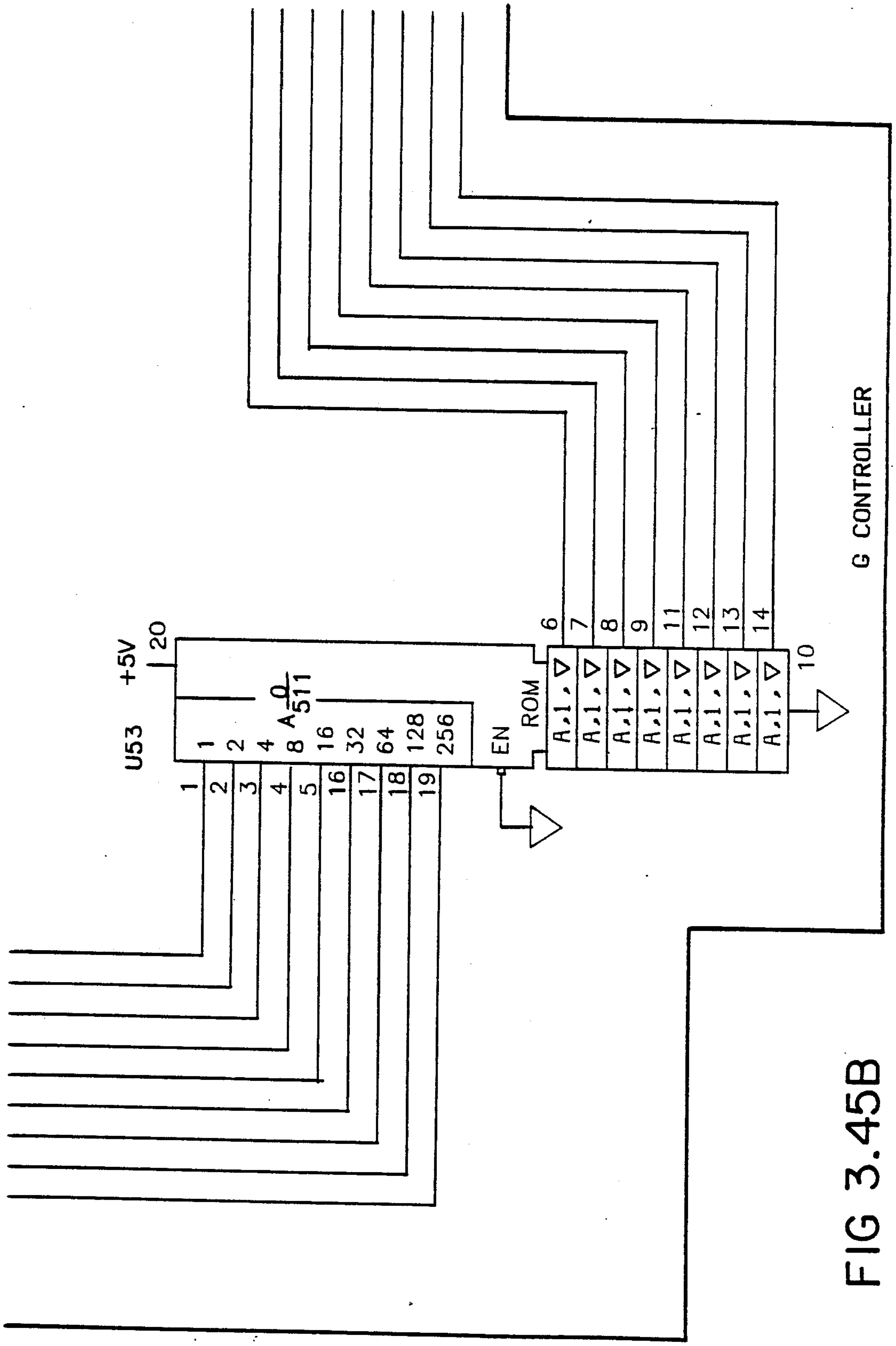
FIG 3.45B

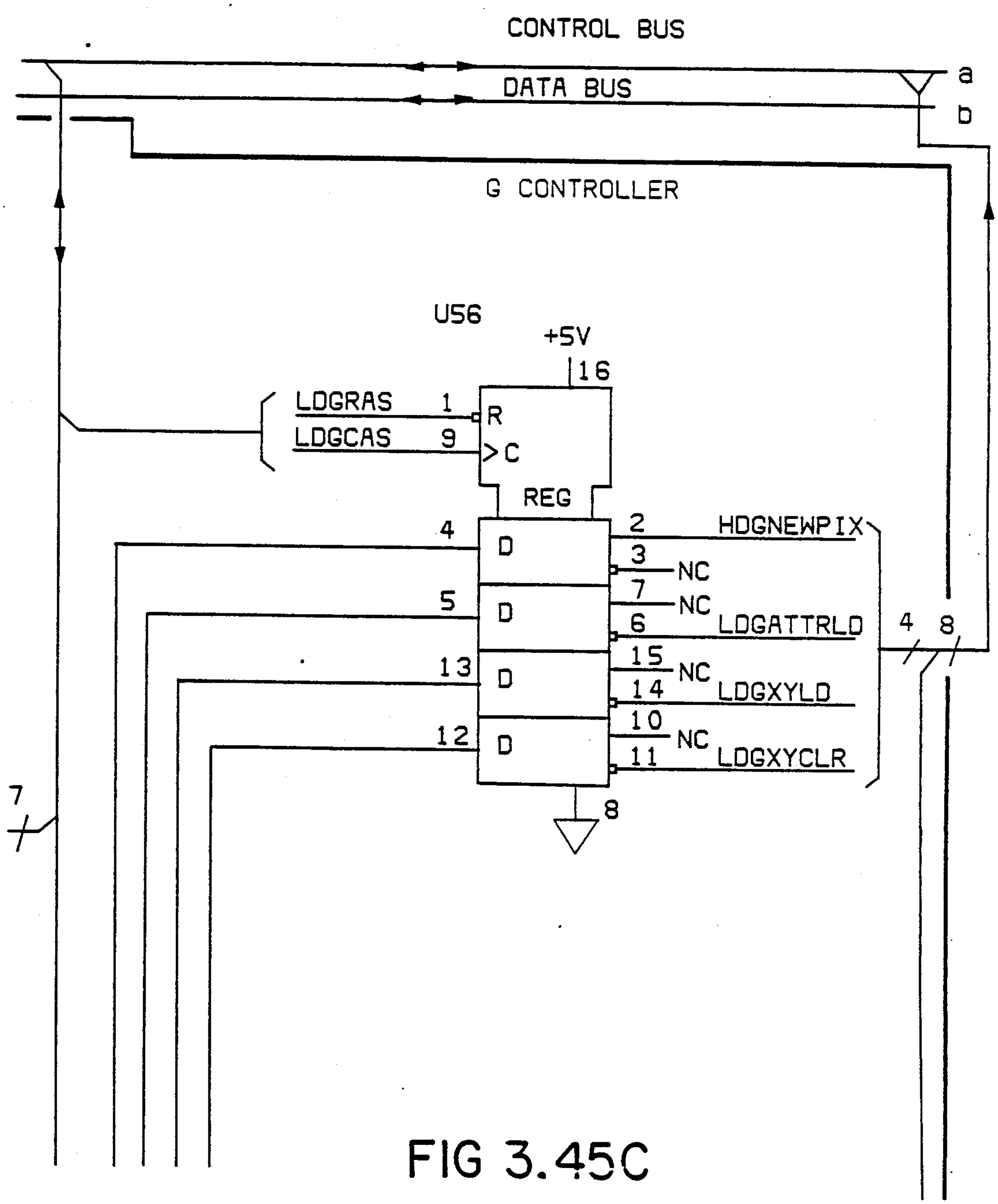
FIG 3.45C

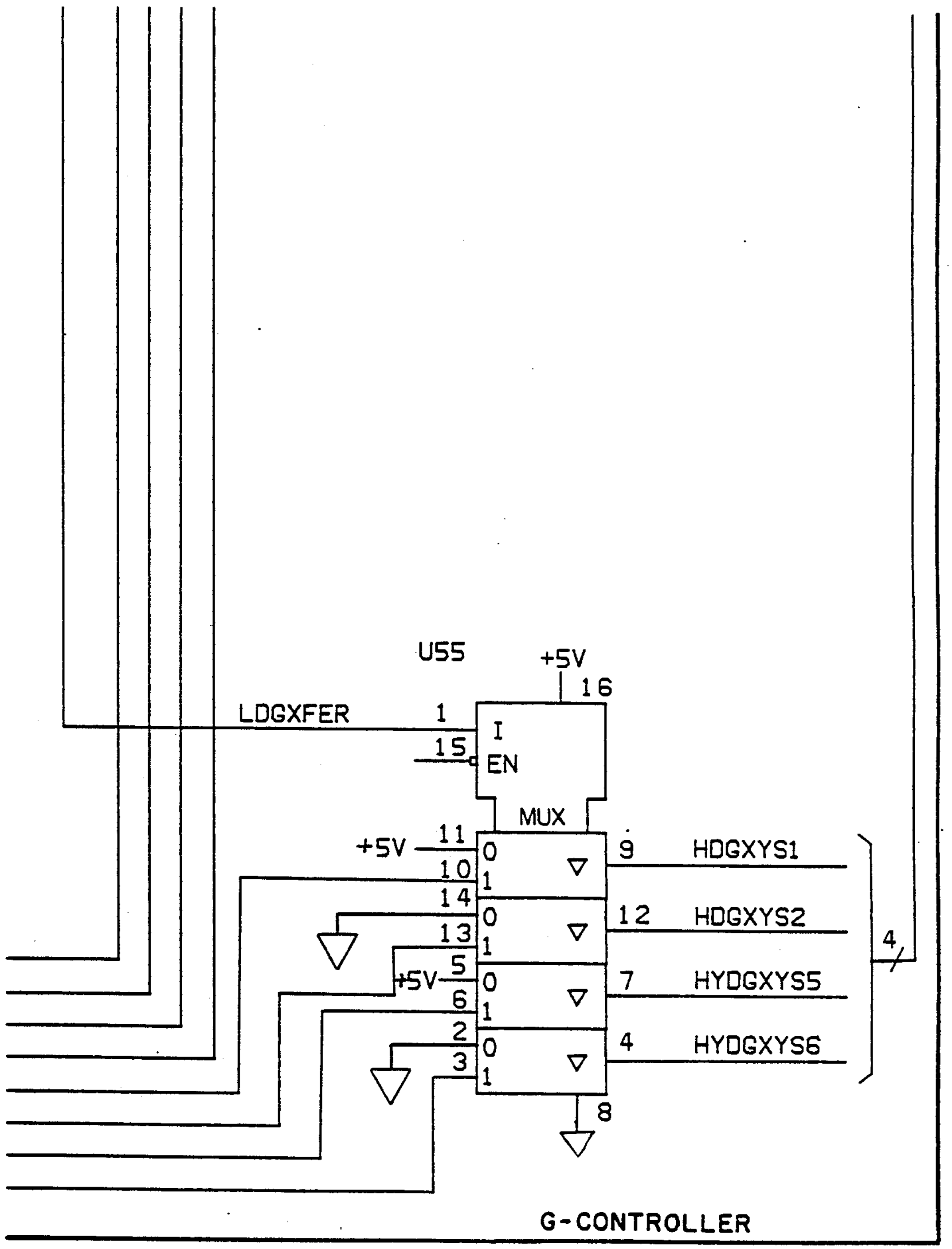
FIG 3.45D

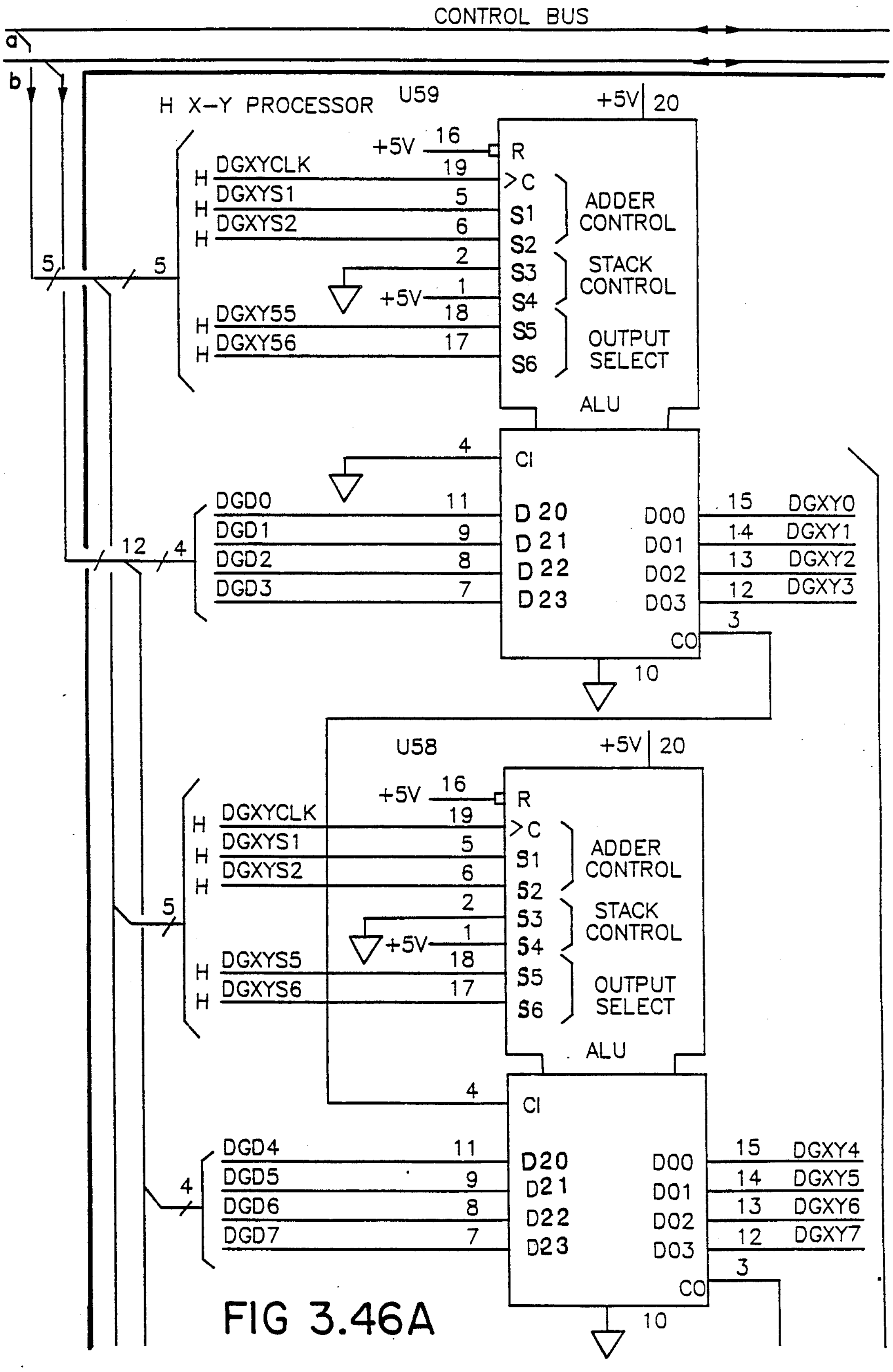
FIG 3.46A

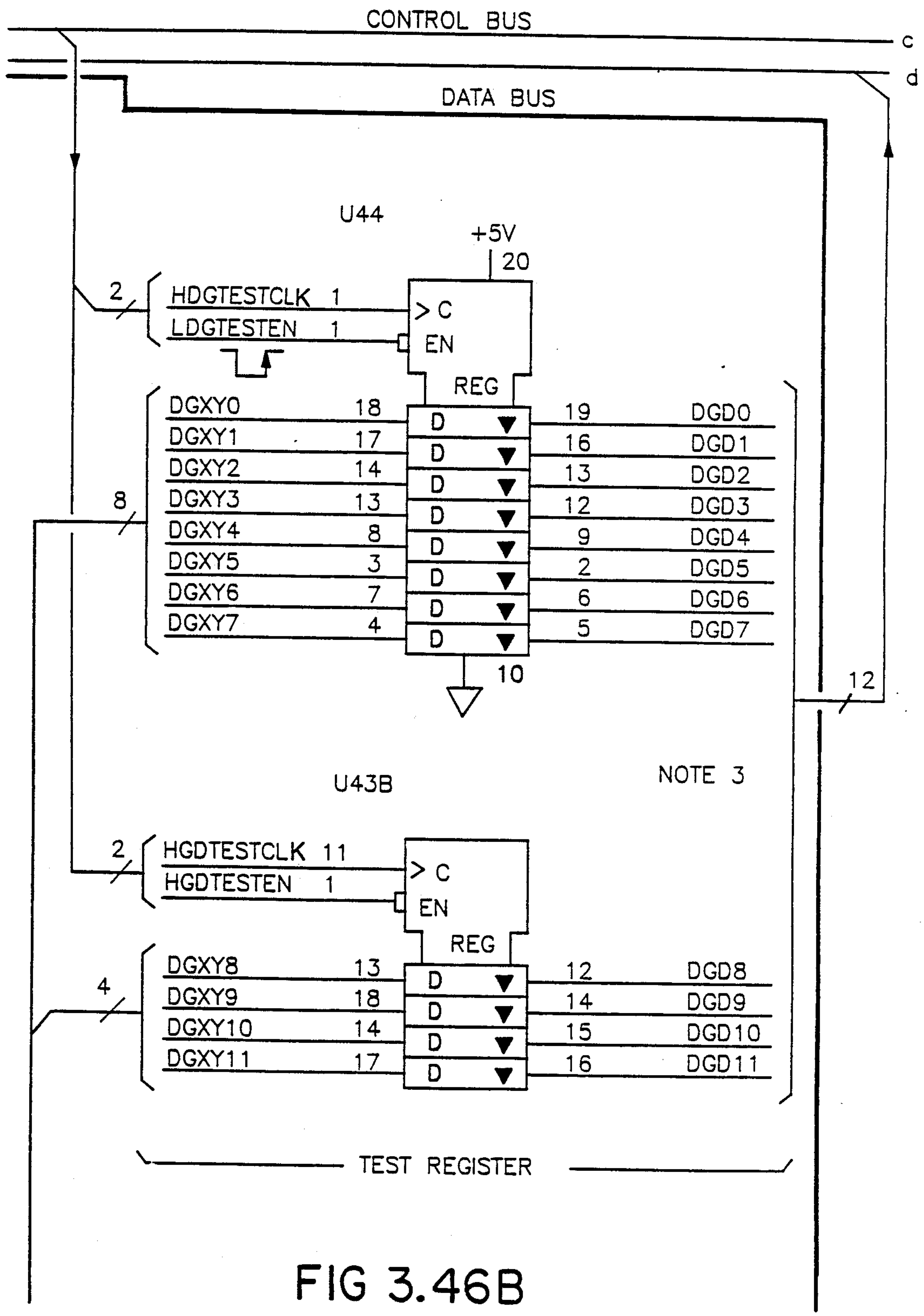
FIG 3.46B

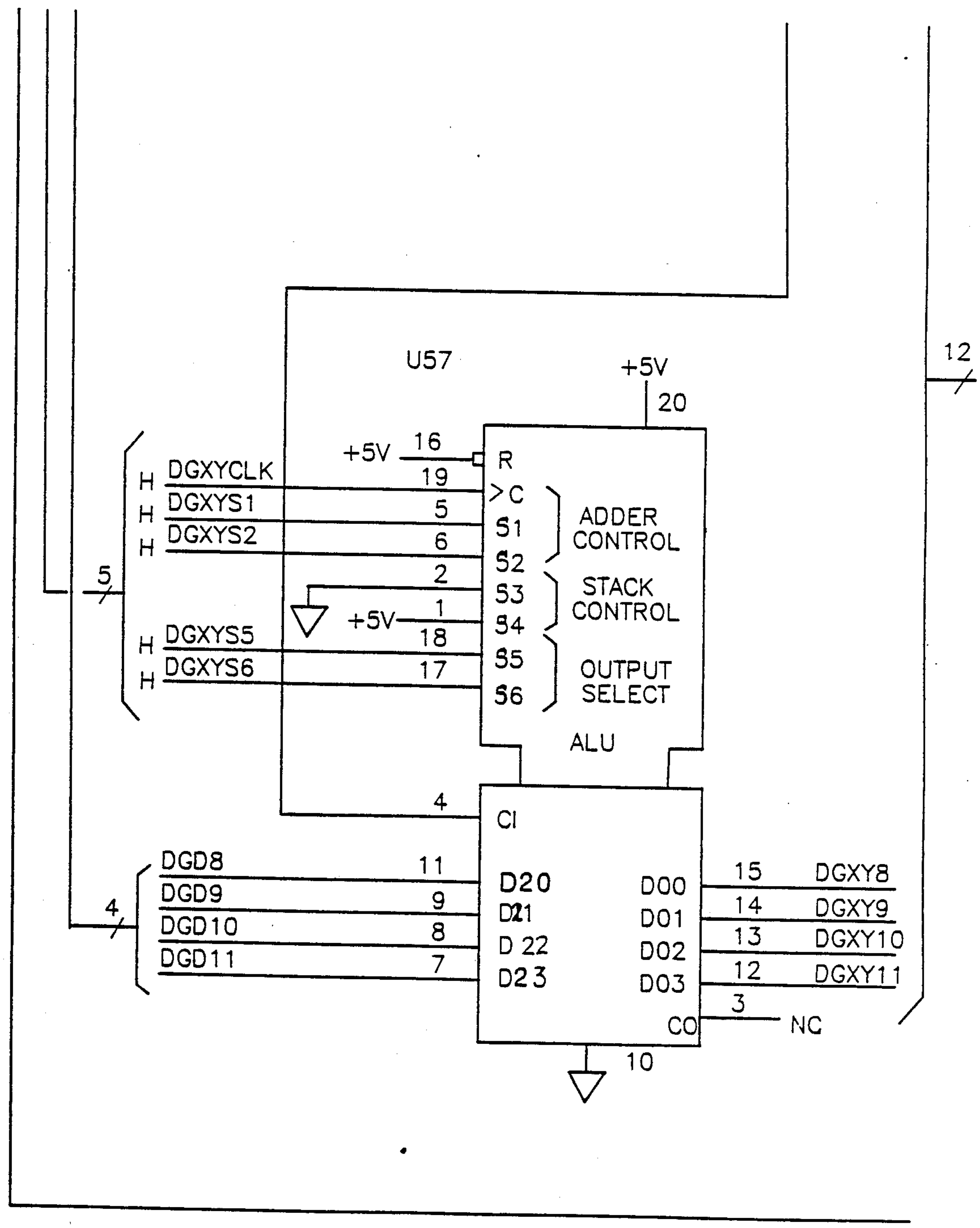
FIG 3.46C

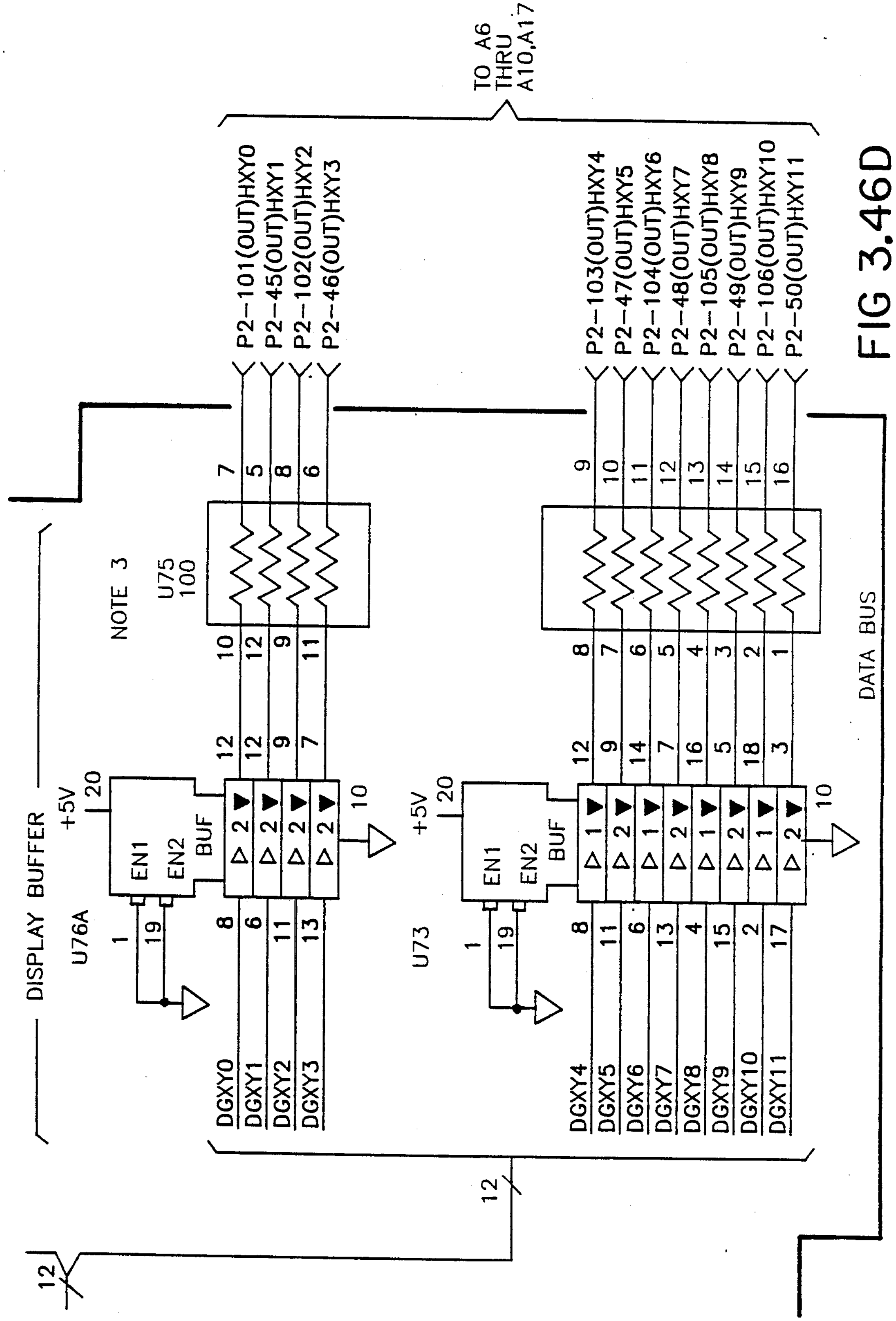
FIG 3.46D

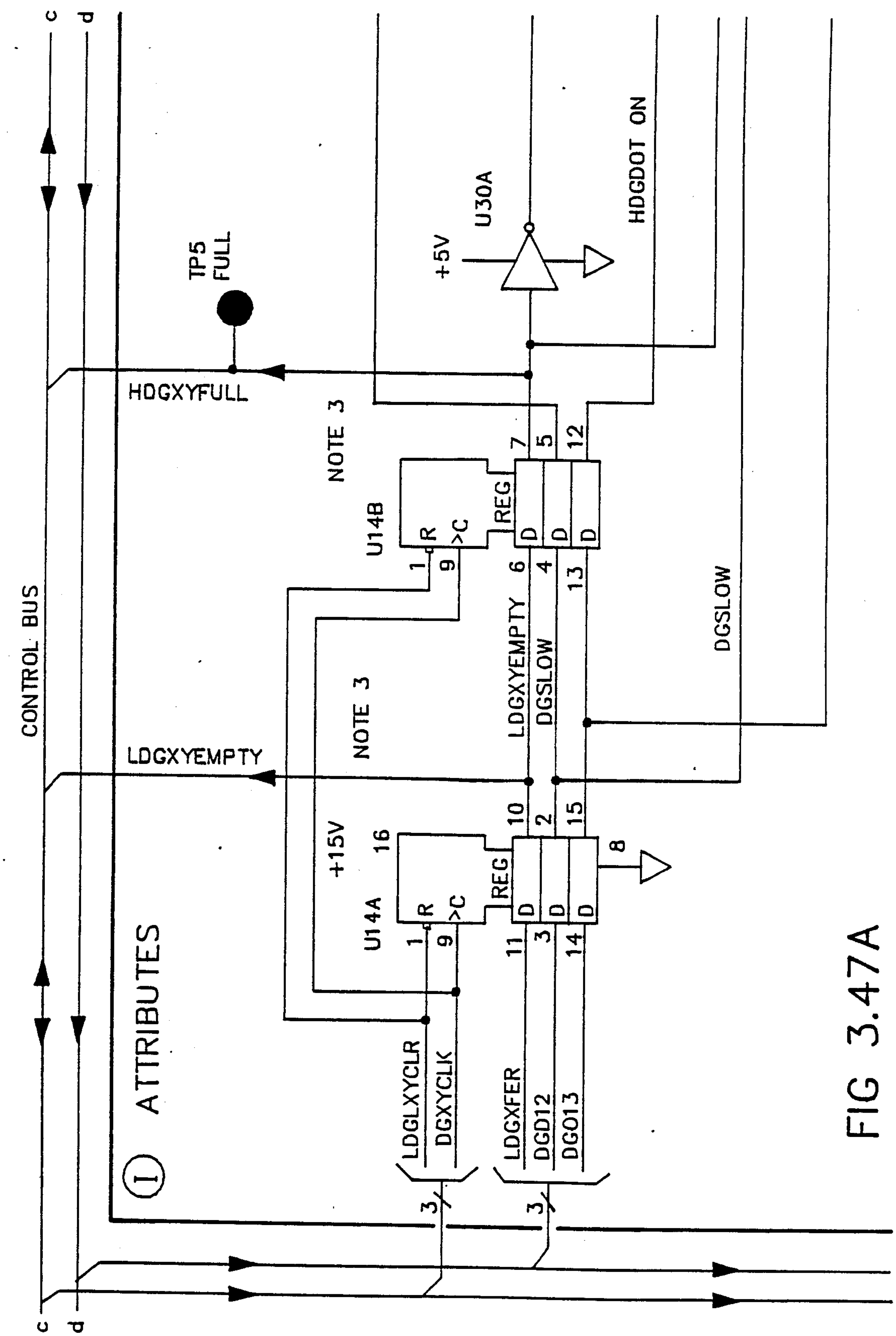
FIG 3.47A

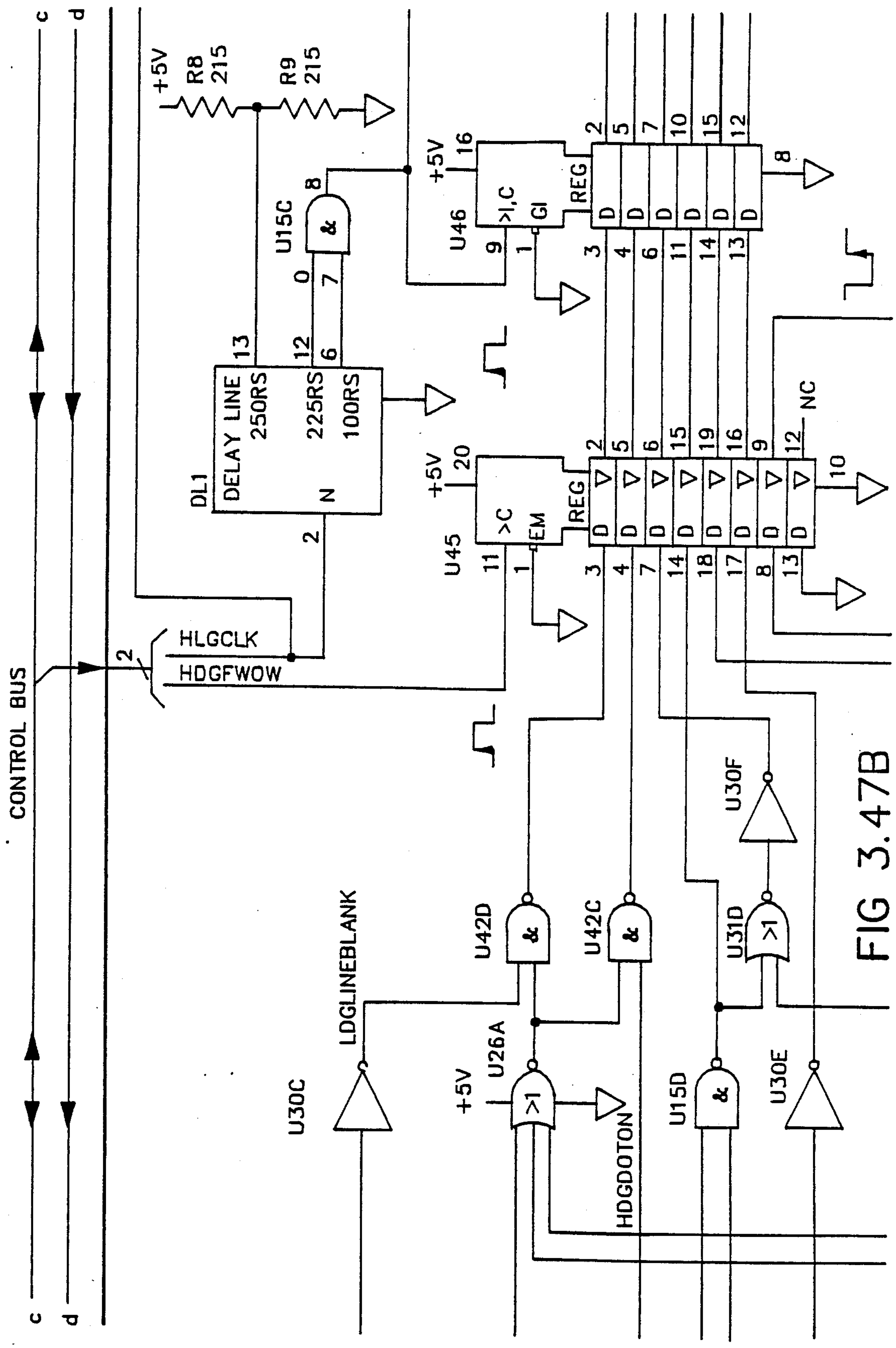
FIG 3.47B

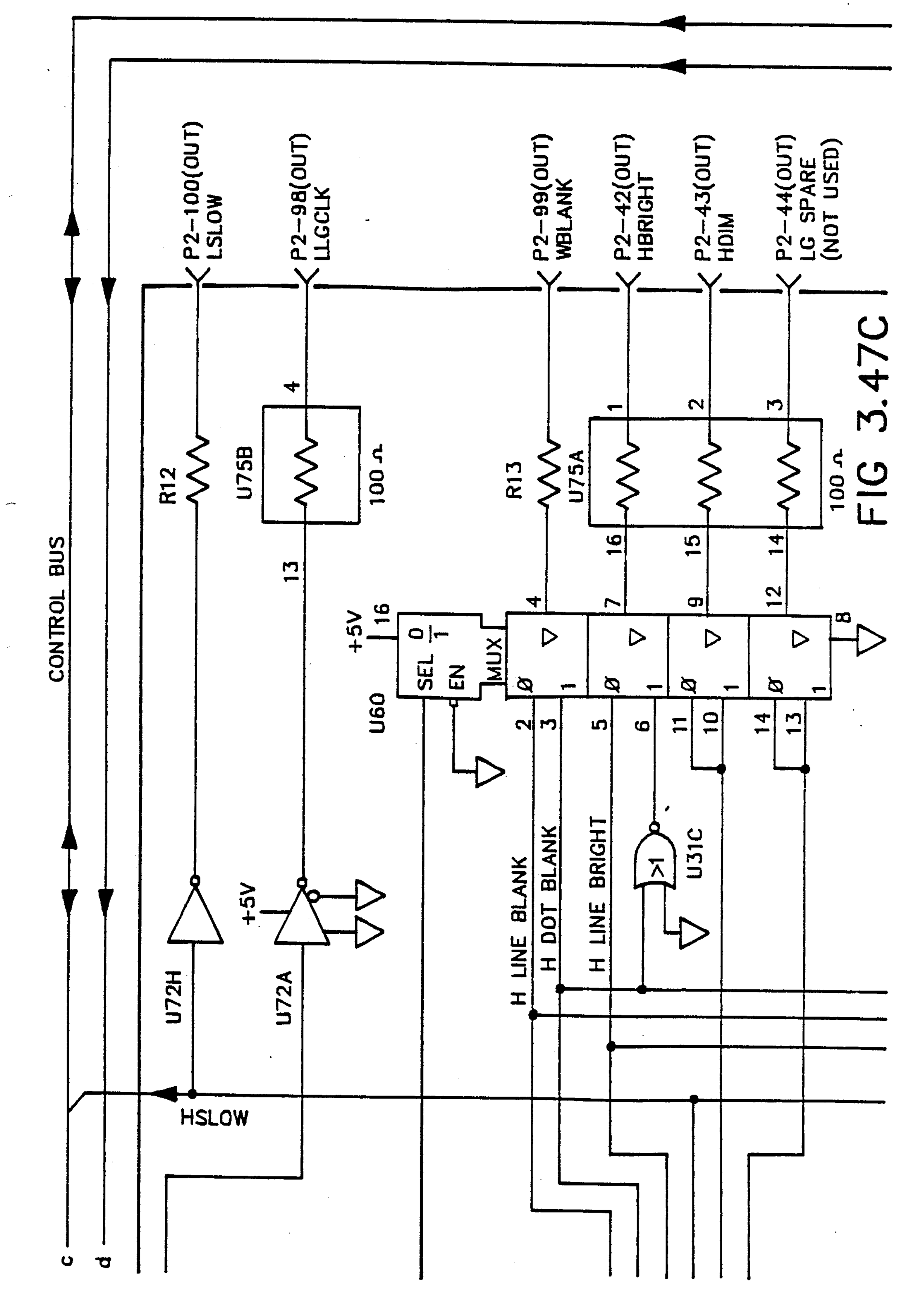
FIG 3.47C

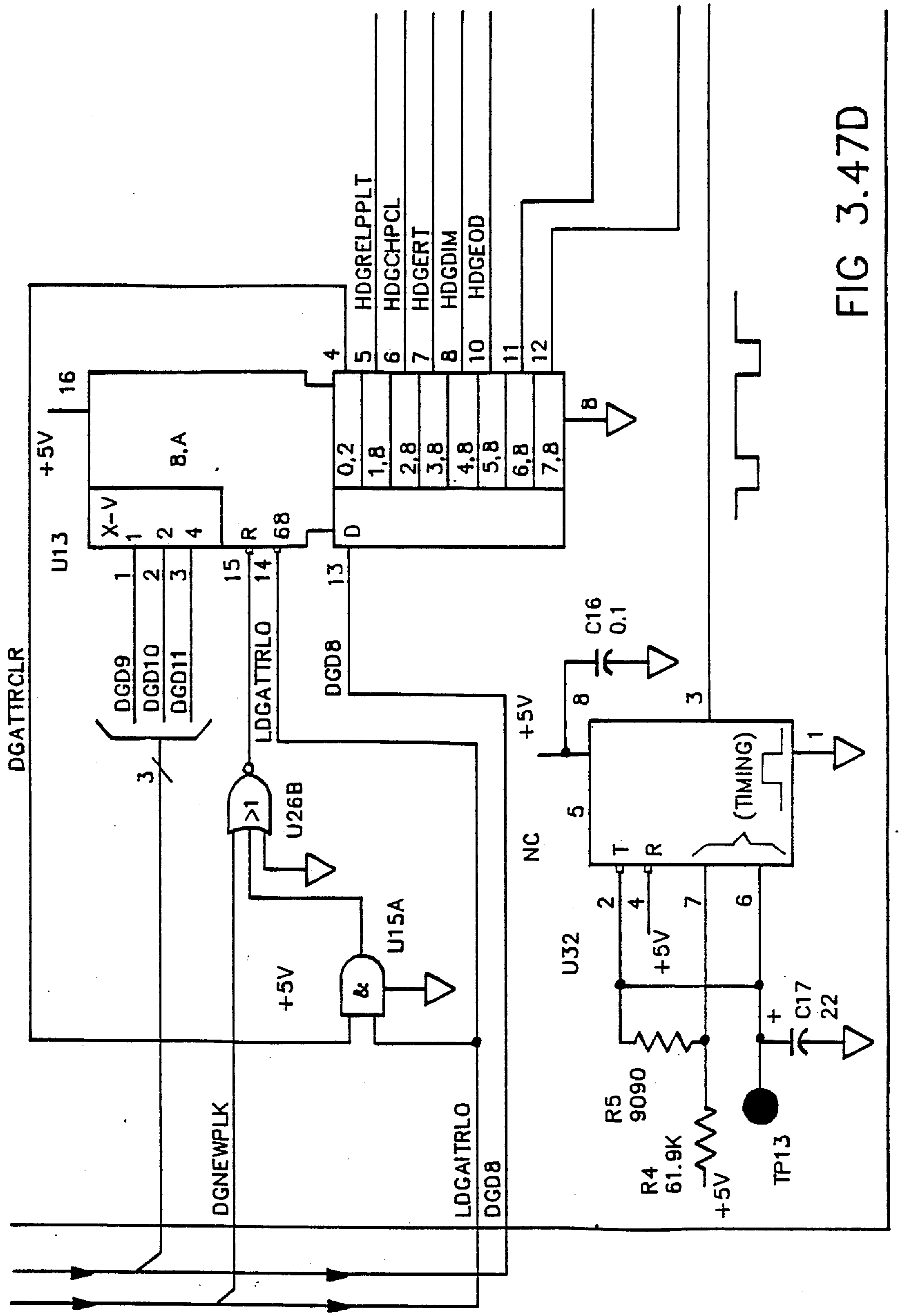
FIG 3.47D

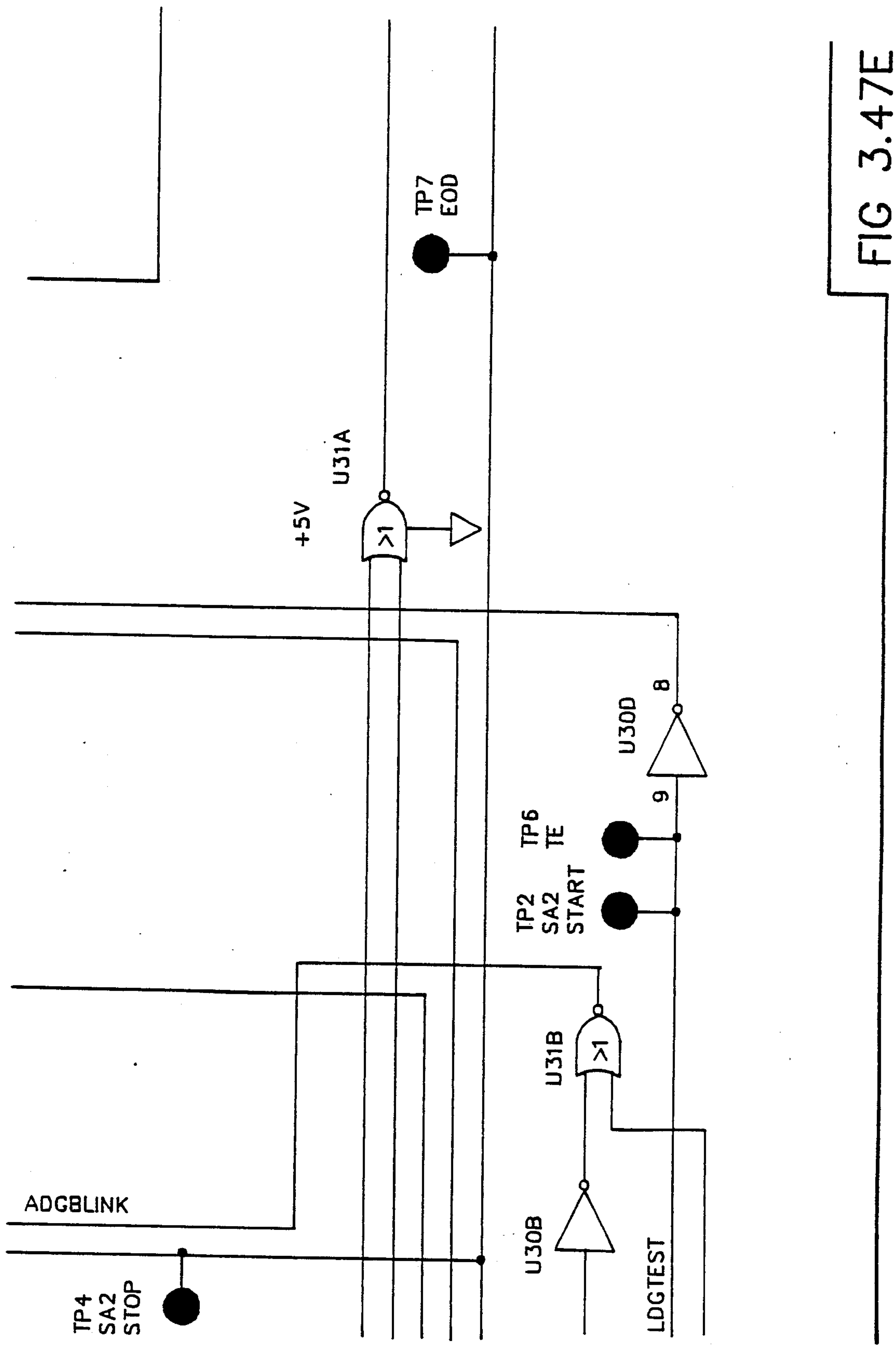
FIG 3.47E

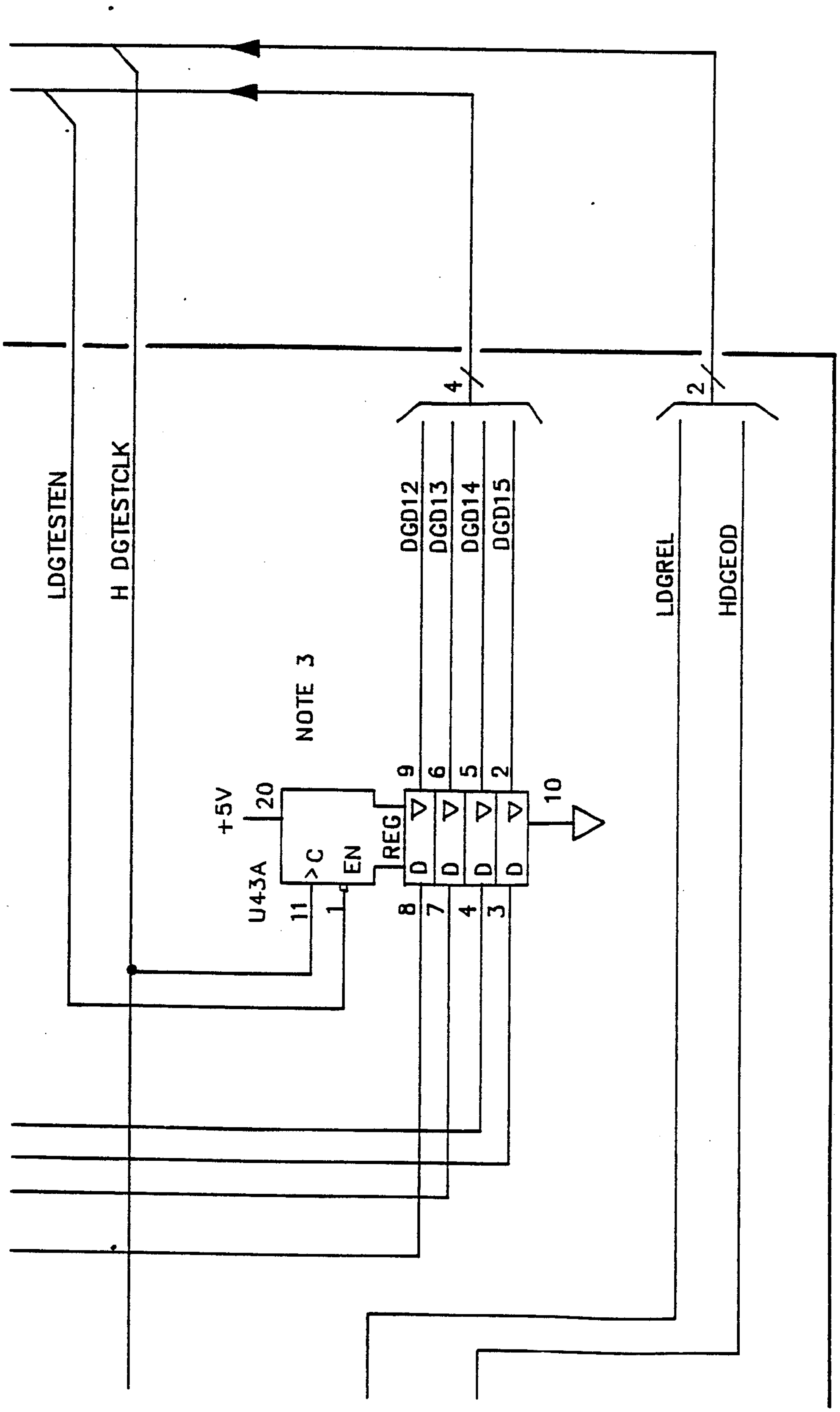
FIG 3.47F

A15 I.O BOARD
085101-60015
(SHEET 1 OF 2)
FIG. 3.49
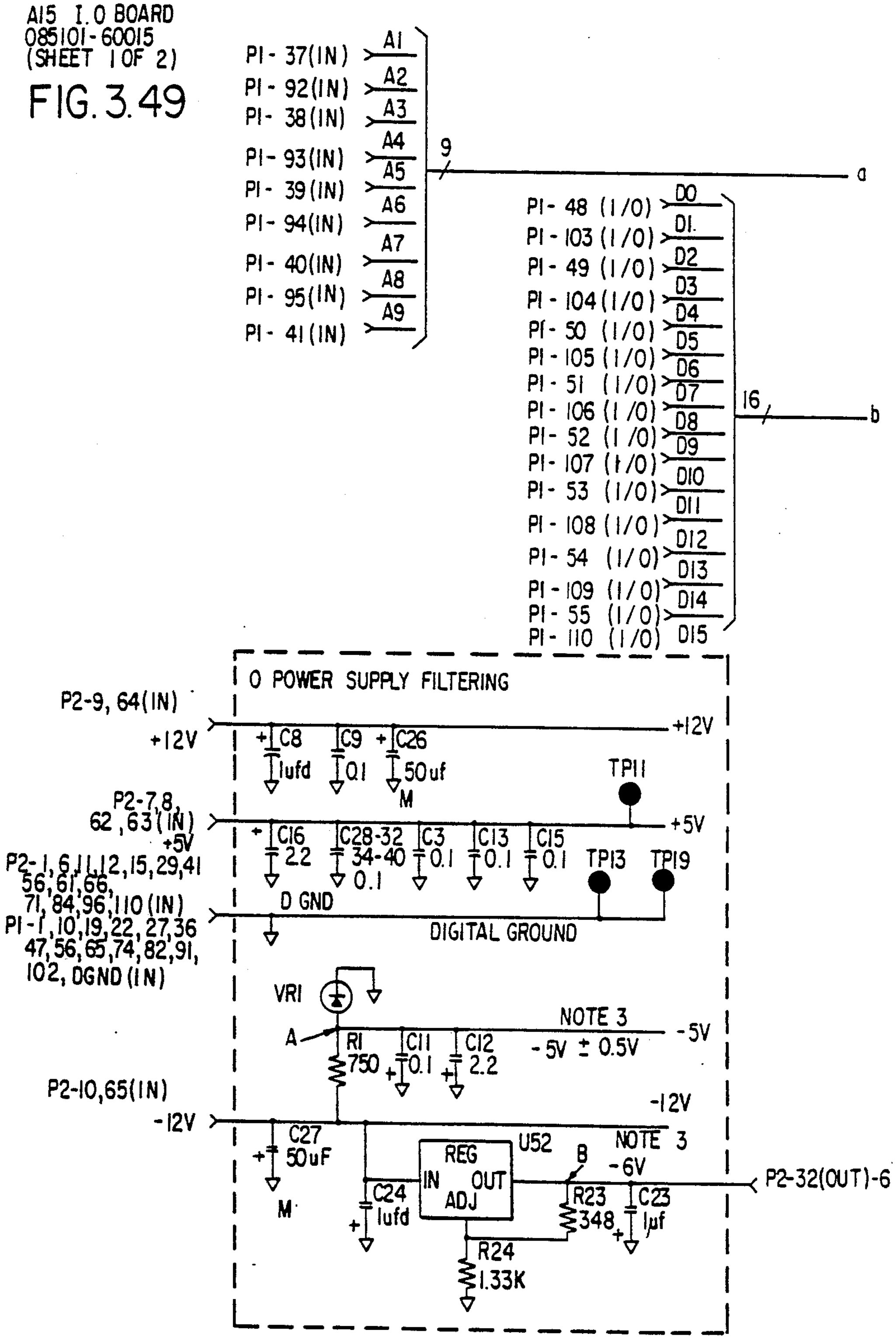

FIG 3.50A
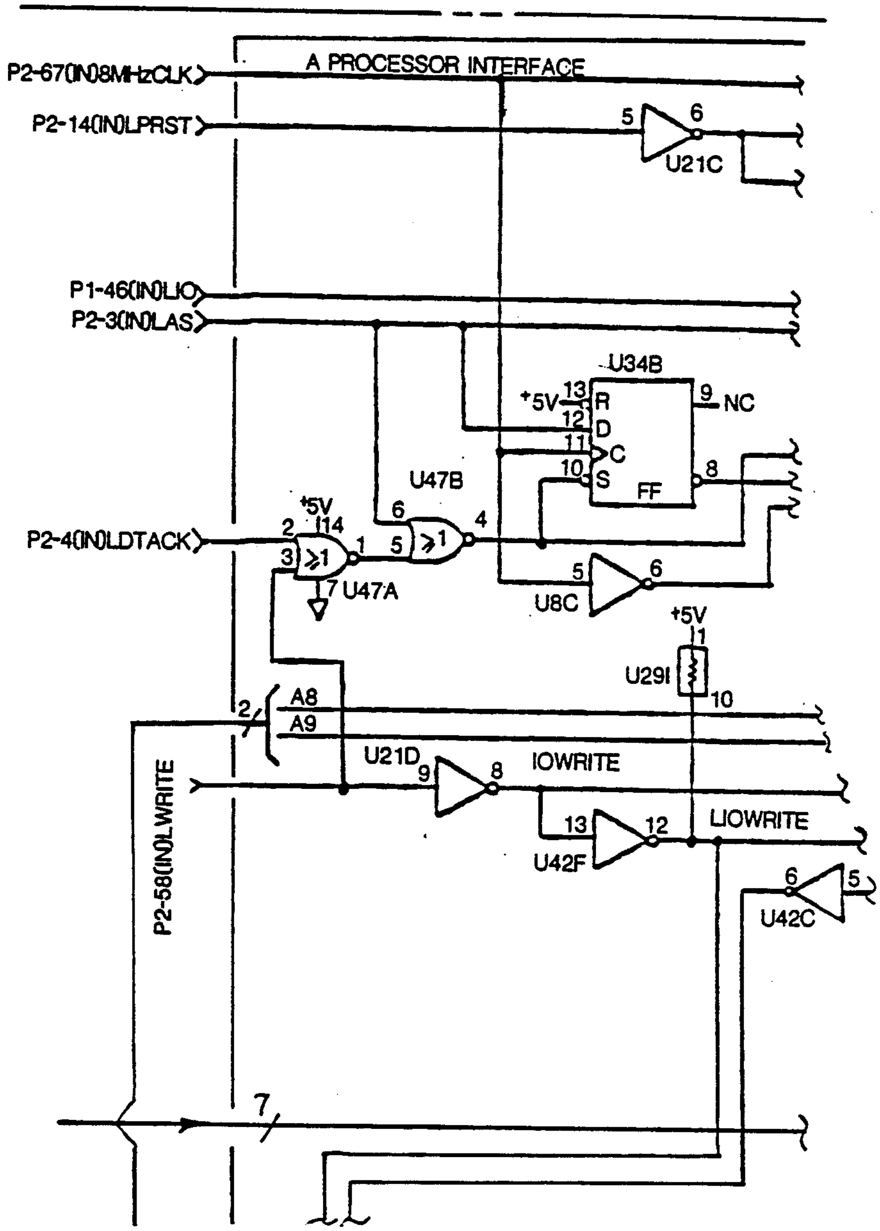

FIG 3.50B
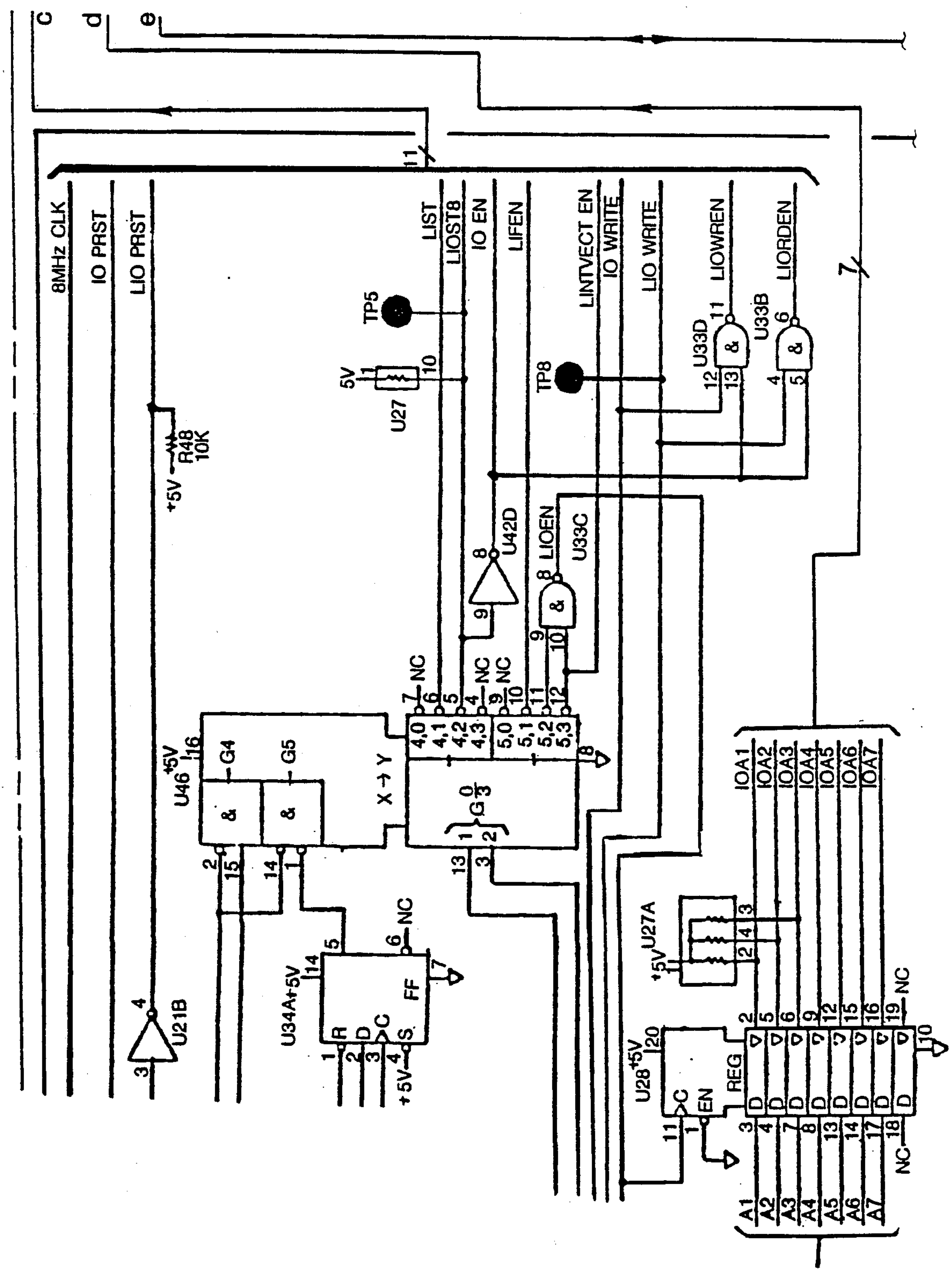

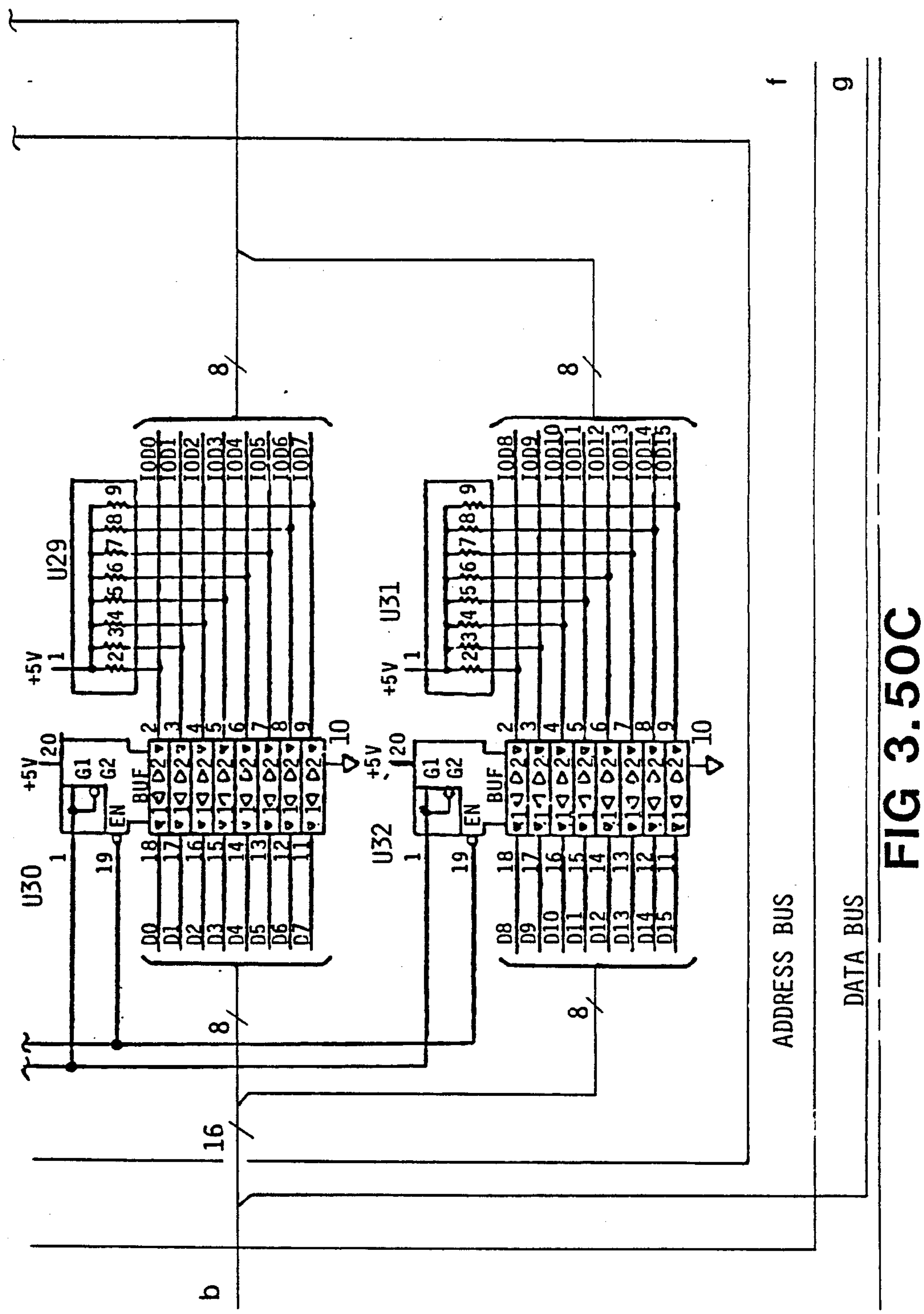
FIG 3.50C

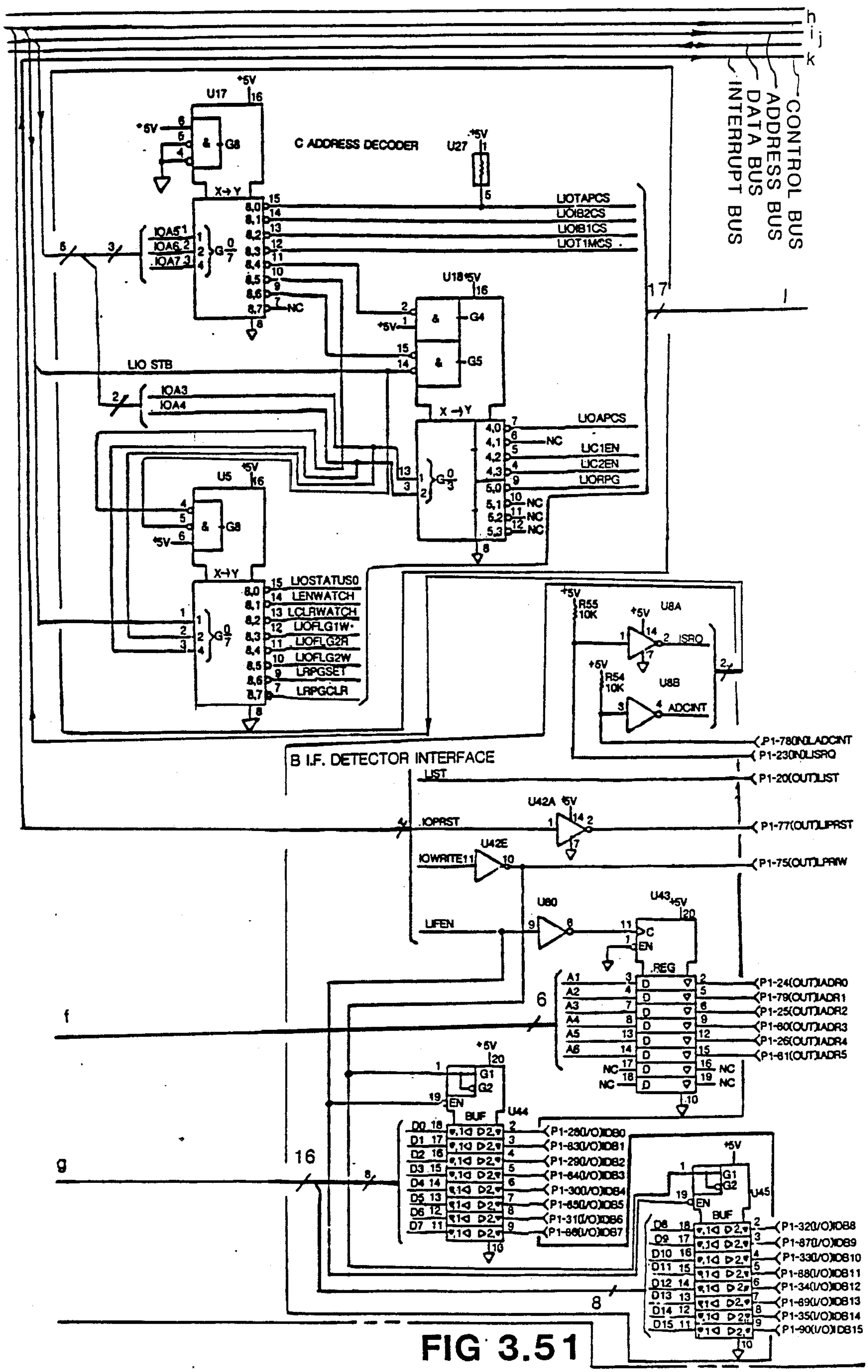
FIG 3.51

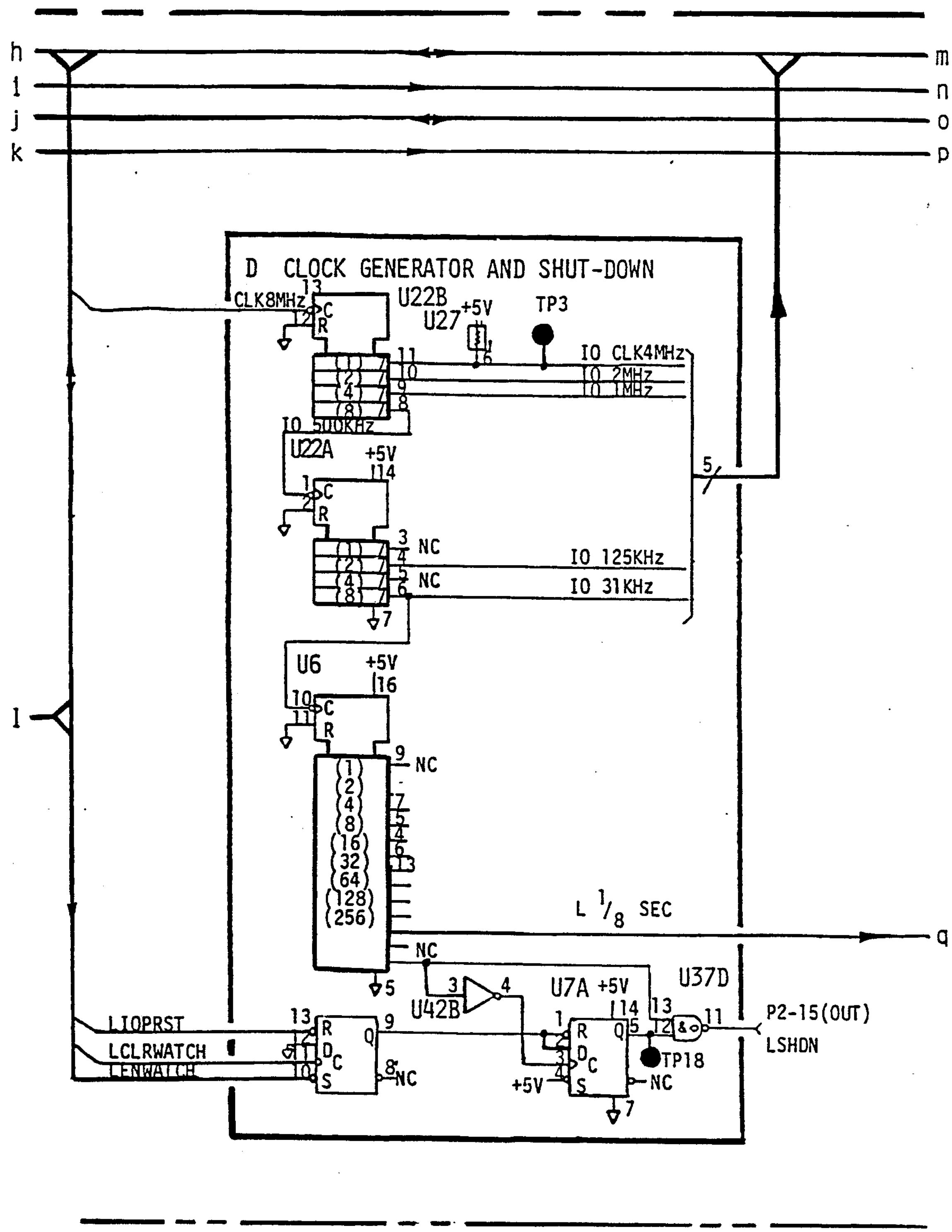
FIG 3.52

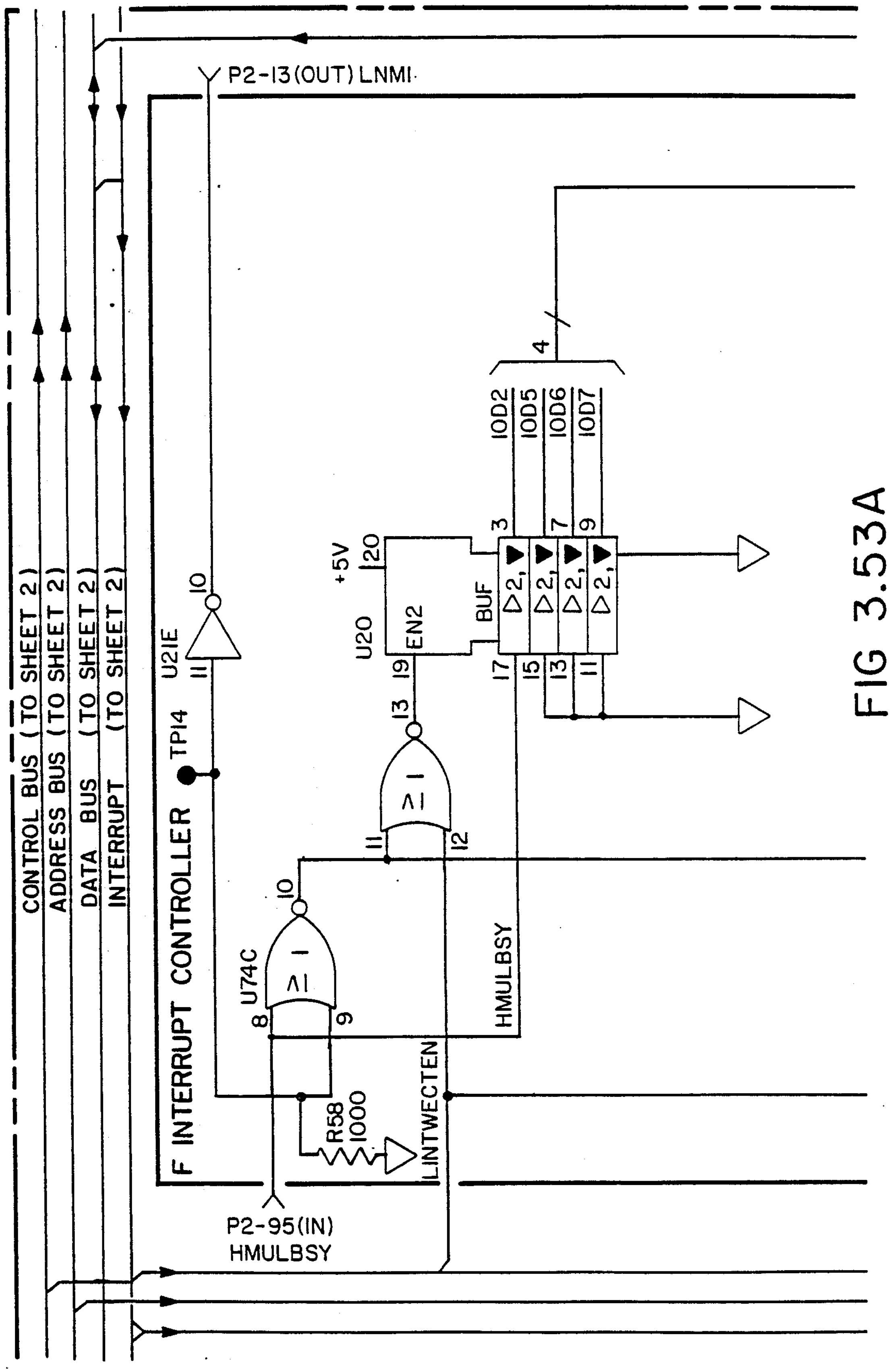
FIG 3.53A

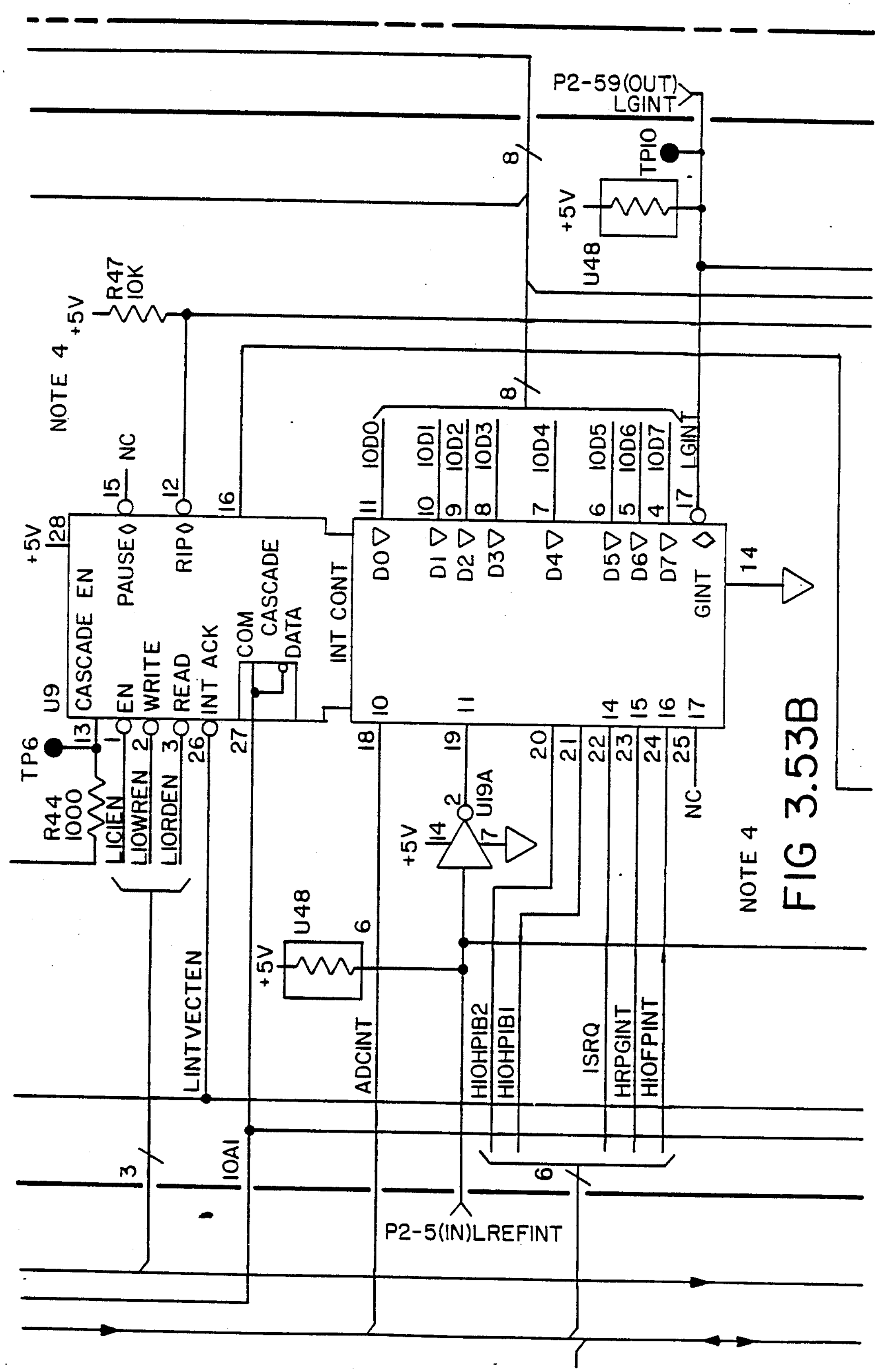
FIG 3.53B

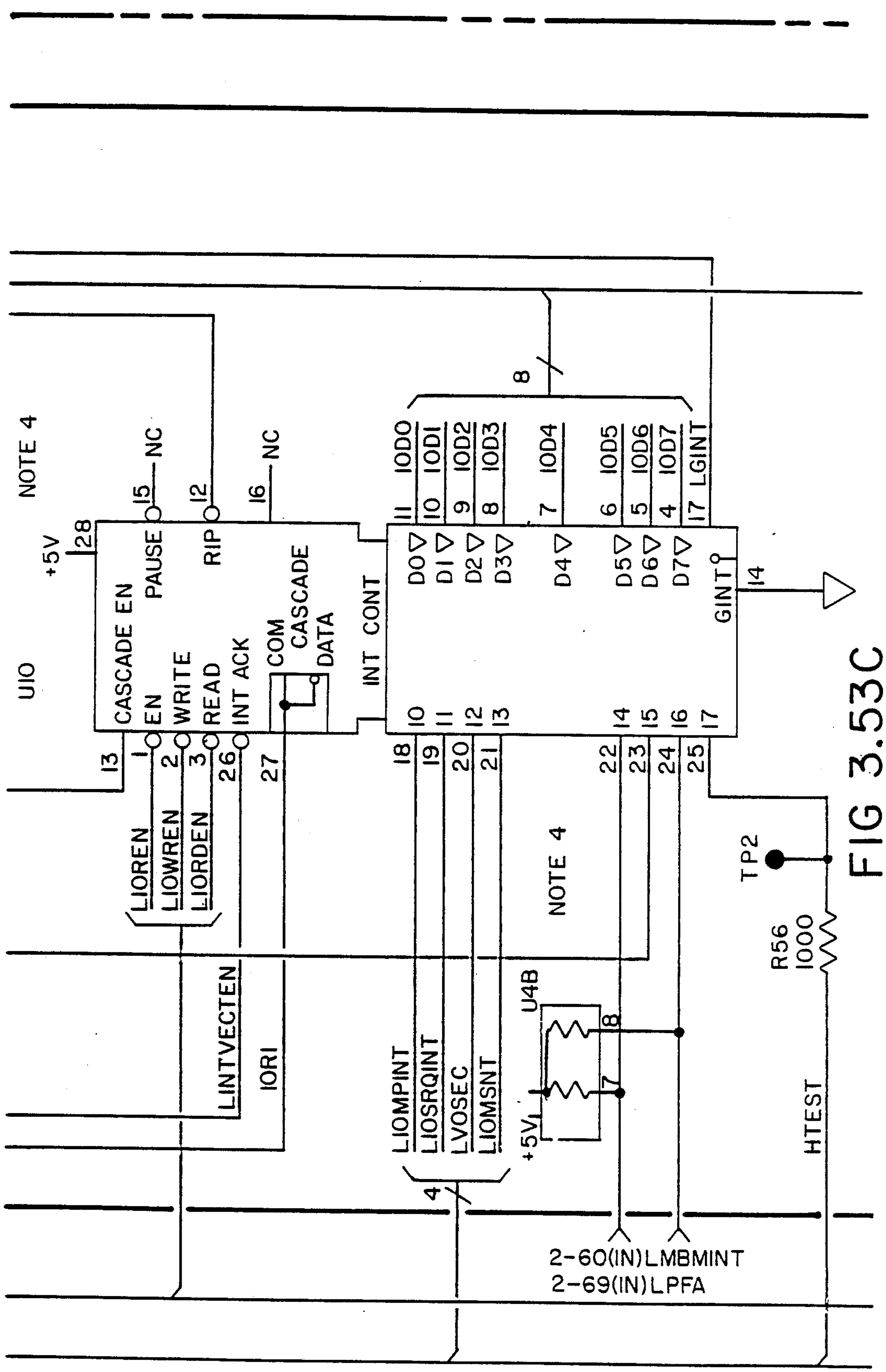
FIG 3.53C

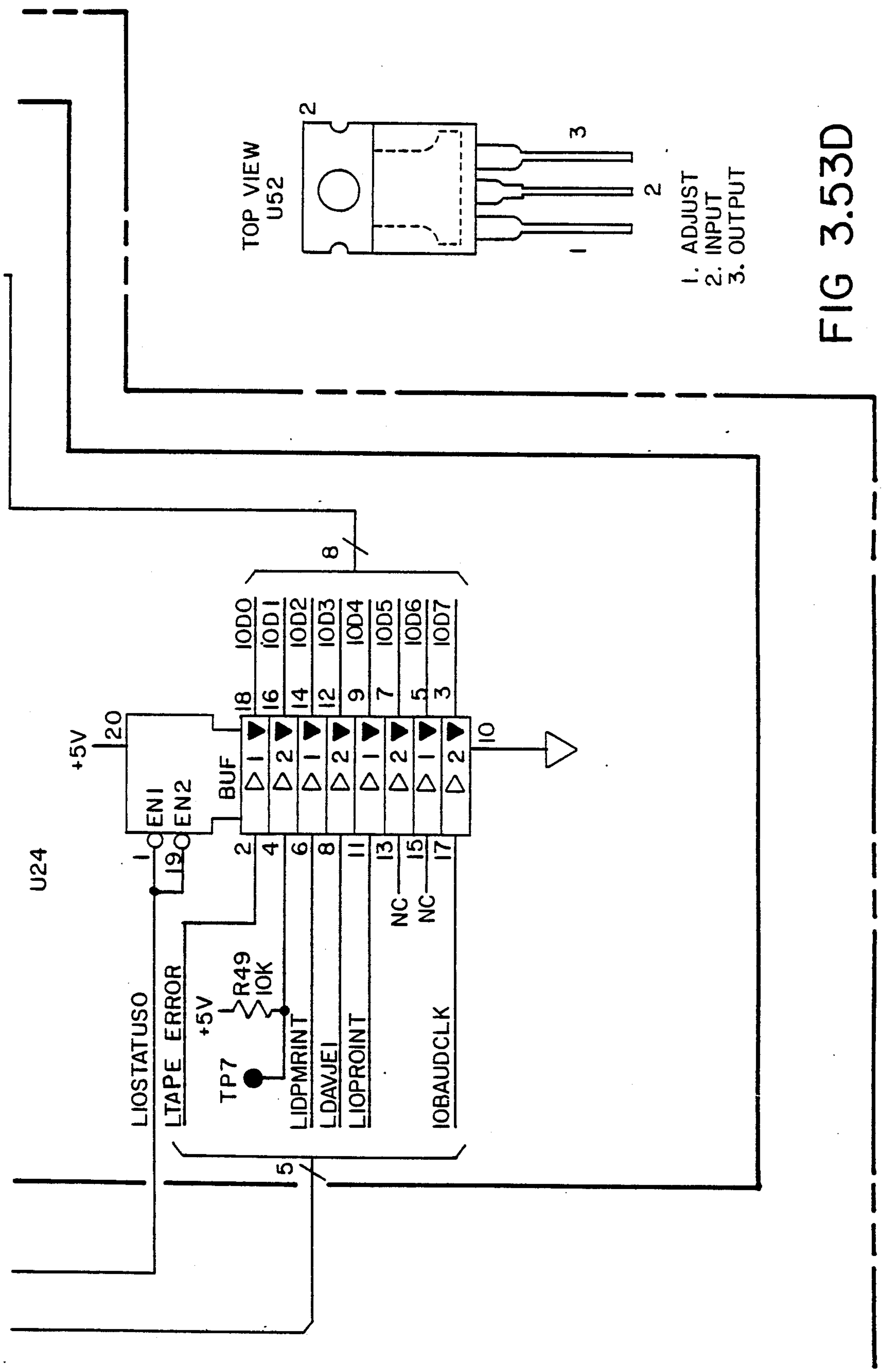
FIG 3.53D

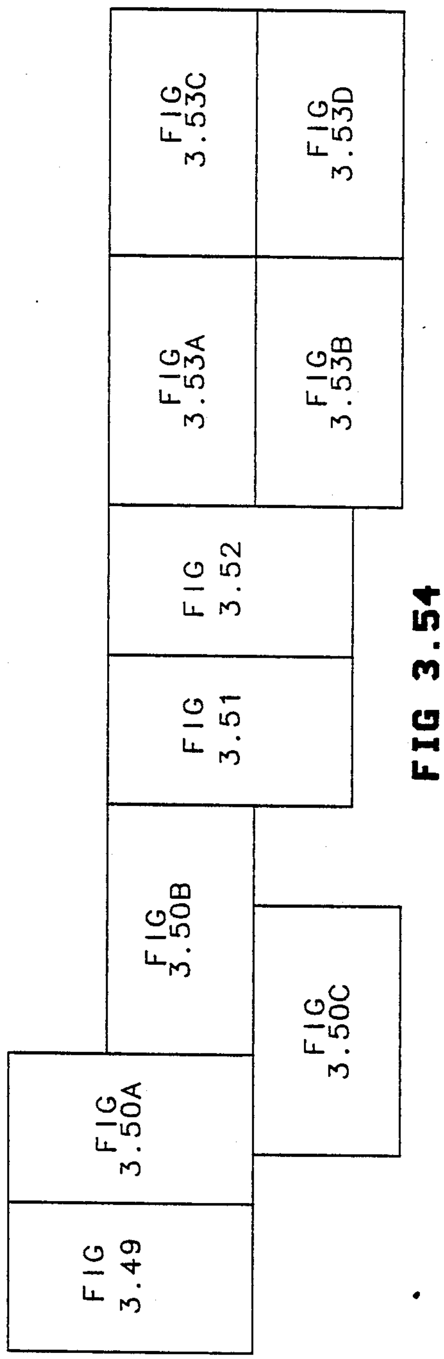
FIG 3.54
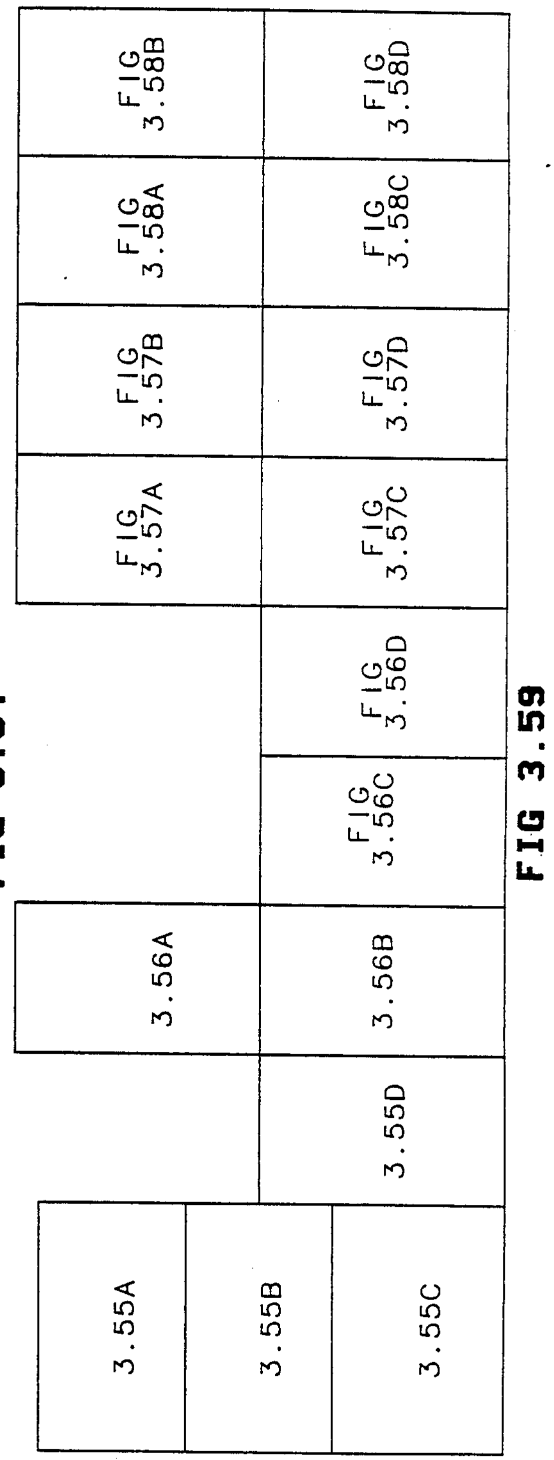
FIG 3.59

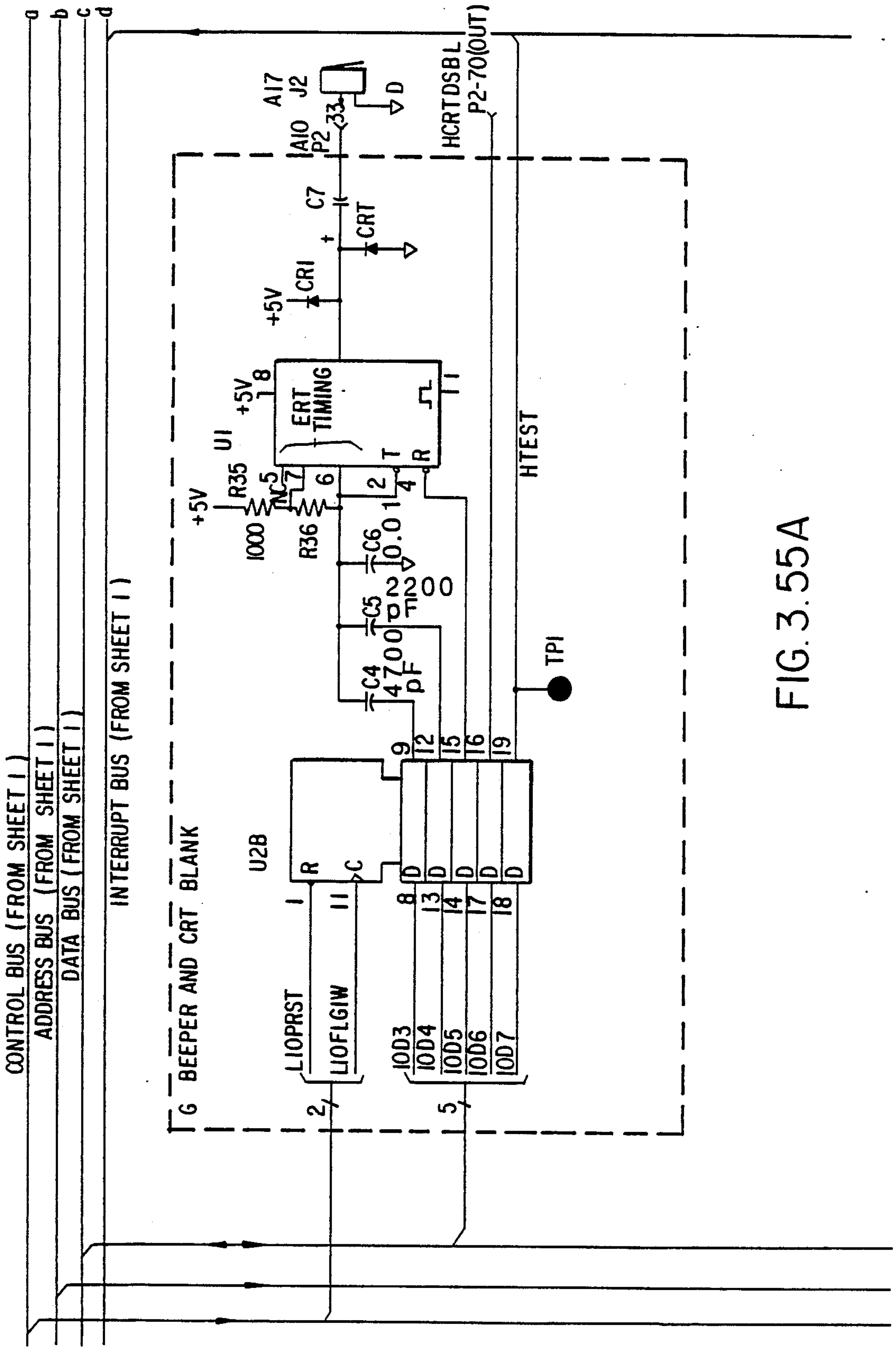
FIG. 3.55A

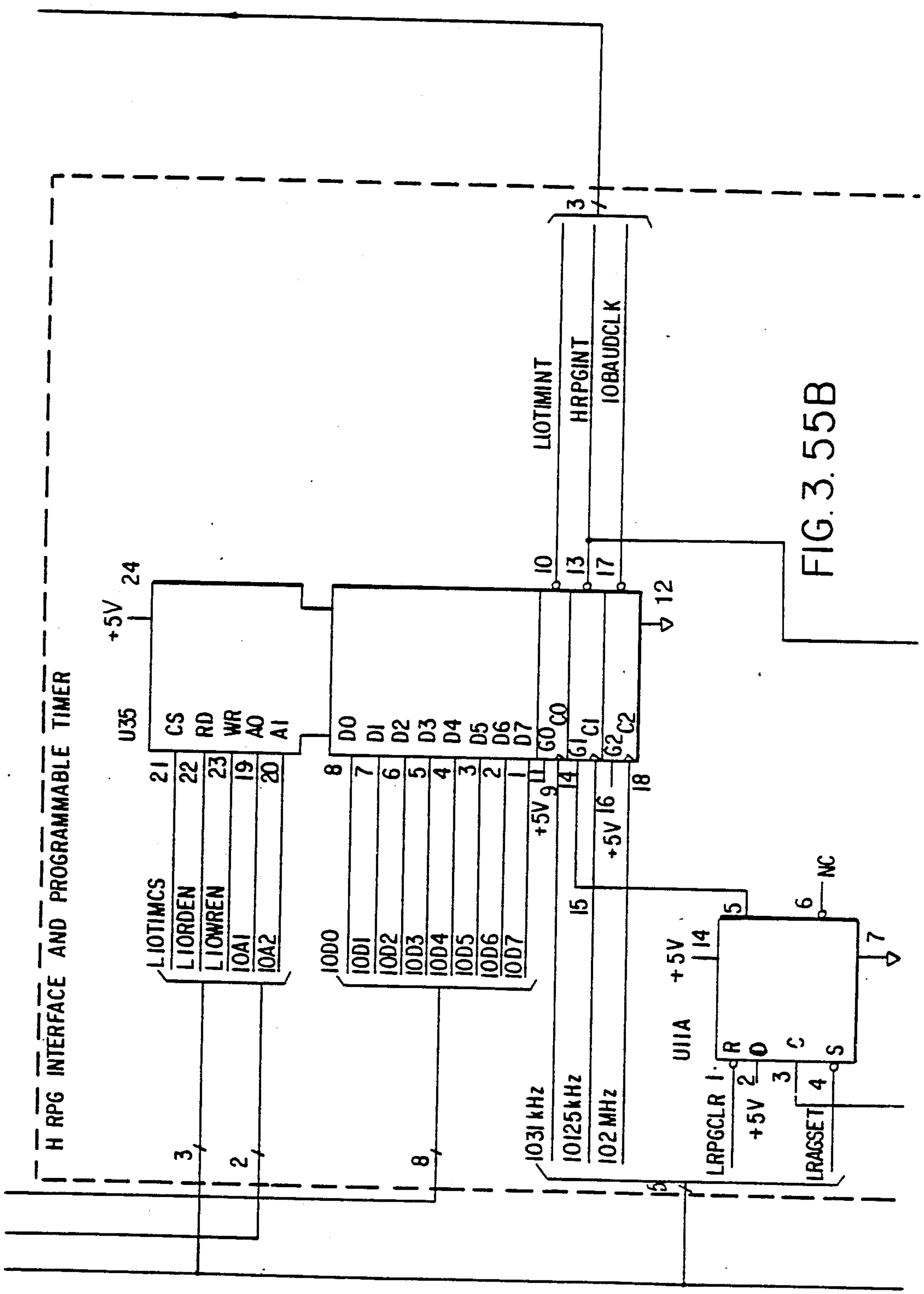
FIG. 3.55B

FIG. 3.55C
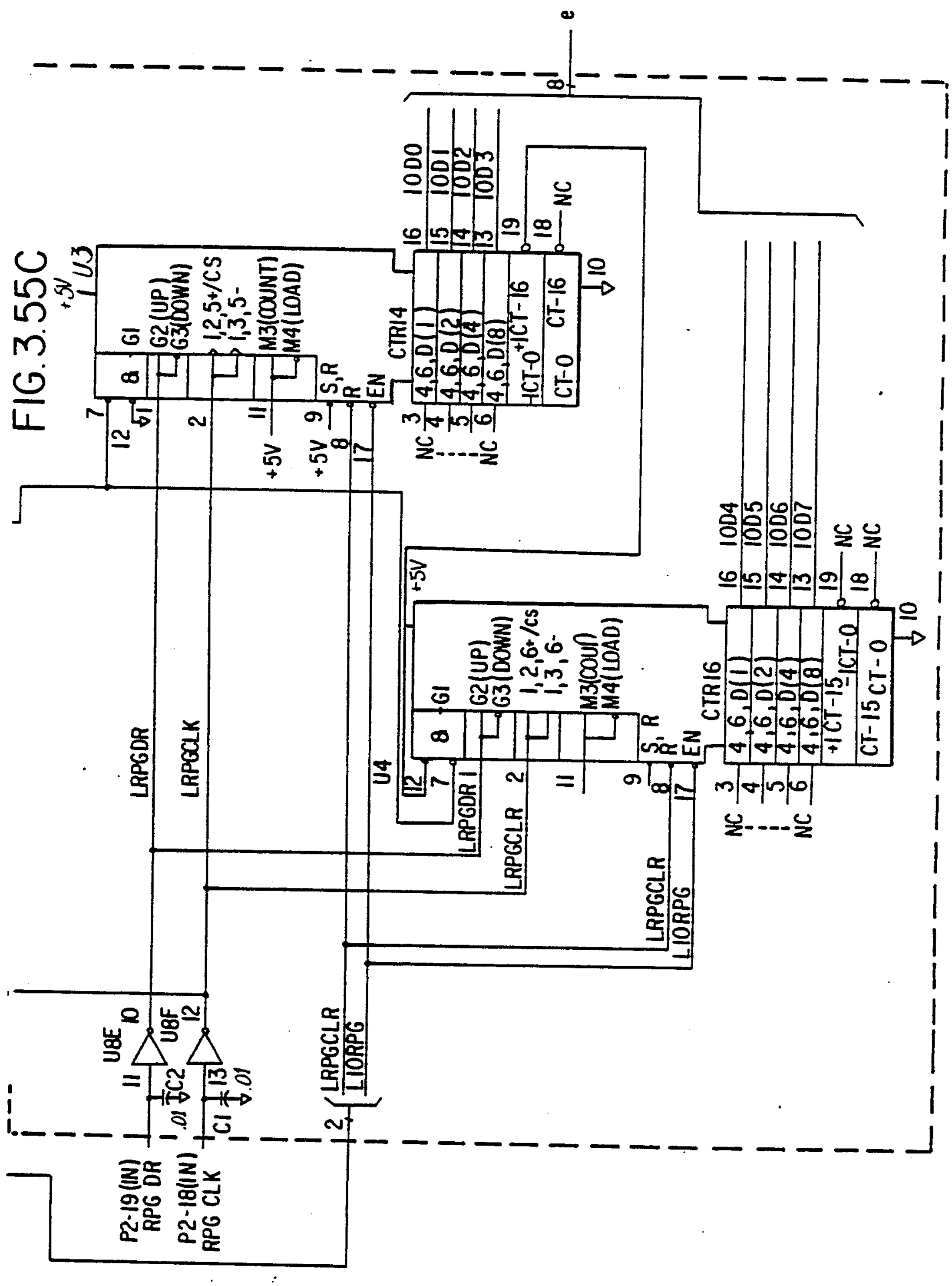

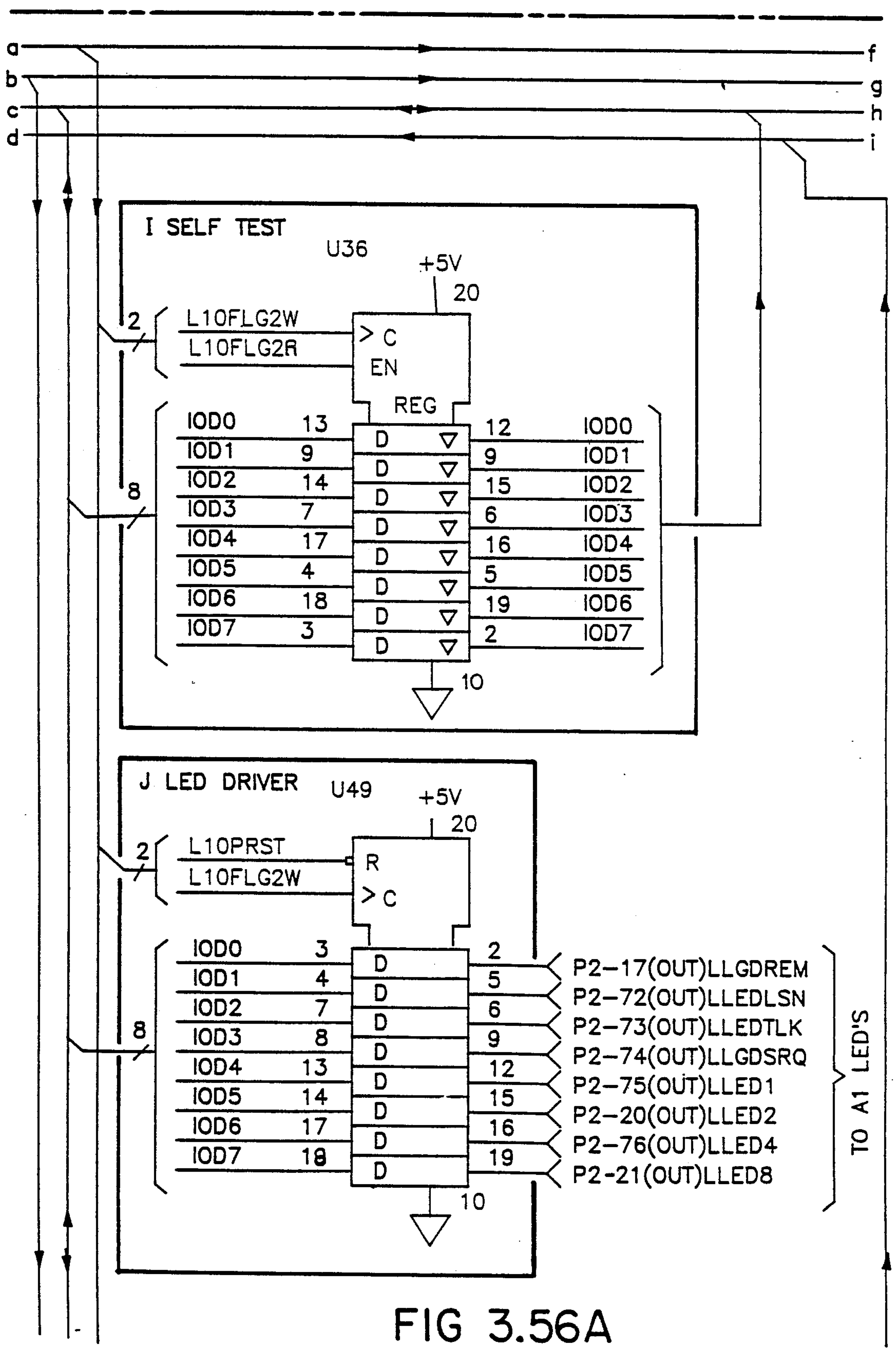
FIG 3.56A

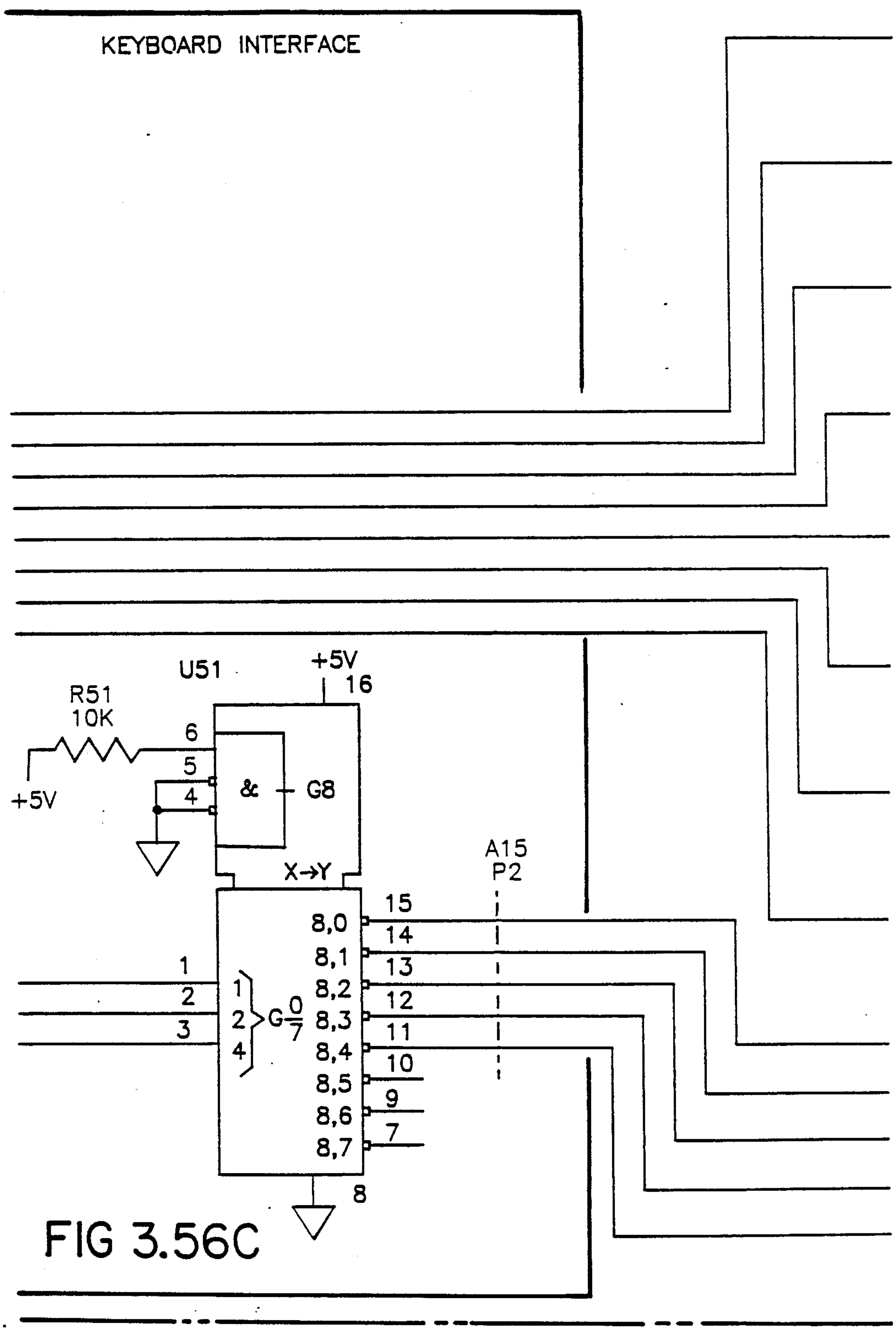
FIG 3.56C

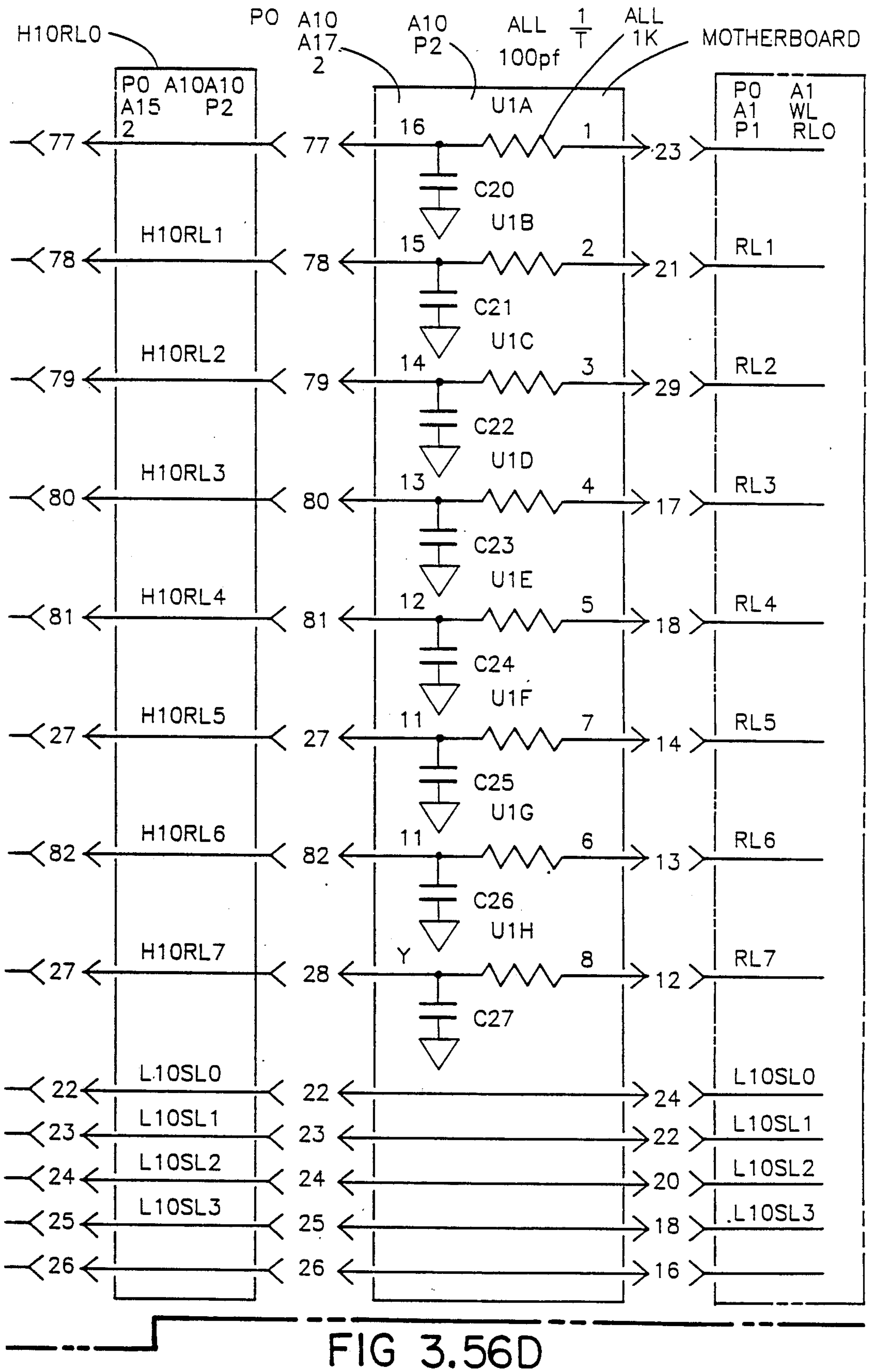
FIG 3.56D

FIG 3.57A
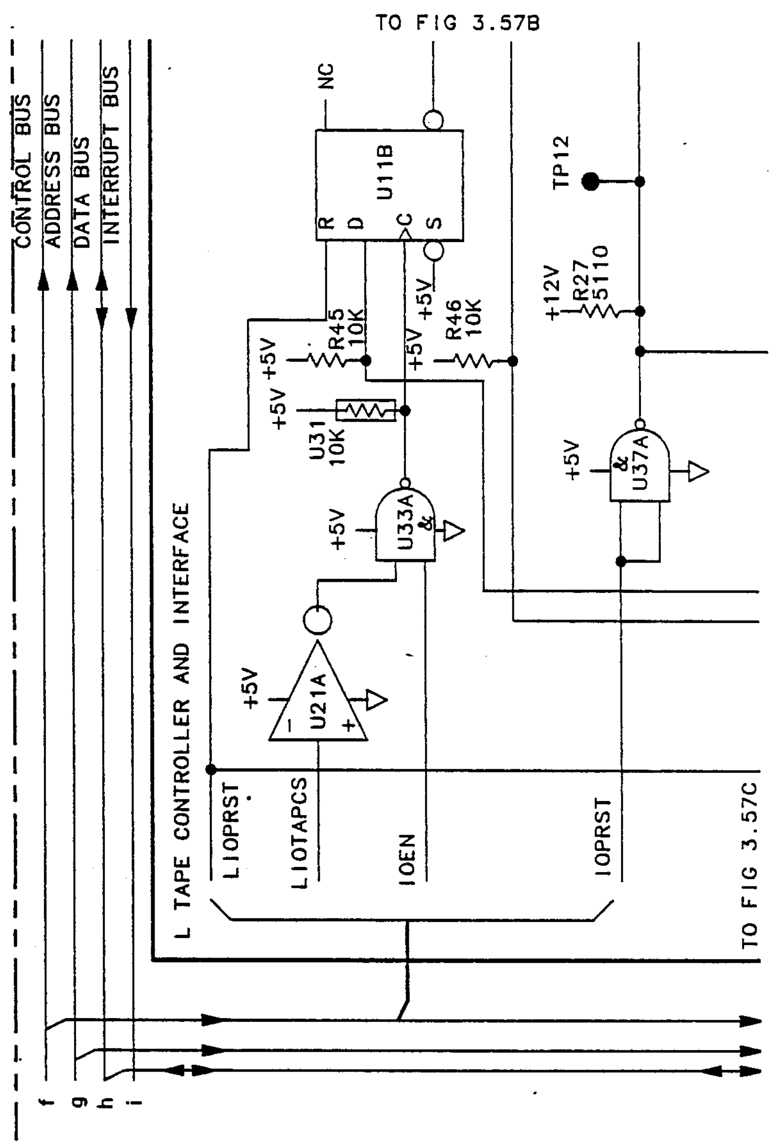

FIG 3.57B
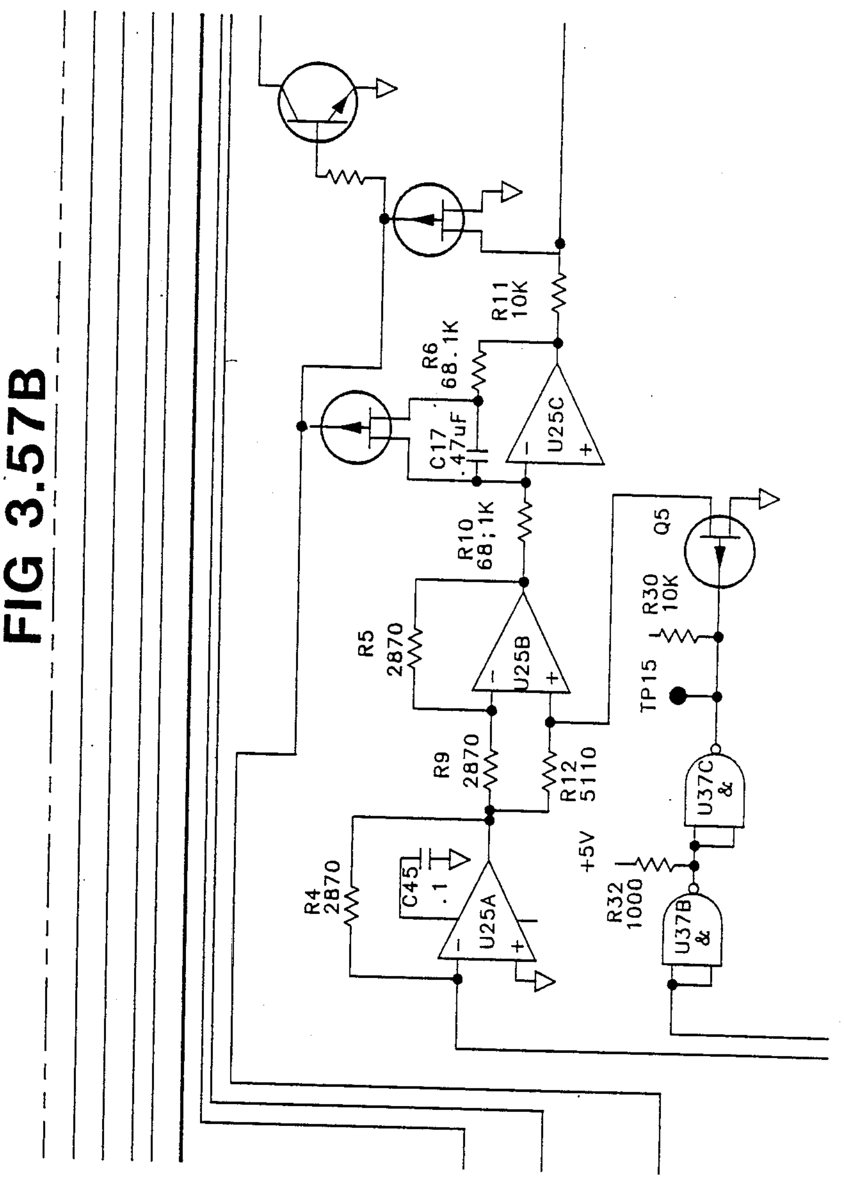

FIG 3.57C
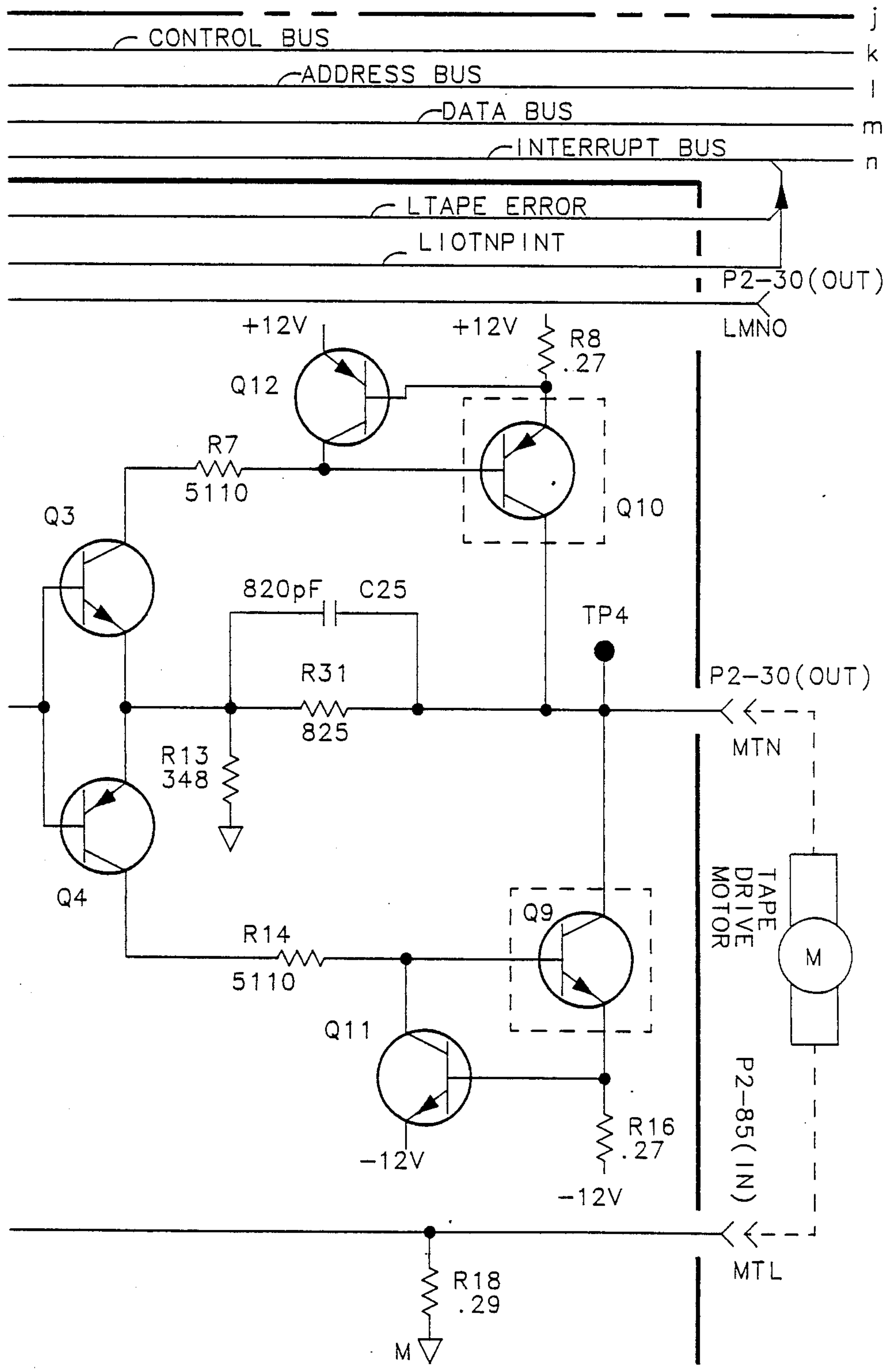

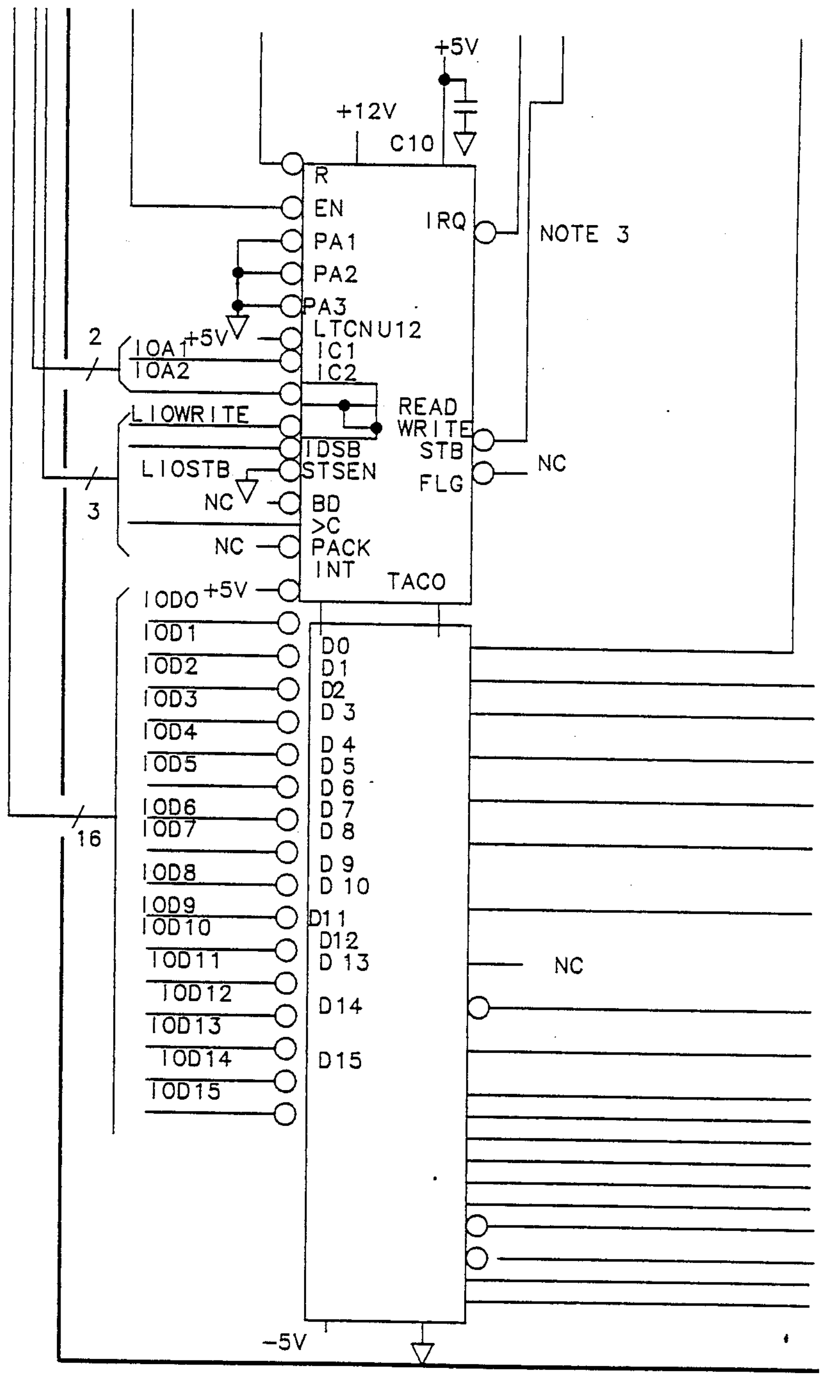
FIG 3.57D

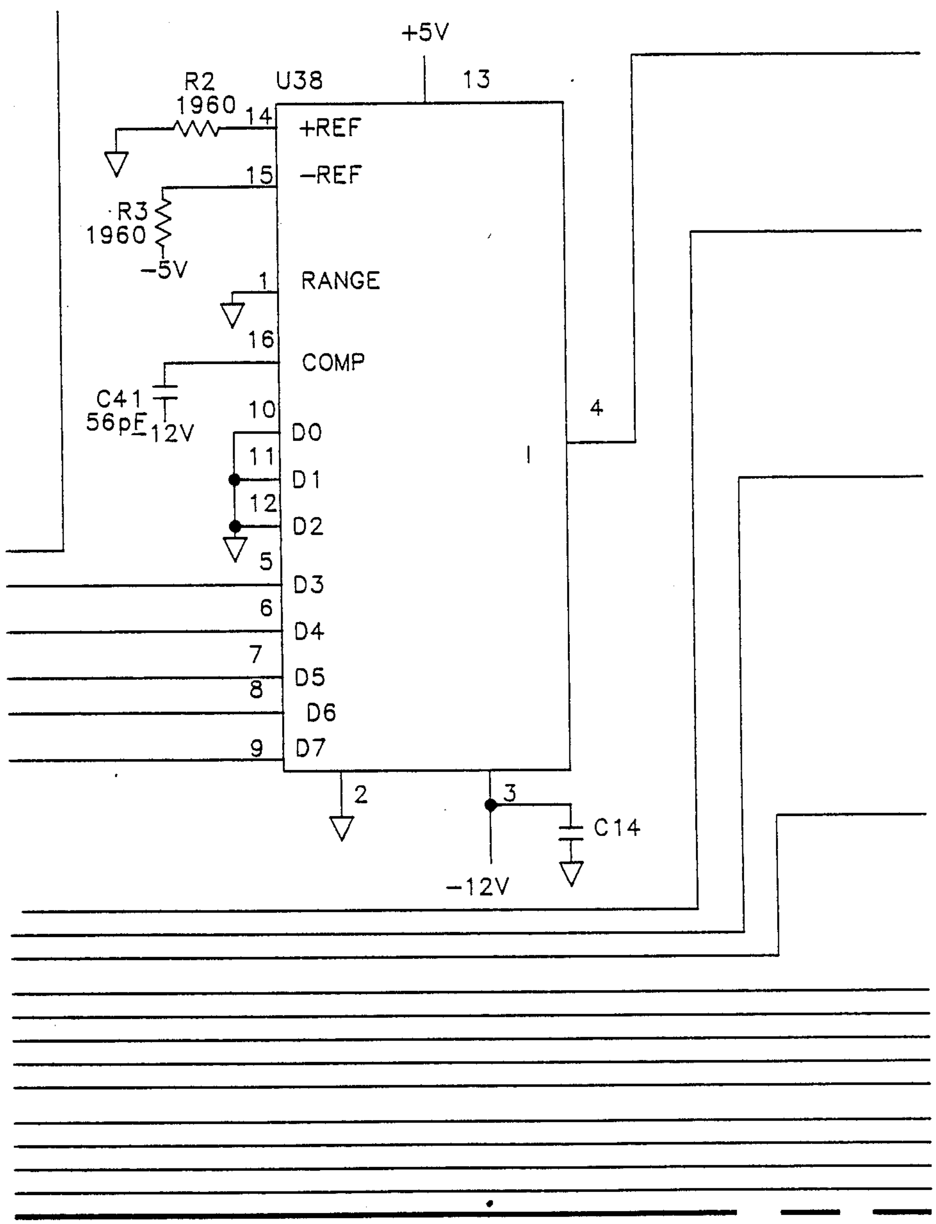
FIG 3.57E

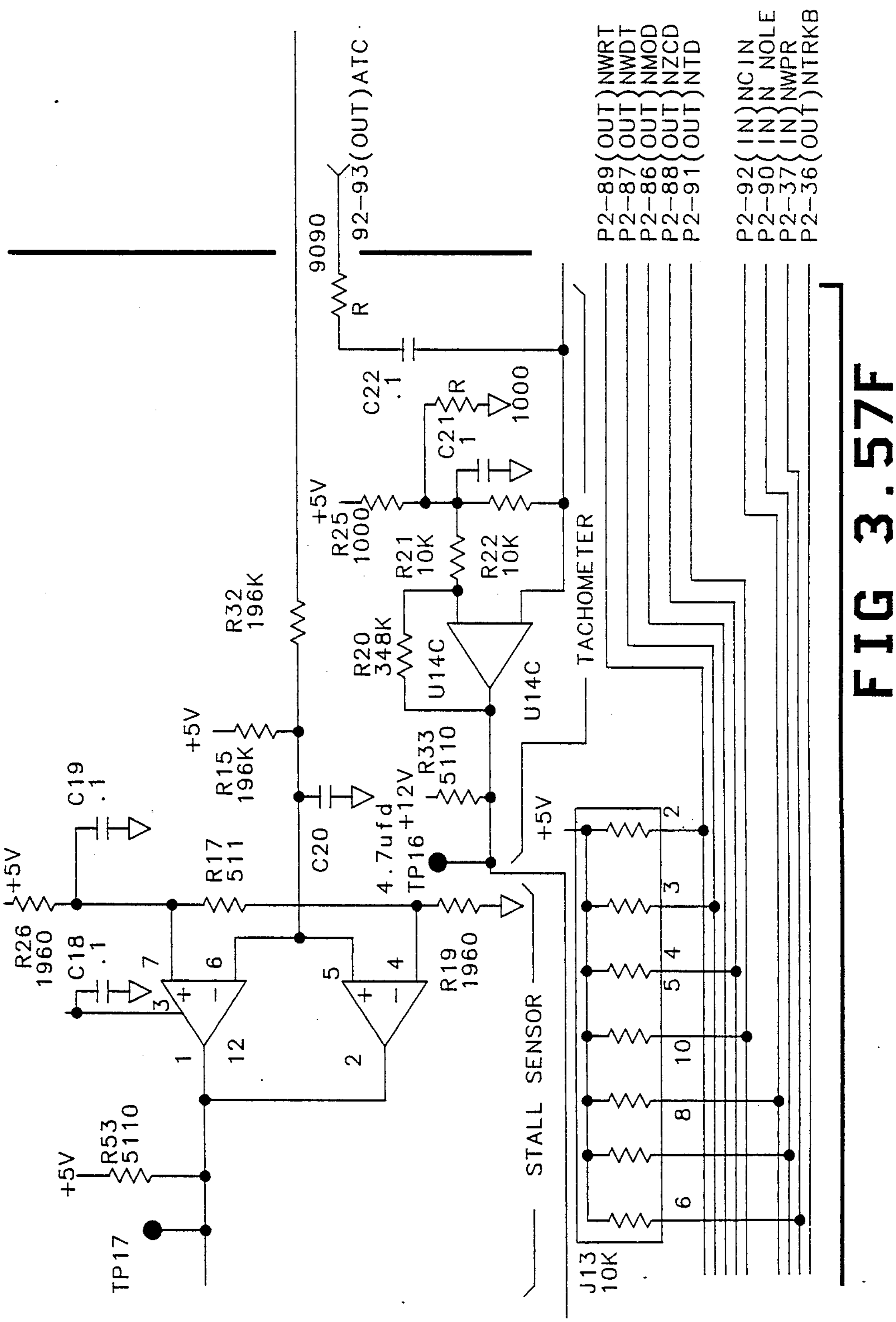
FIG 3.57F

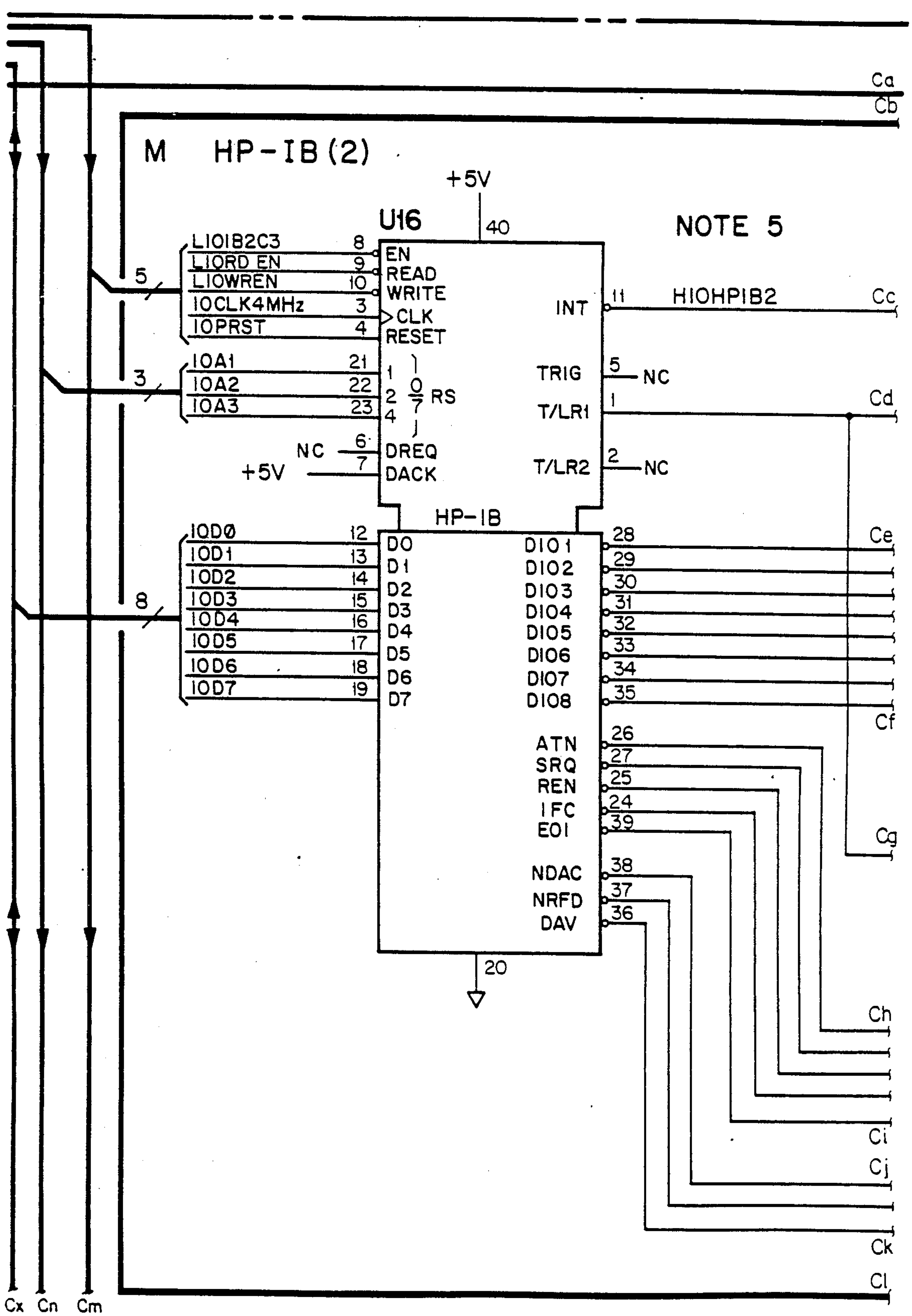
FIG 3.58A

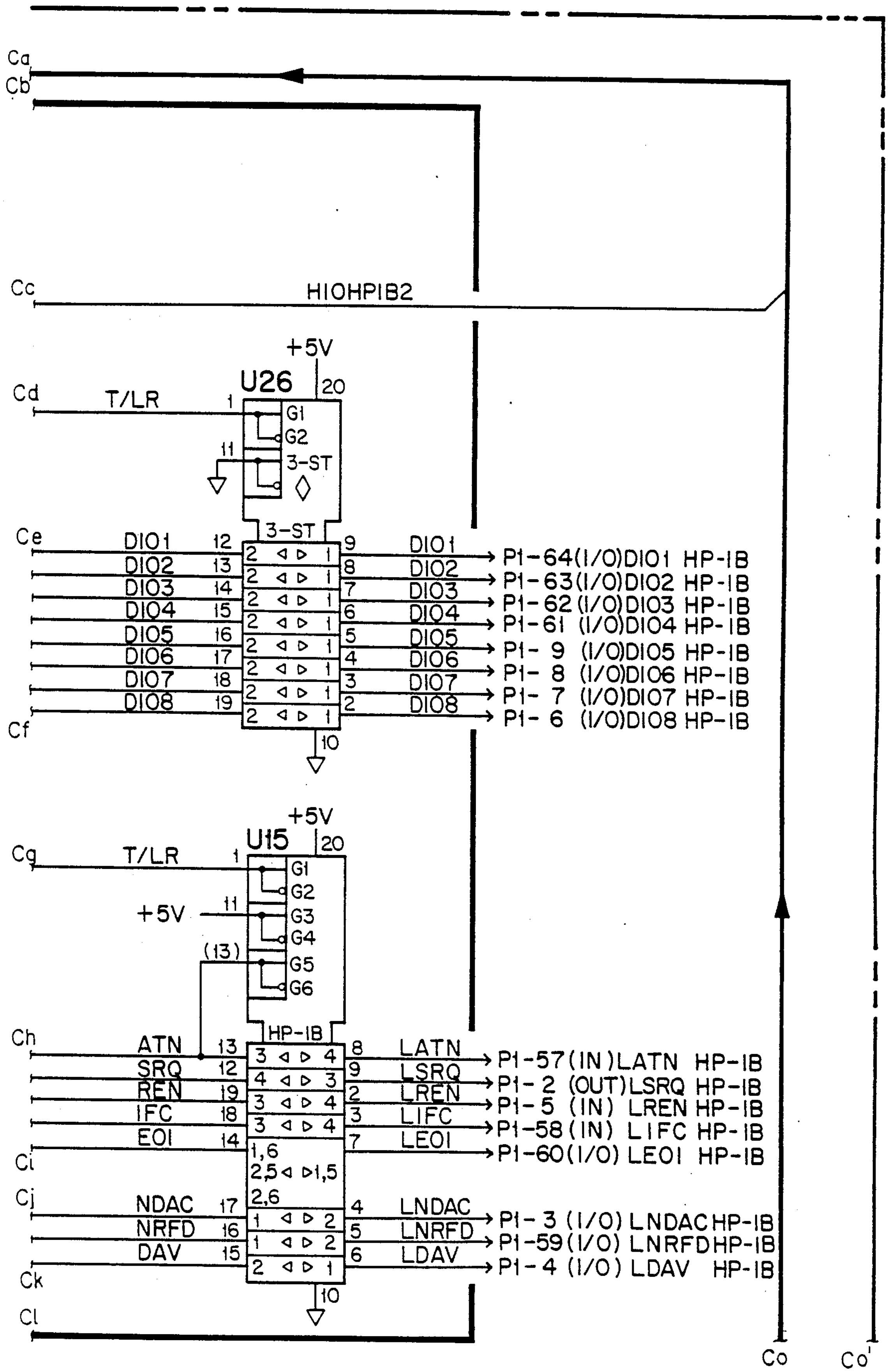
FIG 3.58B

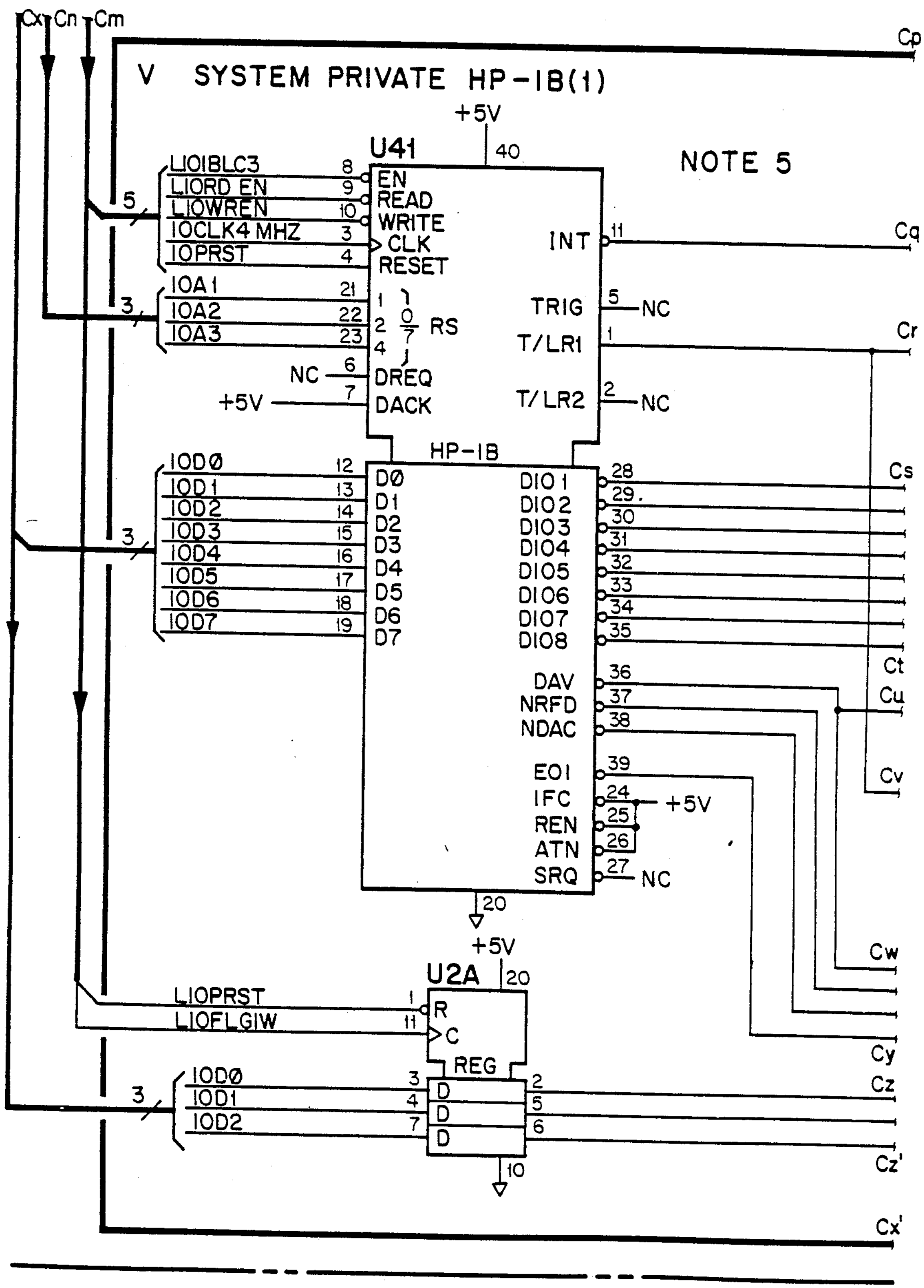
FIG 3.58C

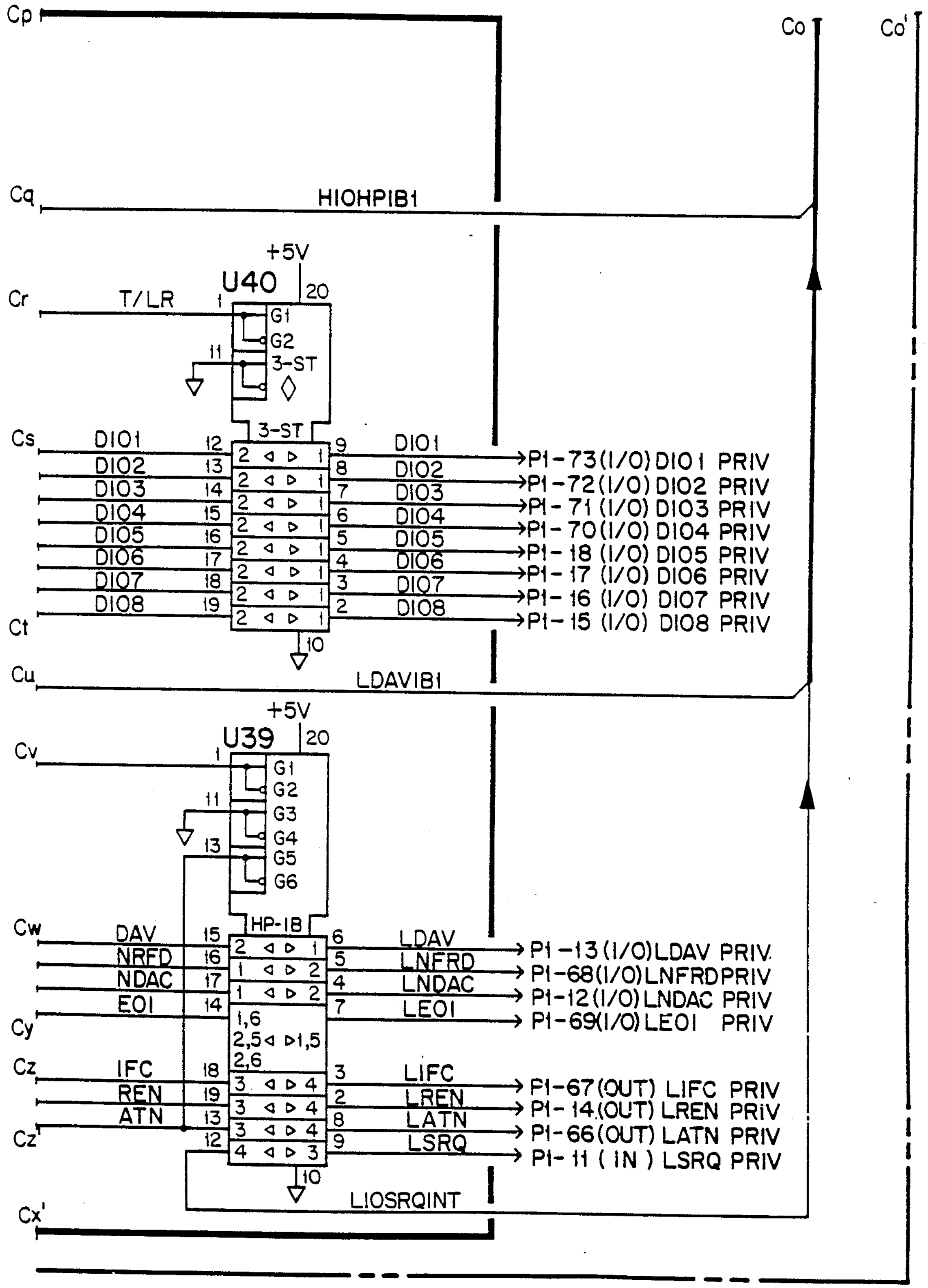
FIG. 3.58D

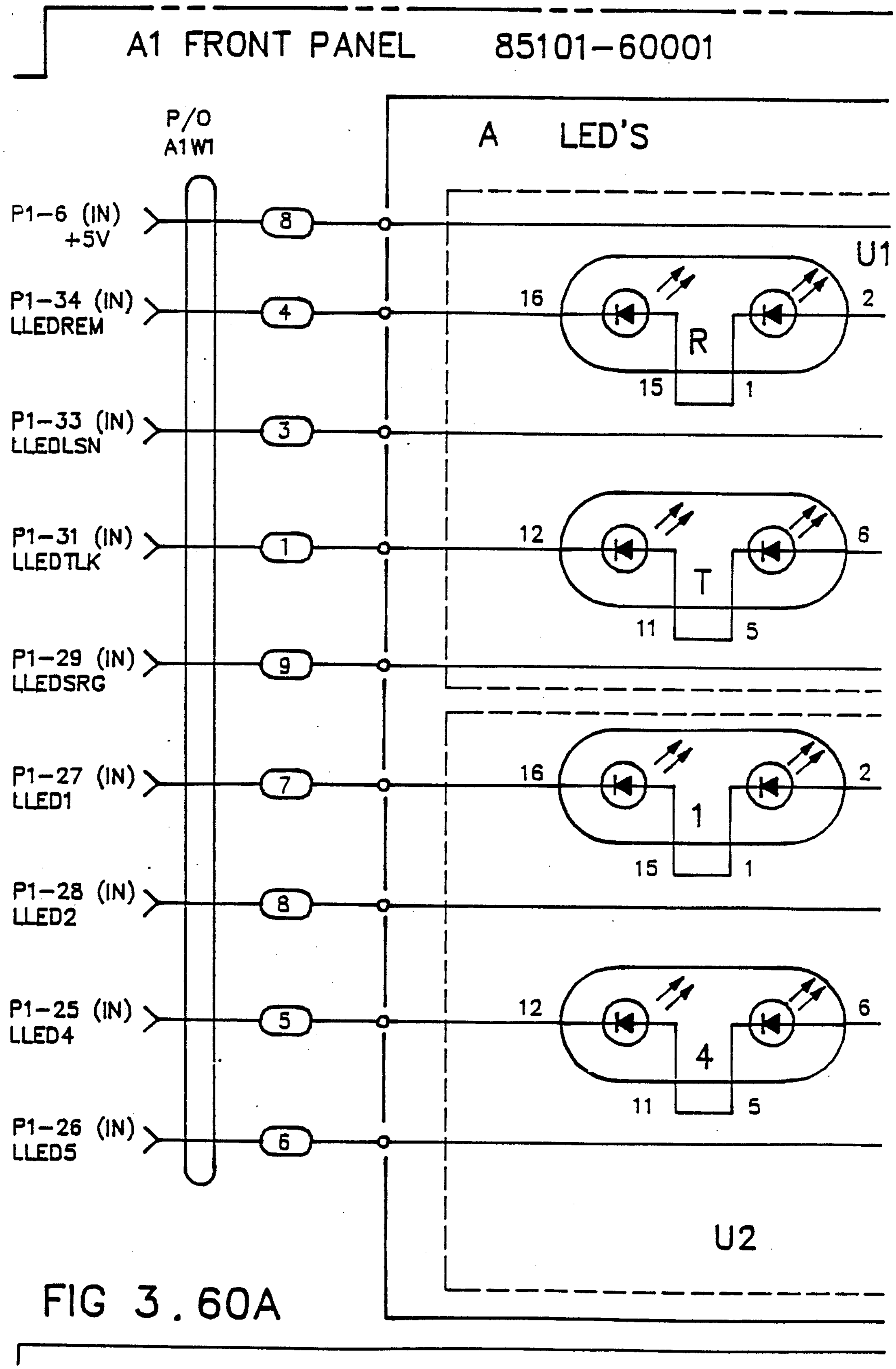
FIG 3.60A

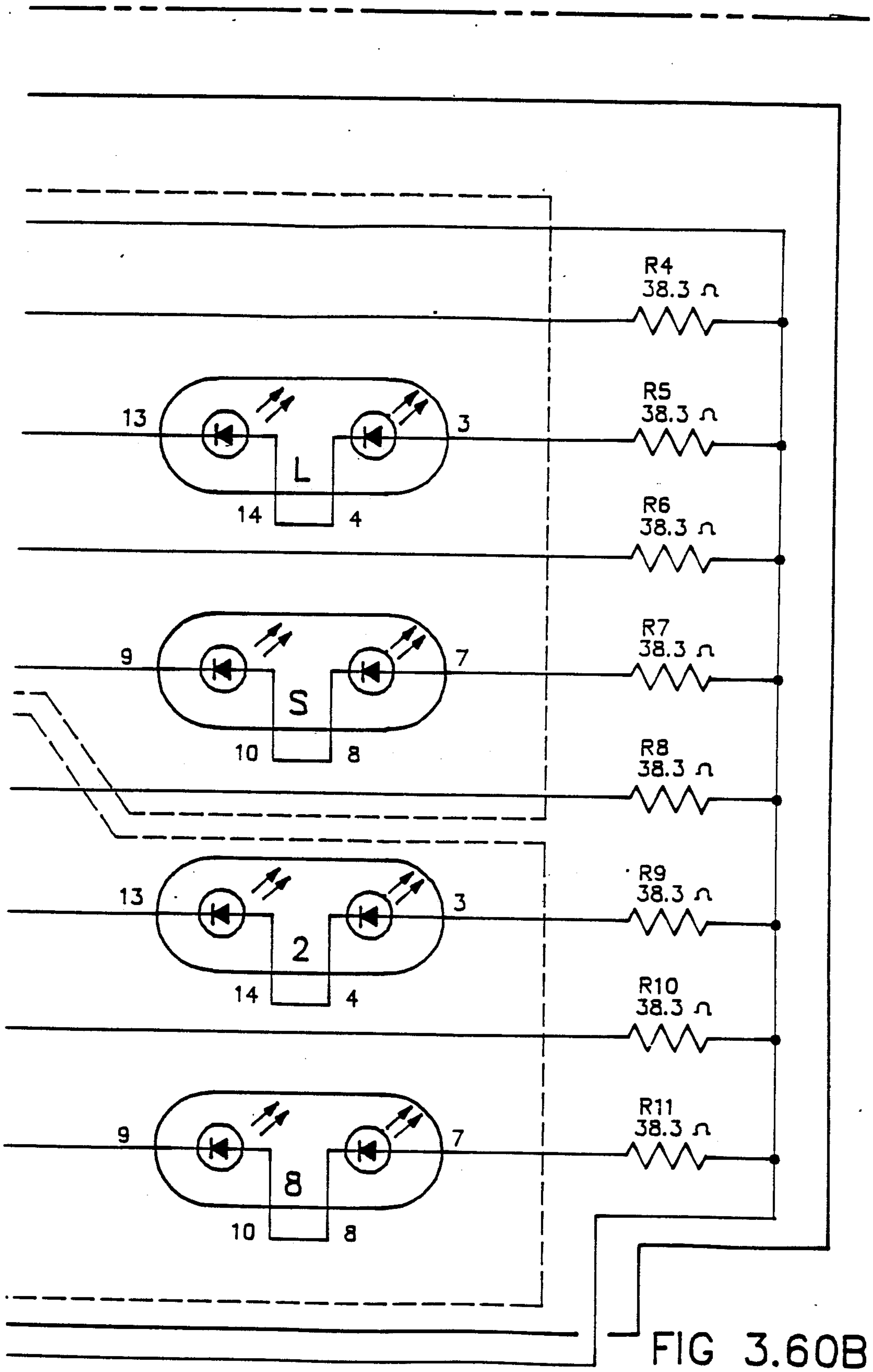
FIG 3.60B

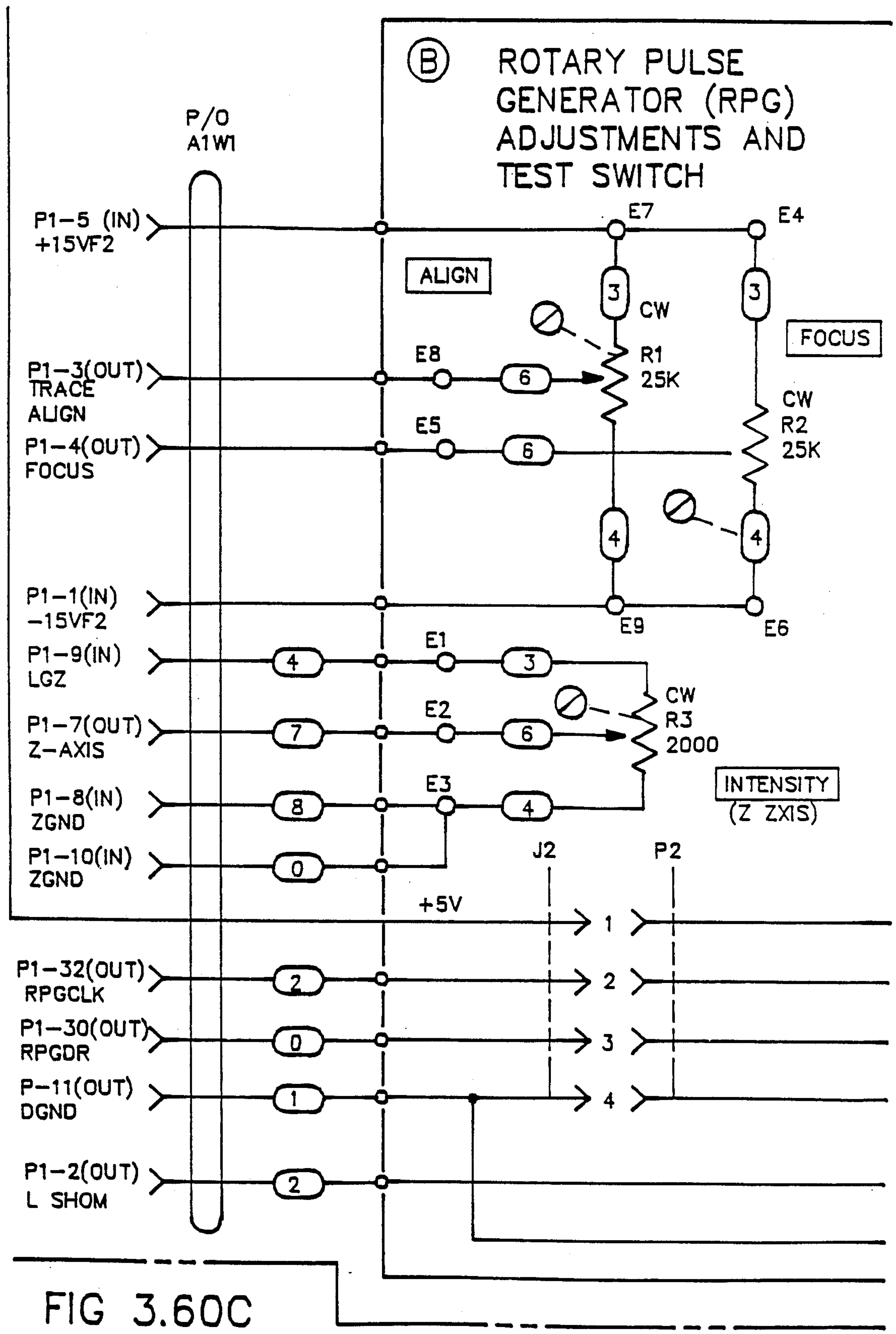
FIG 3.60C

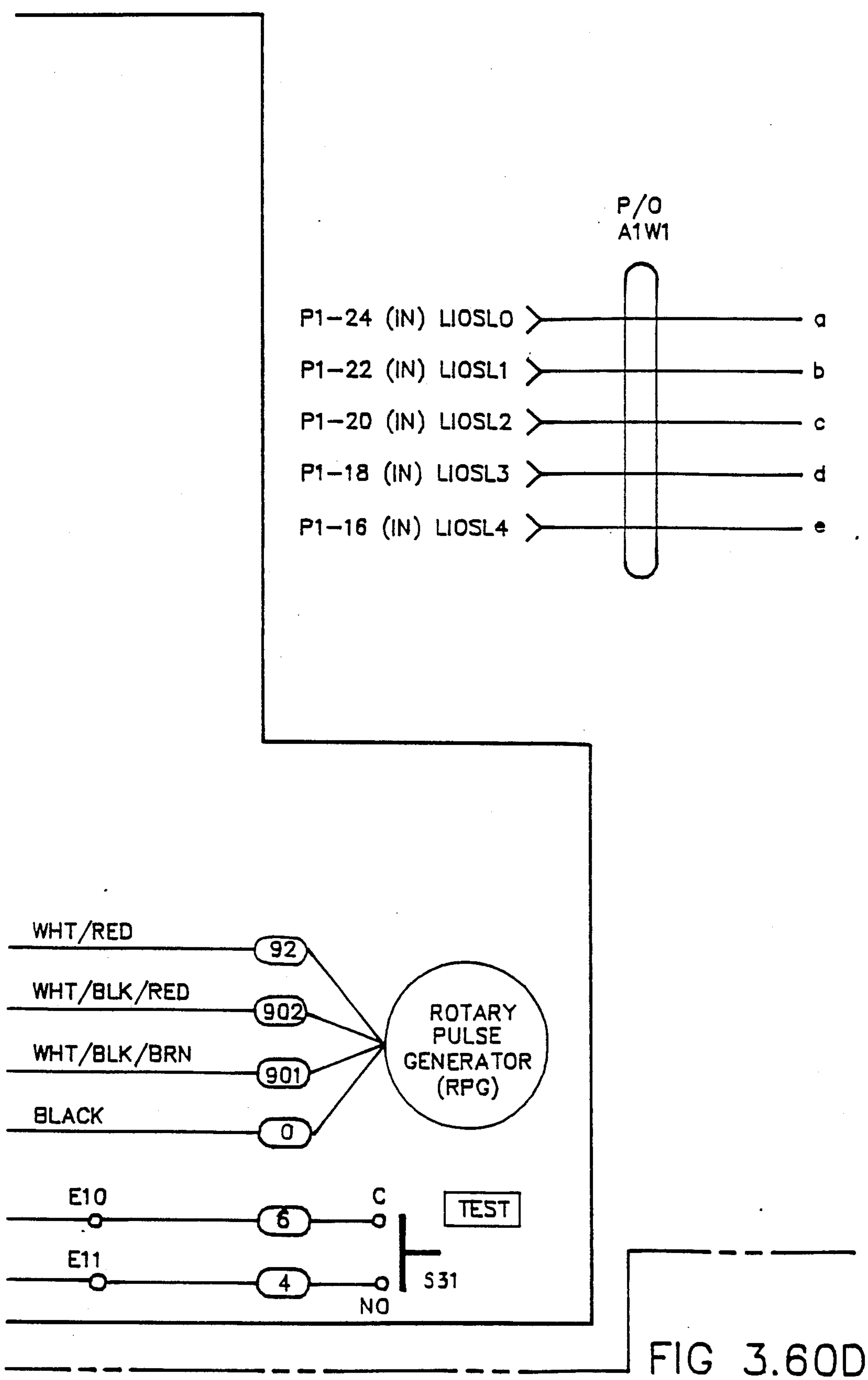
FIG 3.60D

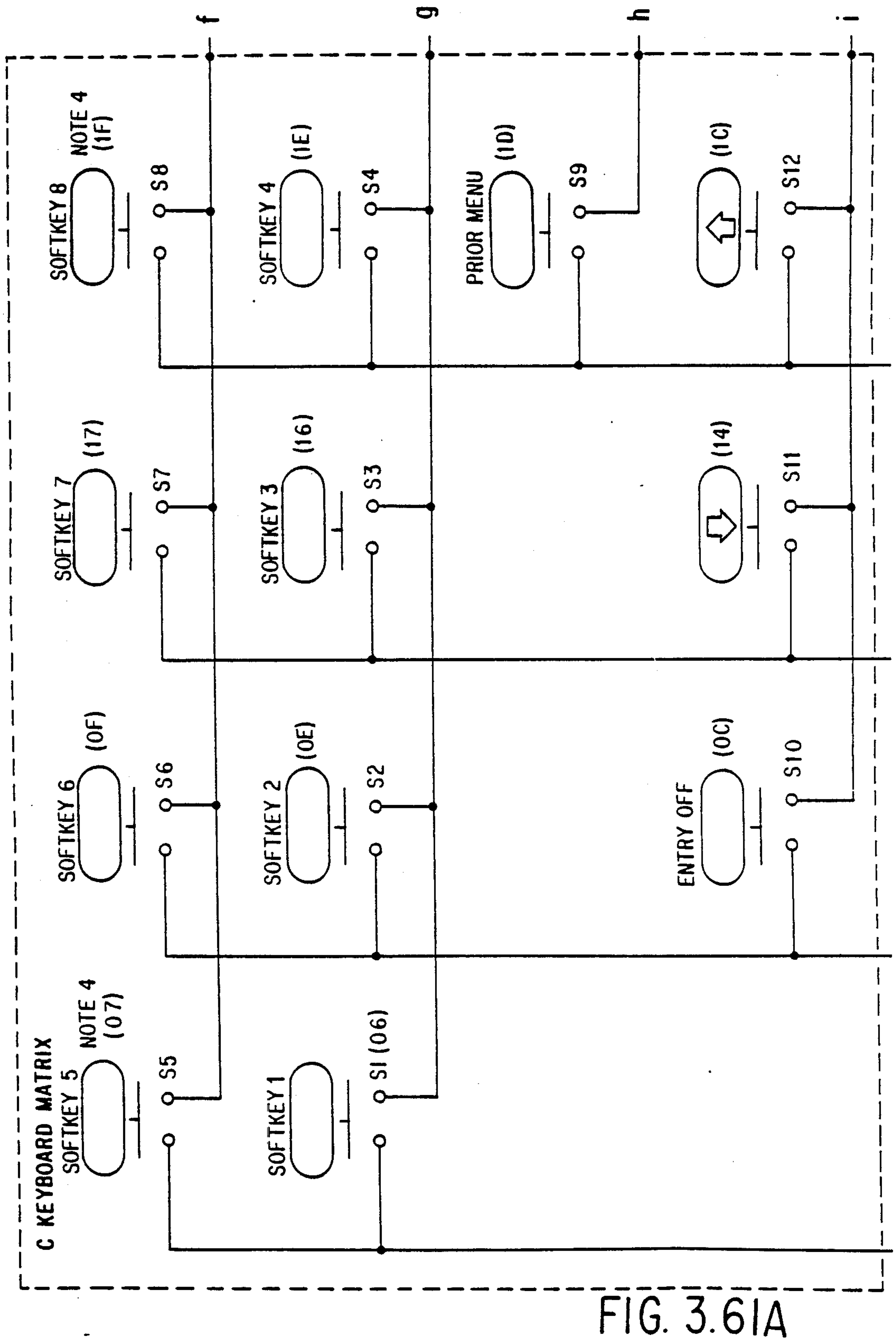
FIG. 3.61A

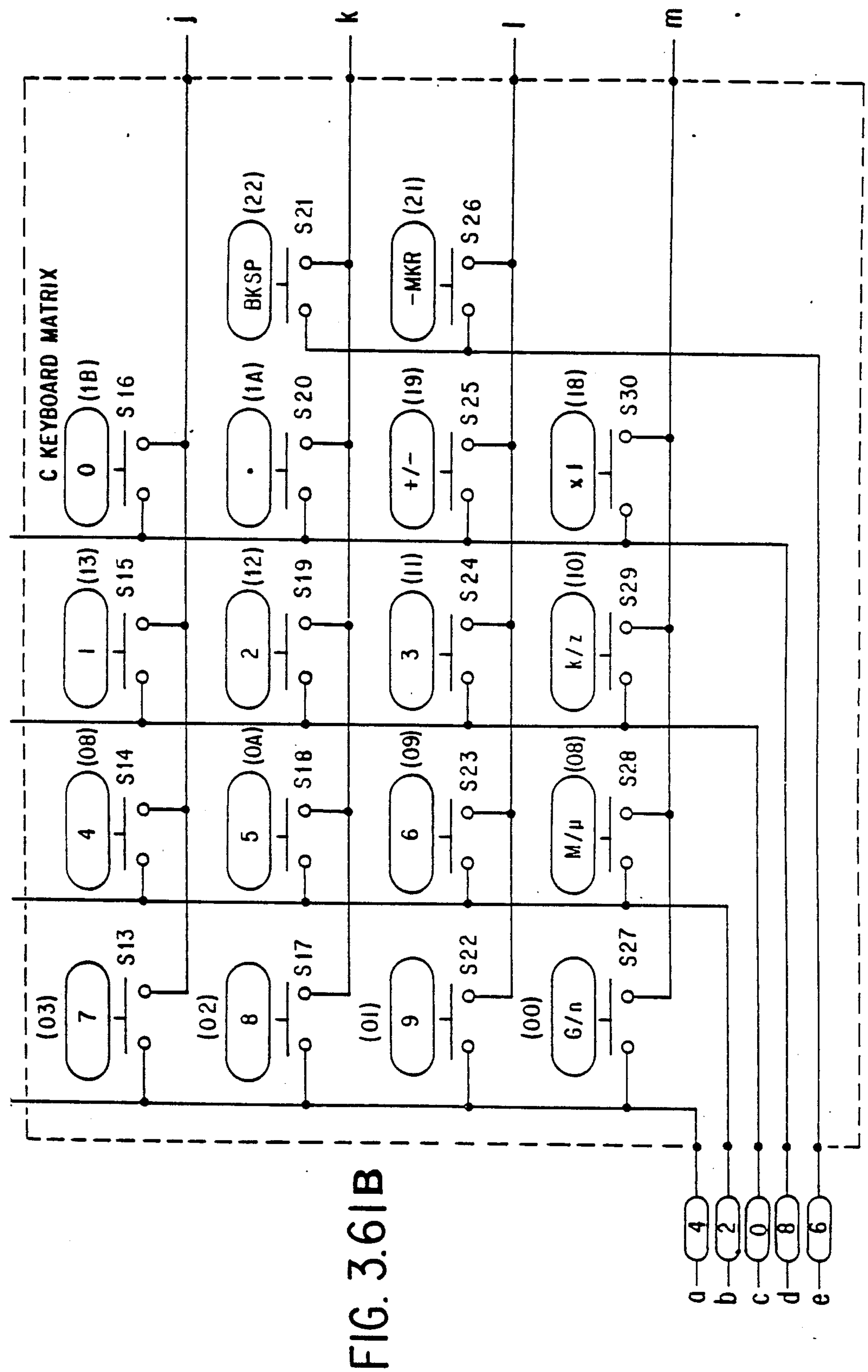
FIG. 3.61B

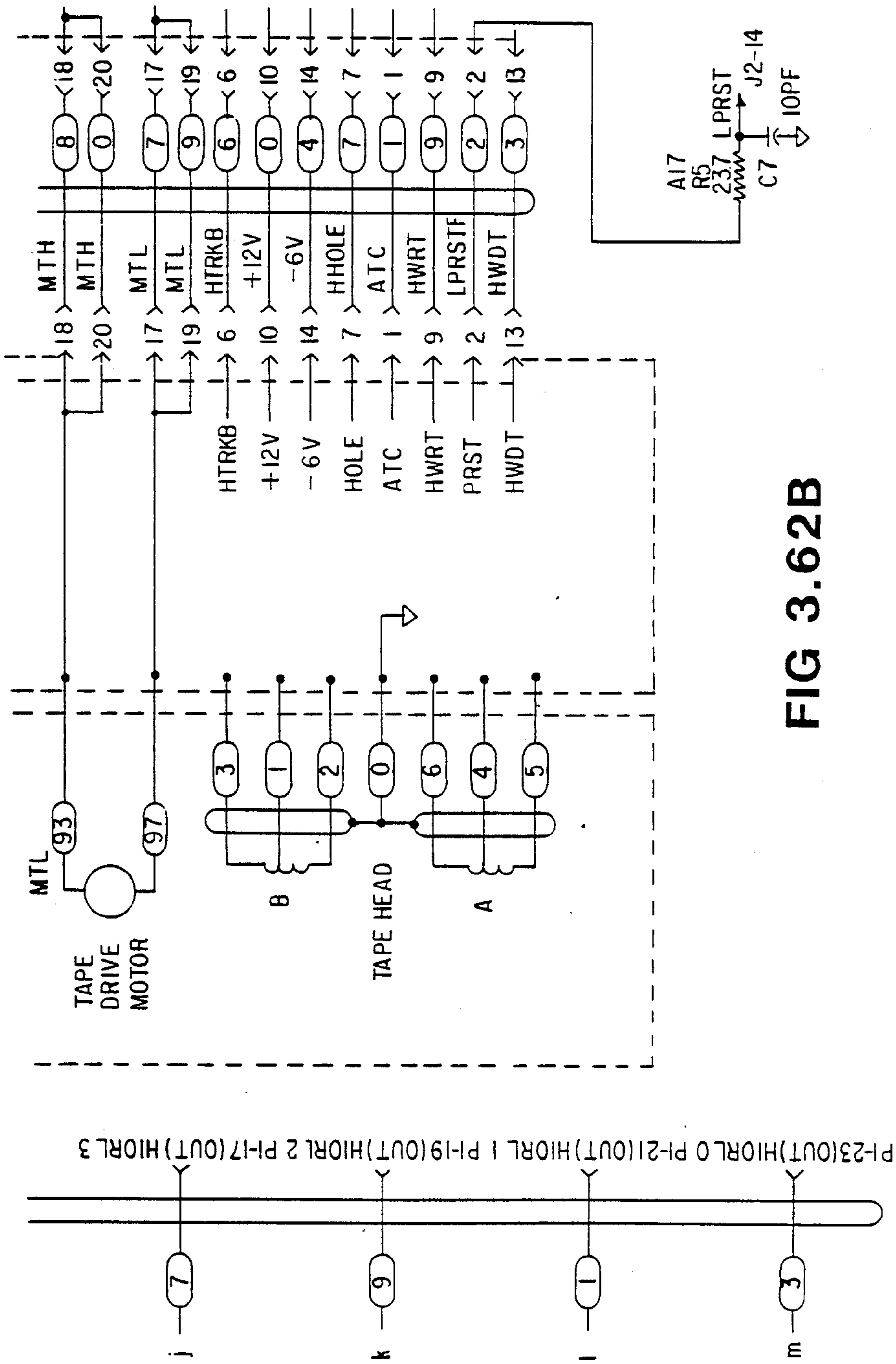
FIG 3.62B

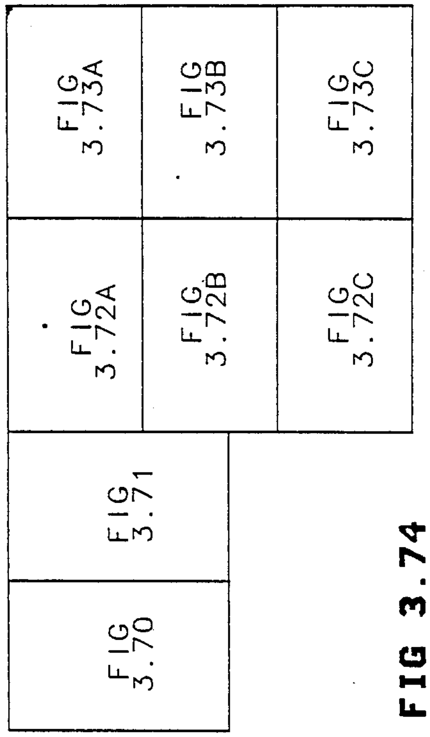
FIG 3.74
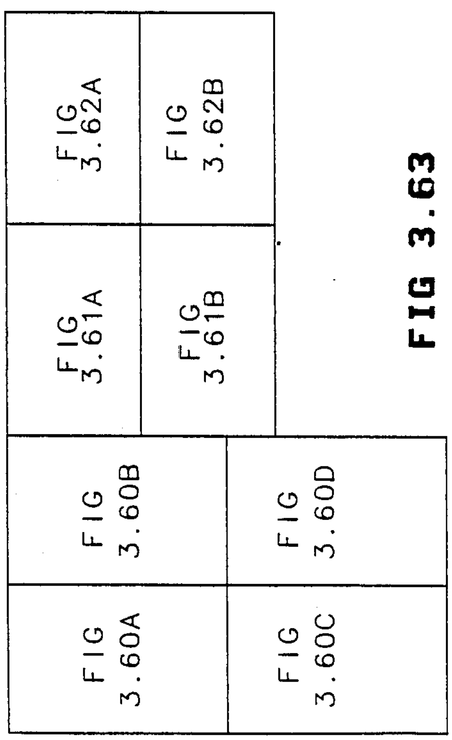
FIG 3.63
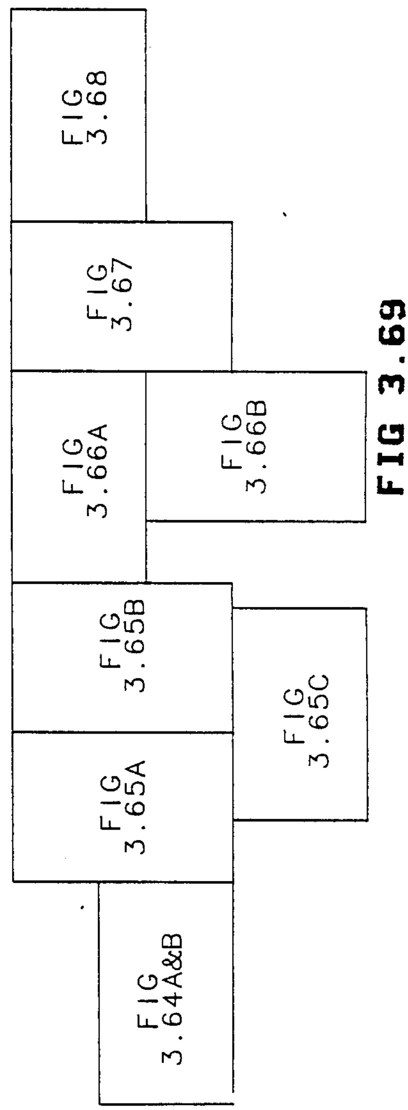
FIG 3.69

| MNEMONIC | DESCRIPTION |
|---|---|
| ACC | WRITE GUN ACCELERATOR |
| ASTIG | ASTIGMATISM |
| CONTROL GATE | BLANKING AND INTENSITY CONTROL |
| FOCUS | FOCUS CONTROL INPUT |
| HF GAIN | HIGH FREQUENCY GAIN |
| HF TRIM | HIGH FREQUENCY COMPENSATION |
| INT GAIN | INTENSITY GAIN |
| INTLIMIT | INTENSITY LIMIT |
| LBLANKO | LO-BLANK DELAYED |
| LGZ | LINE GENERATOR Z-AXIS OUTPUT |
| MESH | EXPANSION MESH |
| ORTHO | ORTHOGONAL |
| PATT | PATTERN |
| Z-AXIS | INTENSITY SIGNAL |
| ZGND | Z-AXIS GROUND RETURN |

FIG 3.64A

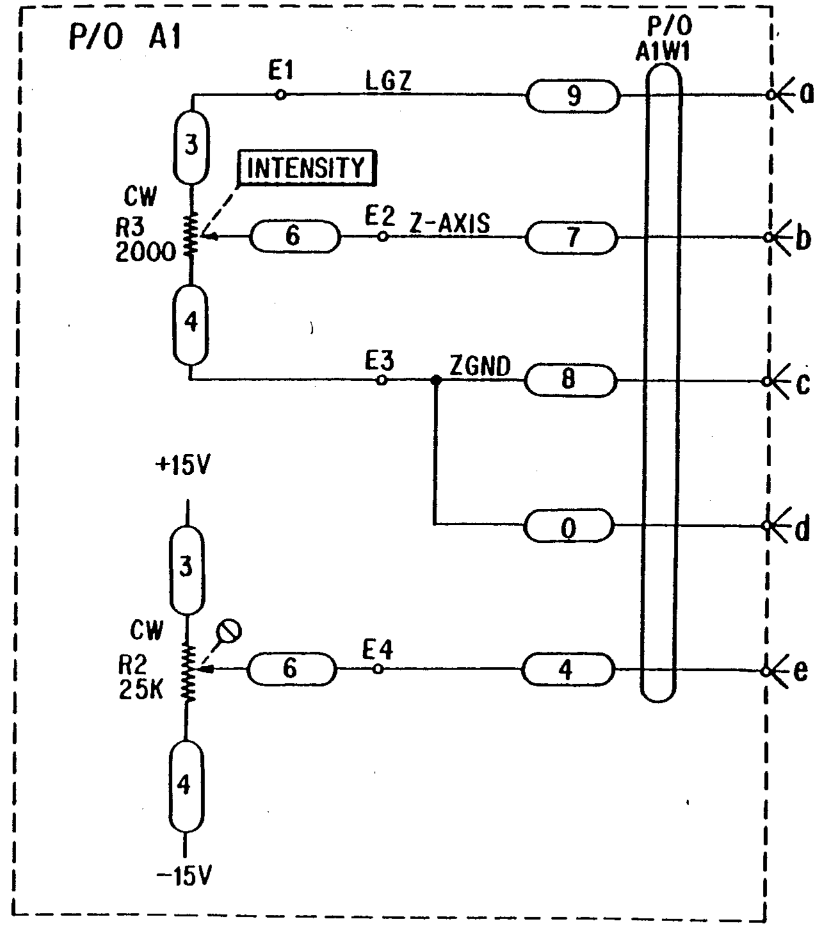

| PIN | SIGNAL | TO/FROM | FUNCTION BLOCK |
|---|---|---|---|
| 1<br>16 | ORTHO<br>ZGND | V1<br>A17C1-NEG | E,G<br>F |
| 2<br>17 | FOCUS GATE<br>CONTROL GATE | A3<br>A3 | D<br>C |
| 3<br>18 | PATTERN<br>INTENSITY<br>LIMIT | V1<br>A3 | E,G<br>E |
| 4<br>19 | ASTIG<br>ZGND | V1<br>A17C1-NEG | E,G<br>F |
| 5<br>20 | MESH<br>ZGND | V1<br>A17C1-NEG | E,G<br>F |
| 6<br>21 | ACC<br>LBLANKD | V1<br>A6 | E,G<br>B |
| 7<br>22 | -15V<br>NC | AB.A17 | F |
| 8<br>23 | ZGND<br>ZGND | A17C1-NEG | F<br>F |
| 9<br>24 | +15V<br>FOCUS | A17. A8<br>A1 | F<br>D |
| 10<br>25 | TRACE ALIGN<br>NC | A1 | G |
| 11<br>26 | ZGND<br>ZGND | A17C1-NEG | F<br>F |
| 12<br>27 | +100V<br>ZGND | AB<br>A17C1-NEG | F<br>F |
| 13<br>28 | ZGND<br>ZGND | A17C1-NEG | F<br>F |
| 14<br>29 | ZGND<br>Z-AXIS | A17C1-NEG<br>A1 | F<br>A |
| 15<br>30 | ZGND<br>ZGND | A17C1-NEG | F<br>F |

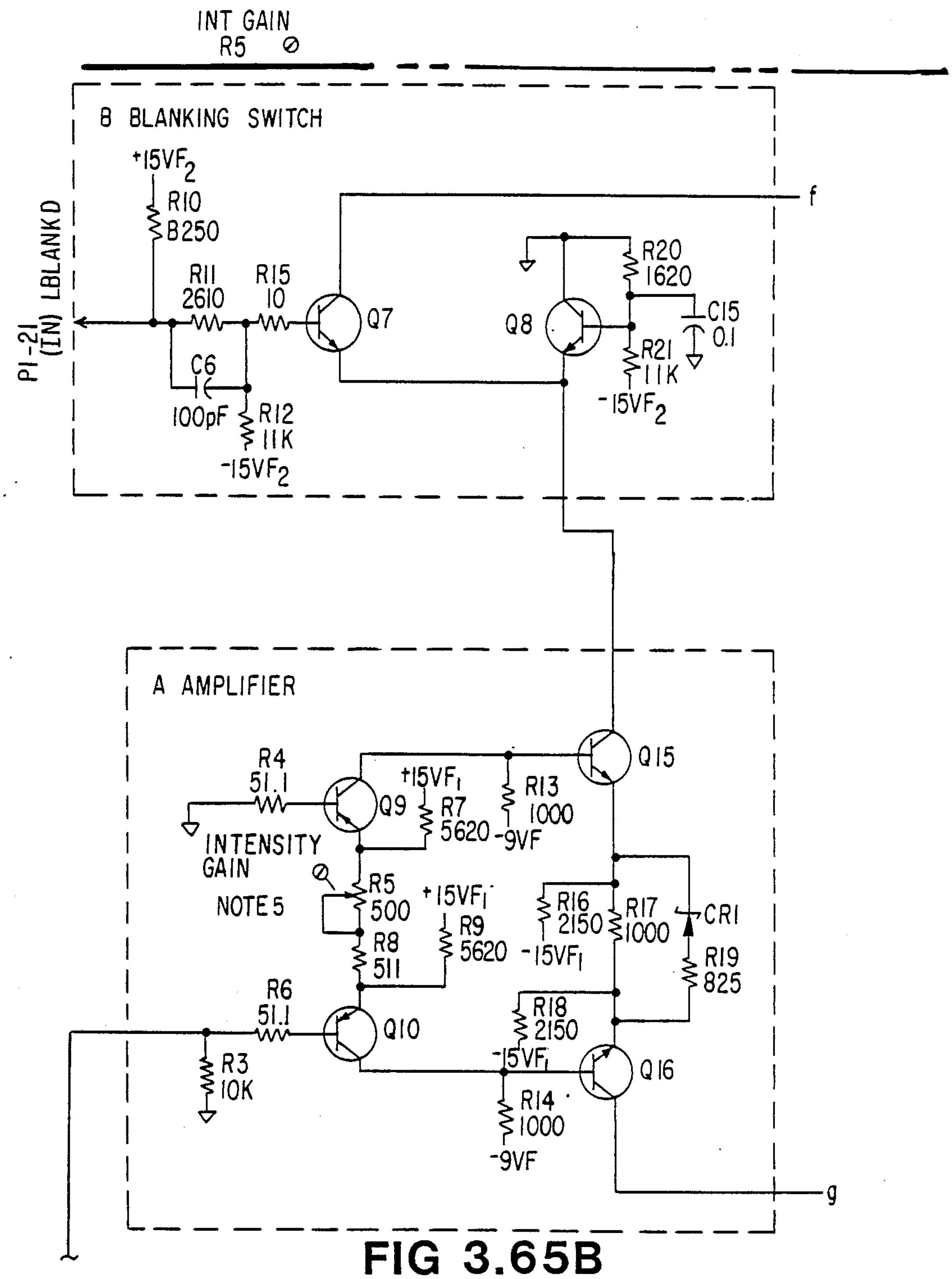
FIG 3.65B

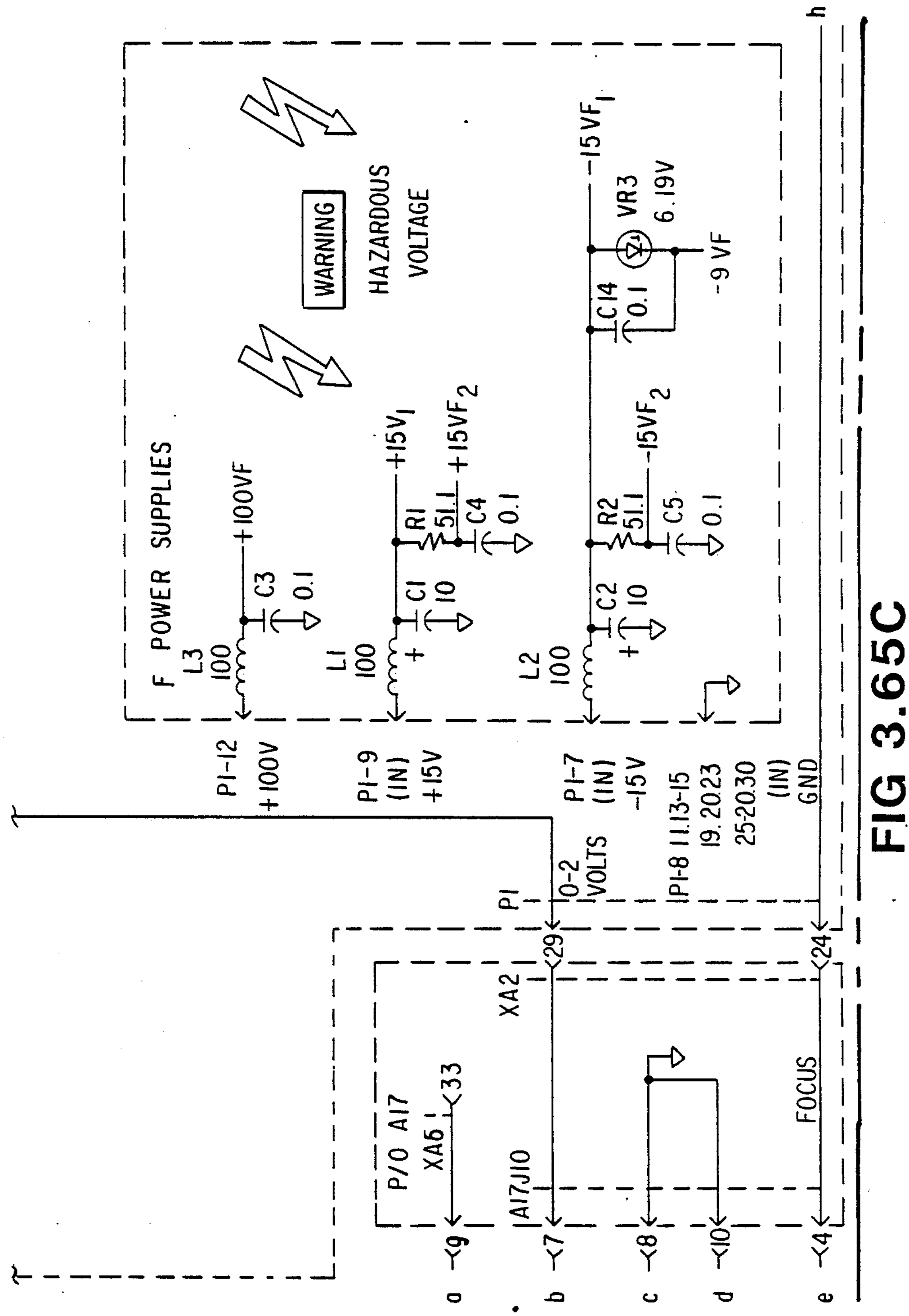
FIG 3.65C

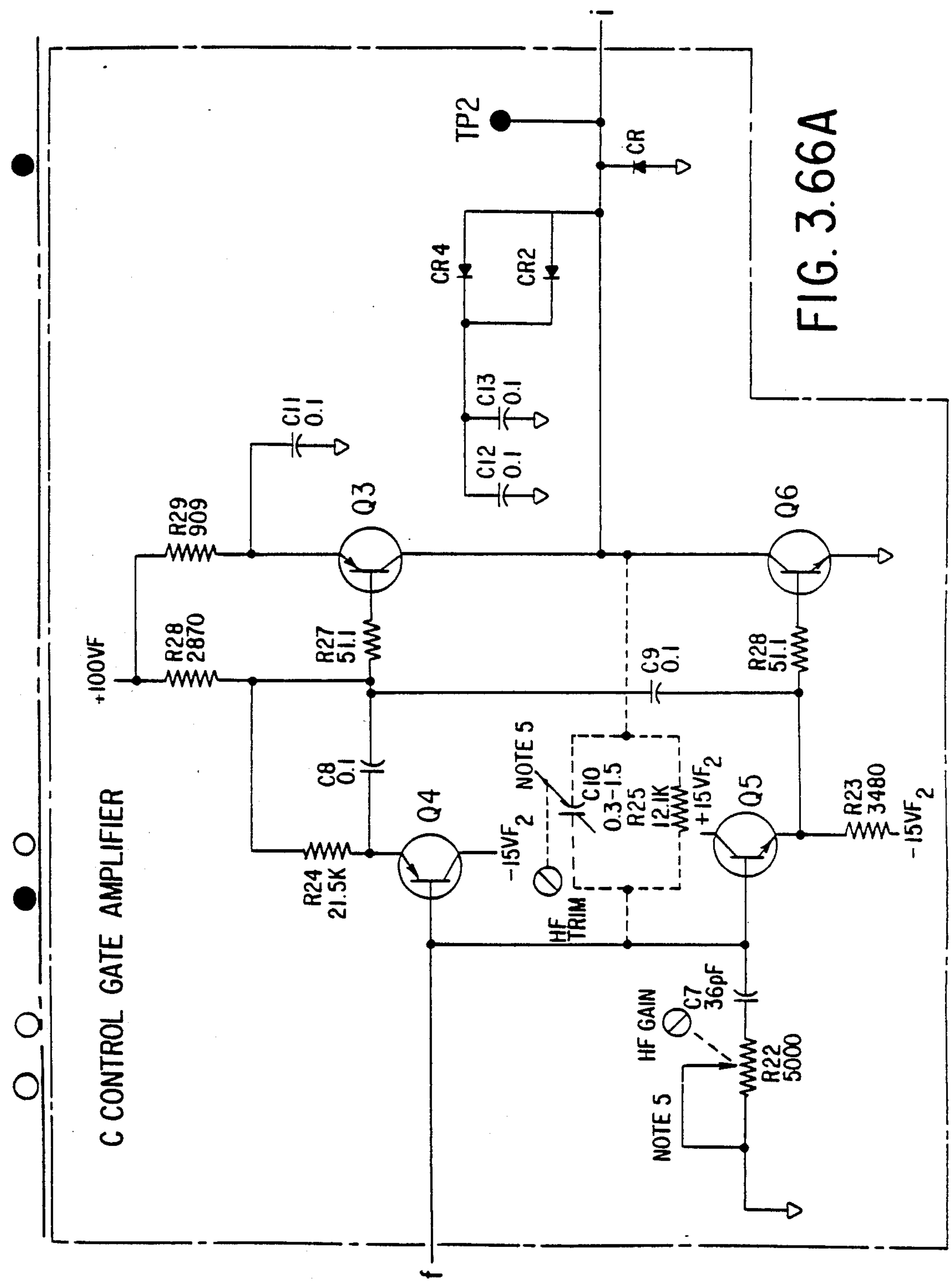
FIG. 3.66A

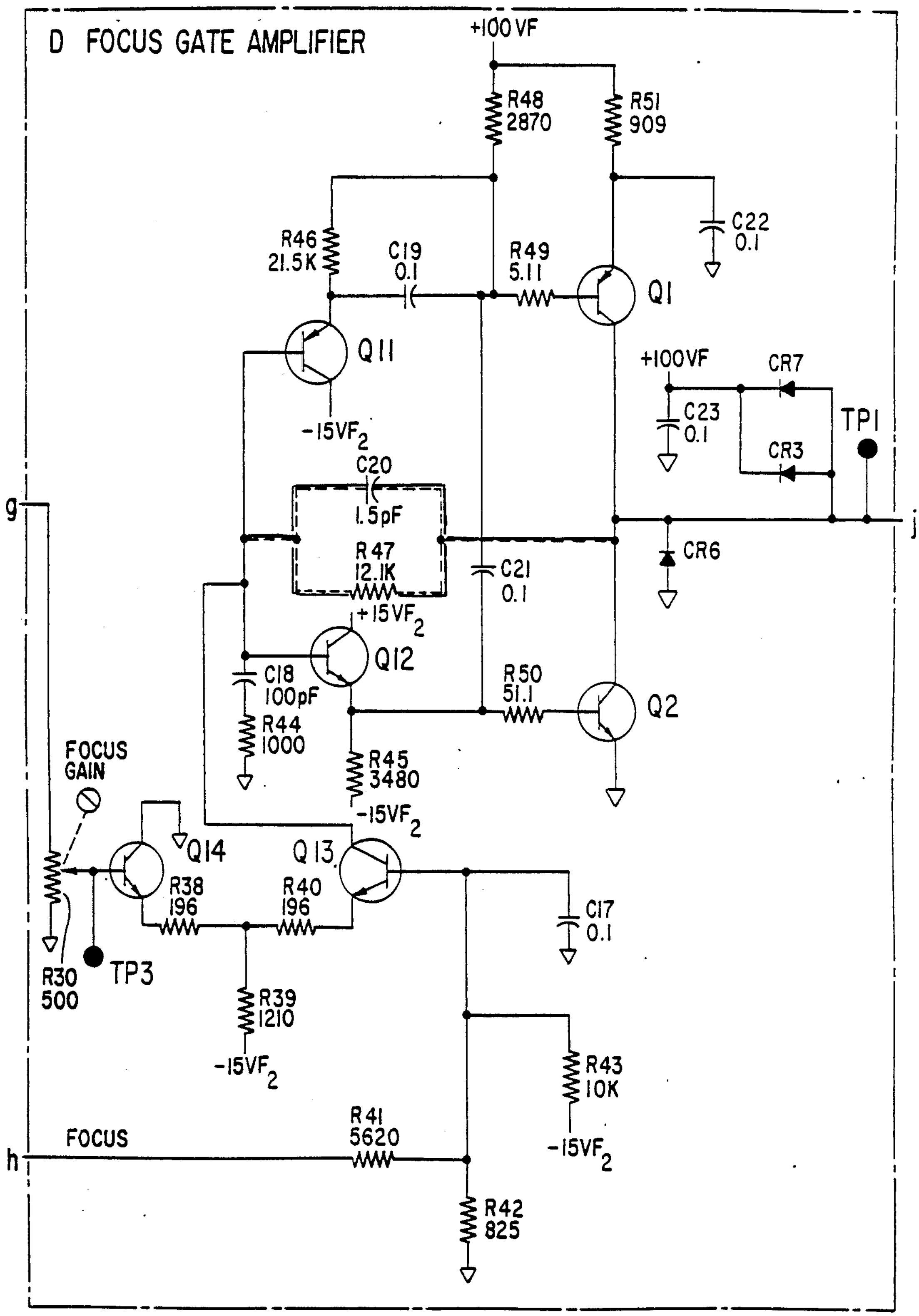
FIG. 3.66B

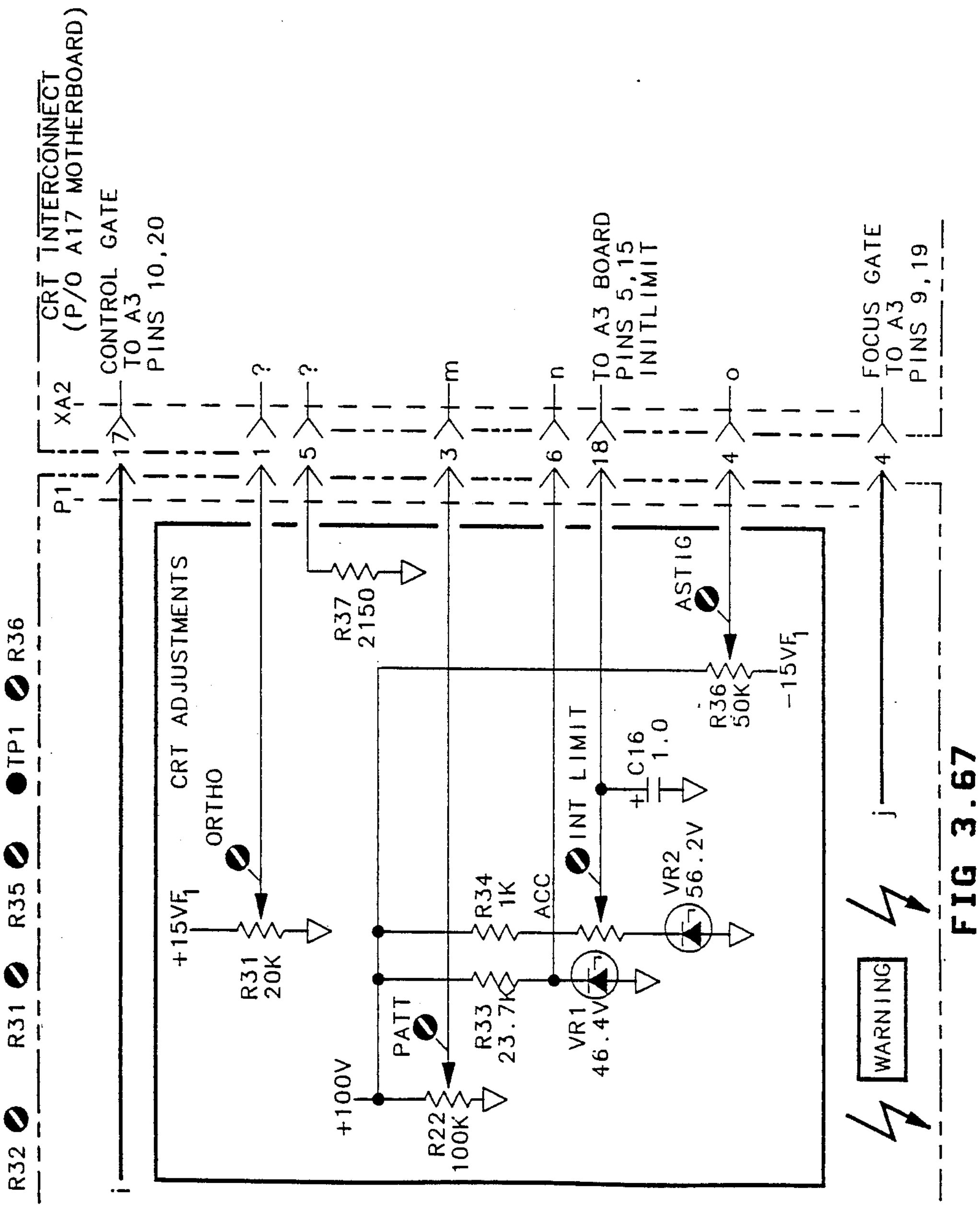
FIG 3.67

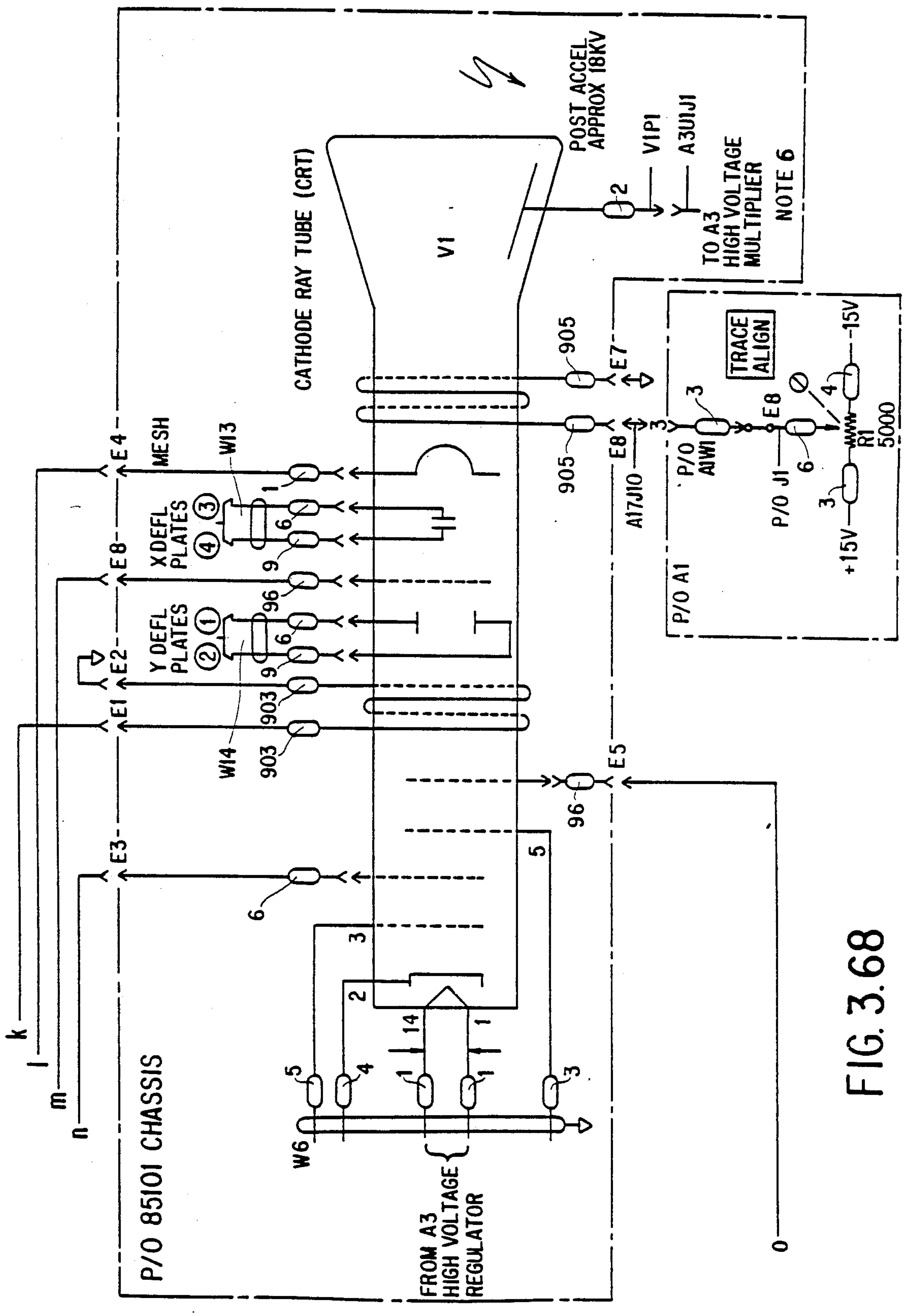
FIG. 3.68

MNEMONIC TABLE

| MNEMONIC | DESCRIPTION | SOURCE |
|---|---|---|
| ACC | WRITE GUNACCELERATOR | A2 |
| ASTIG | ASTIGMATISM | A2 |
| BASE | Q4 BASE DRIVE | A3 |
| COLL | Q4 COLLECTOR OUTPUT | Q4 CHASSIS |
| CONTROL GATE | CONTROL INPUT FOR INTENSITY | A2 |
| DGND | DIGITAL GROUND | A17 CI-NEG |
| FOCUS GATE | DYNAMIC FOCUS INPUT | A2 |
| HV FEEDBACK | HV CONTROL FEEDBACK | A3 |
| INT LIMIT | INTENSITY LIMIT | A2 |
| OSCILLATOR DRIVE | HV REGULATOR OUTPUT | A8 |
| +20V RAW | +20V UNREGULATED | A17 |

A3 HIGH VOLTAGE REGULATOR
85101-60003

P1

| PIN | SIGNAL | TO/FROM | FUNCTION BLOCK |
|---|---|---|---|
| 1 11 | COLL | A8 | A |
| 2 12 | BASE | A8 | A |
| 3 13 | OSCILLATOR DRIVE | A8 | A |
| 4 14 | +20 RAW | A8 | A |
| 5 15 | INT LIMIT | A2 | C |
| 5 15 | GND GND | | A A |
| 7 17 | HV FEEDBACK | A8 | B |
| 8 18 | GND GND | | A A |
| 9 19 | FOCUS GATE | A2 | D |
| 10 20 | CONTROL GATE | A2 | C |

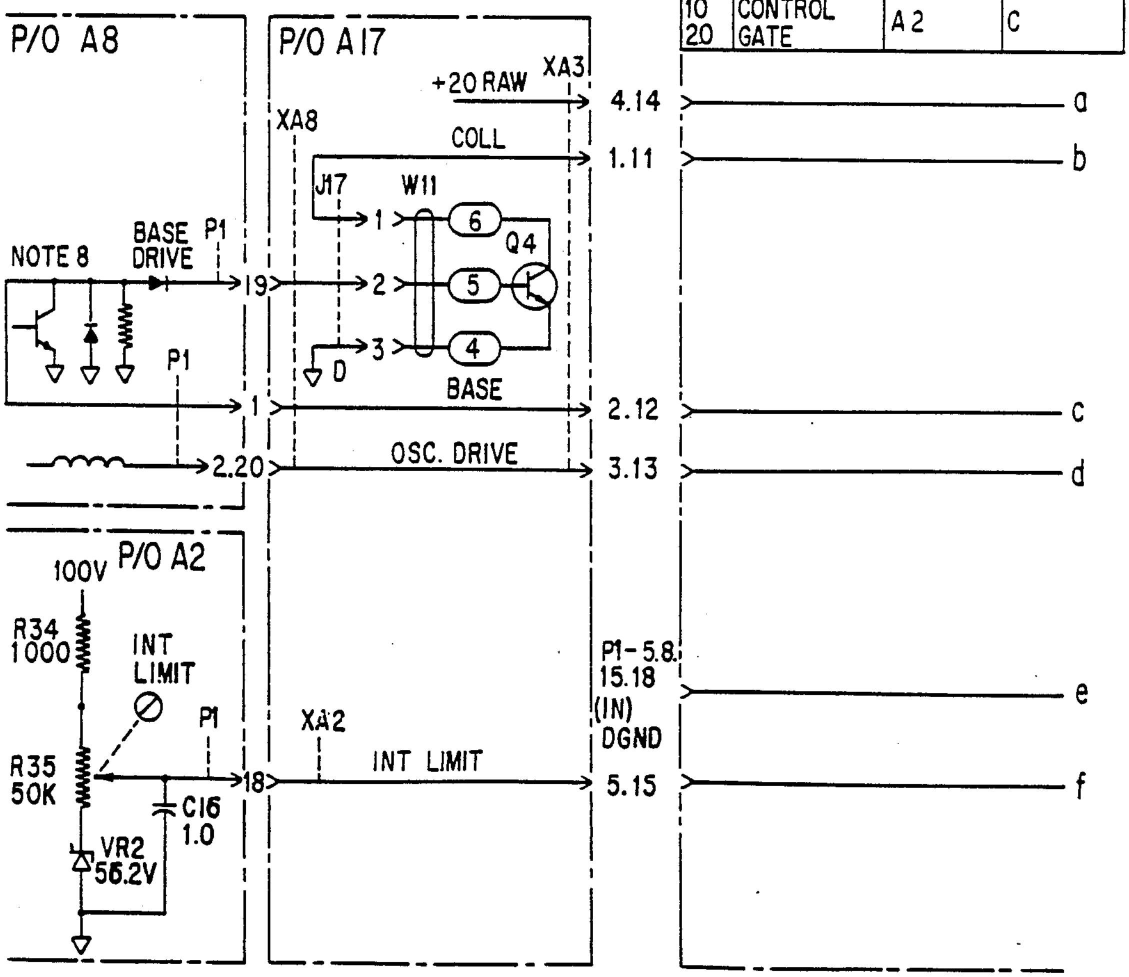

FIG. 3.70

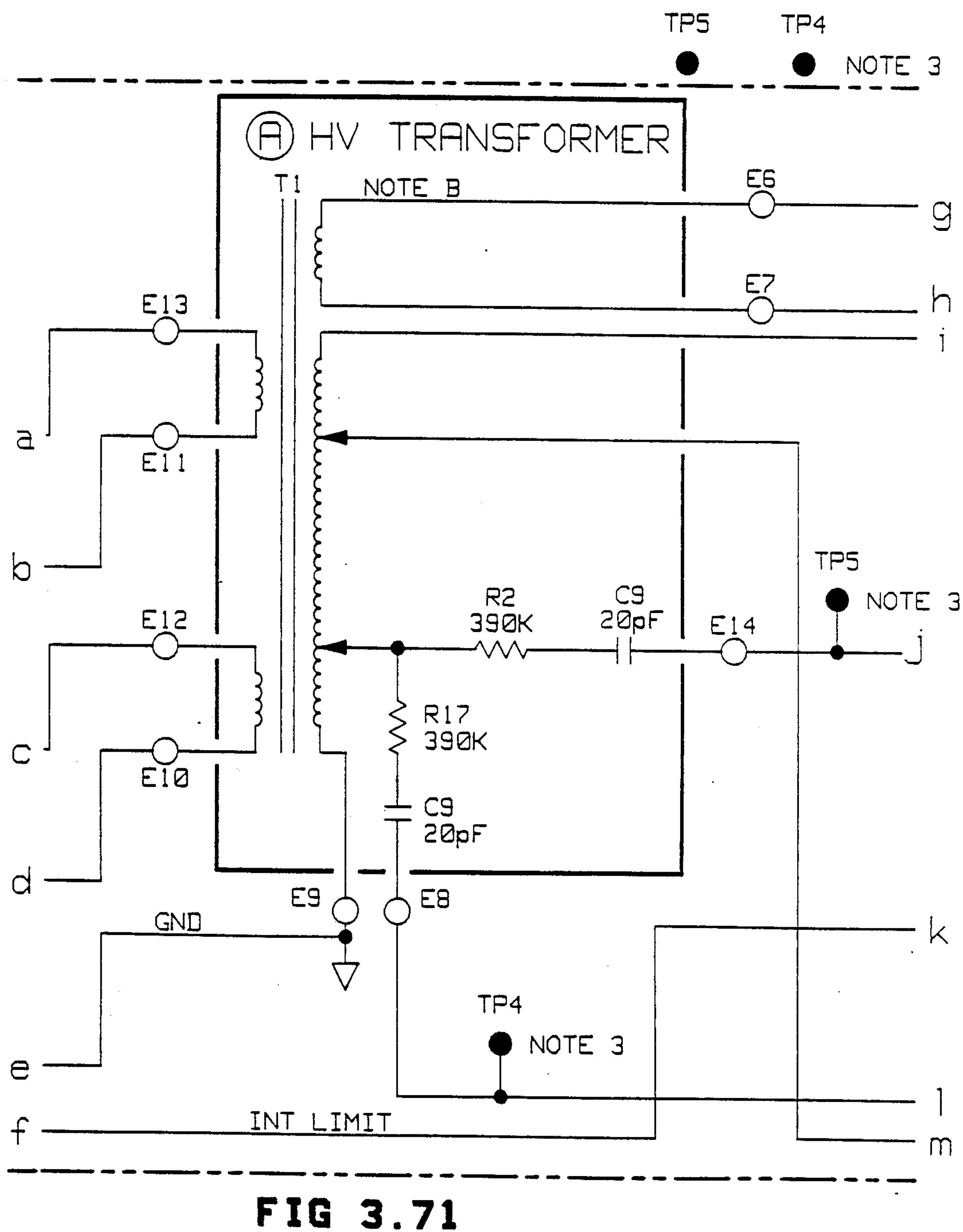
FIG 3.71

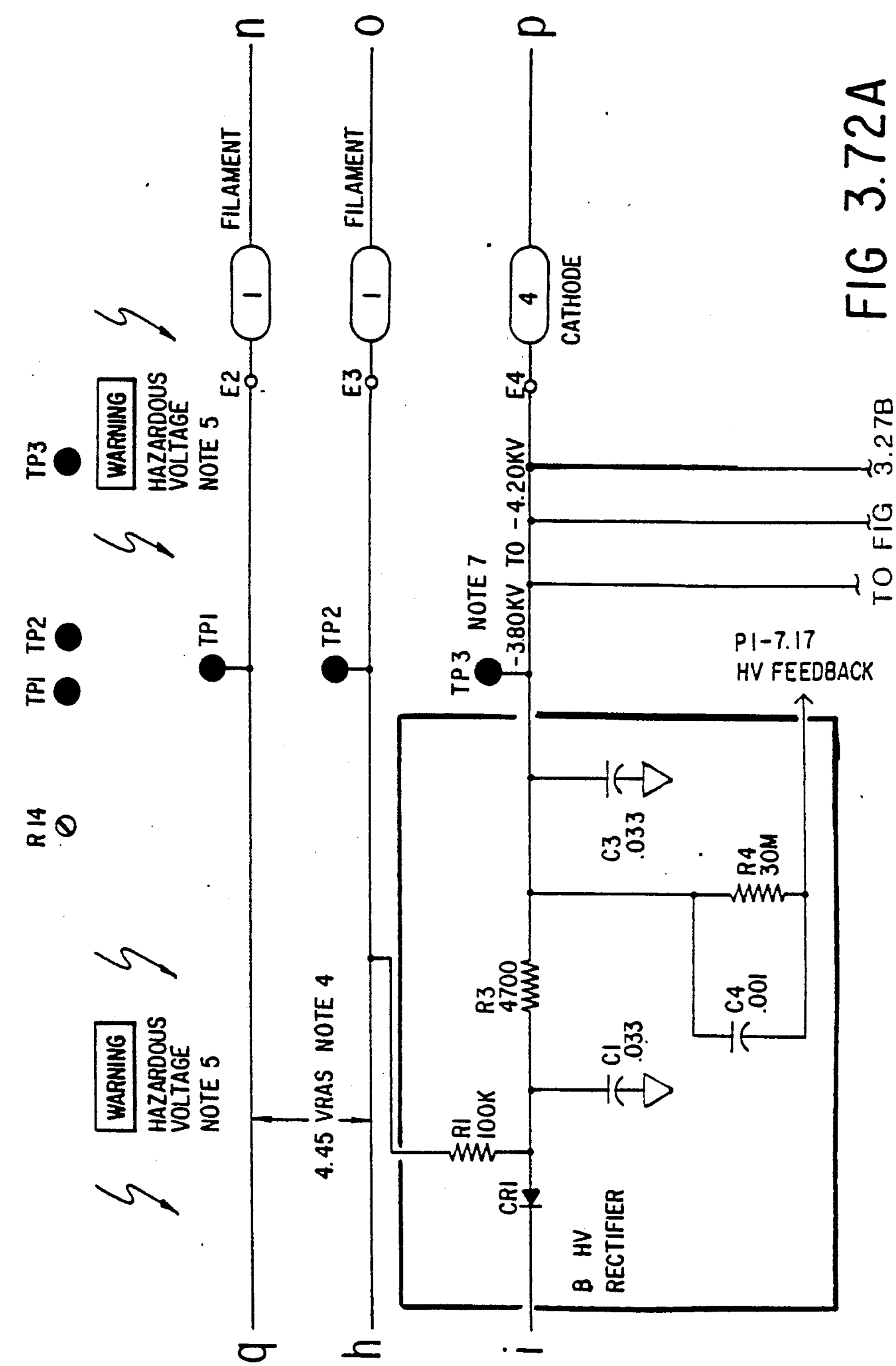
FIG 3.72A

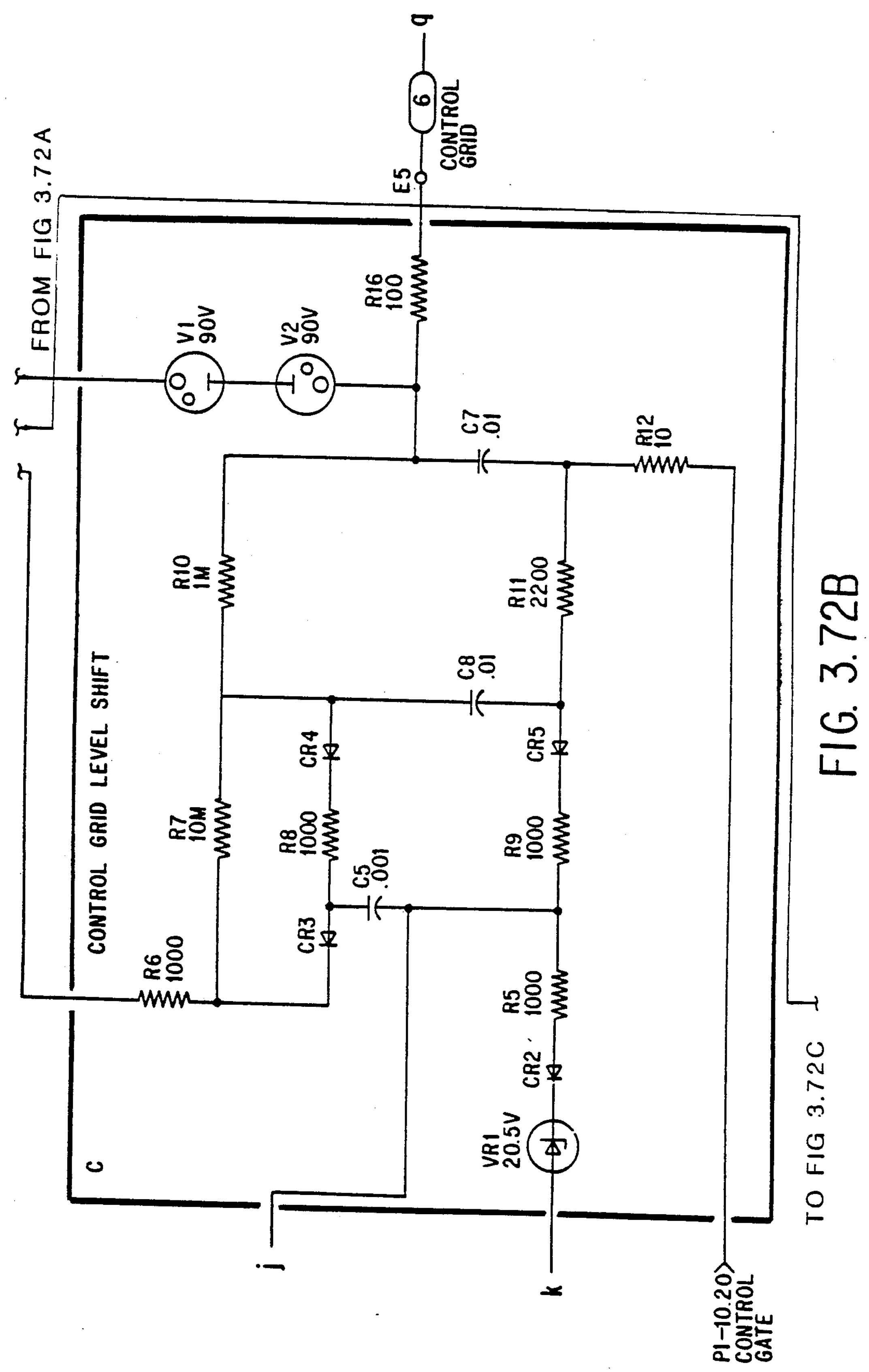
FIG. 3.72B

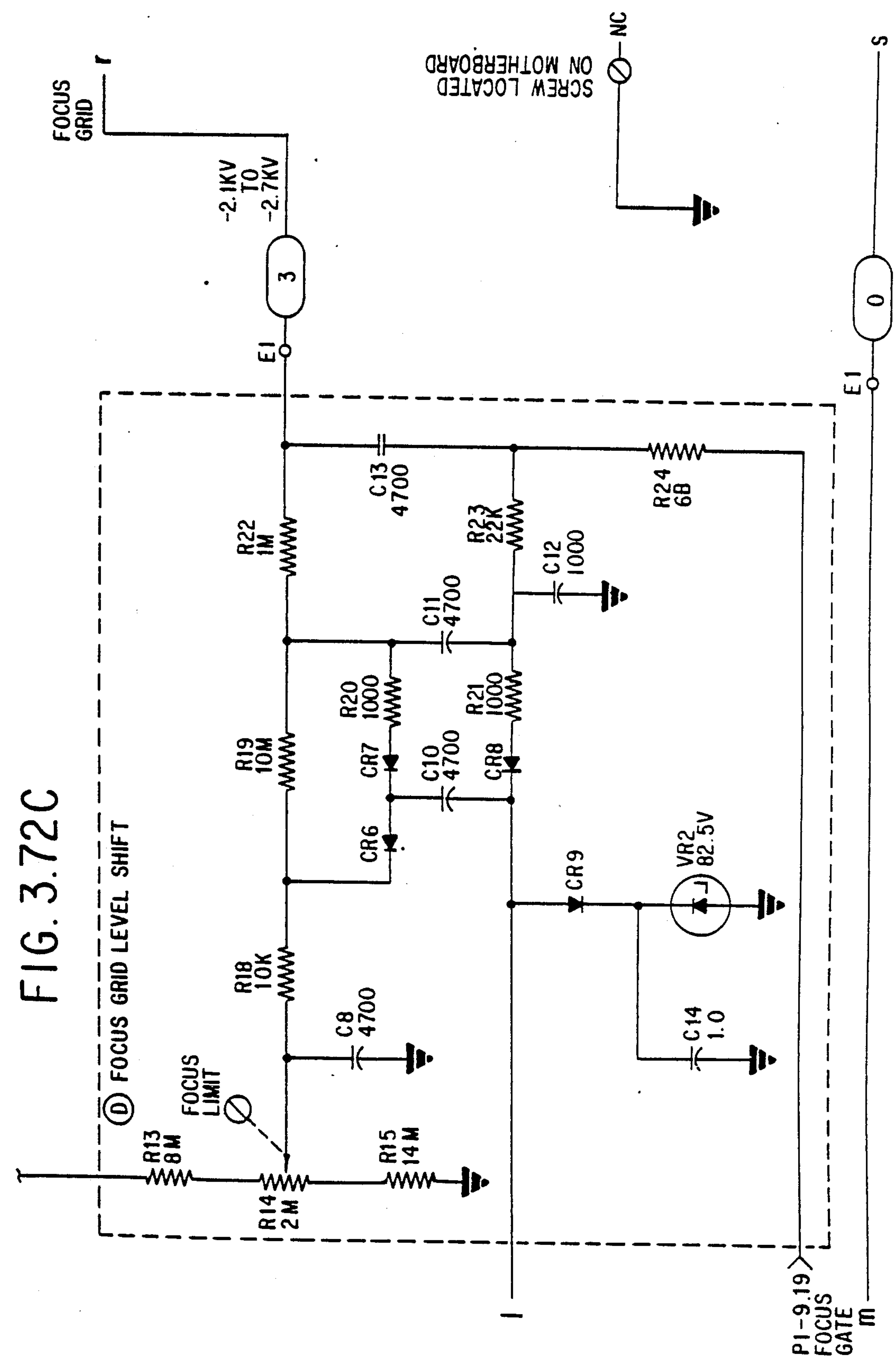
FIG. 3.72C

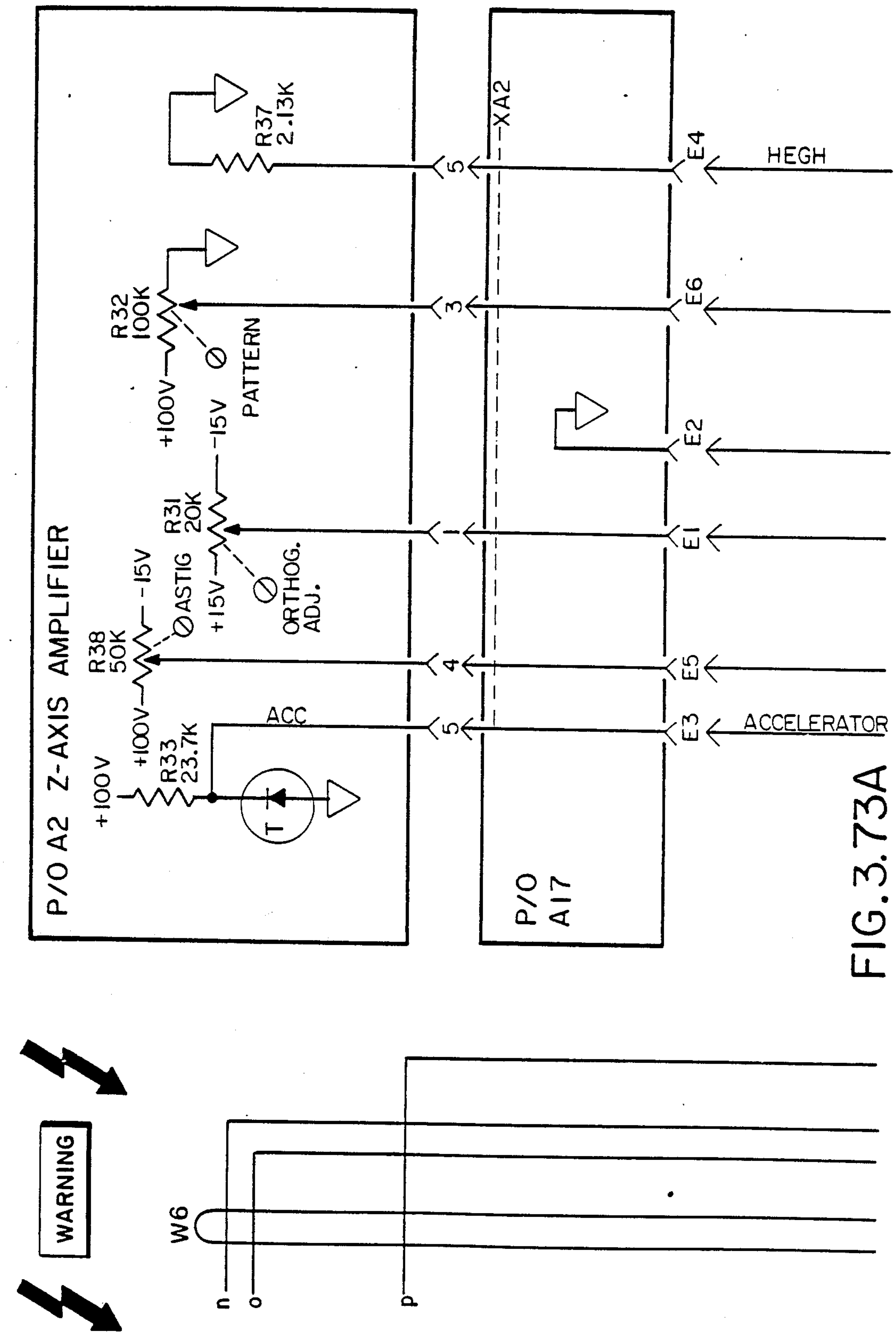
FIG. 3.73A

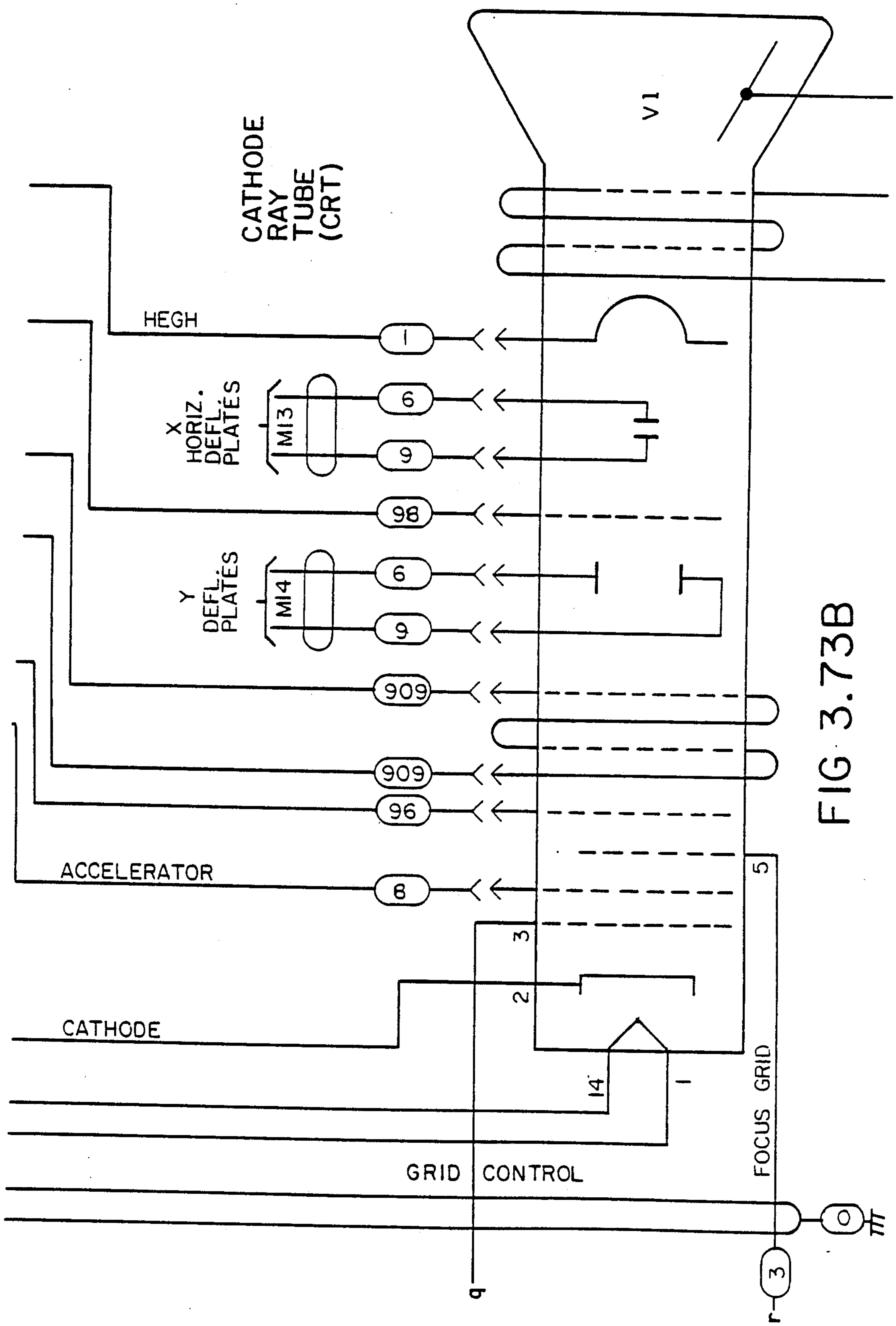
FIG 3.73B

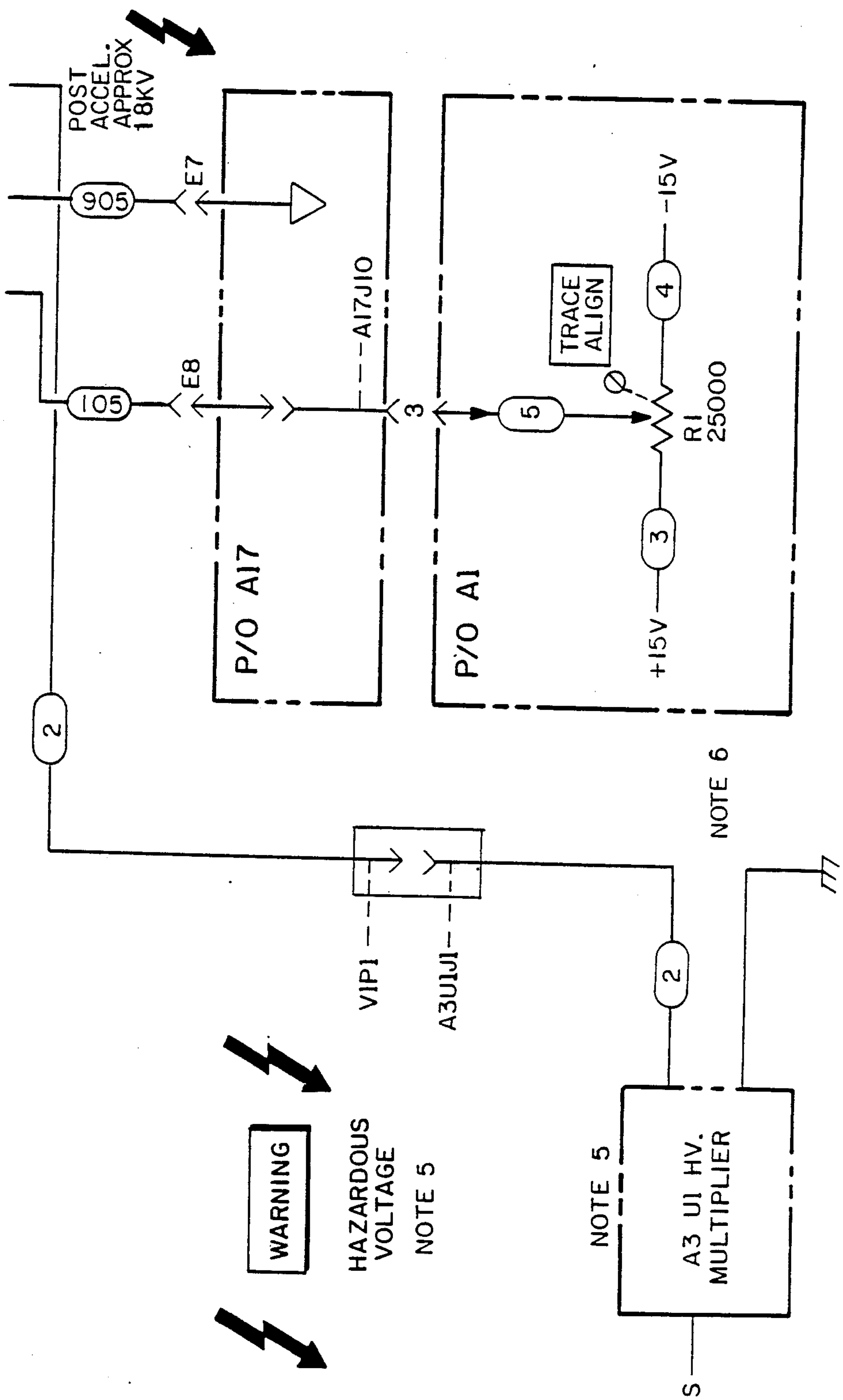
FIG 3.73C

A4 X DEFLECTION AMPLIFIER
A5 Y DEFLECTION AMPLIFIER

P1 85101-60004

| PIN | SIGNAL | TO/FROM | FUNCTION BLOCK |
|---|---|---|---|
| 1<br>16 | LGX/LGY<br>INPUT | A5 P1-5/7 | A |
| 2<br>17 | AGND<br>AGND | A17 CI-NEG | F |
| 3<br>18 | NC<br>NC | | |
| 4<br>19 | NC<br>NC | | |
| 5<br>20 | AUX-X/AUX-Y | REAR PANEL<br>AUX OUT | B |
| 6<br>21 | NC<br>NC | | |
| 7<br>22 | -15VF1<br>-15VF1 | A17L5.L8 | F |
| 8<br>23 | AGND<br>AGND | A17 CI-NEG | F |
| 9<br>24 | +15VF1<br>+15VF1 | A17L4.L7 | F |
| 10<br>25 | NC<br>NC | | |
| 11<br>26 | NC<br>NC | | |
| 12<br>27 | +100VF<br>+100VF | A17L3 | F |
| 13<br>28 | NC<br>NC | | |
| 14<br>29 | AGND<br>AGND | A17 CI-NEG | F |
| 15<br>30 | NC<br>NC | | |

FIG 3.75A

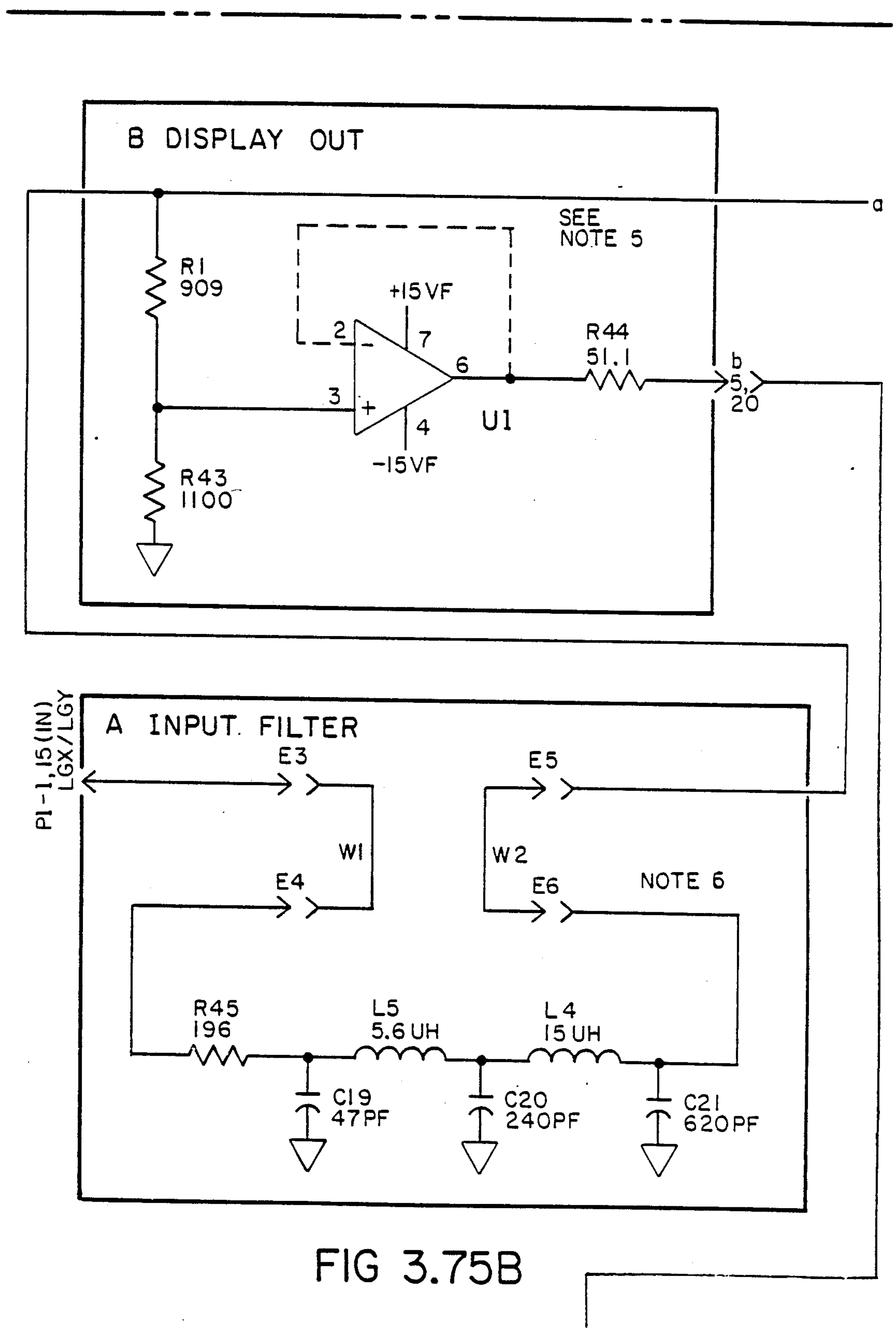
FIG 3.75B

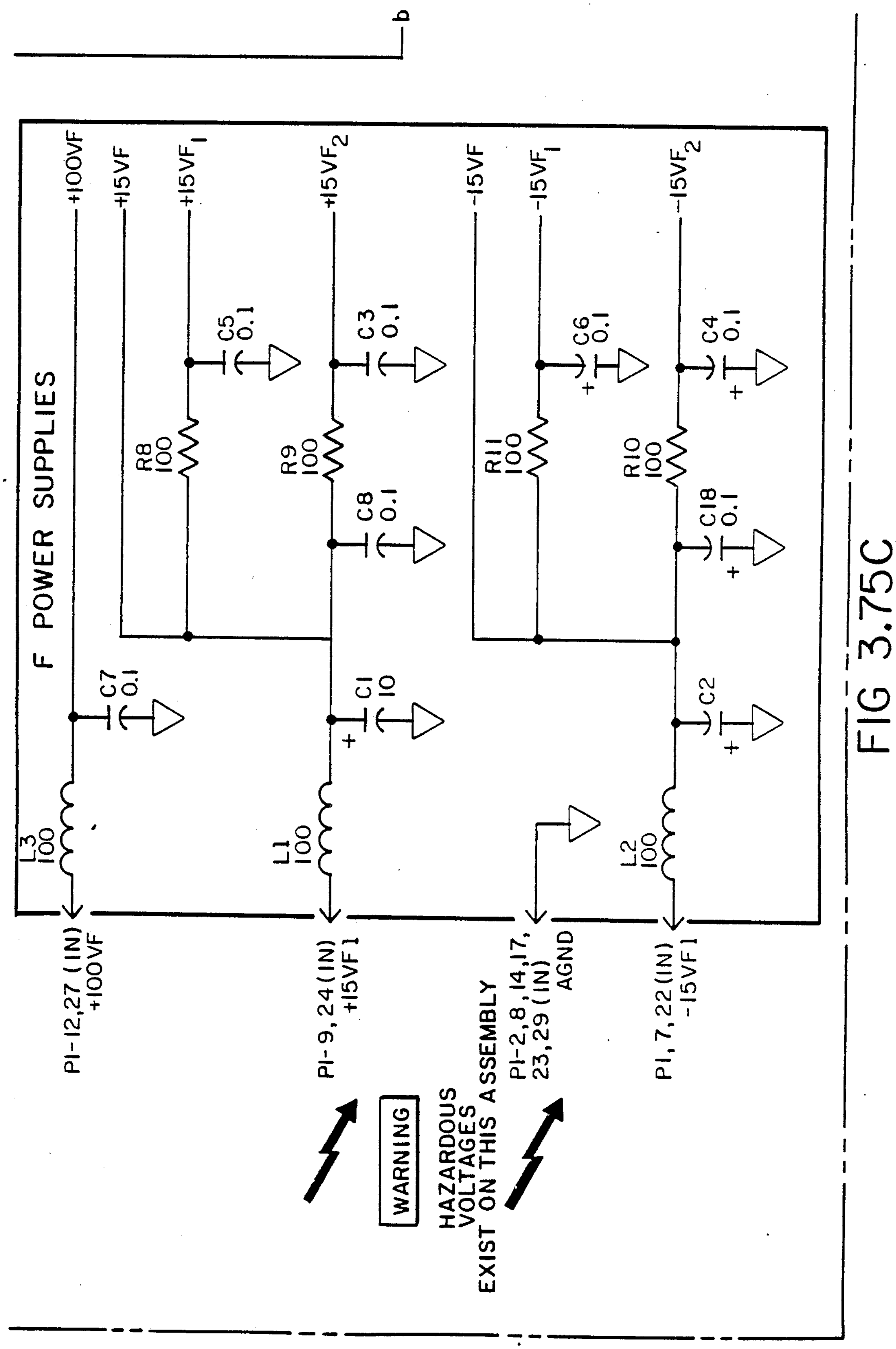
FIG 3.75C

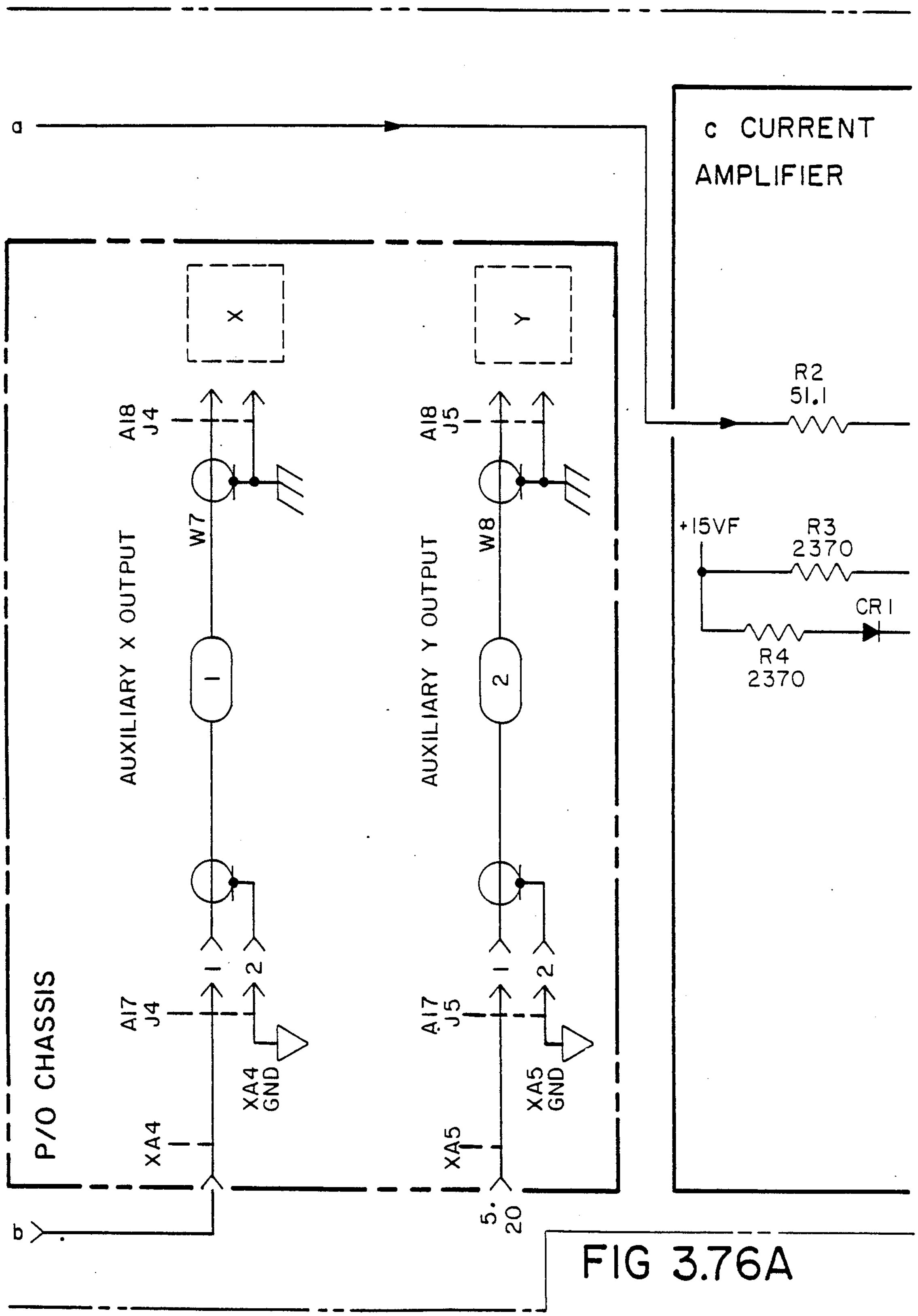
FIG 3.76A

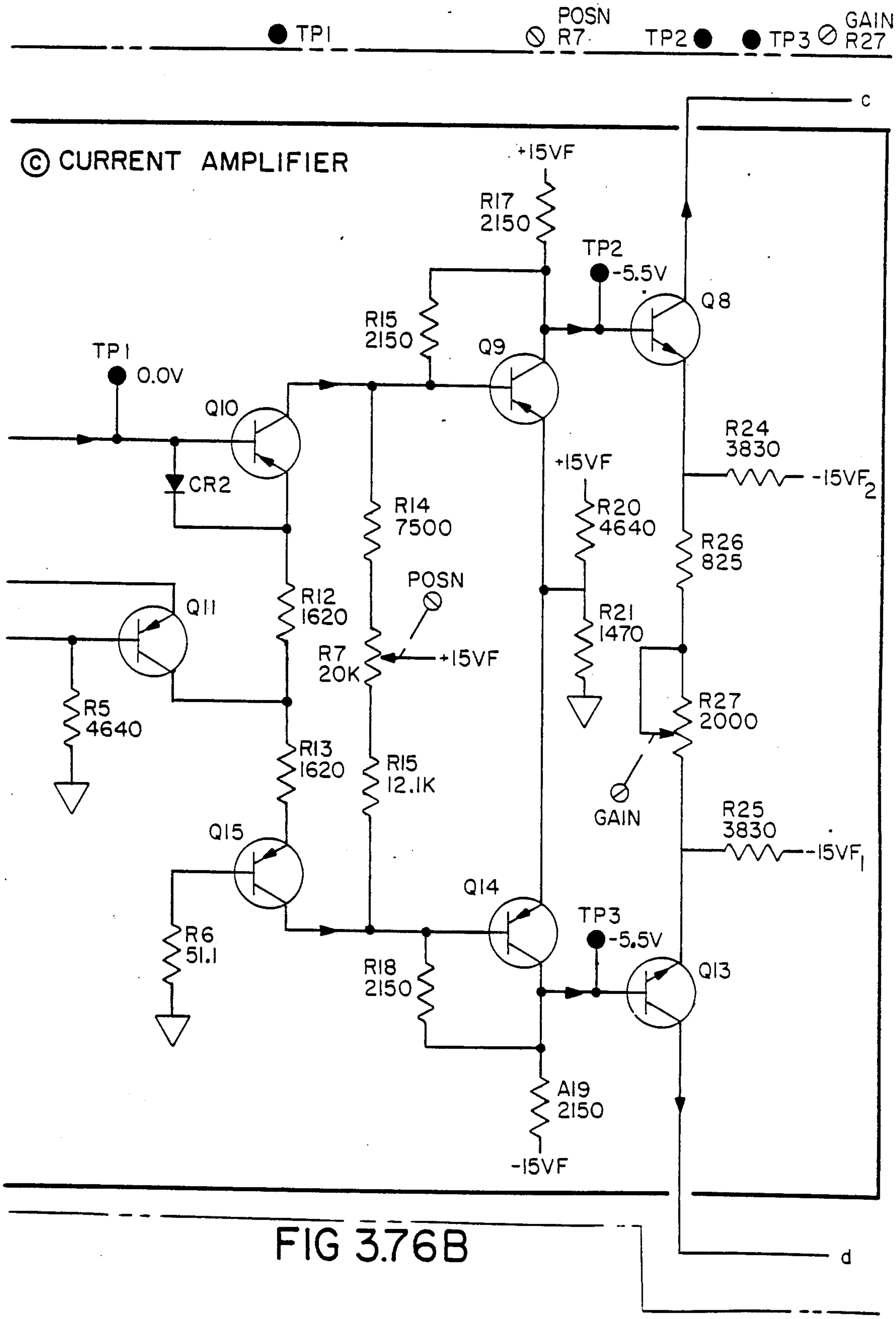
FIG 3.76B

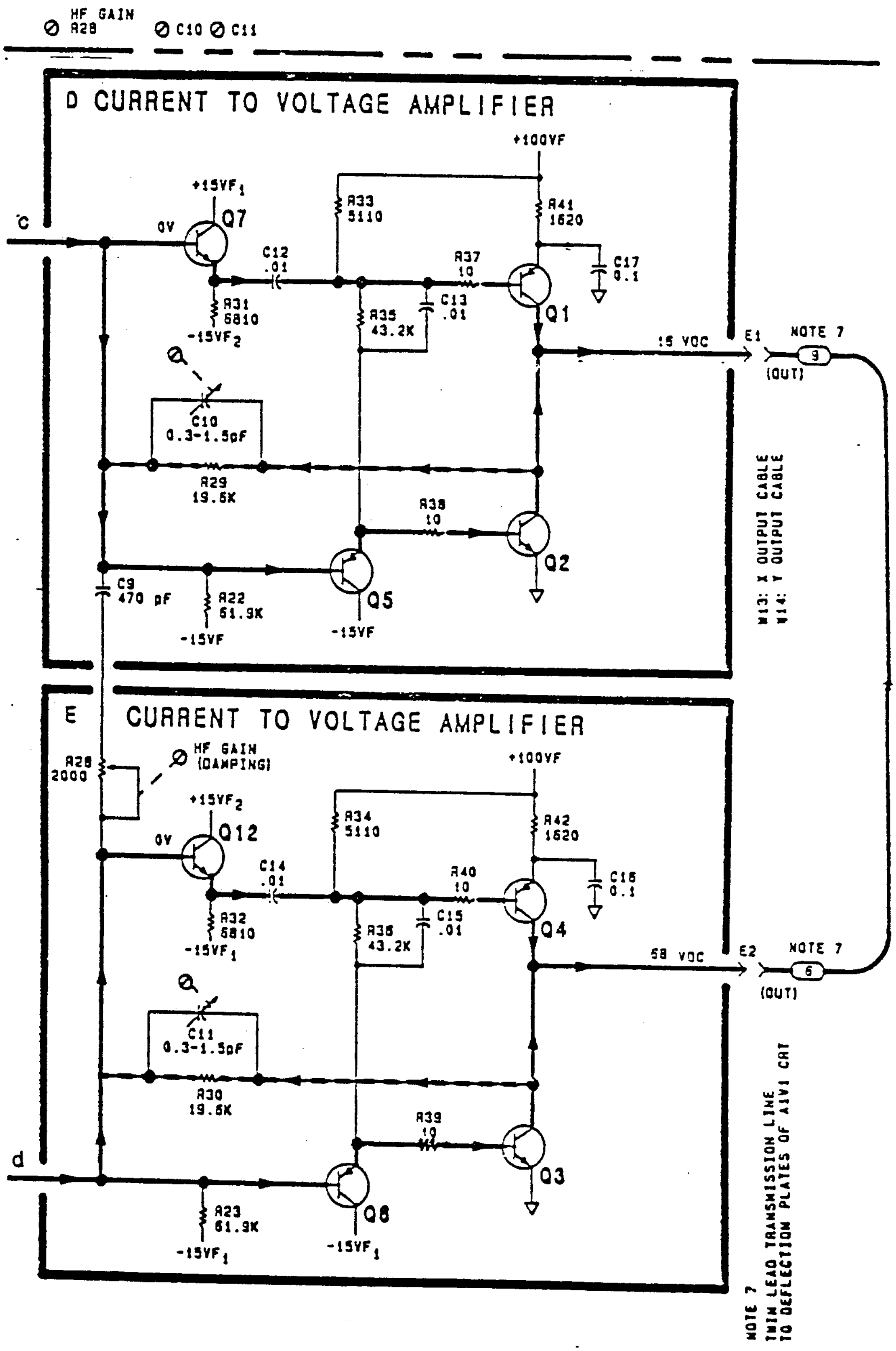
FIG 3.77

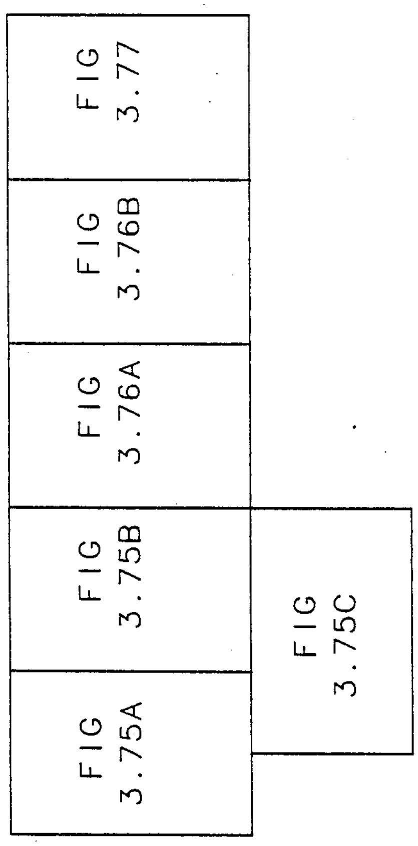
FIG 3.78
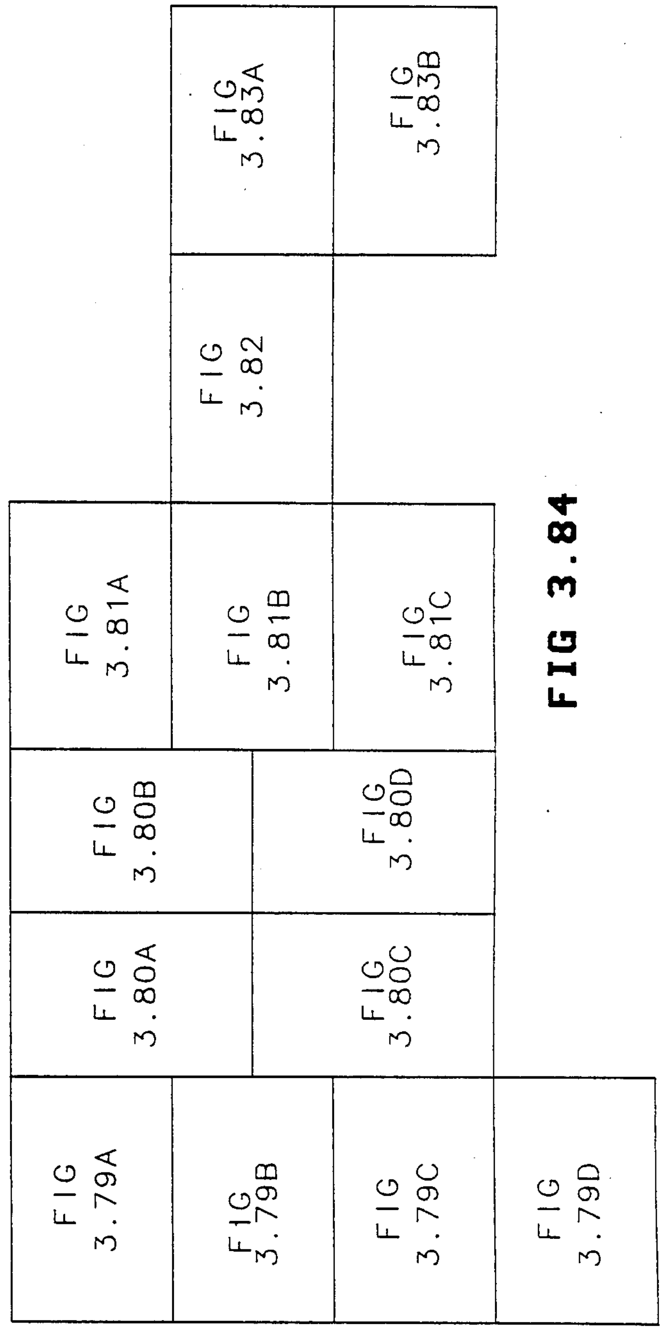
FIG 3.84

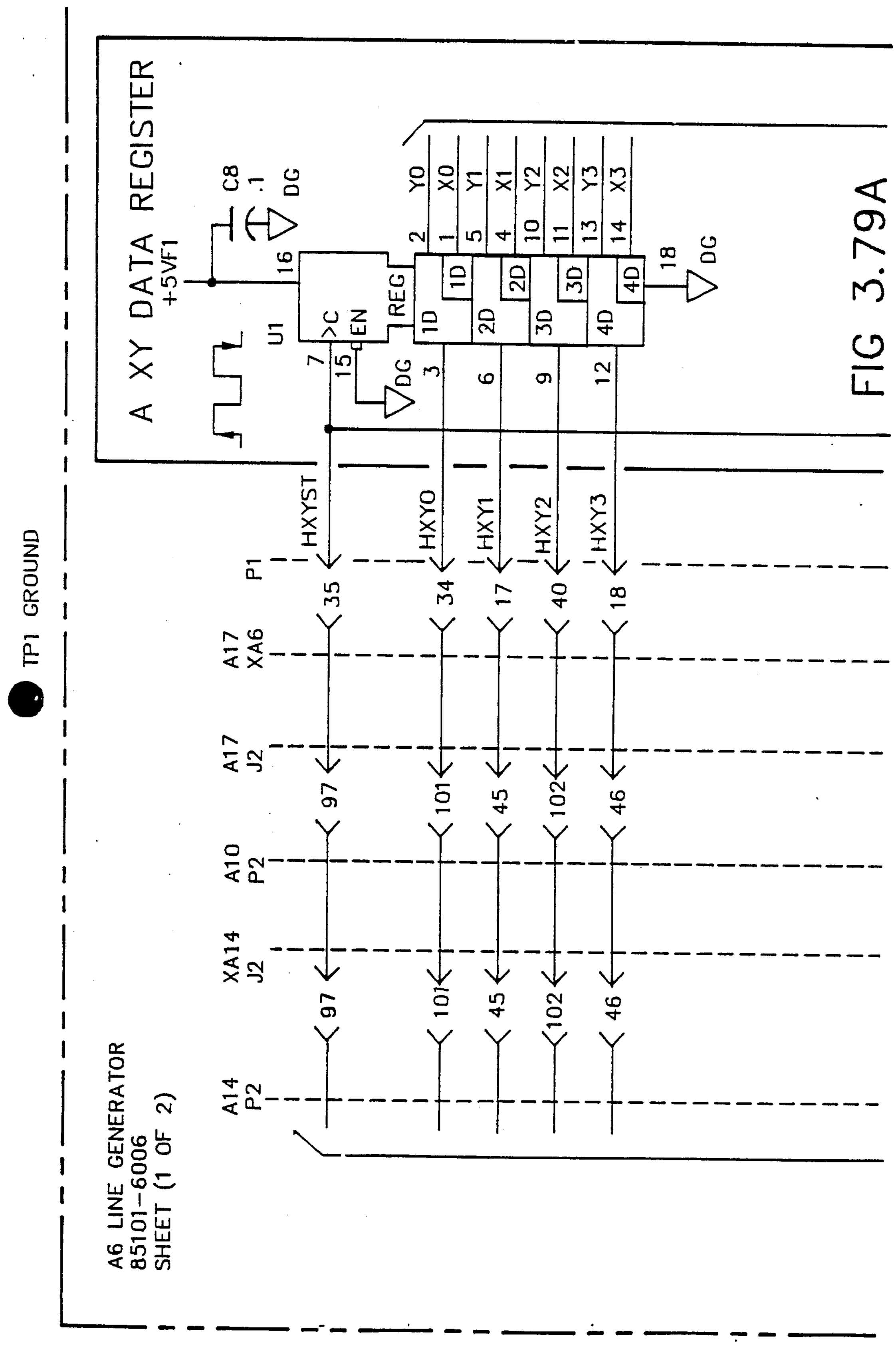
FIG 3.79A

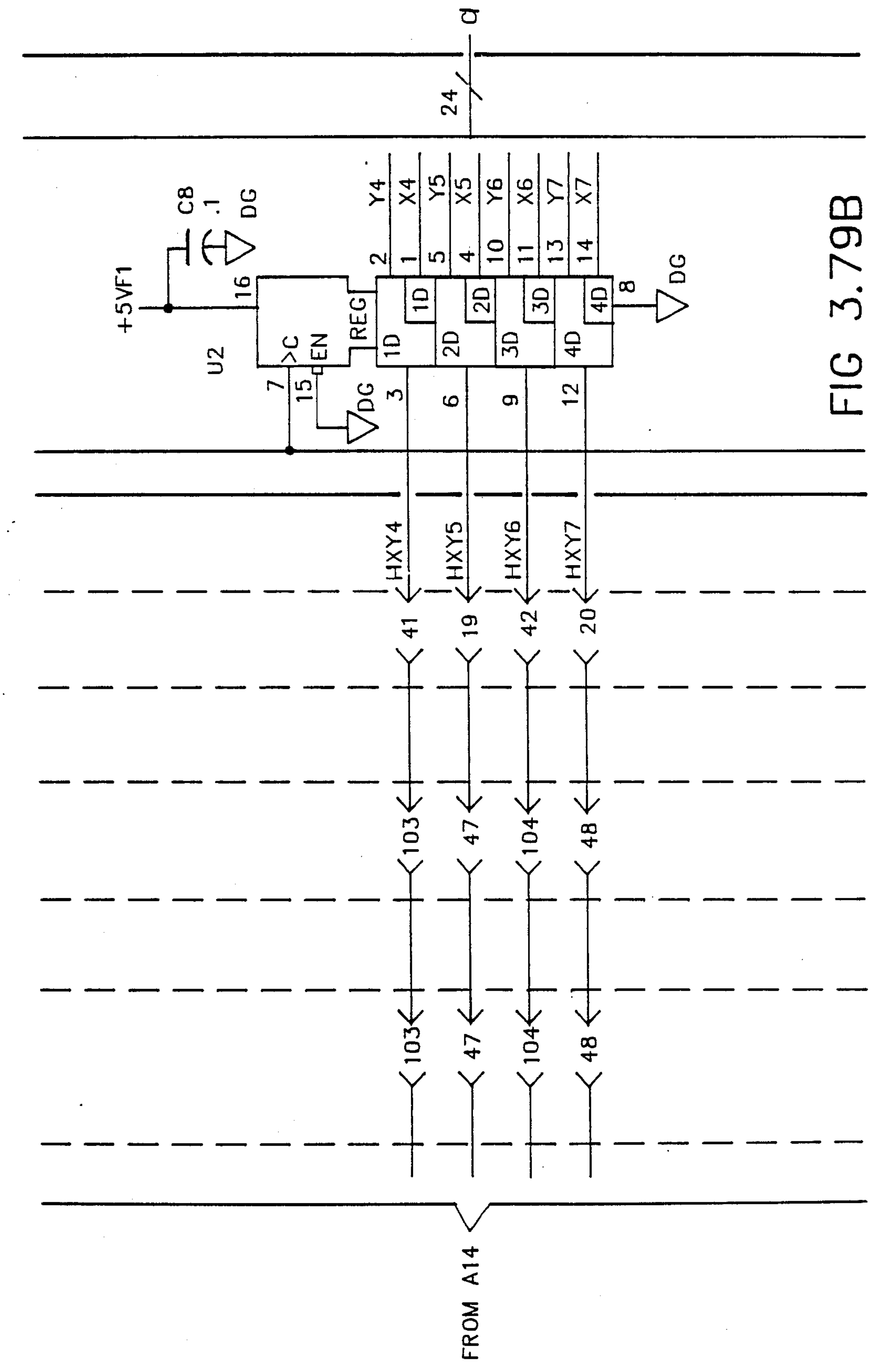
FIG 3.79B

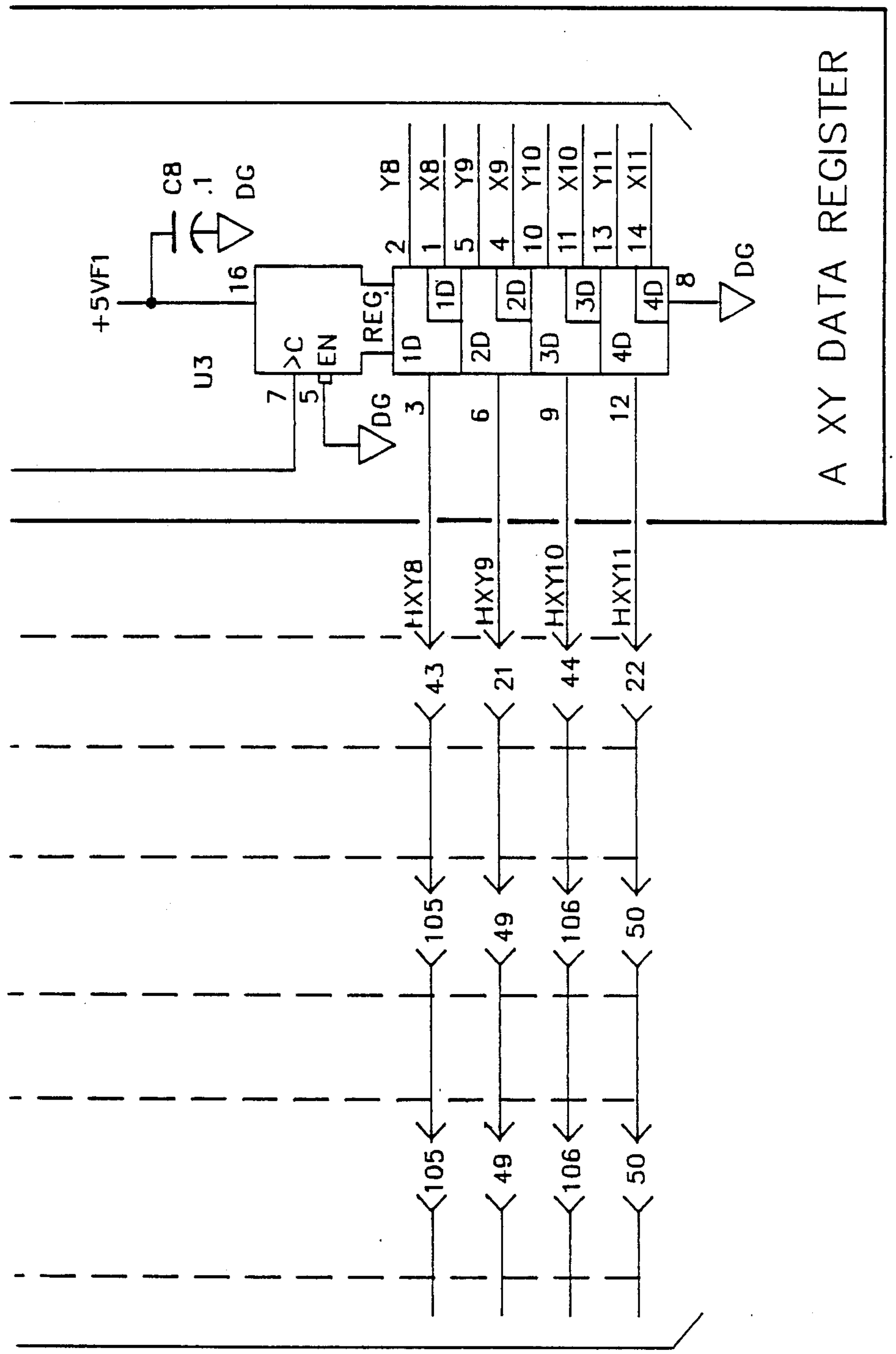
FIG 3.79C

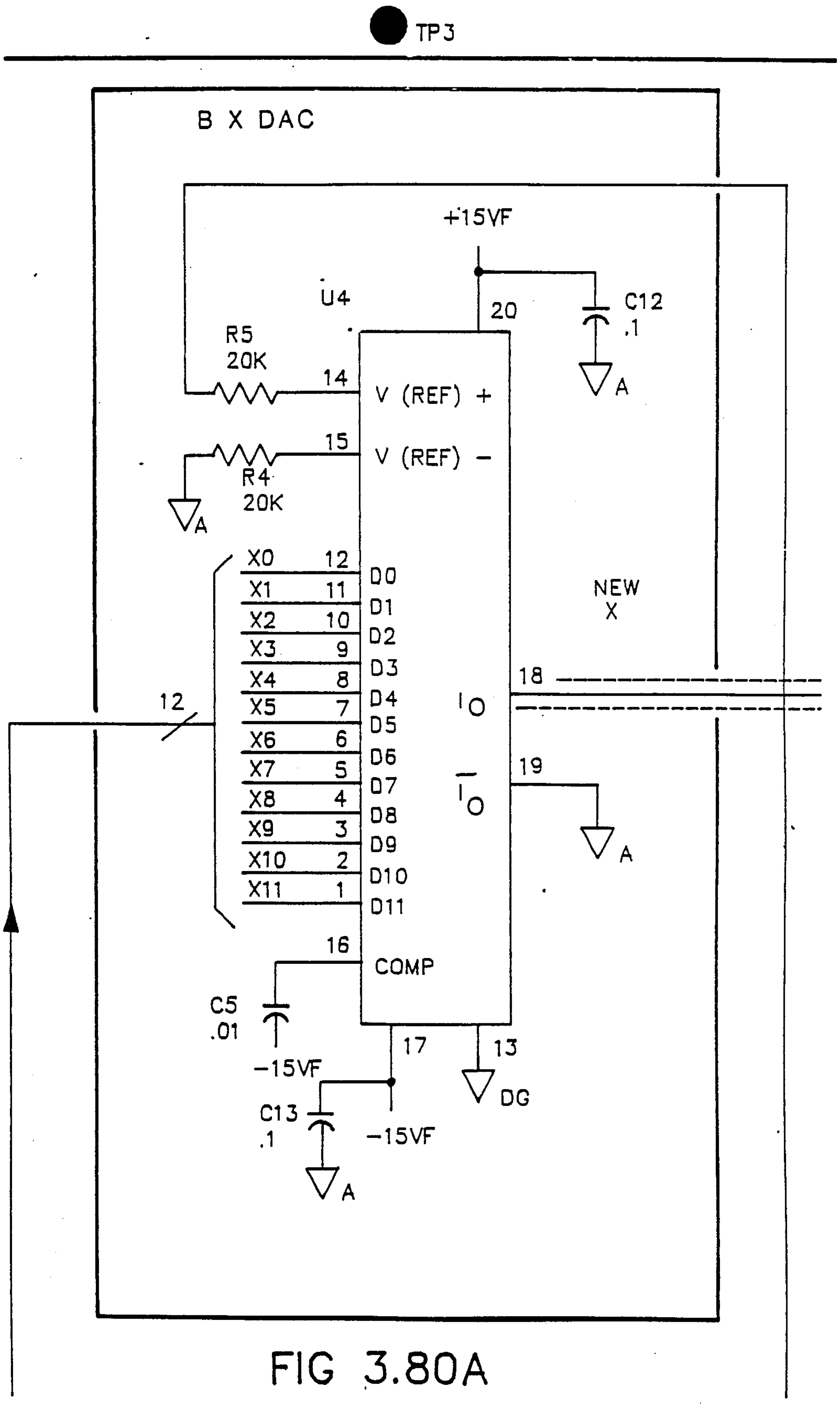
FIG 3.80A

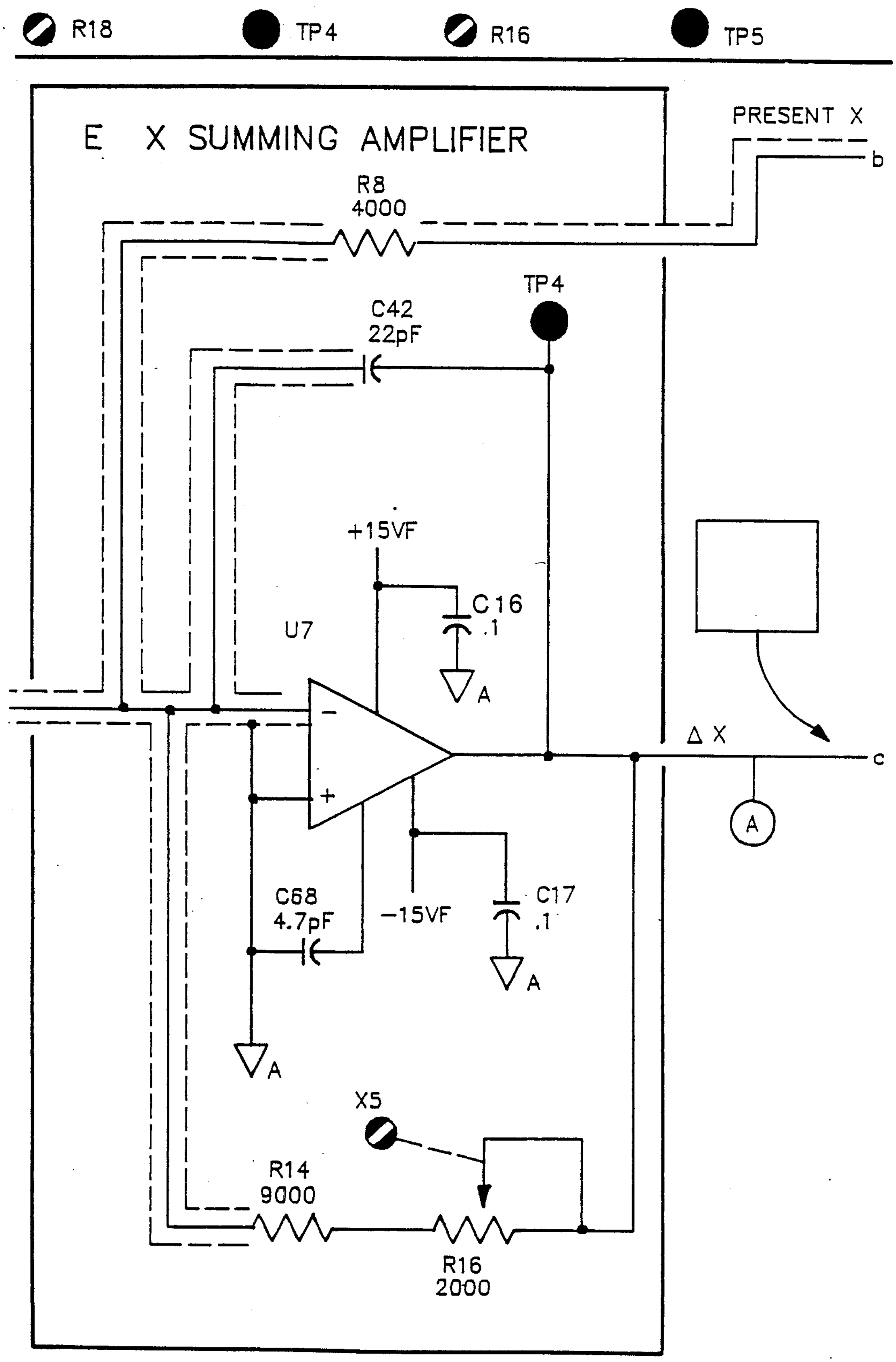
FIG 3.80B

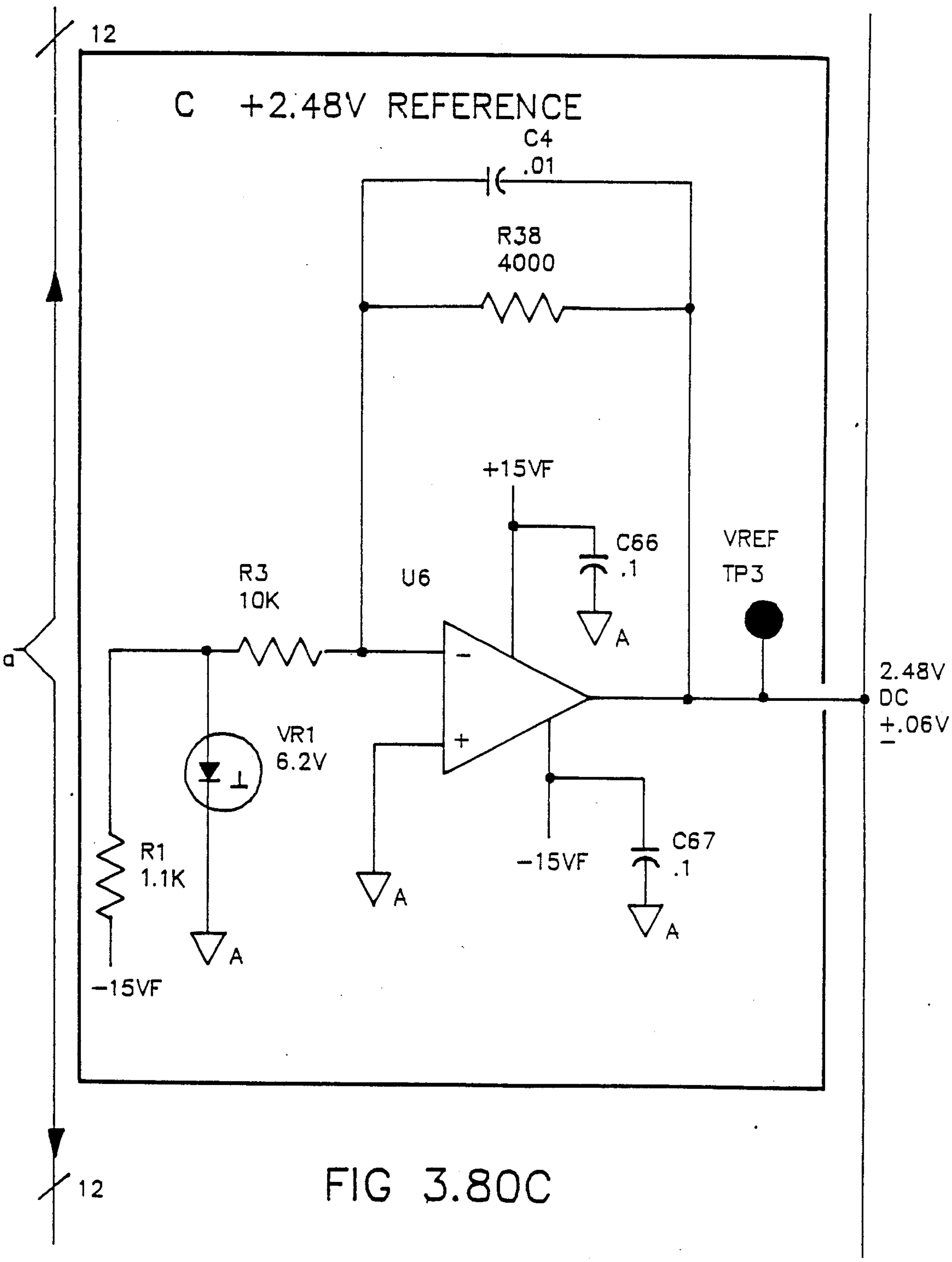
FIG 3.80C

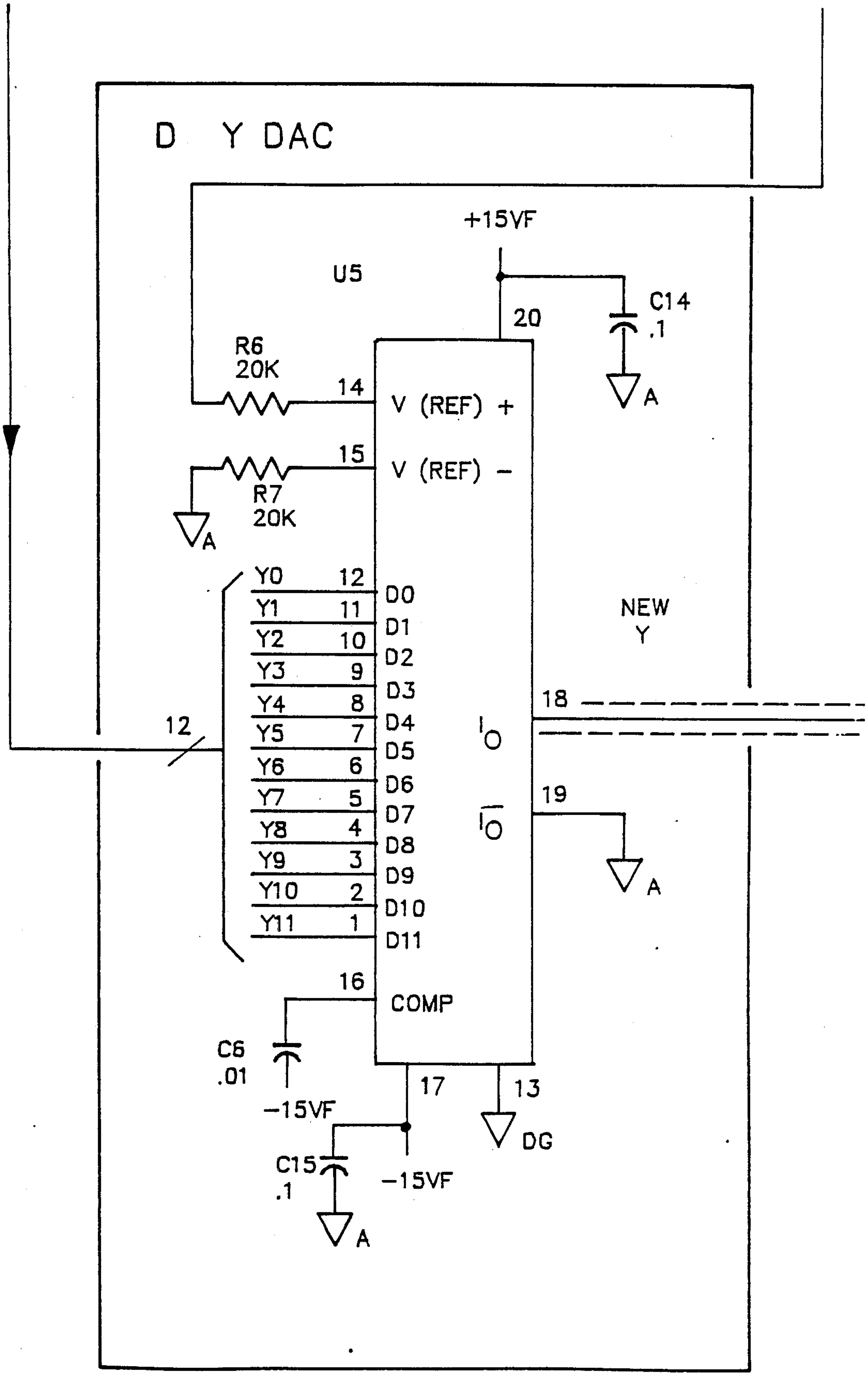
FIG 3.80D

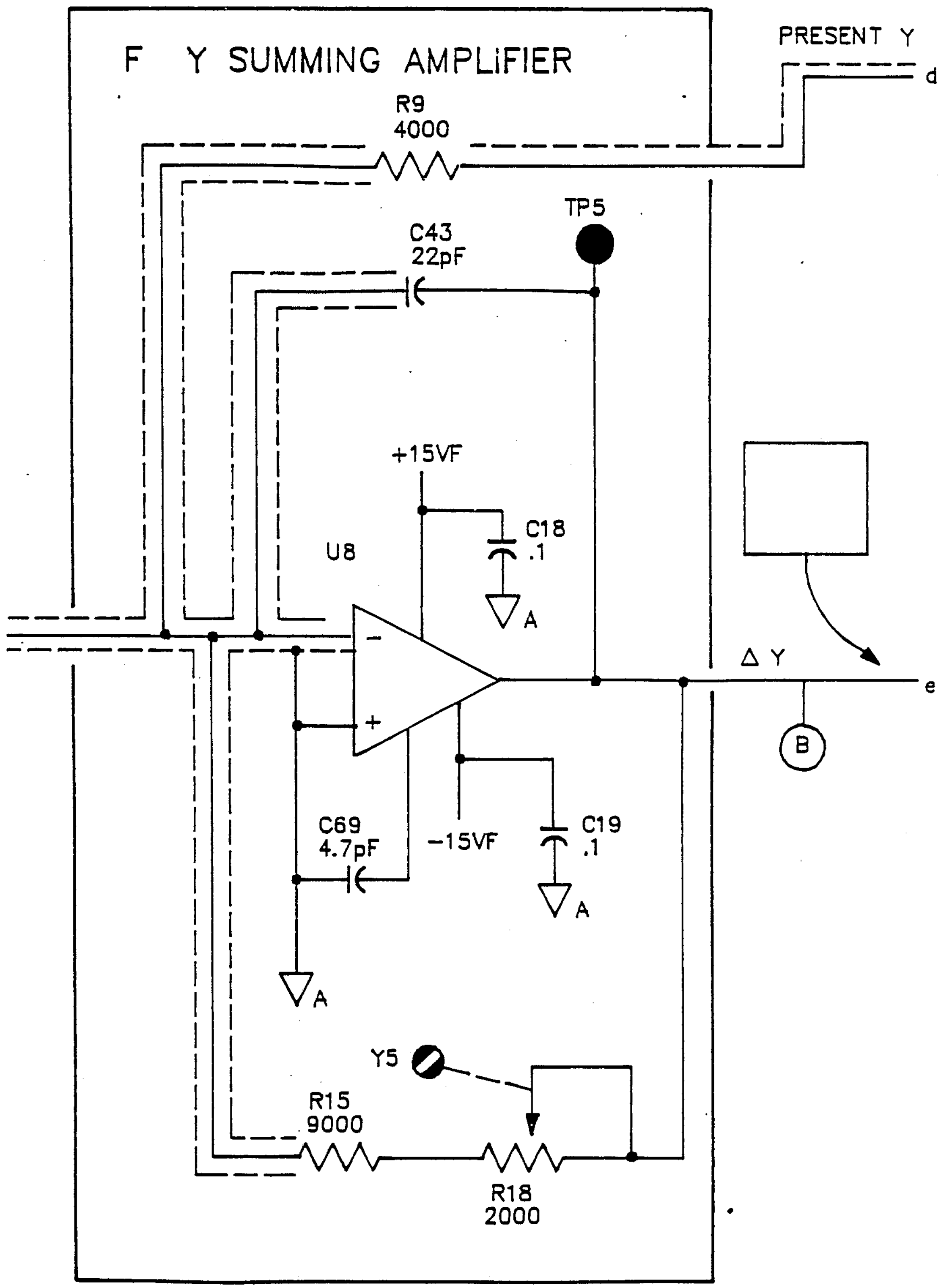
FIG 3.80E

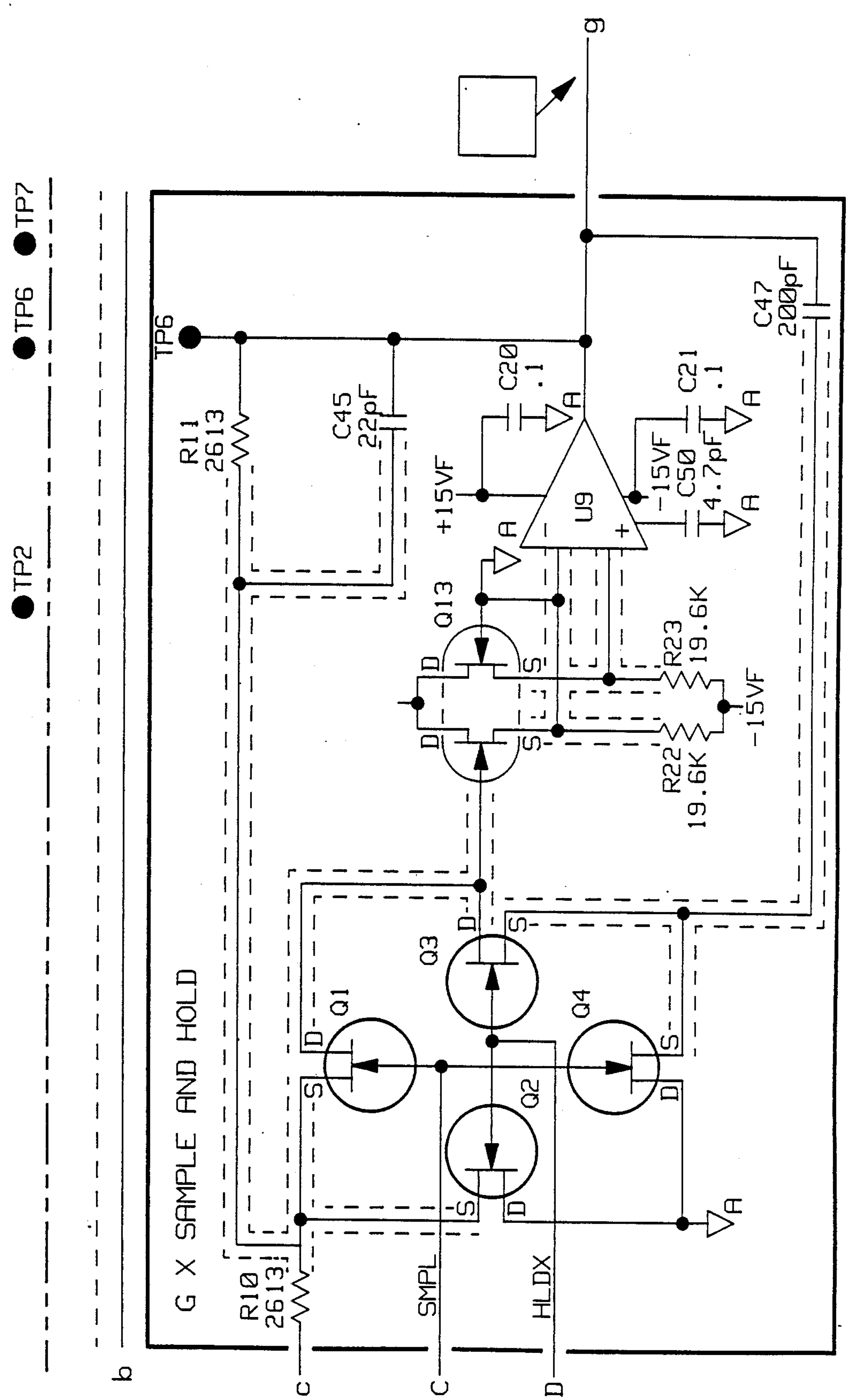
FIG 3.81A

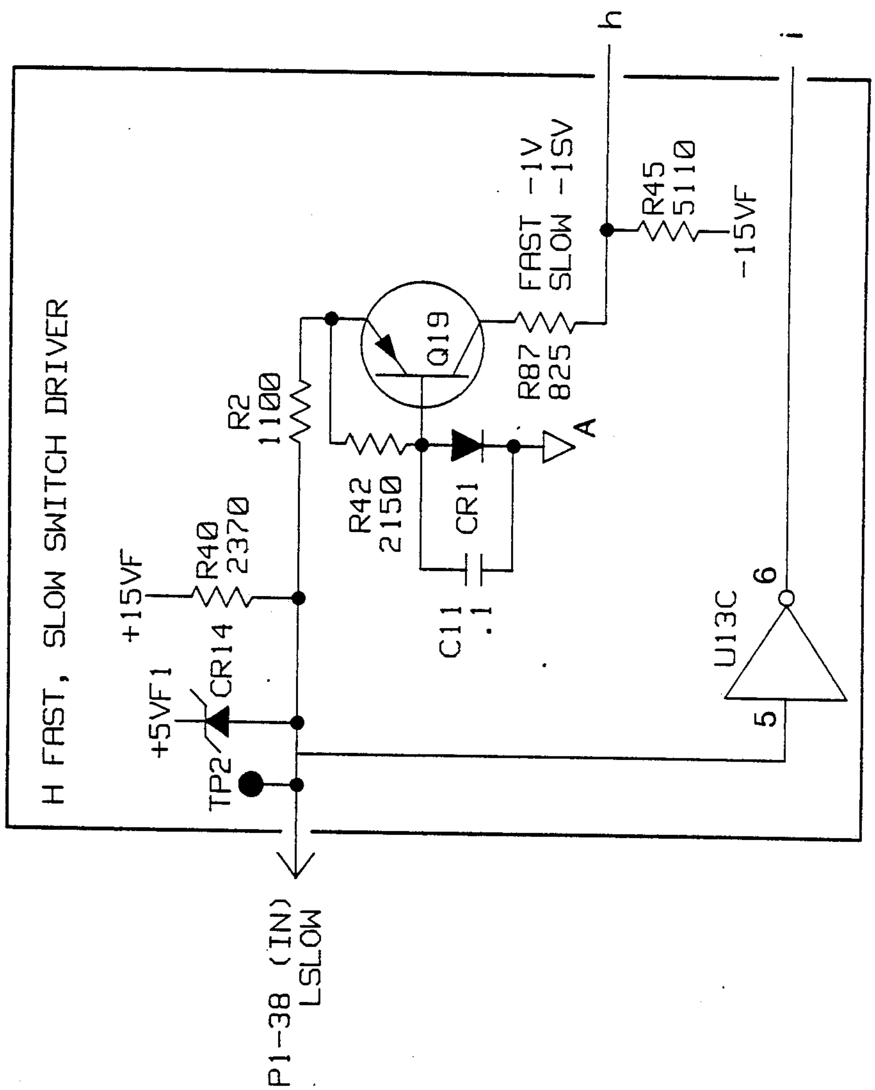
FIG 3.81B

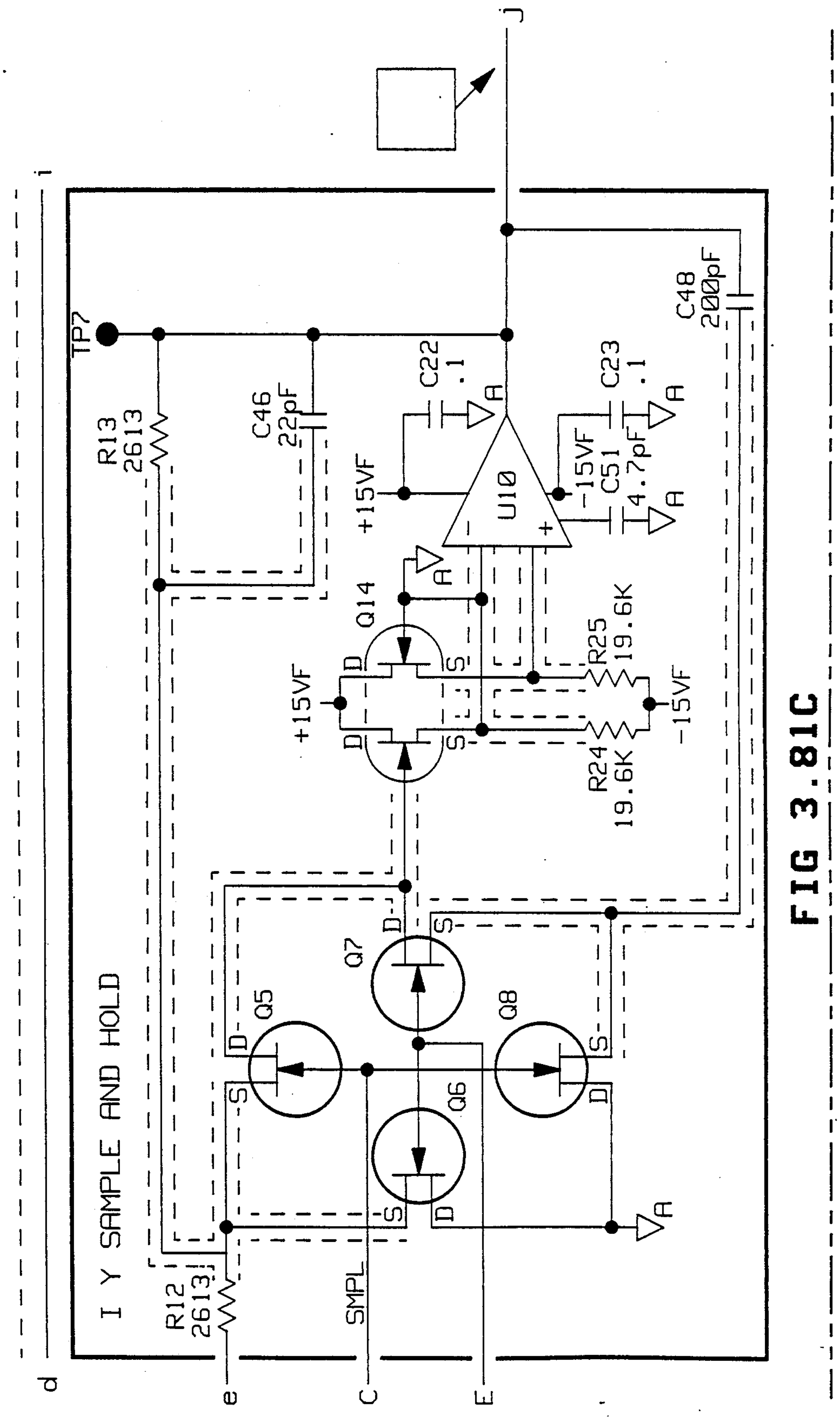
FIG 3.81C

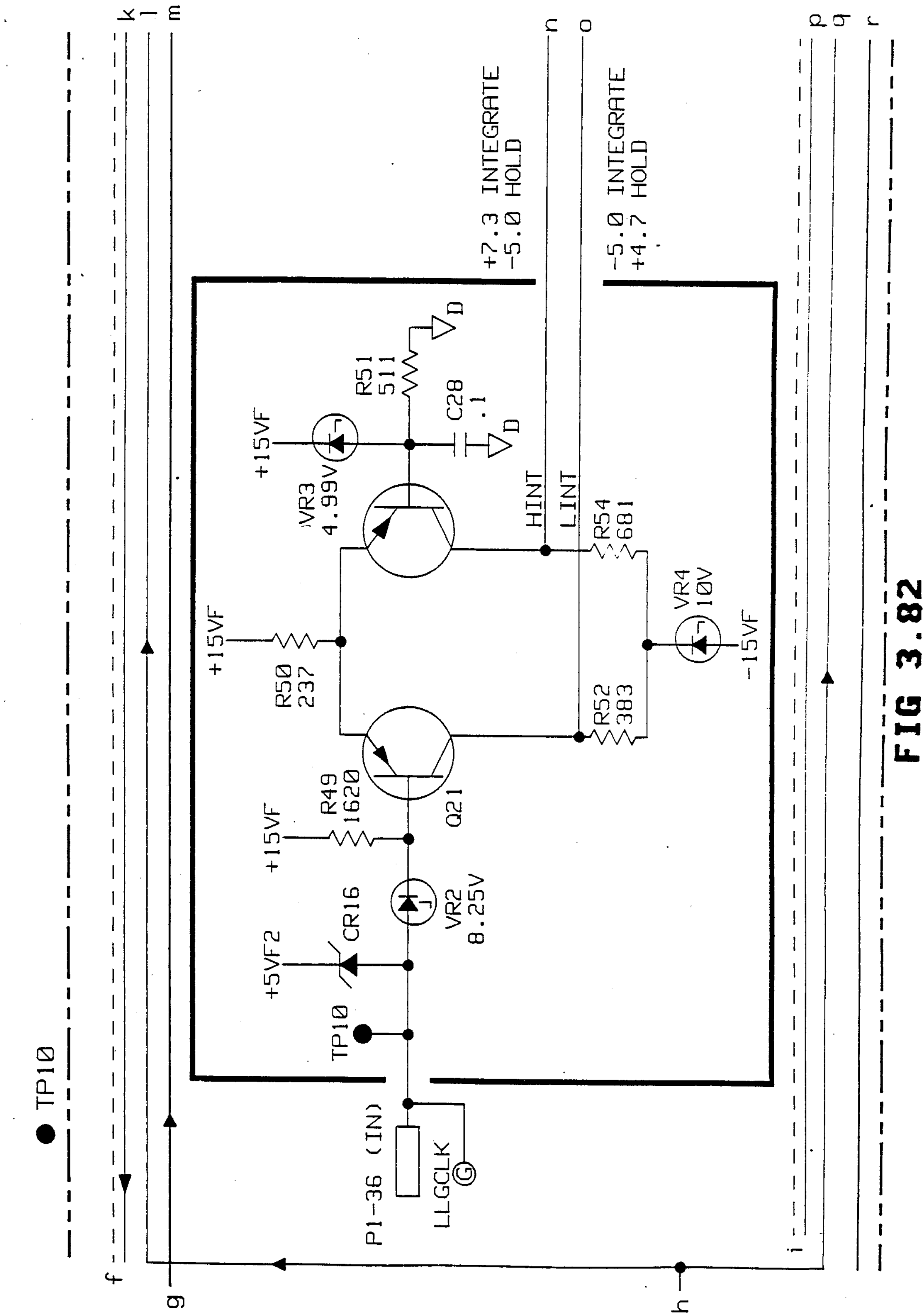
FIG 3.82

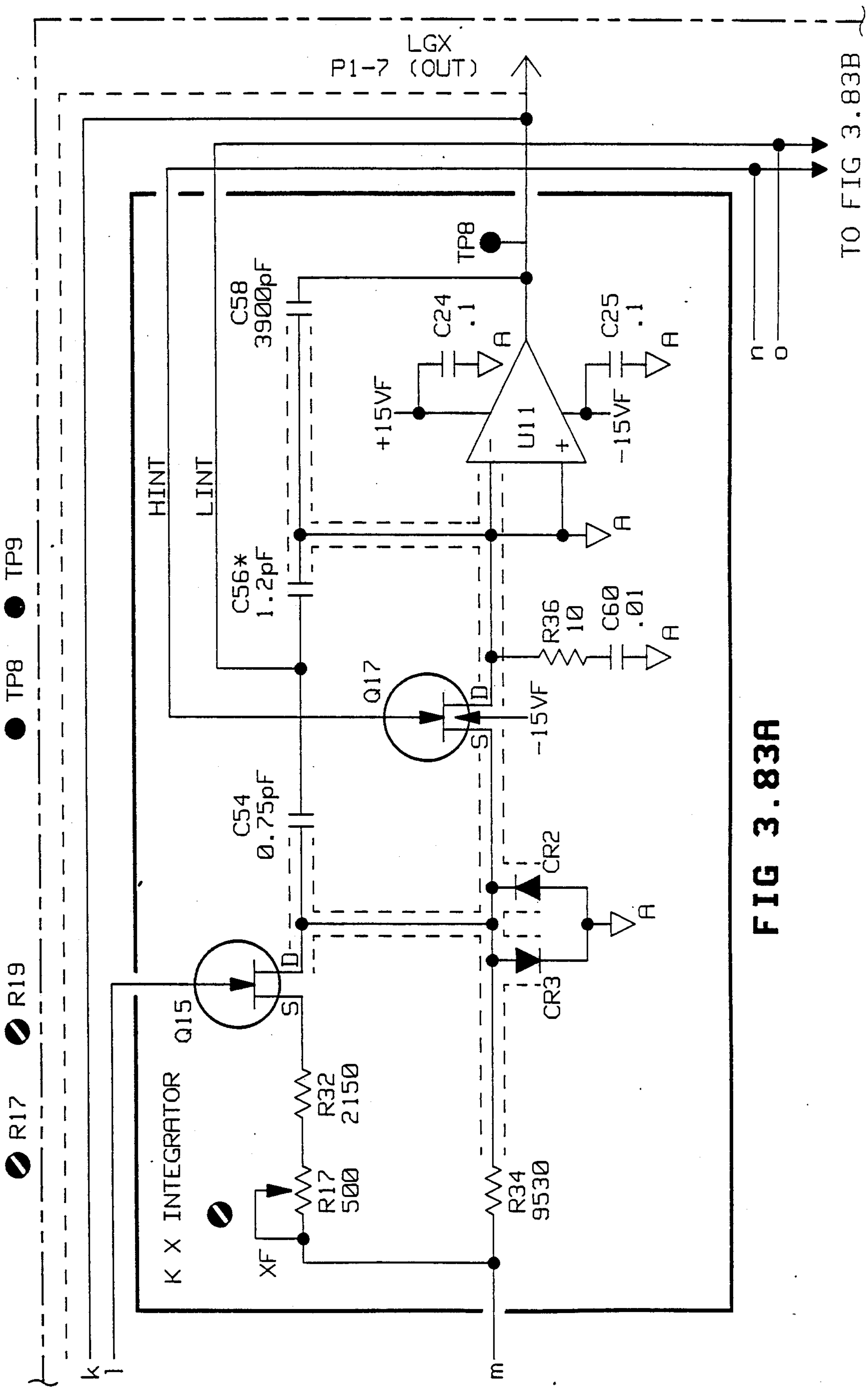
FIG 3.83A

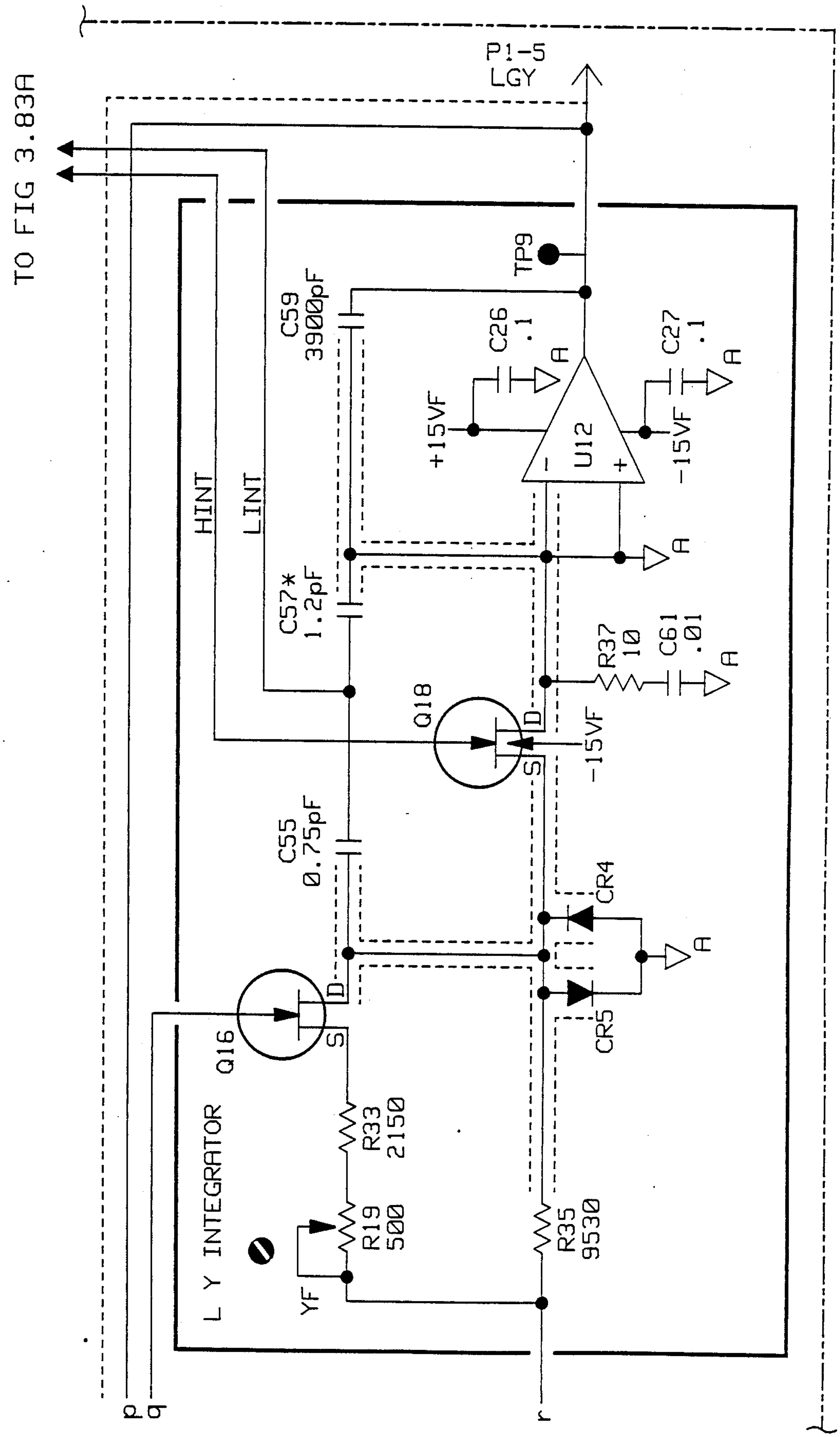
FIG 3.83B

FIG 3.85
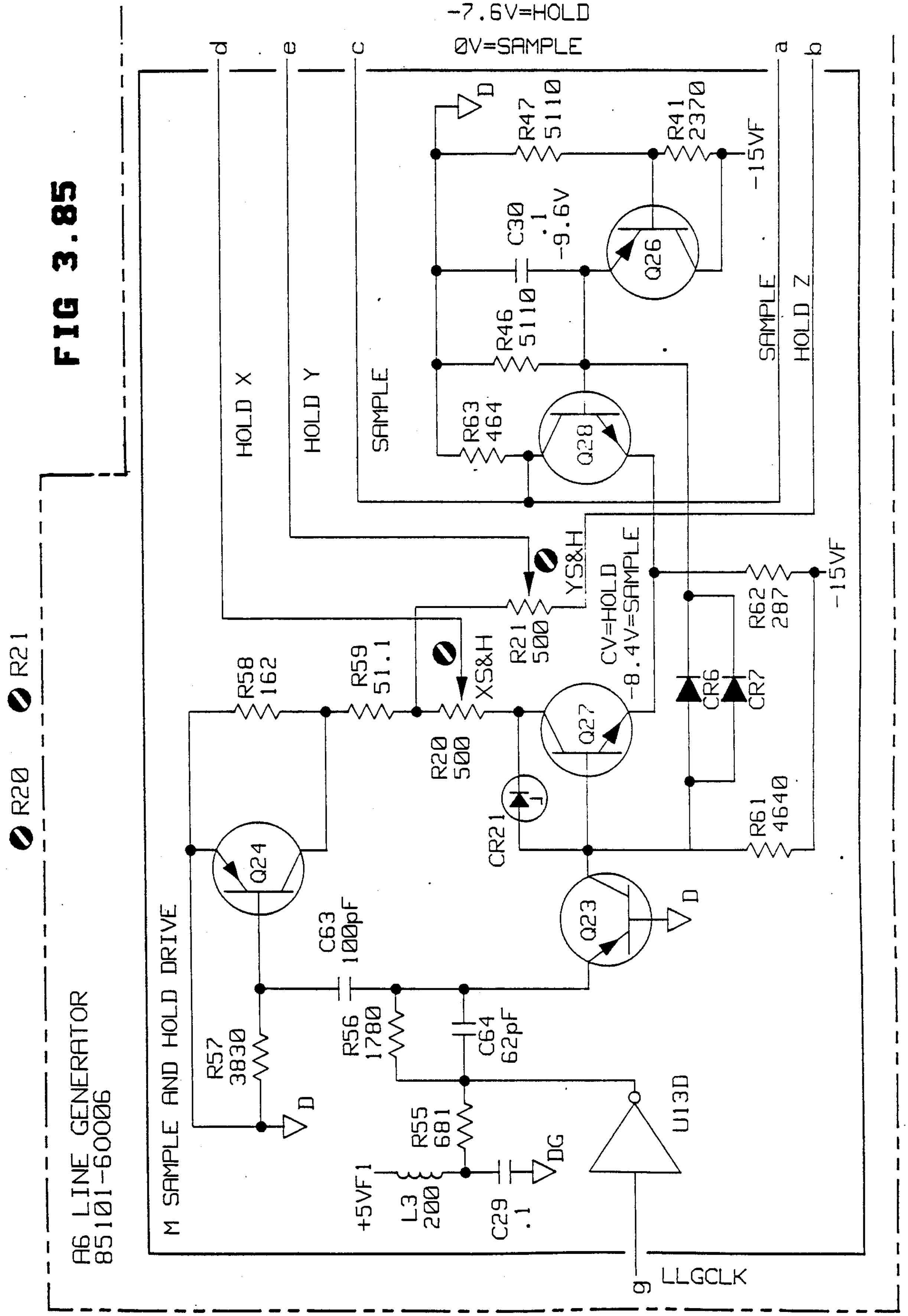

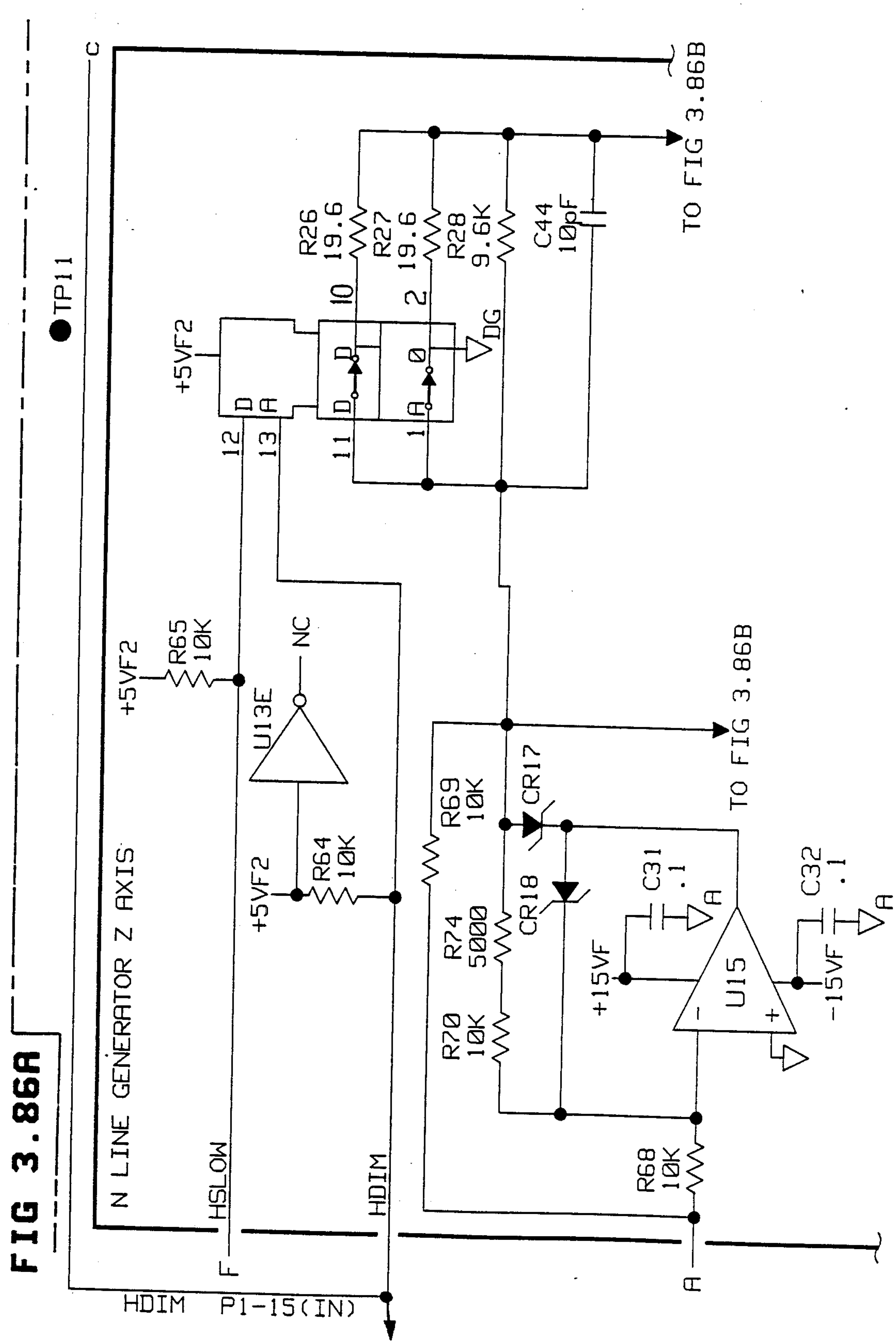
FIG 3.86A
N LINE GENERATOR Z AXIS
TP11
C
TO FIG 3.86B
R26
19.6
R27
19.6
R28
9.6K
C44
10pF
+5VF2
10
2
DG
12
13
11
1
D
A
Ø
R65
10K
+5VF2
NC
U13E
R64
10K
+5VF2
TO FIG 3.86B
R69
10K
CR17
CR18
C31
.1
C32
.1
R74
5000
R70
10K
+15VF
-15VF
U15
R68
10K
HSLOW
HDIM
F
A
HDIM P1-15(IN)

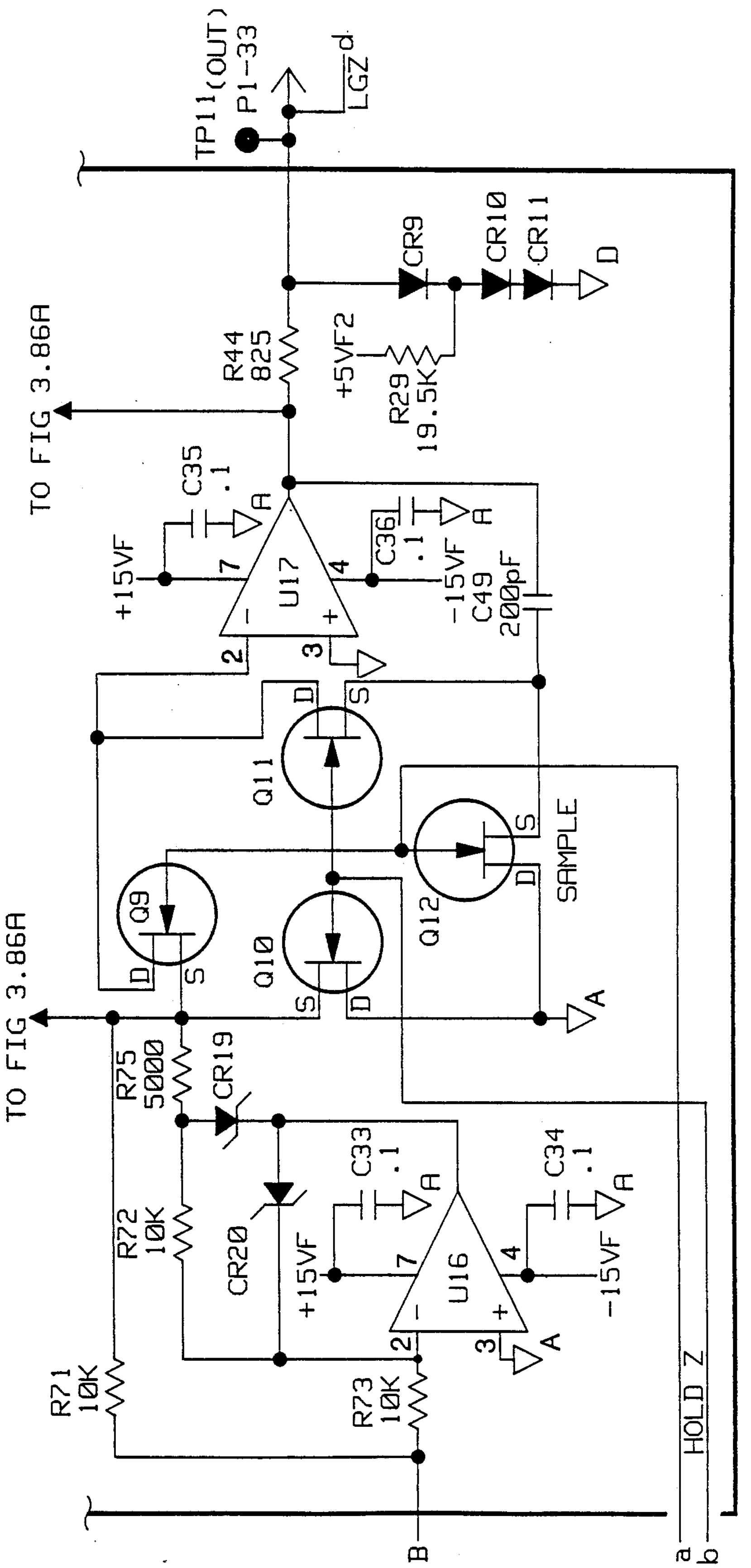
FIG 3.86B

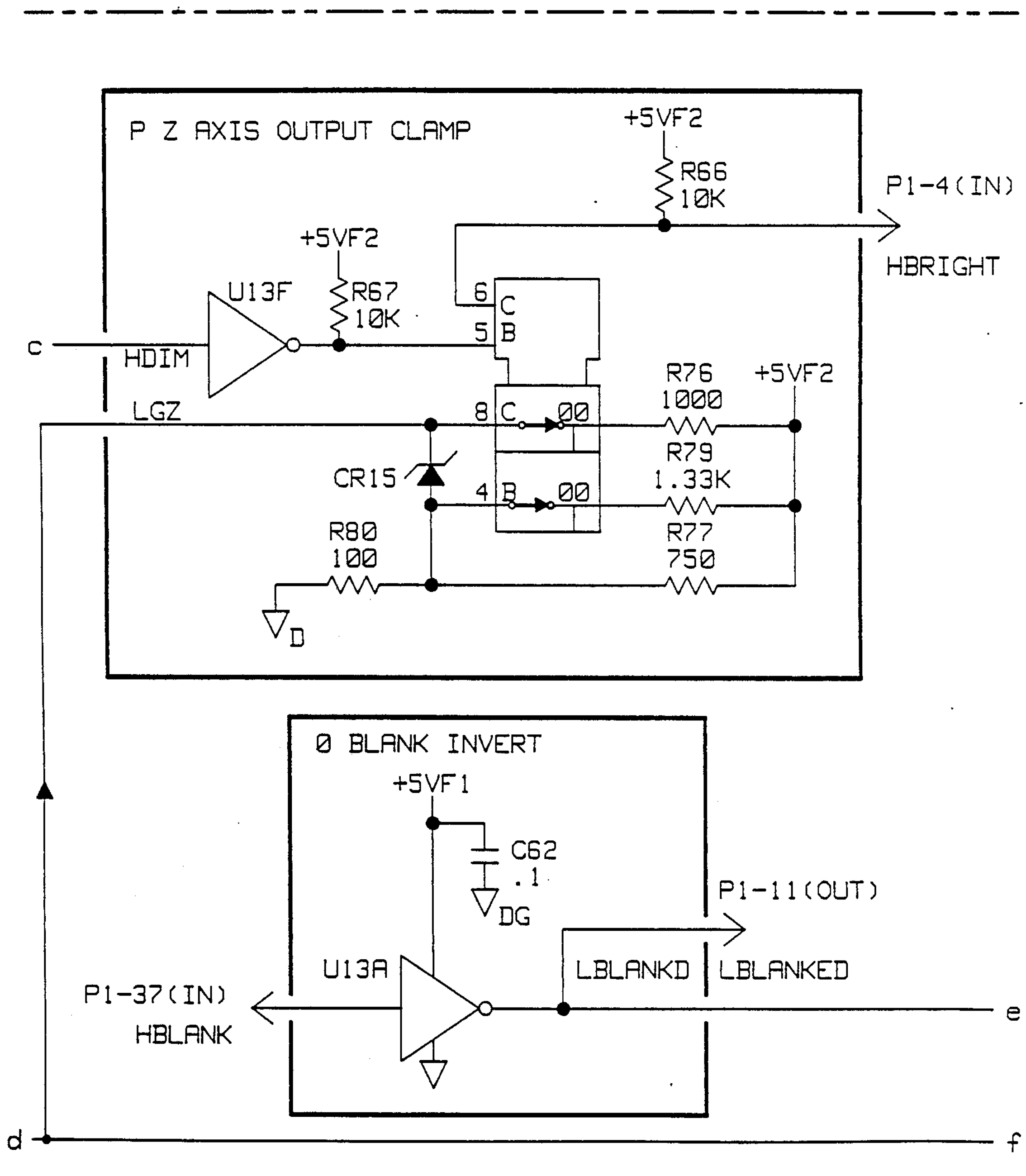
FIG 3.87

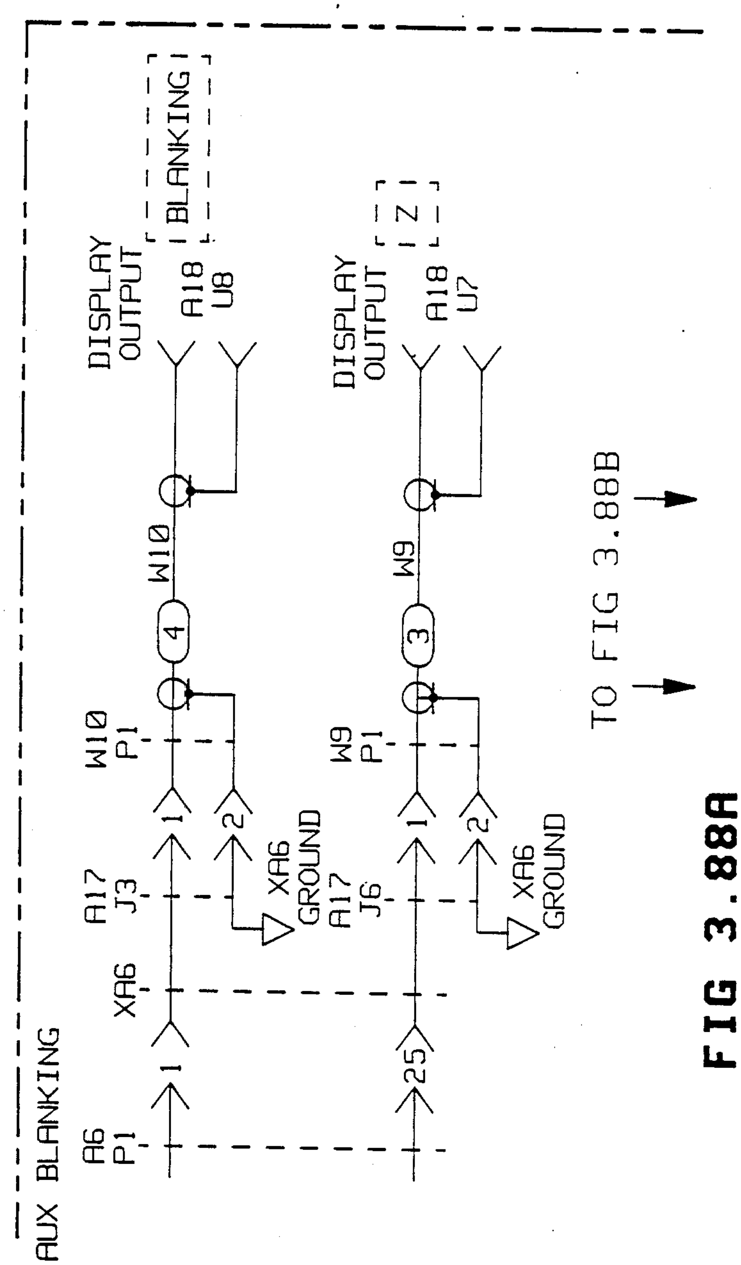
FIG 3.88A

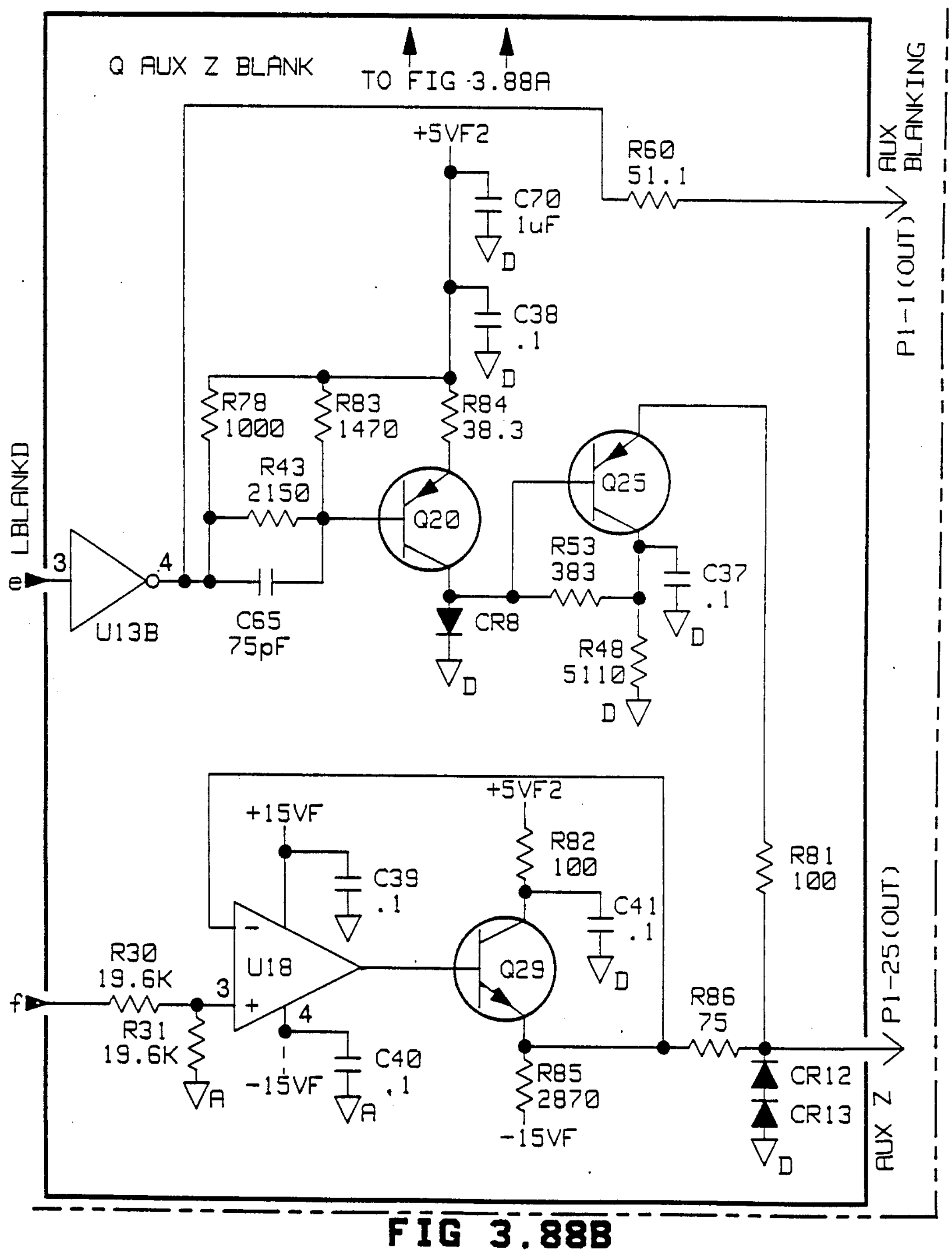
FIG 3.88B

FAST LINES ARE DRAWN IN 3μS
SLOW LINES ARE DRAWN IN 15μS
SETUP TIME IS 1μS

ACTIVE COMPONENTS PARTS LISTS (U's AND Q's)

| REFERENCE DESIGNATORS | PART NUMBER | MANUFACTURERS PART NUMBER |
|---|---|---|
| U1-U3 | 1820-2026 | 74LS396 |
| U4-U5 | 1826-0705 | DAC6012 |
| U6 | 1826-0371 | LF256 |
| U7,8,11,12 | 1826-0079 | HA-2625 |
| U9,U10 | 1826-0089 | HA-2525 |
| U13 | 1826-1199 | 74LS04 |
| U14 | 1826-1548 | MC14066 |
| U15-U18 | 1826-0081 | LM318 |
| Q1-12 | 1855-0081 | 2N5245 |
| Q13,Q14 | 1855-0050 | |
| Q15,Q16 | 1855-0020 | |
| Q17,Q18 | 1855-0241 | |
| Q19,Q20 | 1853-0034 | 2N3251 |
| Q21-Q26 | 1853-0007 | 2N3251 |
| Q27-Q29 | 1854-0404 | NPN |
| | | |
| | | |
| | | |
| | | |
| | | |
| | | |
| | | |

FIG 3.89

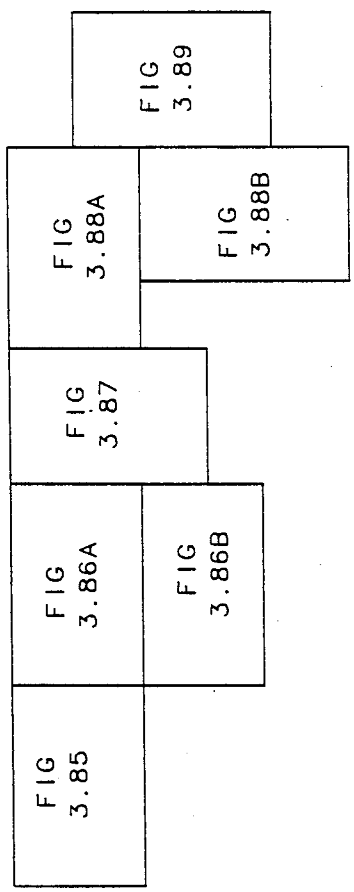
FIG 3.90
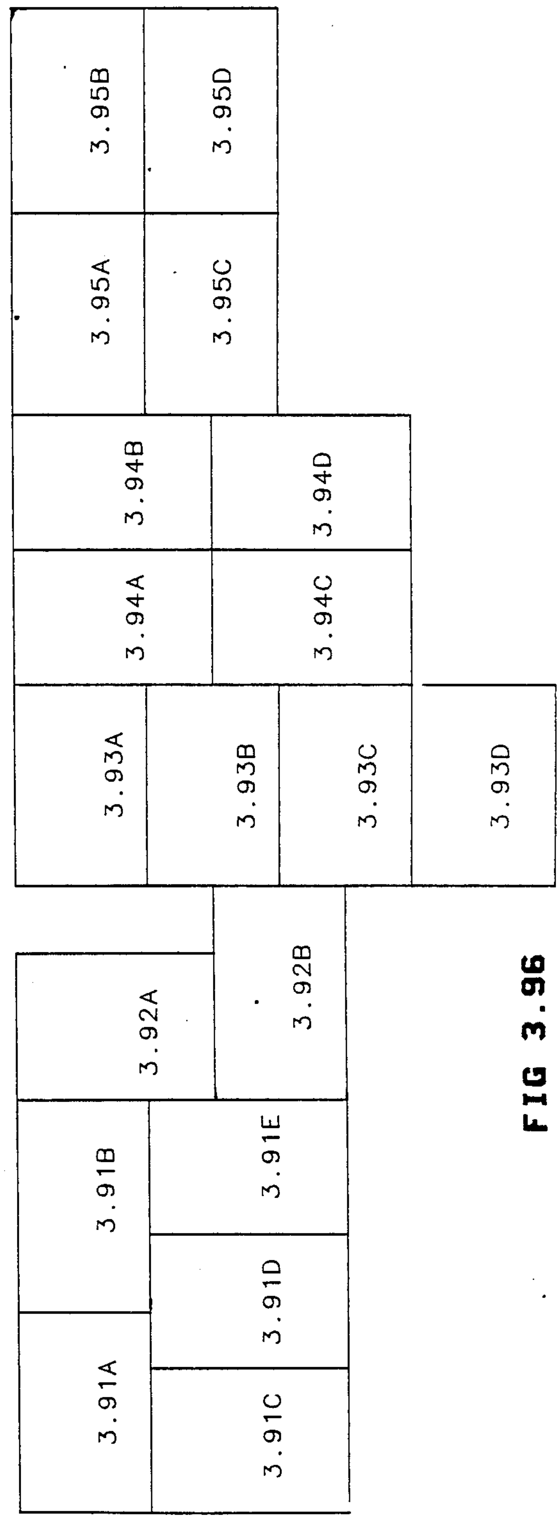
FIG 3.96

A7 SWITCHING REGULATOR
85101-60007

| P/O A18 | P/O A17 | P/O A9 |
|---|---|---|
| S1, S2 | R1, R2, R6, R3, R4 | T1 |
| J4, J1 | K1 | P21-26 |
| F1 | C5, 18, 19, 2, 28, 1, 14 | TB1-4 |
| FL 1 | L 1 | P1 |
| | CR1, 2, 3 | |

FIG 3.91A

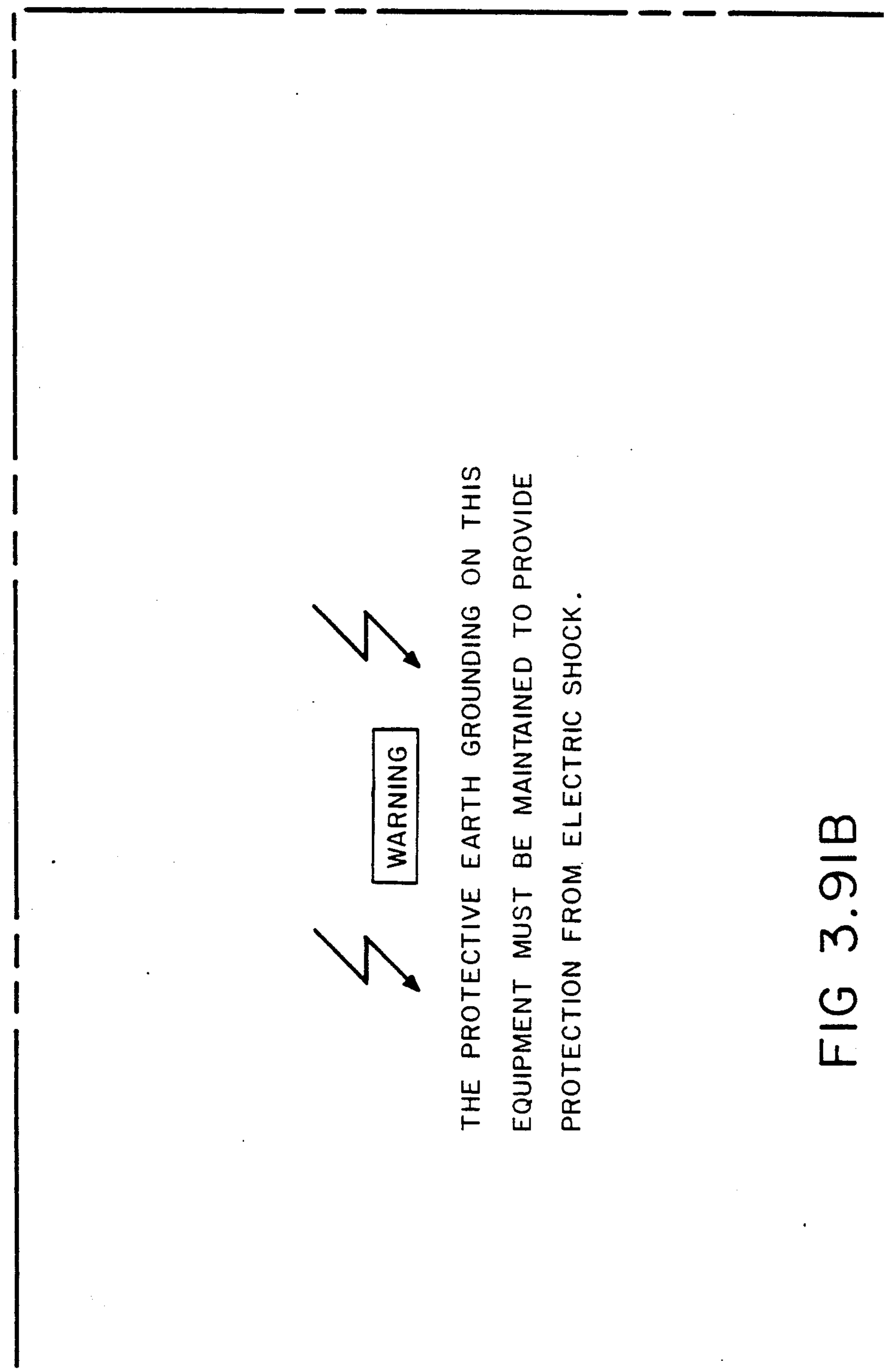
FIG 3.91B

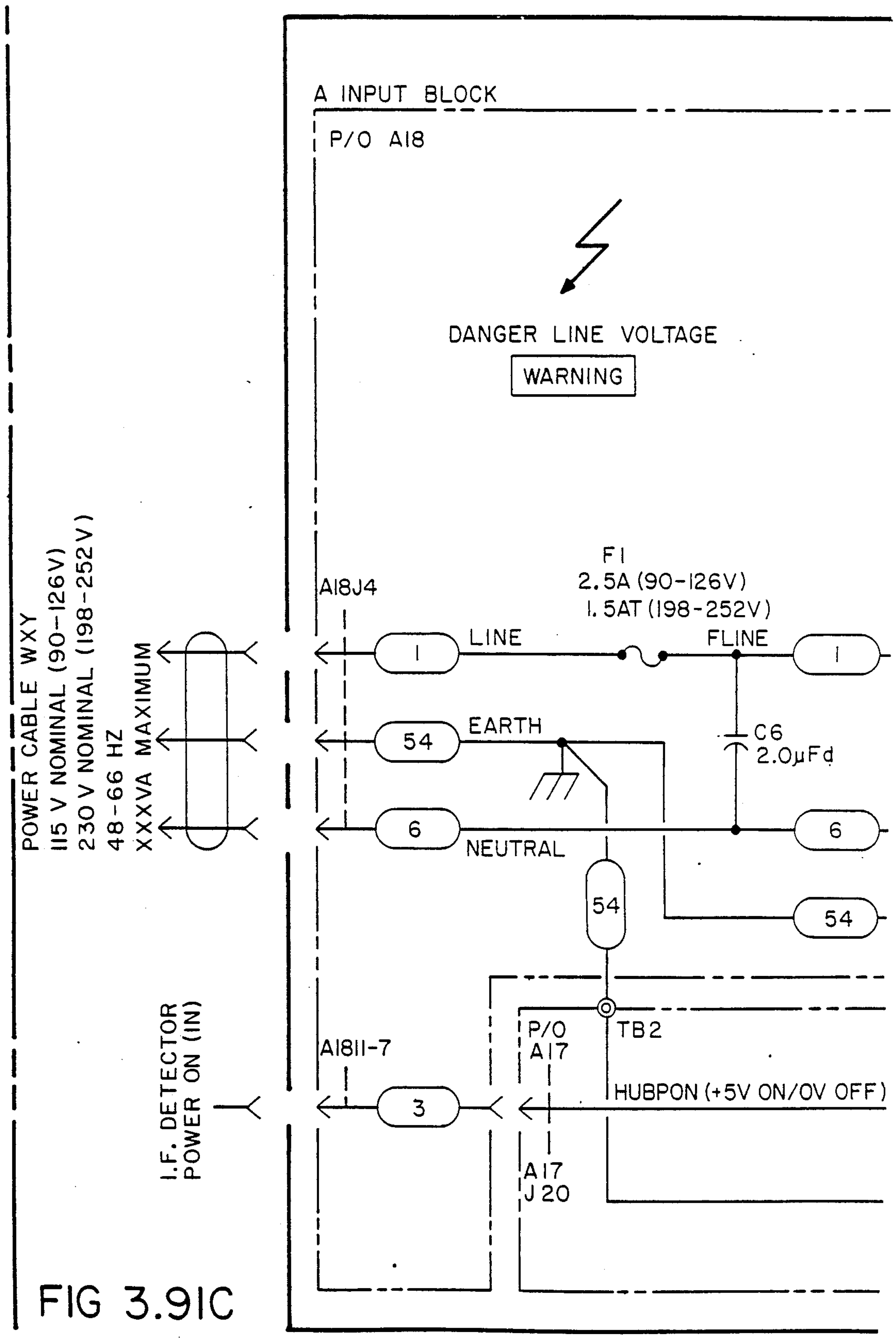
FIG 3.91C

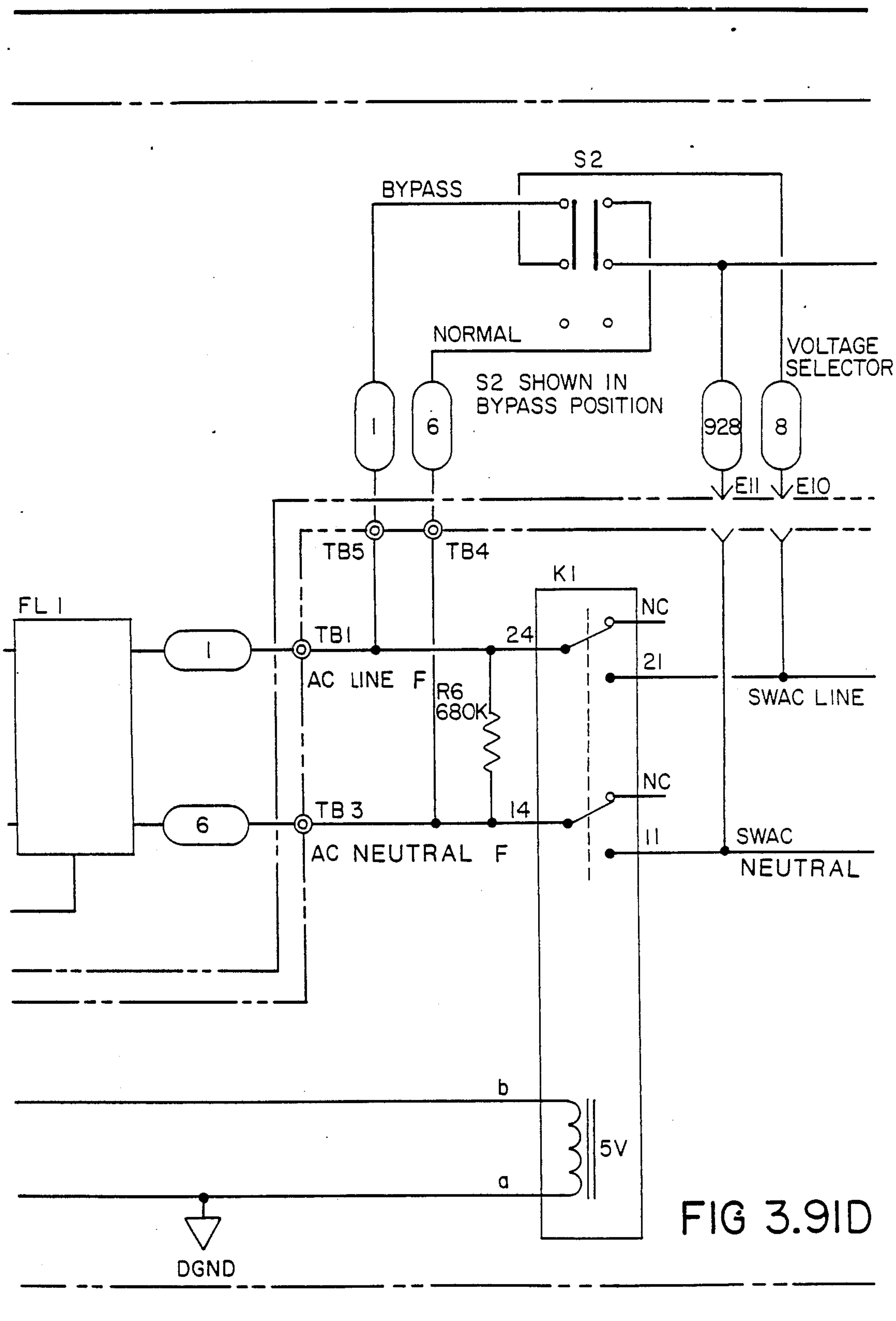
FIG 3.91D

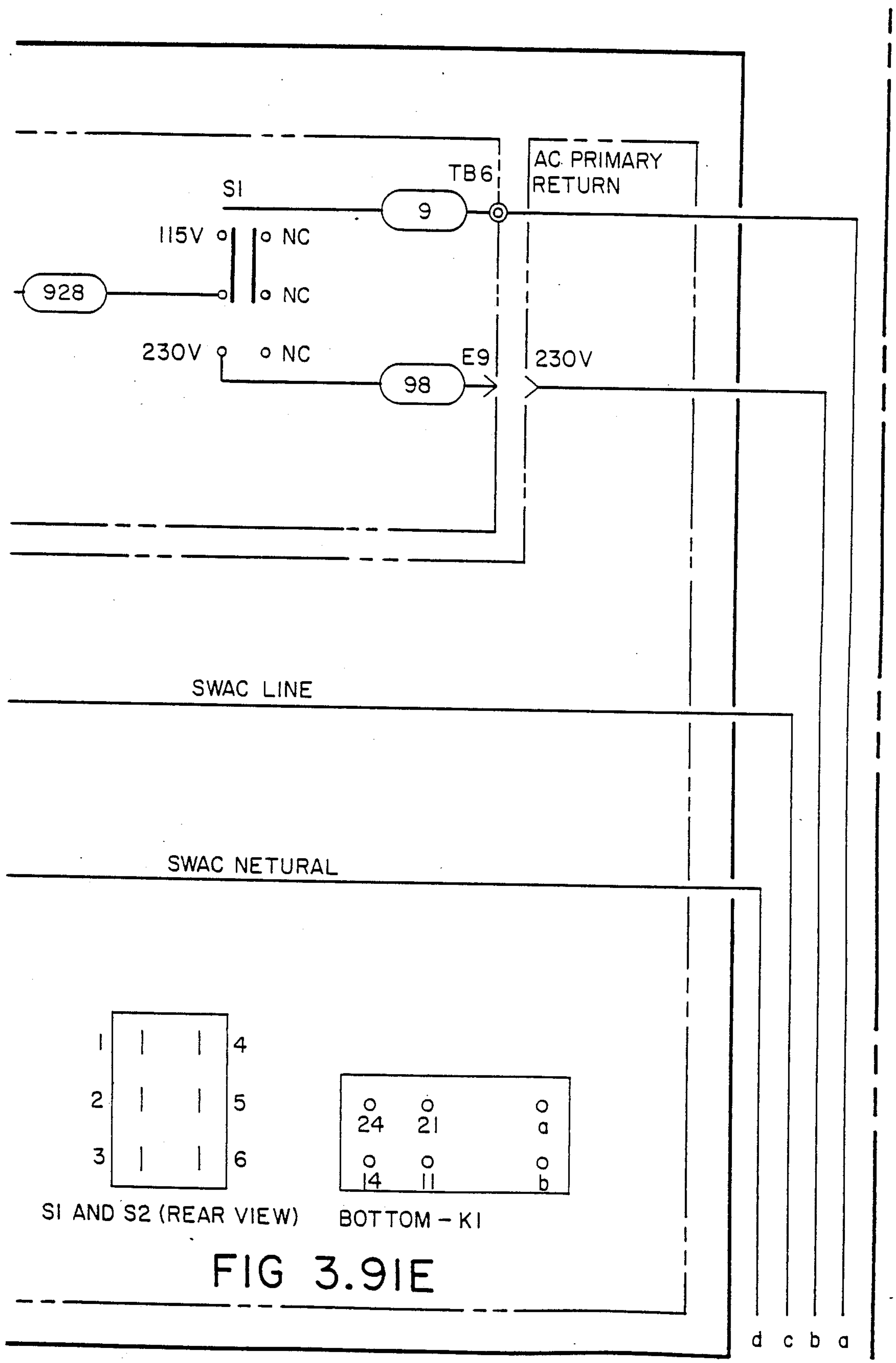
FIG 3.91E

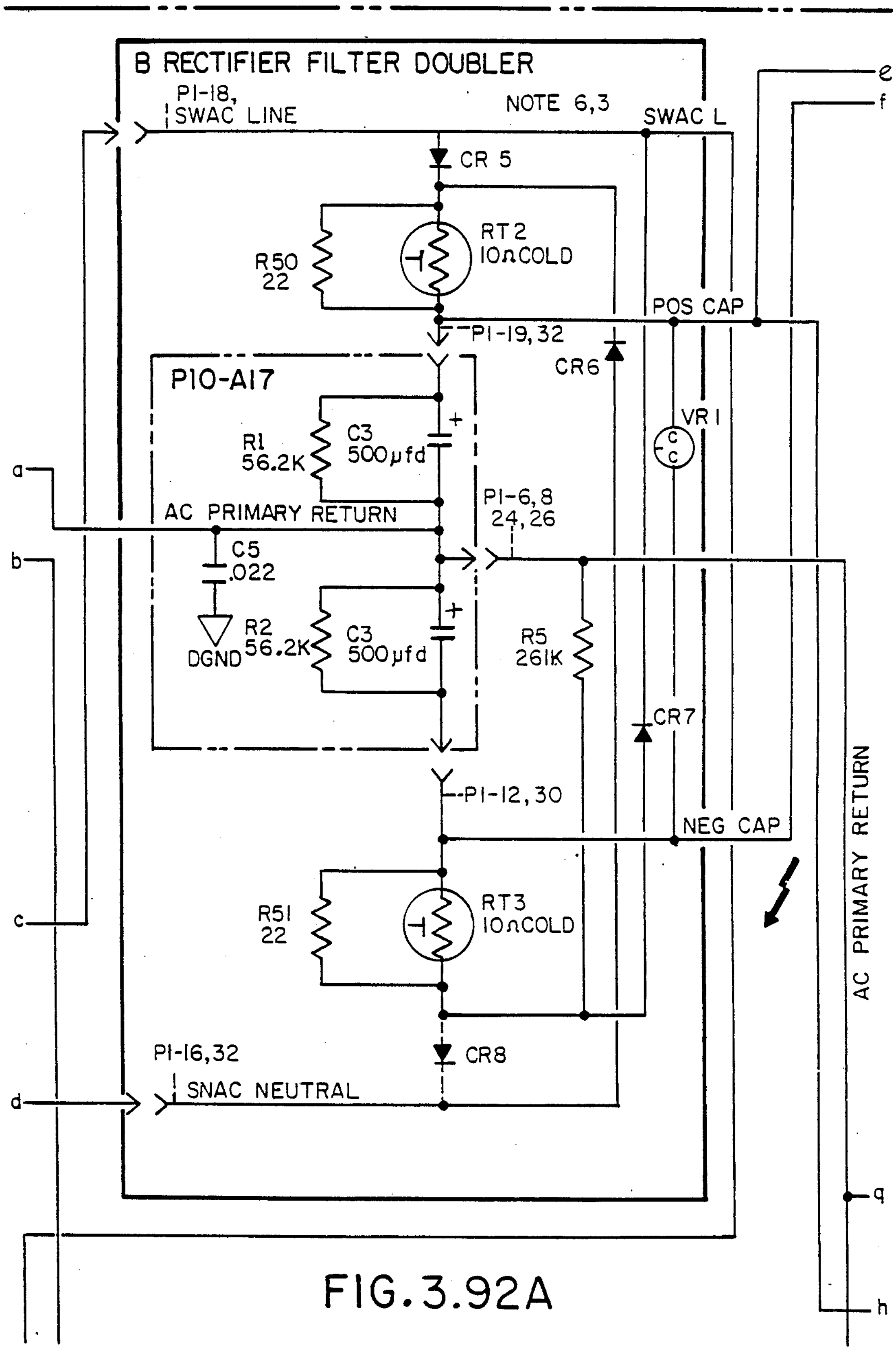
FIG. 3.92A

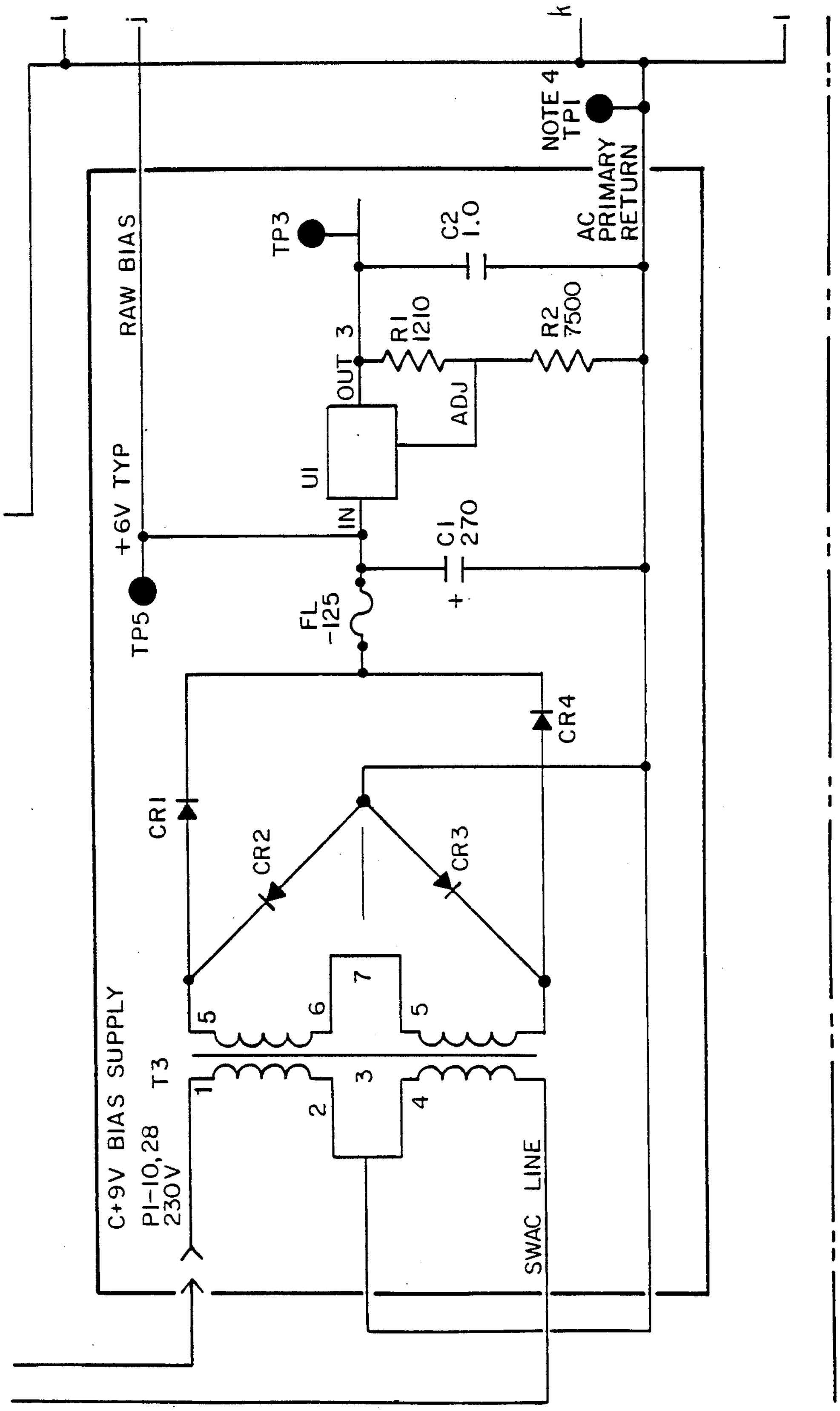
FIG 3.92B

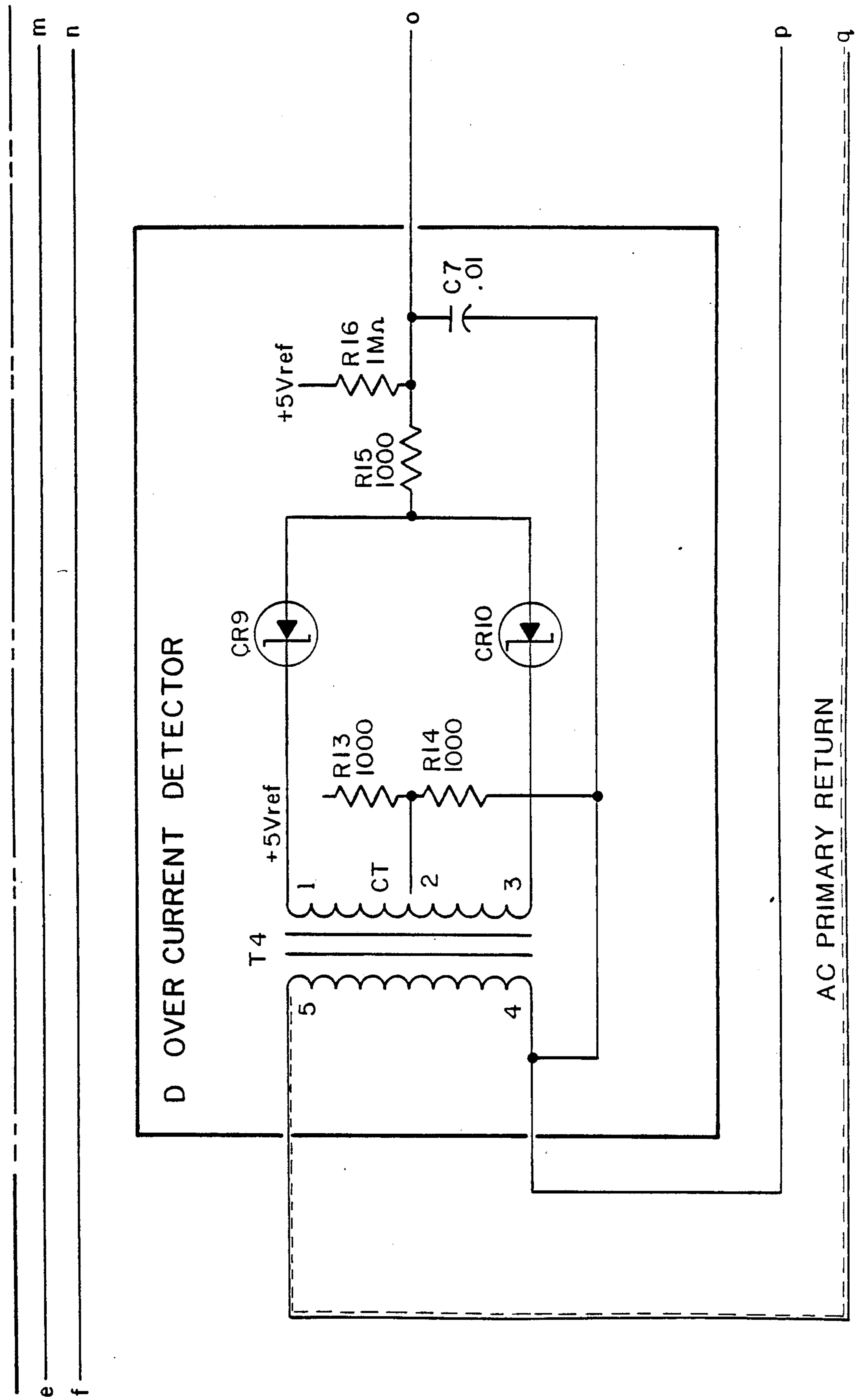
FIG 3.93A

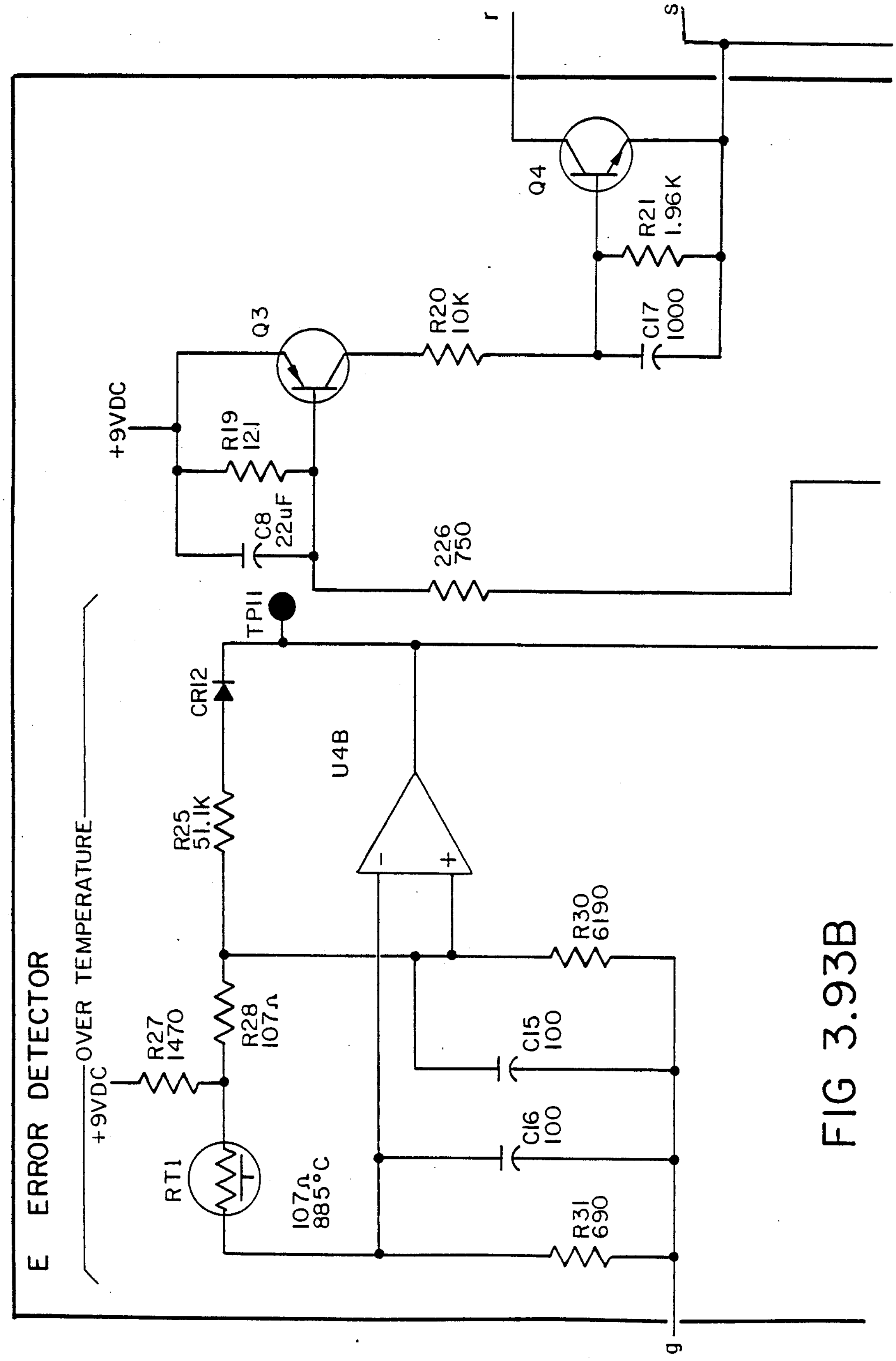
FIG 3.93B

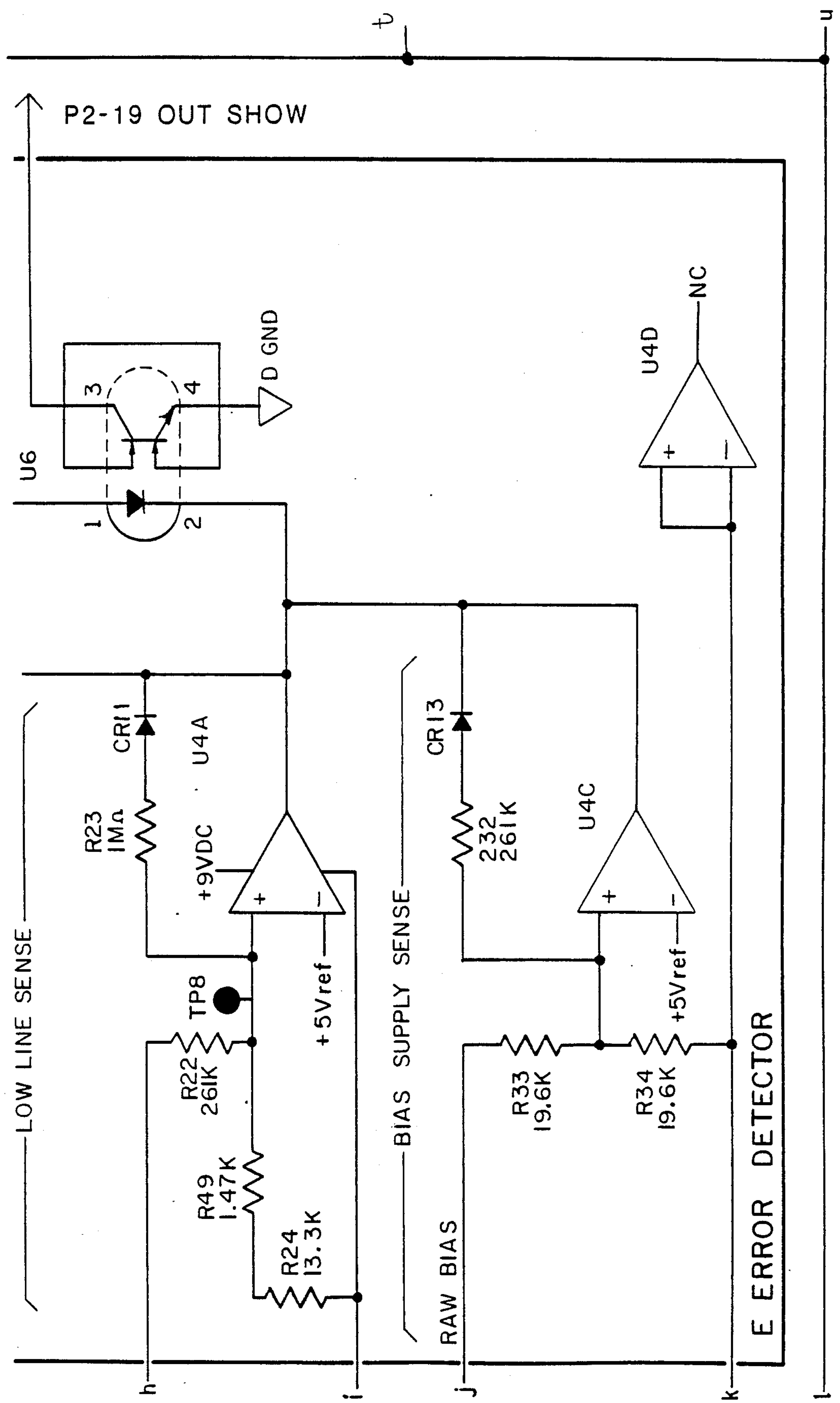
FIG 3.93C

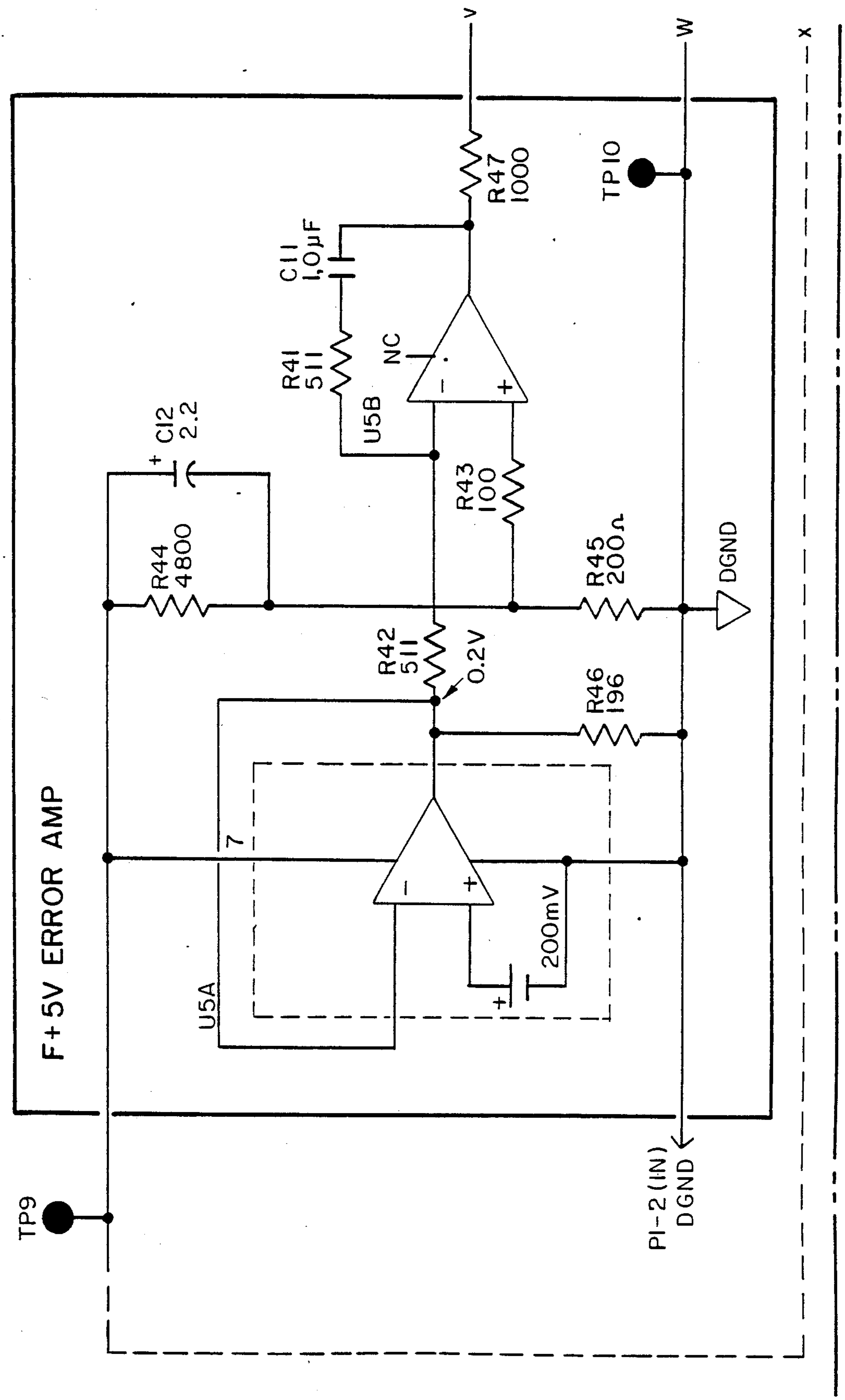
FIG 3.93D

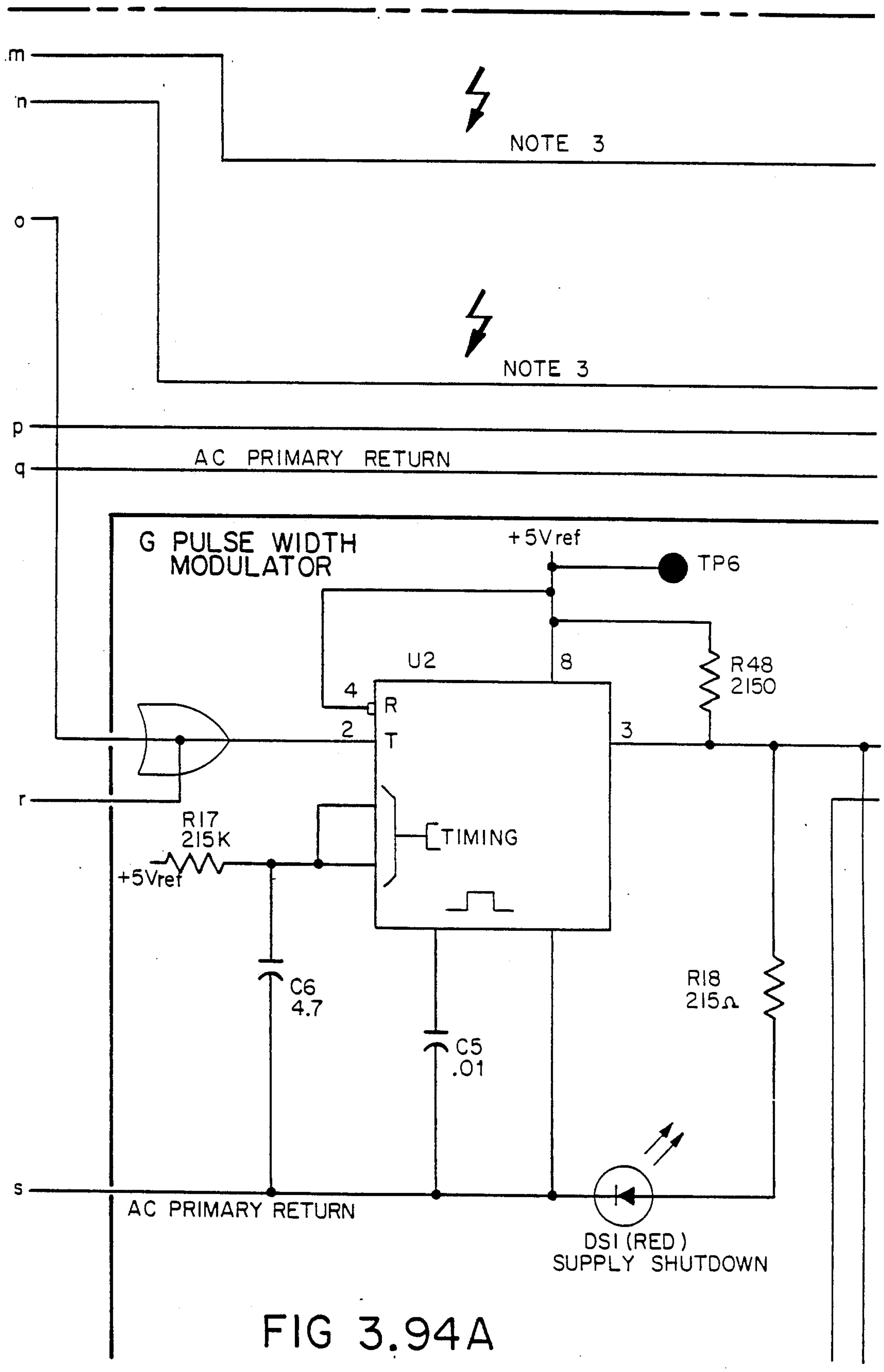
FIG 3.94A

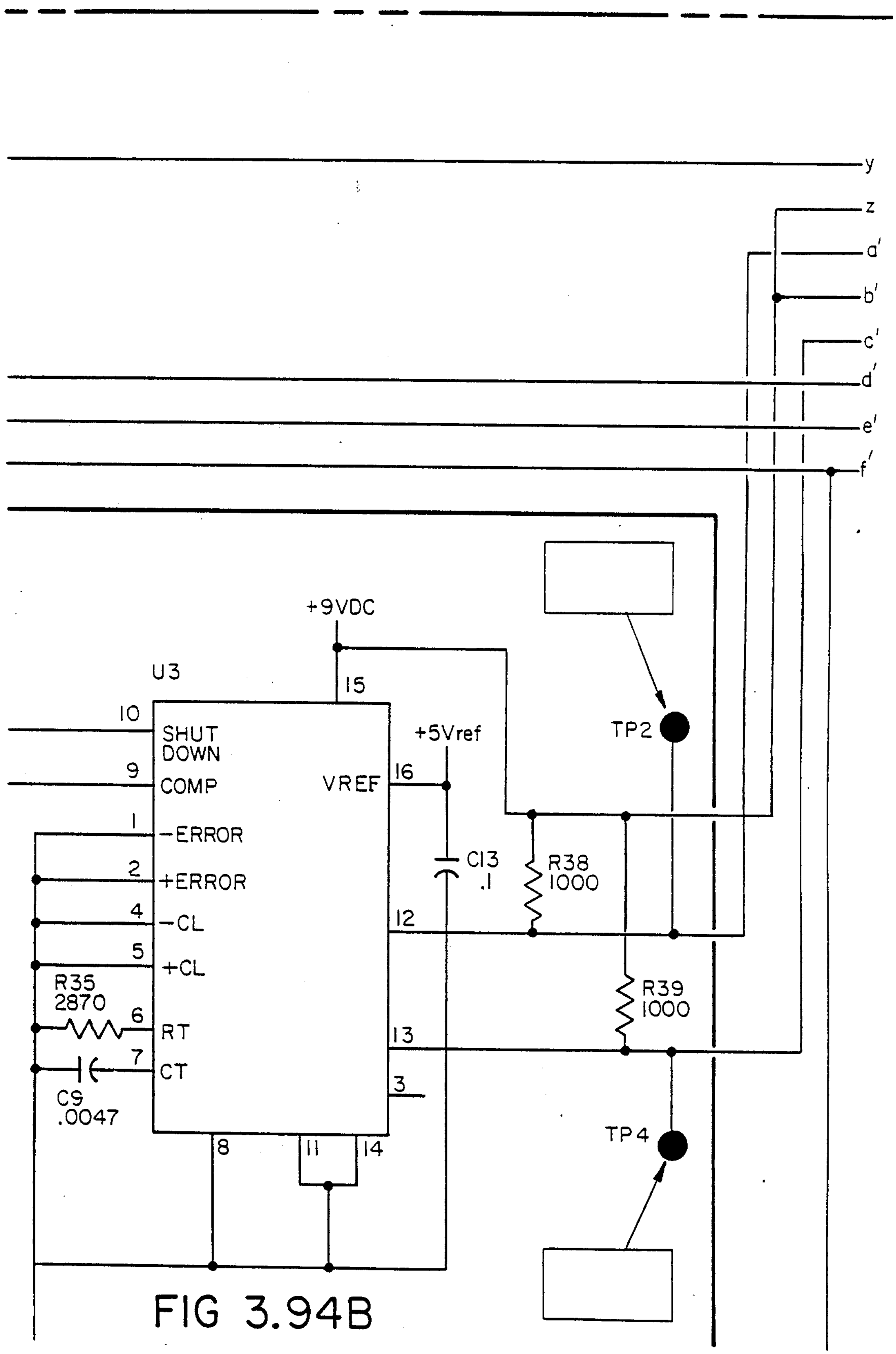
FIG 3.94B

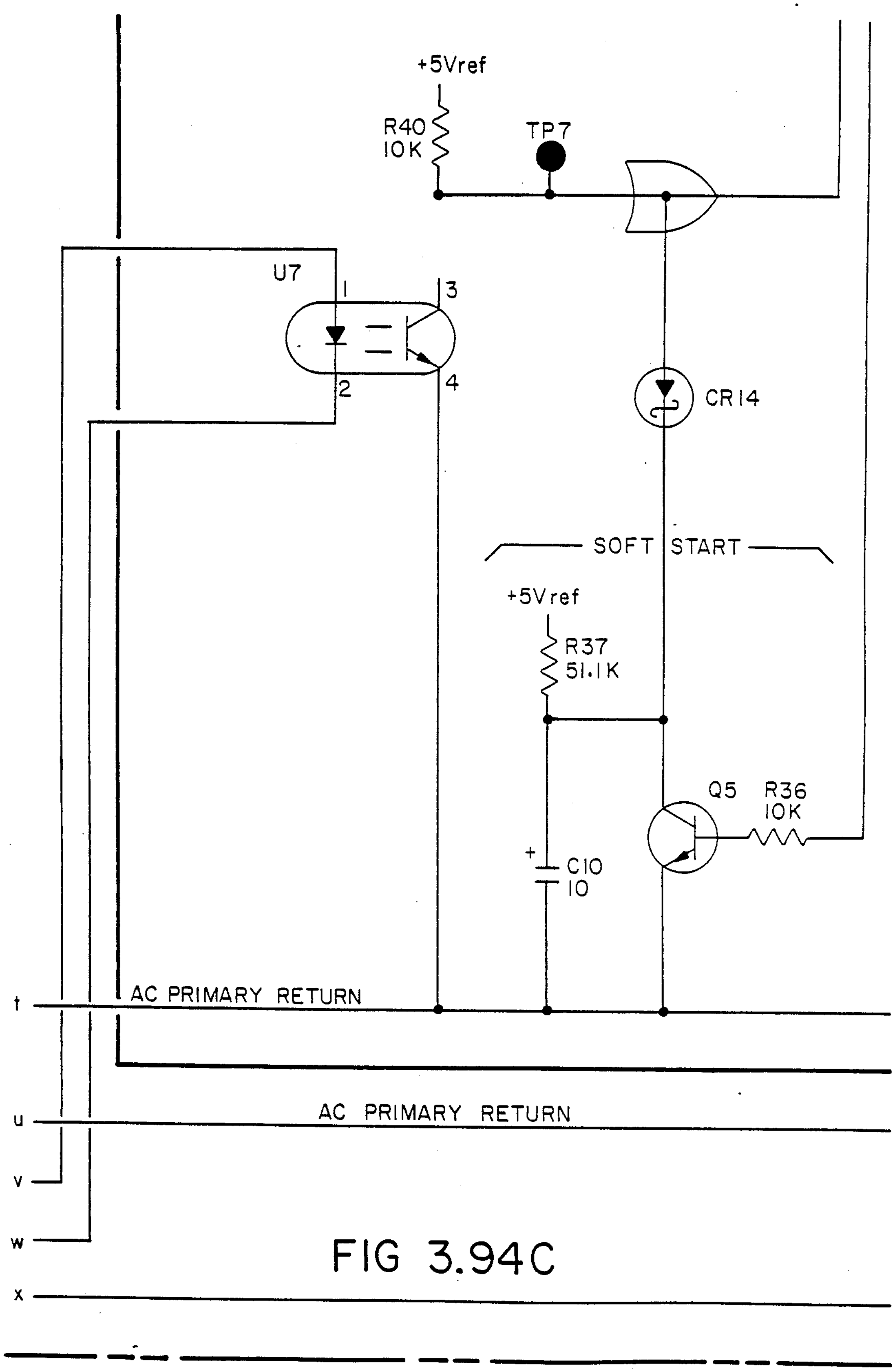
FIG 3.94C

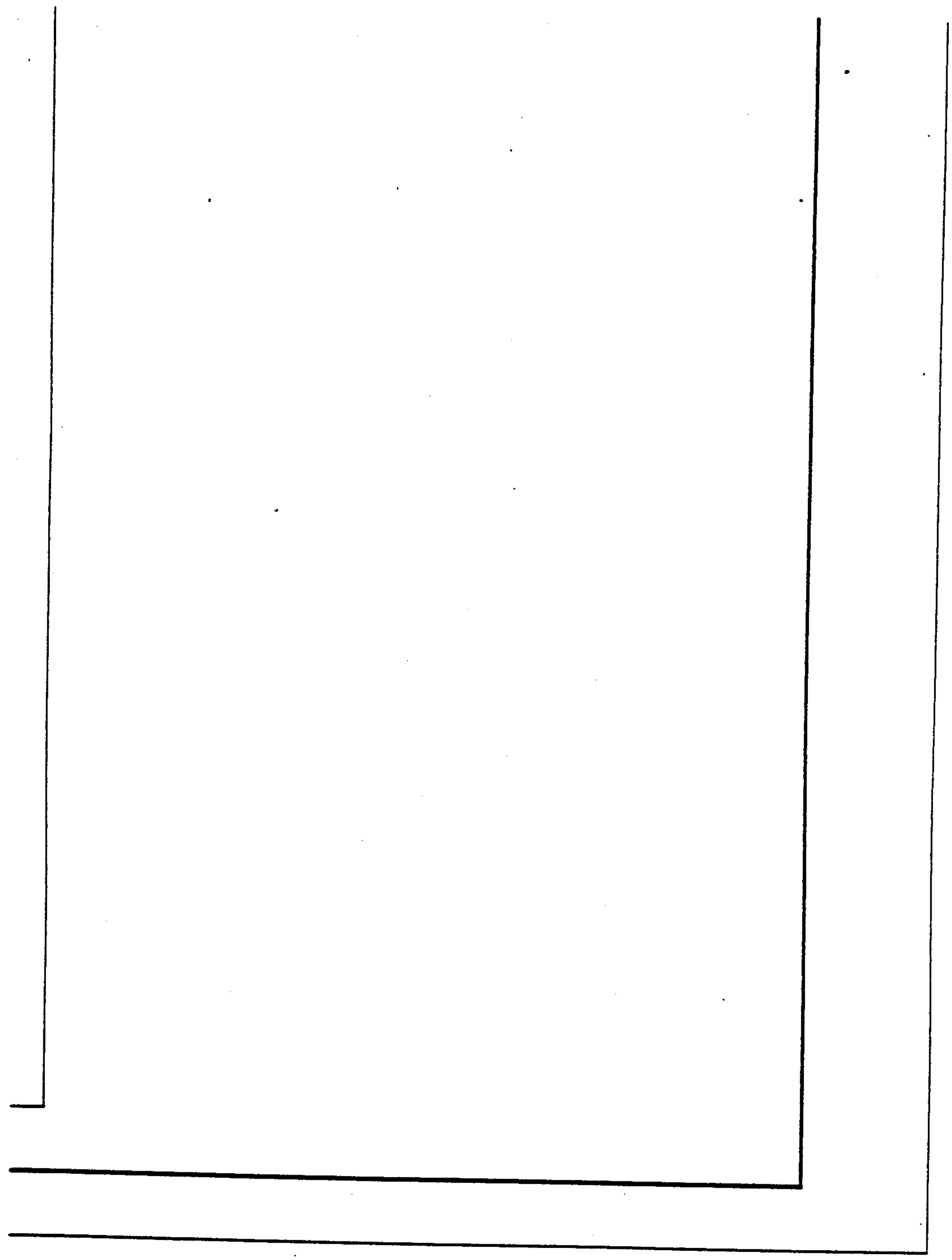
FIG 3.94D
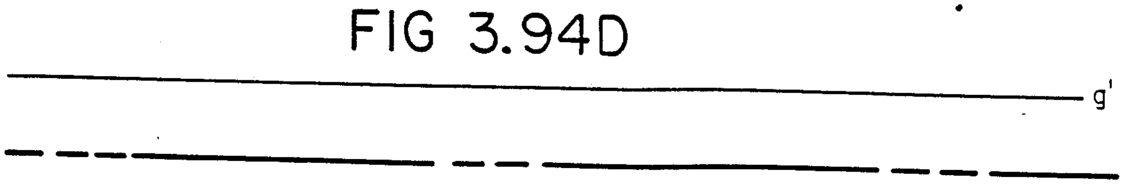

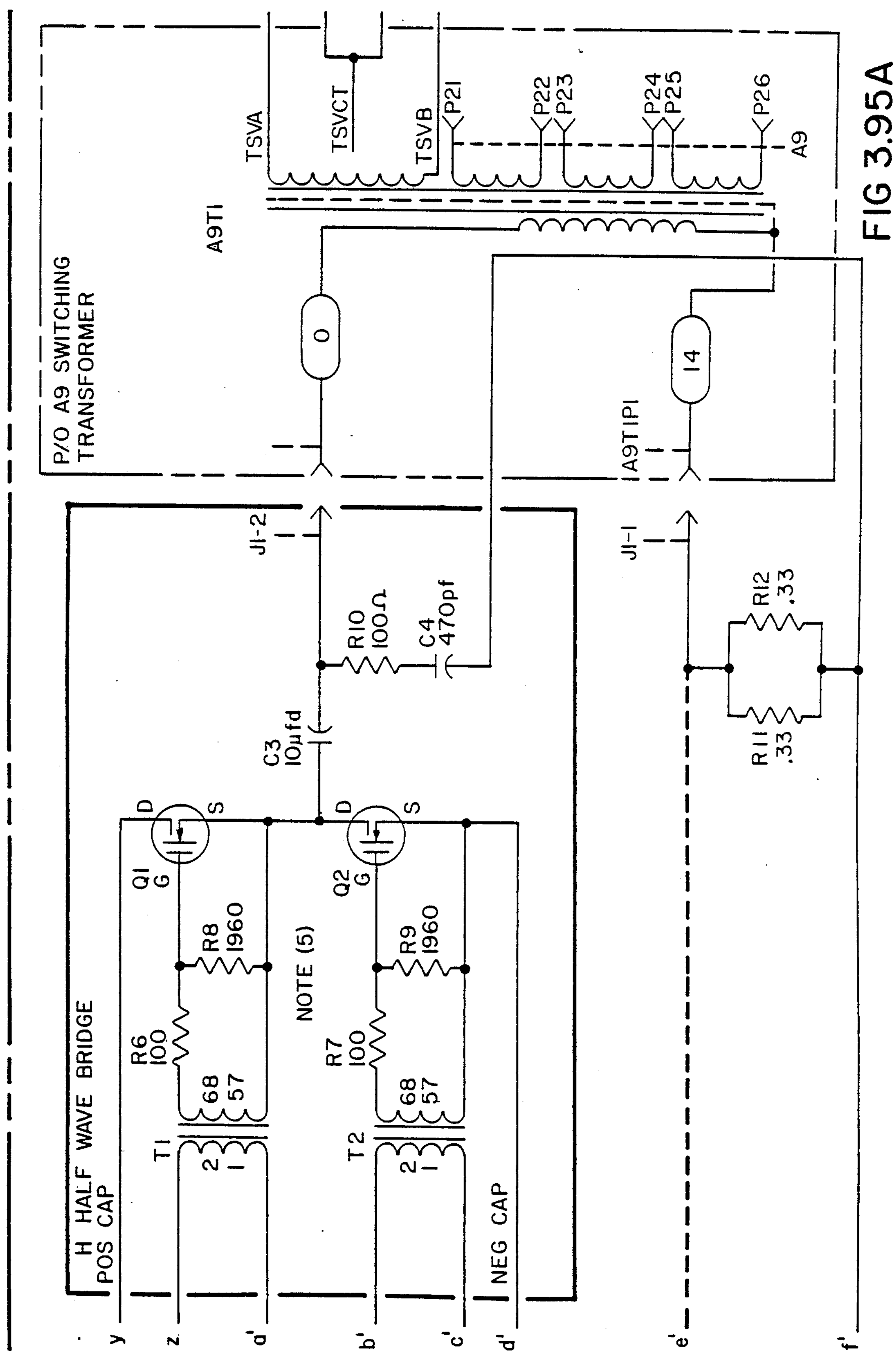
FIG 3.95A

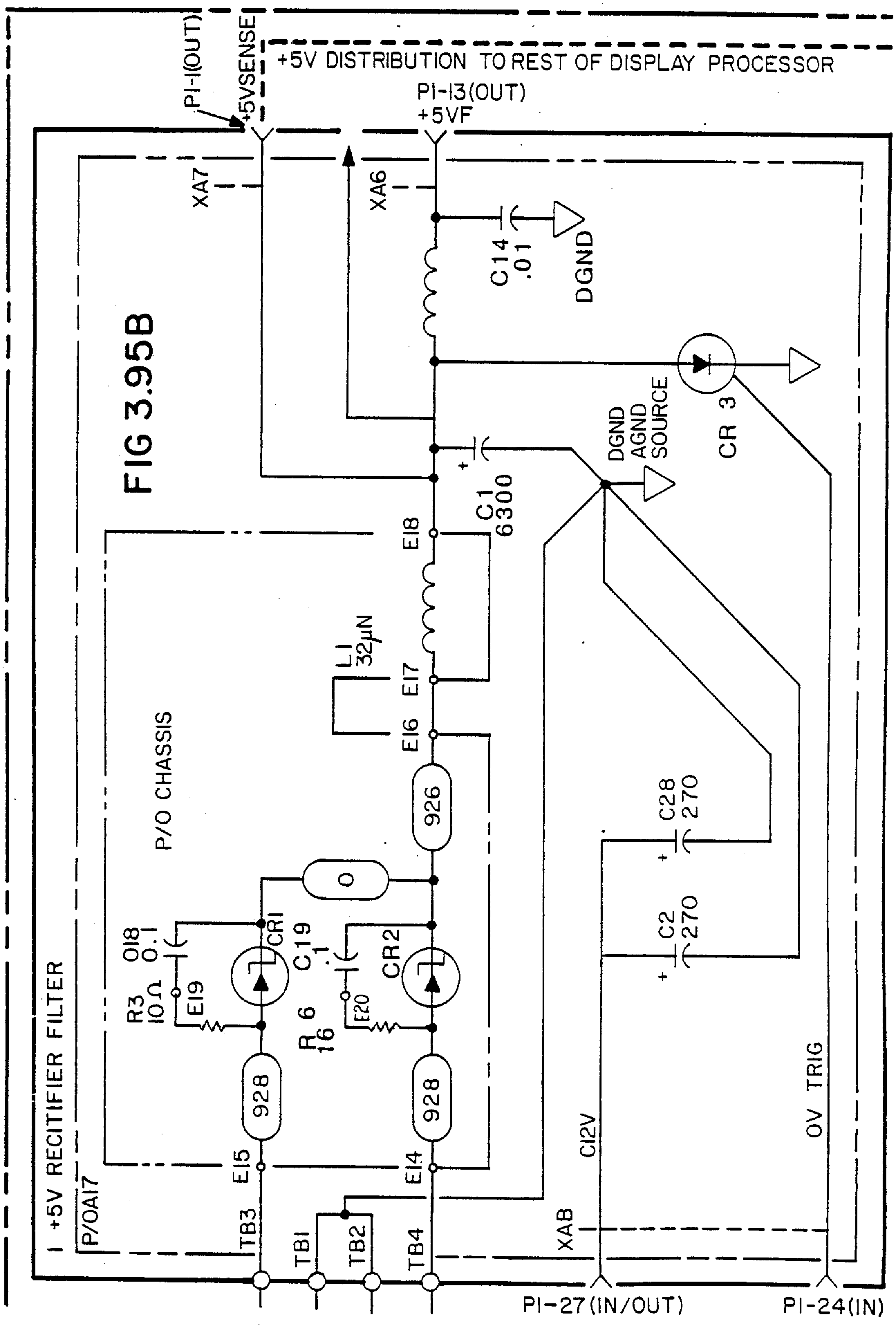
FIG 3.95B

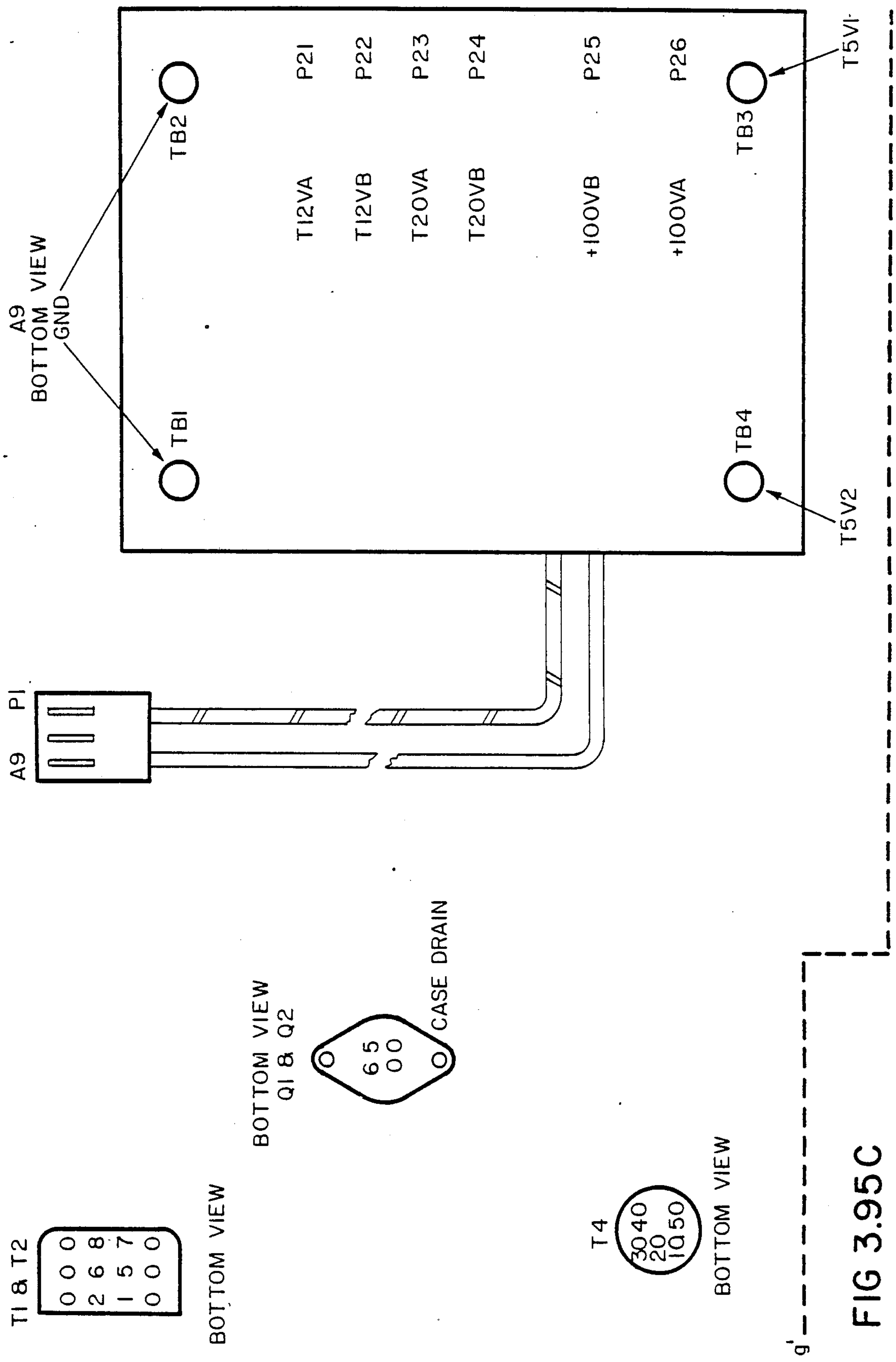
FIG 3.95C

RESISTANCE VALUES SHOWN ARE IN OHMS, CAPACITANCE IN MICROFARADS, AND INDUCTANCE IN MICROHENRIES UNLESS OTHERWISE NOTED.

PLUS AND MINUS 165 VOLTS DC AND LINE VOLTAGE ARE PRESENT WHENEVER THE POWER CABLE IS PLUGGED IN AND TURNED ON :

THERE IS NO GROUND TEST POINT ON THIS BOARD. OSCILLOSCOPE MEASUREMENT SHOULD BE MADE USING "A–B" DIFFERENTIAL MEASUREMENTS, "A" CHANNEL IS THE INPUT AND "B" CHANNEL IS CONNECTED TO TP1 ( AC PRIMARY RETURN ).

THE GATES OF Q1 AND Q2 CANNOUT BE MEASURED WITH AN OSCILLOSCOPE PROBE. MEASURE GATE DRIVE AT TP2 AND TP4. REPLACE Q1 AND Q2 AT THE SAME TIME .

FOR 115V LINE OPERATION CR5–CR7 ACT AS A VOLTAGE DOUBLER.
FOR 230V LINE OPERATION CR4–CR7 ACT AS A FULL WAVE RECTIFIER.

FIG 3.95D

FIG 3.97A
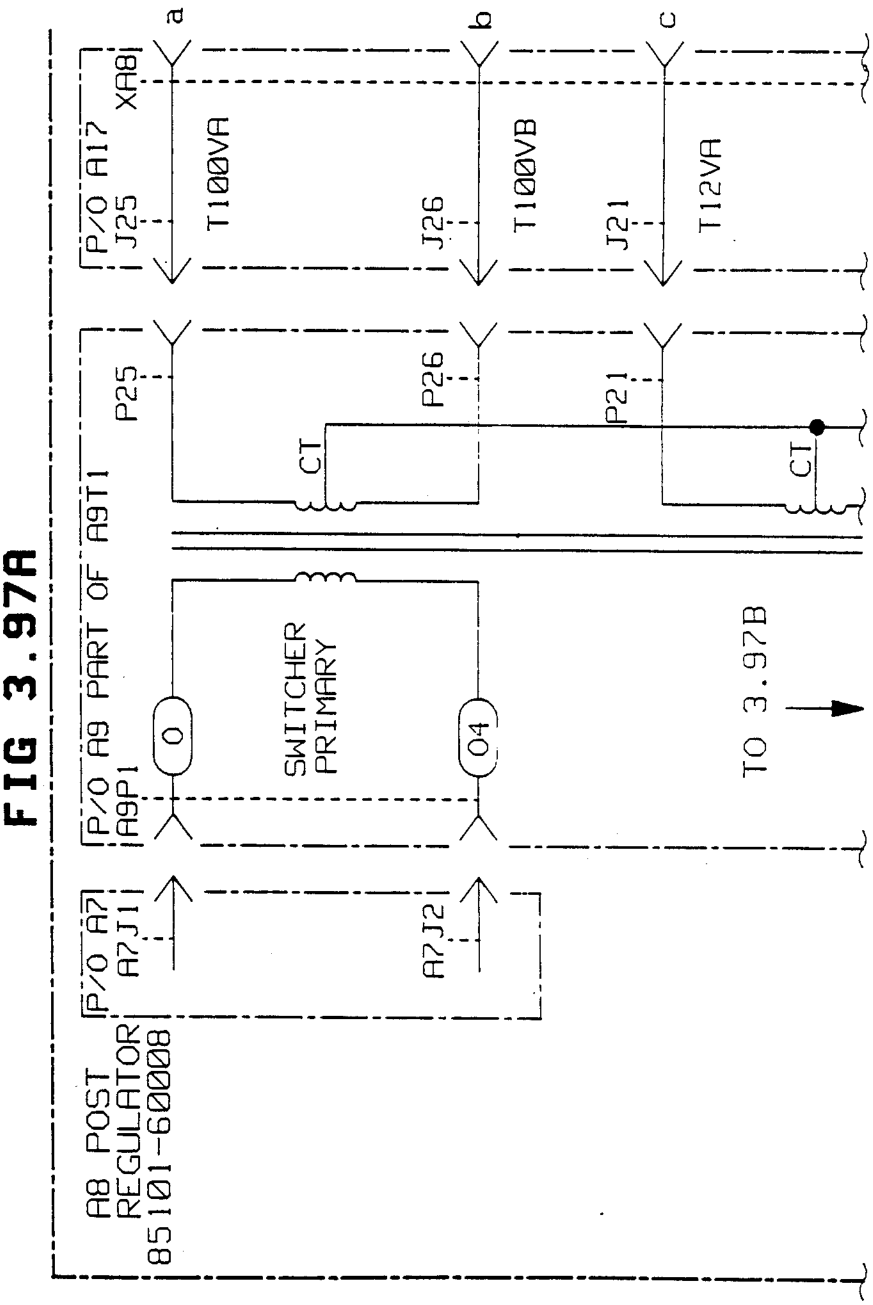

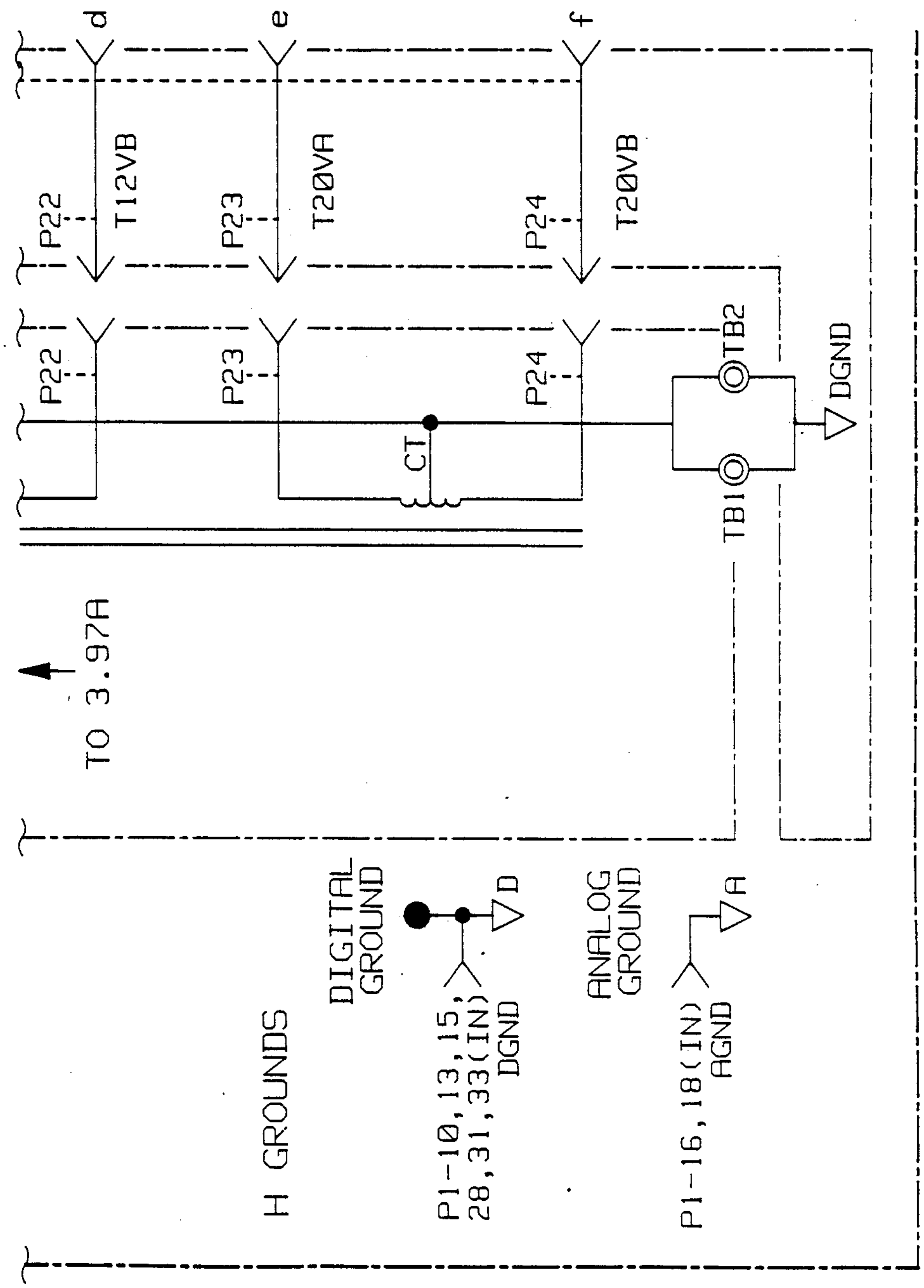
FIG 3.97B

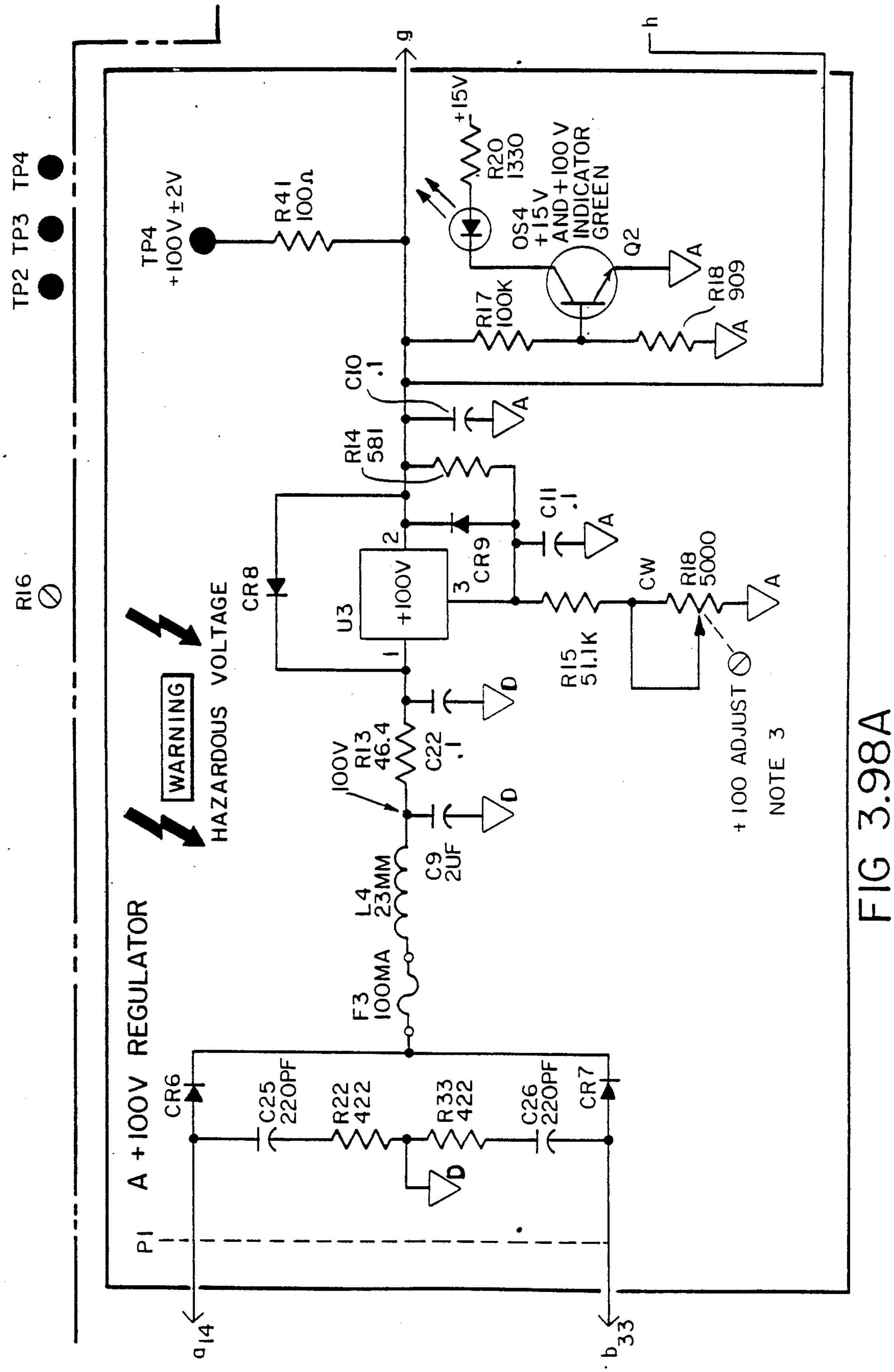
FIG 3.98A

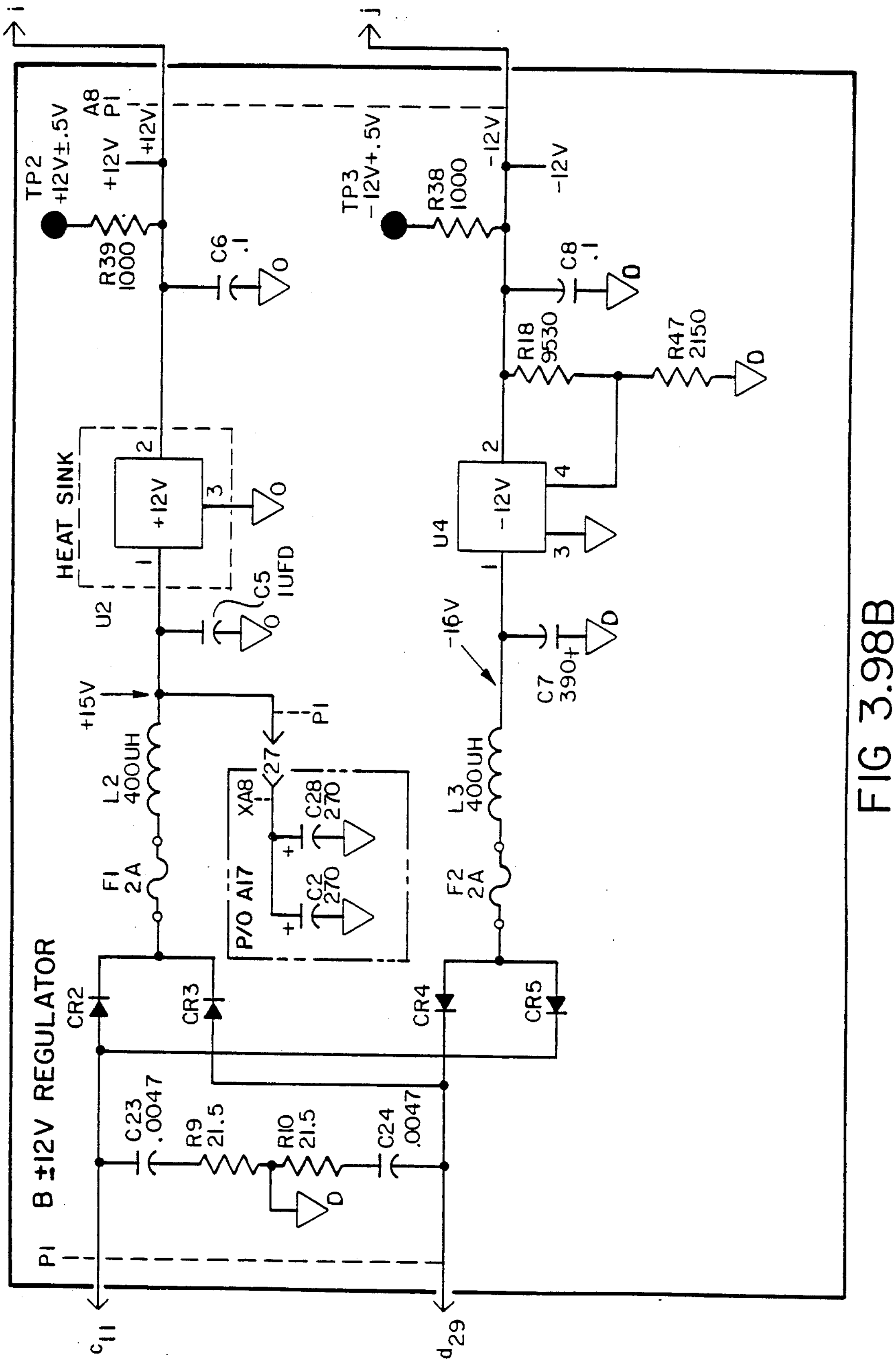
FIG 3.98B

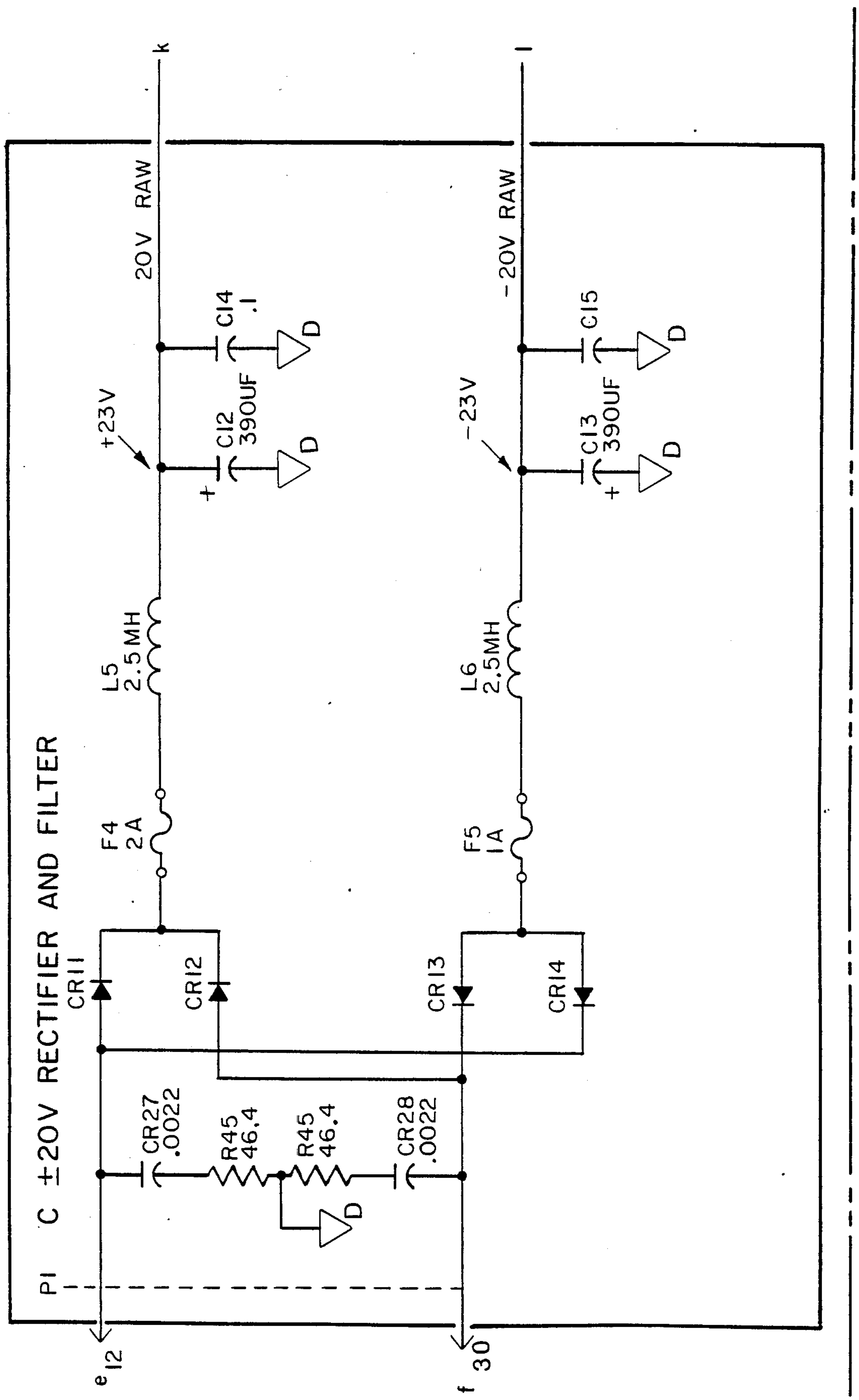
FIG 3.98C

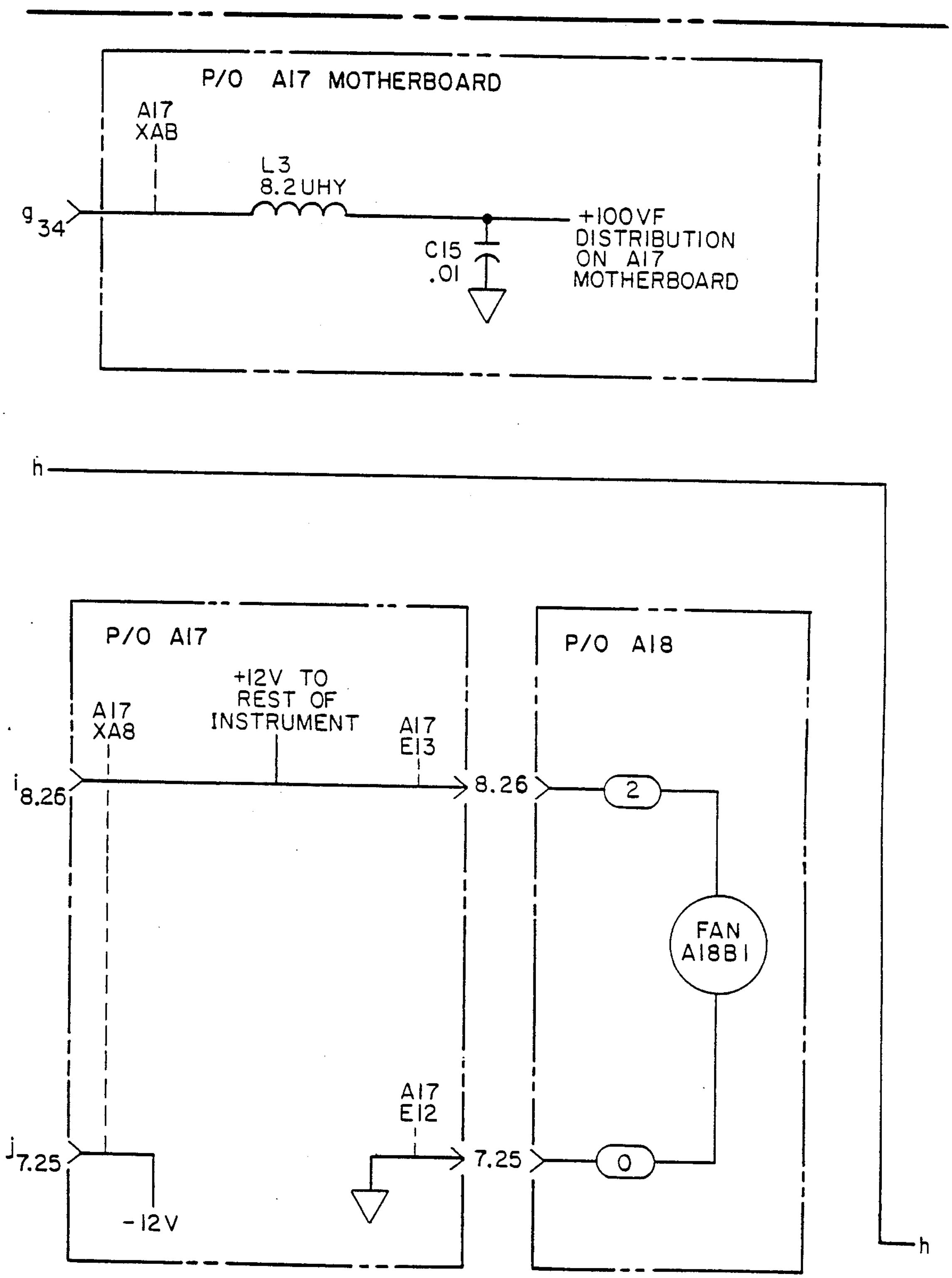
FIG 3.99A

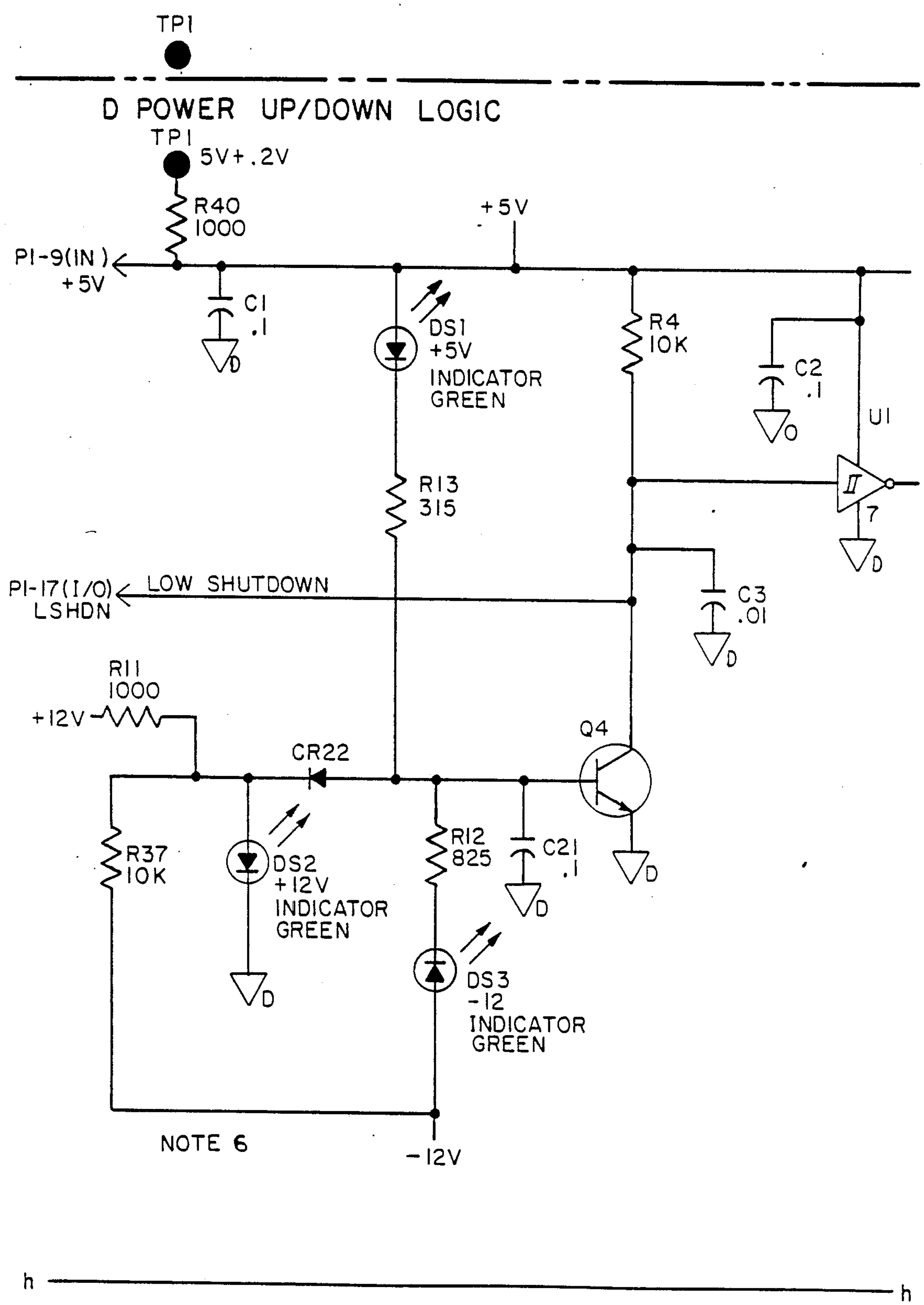
FIG. 3.99B

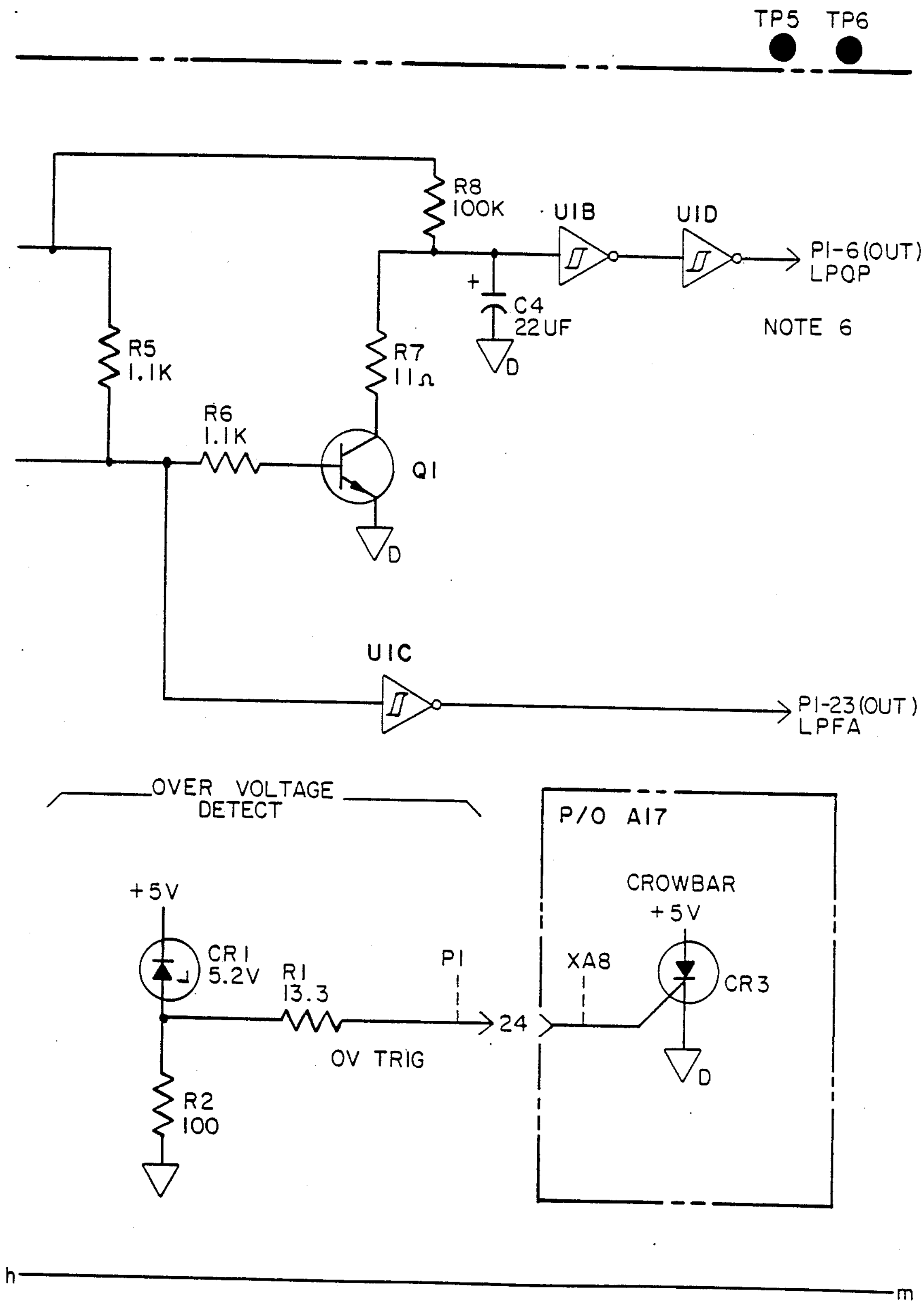
FIG. 3.99C

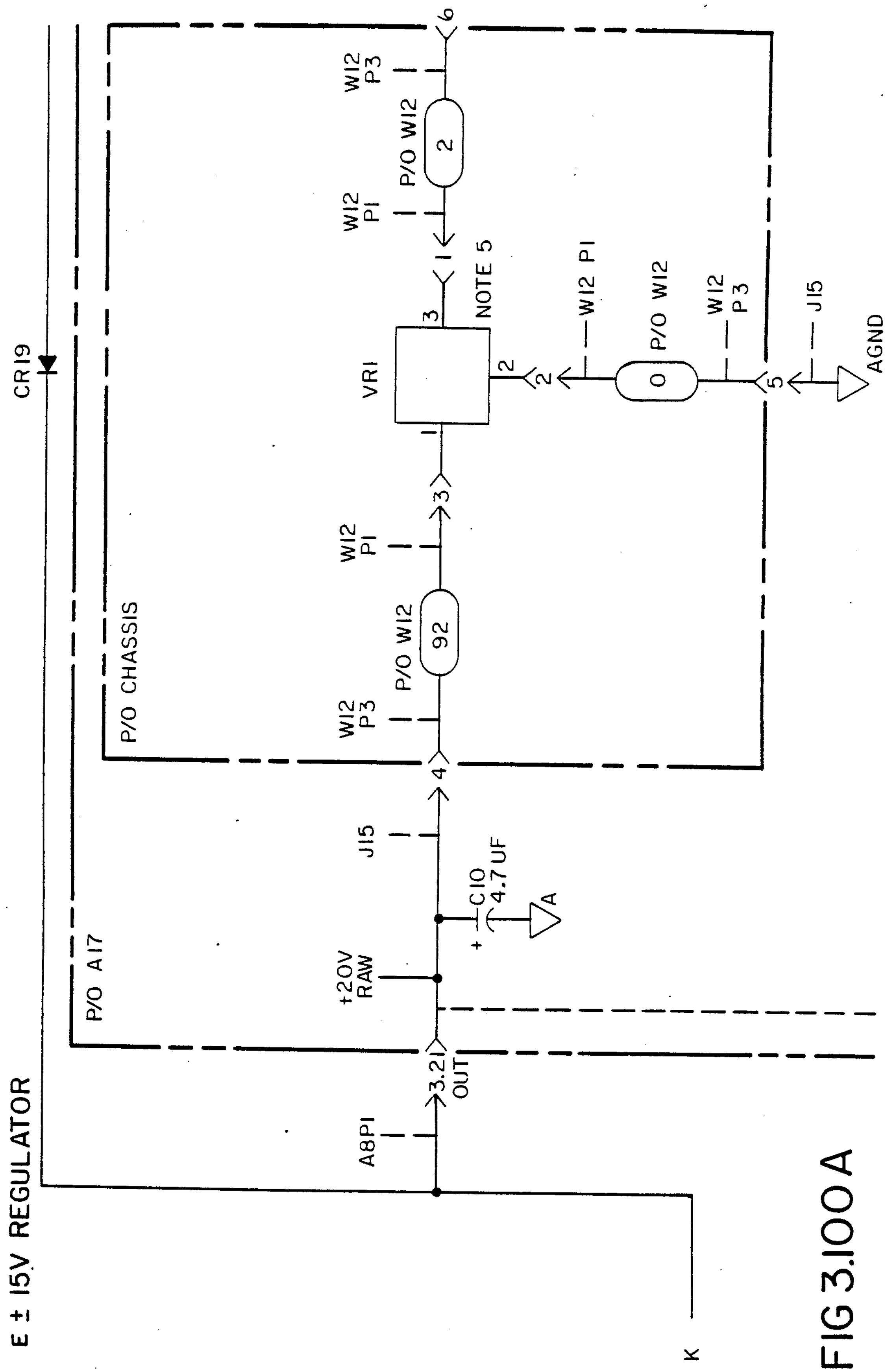
FIG 3.100A

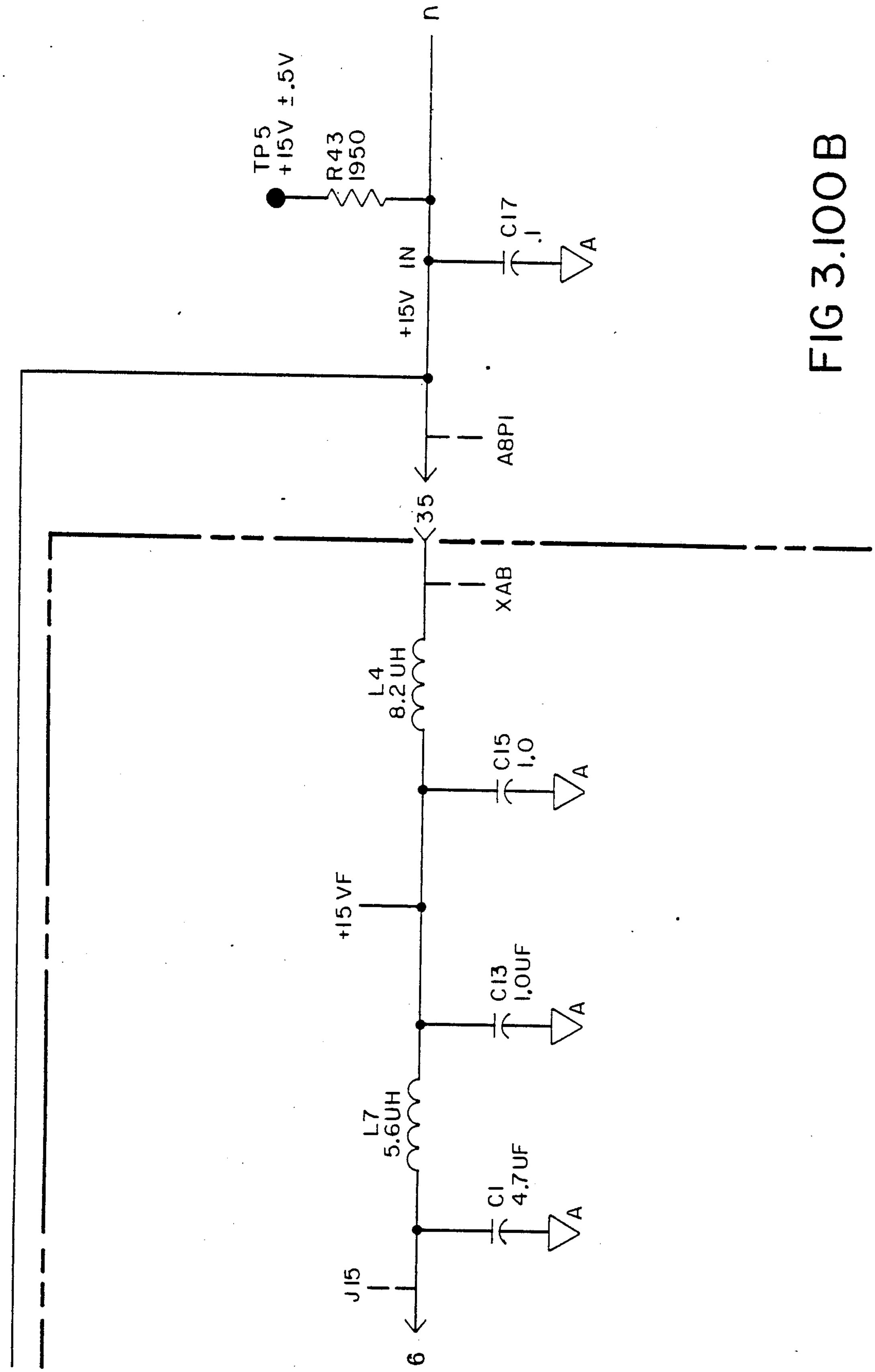
FIG 3.100 B

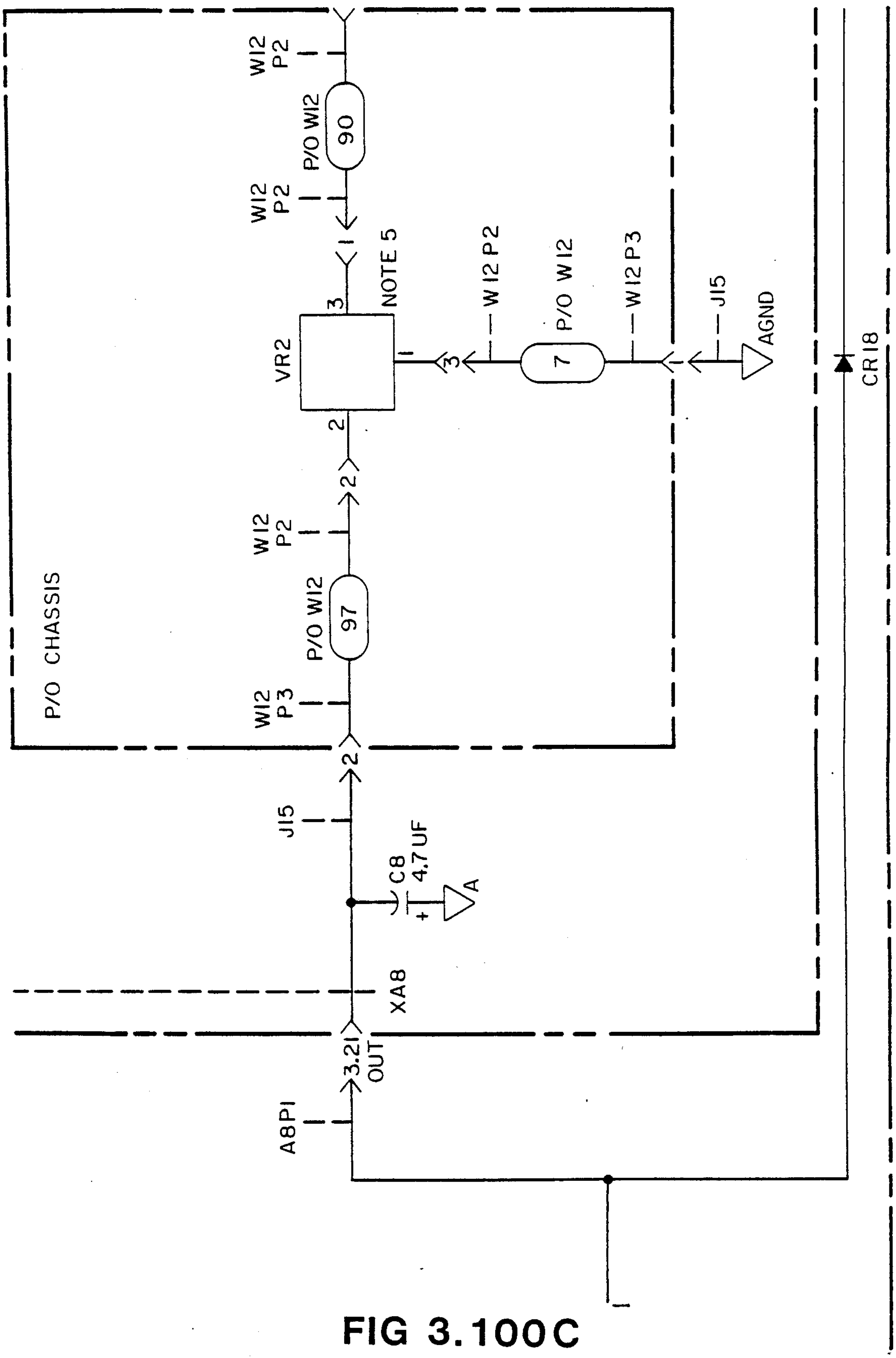
FIG 3.100C

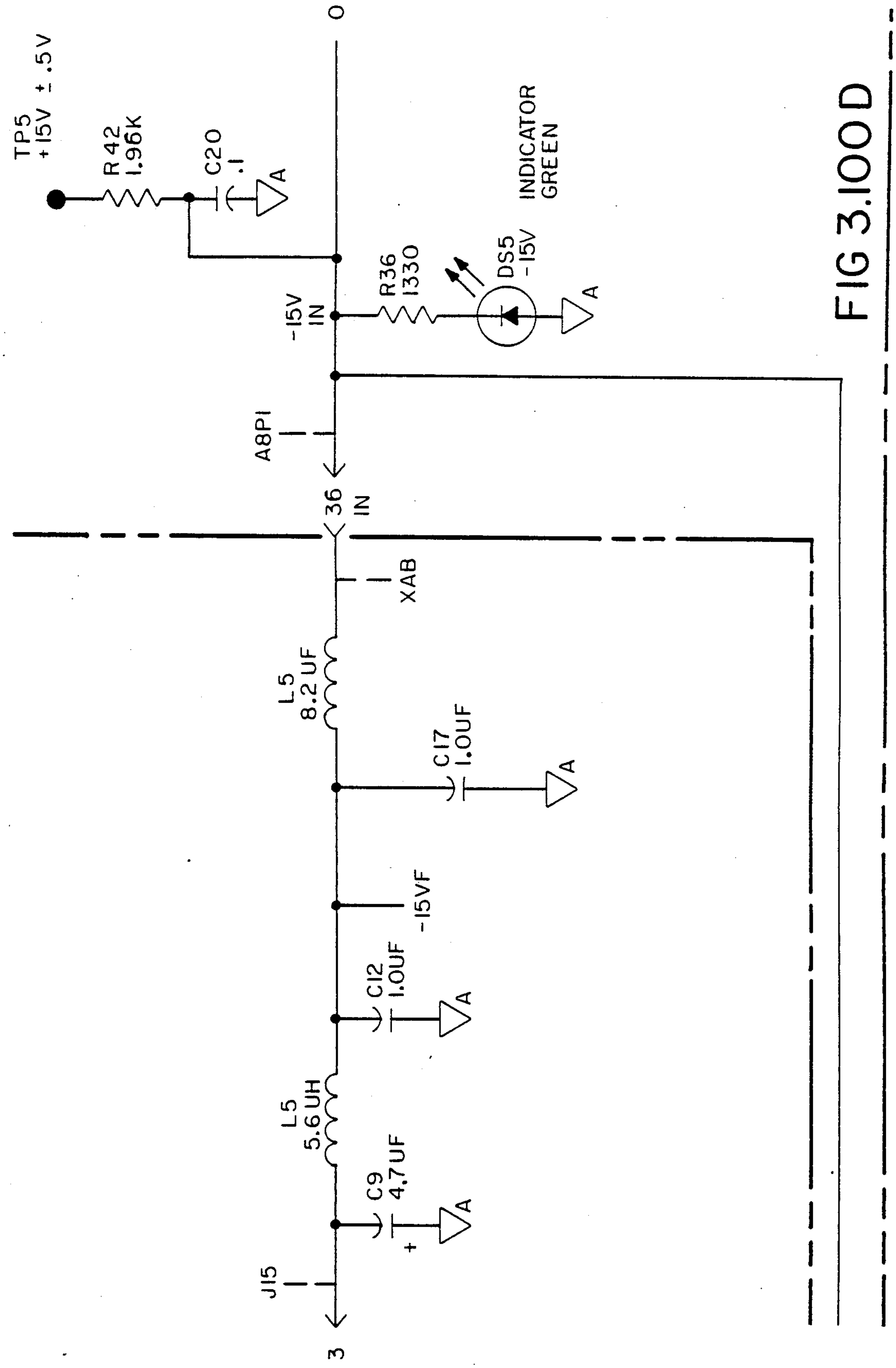
FIG 3.100D

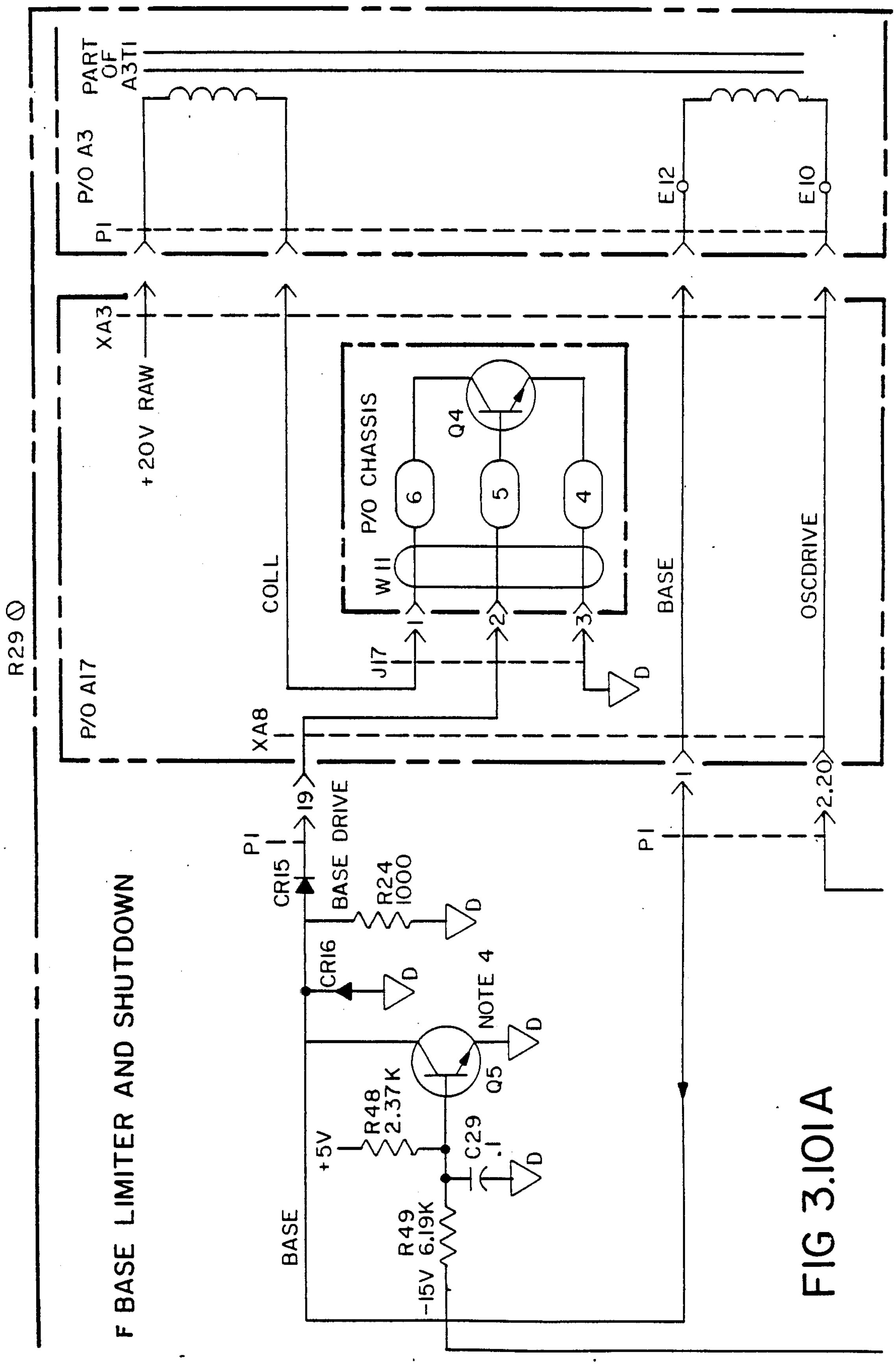
FIG 3.101A

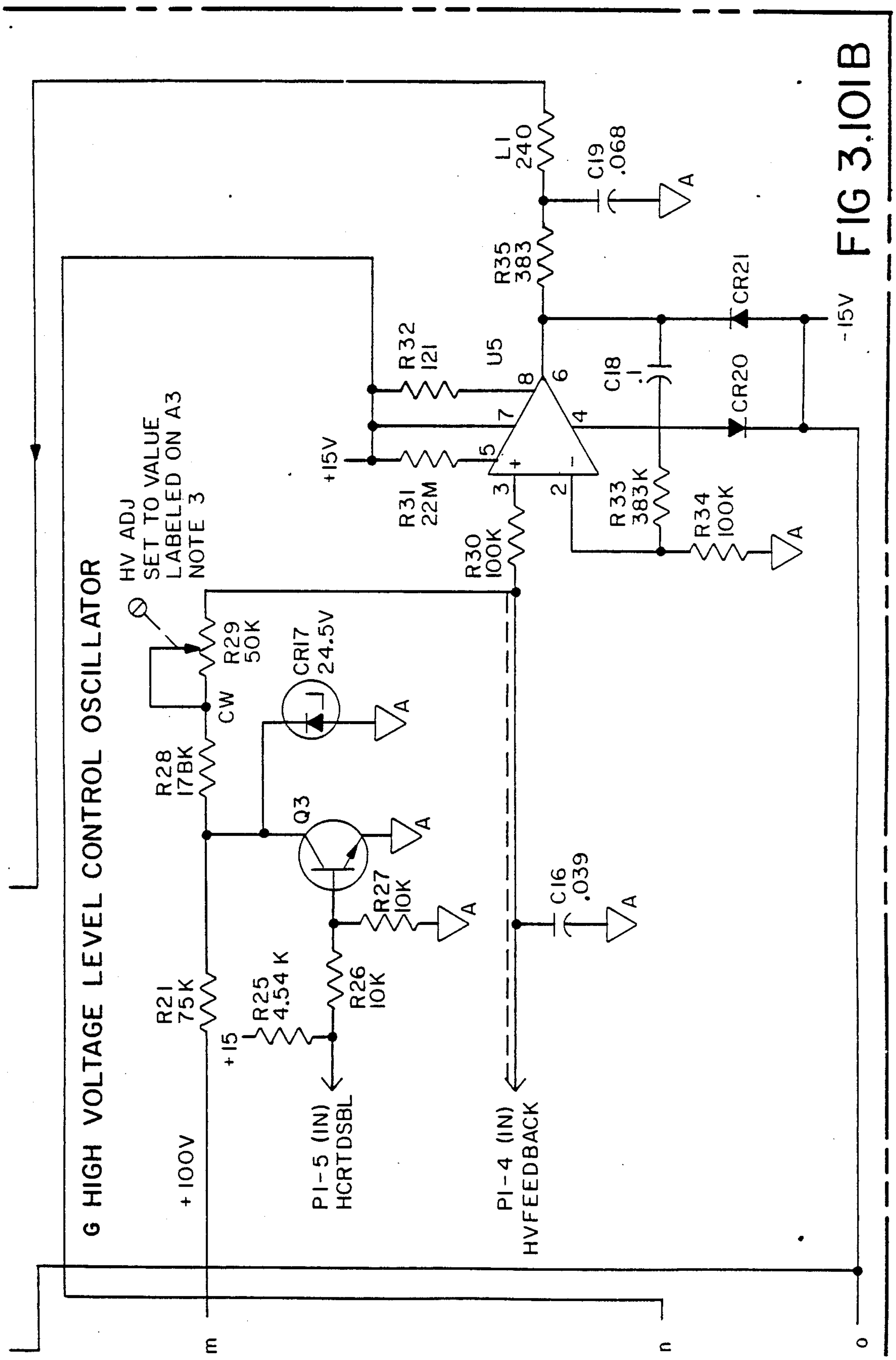
FIG 3.101B

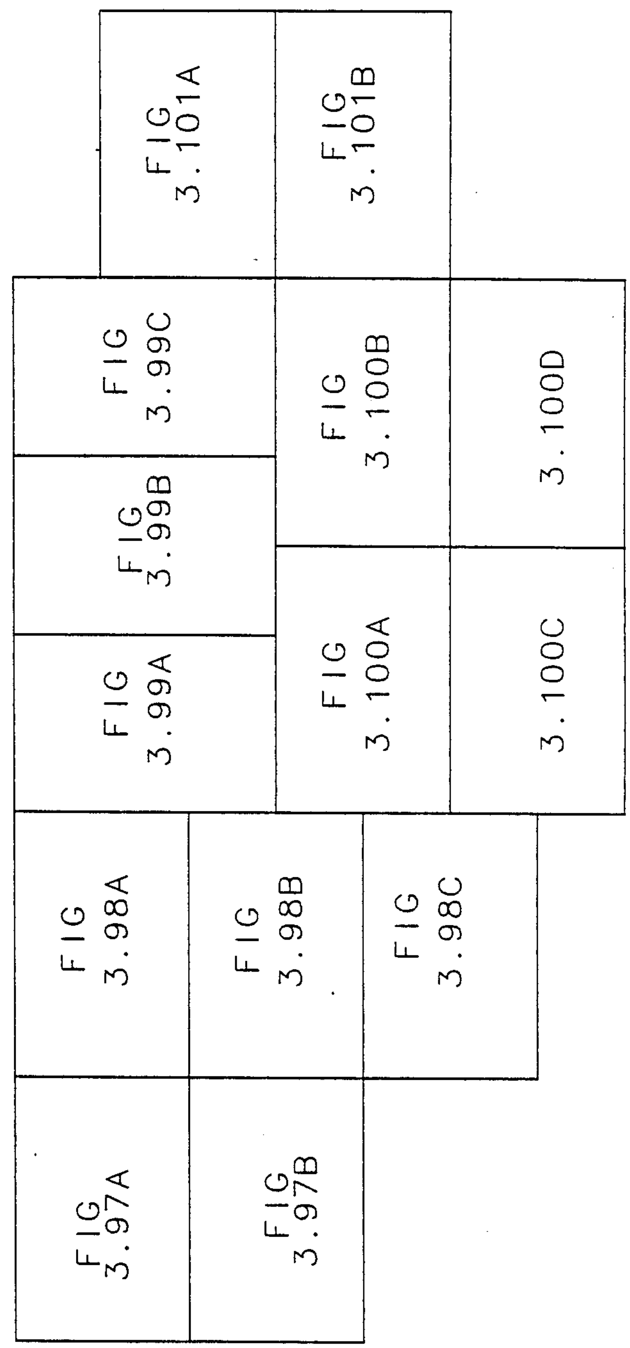
FIG 3.102

8511A/8512A/8513A INTERCONNECTION
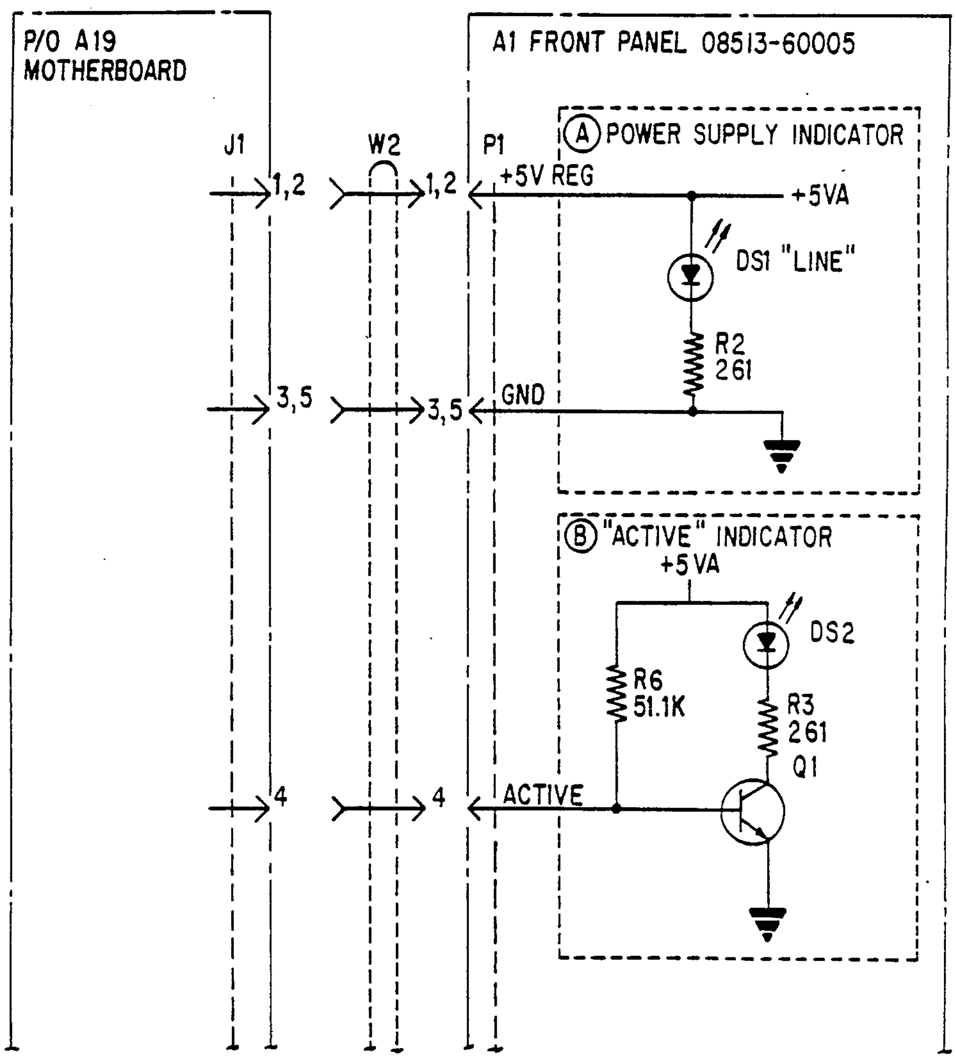
FIG. 24.1A

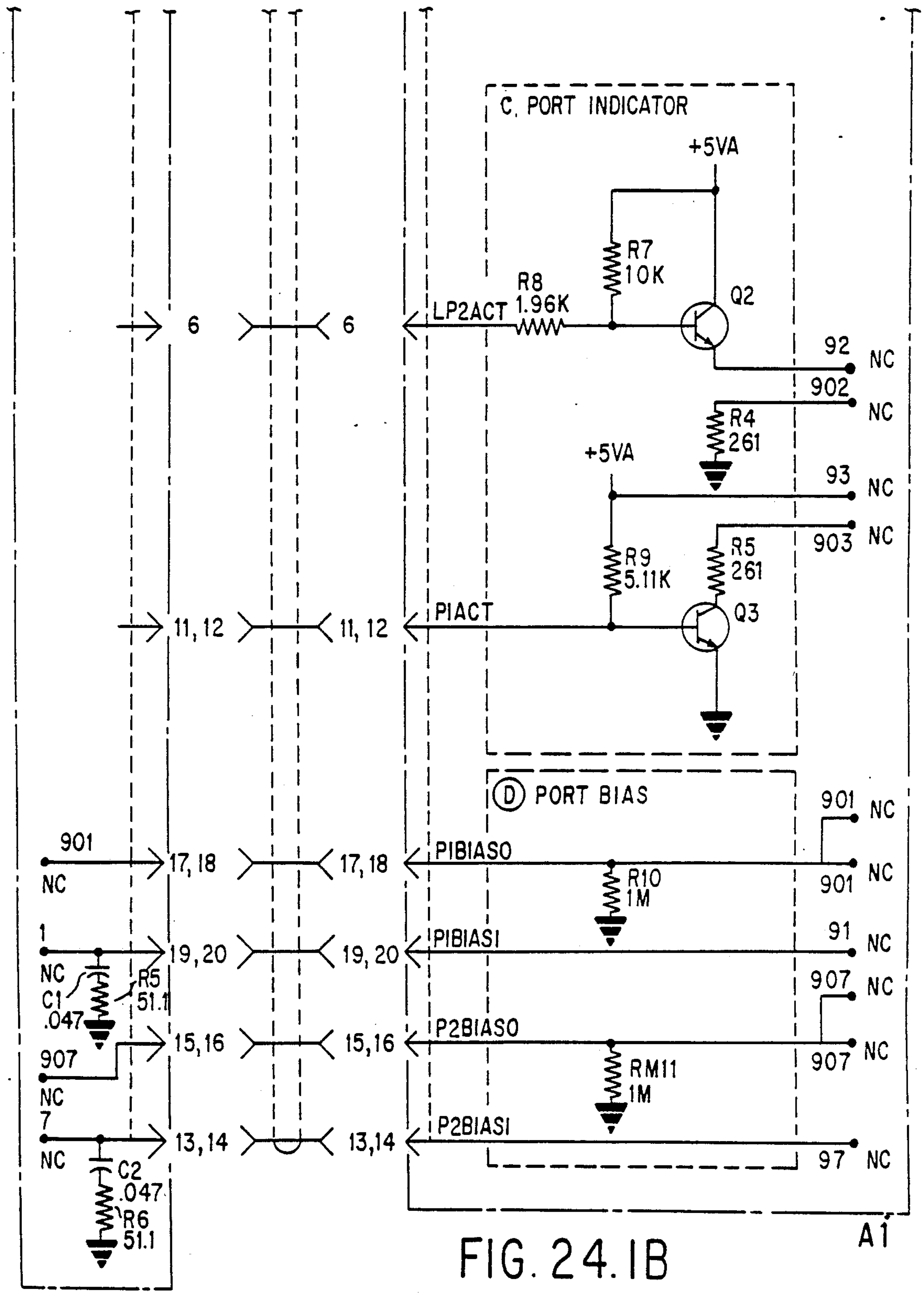
FIG. 24.1B

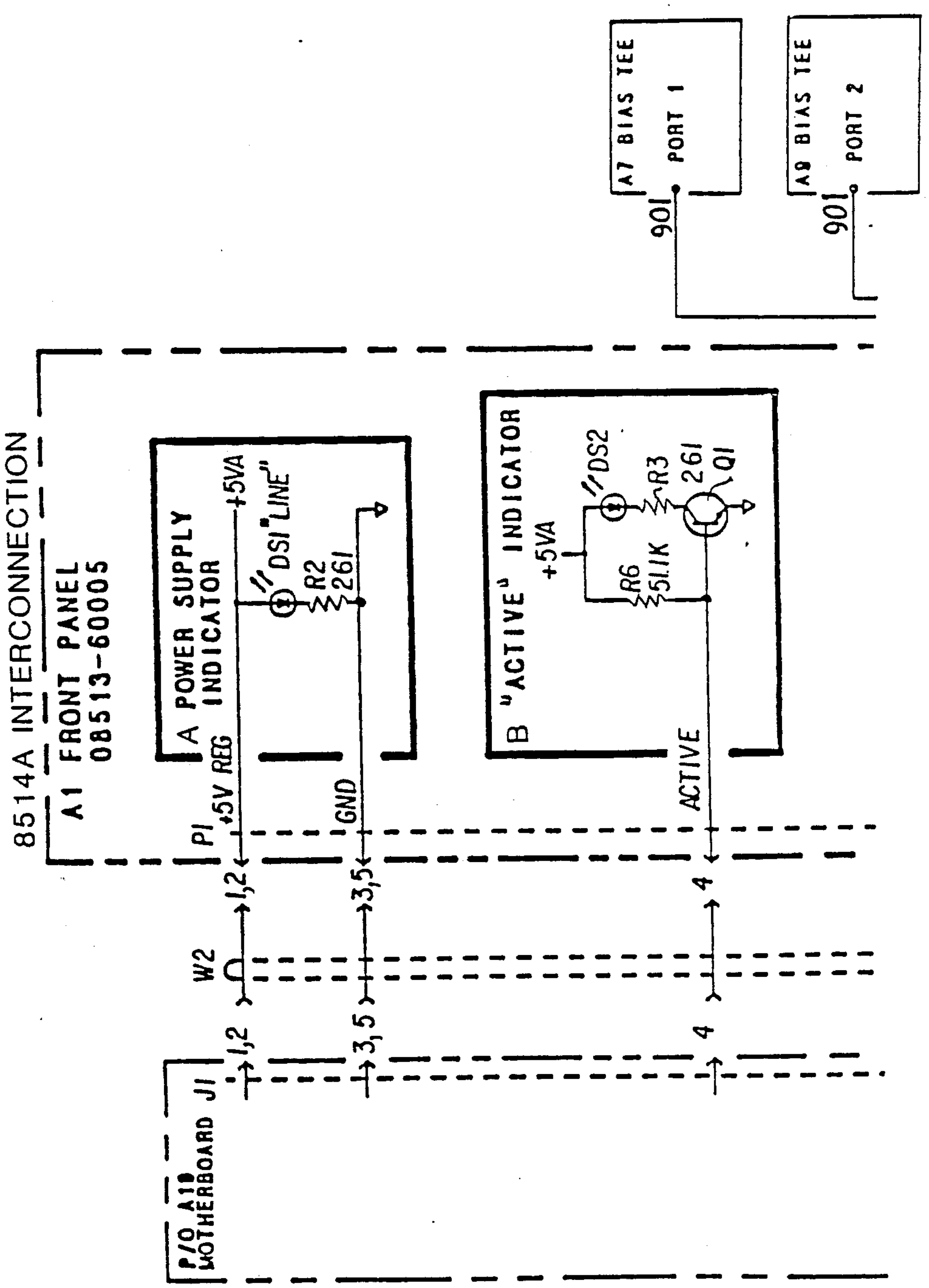
FIG 24.2A

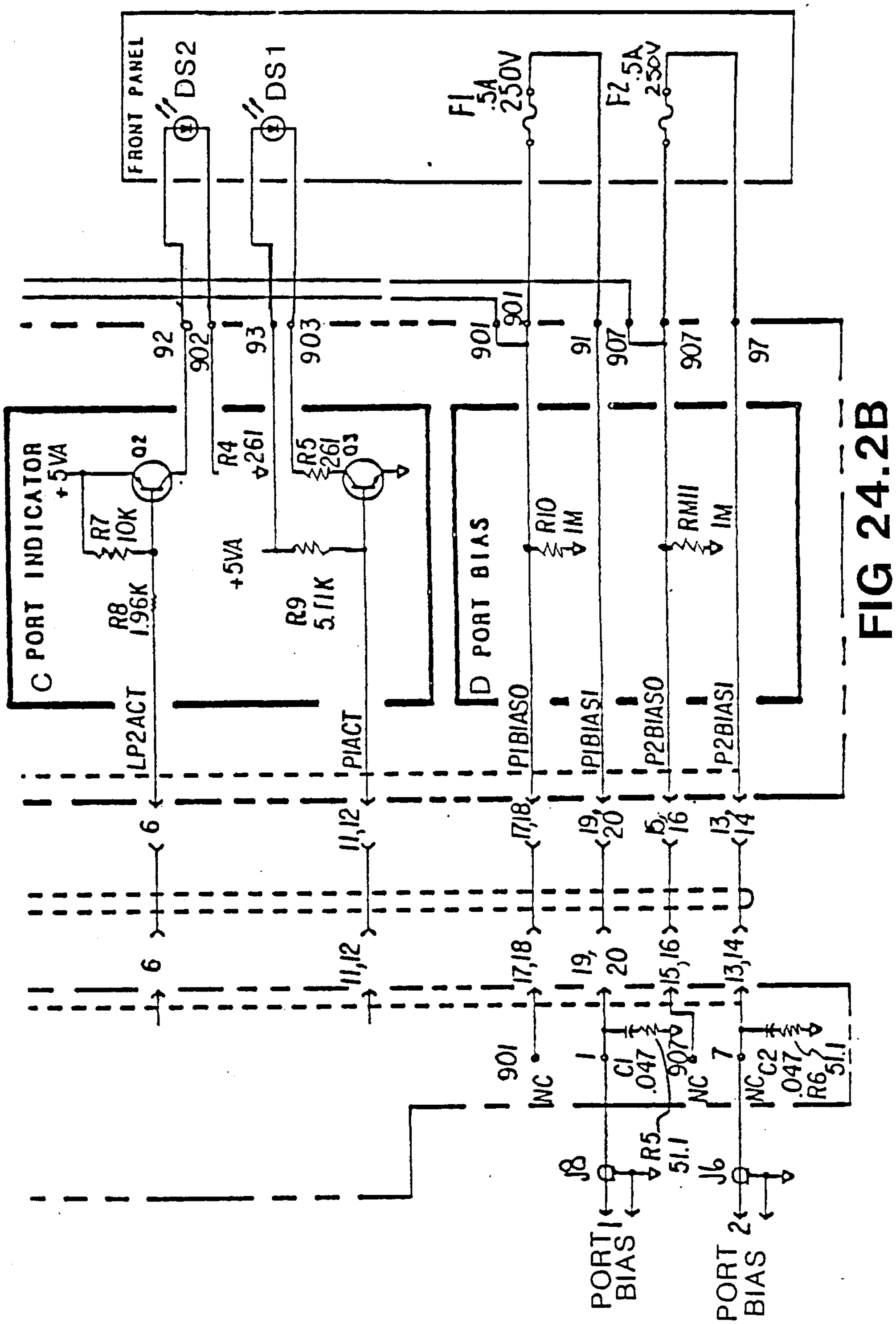
FIG 24.2B

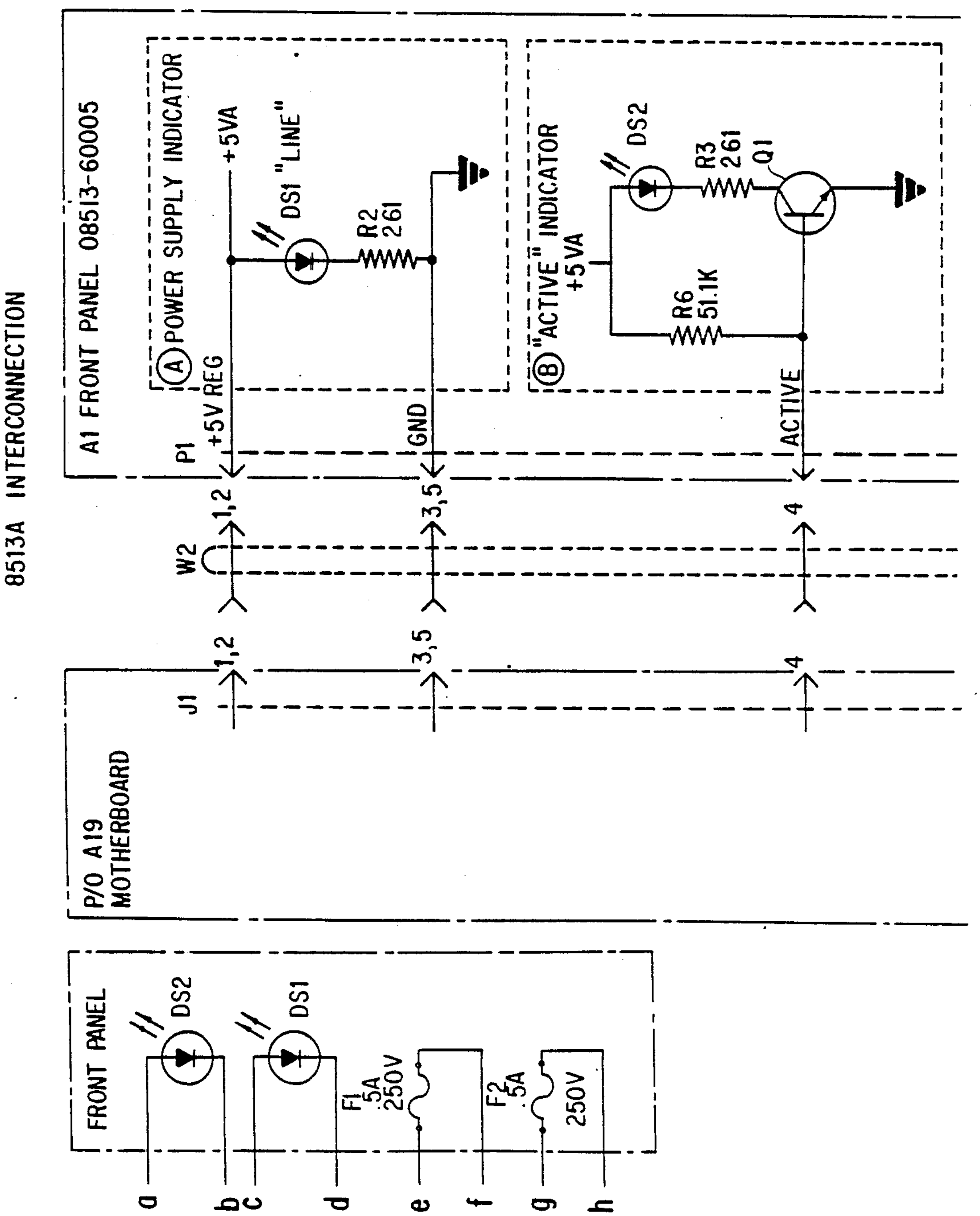
FIG. 24.3A

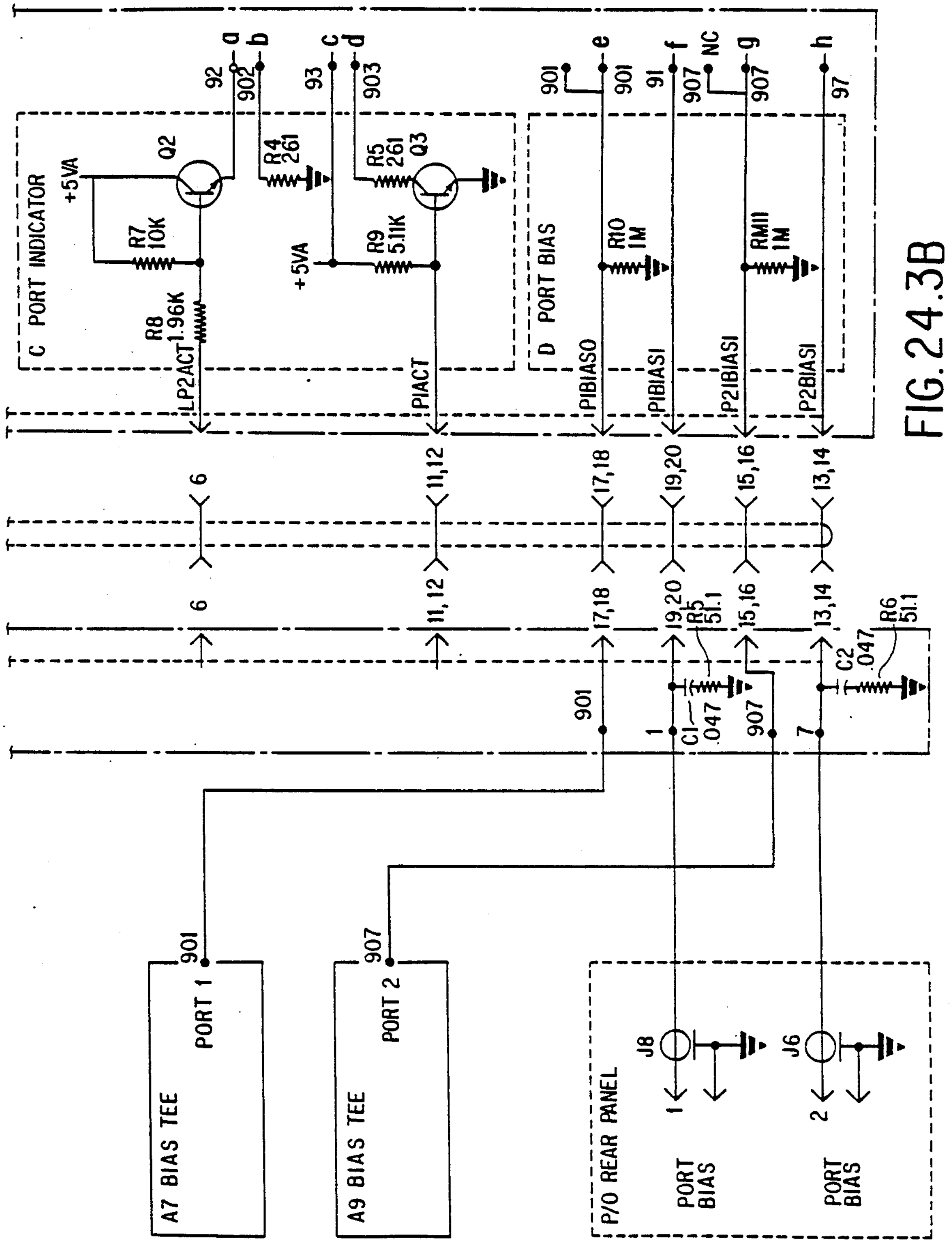
FIG. 24.3B

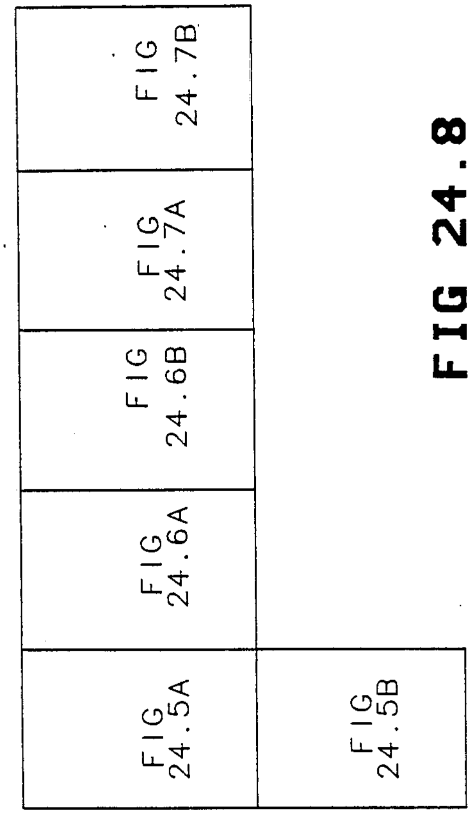
FIG 24.8
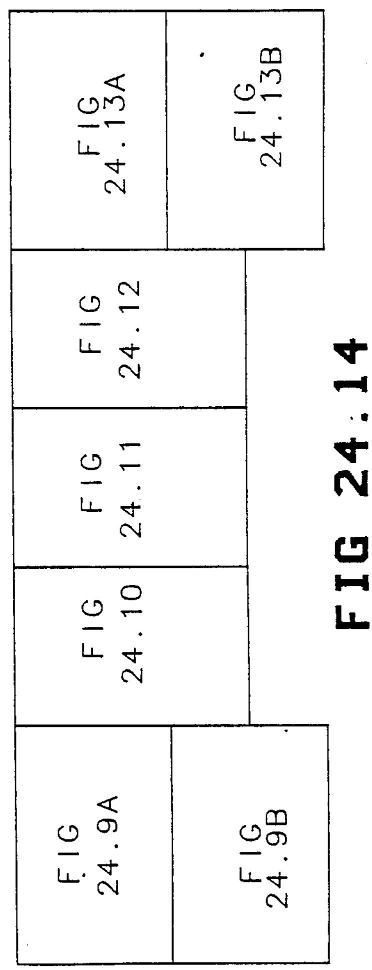
FIG 24.14
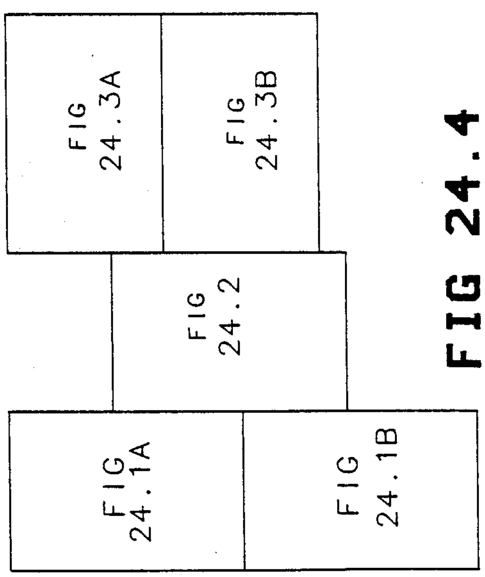
FIG 24.4

FIG. 24.5A

| PIN | SIGNAL | TO/FROM | FUNCTION BLOCK |
|---|---|---|---|
| 1<br>23 | | | |
| 2<br>24 | IF1<br>IF2 | NC<br>NC | B |
| 3<br>25 | | | |
| 4<br>26 | | | |
| 5<br>27 | LBIOS | A4 | A |
| 6<br>28 | PNON | A15 | B |
| 7<br>29 | AB0 | A4 | A |
| 8<br>30 | AB1<br>AB2 | A4<br>A4 | A |
| 9<br>31 | AB3<br>AB4 | A4<br>A4 | A |
| 10<br>32 | +15V REG | A15 | G |
| 11<br>33 | GND | GND BUS | G |
| 12<br>34 | GND | GND BUS | G |
| 13<br>35 | -15V REG | A15 | G |
| 14<br>36 | +5V REG | A15 | G |
| 15<br>37 | DB0<br>DB1 | A4<br>A4 | B |
| 16<br>38 | DB2<br>DB3 | A4<br>A4 | B |
| 17<br>39 | | | |
| 18<br>40 | DB6<br>DB7 | A4<br>A4 | B |
| 19<br>41 | | | |
| 20<br>42 | IF NUX | A3 | A |
| 21<br>43 | | | |
| 22<br>44 | | | |

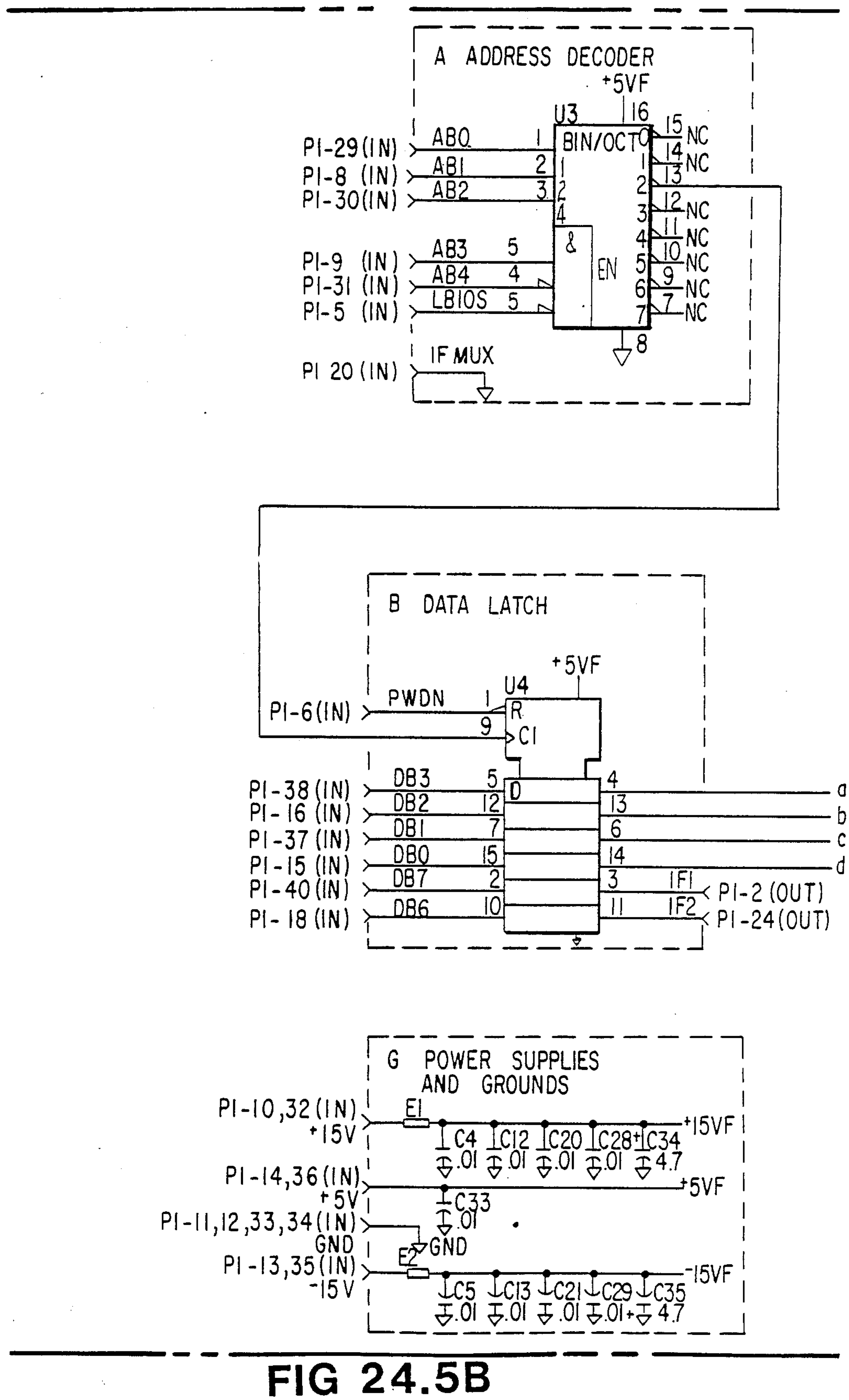
FIG 24.5B

FIG. 24.6A
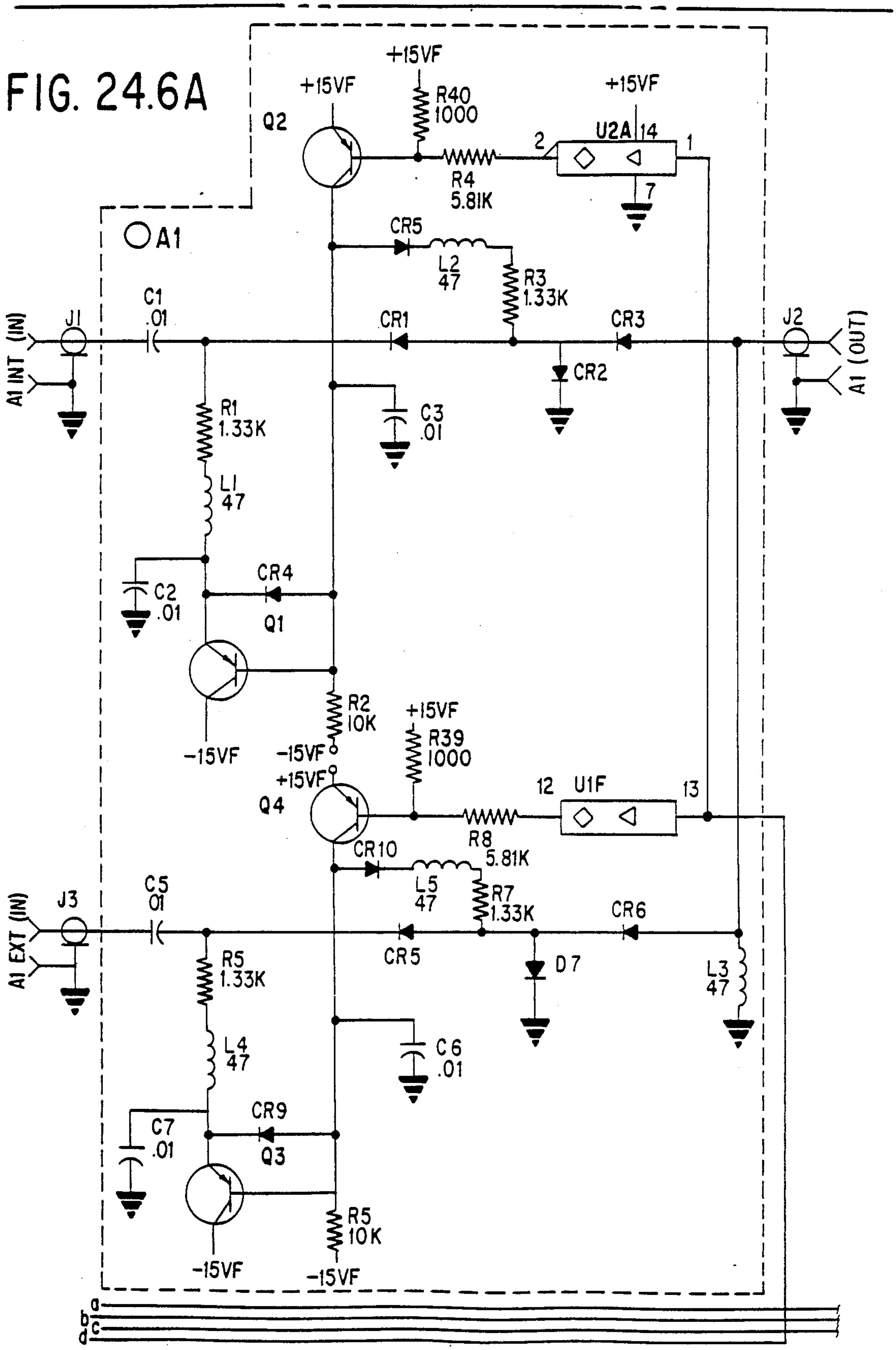

FIG. 24.6B
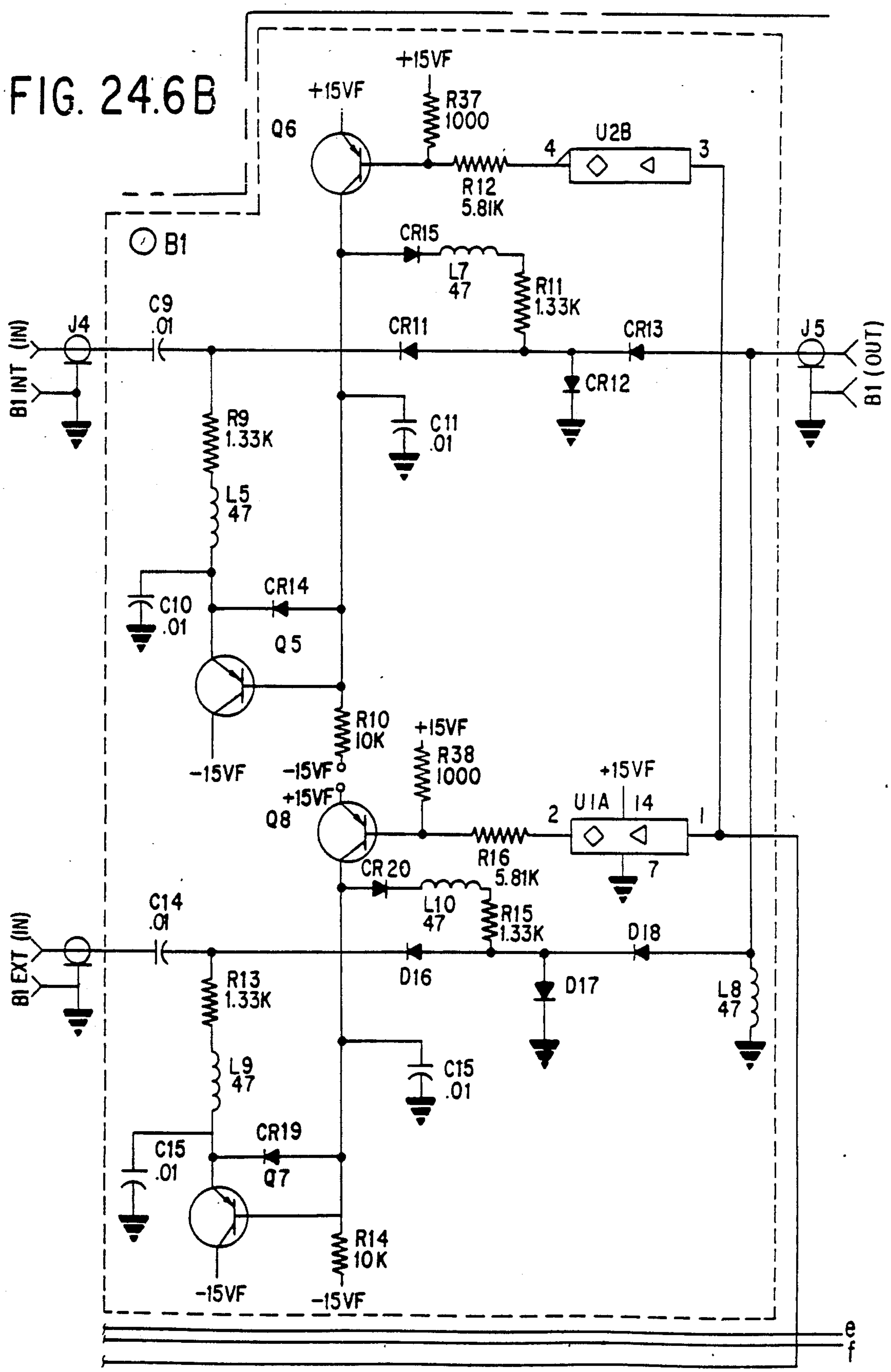

FIG. 24.7A
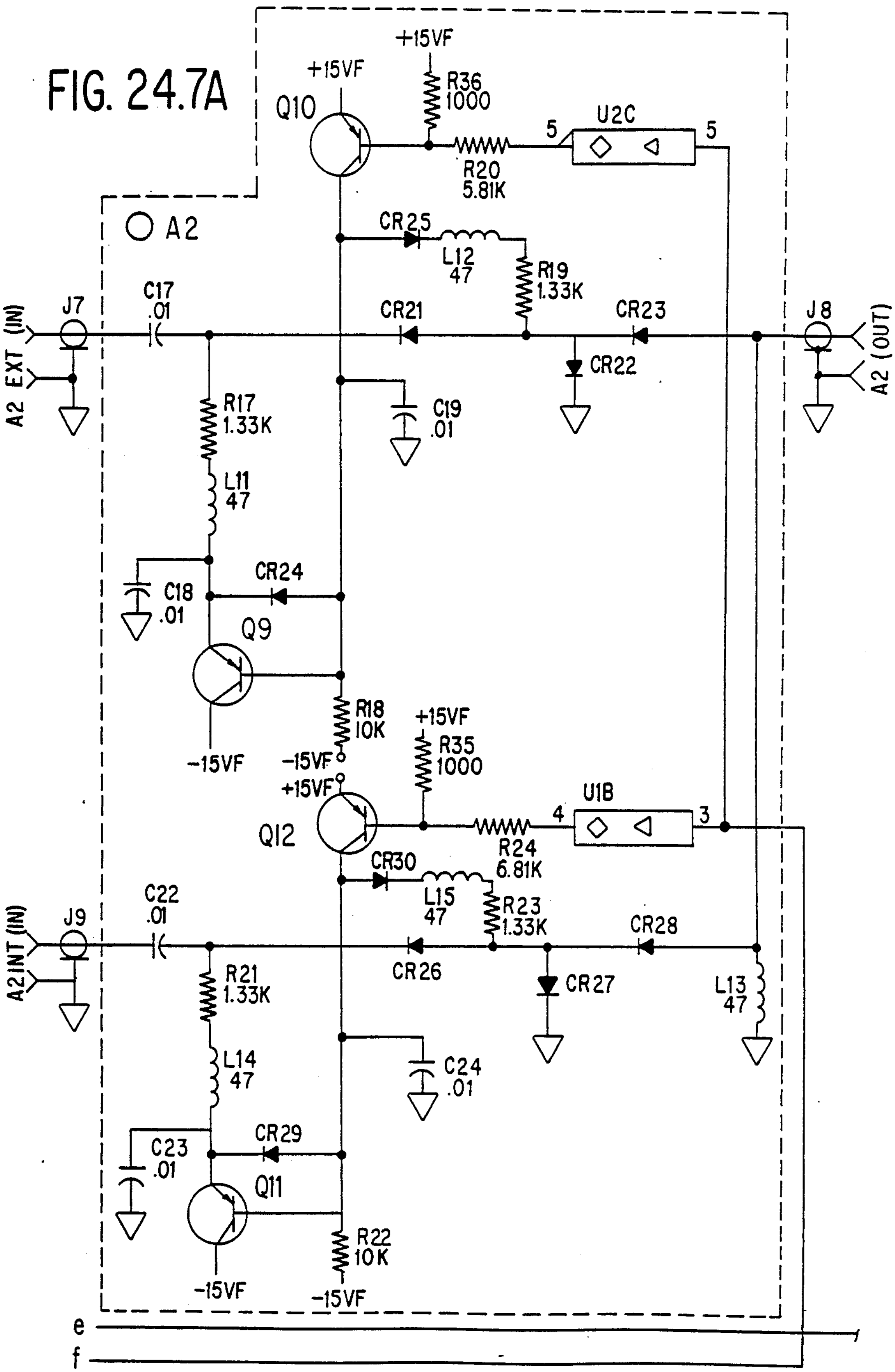

FIG. 24.7B
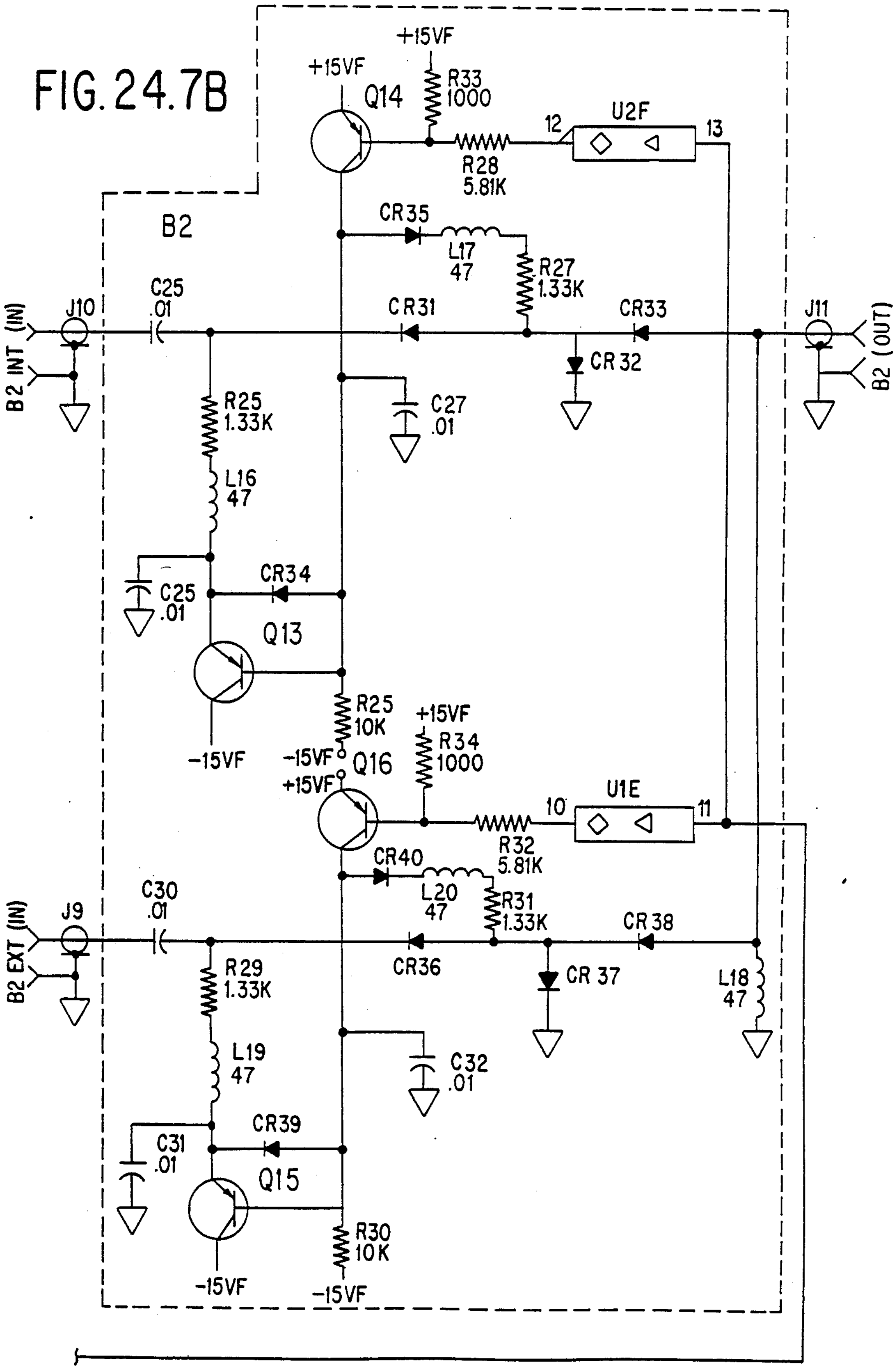

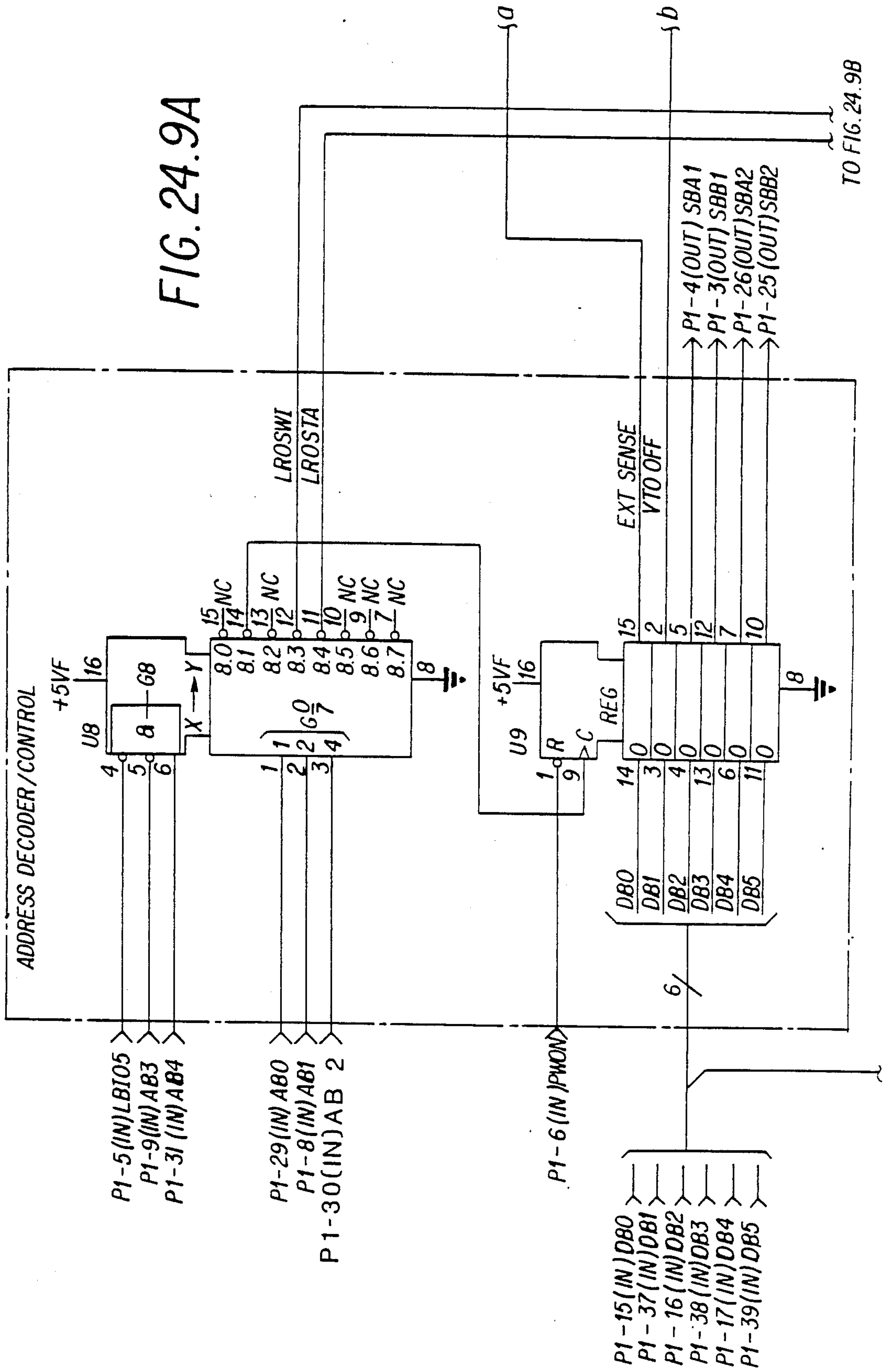
FIG. 24.9A

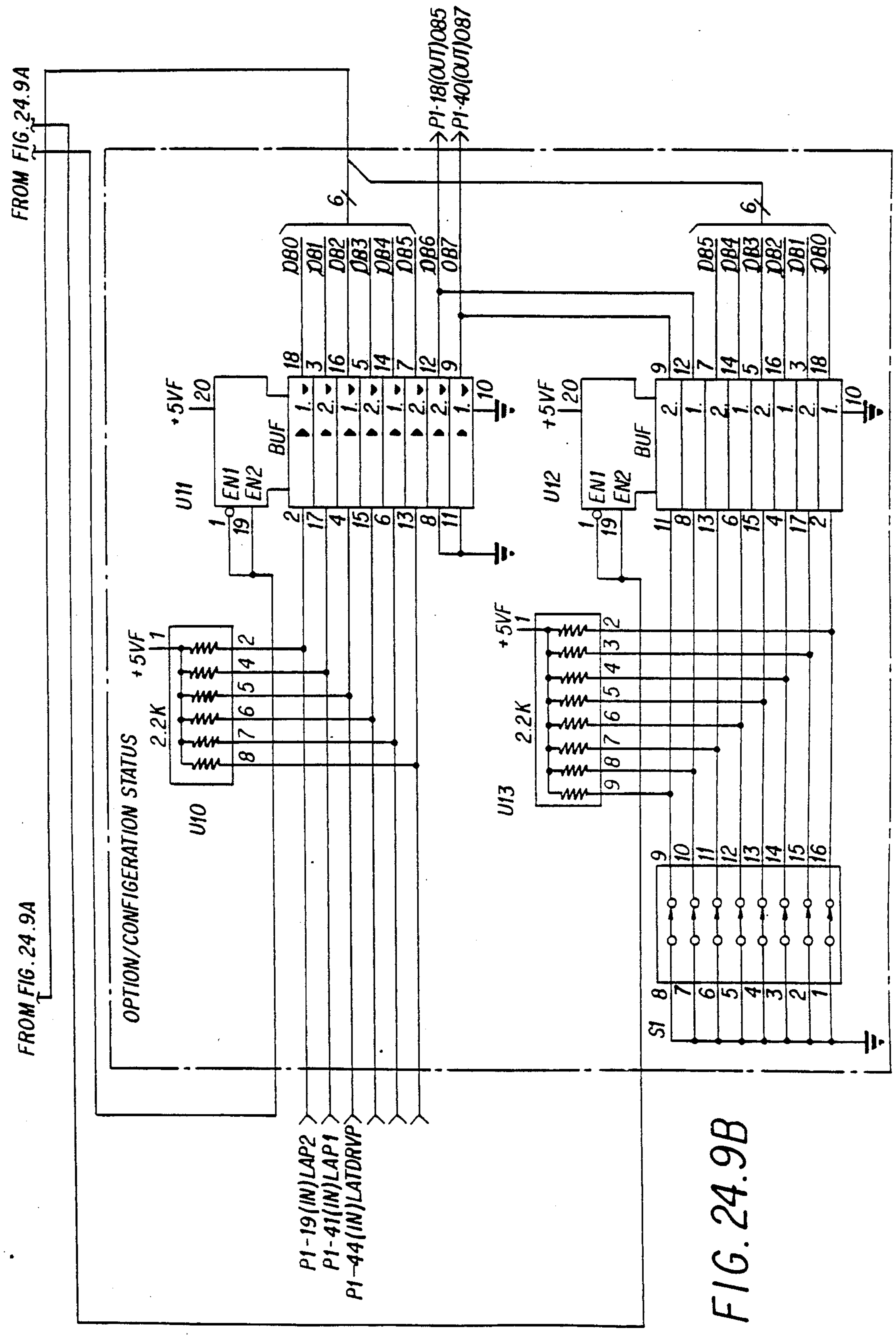
FIG. 24.9B

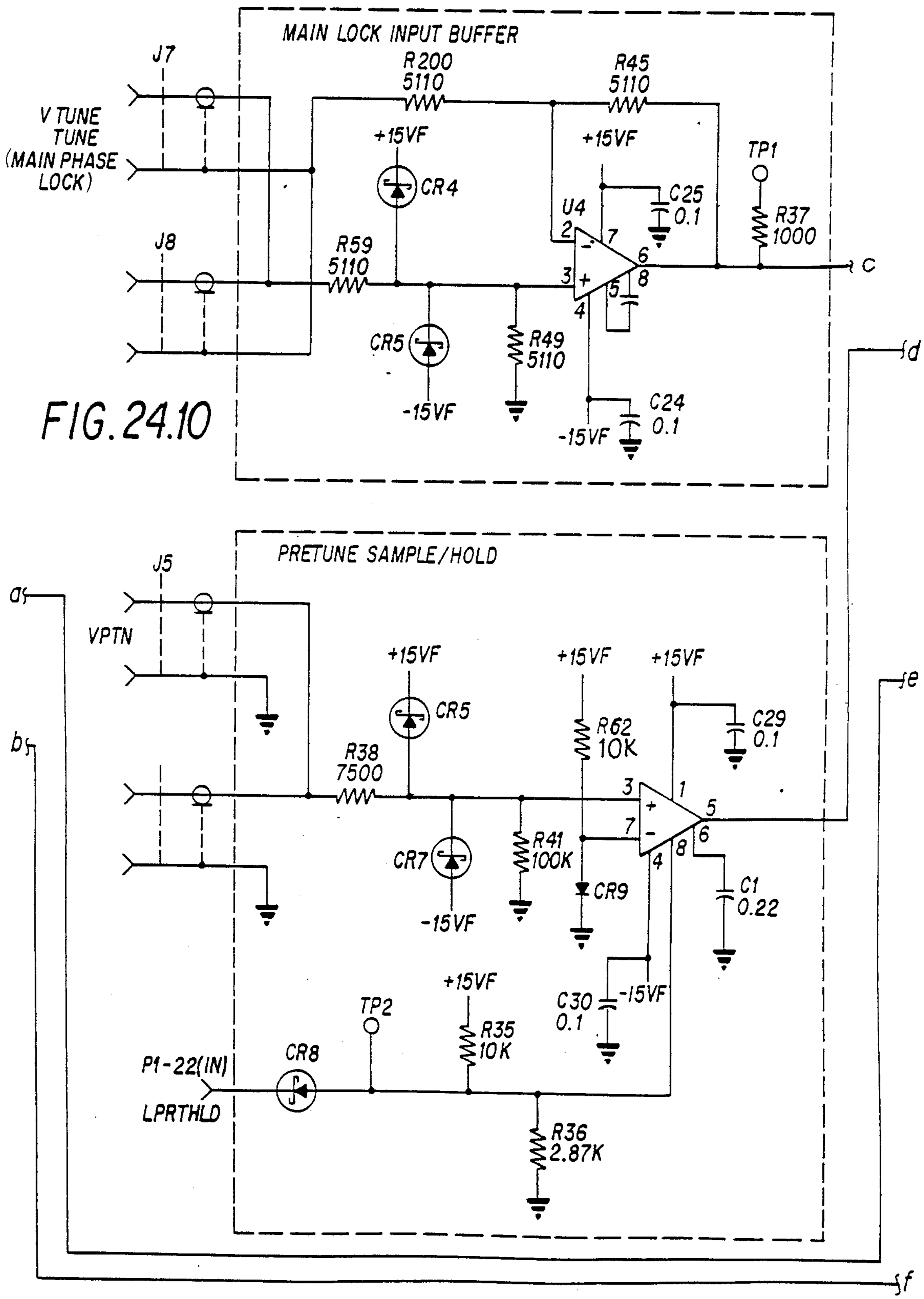
FIG. 24.10

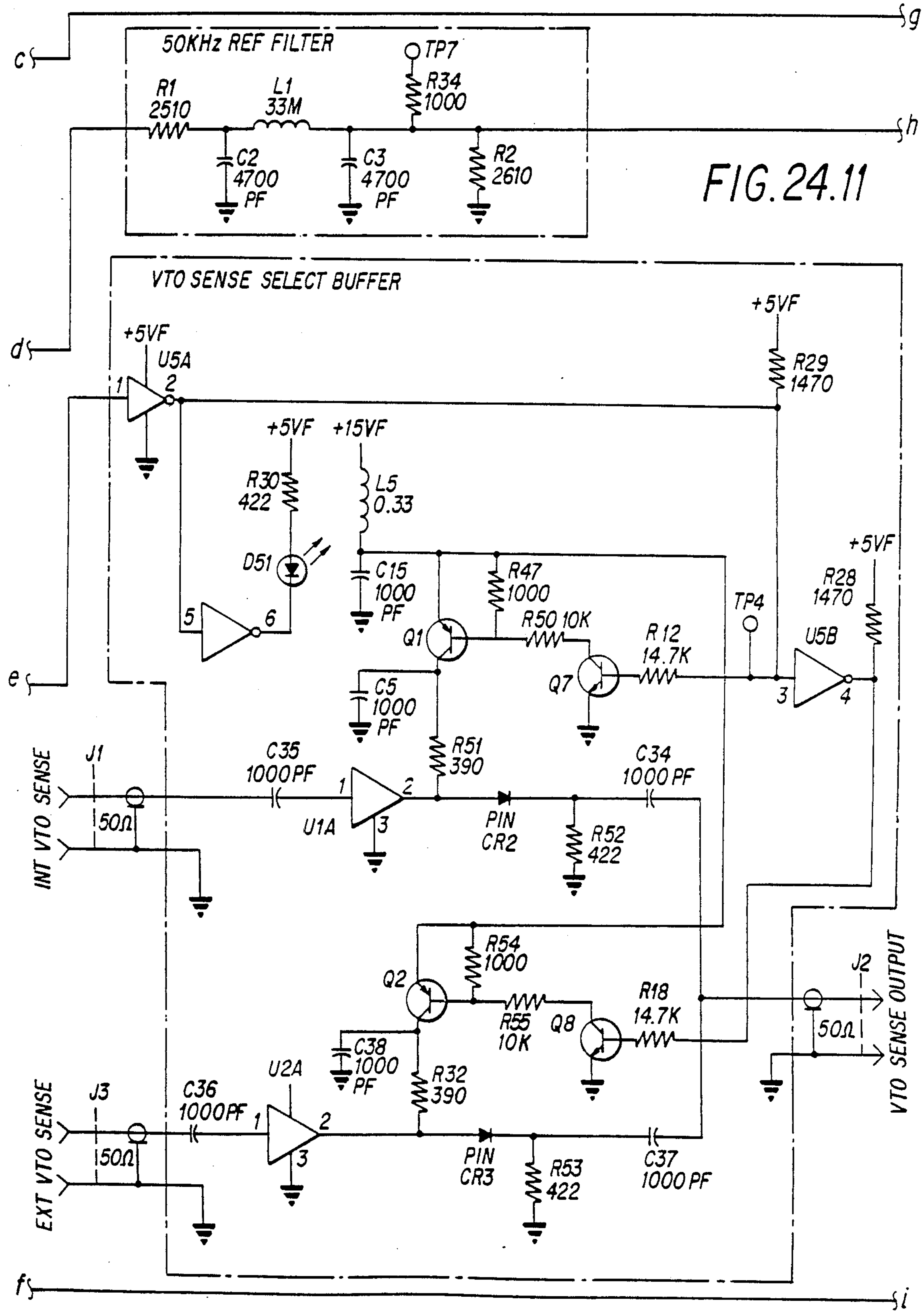
FIG. 24.11

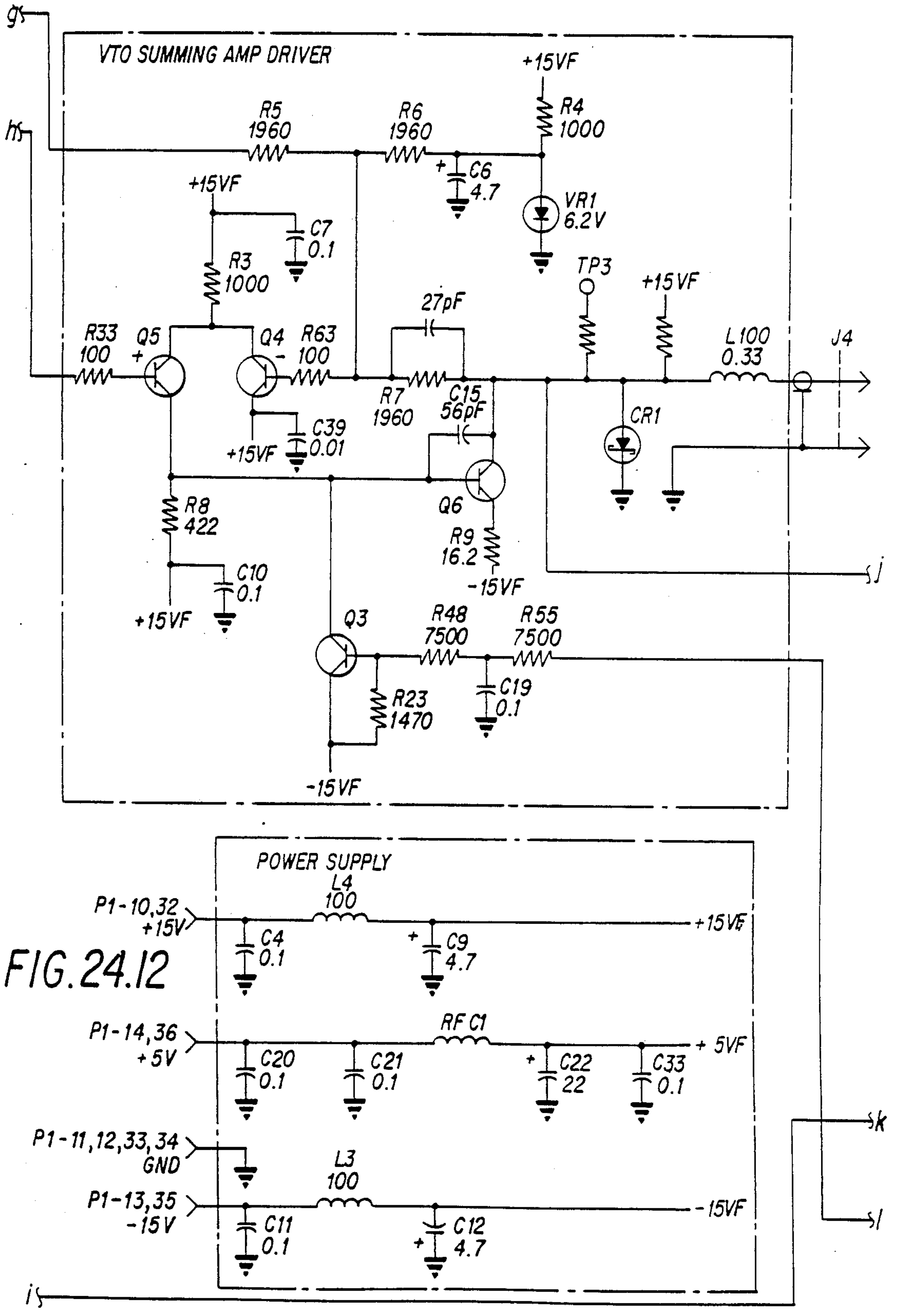
FIG. 24.12

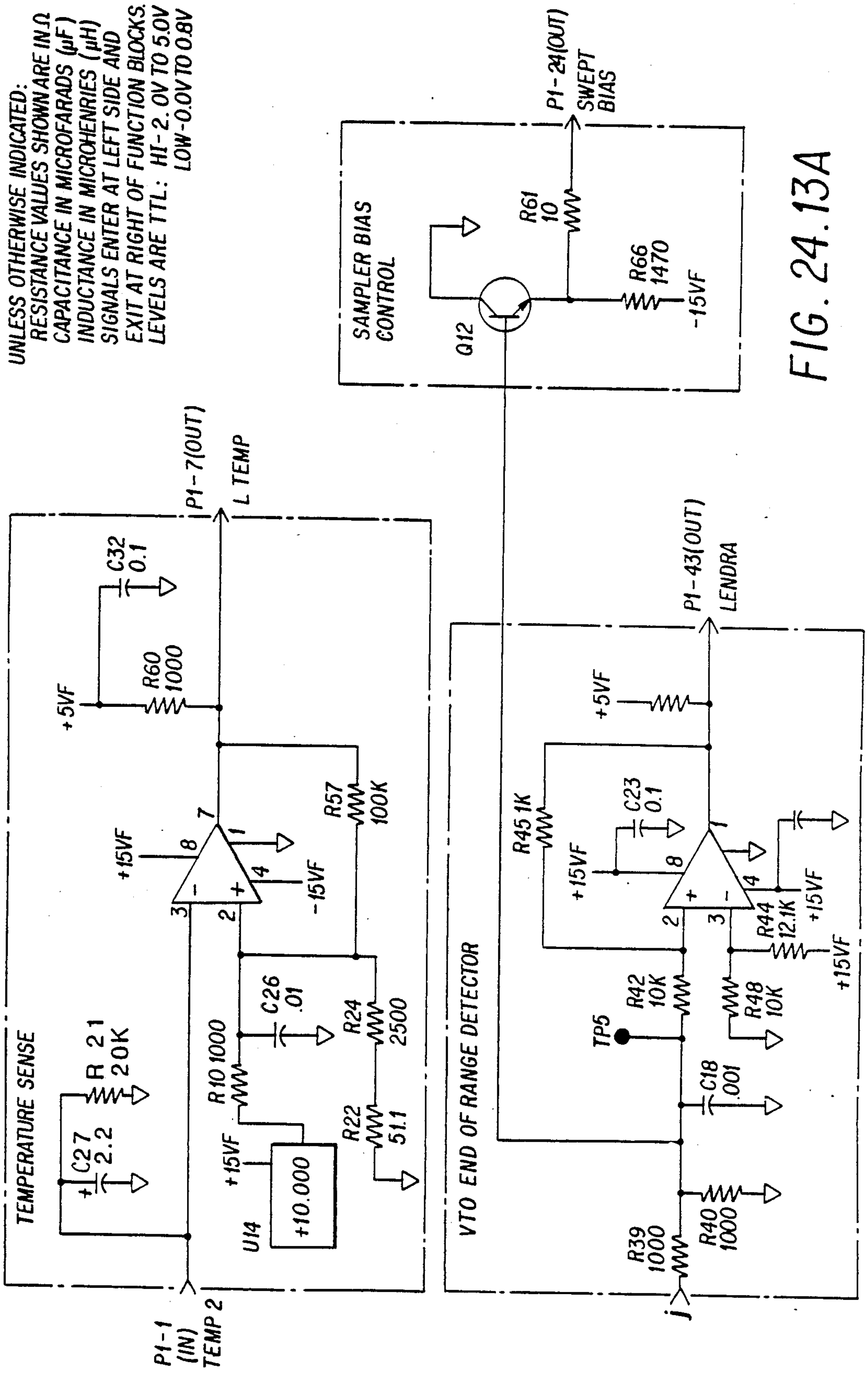
FIG. 24.13A

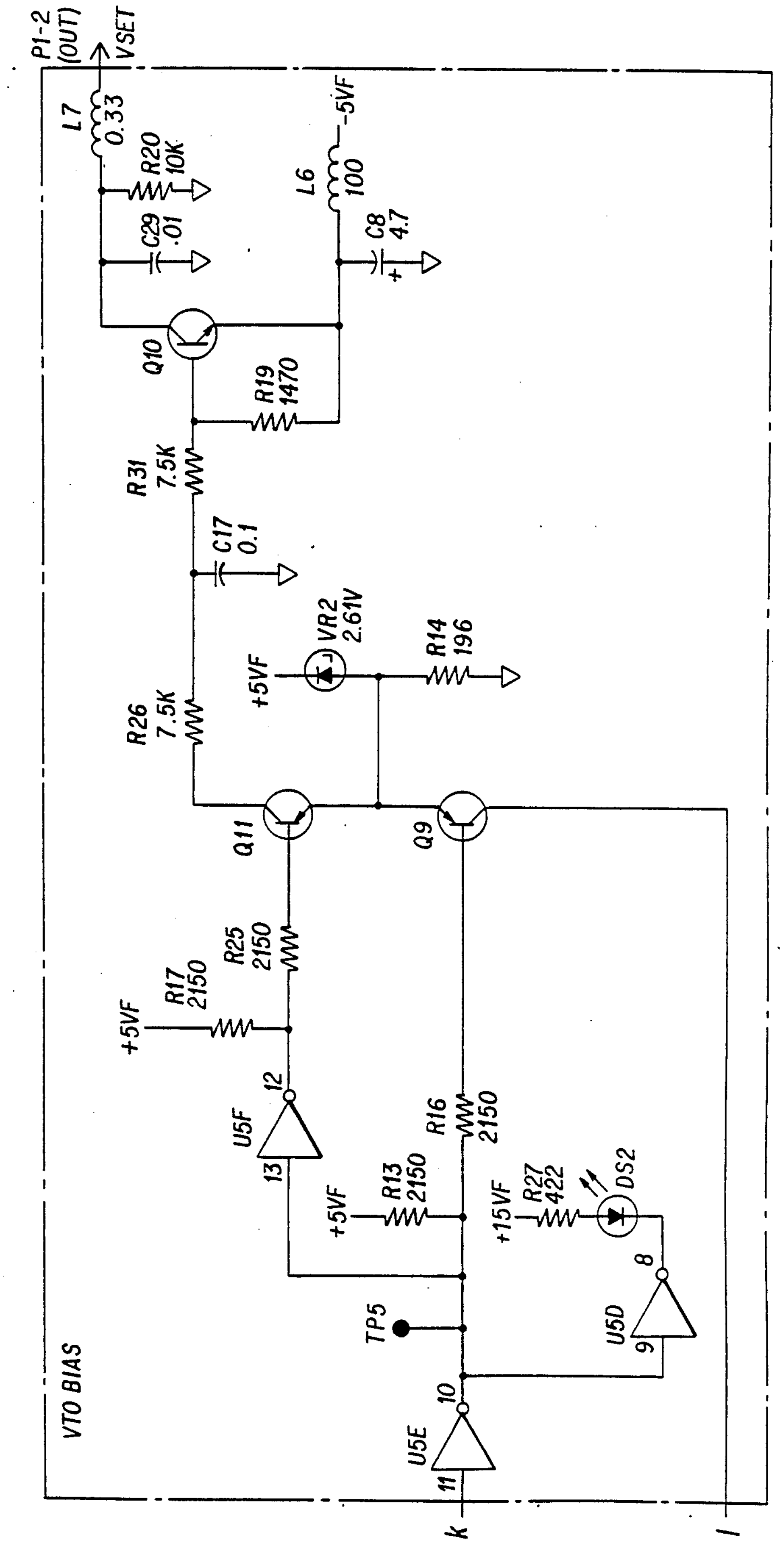
FIG. 24.13B

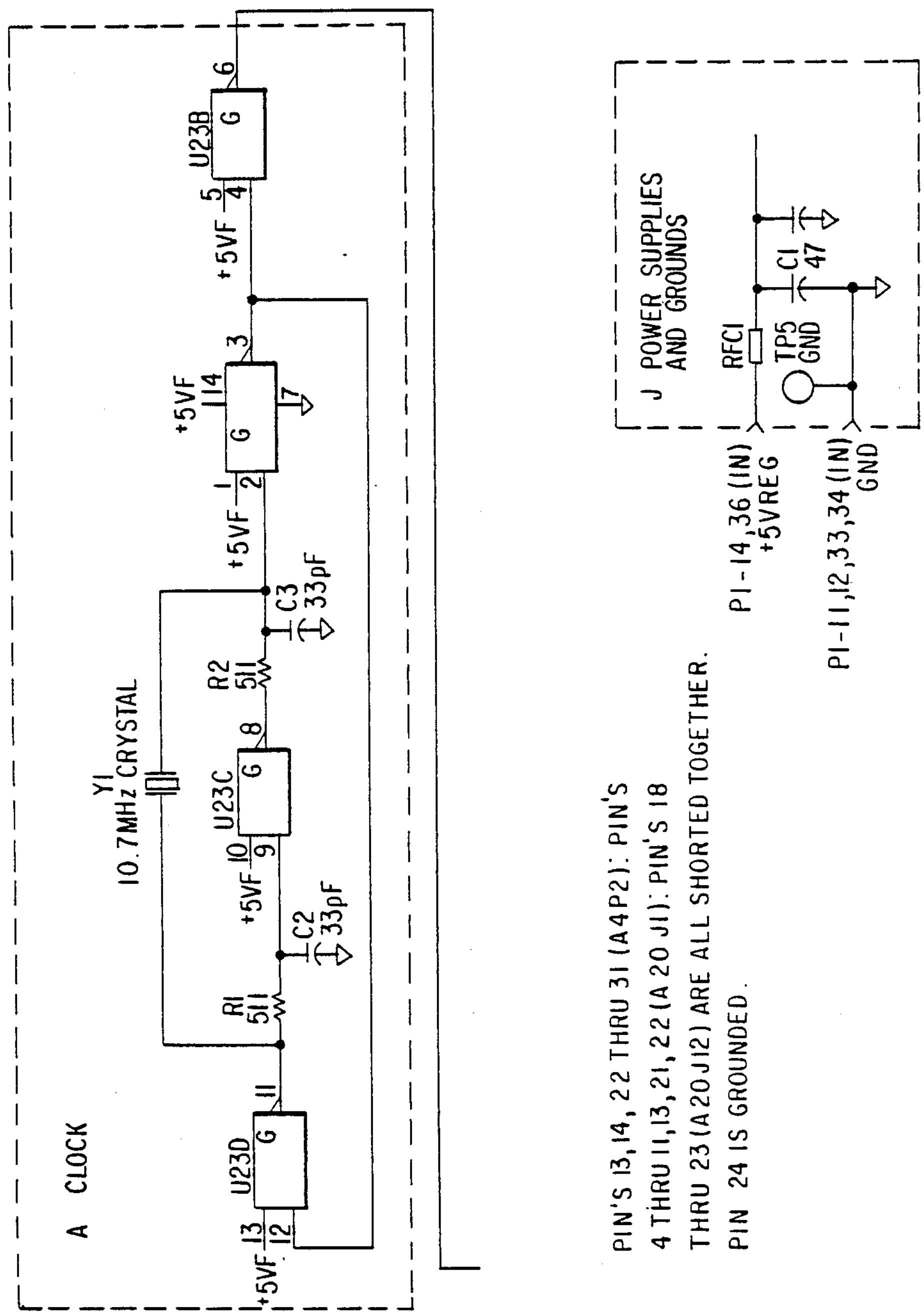
FIG.24.15A

FIG. 24.15B
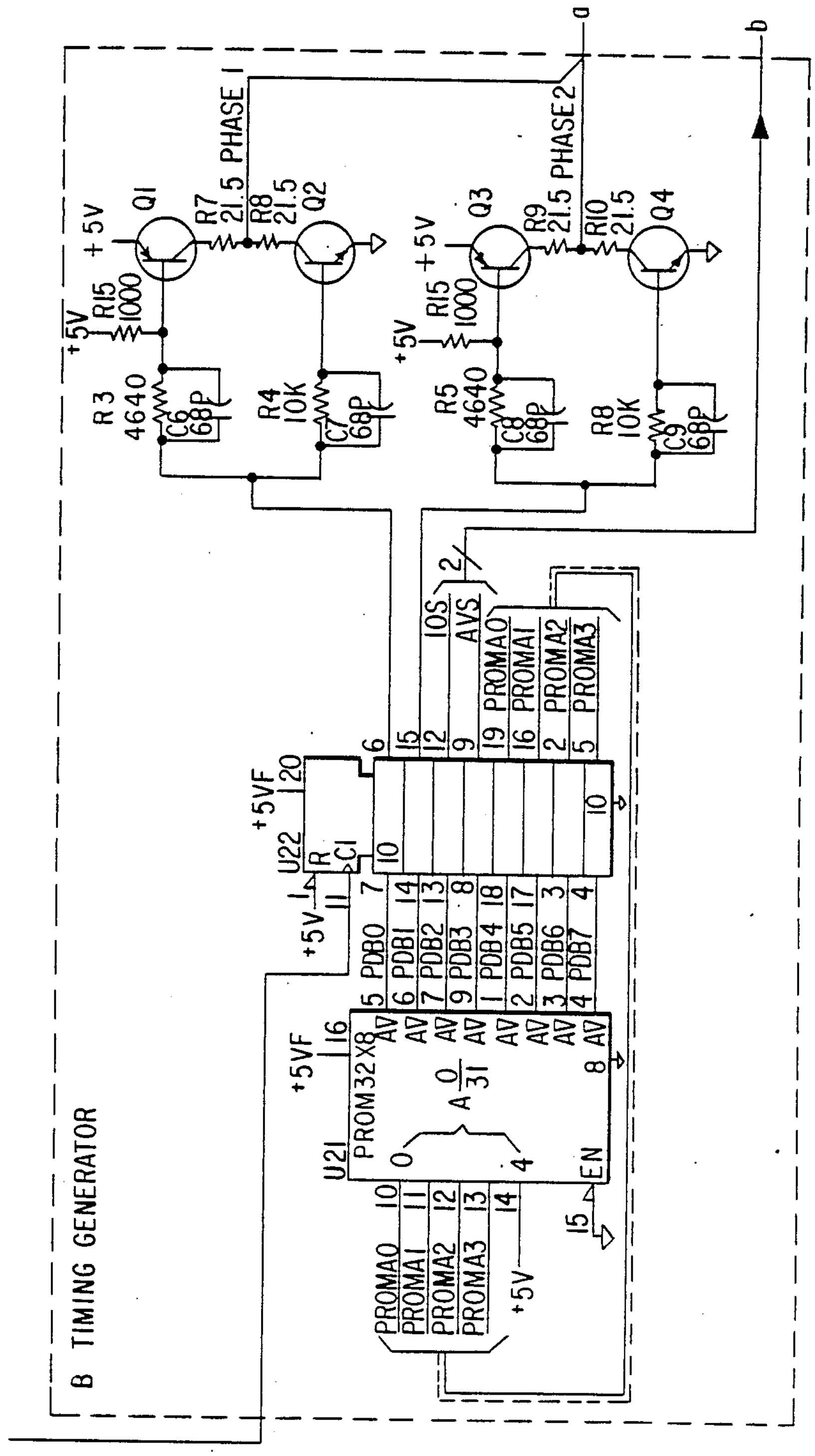

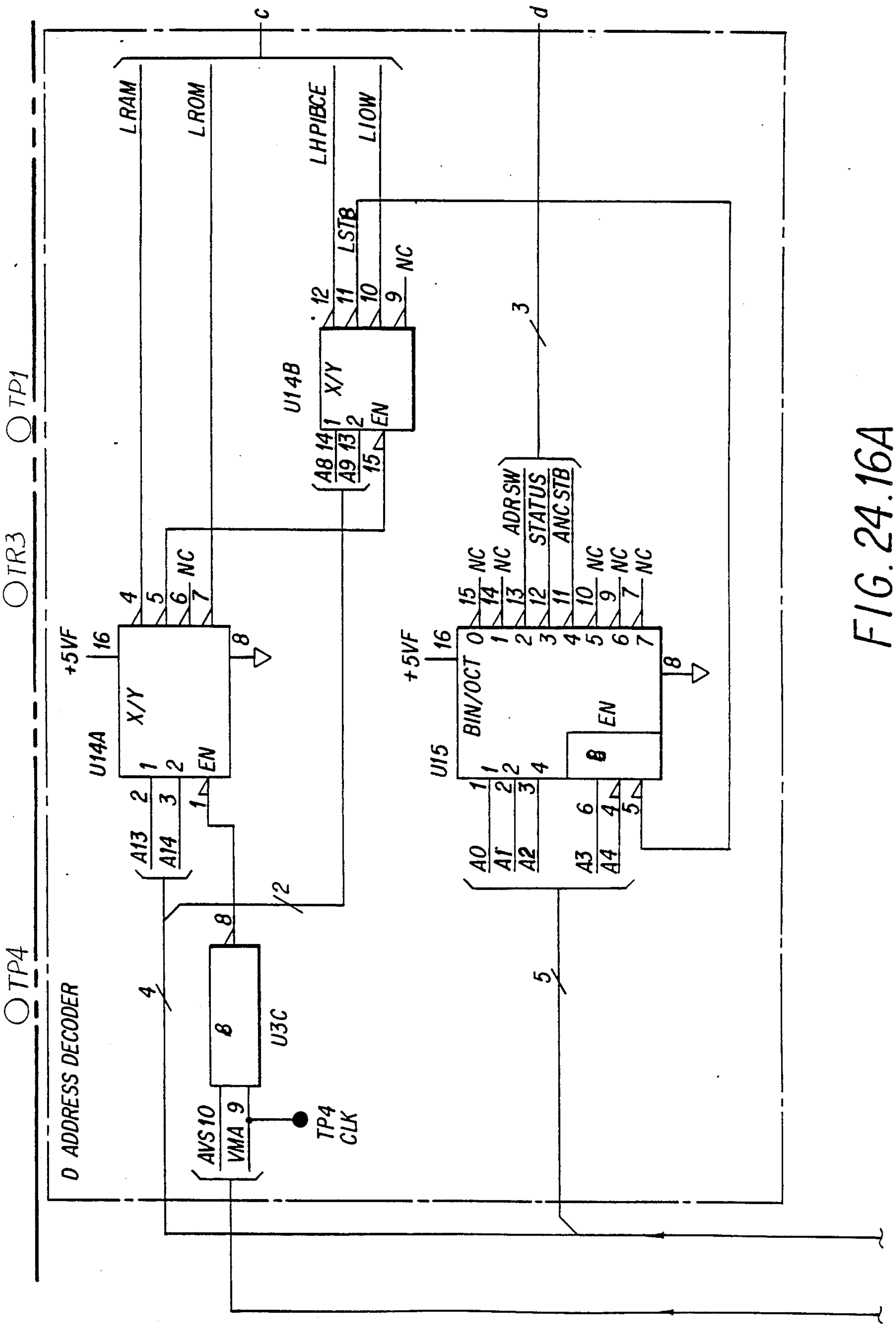
FIG. 24.16A

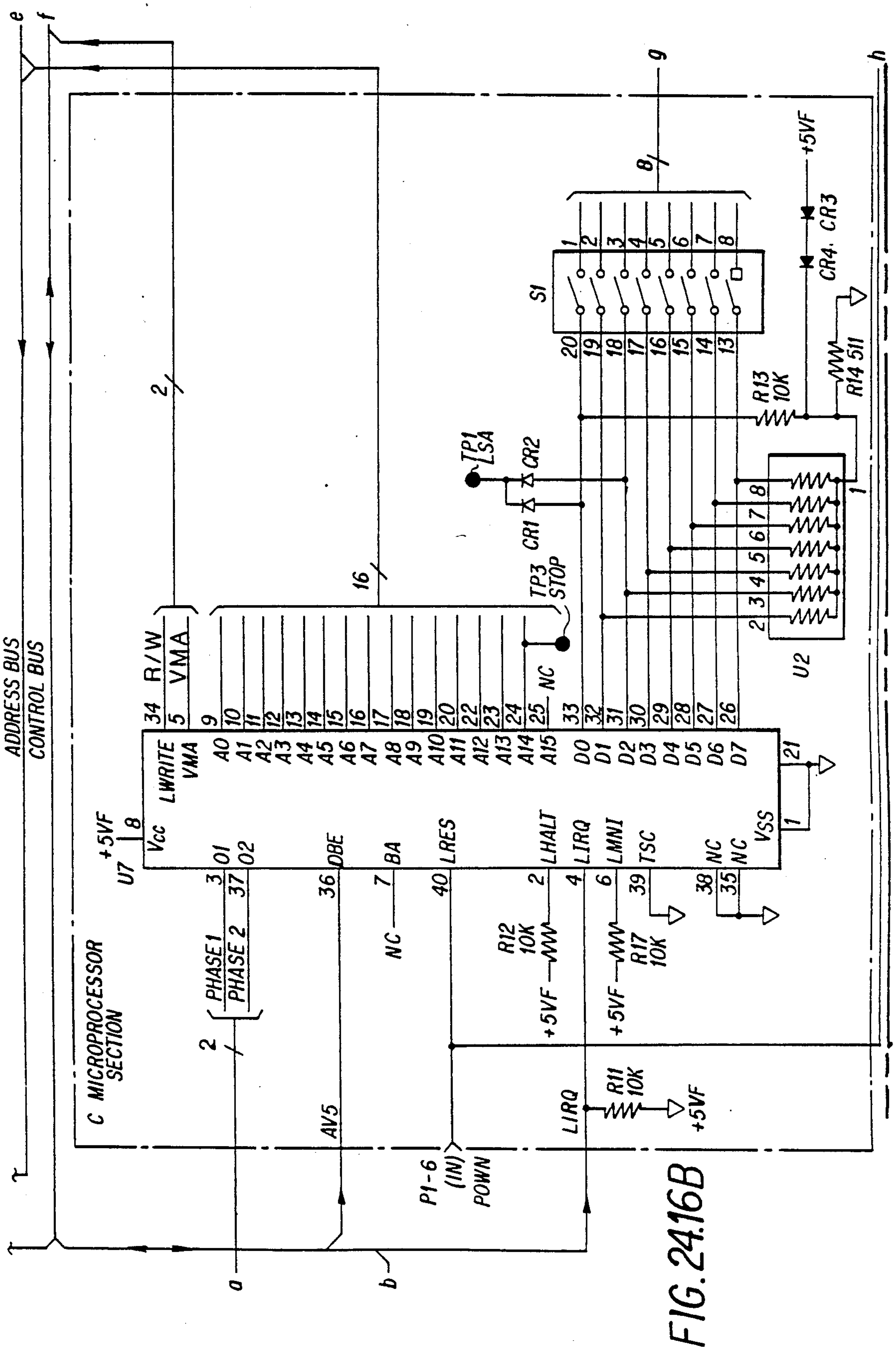
FIG. 2416B

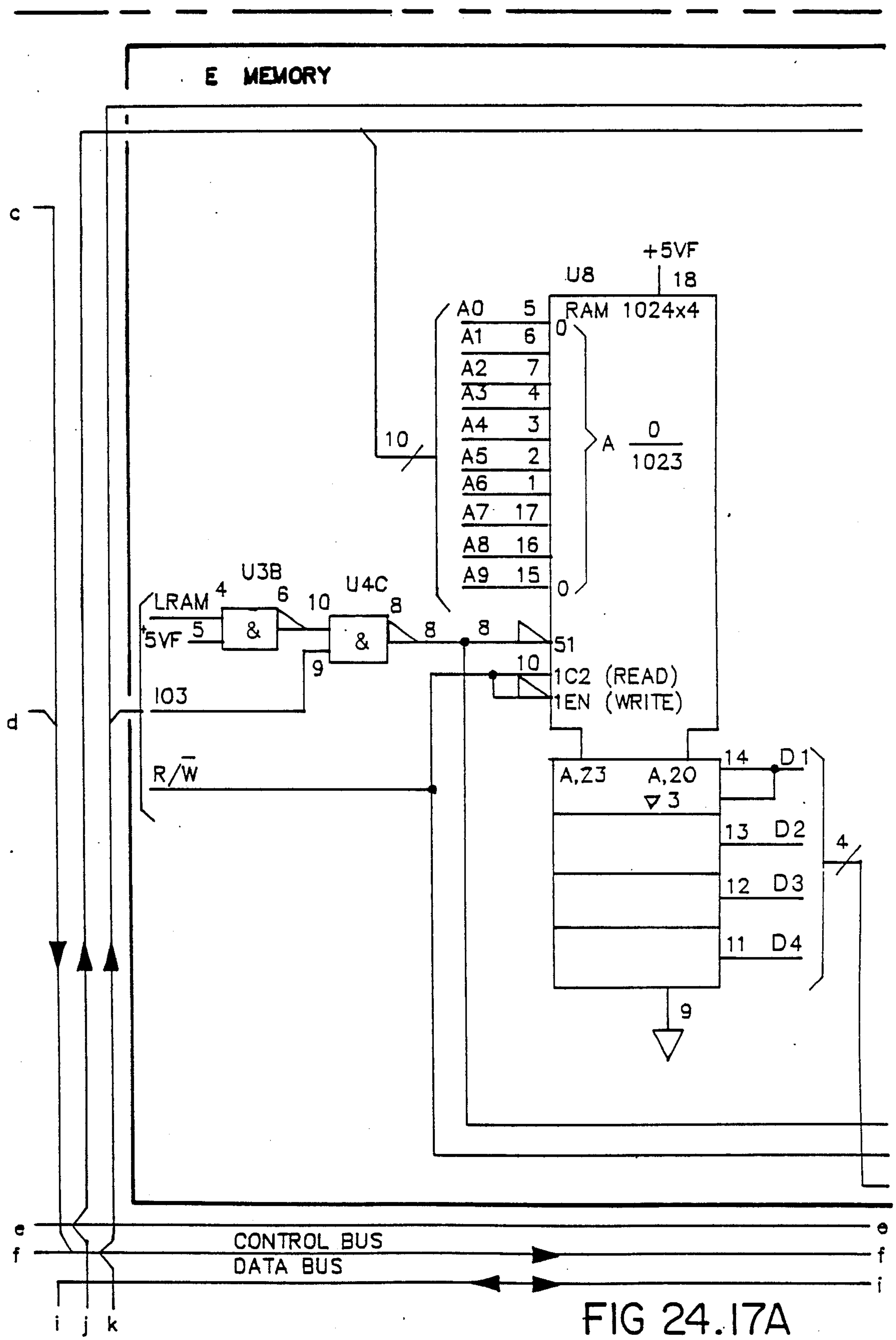
FIG 24.17A

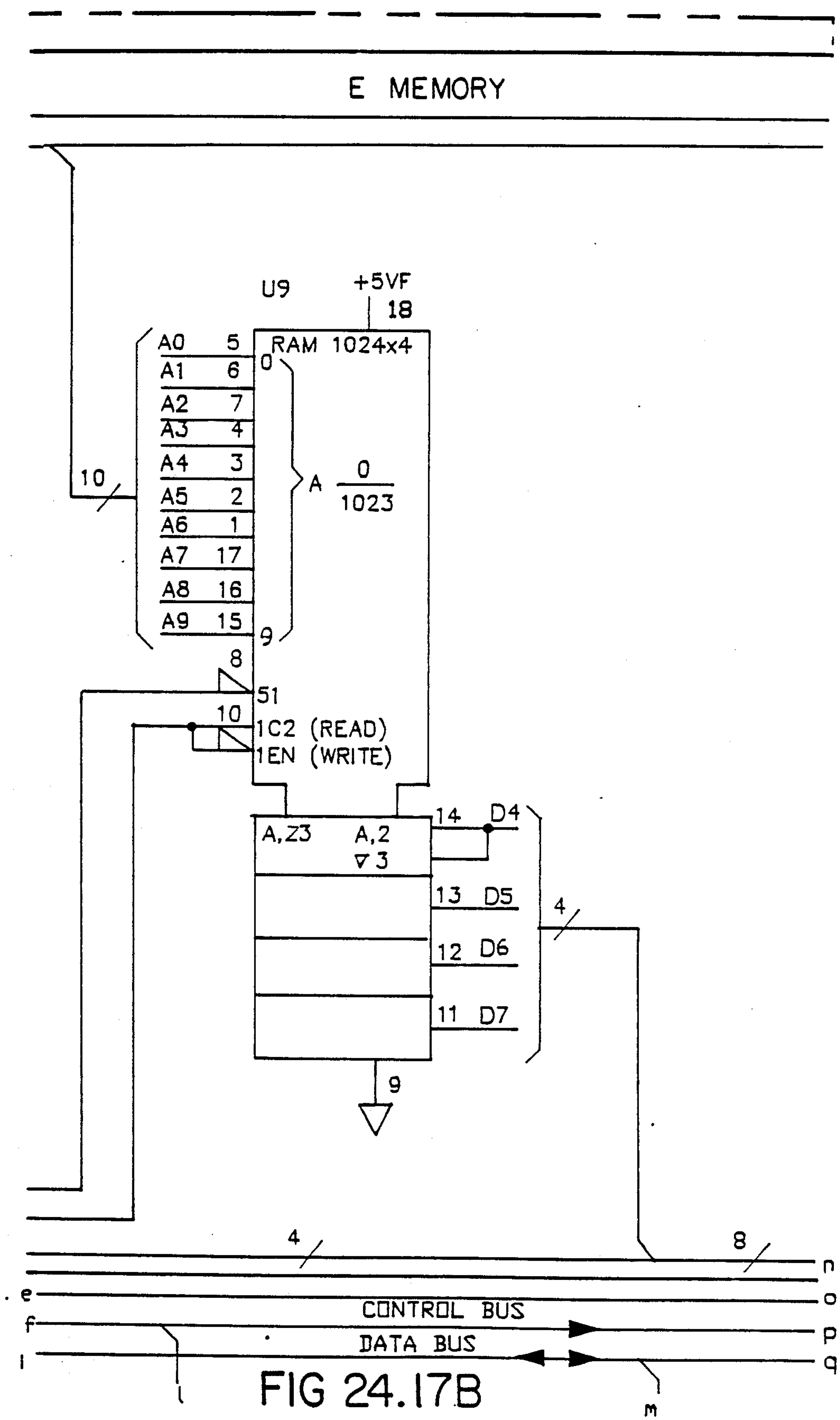
FIG 24.17B

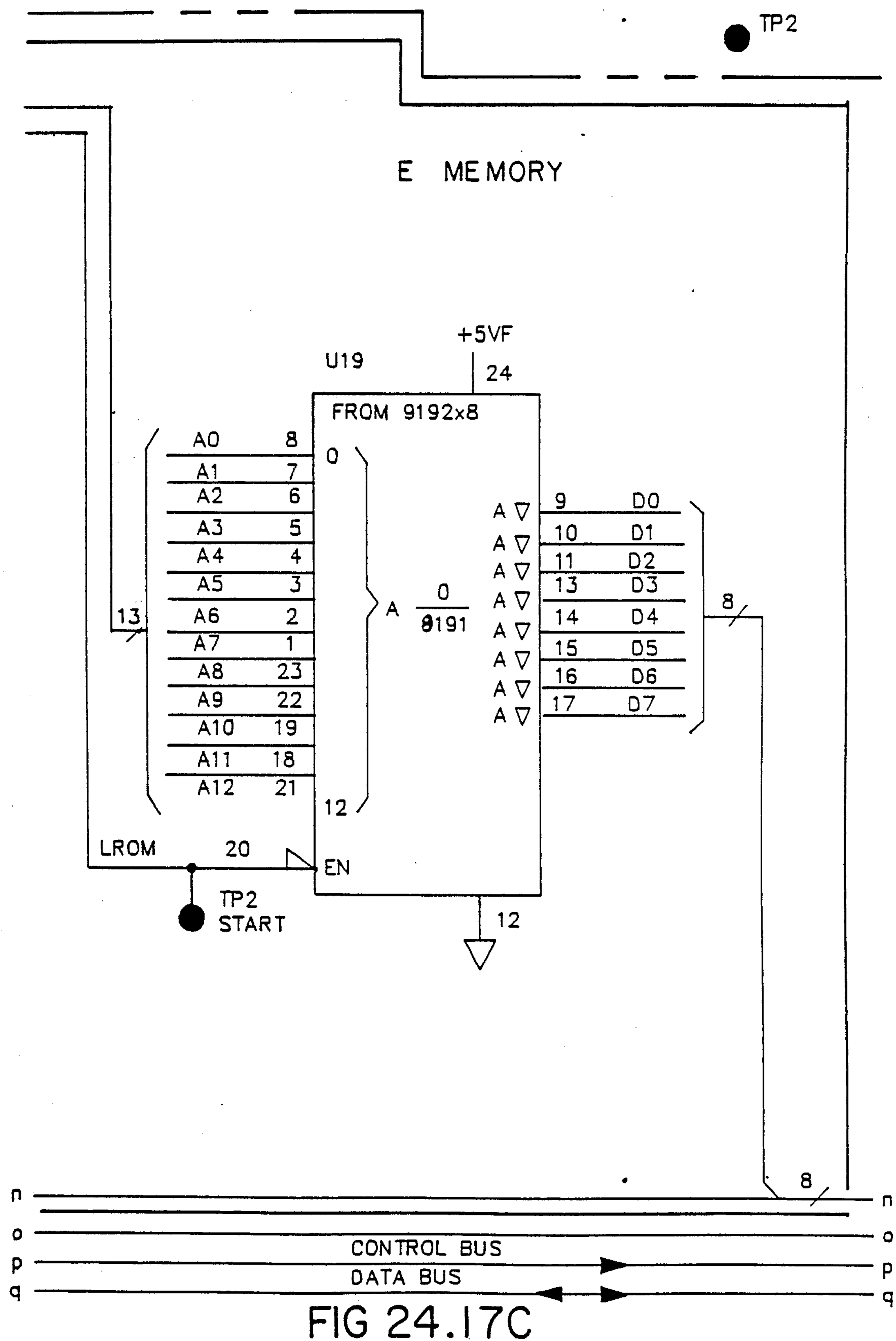
FIG 24.17C

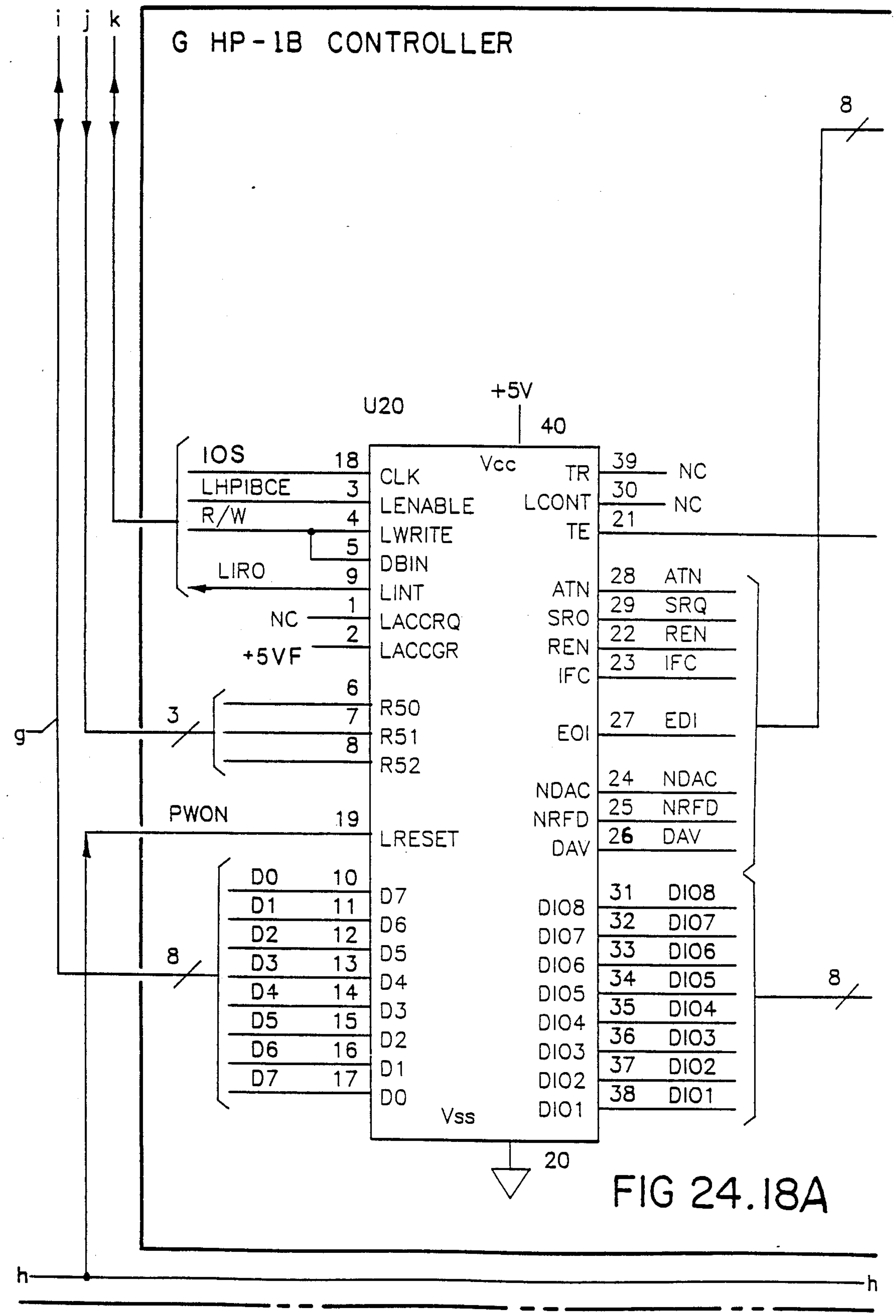
FIG 24.18A

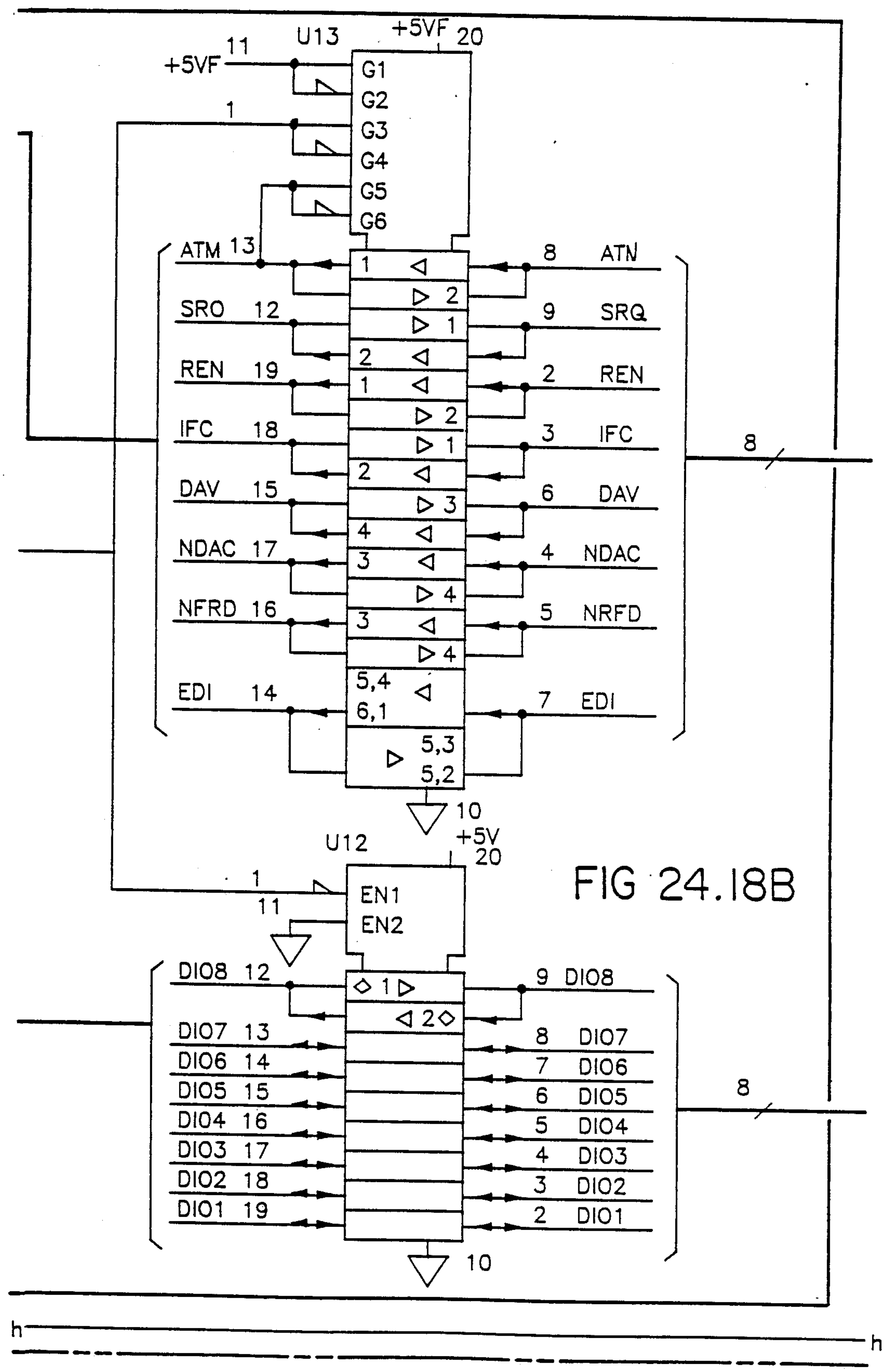
FIG 24.18B

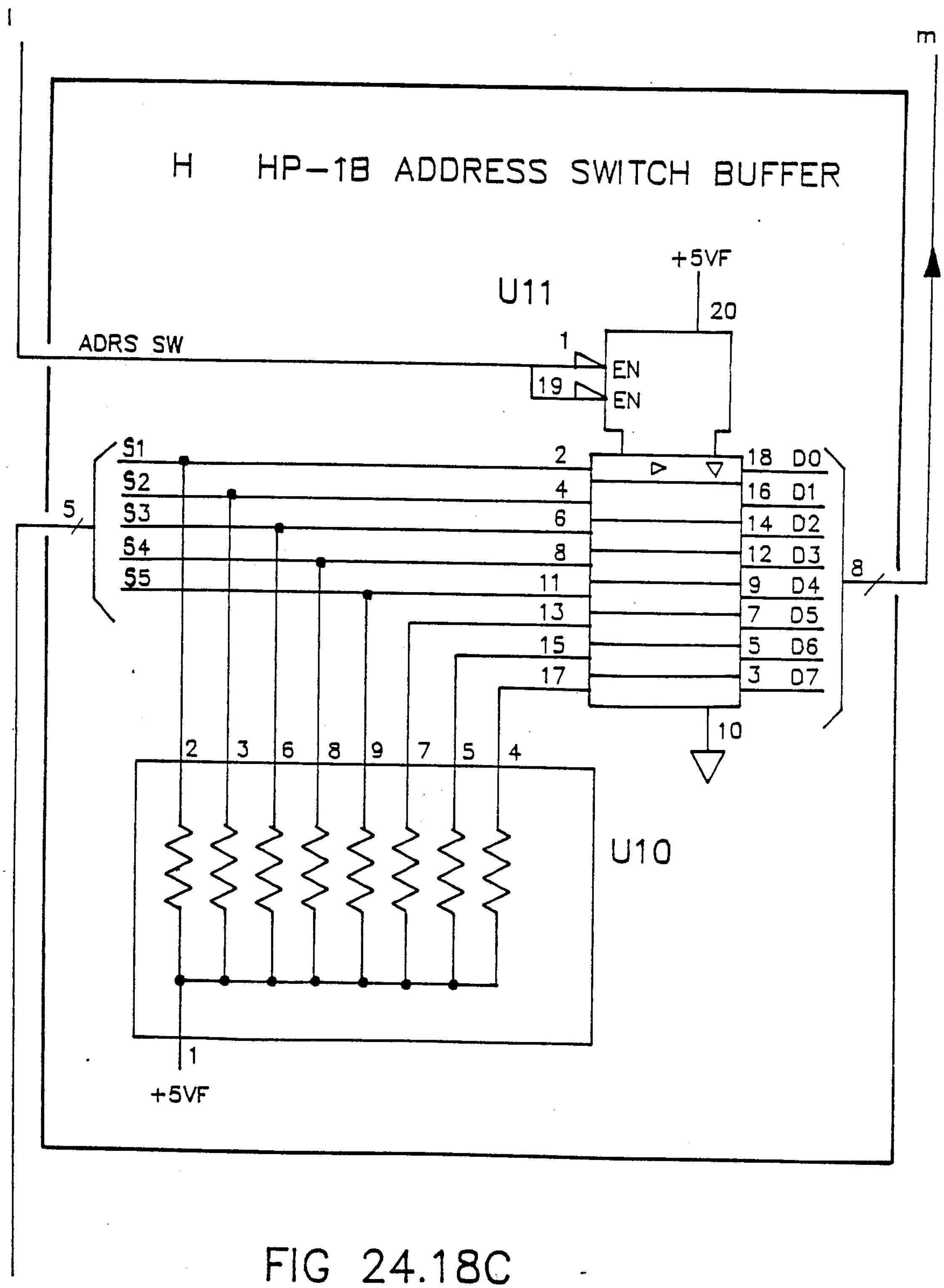
FIG 24.18C

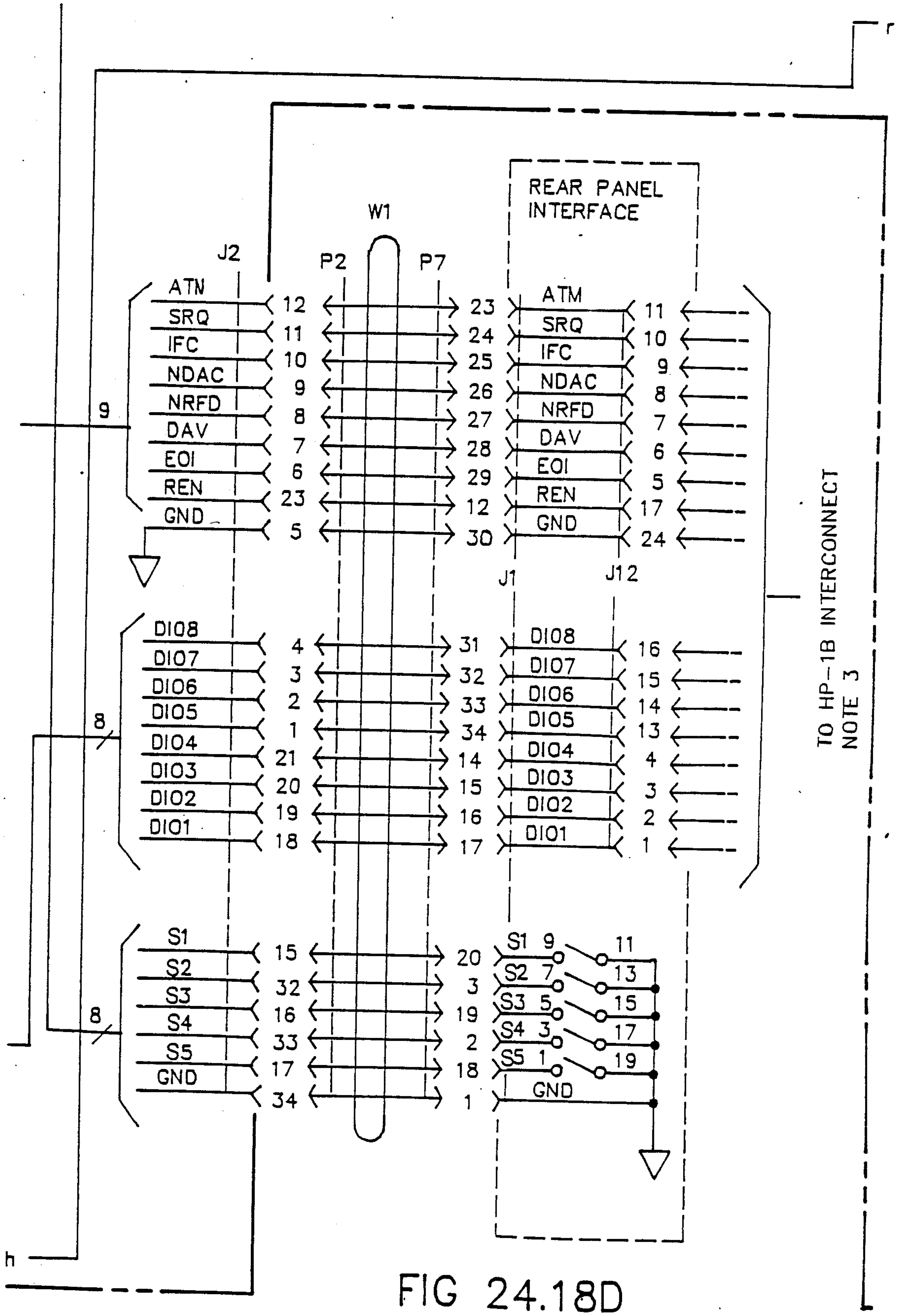
FIG 24.18D

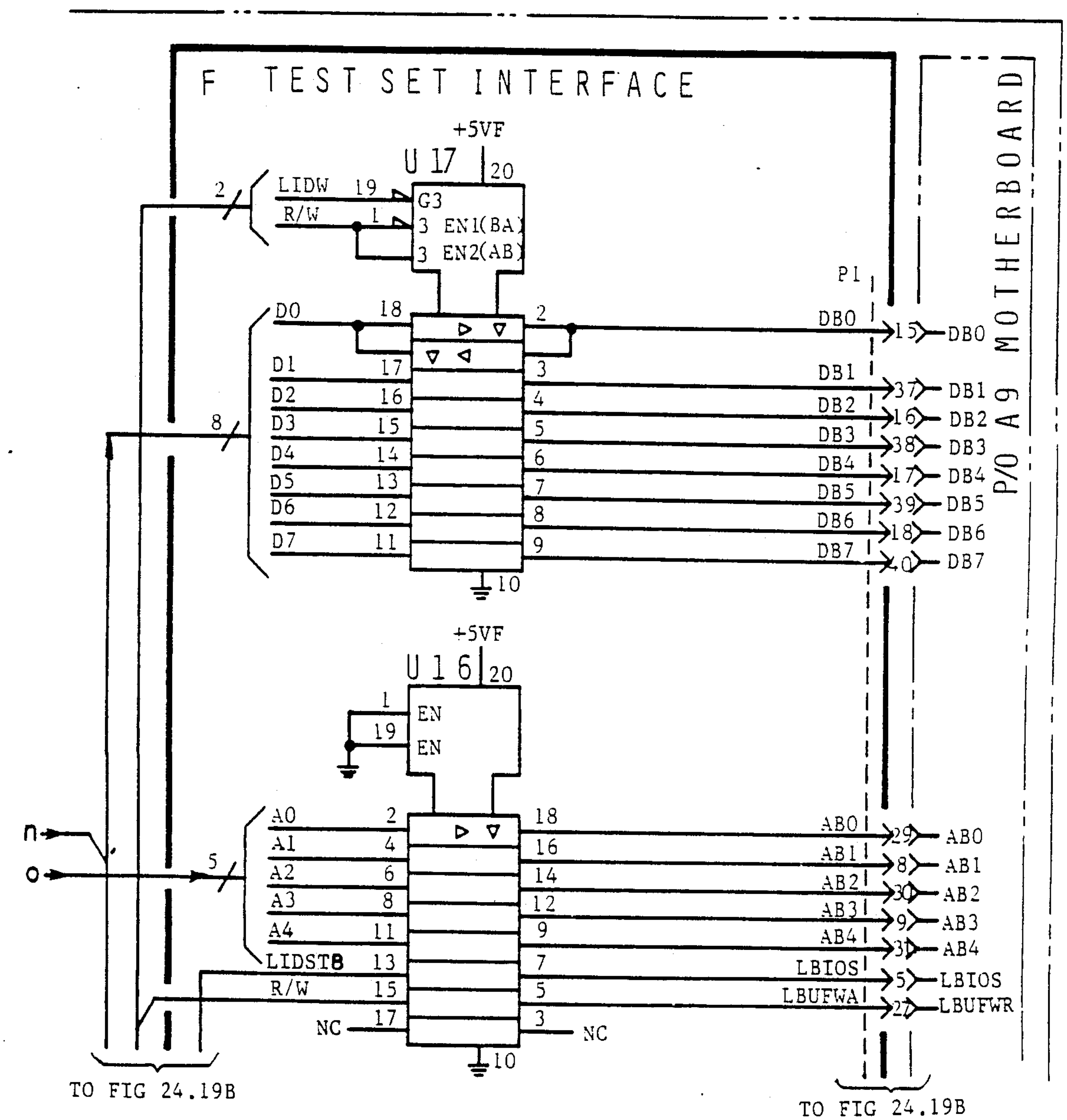
FIG 24.19A

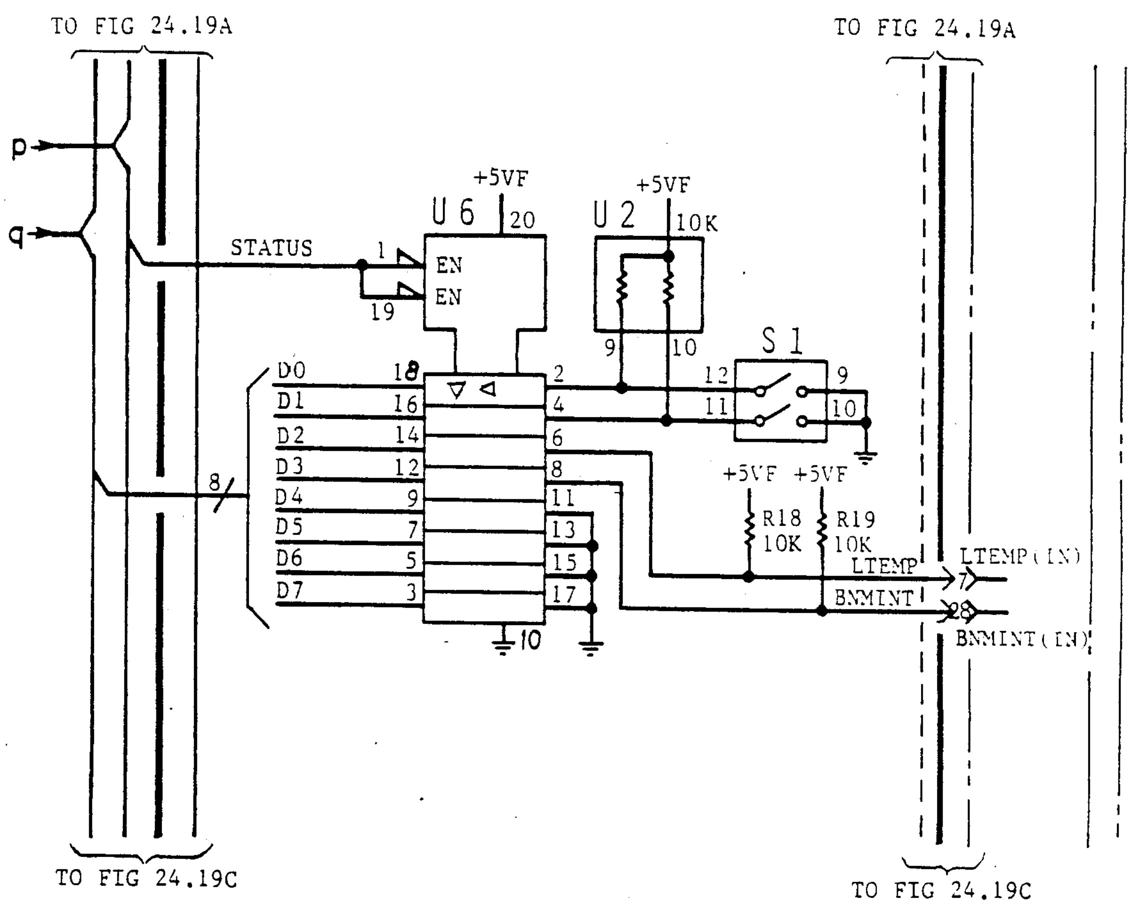
FIG 24.19 B

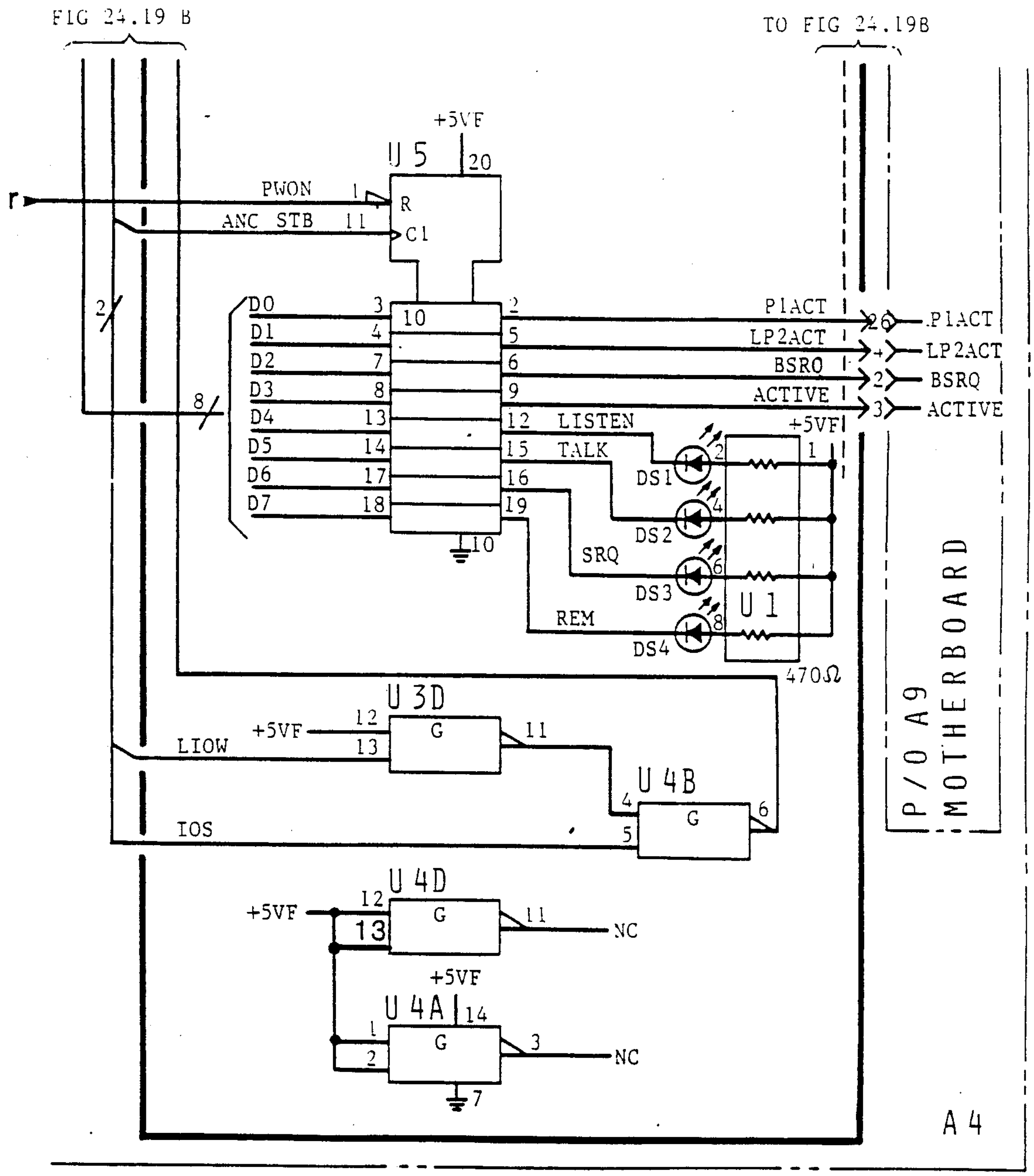
FIG 24.19C

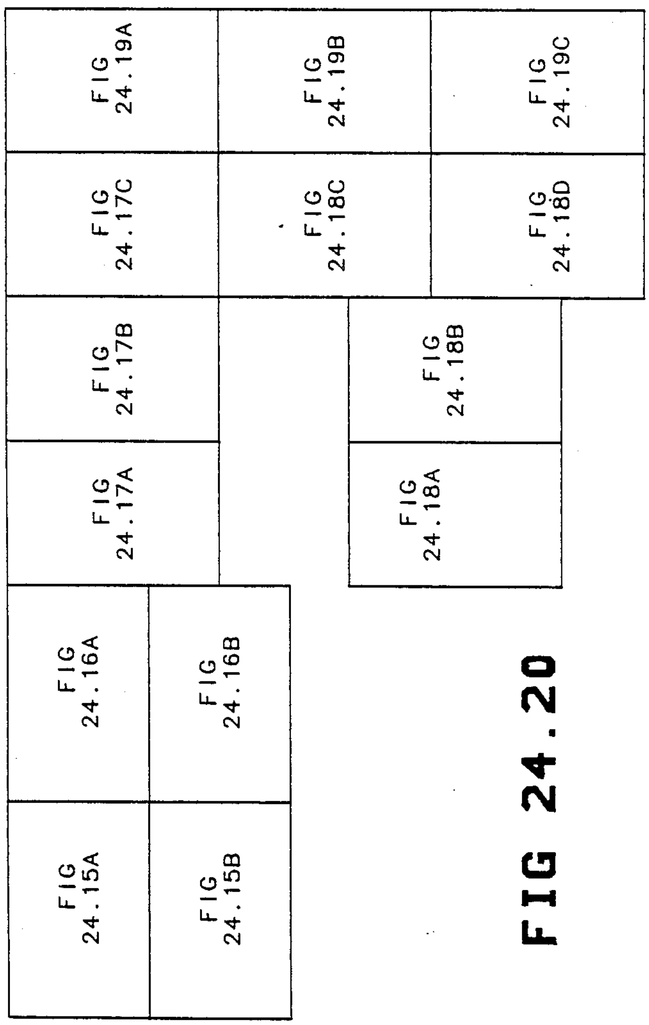
FIG 24.20
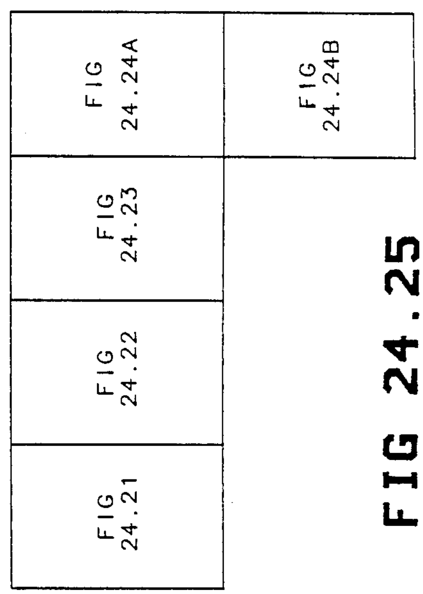
FIG 24.25

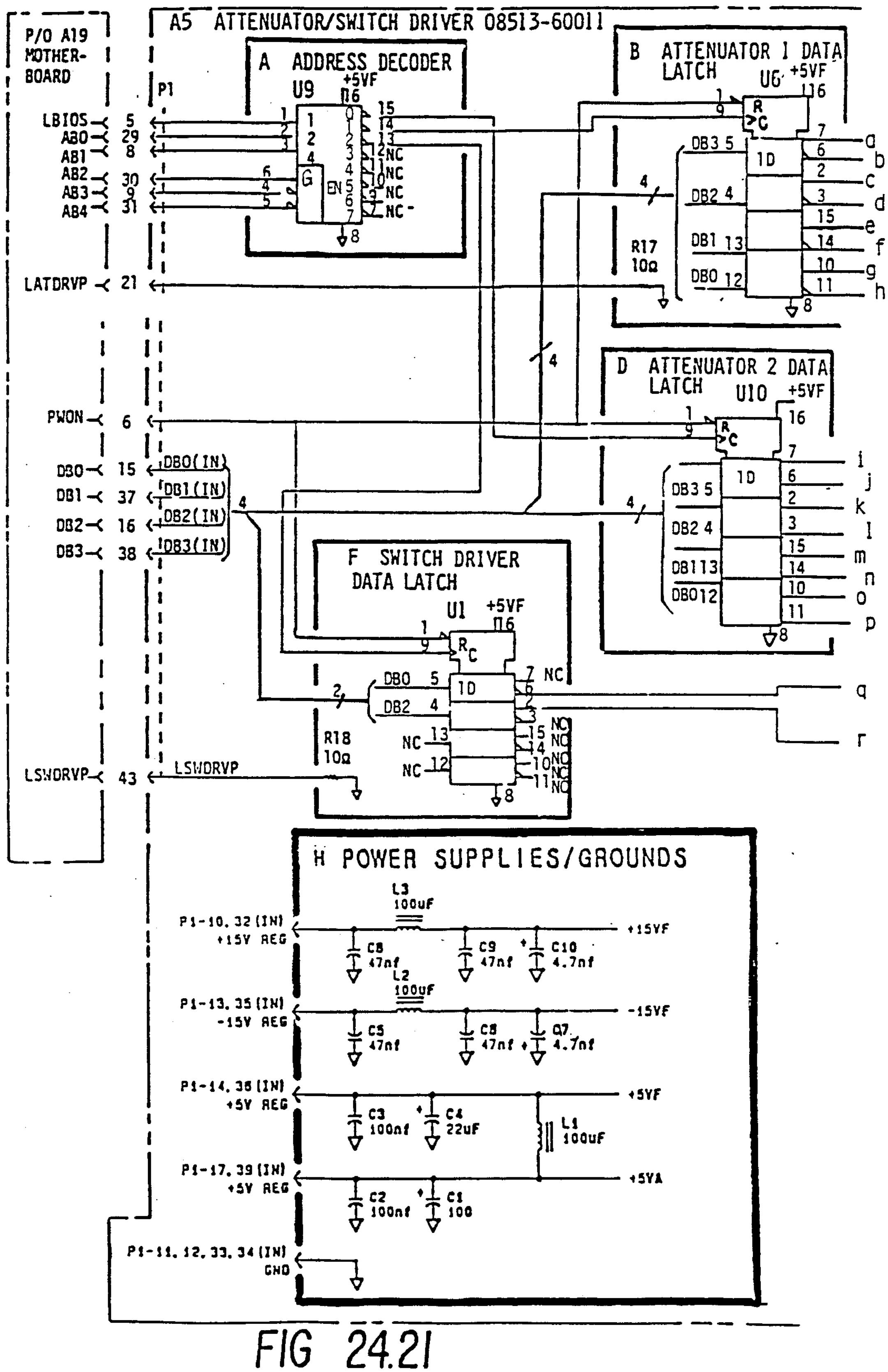
FIG 24.21

FIG 24.22
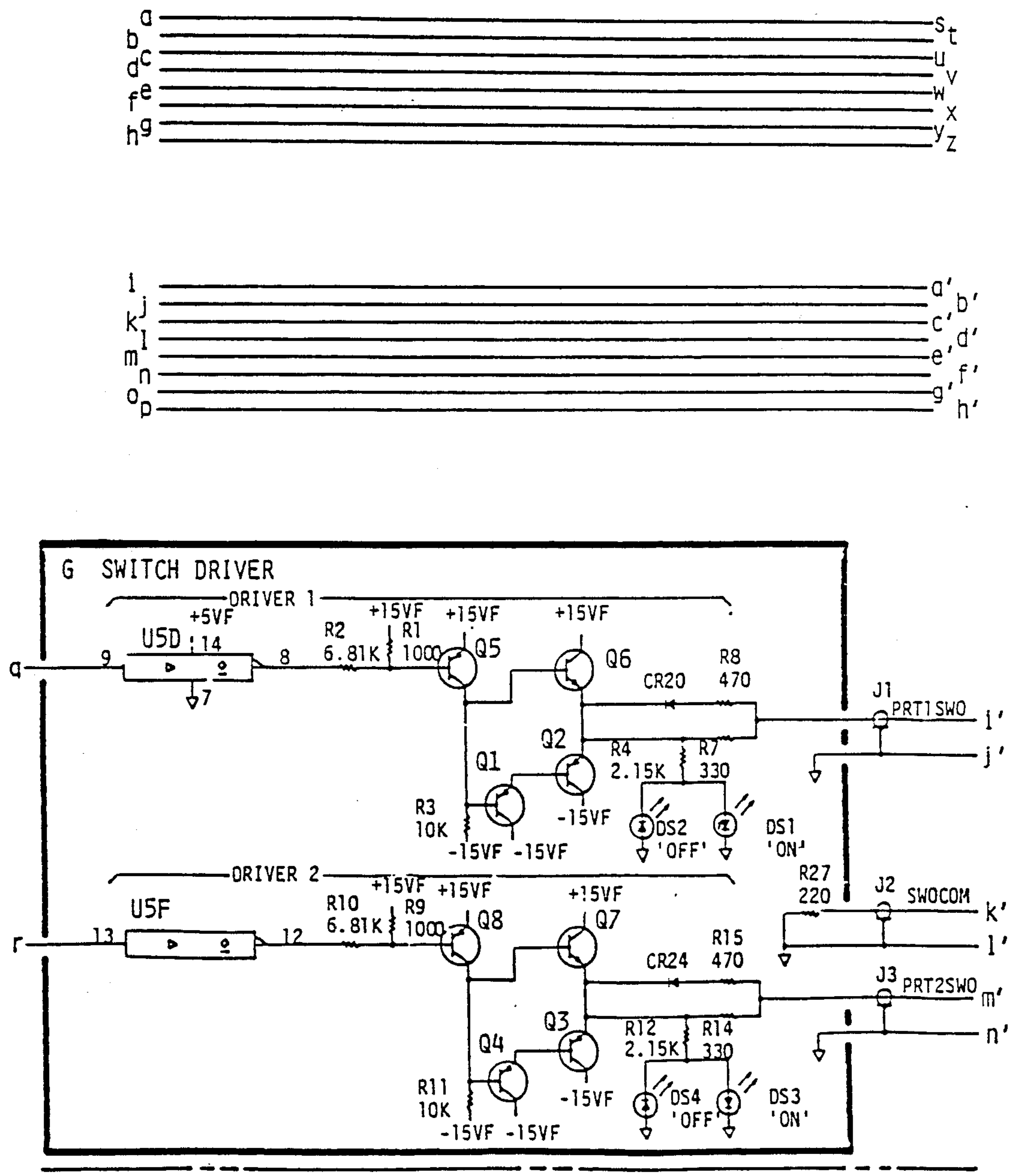

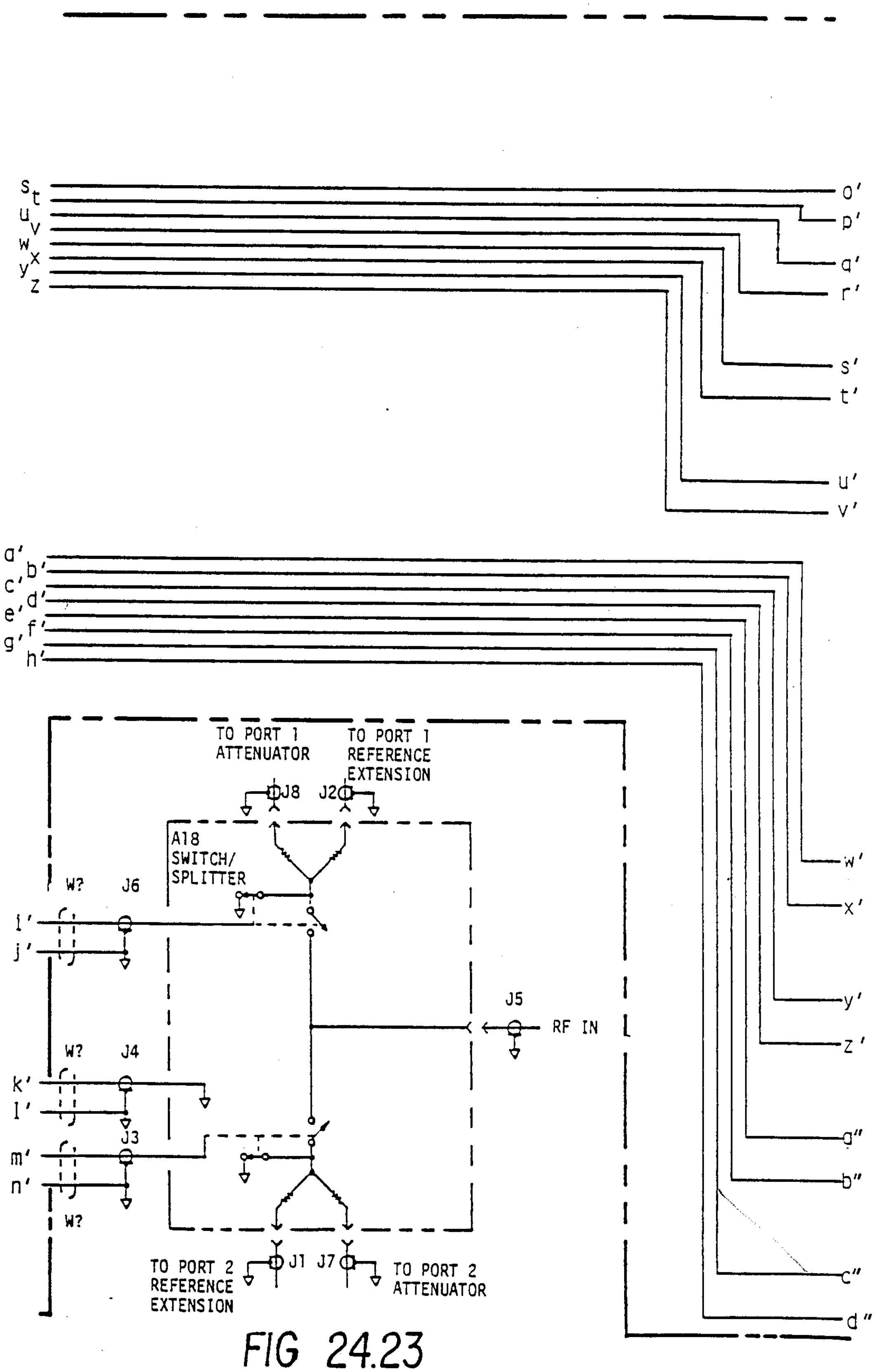
FIG 24.23

FIG 24.24A
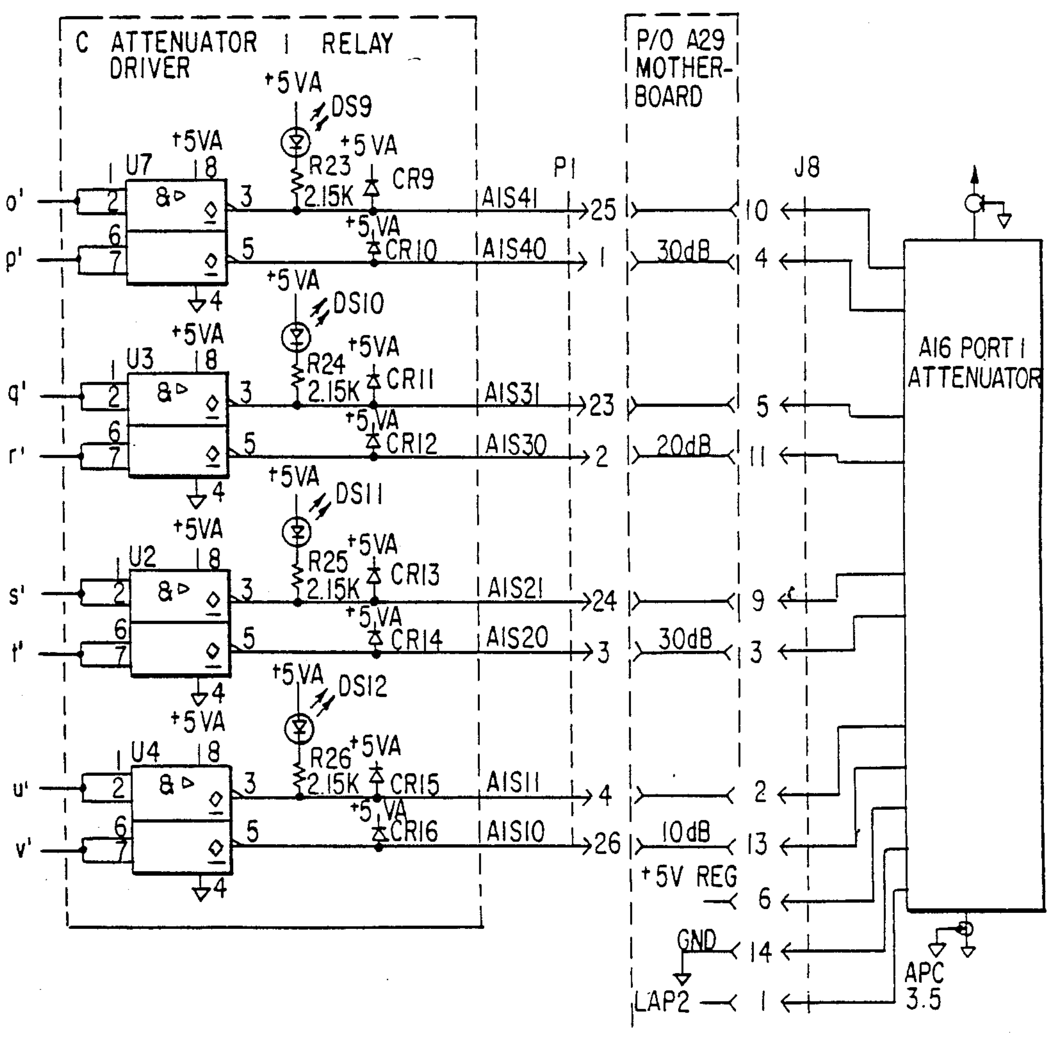

FIG 24.24B
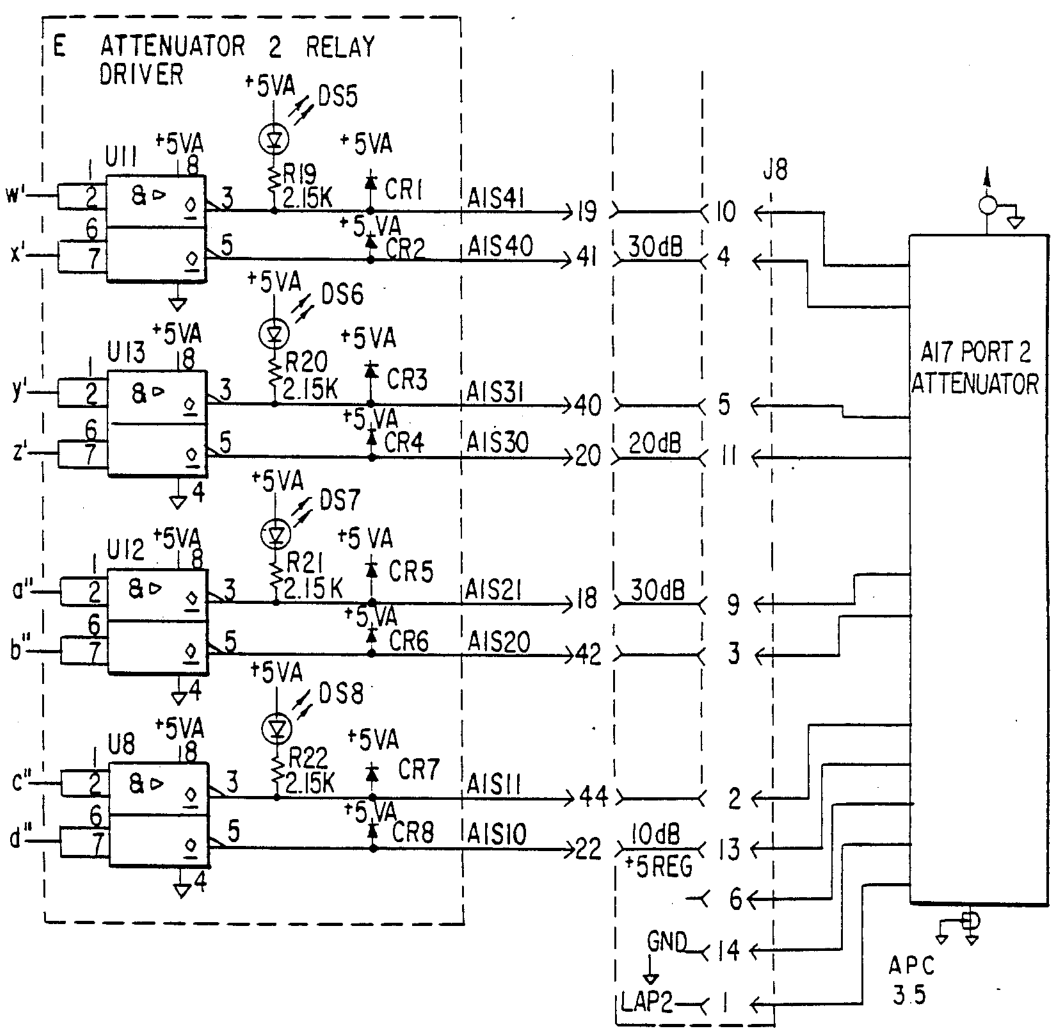

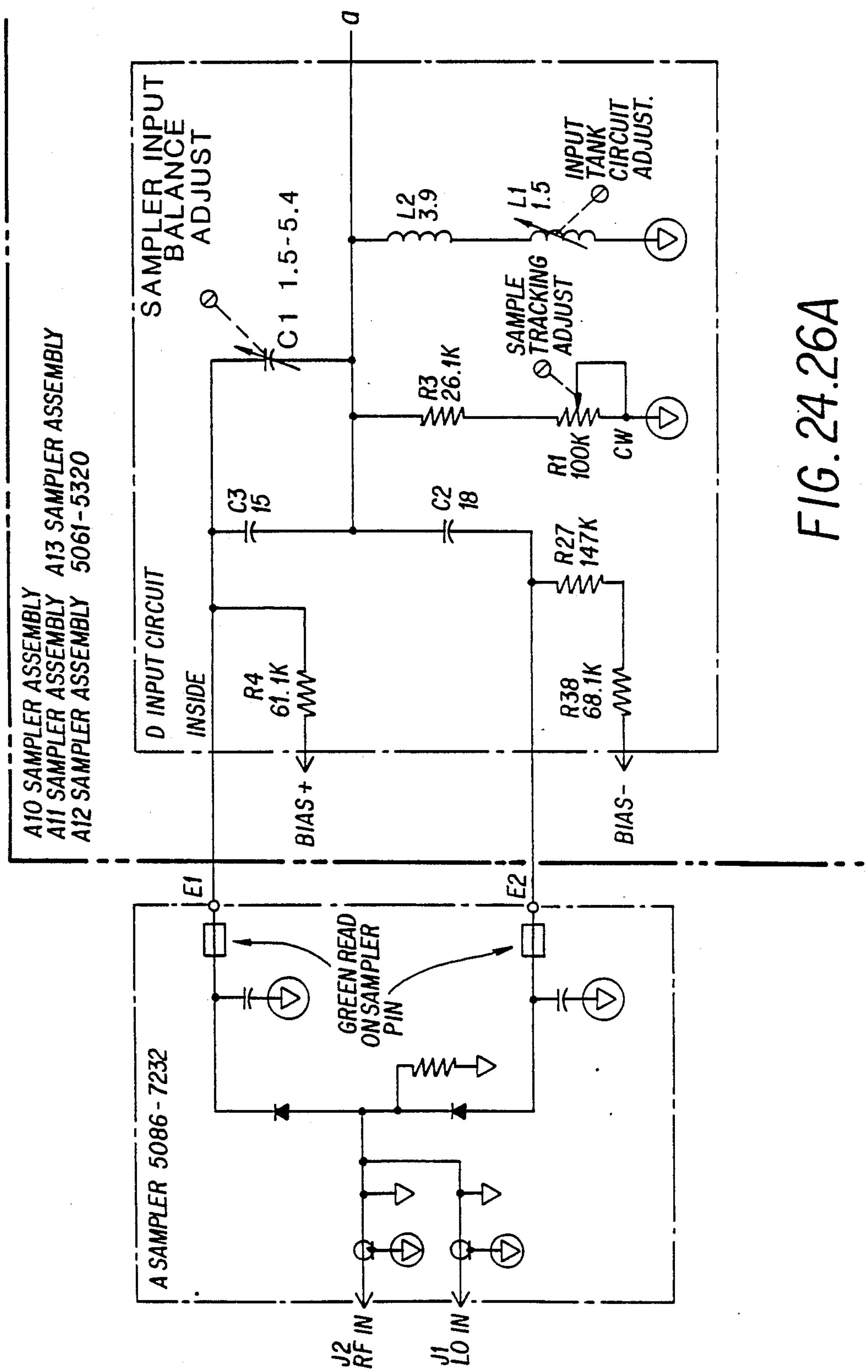
FIG. 24.26A

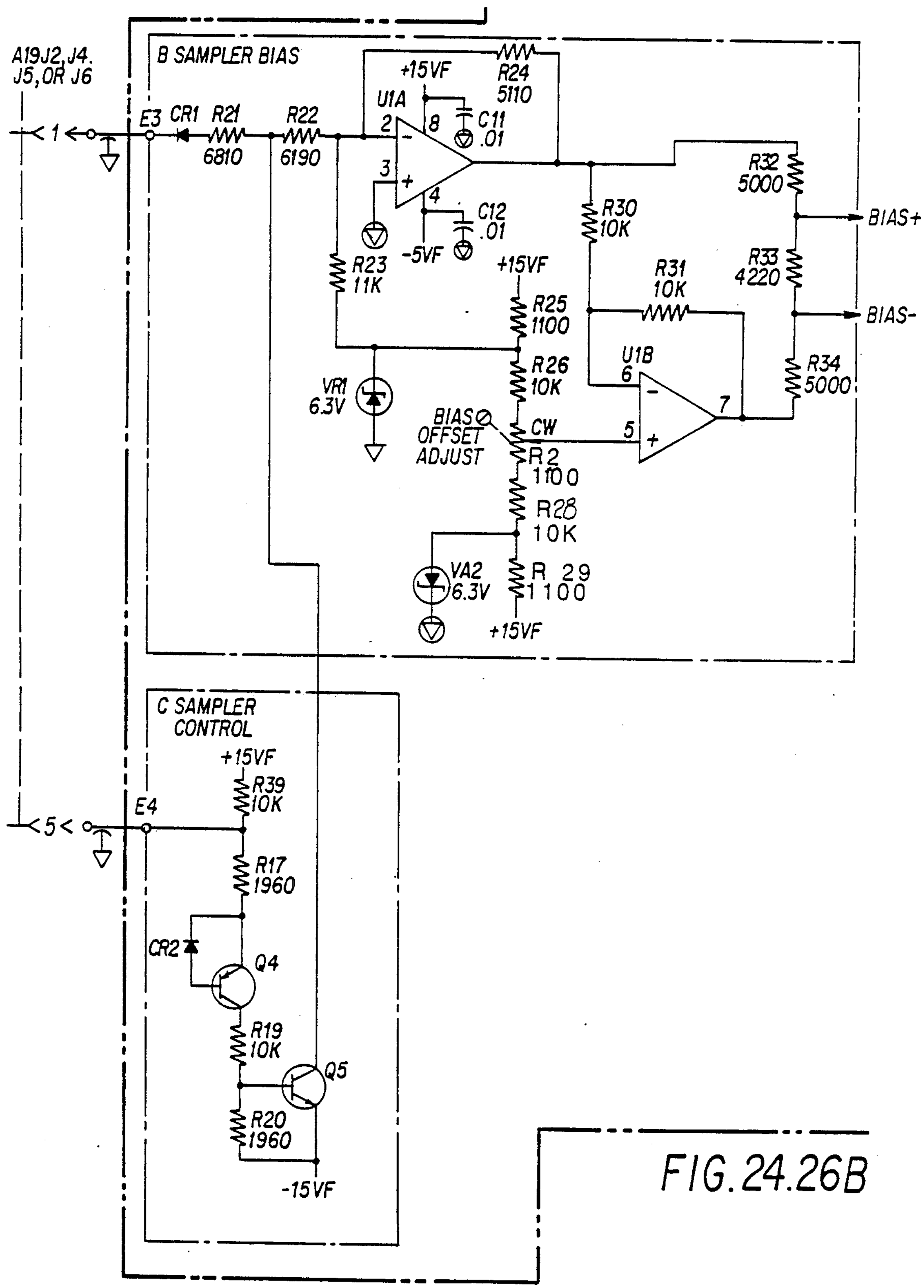
FIG. 24.26B

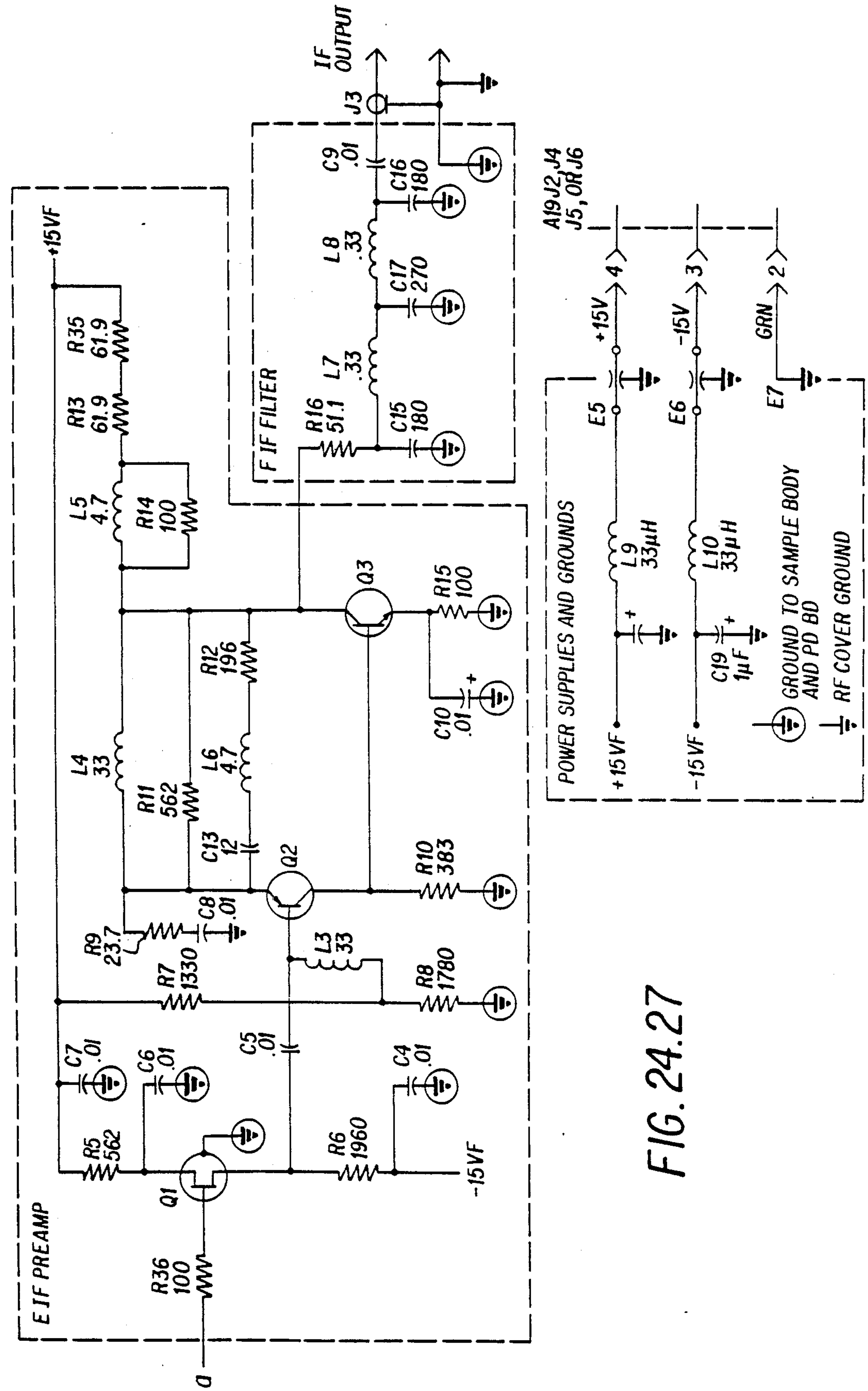
FIG. 24.27

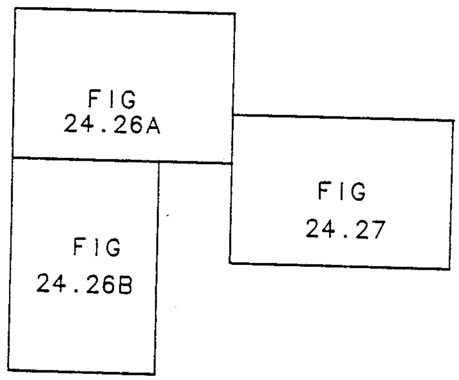
FIG 24.28
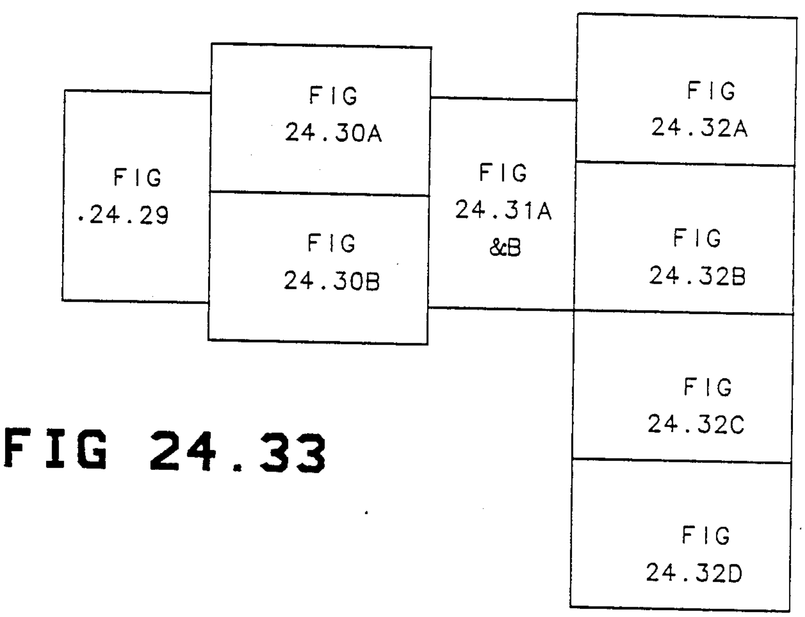
FIG 24.33

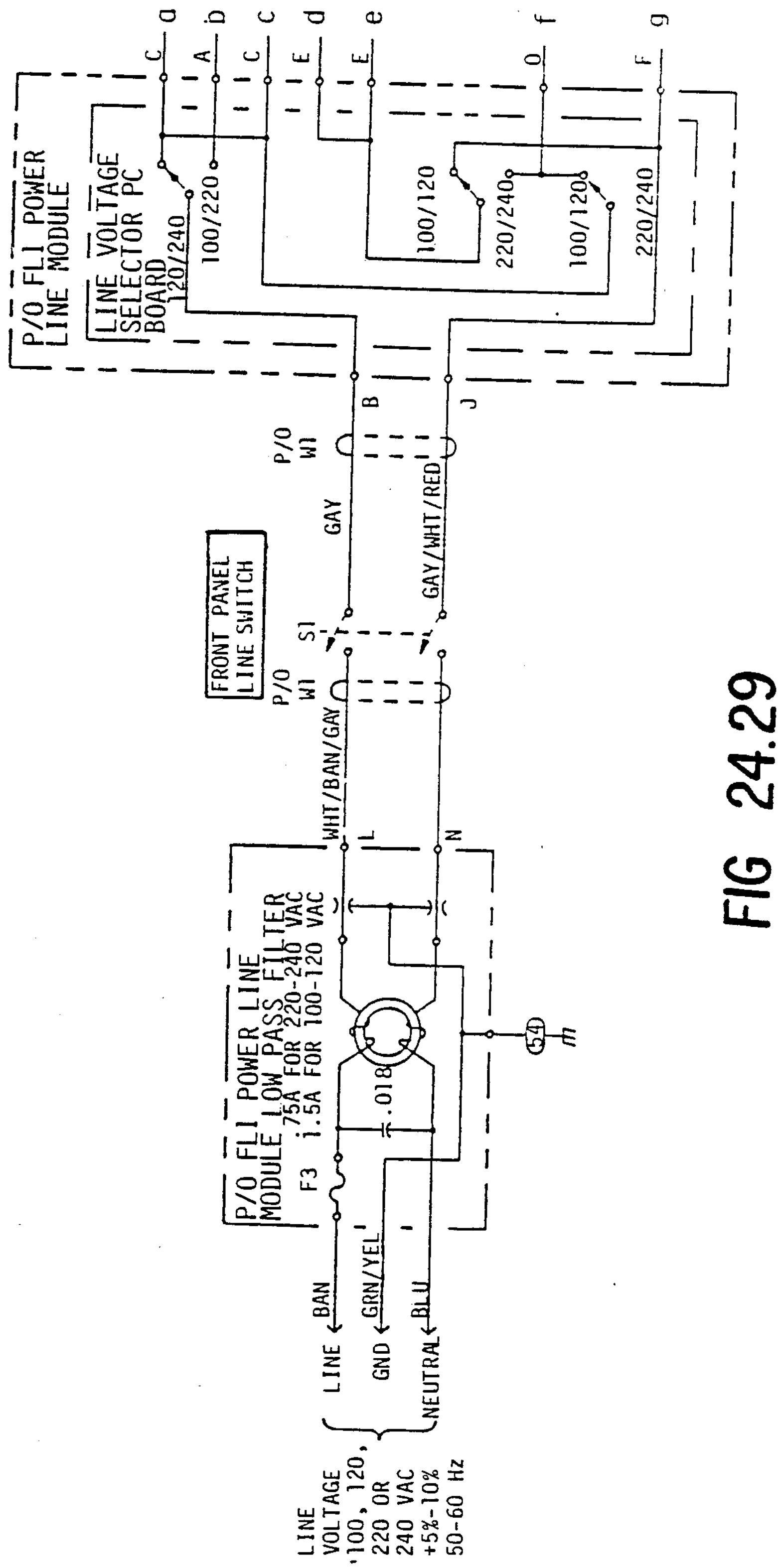
FIG 24.29

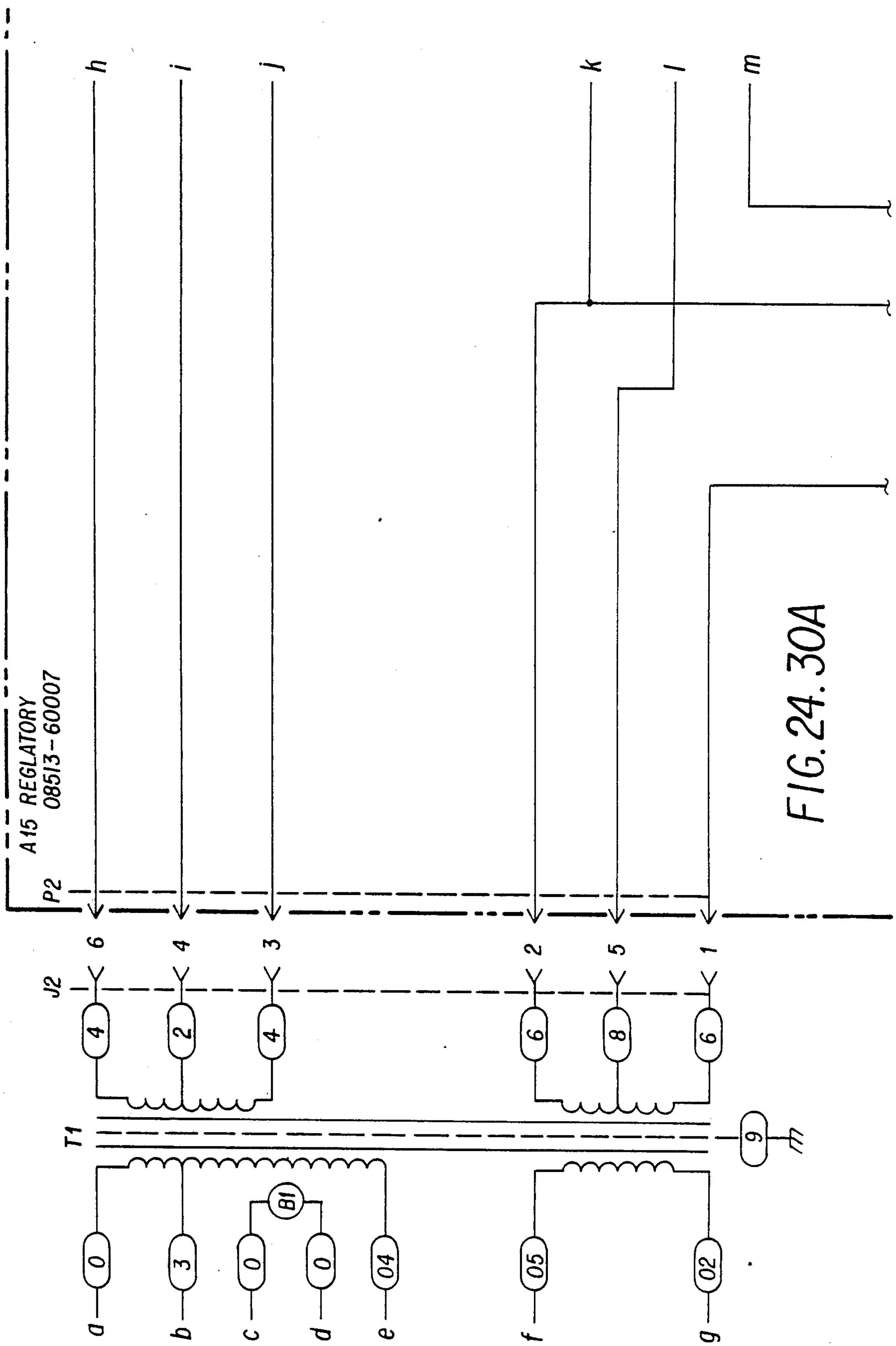
FIG. 24.30A

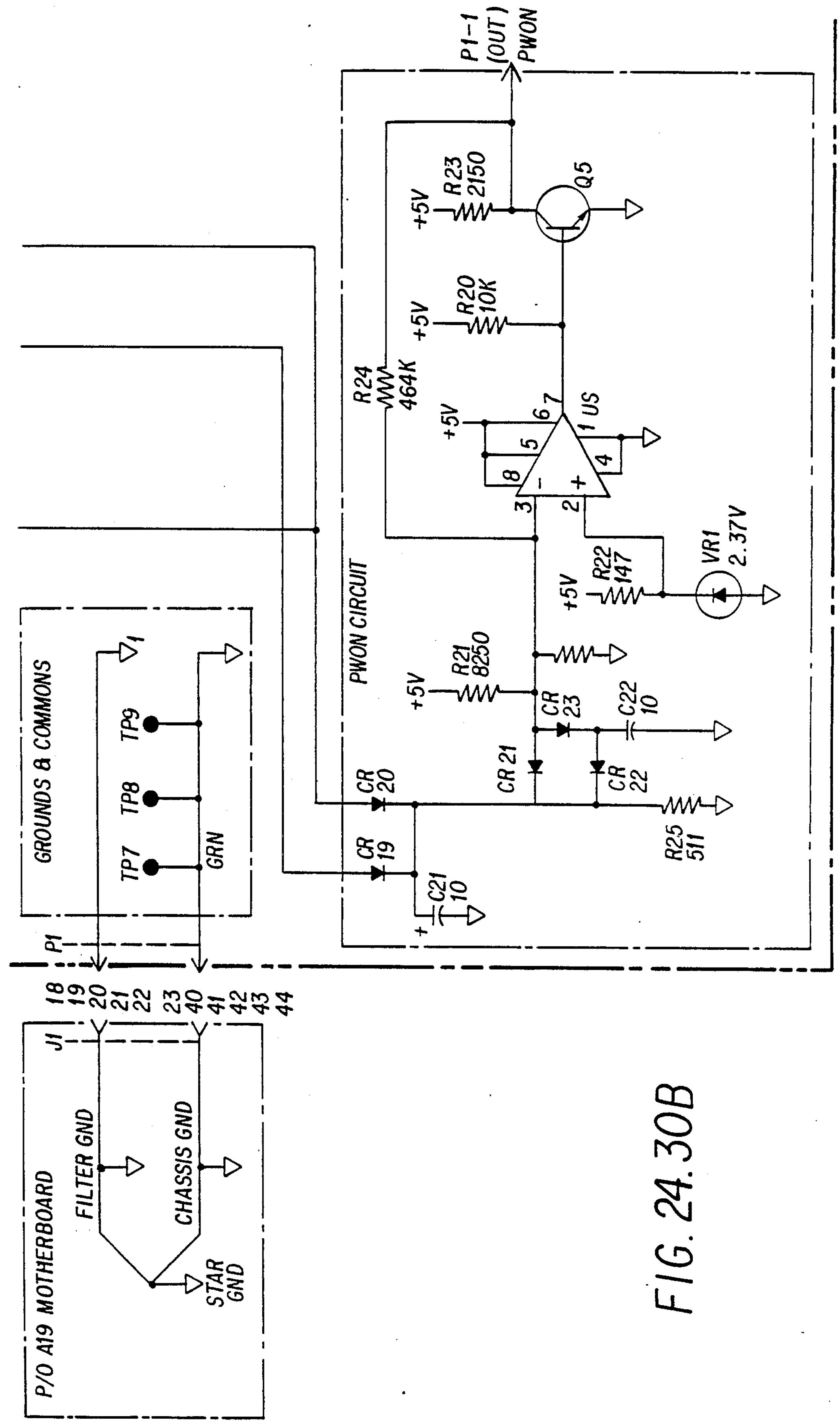
FIG. 24.30B

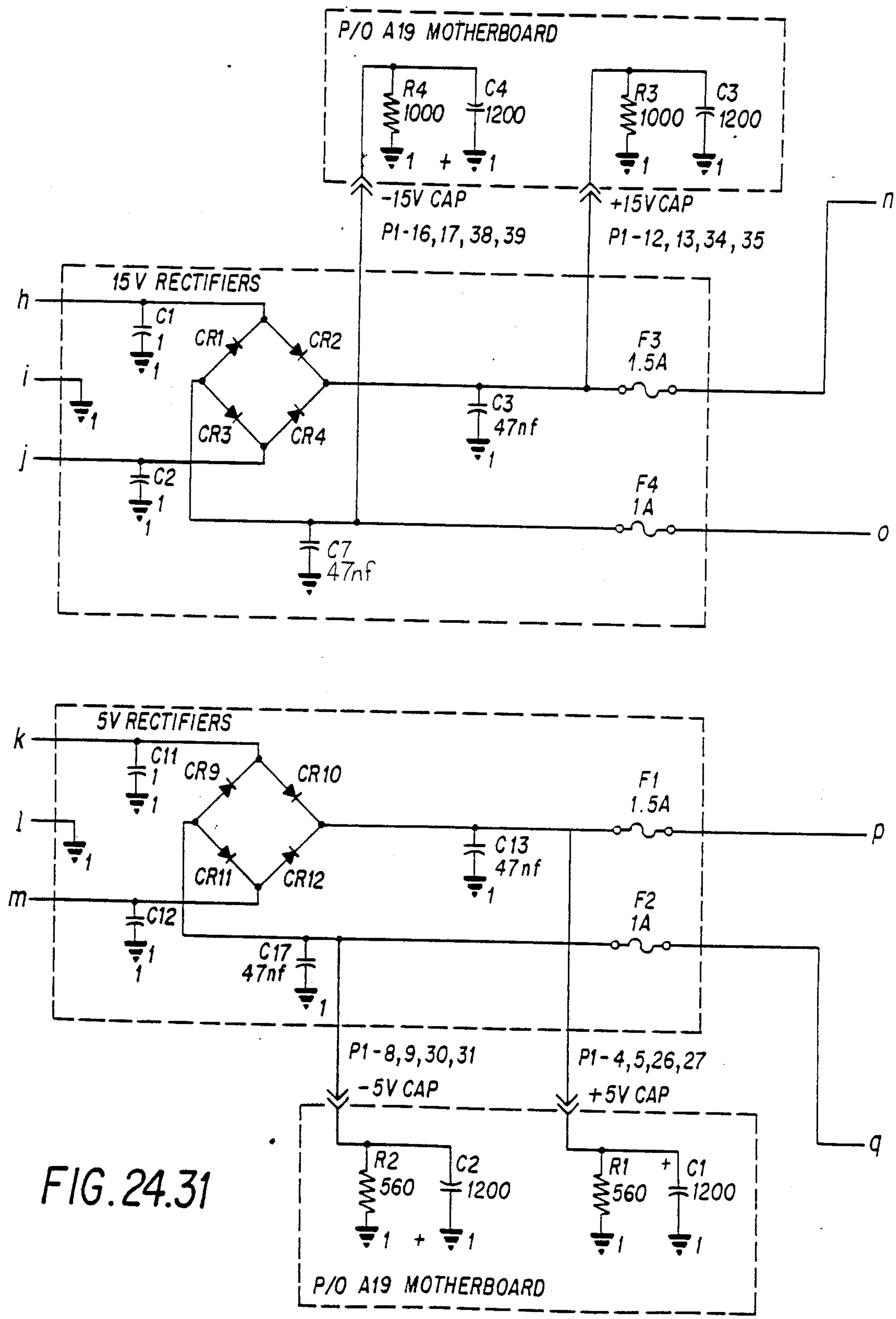
FIG. 24.31

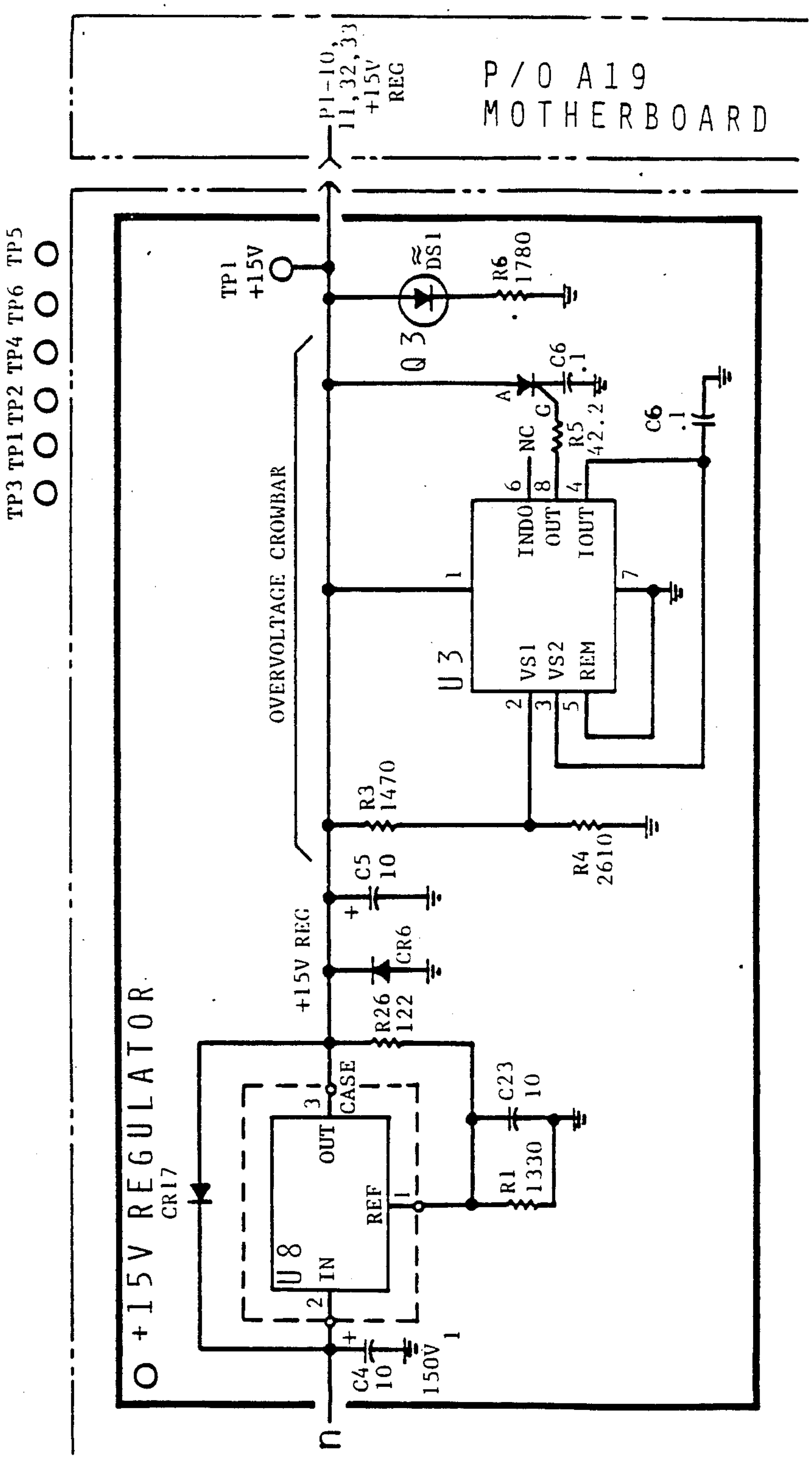
FIG 24.32A

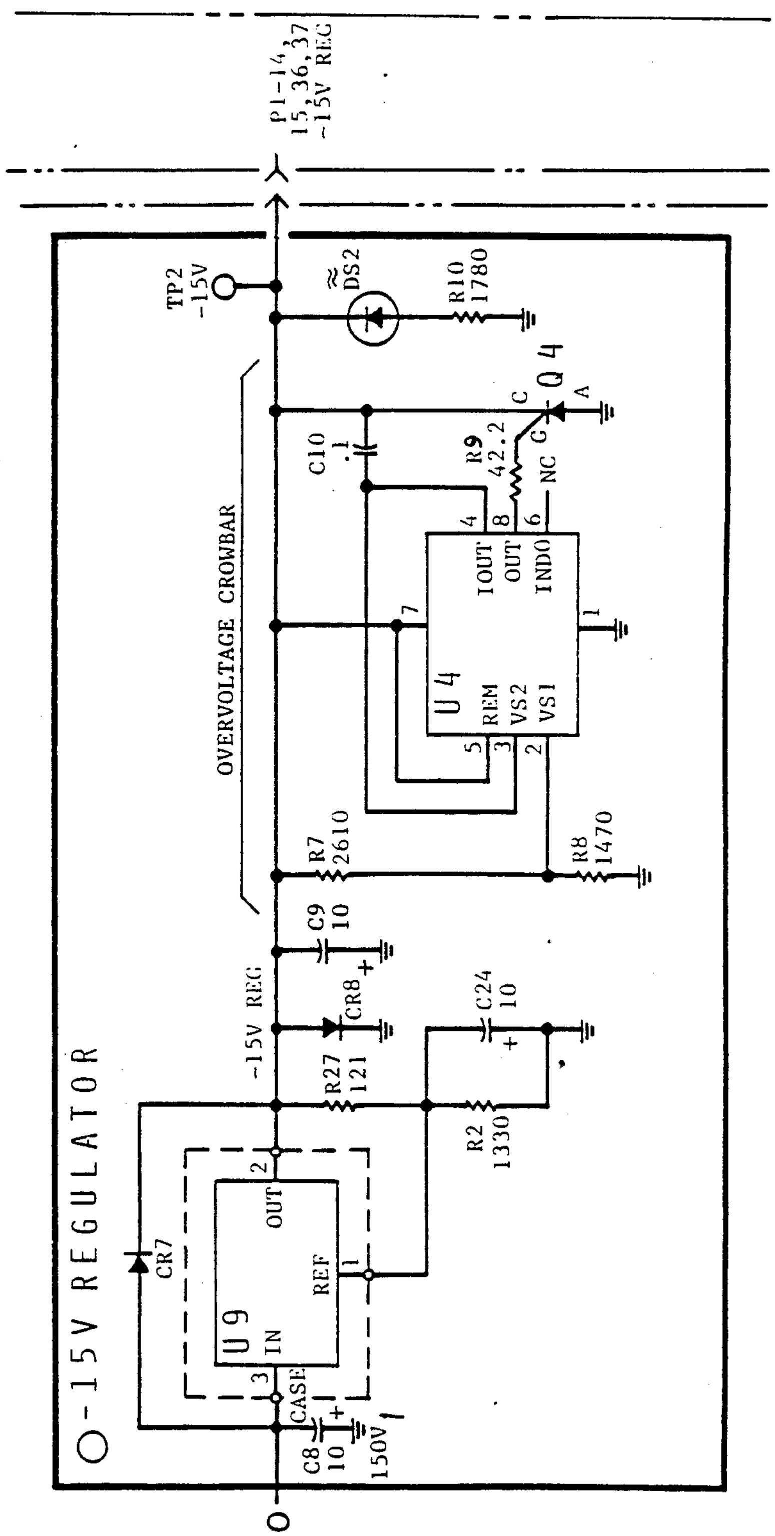
FIG 24.32B

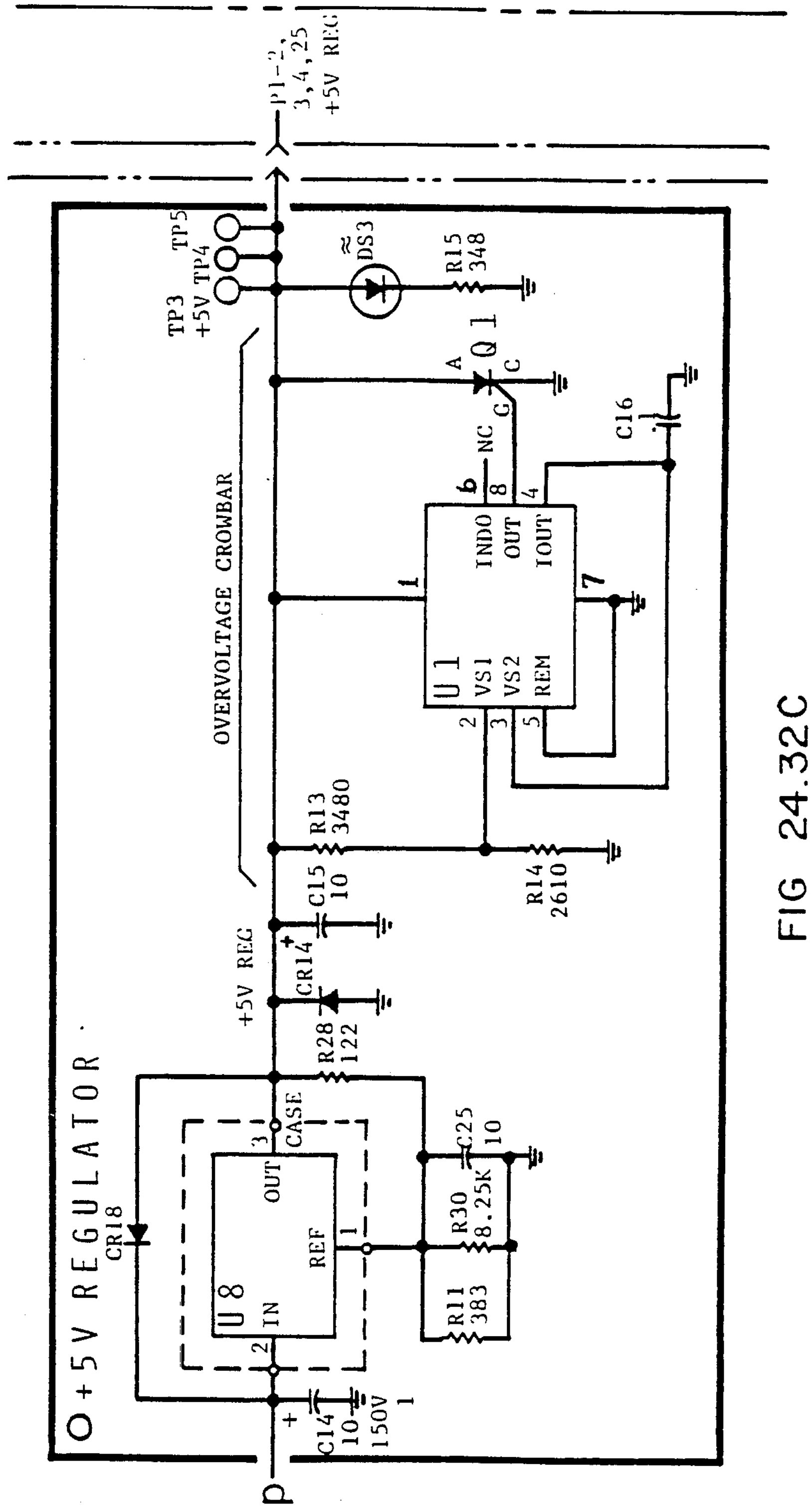
FIG 24.32C

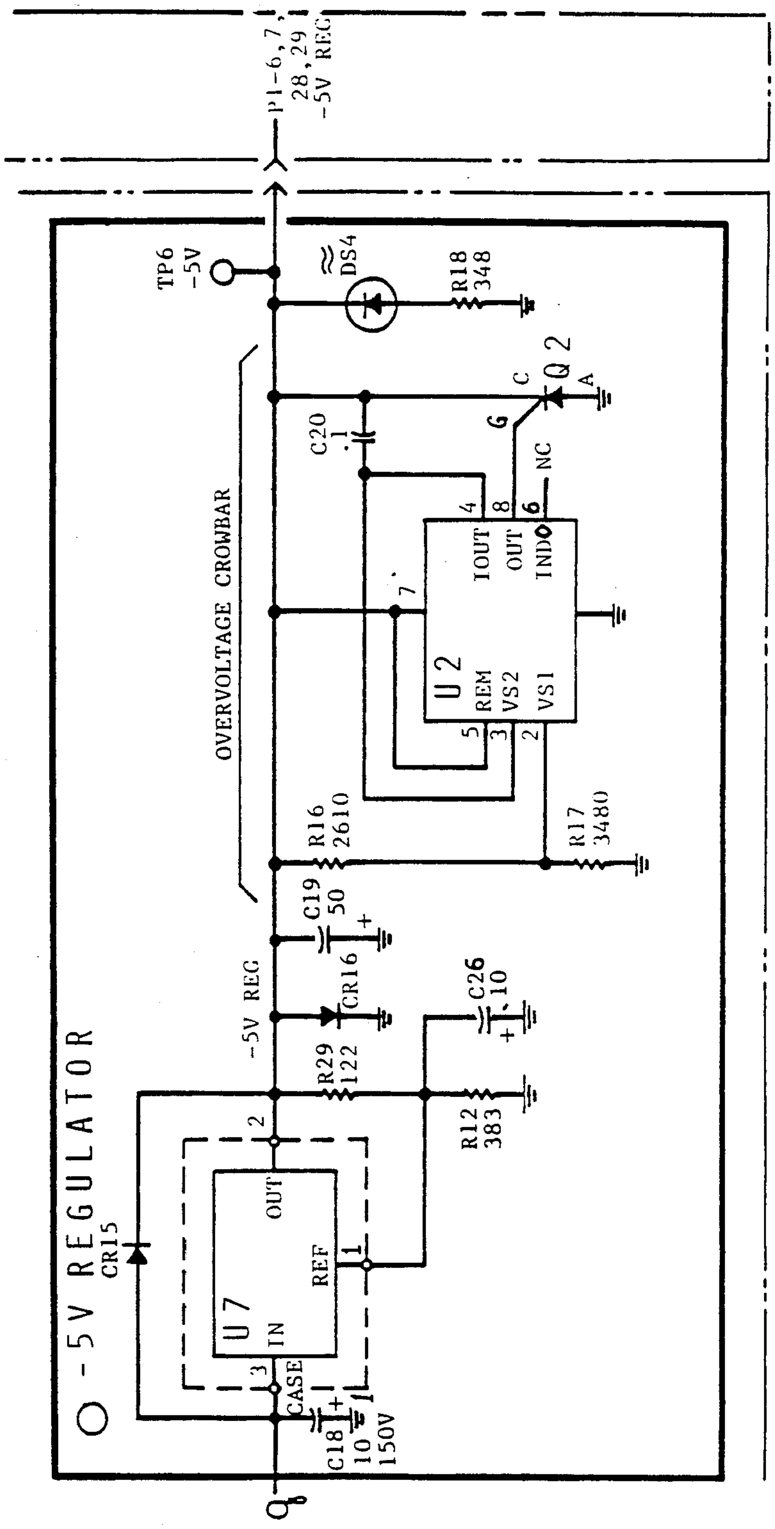
FIG 24.32D

FIG. 25.1A
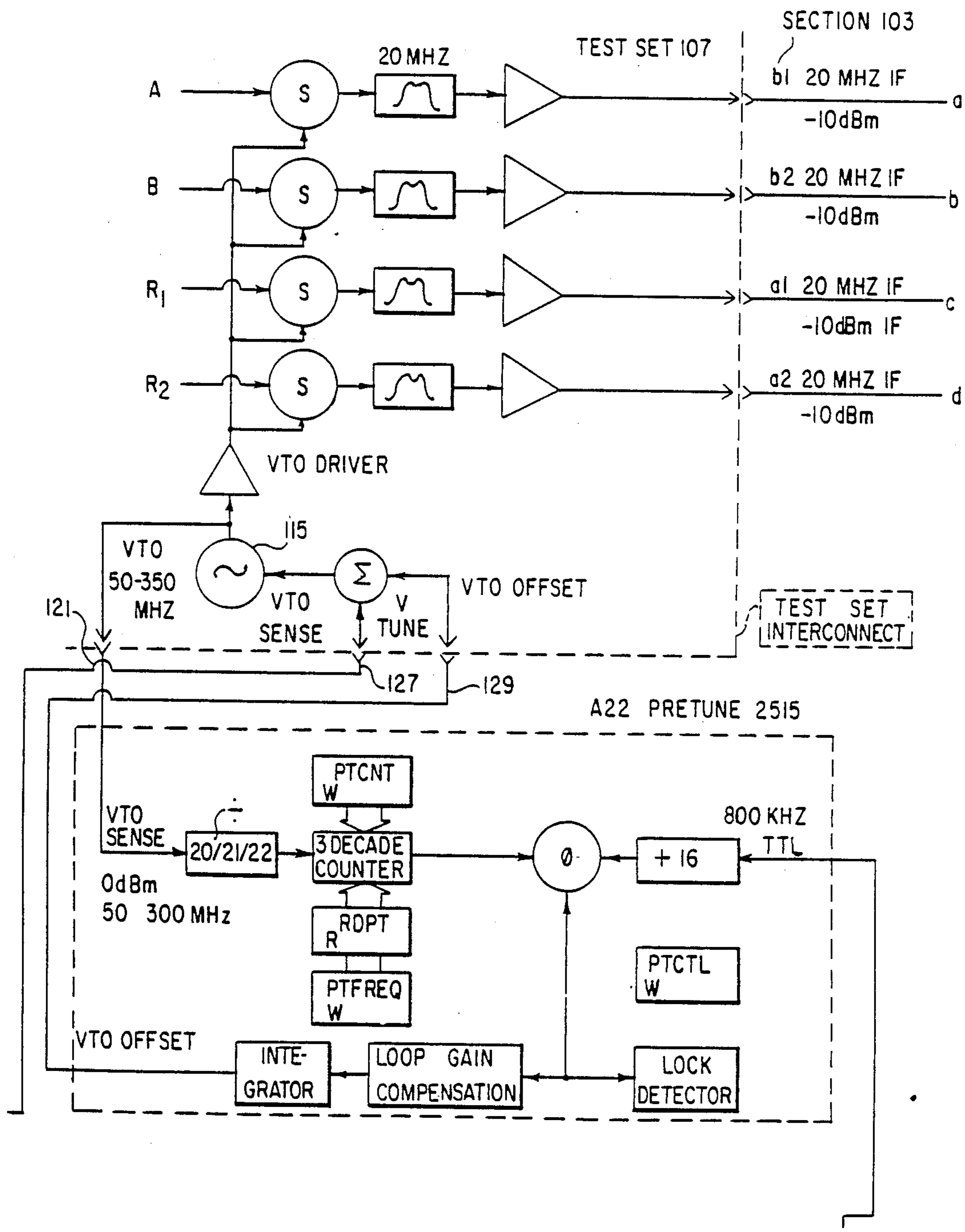

FIG. 25.1B
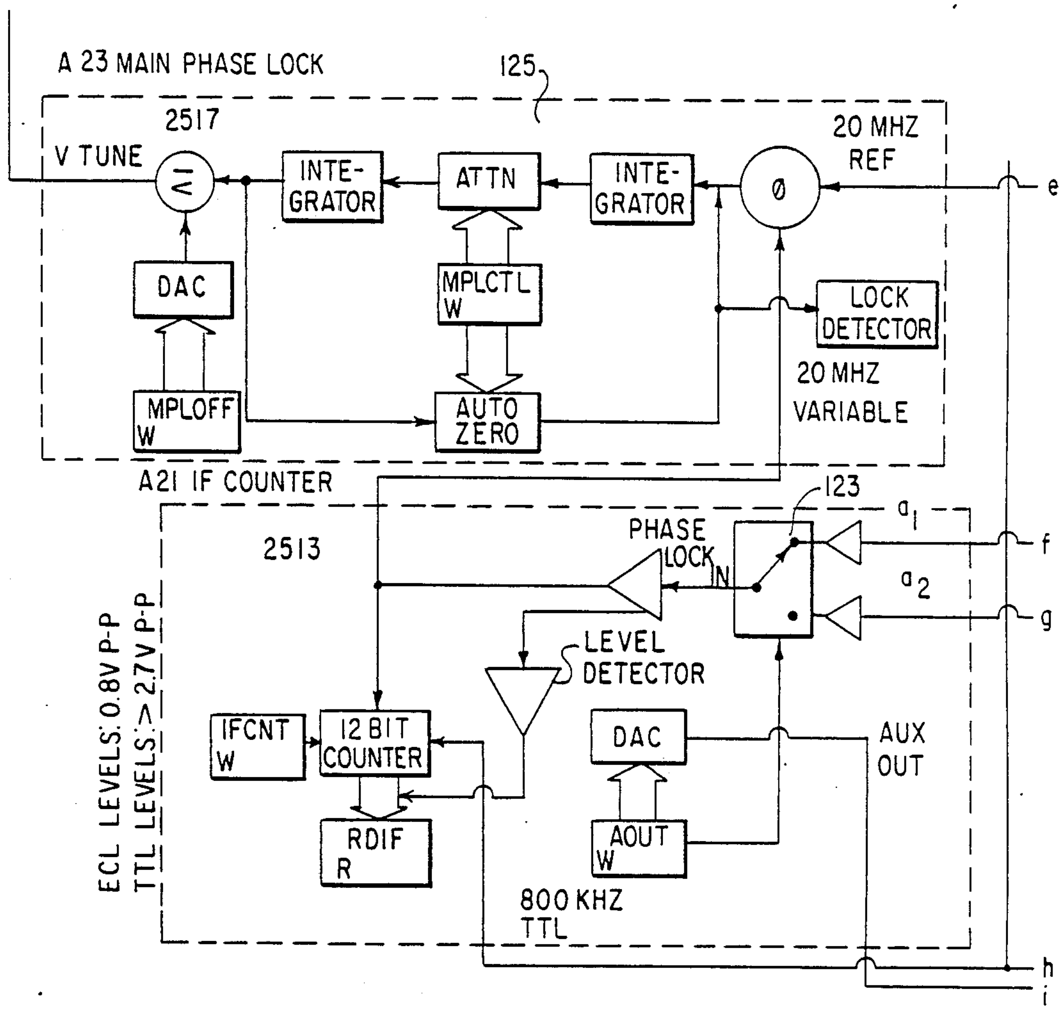

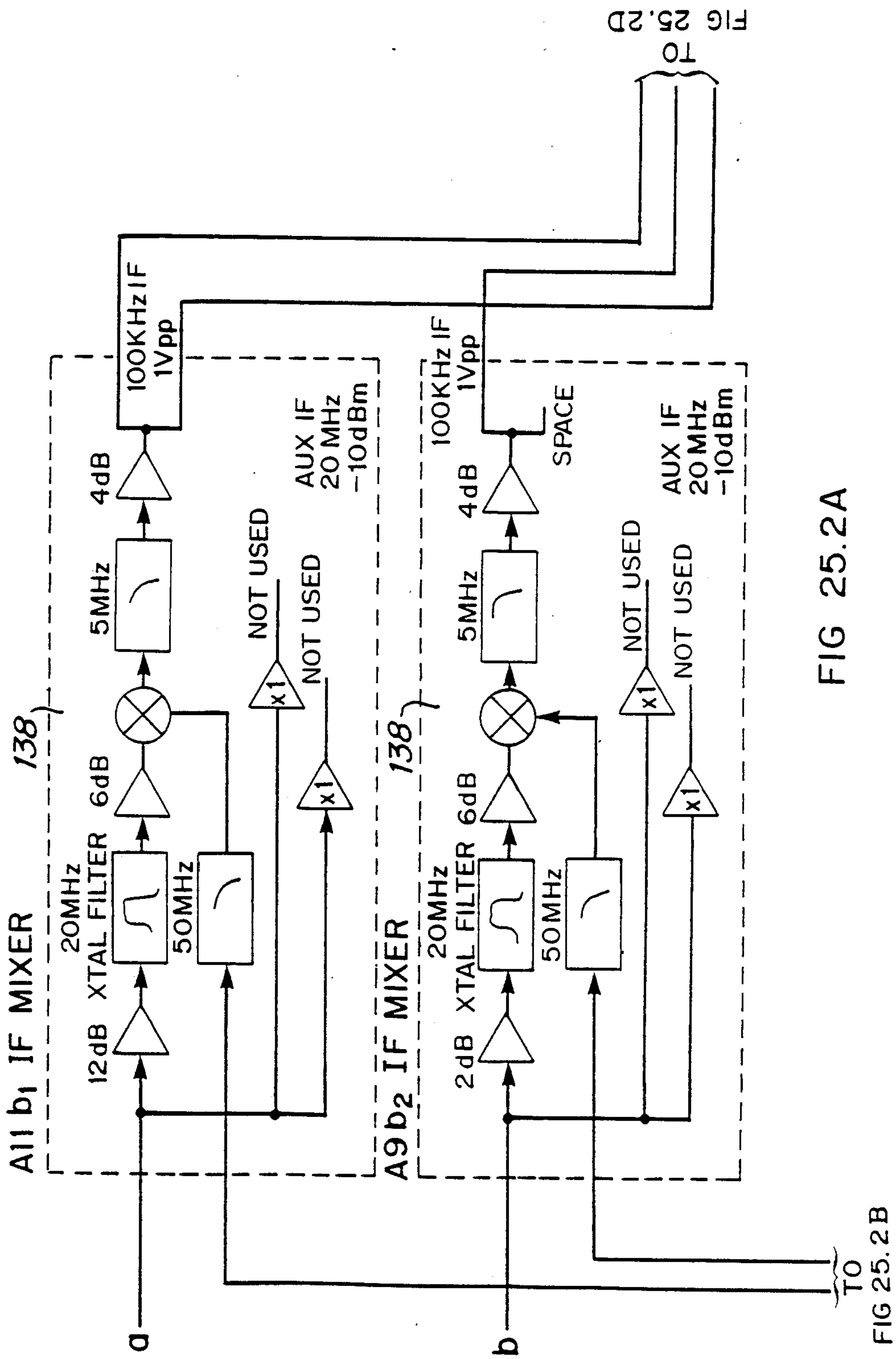
FIG 25.2A

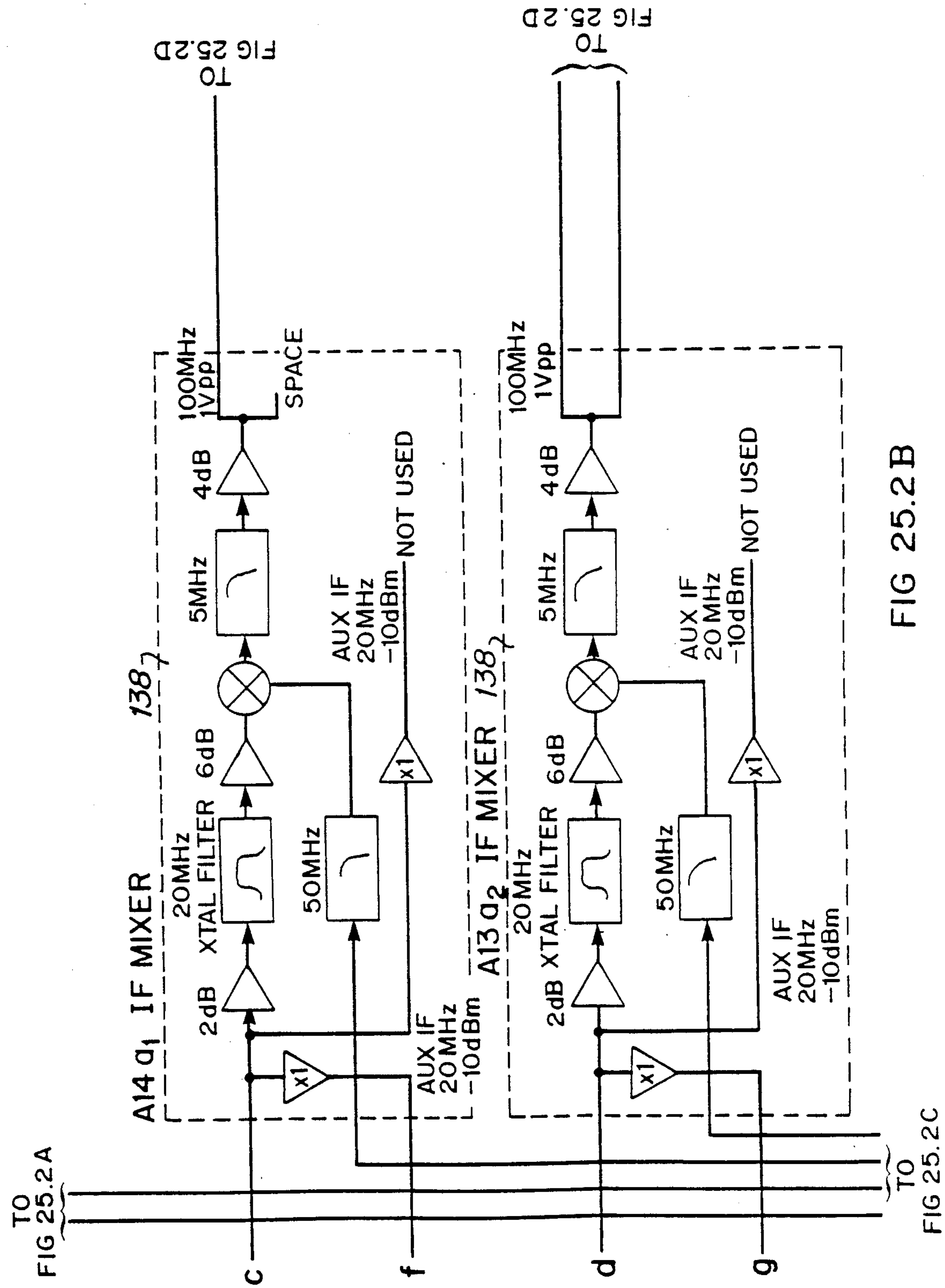
FIG 25.2B

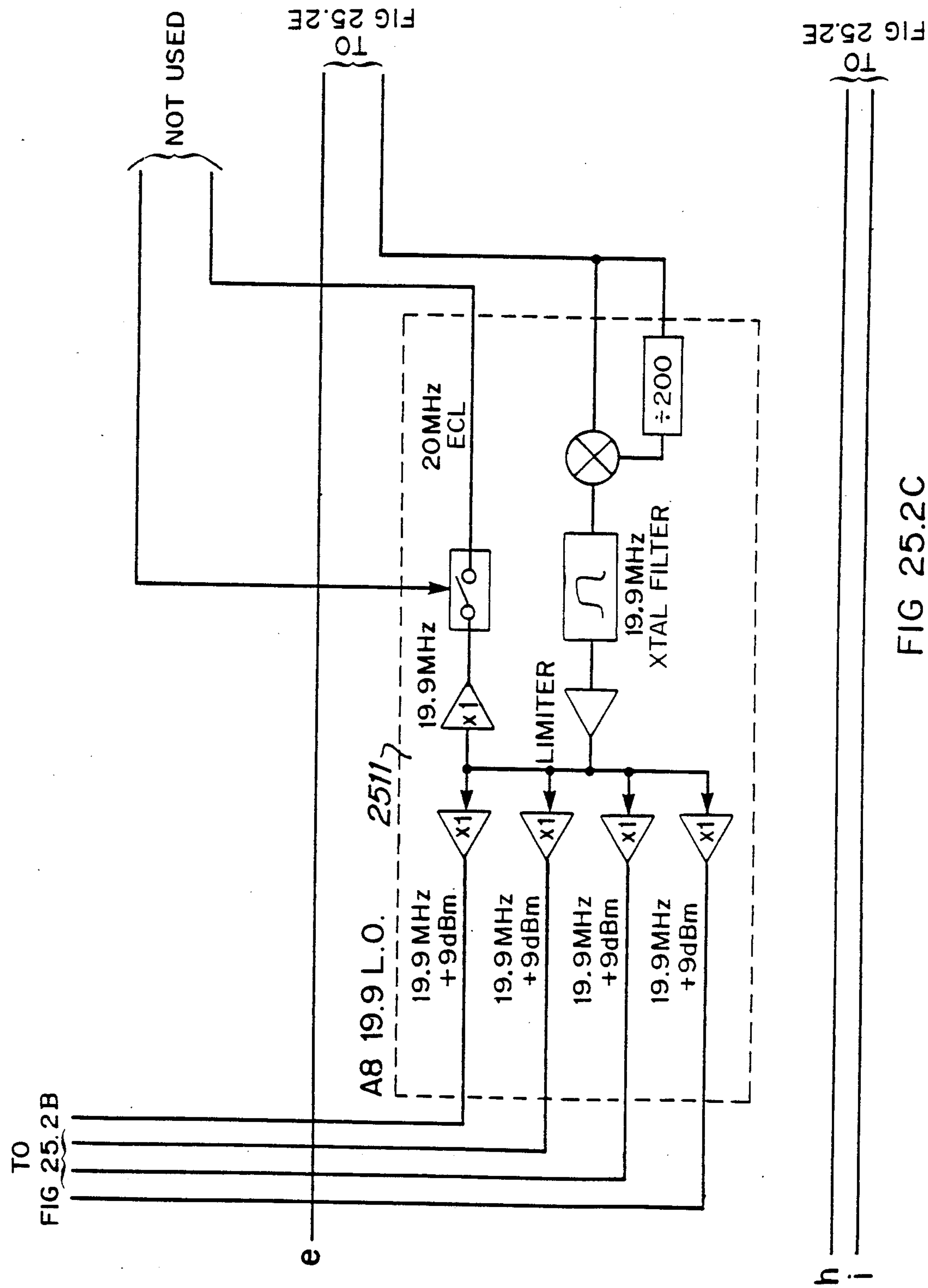
FIG 25.2C

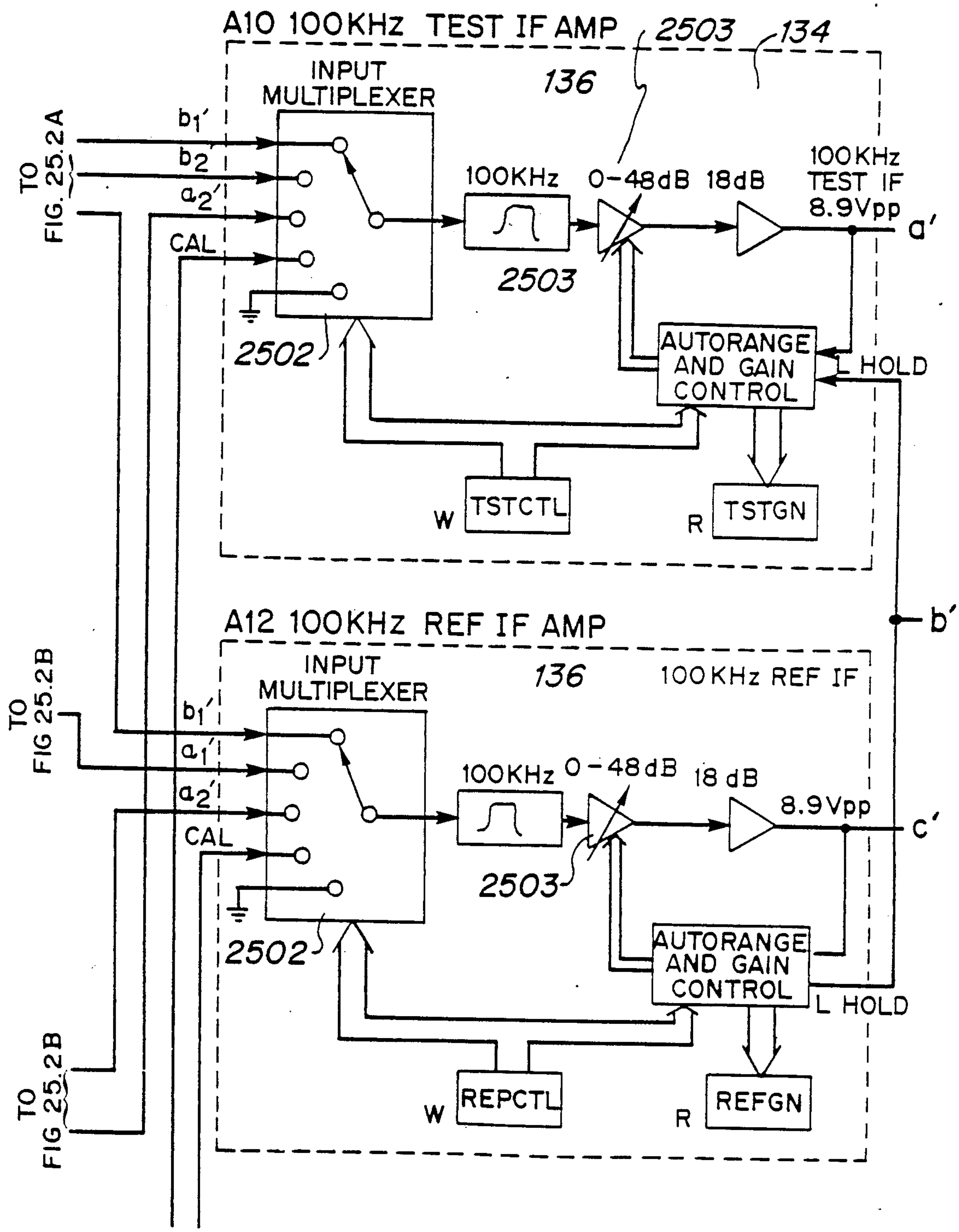
FIG. 25.2D

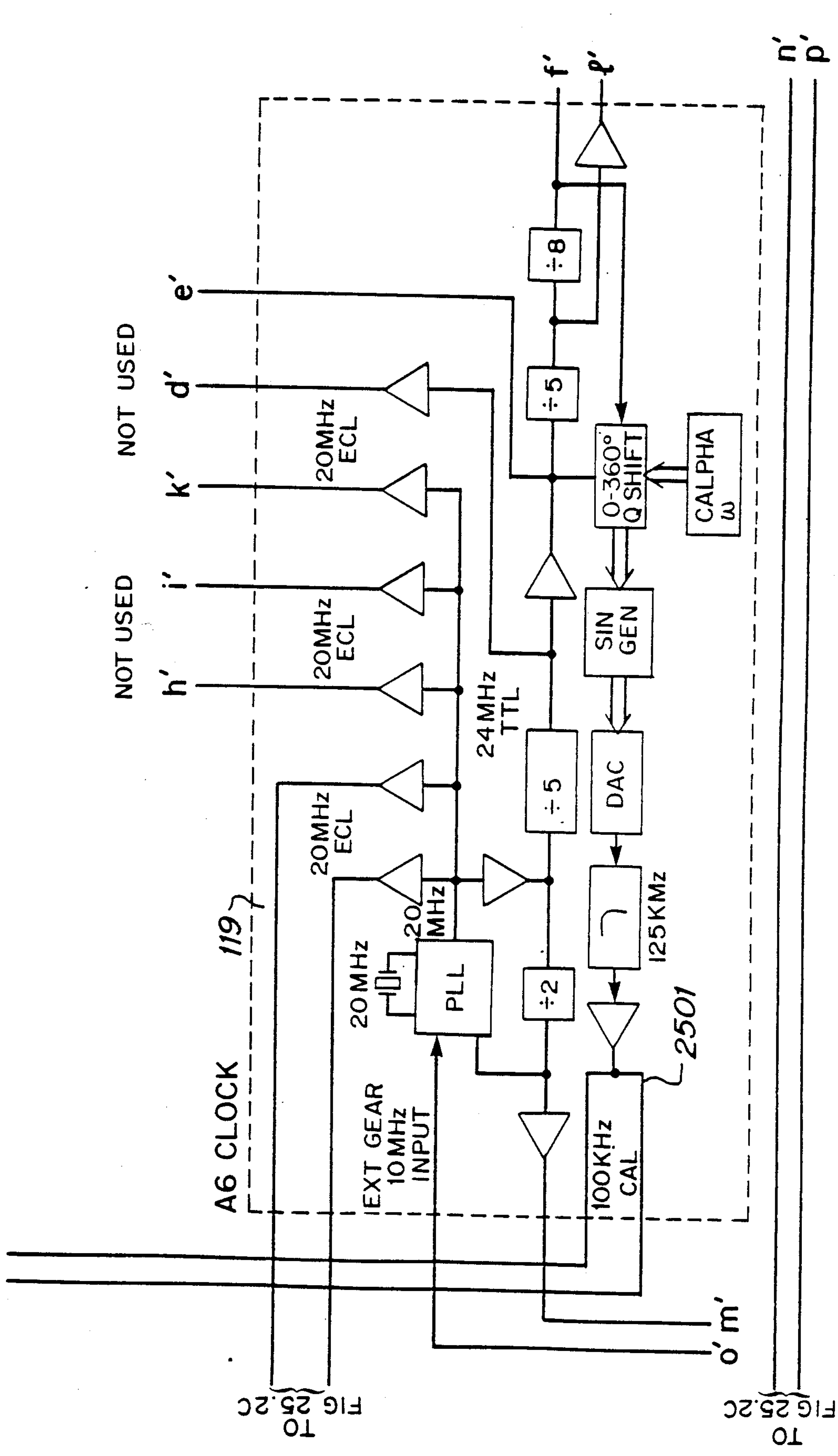
FIG 25.2E

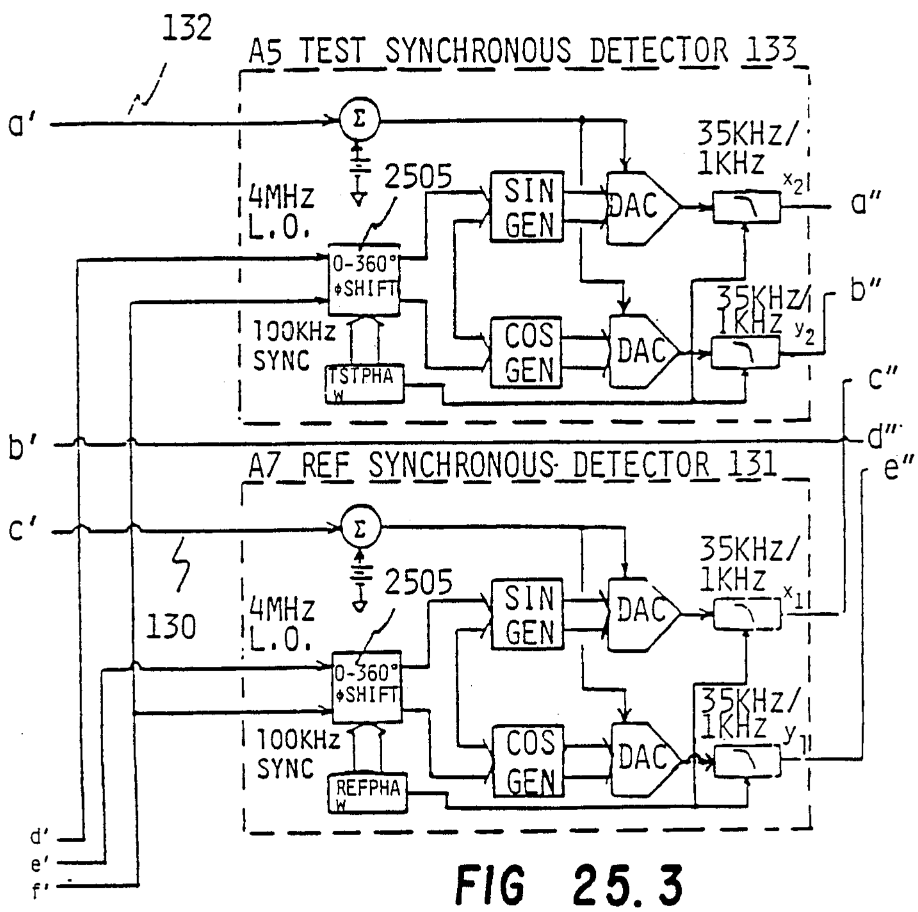
FIG 25.3
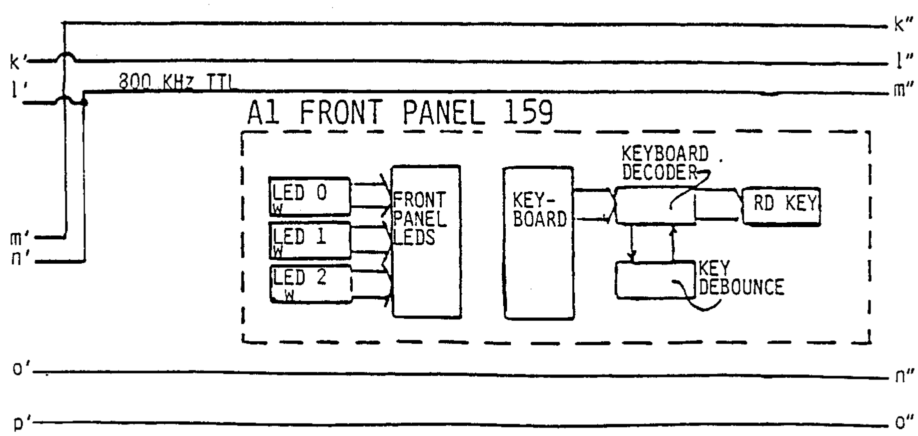
FIG 25.4

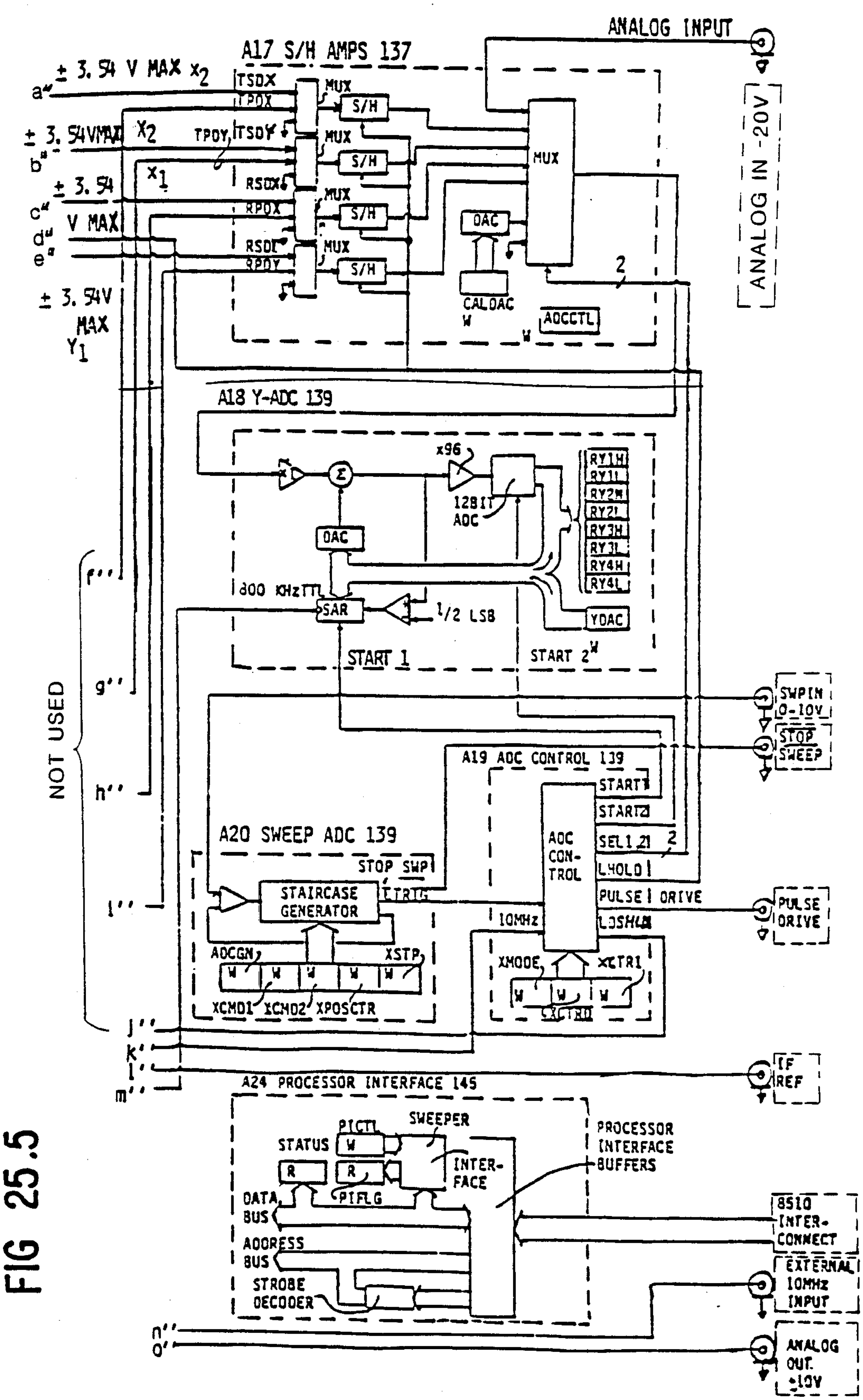
FIG 25.5

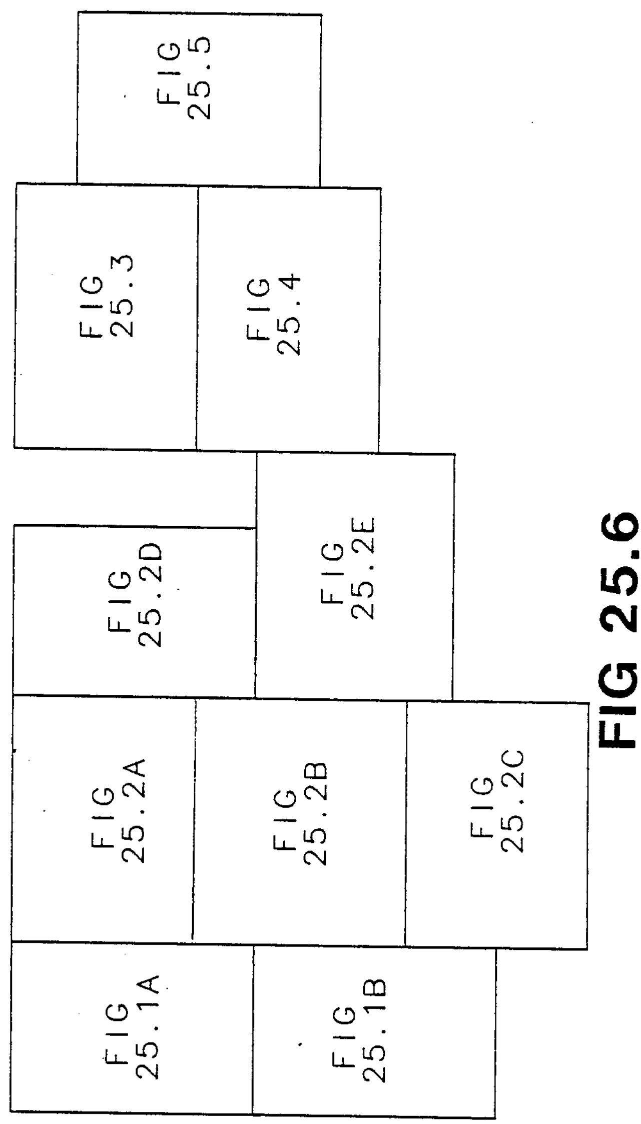
FIG 25.6

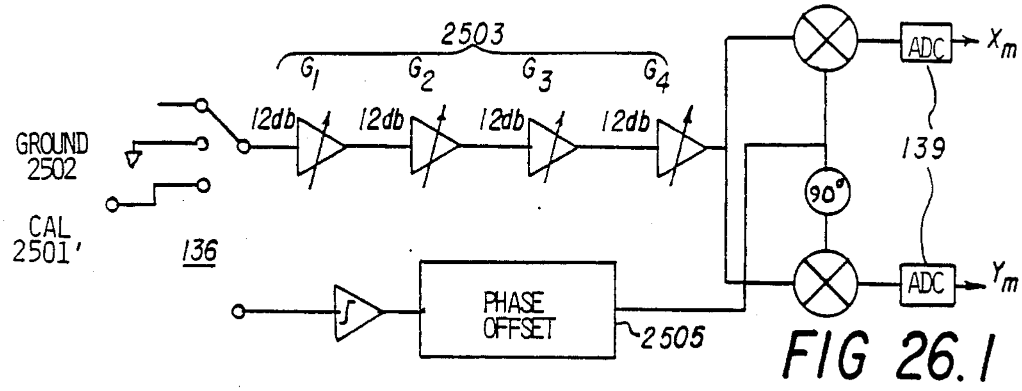

FIG 26.1

$$\begin{bmatrix} X \\ Y \end{bmatrix} = \underbrace{\begin{bmatrix} H_{11} & H_{12} \\ H_{21} & H_{22} \end{bmatrix}}_{[H]} \begin{bmatrix} X_m - X_0 \\ Y_m - Y_0 \end{bmatrix}$$

FIG 26.2

$$X_0 = \frac{1}{4} \Sigma X_m \quad ; \quad y_0 = \frac{1}{4} \Sigma Y_m$$

FIG 26.3

$$1)\ \begin{bmatrix} X \\ Y \end{bmatrix}_{0°} = \begin{bmatrix} A \\ 0 \end{bmatrix} ;\ 2)\ \begin{bmatrix} X \\ Y \end{bmatrix}_{90°} = \begin{bmatrix} 0 \\ A \end{bmatrix} ;\ 3)\ \begin{bmatrix} X \\ Y \end{bmatrix}_{180°} = \begin{bmatrix} -A \\ 0 \end{bmatrix} ;\ 4)\ \begin{bmatrix} X \\ Y \end{bmatrix}_{270} = \begin{bmatrix} 0 \\ -A \end{bmatrix}$$

FIG 26.4

$$\underbrace{\begin{bmatrix} 1 \\ 0 \\ 0 \\ 1 \end{bmatrix}}_{A} \begin{bmatrix} H_{11} \\ H_{12} \\ H_{21} \\ H_{22} \end{bmatrix} = \frac{A}{\Sigma(x^2)\Sigma(y^2) - (\Sigma(xy))^2} \cdot \begin{bmatrix} 0 & -(Y_1-Y_3) & (X_1-X_3) \\ (Y_1-Y_3) & -(X_1-X_3) & 0 \\ 0 & -(Y_2-Y_4) & (X_2-X_4) \\ (Y_2-Y_4) & -(X_2-X_4) & 0 \end{bmatrix} \begin{bmatrix} \Sigma(x^2) \\ \Sigma(xy) \\ \Sigma(y^2) \end{bmatrix}$$

FIG 26.5

$$a_1 = A \cdot \left[ \frac{(X_1-X_3) + (Y_2-Y_4)}{\Sigma(X^2) + \Sigma(Y^2)} \right.$$

$$b_1 = A \cdot \left. \frac{(X_2-X_4) + (Y_3-Y_1)}{\Sigma(X^2) + \Sigma(Y^2)} \right]$$

FIG 26.6

PI A6 CLOCK

| PIN | SIGNAL | TO/FROM | FUCTION CLOCK |
|---|---|---|---|
| 1<br>23 | | | |
| 2 | LTSDS | A5 | A |
| 24 | LRSDS | A7 | A |
| 3 | LTIFWS | A10 | A |
| 25 | LRIFWS | A12 | A |
| 4 | LTIFRS | A10 | A |
| 26<br>5 | LRIFRS<br>LHOST | A12<br>ADR BUS | A<br>A |
| 27 | LIFSRQ | | |
| 6 | CLK | A2 - A5 A16-A21 | F |
| 28 | LRDS | | |
| 7 | GND | | |
| 29 | Aϕ | ADR BUS | A |
| 8 | A1 | ADR BUS | A |
| 30 | A2 | ACR BUS | A |
| 9 | A3 | ADR BUS | A |
| 31 | A4 | ADR BUS | A |
| 10<br>32 | +15V REG | POWER BUS | I |
| 11<br>33 | GND | | I |
| 12<br>34 | GND | | I |
| 13<br>35 | -15V REG | POWER BUS | I |
| 14<br>36 | +5V REG | POWER BUS | I |
| 15 | BUF D8ϕ | DATA BUS | C |
| 37 | BUF D81 | " | C |
| 16 | BUF D82 | " | C |
| 38 | BUF D83 | " | C |
| 17 | BUF D84 | " | C |
| 39 | BUF D85 | " | C |
| 18 | BUF D86 | " | C |
| 40 | BUF D87 | " | C |
| 19<br>41 | 100 KHz<br>RET | A5, A7 | F<br>F |
| 20 | 100K SA | A5 | F |
| 42 | 100K SB | A7 | F |
| 21<br>43 | 100KHz<br>RETA | A5, A7 | F<br>F |
| 22<br>44 | | | |

FIG. 27.1A

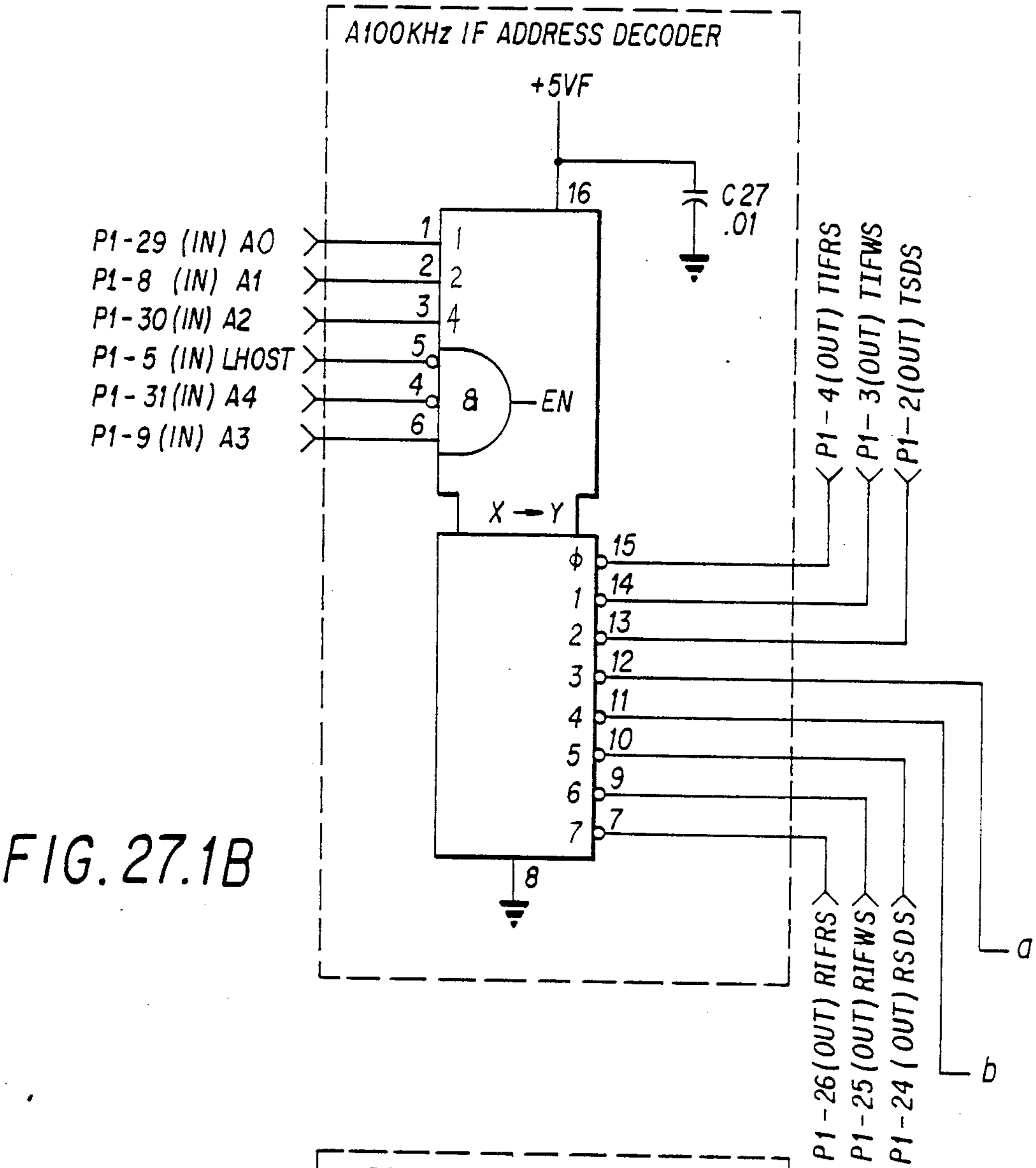
FIG. 27.1B
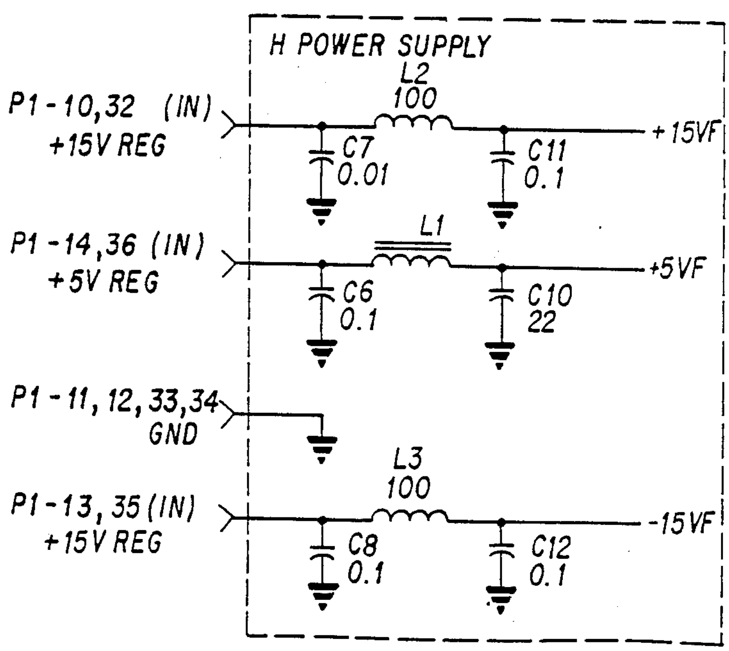
FIG. 27.1C

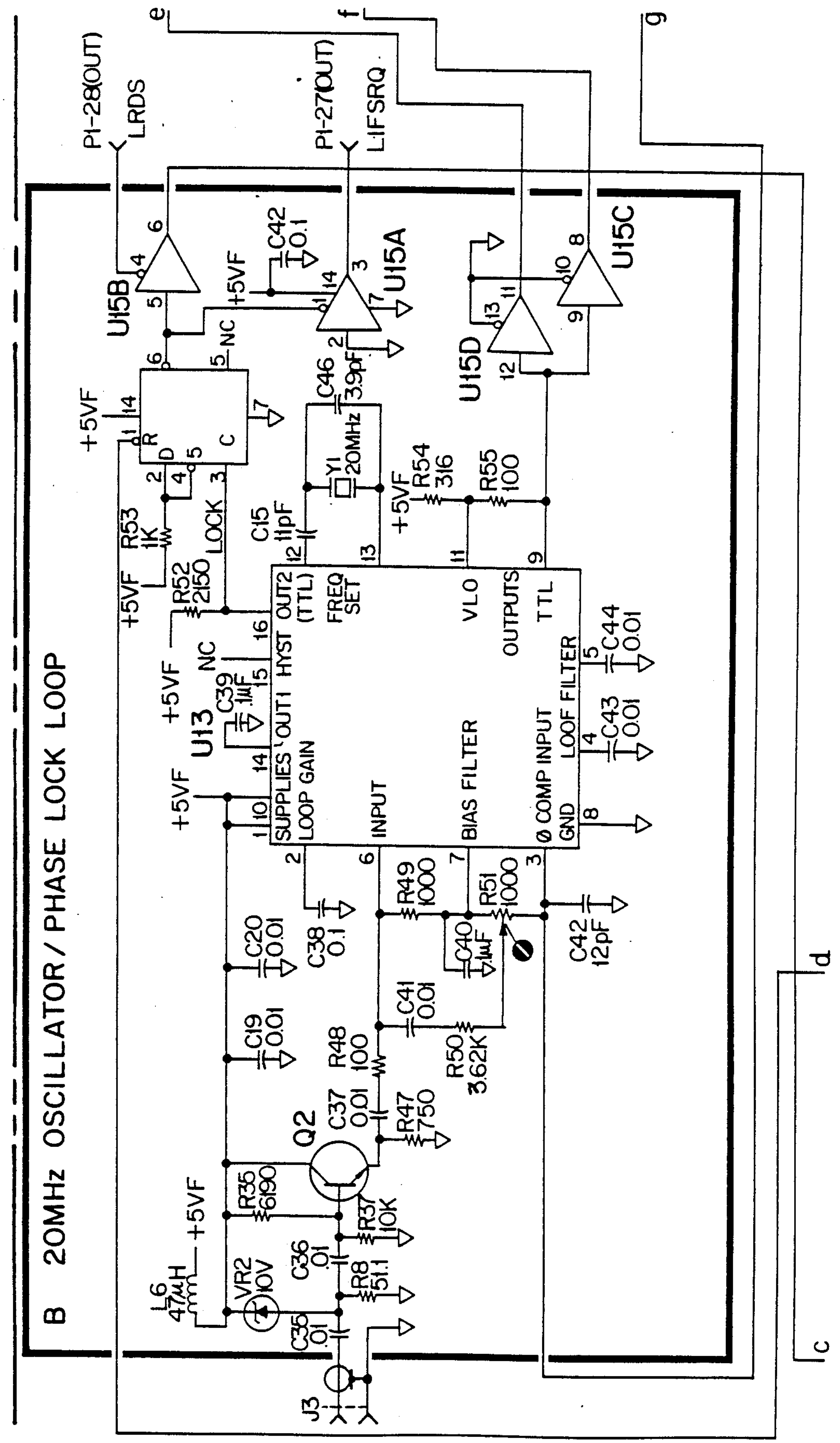
FIG 27.2

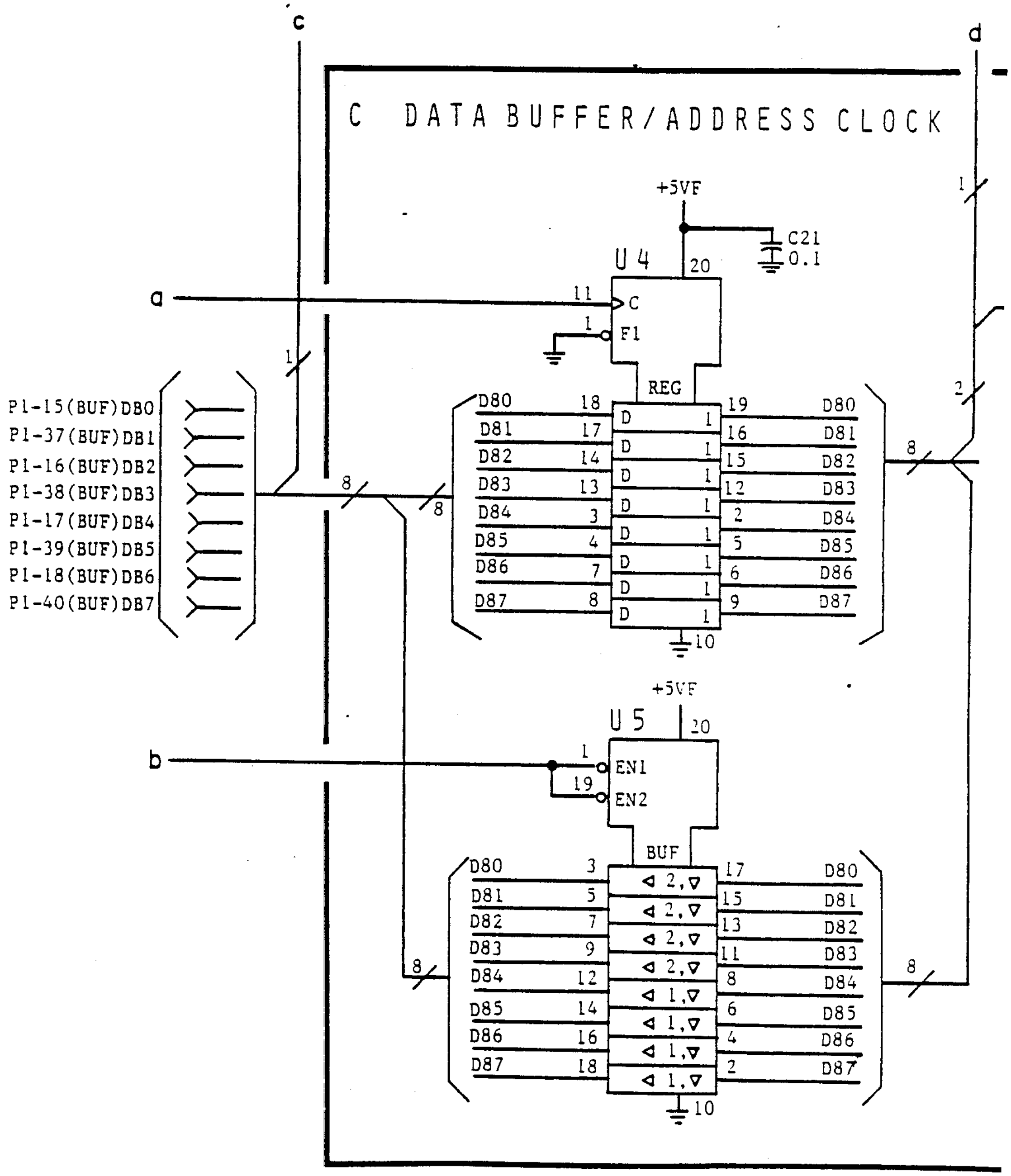
FIG 27.3A

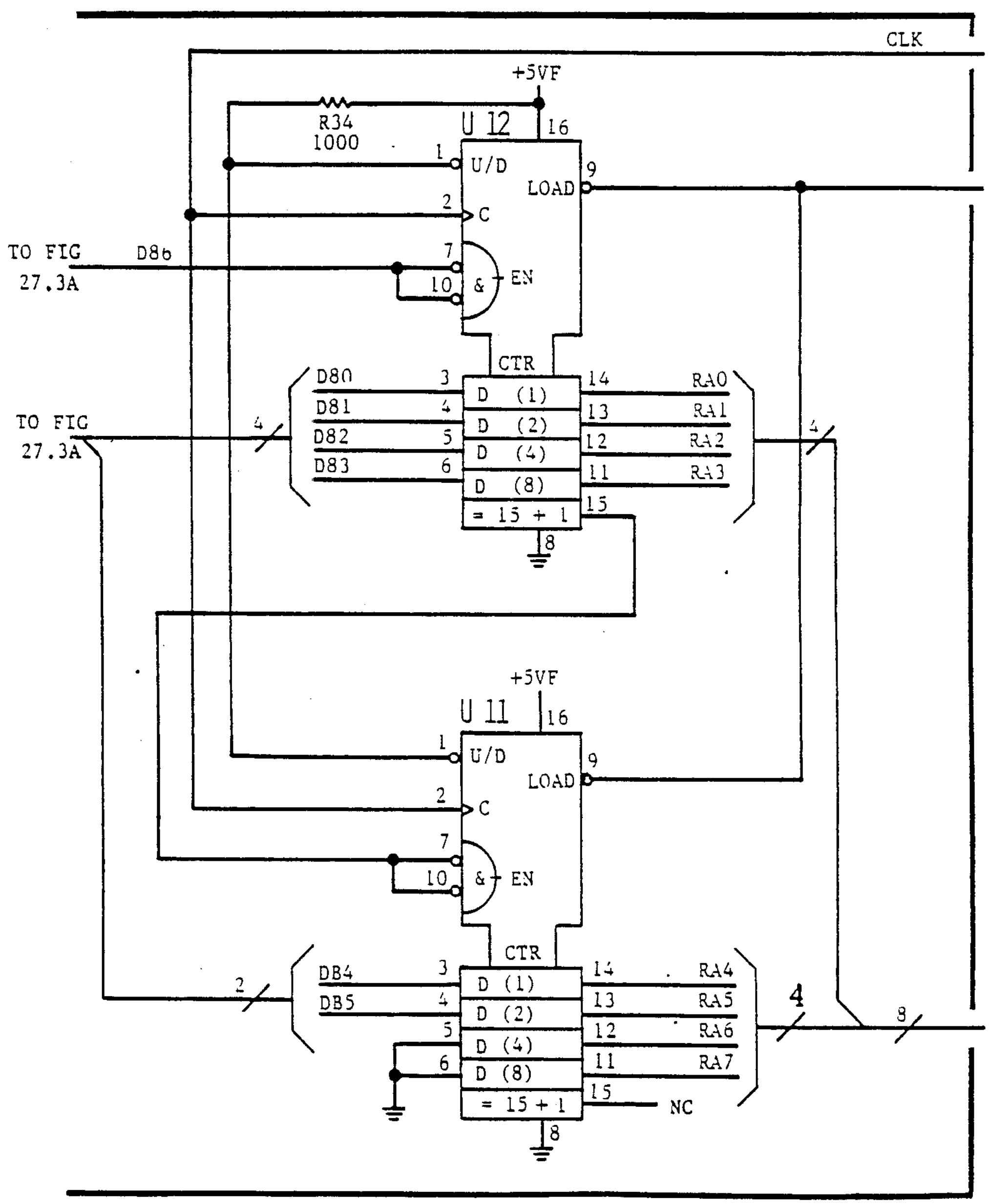
FIG 27.3B

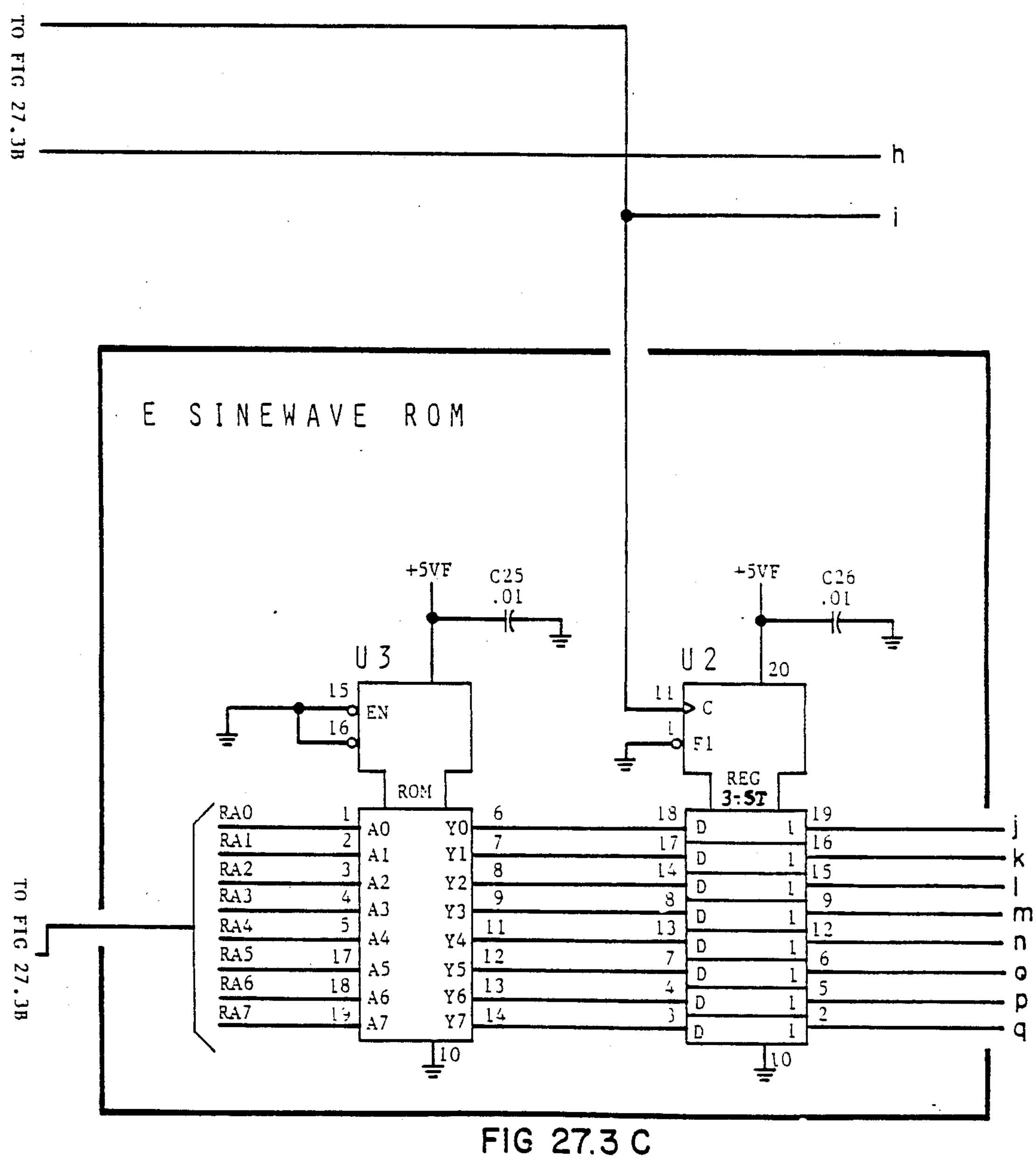
FIG 27.3 C

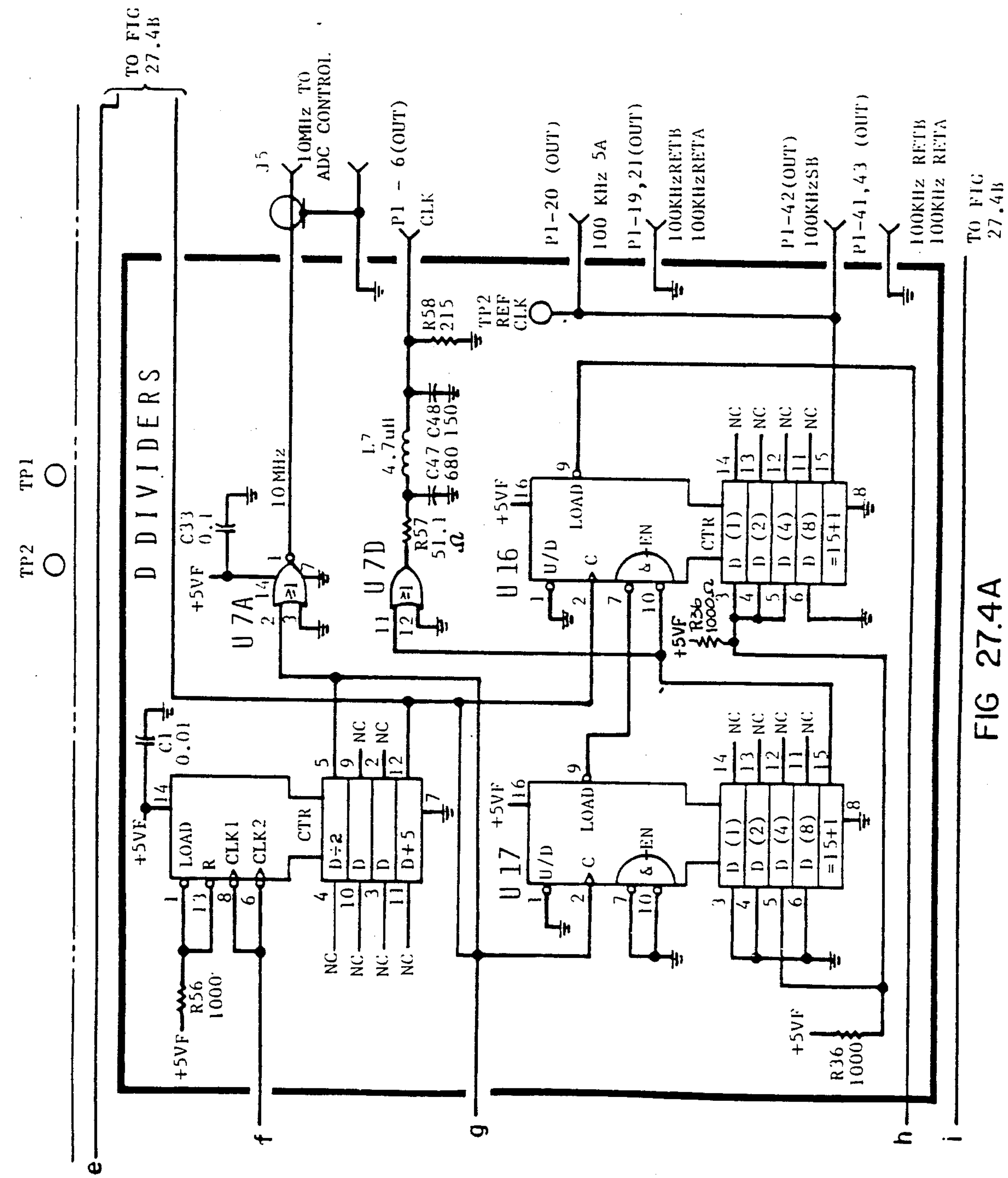
FIG 27.4A

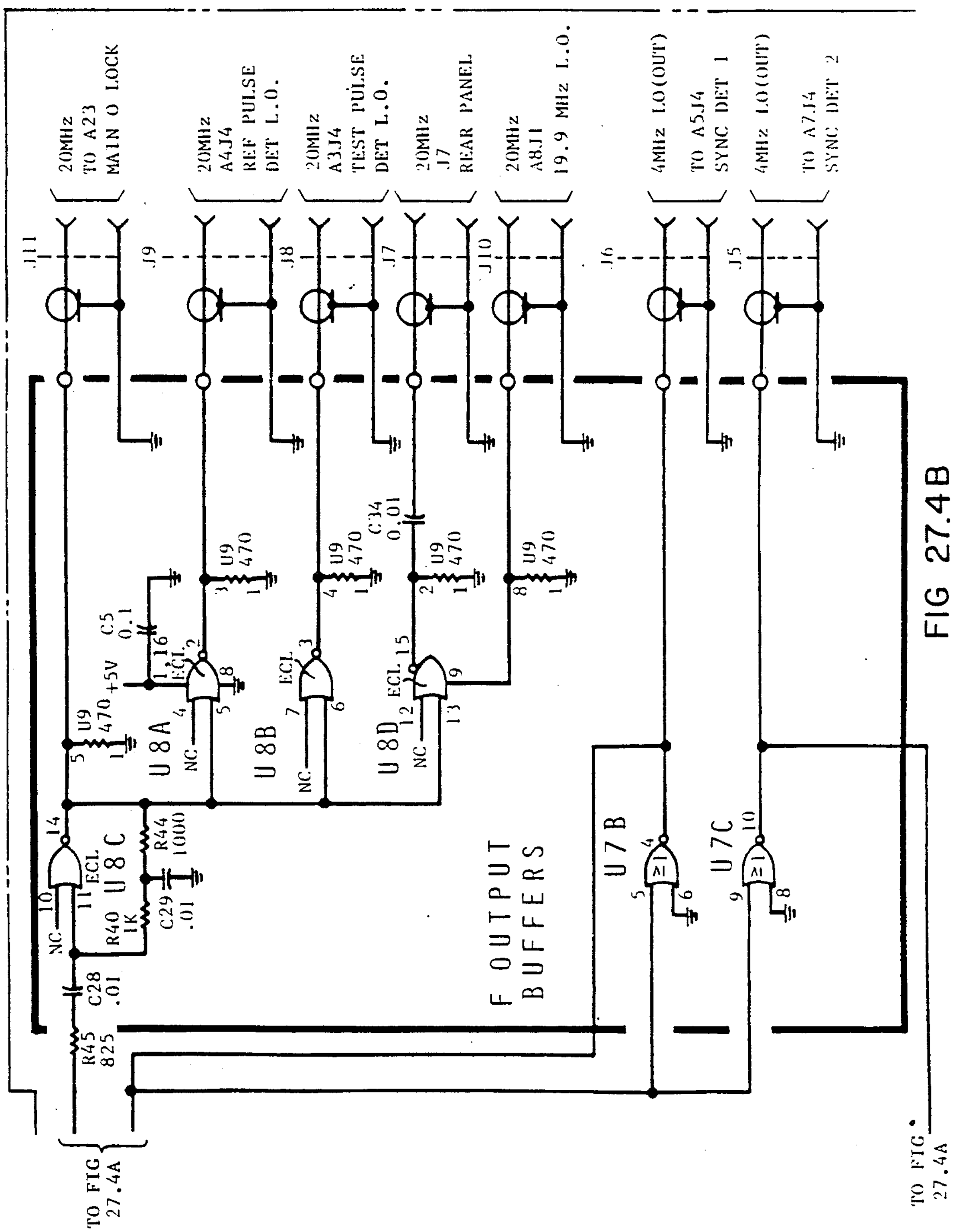
FIG 27.4B

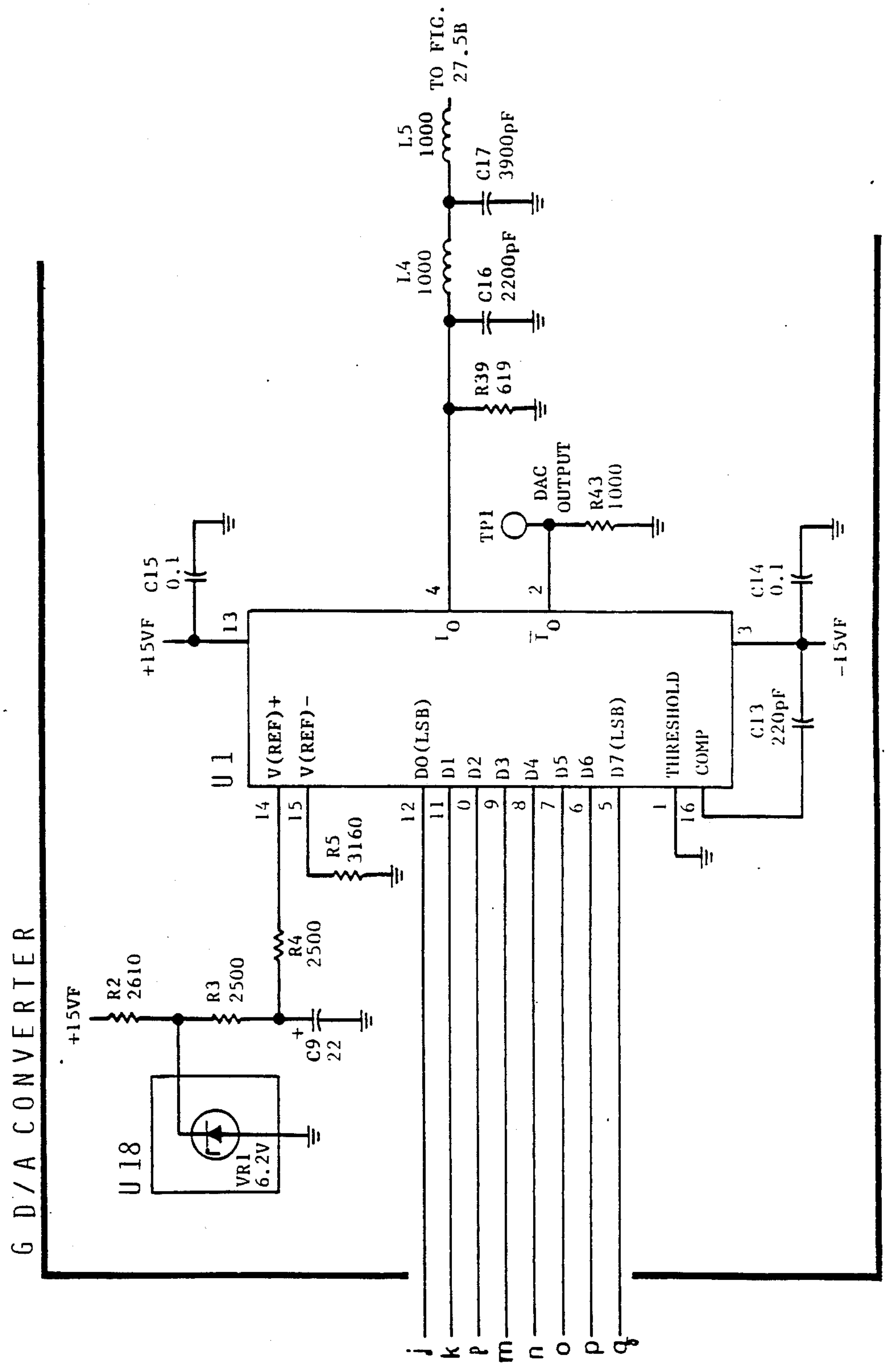
FIG 27.5A

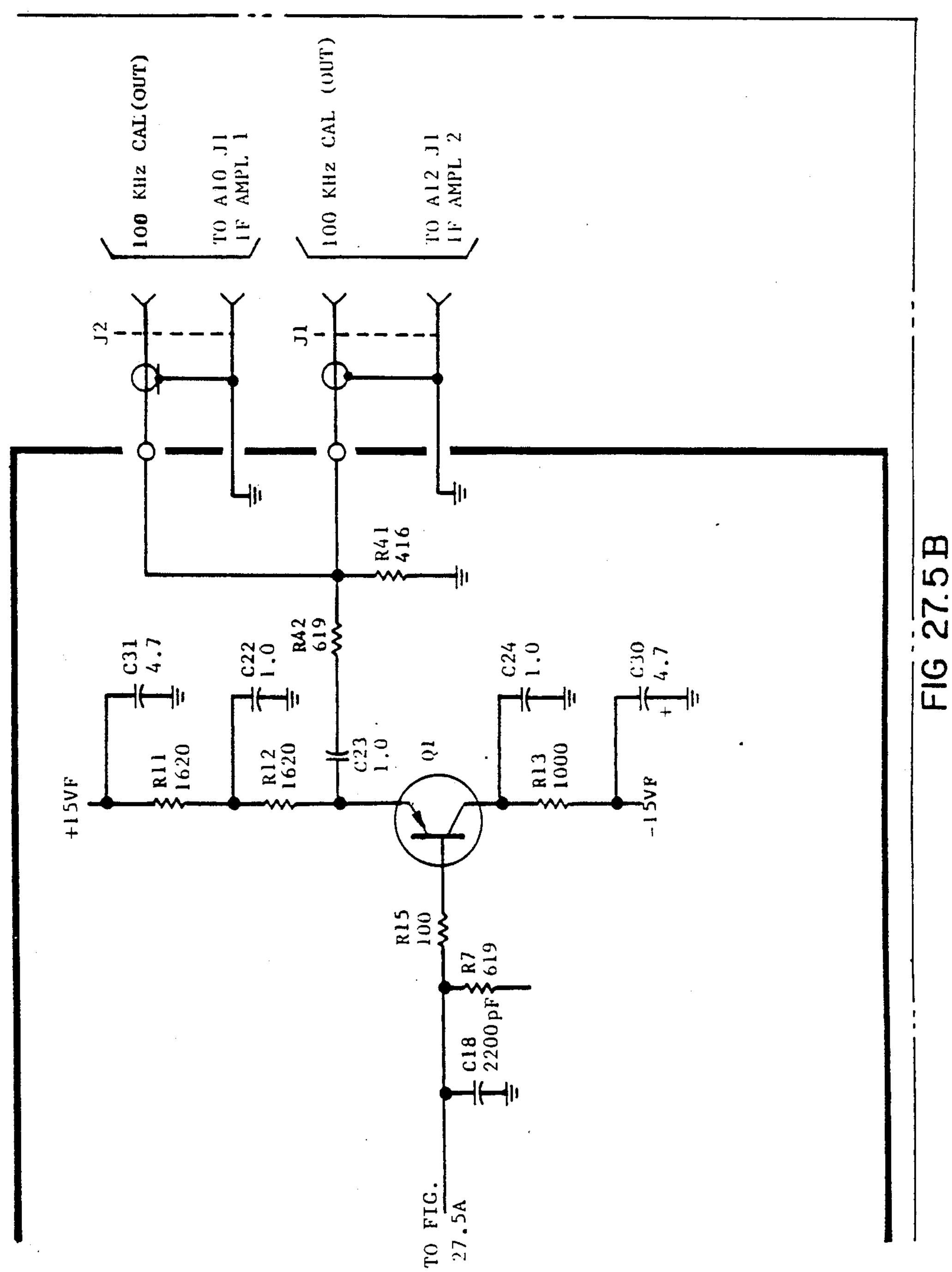
FIG 27.5 B

ACTIVE COMPONENTS PARTS LISTS (U's and Q's)

| REFERENCE DESIGNATORS | PART NUMBER | MANUFACTURER'S PART NUMBER |
|---|---|---|
| U1 | 1820-1934 | DAC-08 |
| U2 | 1820-1997 | 74 LS 374 |
| U4 | 1820-1997 | 74 LS 374 |
| U5 | 1820-2024 | 74 LS 244 |
| U6 | 1820-1869 | 74 S 196 |
| U7 | 1820-107 4 | 74 123 |
| U8 | 1820-0802 | MC10102 |
| U9 | | |
| U10 | 1820-1216 | 74 LS 138 |
| U11,12,16,17 | 1820-1435 | 74 LS 669 |
| U13 | | SE 564 |
| U14 | 1820-0693 | 74 S 74 |
| U15 | 1820-1568 | 74 LS 125 |
| | | |
| Q1 | 1853-0314 | 2N2905A |
| Q2 | 1854-0477 | 2N2222 |

FIG 27.6

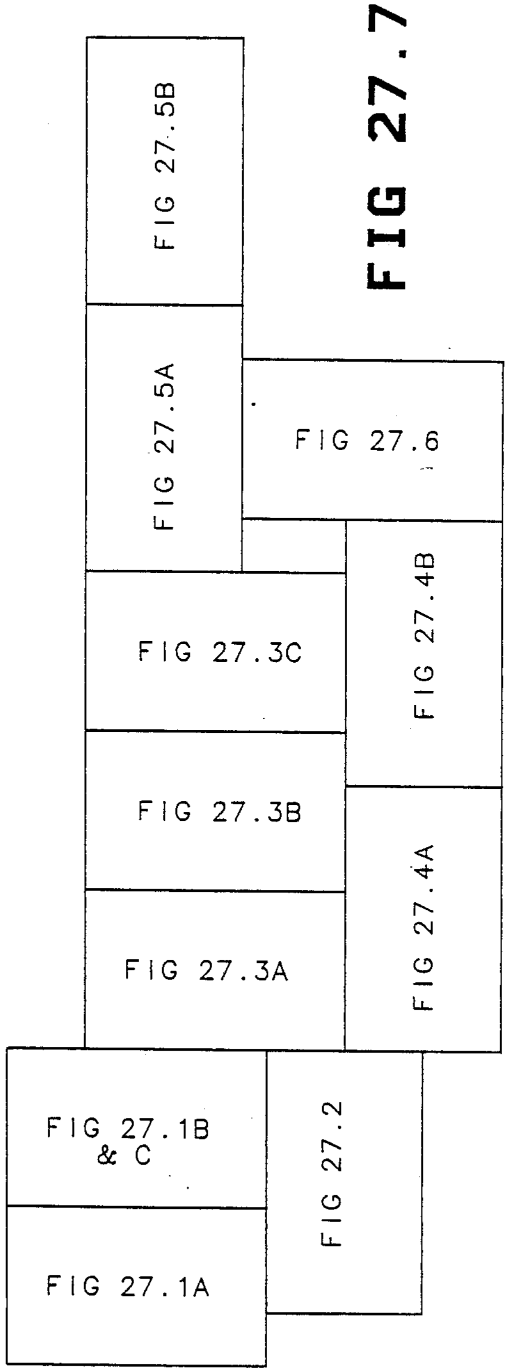
FIG 27.7
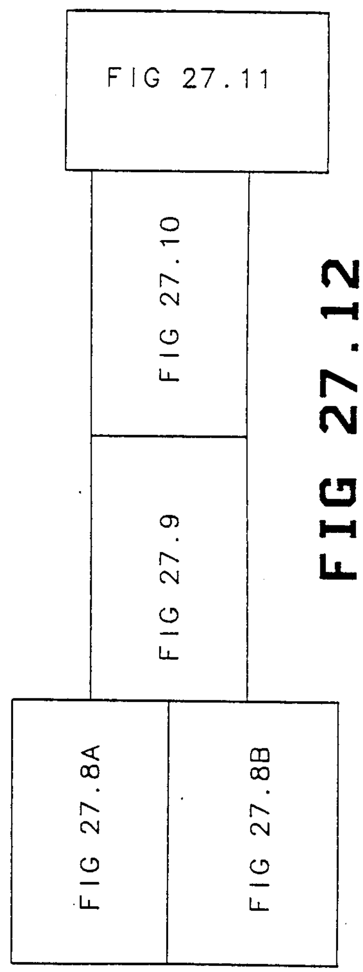
FIG 27.12

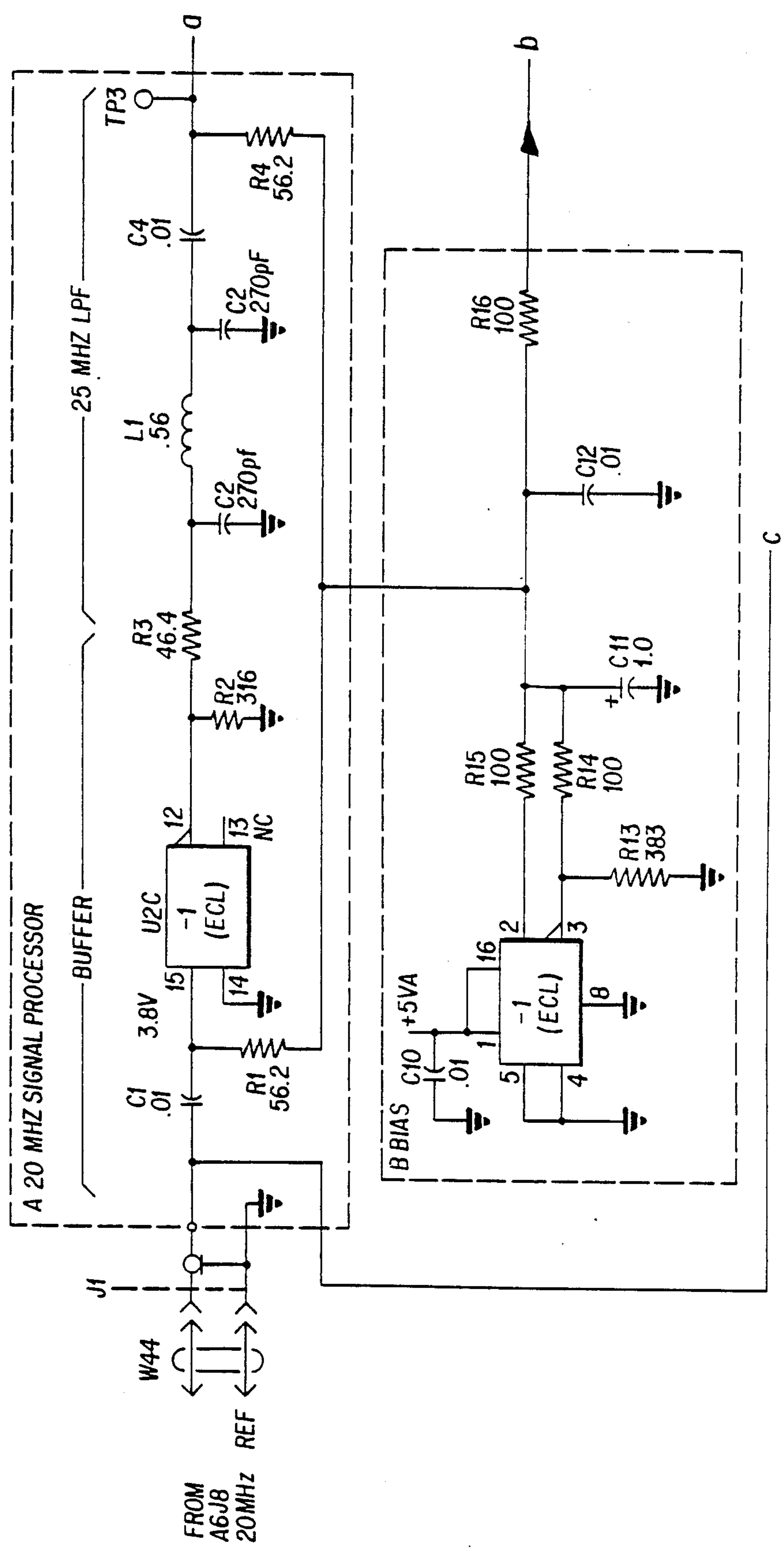
FIG. 27.8A

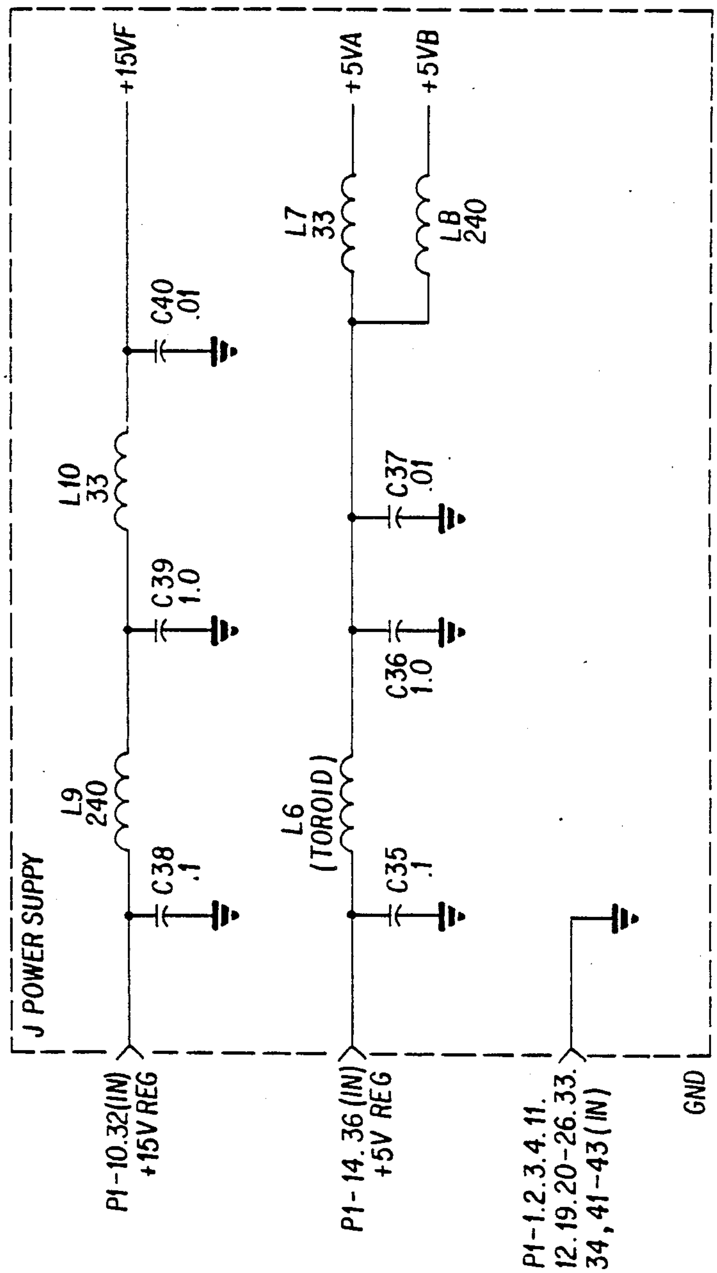
FIG. 27.8B

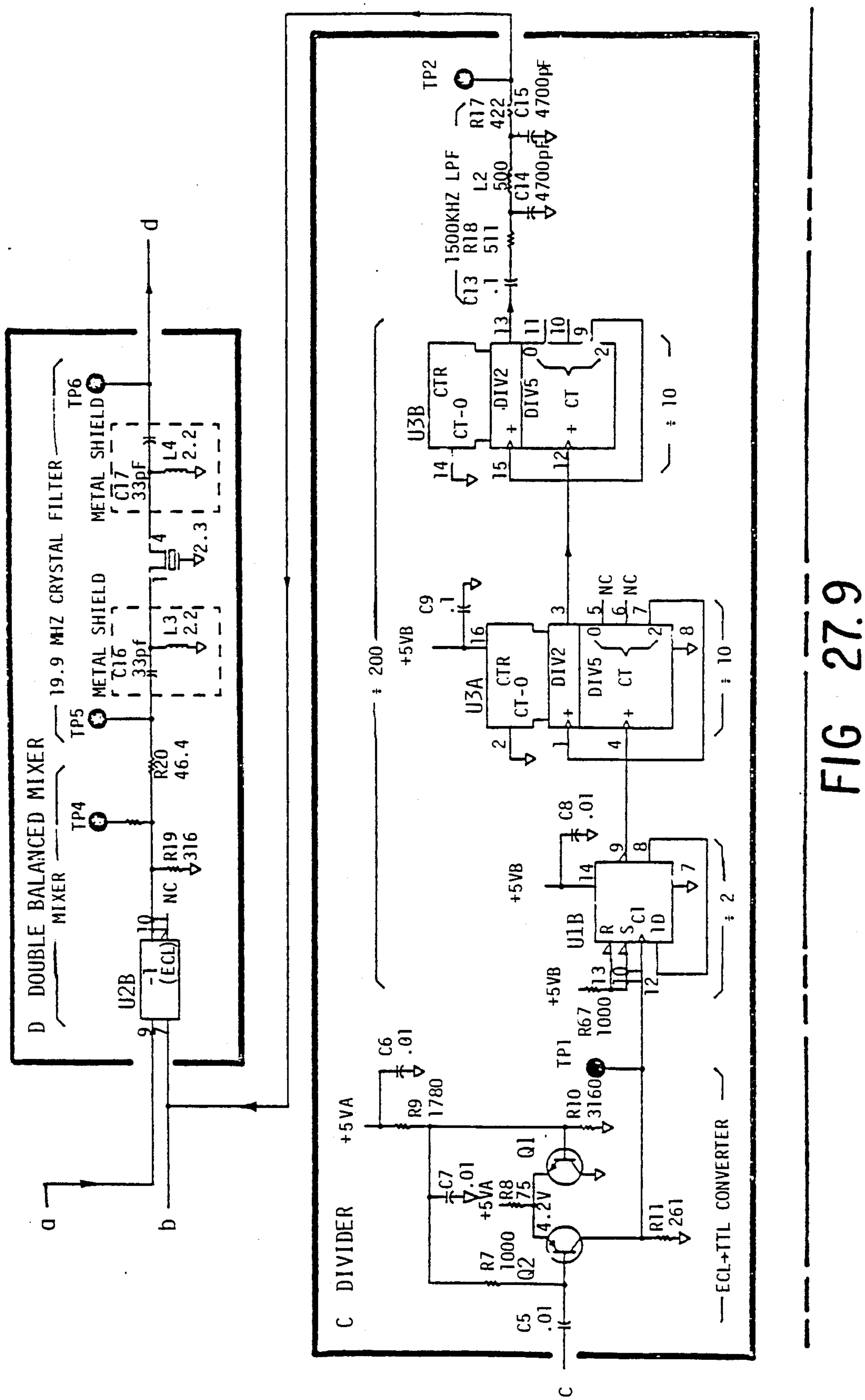
FIG 27.9

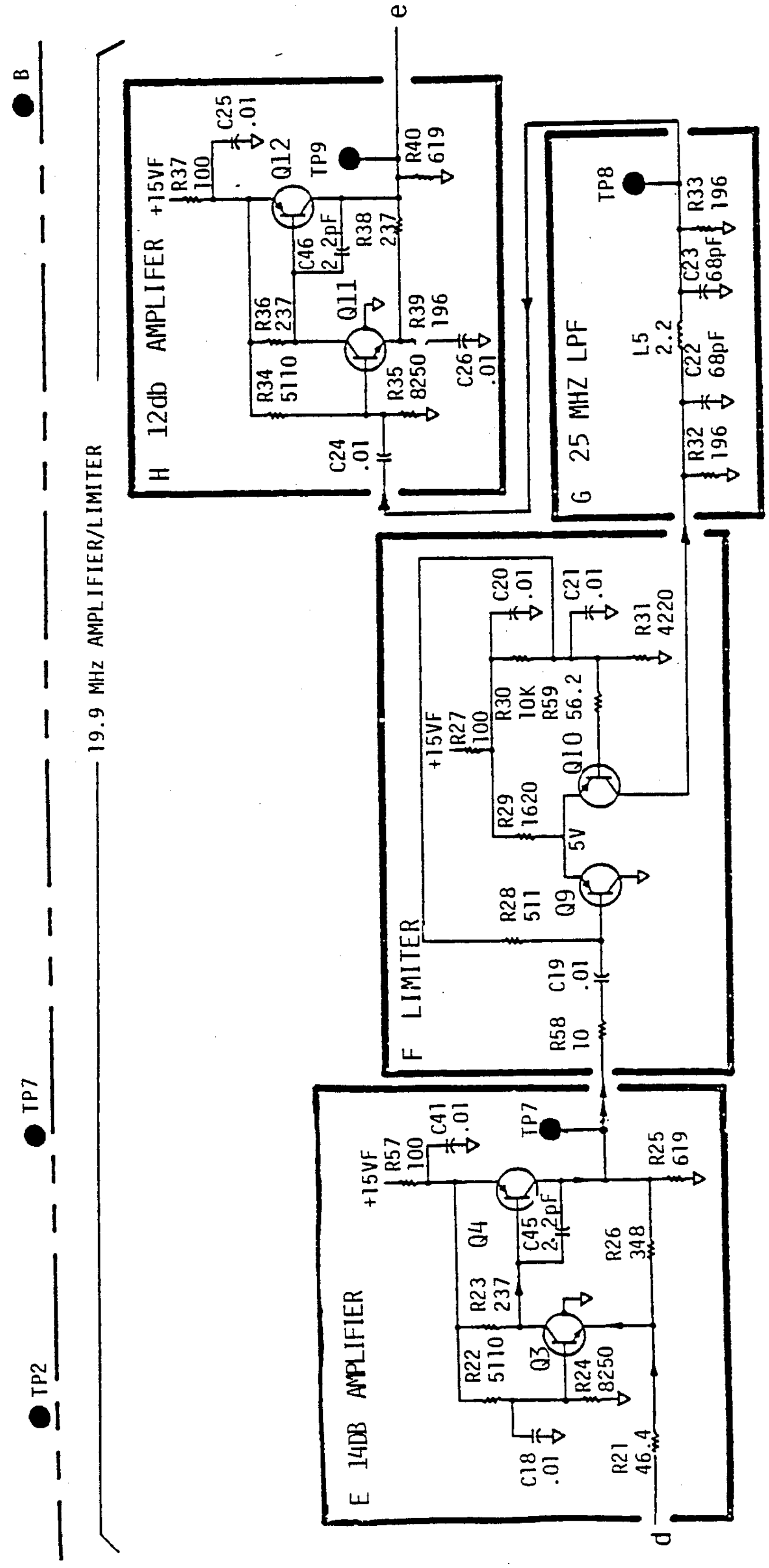
FIG 27.10

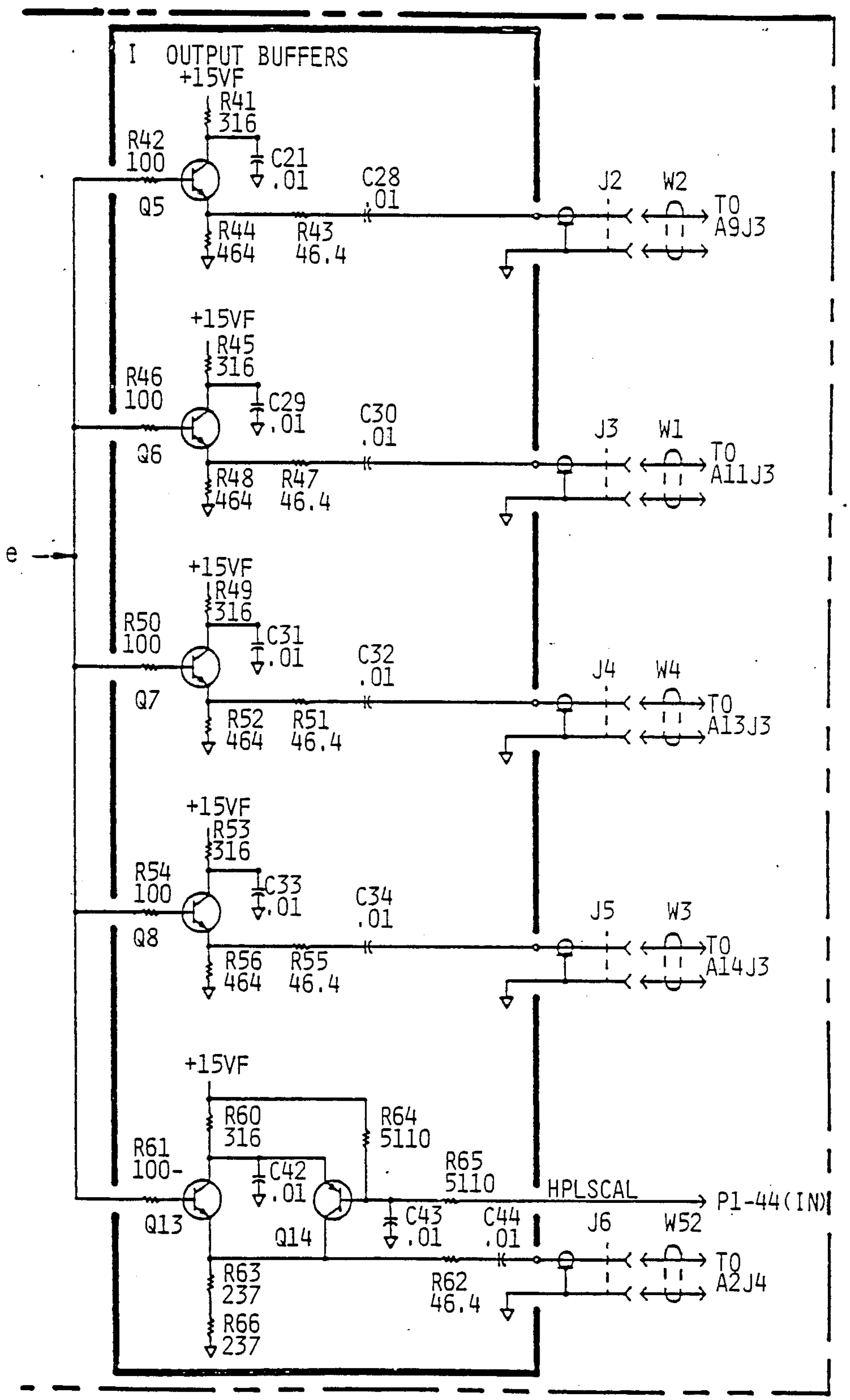
FIG 27.11

TP9 TP6 TP7 TP8 TP5
| ASSY | SIGNAL | FROM | CABLE DESIG | DESCRIPTION |
|---|---|---|---|---|
| A9 | B2IFIN | J1A3 | W31 | |
| A11 | B1IFIN | J1A2 | W30 | 1ST IF IN |
| A13 | A2IFIN | J1A4 | W32 | |
| A14 | A1IFIN | J1A1 | W36 | |
A9 B2 IF MIXER 85102-60009
A11 B1 IF MIXER 85102-60011
A13 A2 IF MIXER 85102-60013
A14 A1 IF MIXER 85102-60014
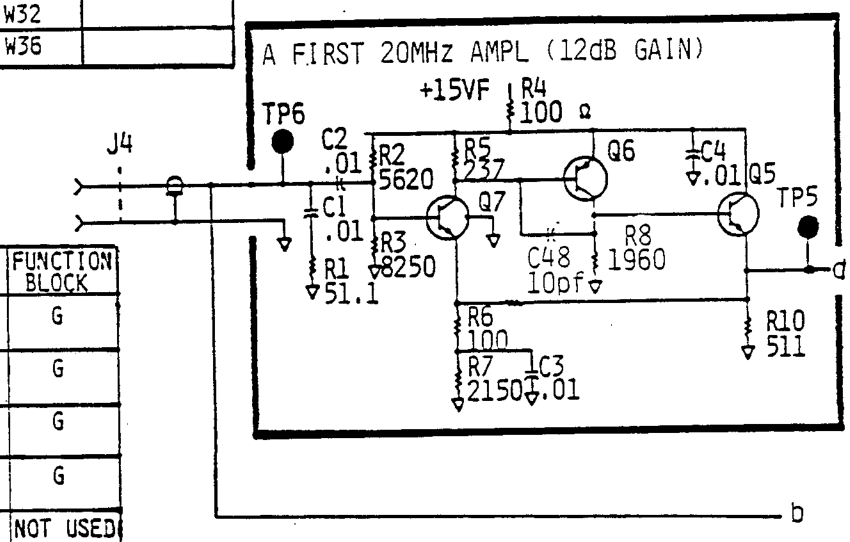
| PIN | SIGNAL | TO/FROM | FUNCTION BLOCK |
|---|---|---|---|
| 1 23 | GND | GND BUS | G |
| 2 24 | GND | GND BUS | G |
| 3 25 | GND | GND BUS | G |
| 4 26 | GND | GND BUS | G |
| 5 27 | | | NOT USED |
| 6 28 | | | NOT USED |
| 7 29 | | | |
| 8 30 | | | |
| 9 31 | | | |
| 10 32 | +15V REG | +15V BUS | G |
| 11 33 | GND | GND BUS | G |
| 12 34 | GND | GND BUS | G |
| 13 35 | -15V REG | -15V BUS | G |
| 14 36 | | | |
| 15 37 | | | |
| 16 38 | | | |
| 17 39 | | | |
| 13 40 | | | |
| 19 41 | GND | GND BUS | G |
| 20 42 | GND | GND BUS | G |
| 21 43 | GND | GND BUS | G |
| 22 44 | GND | GND BUS | G |
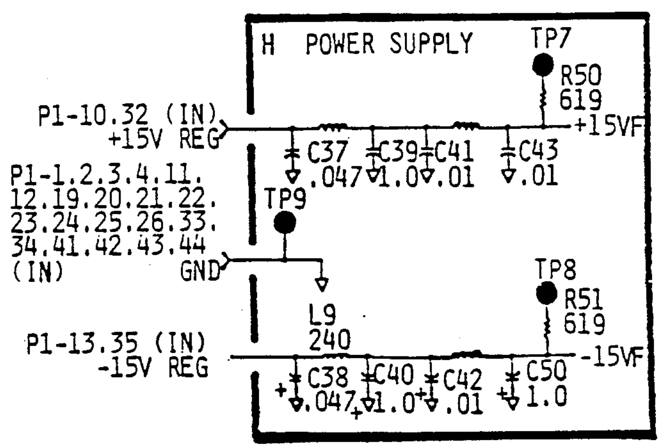
FIG 27.13

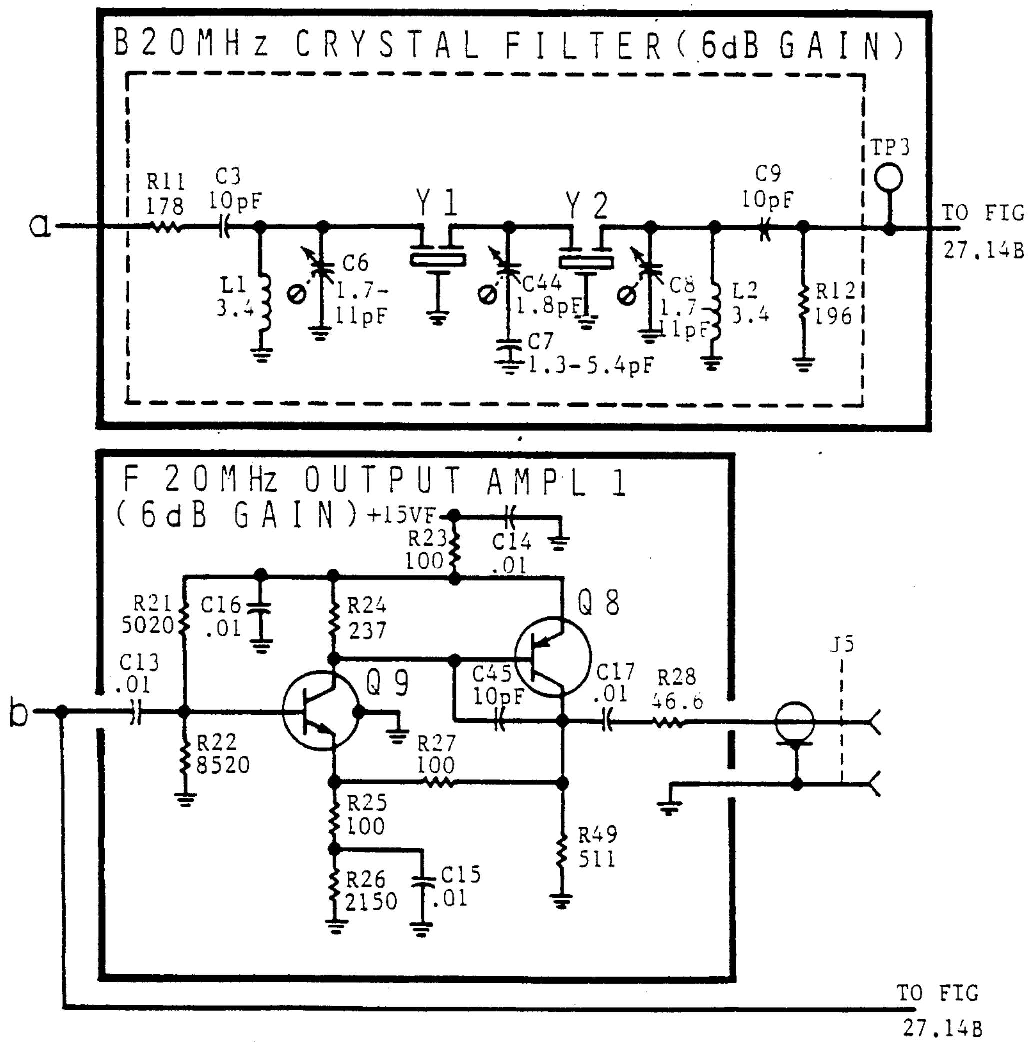
| ASSY. | SIGNAL | TO | CABLE DESIG | DESCRIPTION |
|---|---|---|---|---|
| A9 | PLIFB2 | A2J3 | W41 | 1ST IF OUT |
| A11 | PLIFB1 | A2J1 | W40 | |
| A13 | PLIFA2 | A2J5 | W45 | |
| A14 | PLIFA1 | A2J7 | W45 | |
FIG 27.14A

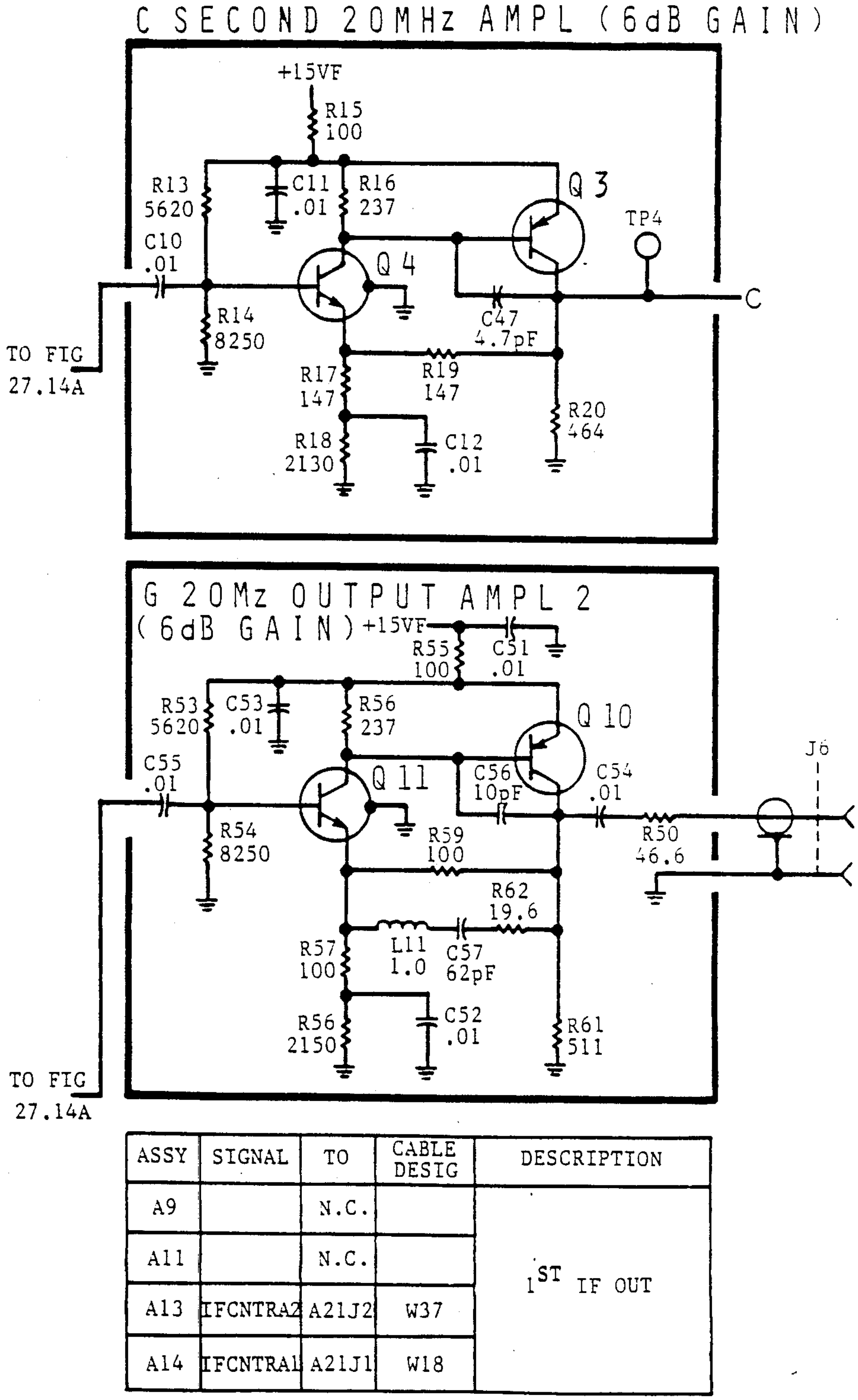
| ASSY | SIGNAL | TO | CABLE DESIG | DESCRIPTION |
|---|---|---|---|---|
| A9 | | N.C. | | 1ST IF OUT |
| A11 | | N.C. | | |
| A13 | IFCNTRA2 | A21J2 | W37 | |
| A14 | IFCNTRA1 | A21J1 | W18 | |
FIG 27.14 B

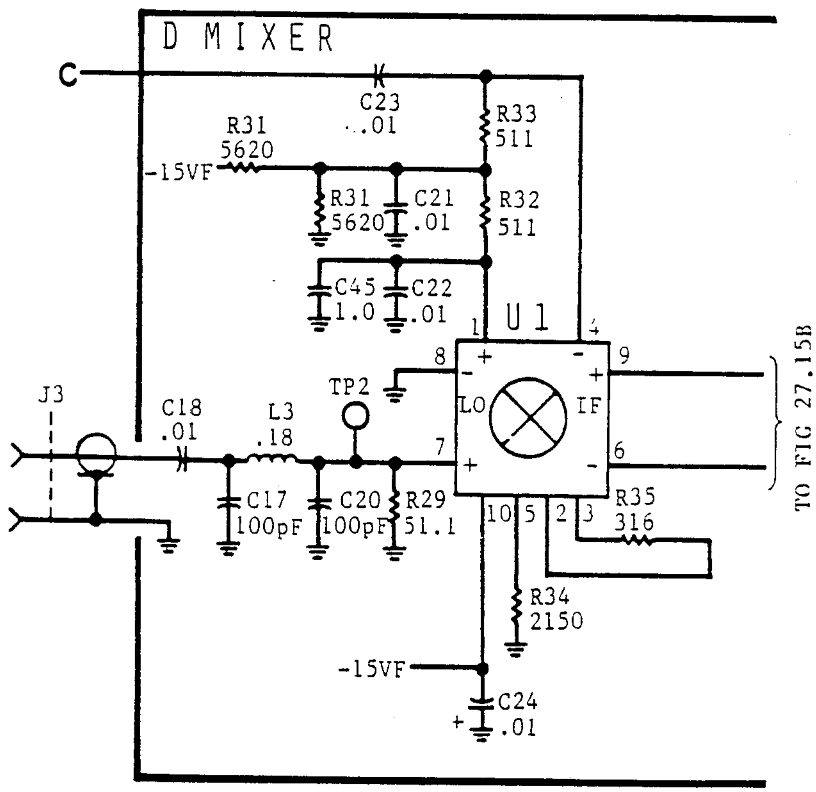
| ASSY | SIGNAL | FROM | CABLE DESIG | DESCRIPTION |
|---|---|---|---|---|
| A9 | B2LO | ABJ2 | W2 | LO IN |
| A11 | B1LO | ABJ3 | W1 | |
| A13 | A2LO | ABJ4 | W4 | |
| A14 | A1LO | ABJ5 | W3 | |
FIG 27.15A

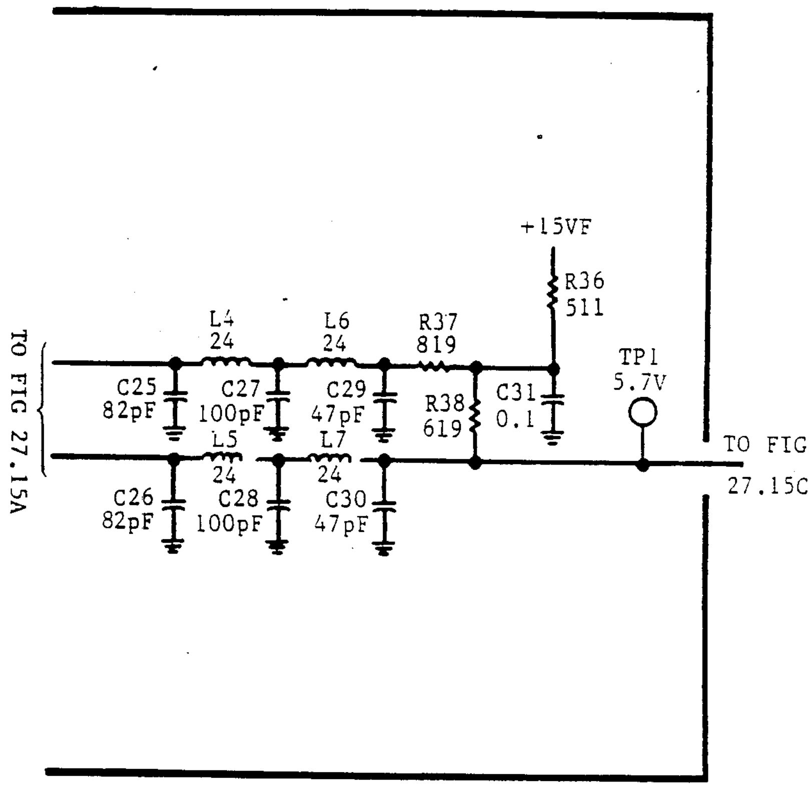
FIG 27.15B

| ASSY | SIGNAL | TO | CABLE DESIG | DESCRIPTION |
|---|---|---|---|---|
| A9 | B2IF | A10J3 | W9 | 100KHz IF OUT |
| A11 | B1IF | A12J4 | W12 | |
| A13 | A2IF | A10J2 | W10 | |
| A14 | A1IF | A12J3 | W13 | |
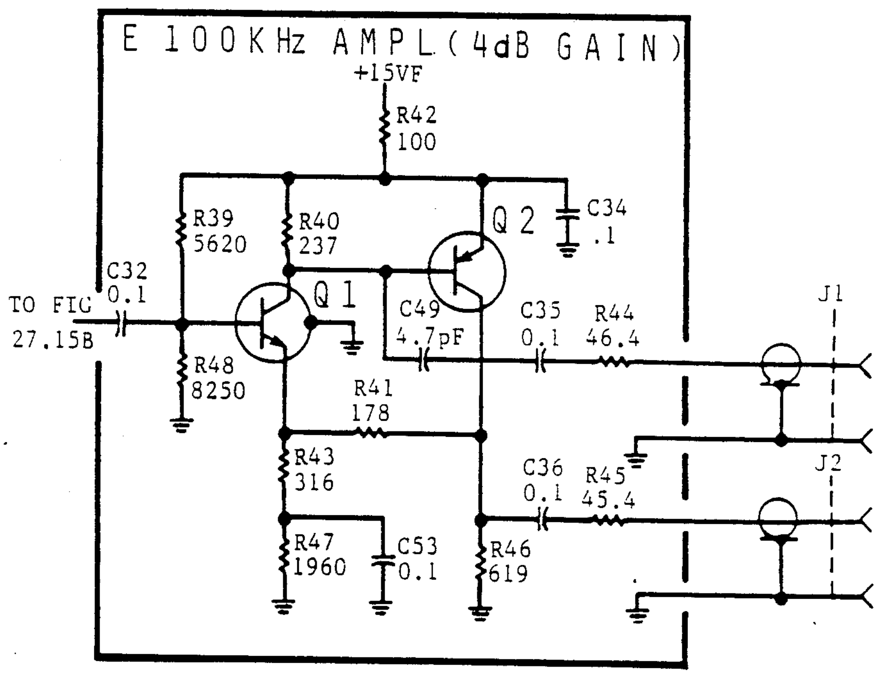
| ASSY | SIGNAL | TO | CABLE DESIG | DESCRIPTION |
|---|---|---|---|---|
| A9 | | N.C. | | 100KHz IF OUT |
| A11 | B1IF | A10J4 | W8 | |
| A13 | A2IF | A12J2 | W14 | |
| A14 | | N.C. | | |
FIG 27.15C FIG 27.16
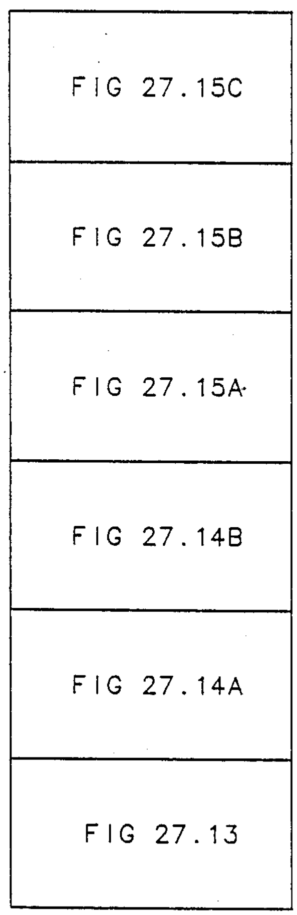
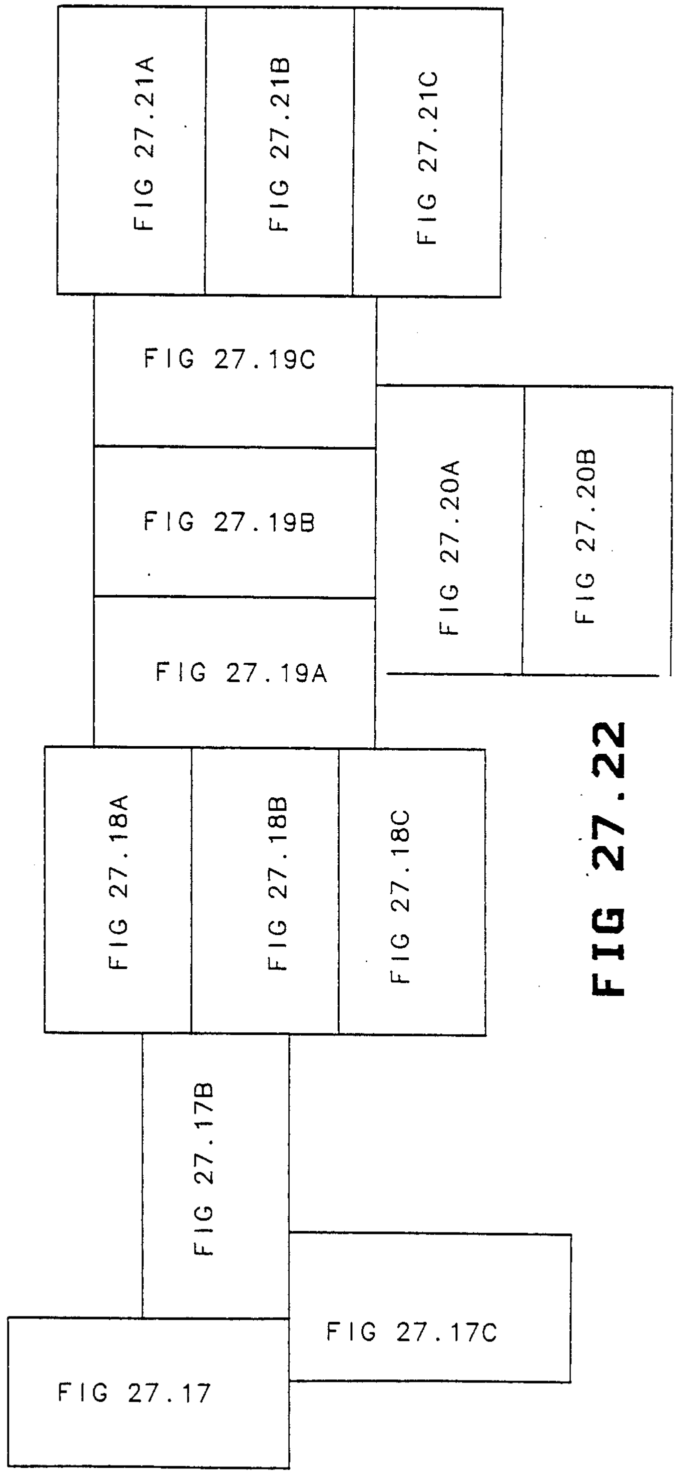
FIG 27.22

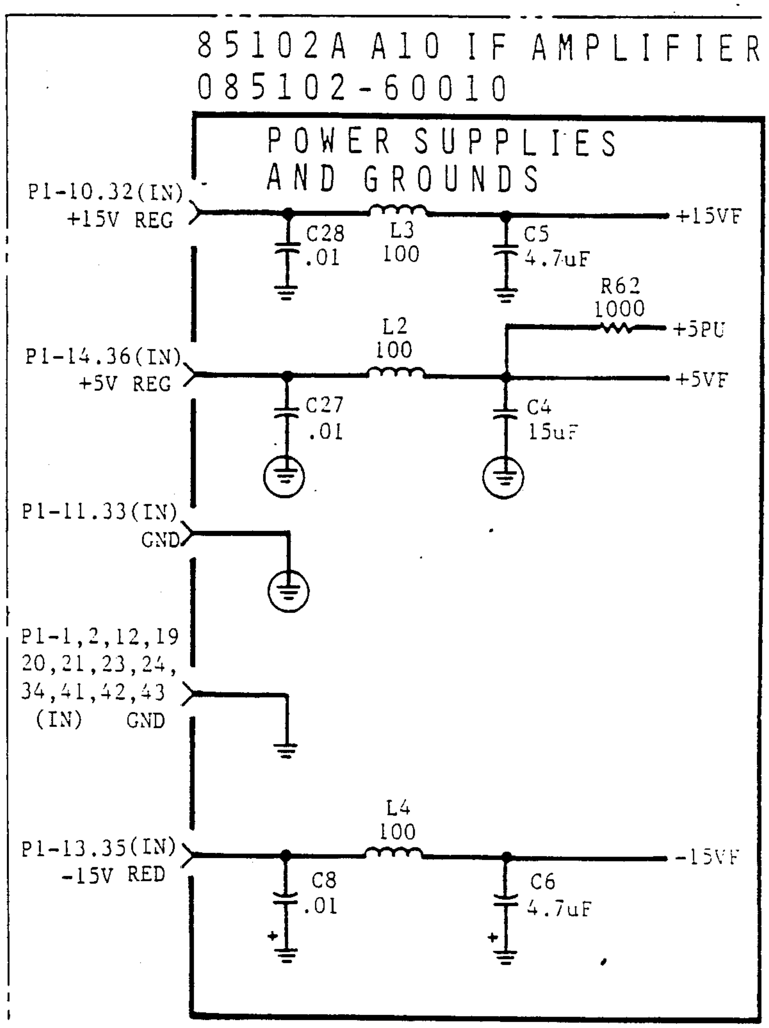
FIG 27.17A

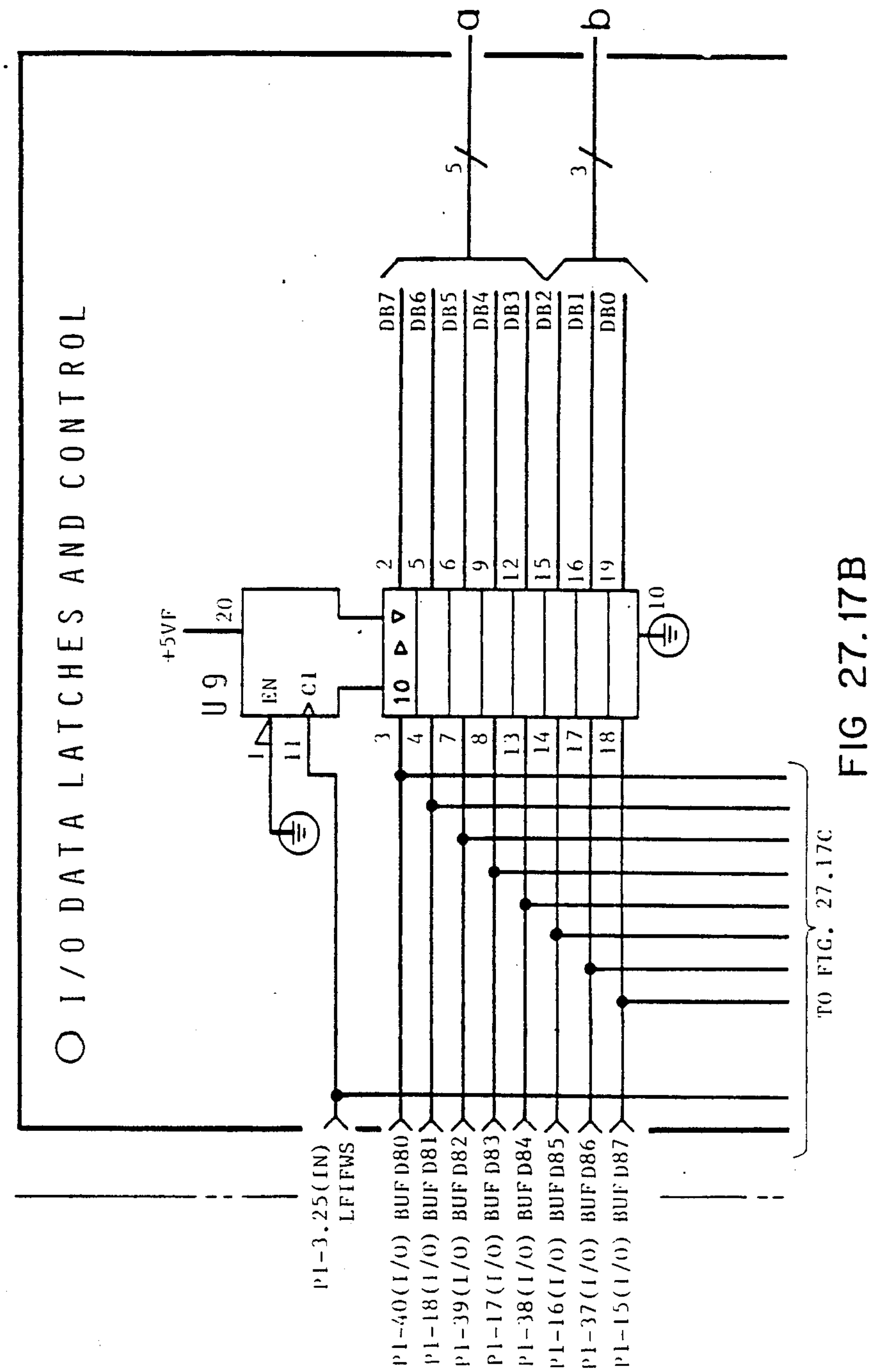
FIG 27.17B

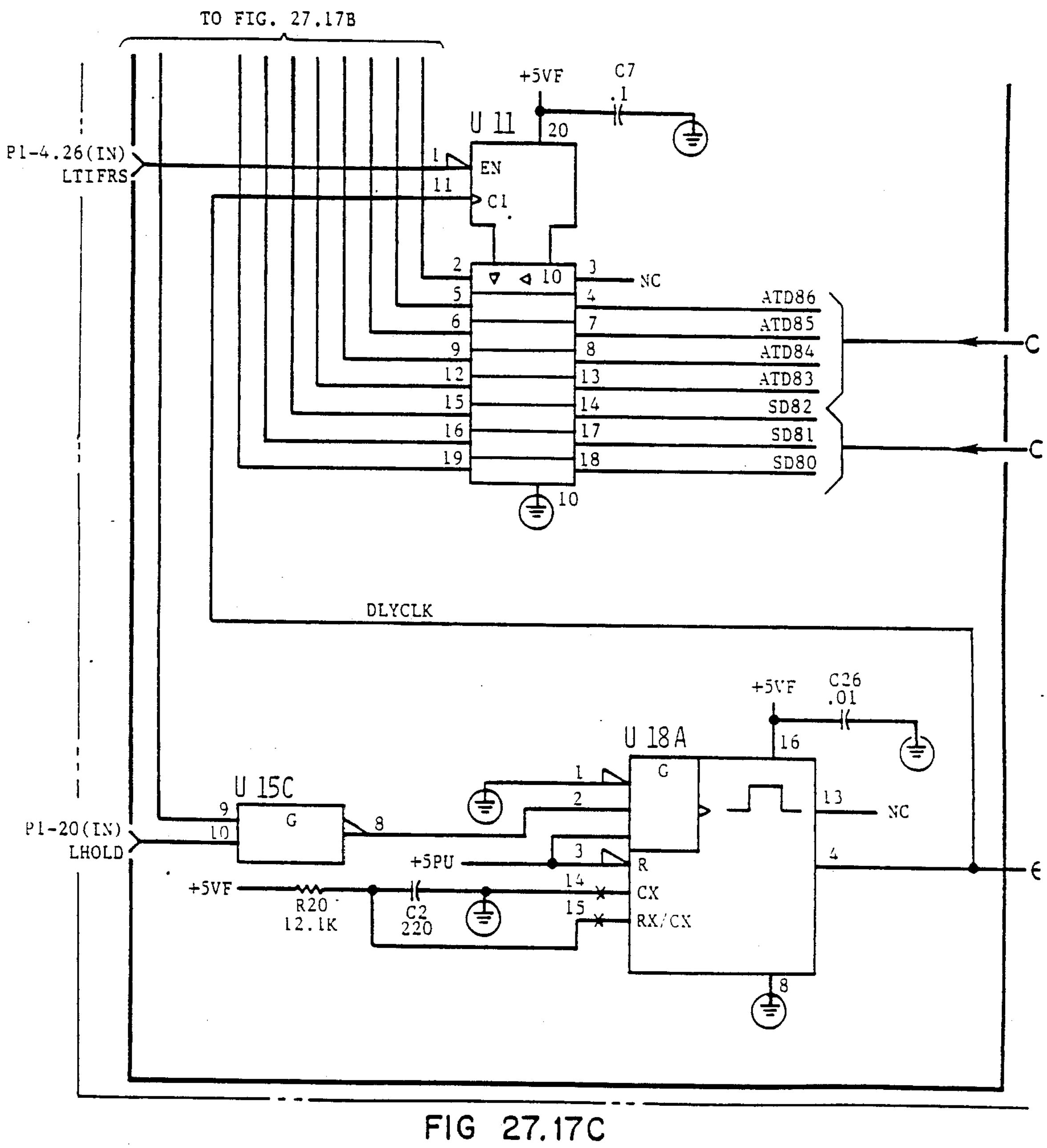
FIG 27.17C

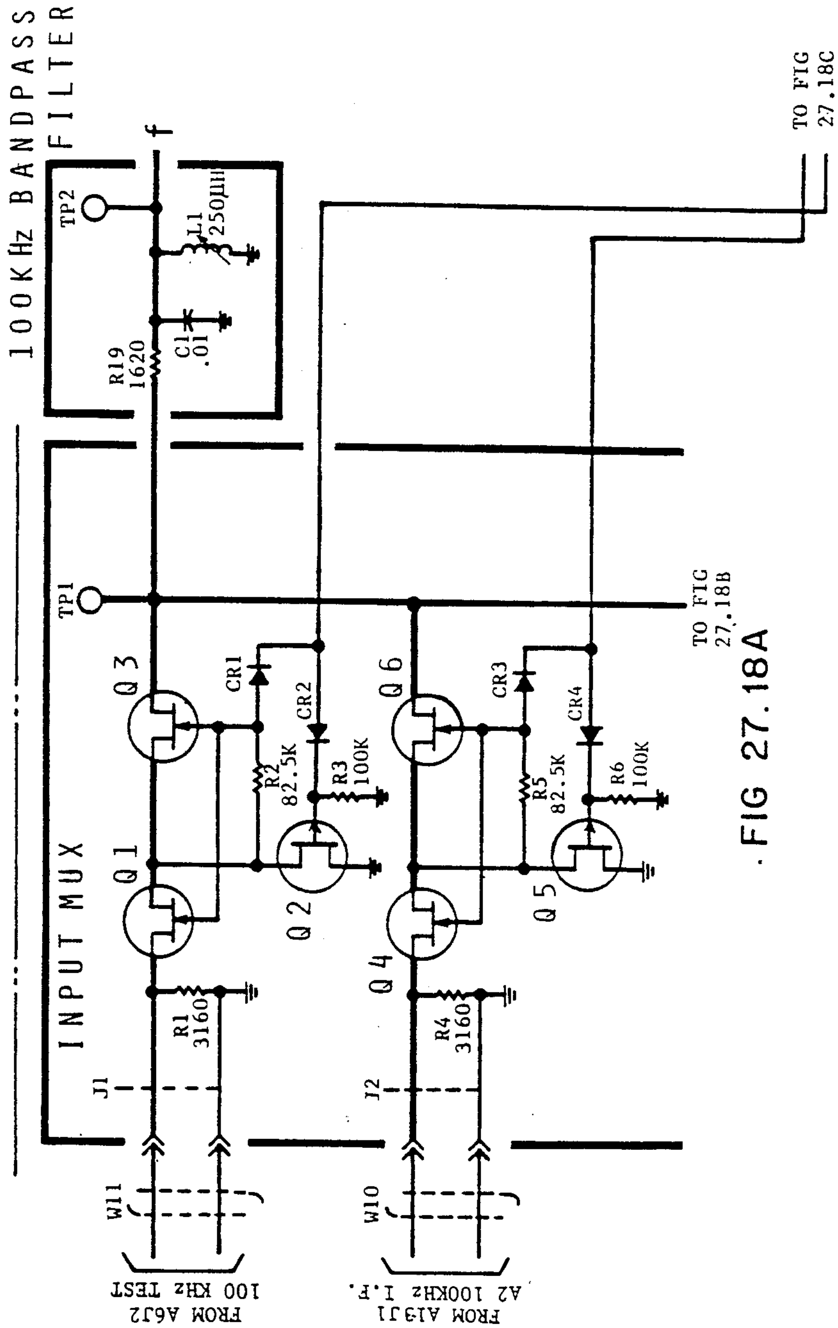
FIG 27.18A

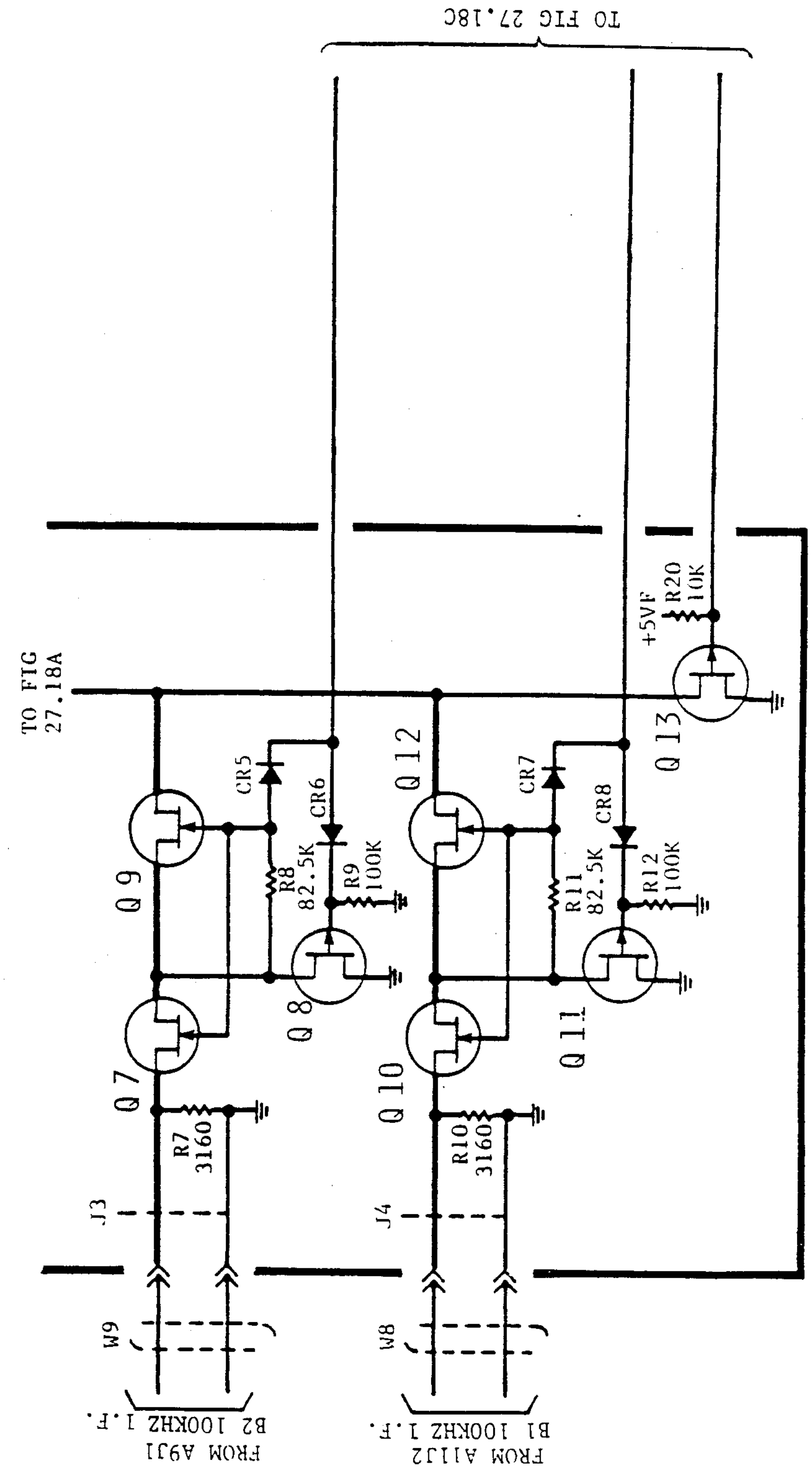
FIG 27.18B

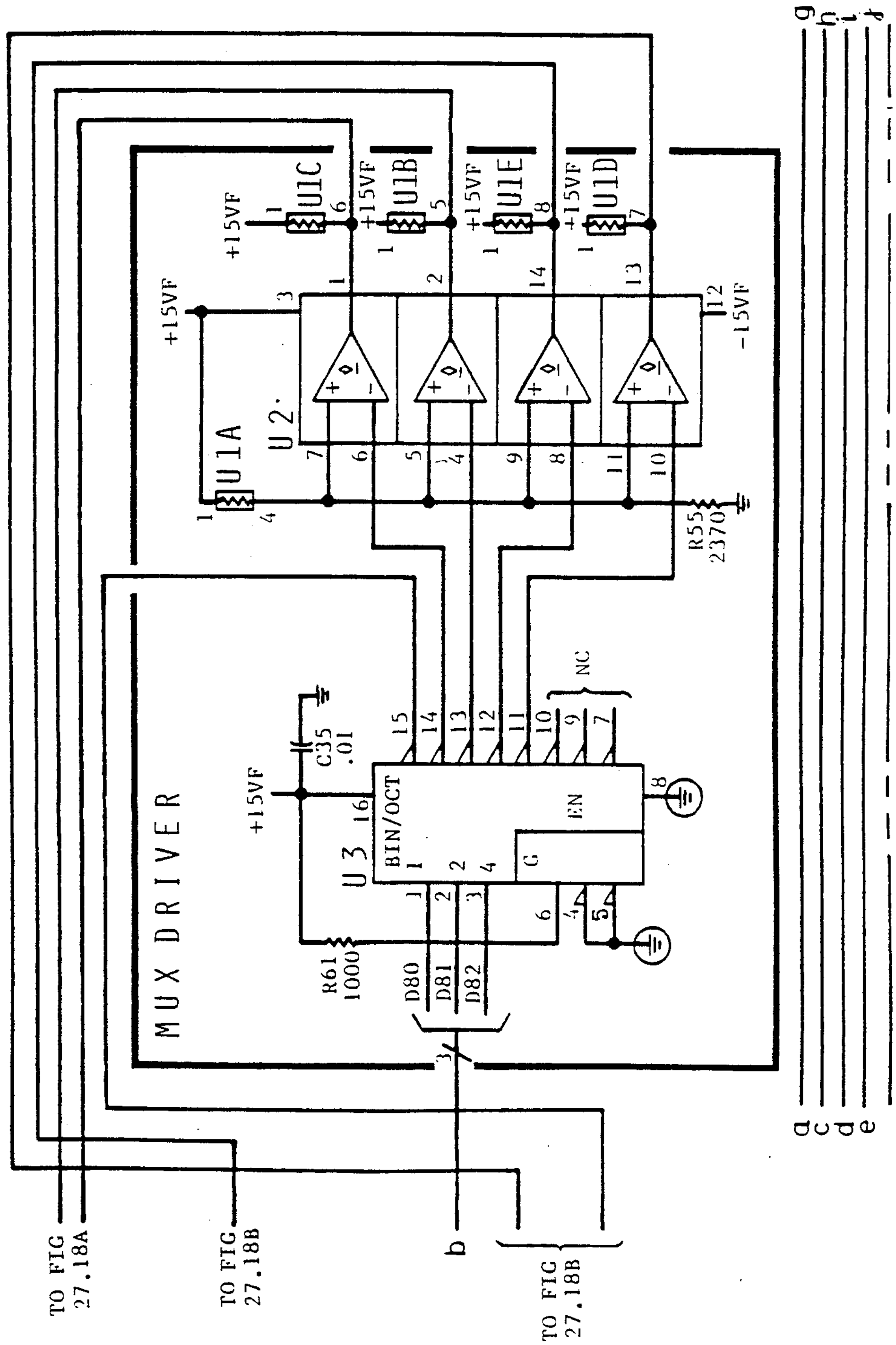
FIG 27.18C

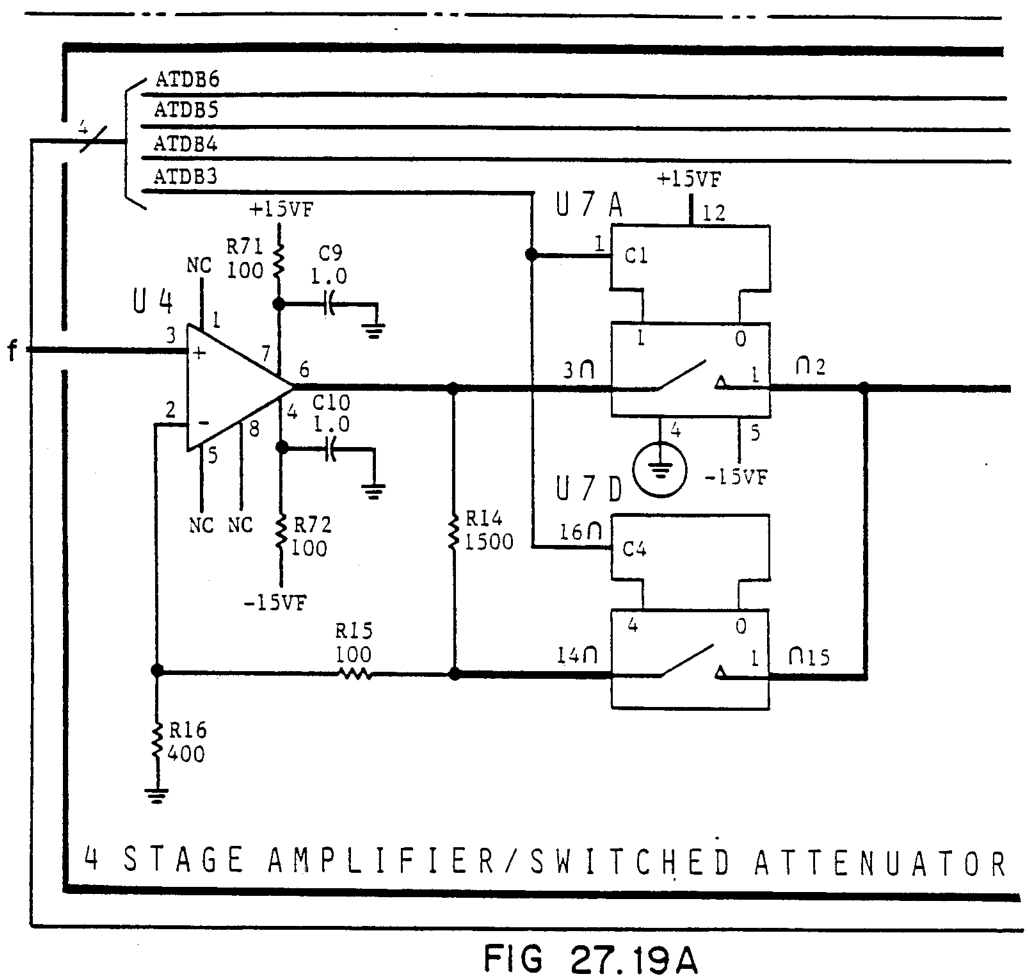
FIG 27.19A

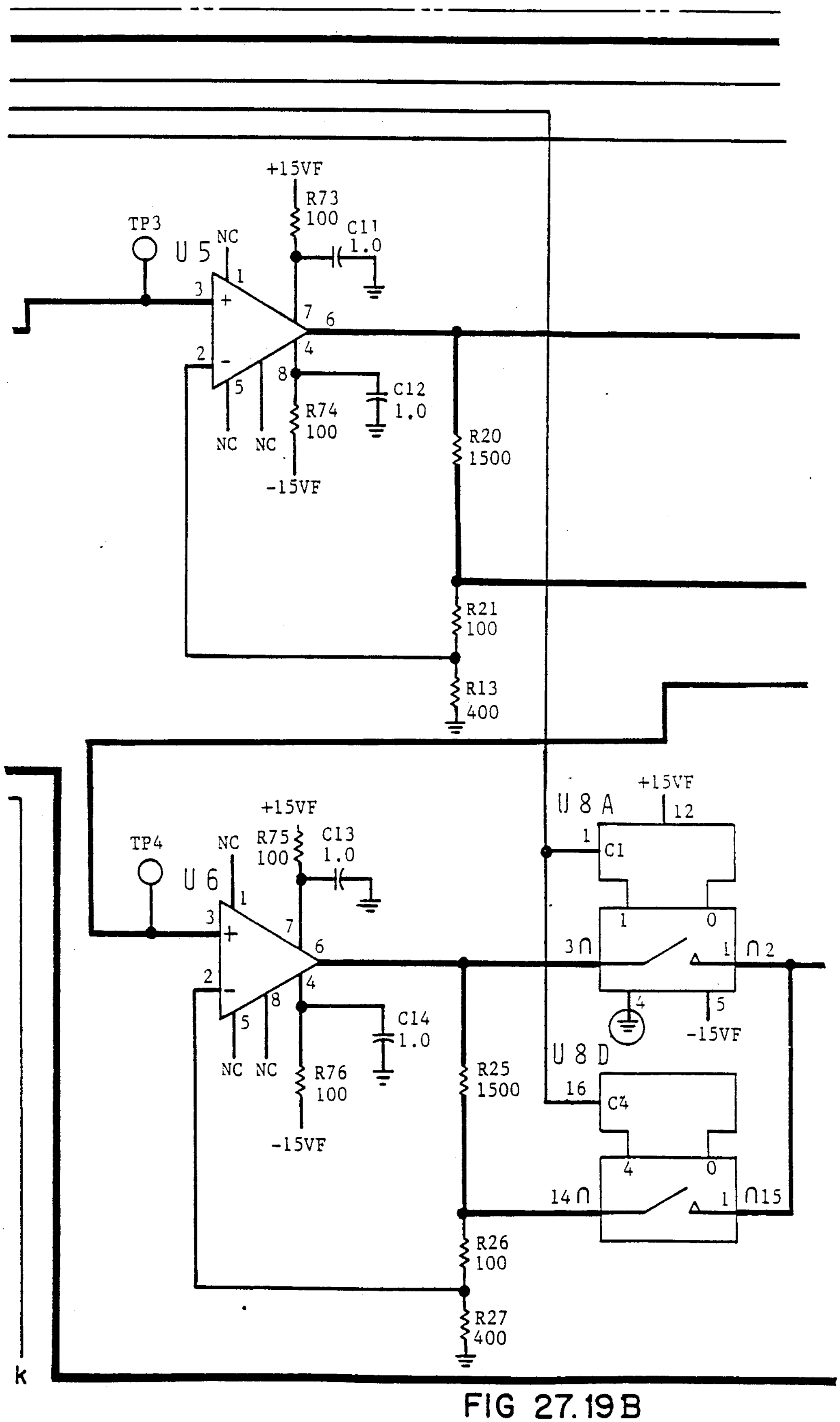
FIG 27.19B

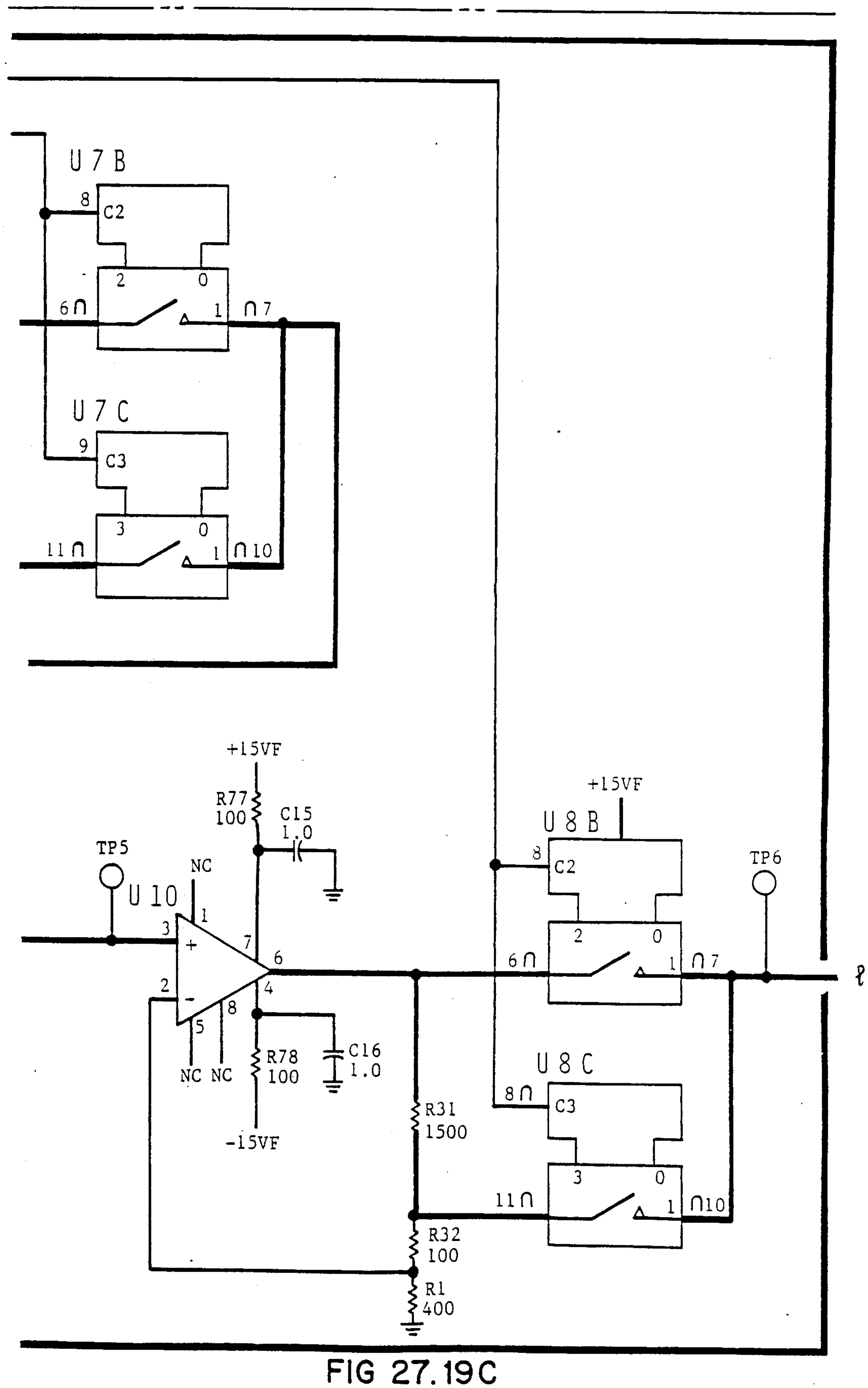
FIG 27.19C

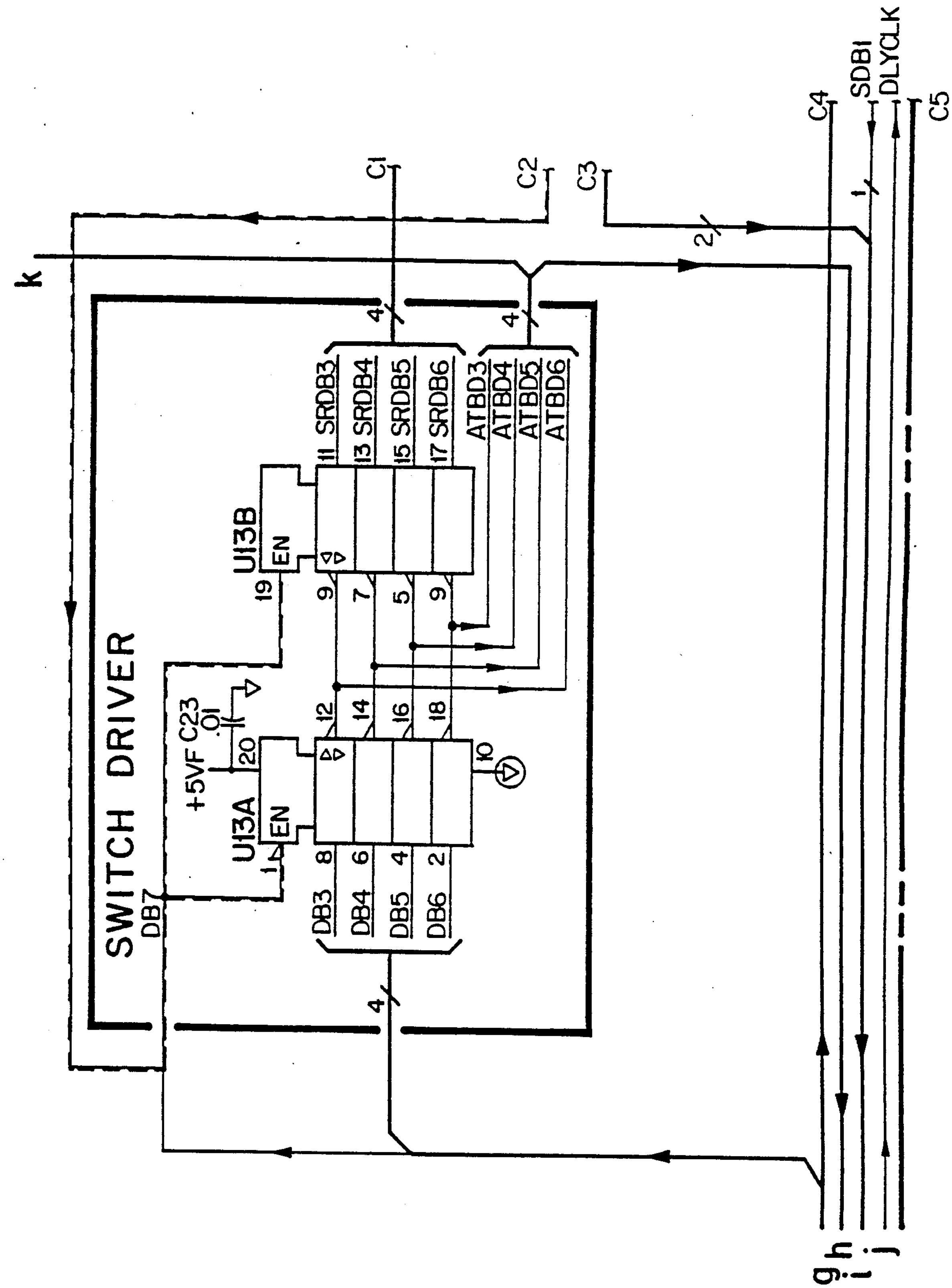
FIG 27.20A

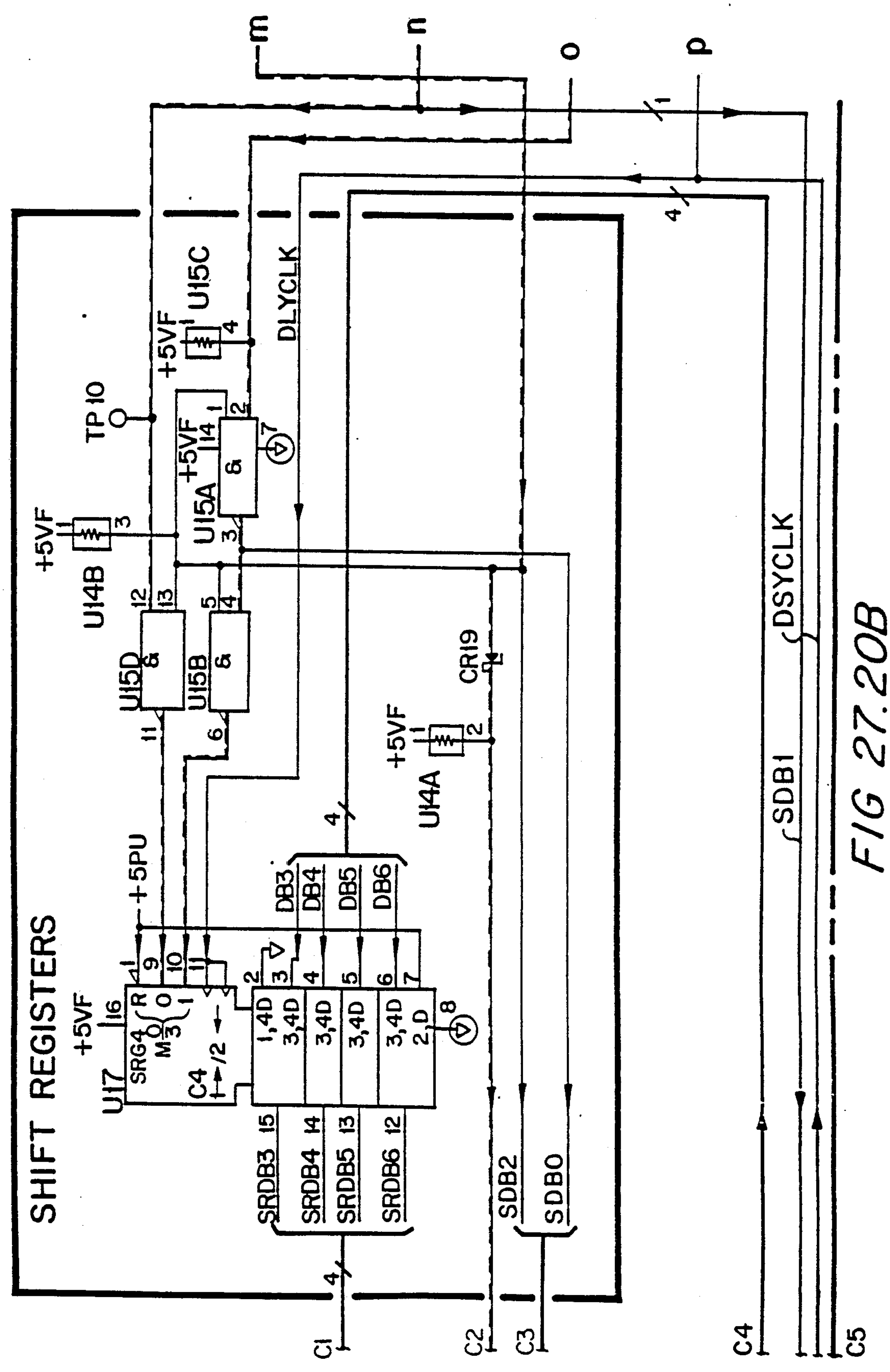
FIG 27.20B

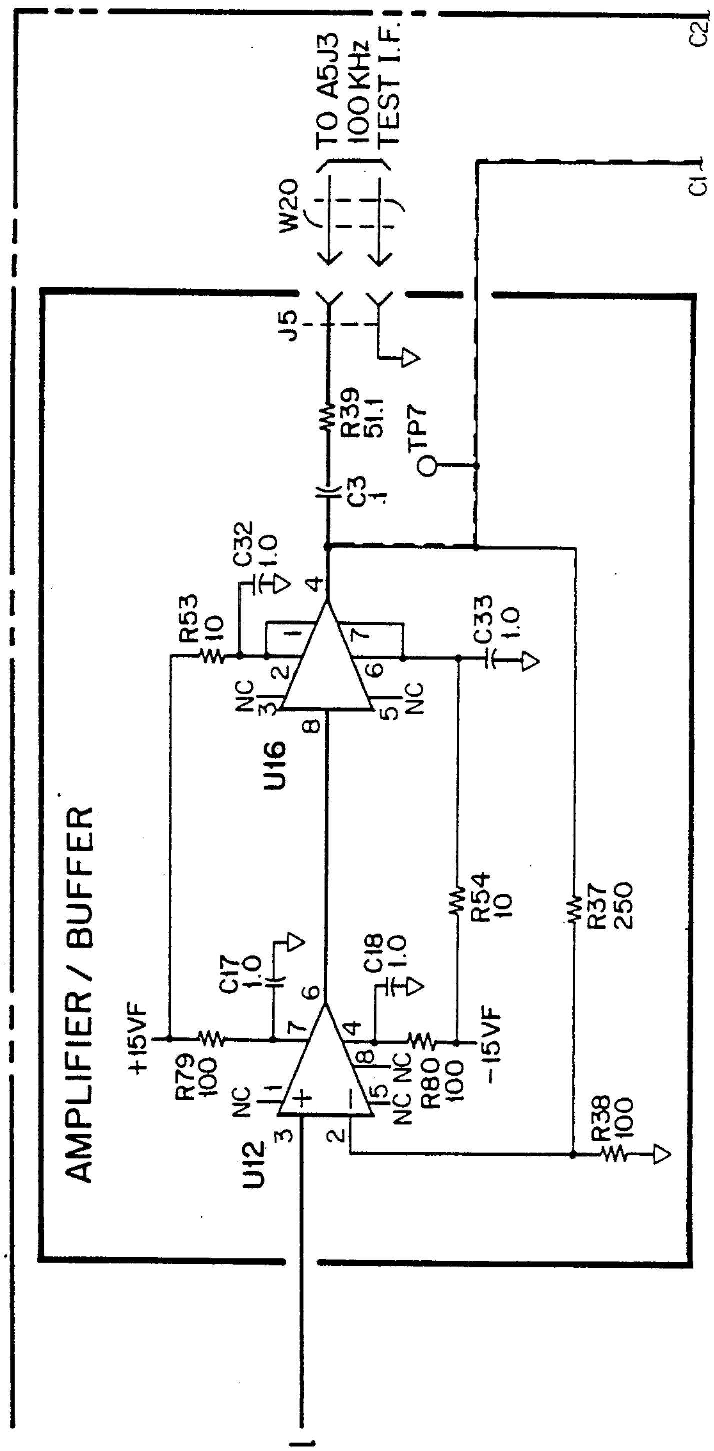
FIG 27.21A

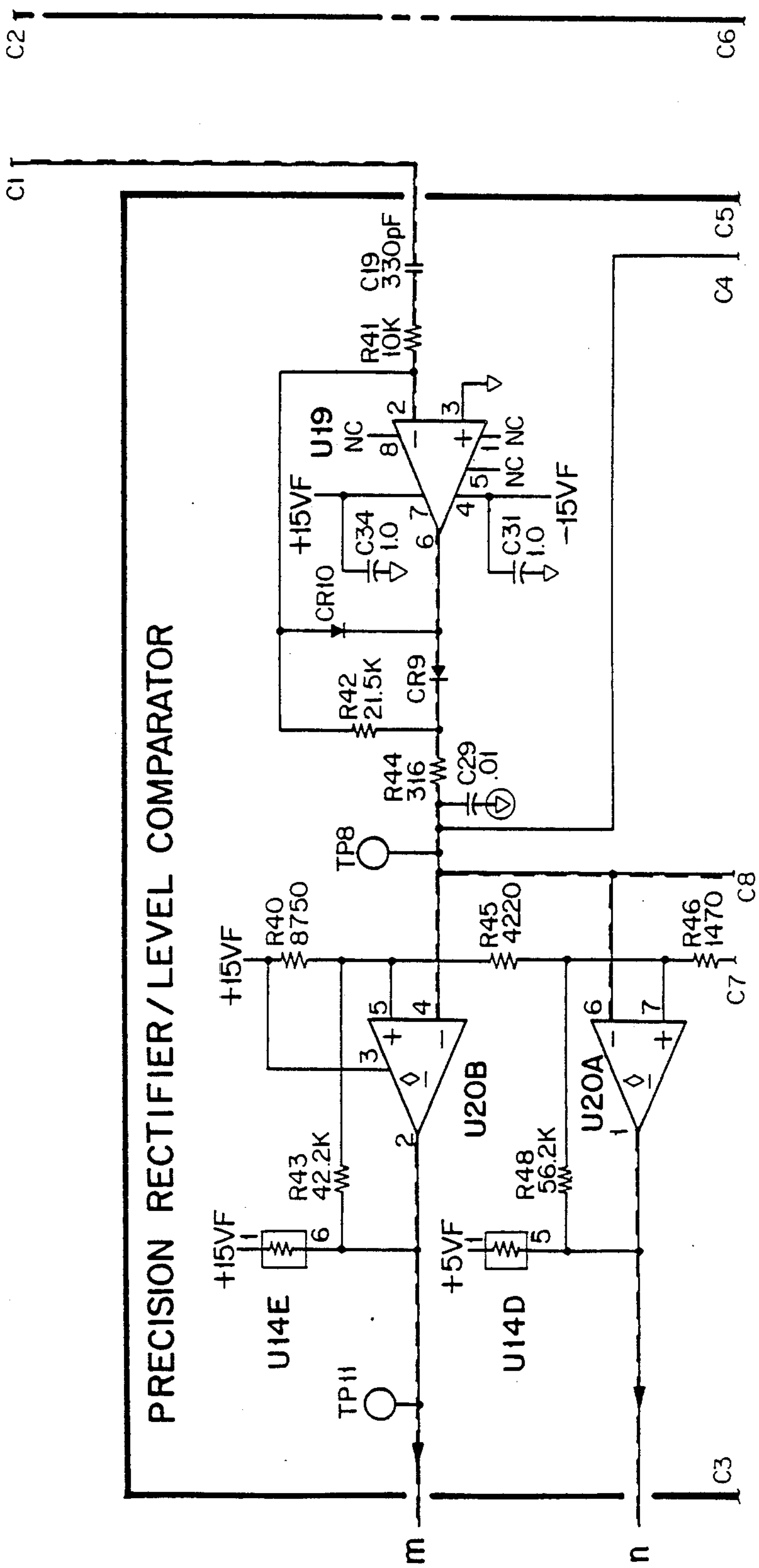
FIG 27.21B

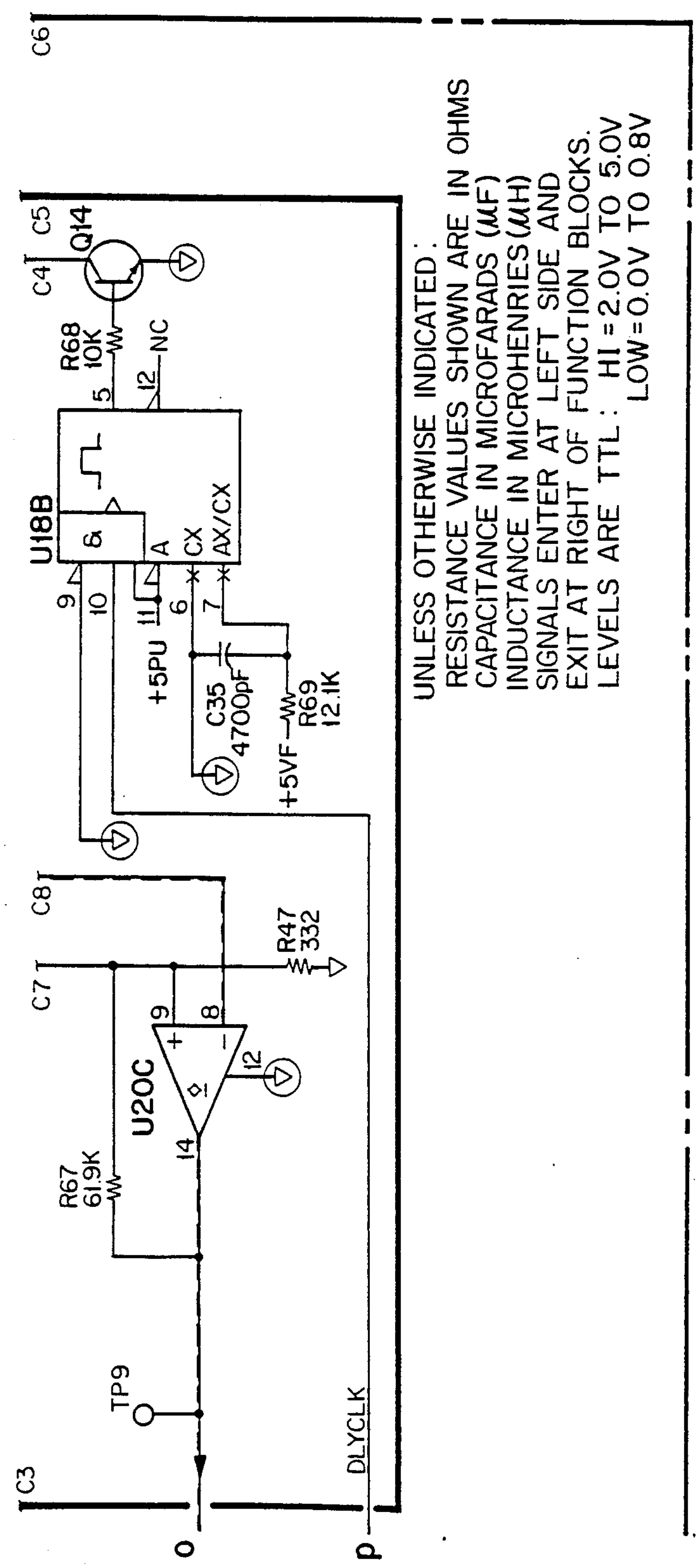
FIG 27.21C

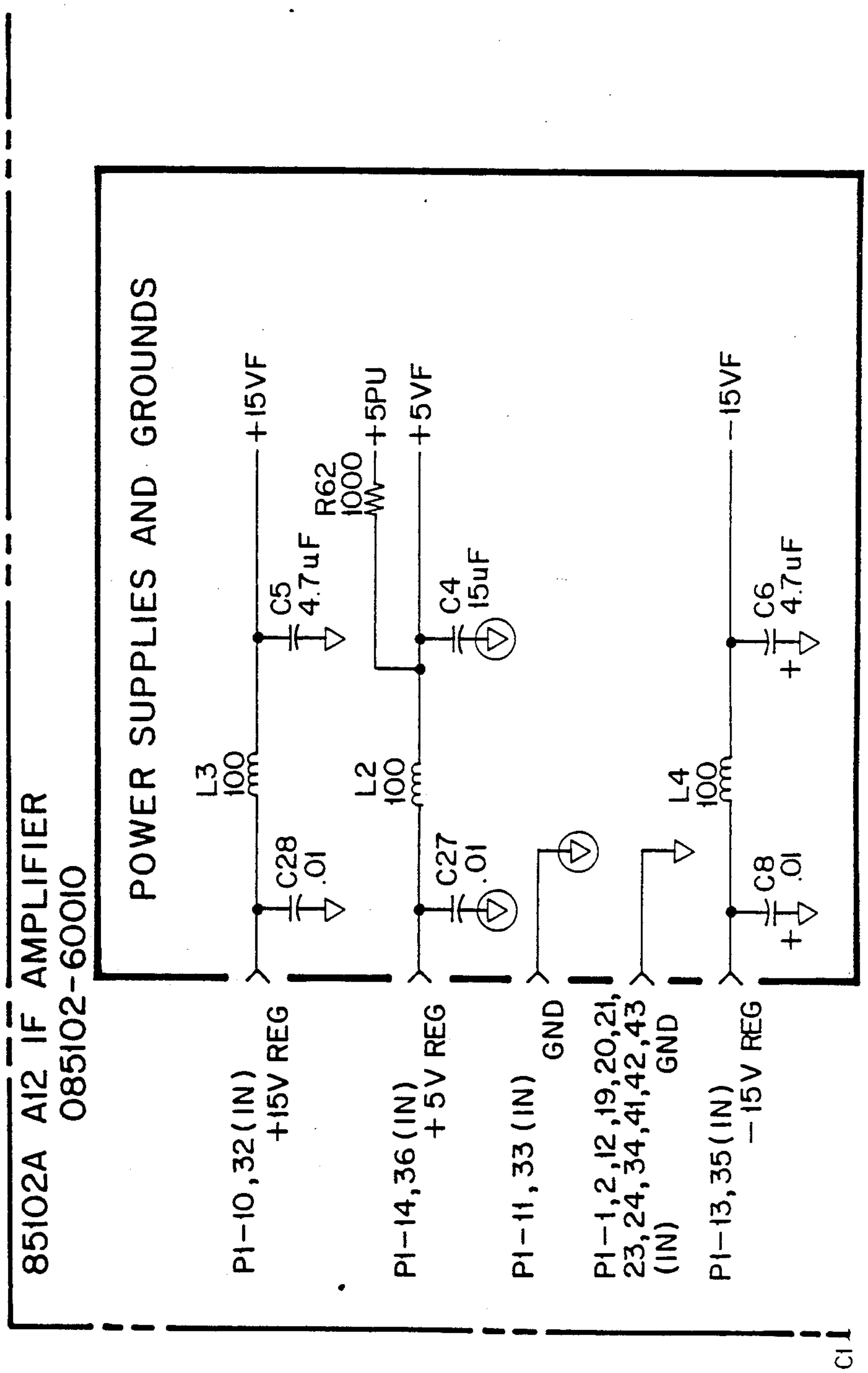
FIG 27.23A

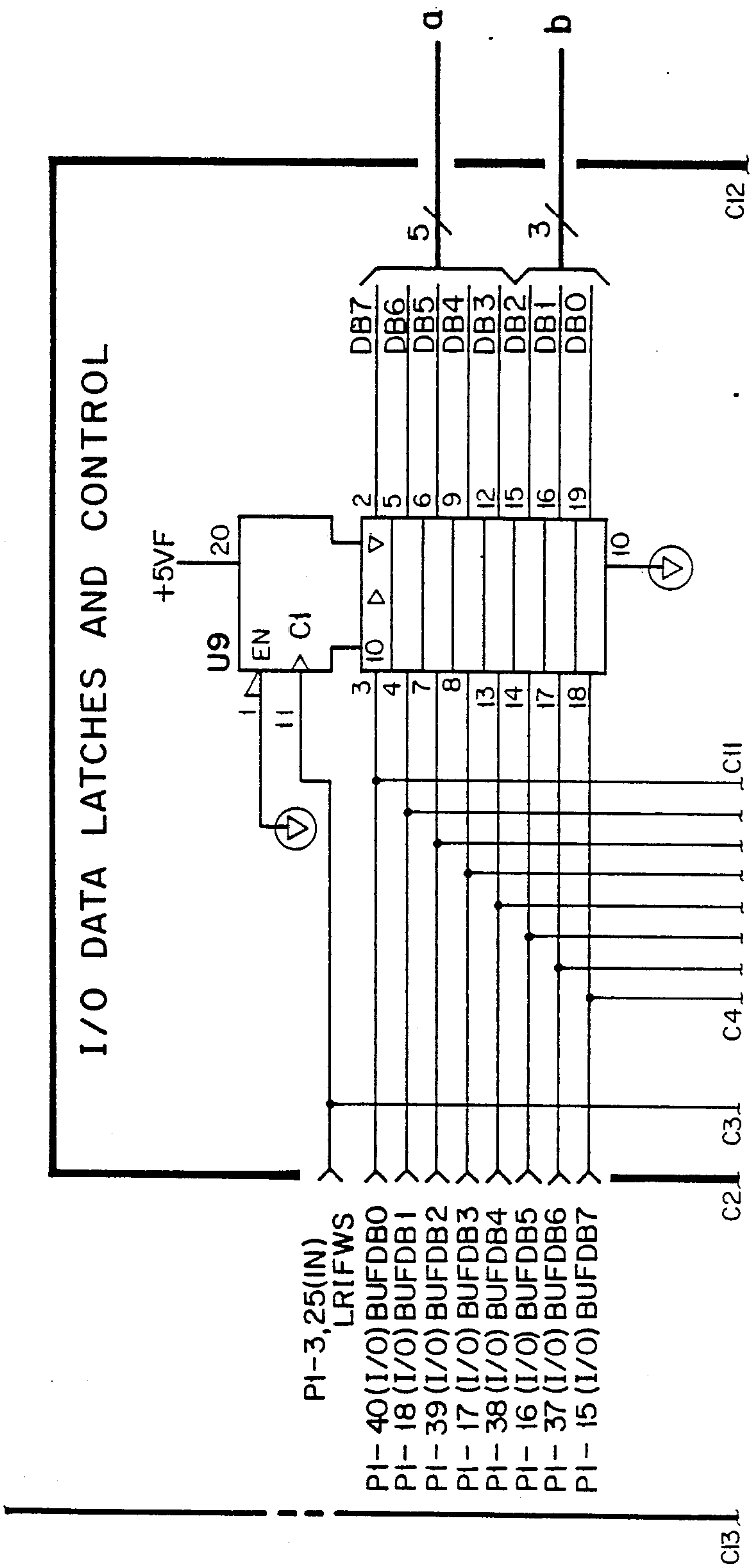
FIG 27.23B

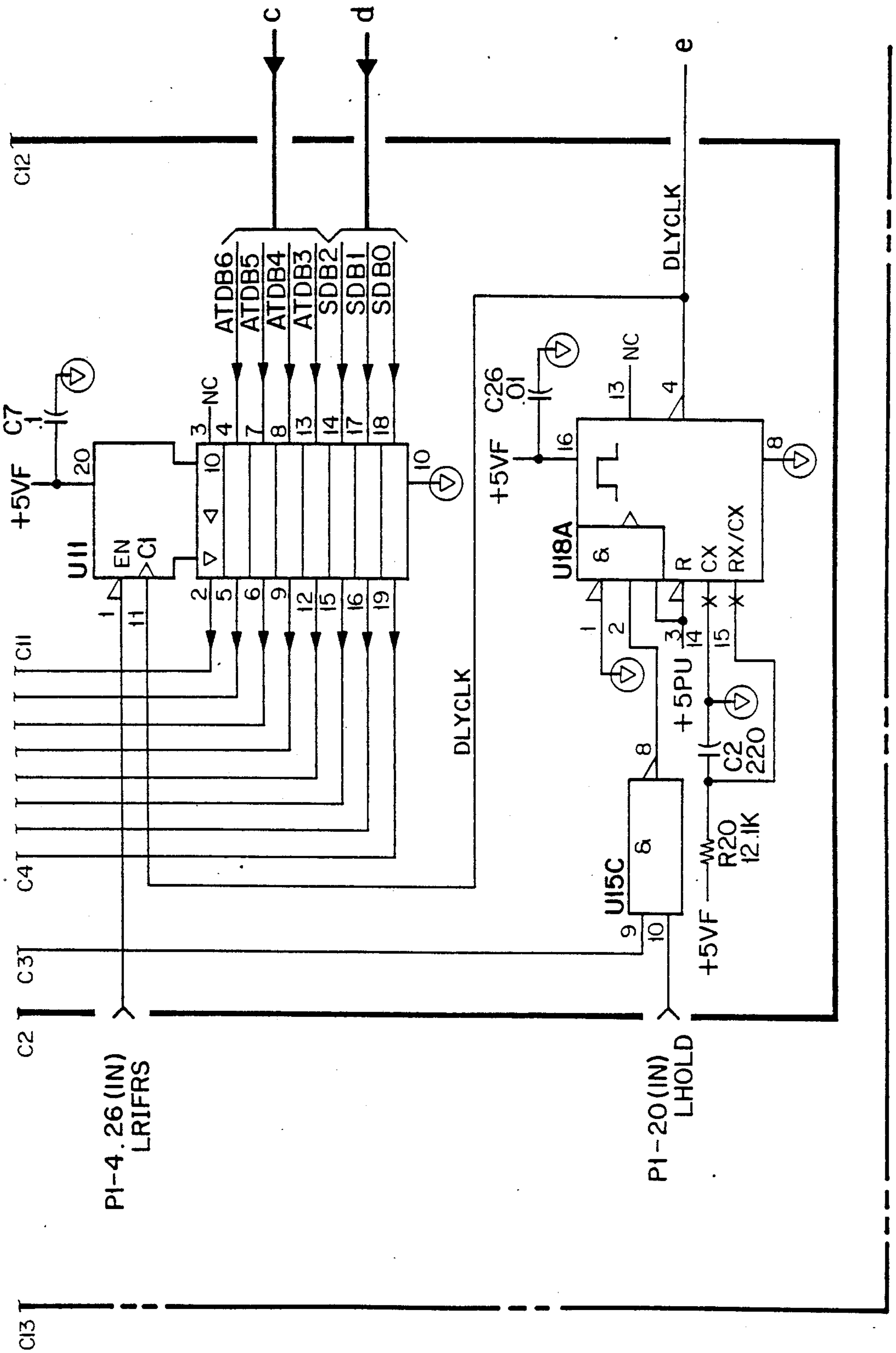
FIG 27.23C

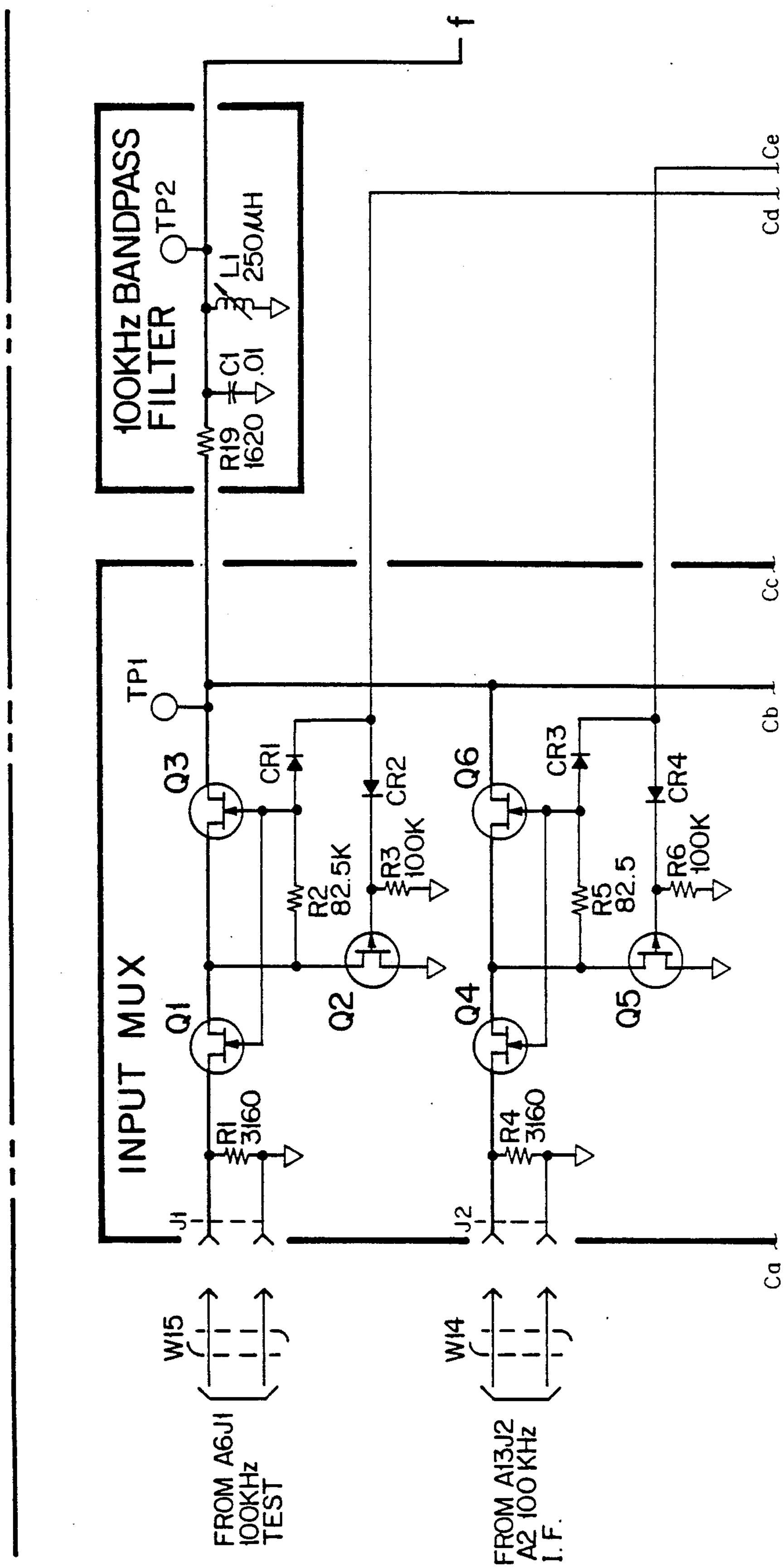
FIG 27.24A

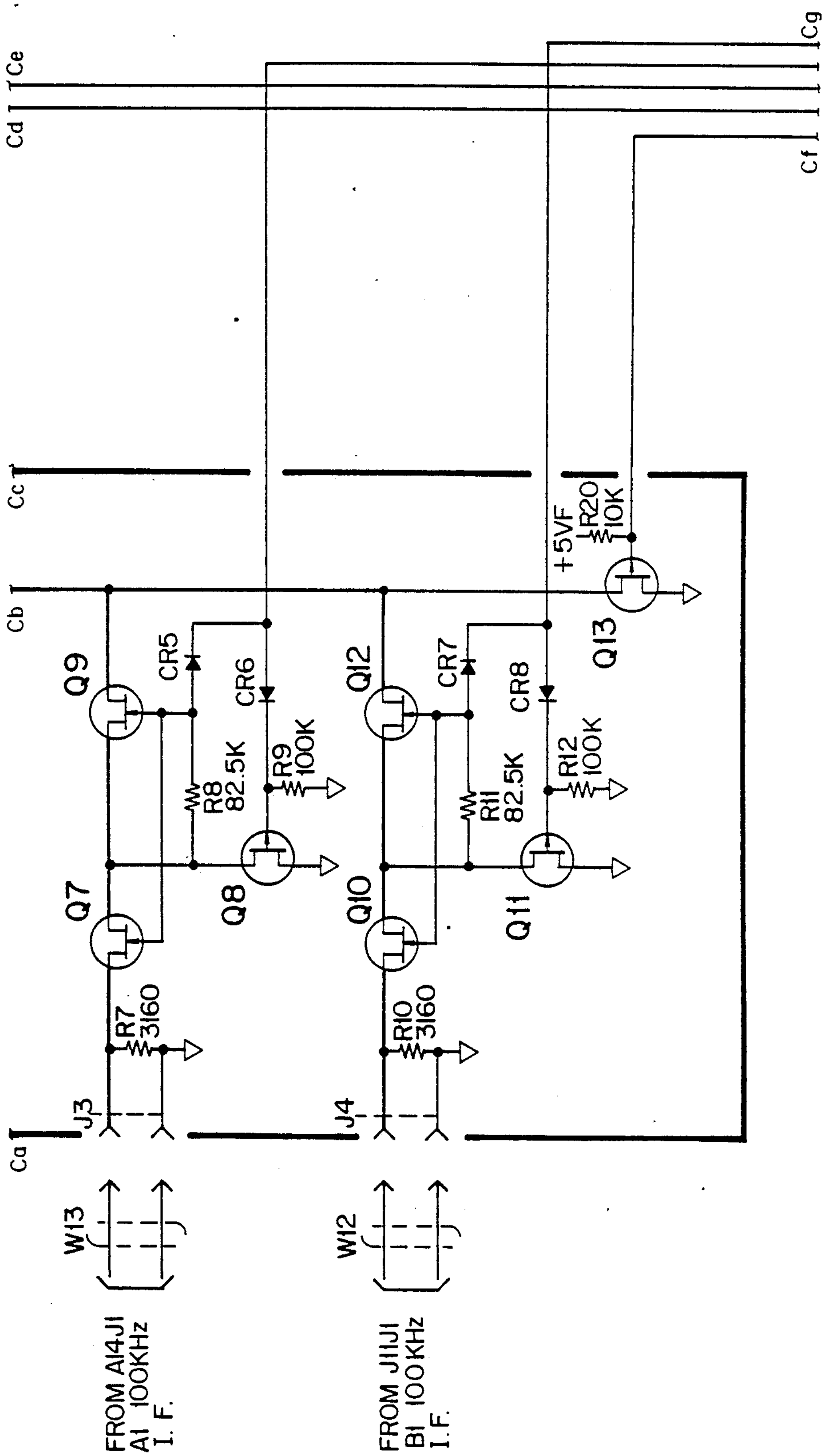
FIG 27.24B

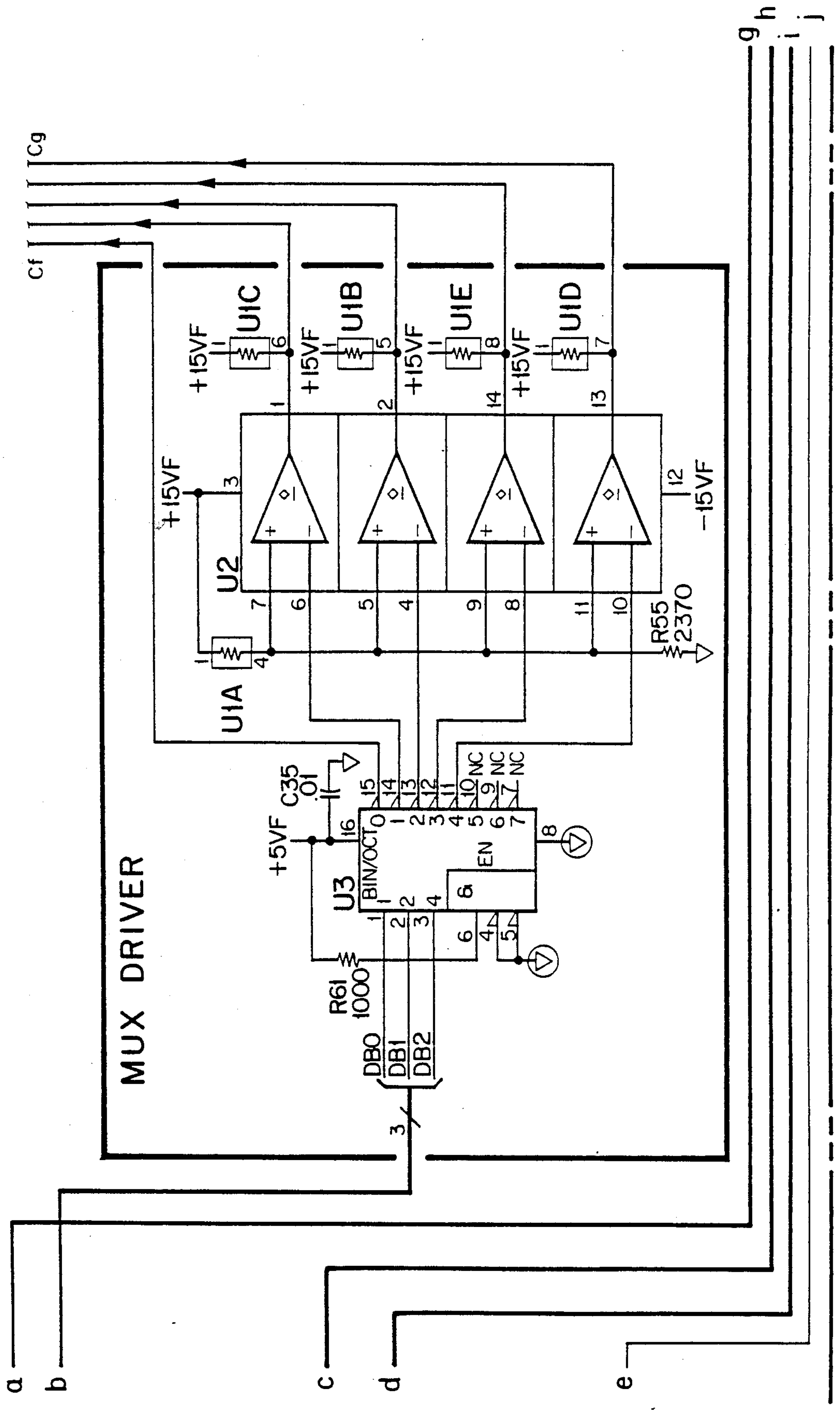
FIG 27.24C

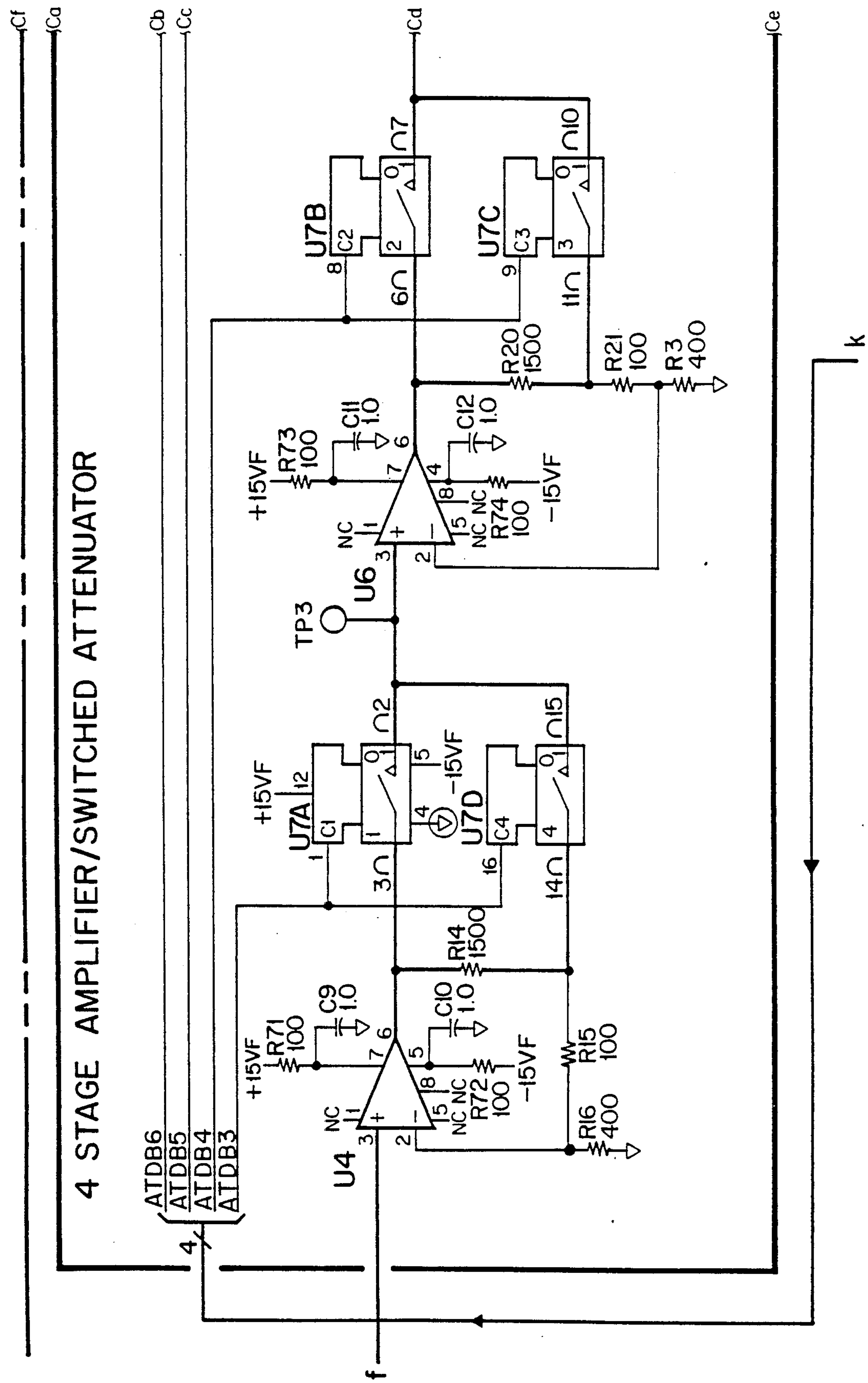
FIG 27.25A

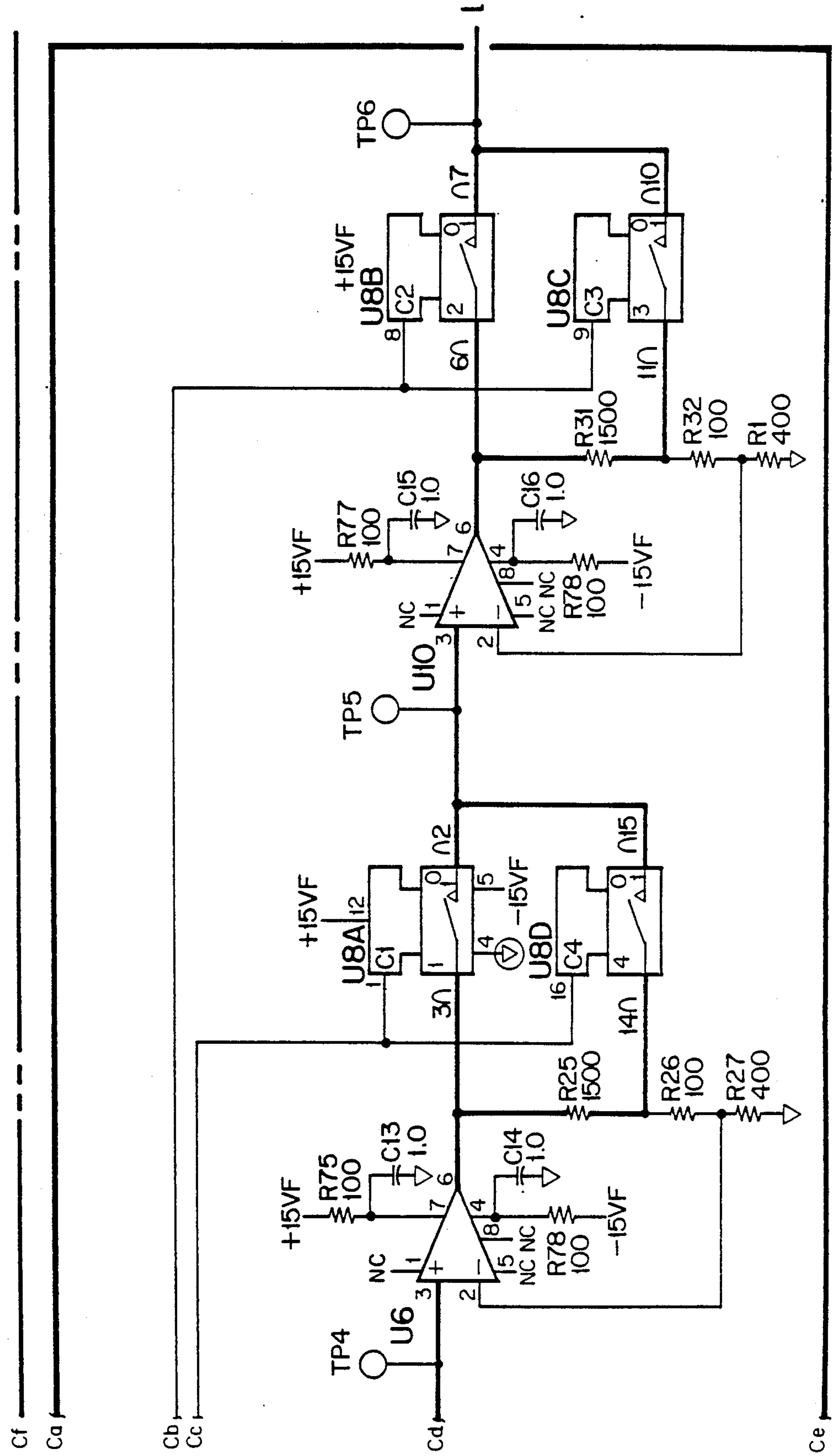
FIG 27.25B

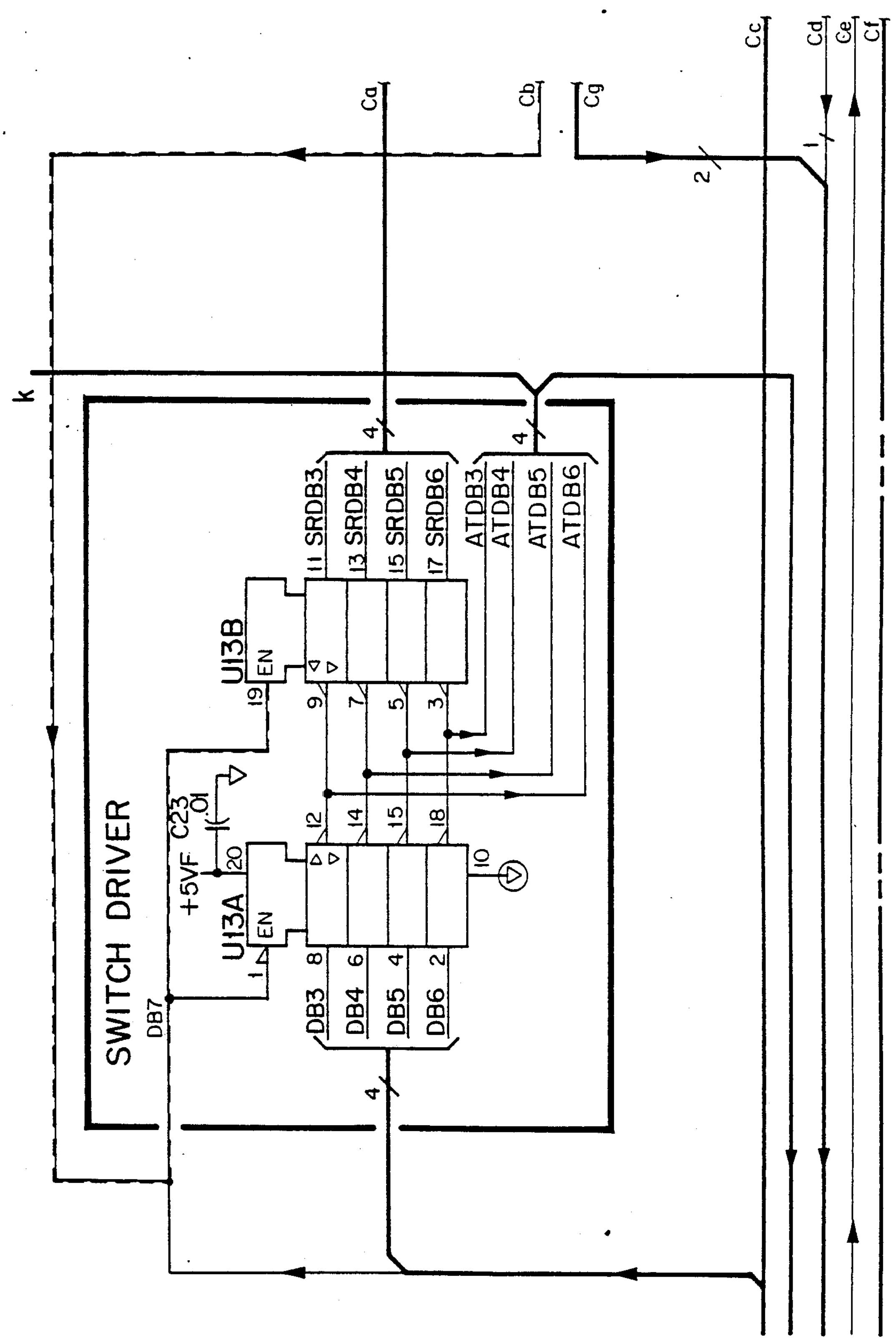
FIG 27.26A

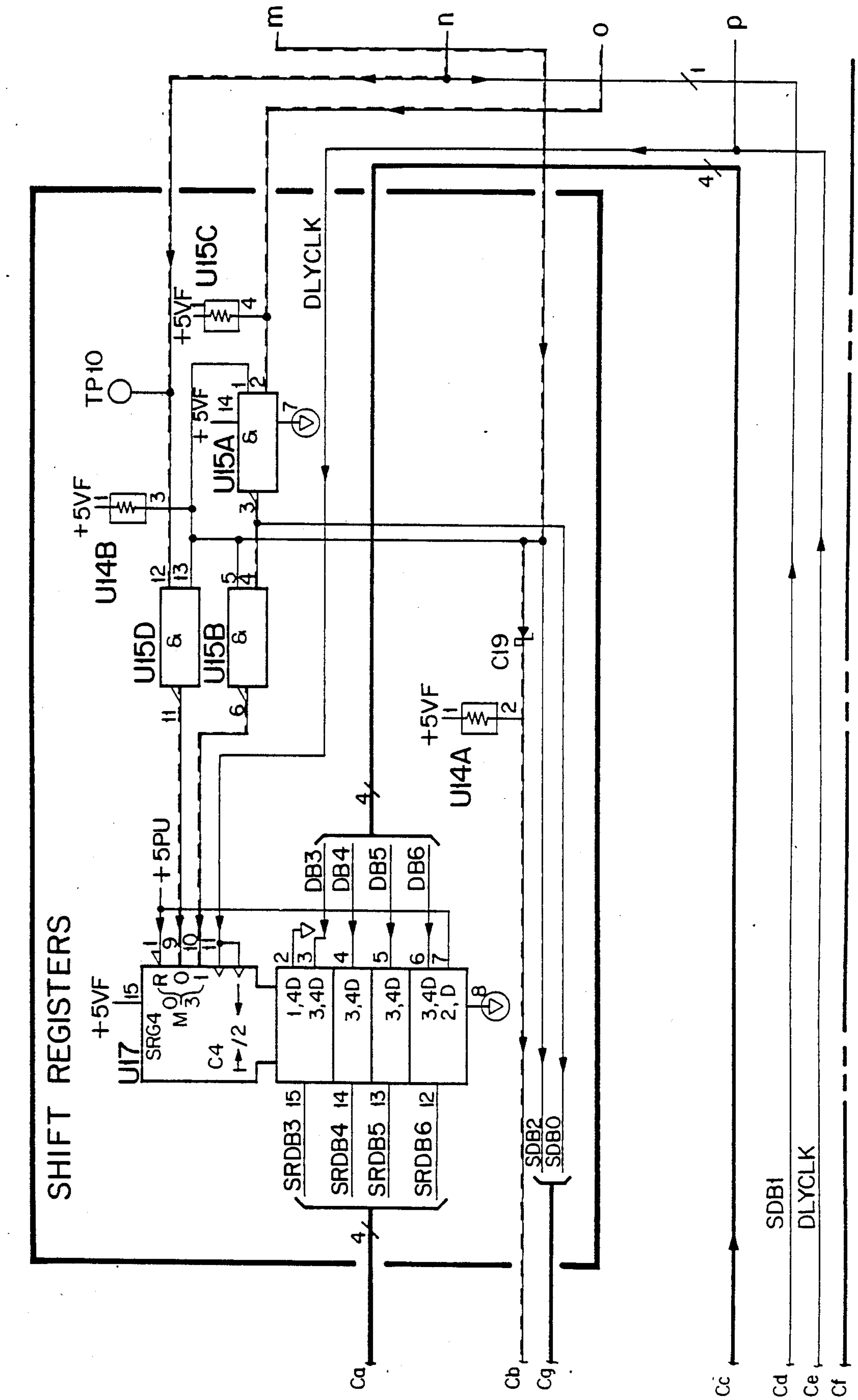
FIG 27.26B

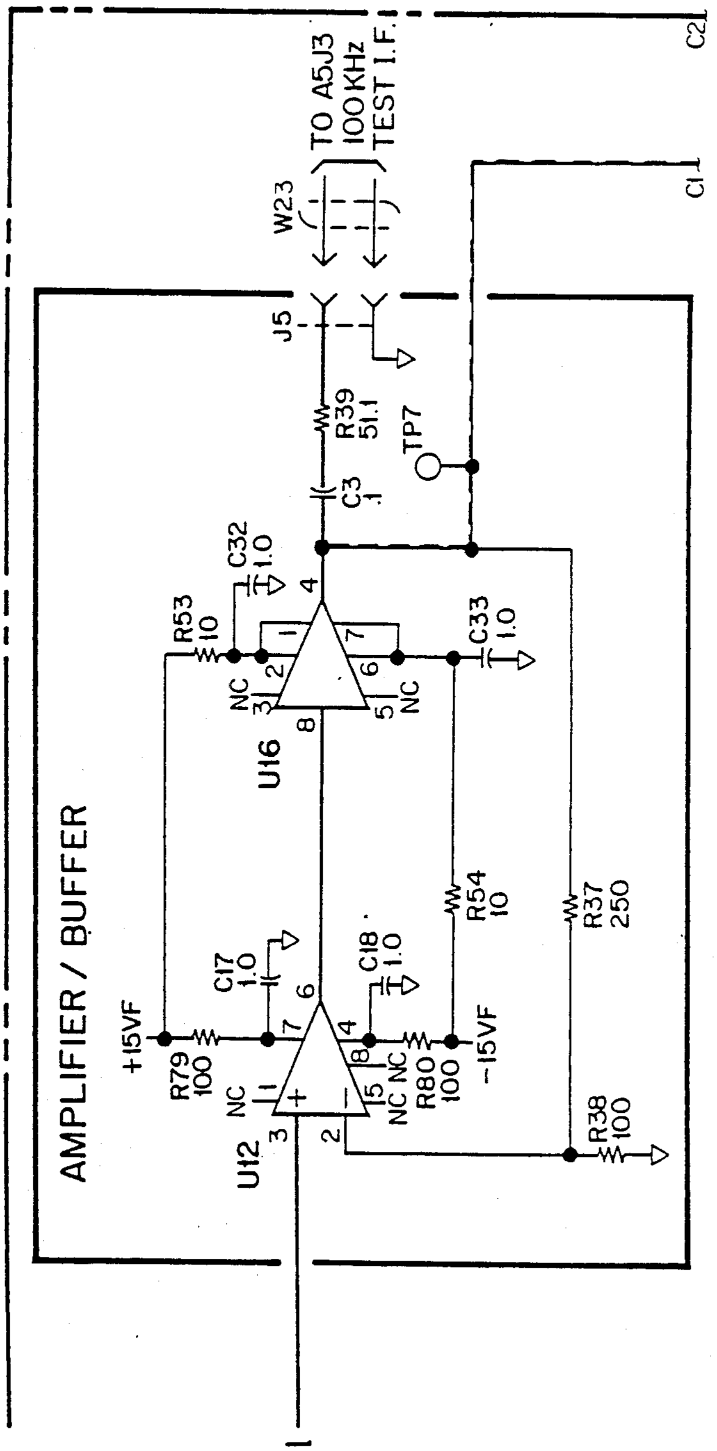
FIG 27.27A

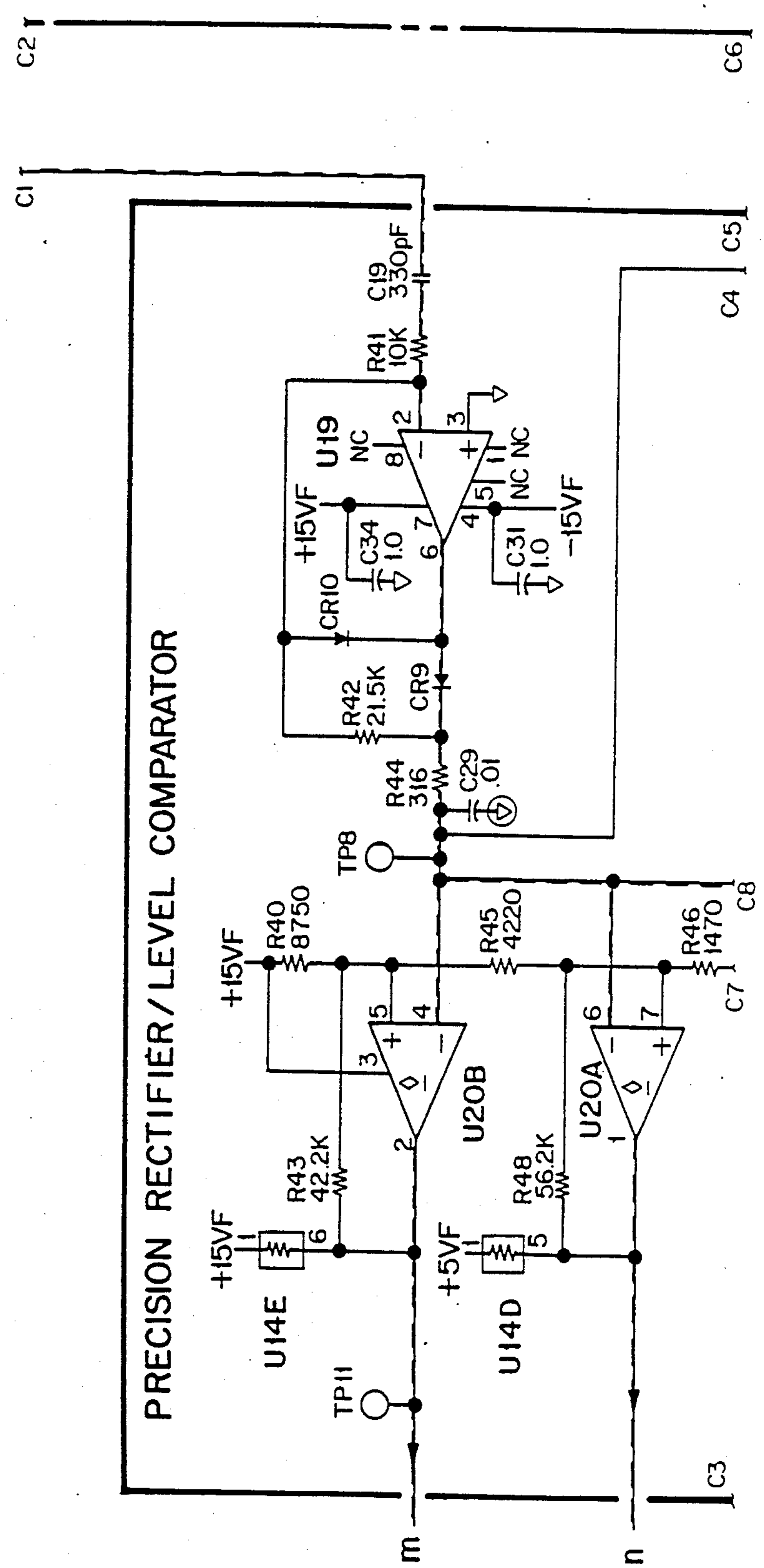
FIG 27.27B

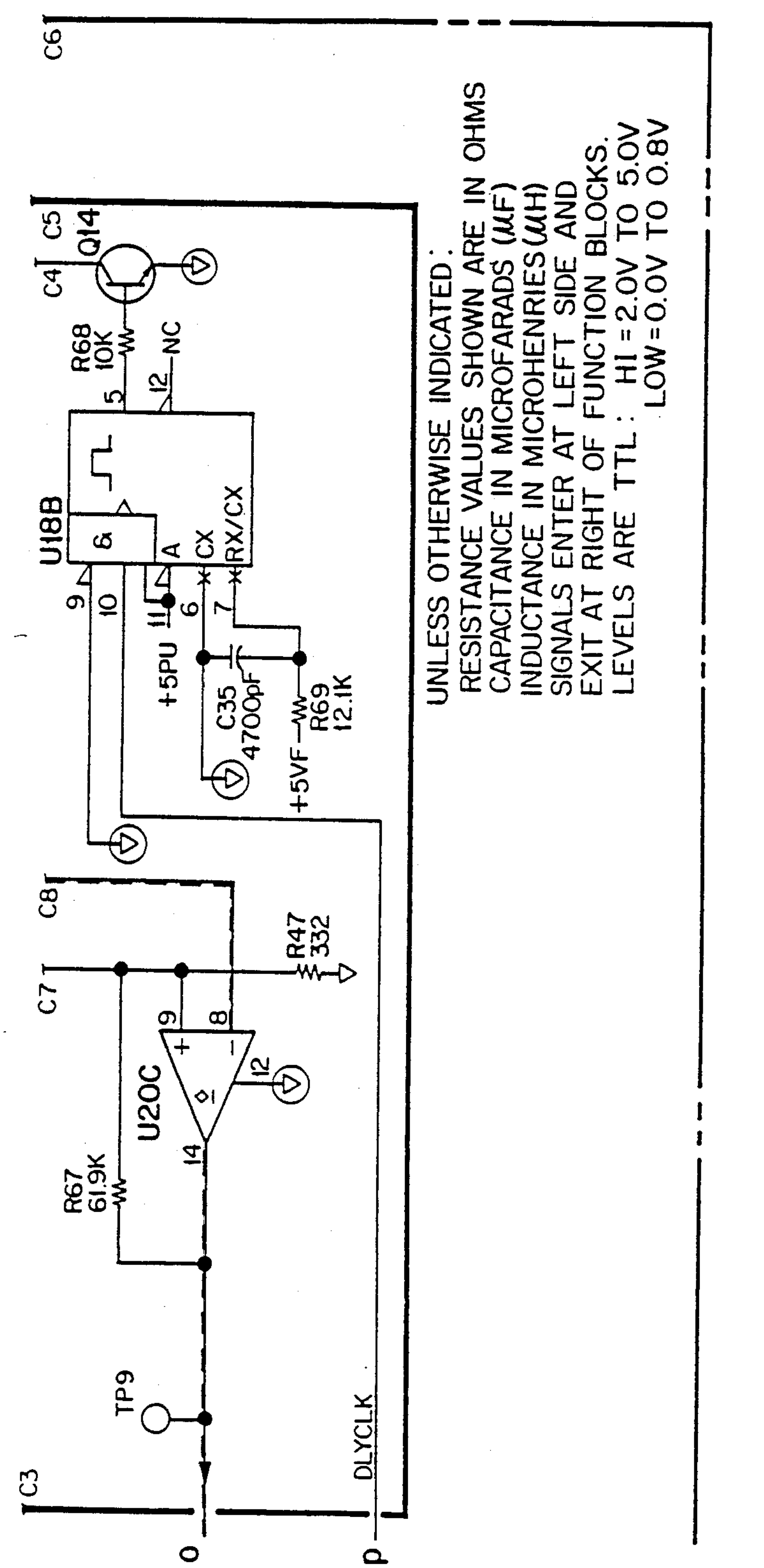
FIG 27.27C

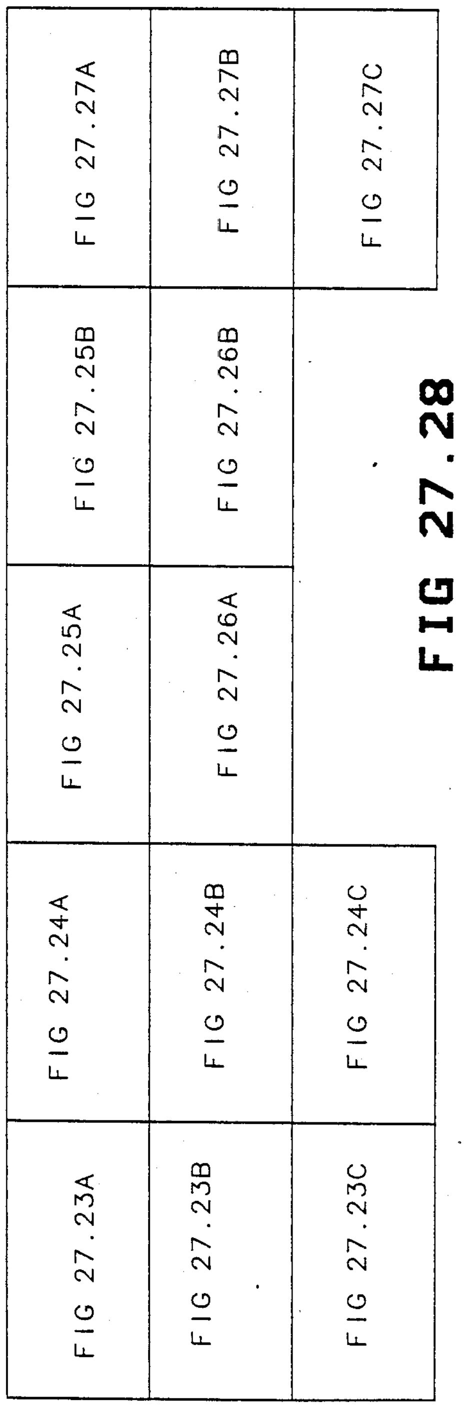
FIG 27.28
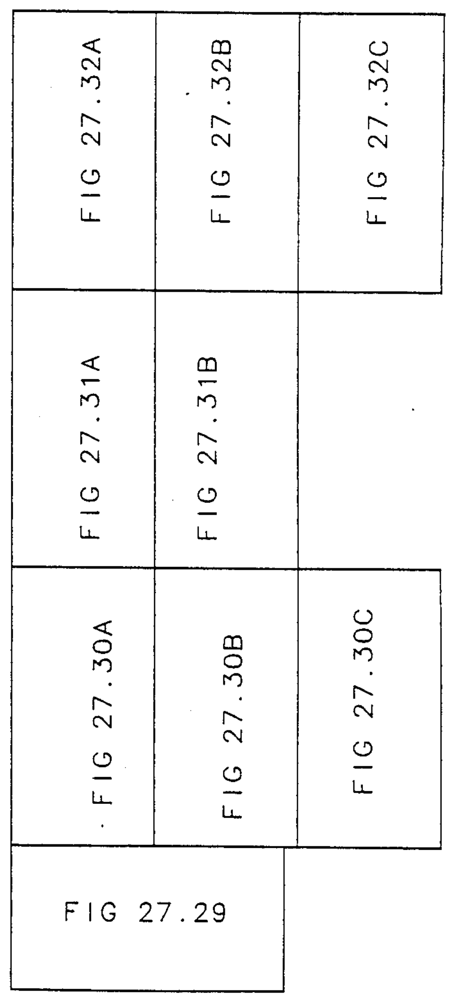
FIG 27.33

A15 REGULATOR
85102-60015

P1

| PIN | SIGNAL | TO/FROM | FUNCTION BLOCK |
|---|---|---|---|
| 1 | Q2B | A25Q2 BASE | J |
| 23 | | | |
| 2 24 | | | |
| 3 25 | -5V SENSE | -5V BUS | J |
| 4 26 | | | |
| 5 27 | | | |
| 6 28 | | | |
| 7 29 | | | |
| 8 30 | | | |
| 9 31 | | | |
| 10 32 | +15V REG | +15V BUS | E |
| 11 33 | GND | GND BUS | A |
| 12 34 | GND | GND BUS | A |
| 13 35 | -15V REG | -15V BUS | H |
| 14 36 | -5V REG | +5V BUS | I |
| 15 | | | |
| 37 | +5V SENSE | +5V BUS | I |
| 16 | | | |
| 38 | -15V SENSE | -15V BUS | H |
| 17 | -15VUNREG | A26 | C G |
| 39 | Q4B | A25Q+ BASE | G H |
| 18 | | | |
| 40 | +15VUNREG | A26 | B D |
| 19 | Q1B | A25Q1 BASE | I |
| 41 | Q3B | A25Q3 BASE | D E |
| 20 | Q5B | A25Q5 BASE | I |
| 42 | | | |
| 21 | SENSE GND | GND | E H I J |
| 43 | THER 1 | A25RT1 | F |
| 22 | +15 SENSE | +15V BUS | E H I J |
| 44 | THER 2 | A25RT1 | E |

ACTIVE COMPONENTS PARTS LISTS
(U's and Q's)

| REFERENCE DESIGNATORS | HP PART NUMBER | MANUFACTURER'S PART NUMBER |
|---|---|---|
| U8 | 1826-0458 | LF255 |
| U2 | 1826-0458 | LF255 |
| U9 | 1826-0458 | LF255 |
| U6 | 1826-0458 | LF255 |
| U10 | 1826-0261 | 741 |
| | | |
| | | |
| U5 | 1826-0316 | LH0070 |
| U4 | 1826-0468 | MC3423 |
| U3 | 1826-0468 | MC3423 |
| U1 | 1826-0468 | MC3423 |
| U7 | 1826-0468 | MC3423 |
| | | |
| Q18 | 1853-0281 | 2N2907 |
| Q3 | 1854-0477 | 2N222 |
| Q13 | 1854-0477 | 2N222A |
| Q12 | 1854-0022 | 2N2102 |
| Q11 | 1853-0281 | 2N2907 |
| Q15 | 1853-0281 | 2N2907A |
| Q9 | 1853-0281 | 2N2907A |
| Q8 | 1854-0404 | S59333 |
| Q7 | 1884-0244 | |
| Q2 | 1884-0293 | |
| Q4 | 1884-0244 | |
| Q9 | 1884-0244 | |
| Q17 | 1884-0073 | |
| Q10 | 1854-0404 | S59333 |
| Q14 | 1853-0314 | 2N2905A |
| Q16 | 1854-0637 | 2N2219A |
| Q1,Q6 | 1854-0477 | 2N222A |

| CHASSIS | MOUNTED | SEMICONDUCTORS |
|---|---|---|
| Q1 | 1854-0679 | 2N5885 |
| Q2 | 1853-0351 | 2N6053 |
| Q3 | 1854-0611 | 2N6055 |
| Q4 | 1853-0351 | 2N6053 |

| MOTHERBOARD | | SEMICONDUCTORS |
|---|---|---|
| Q5 | 1854-0441 | 40372 |

FIG 27.29

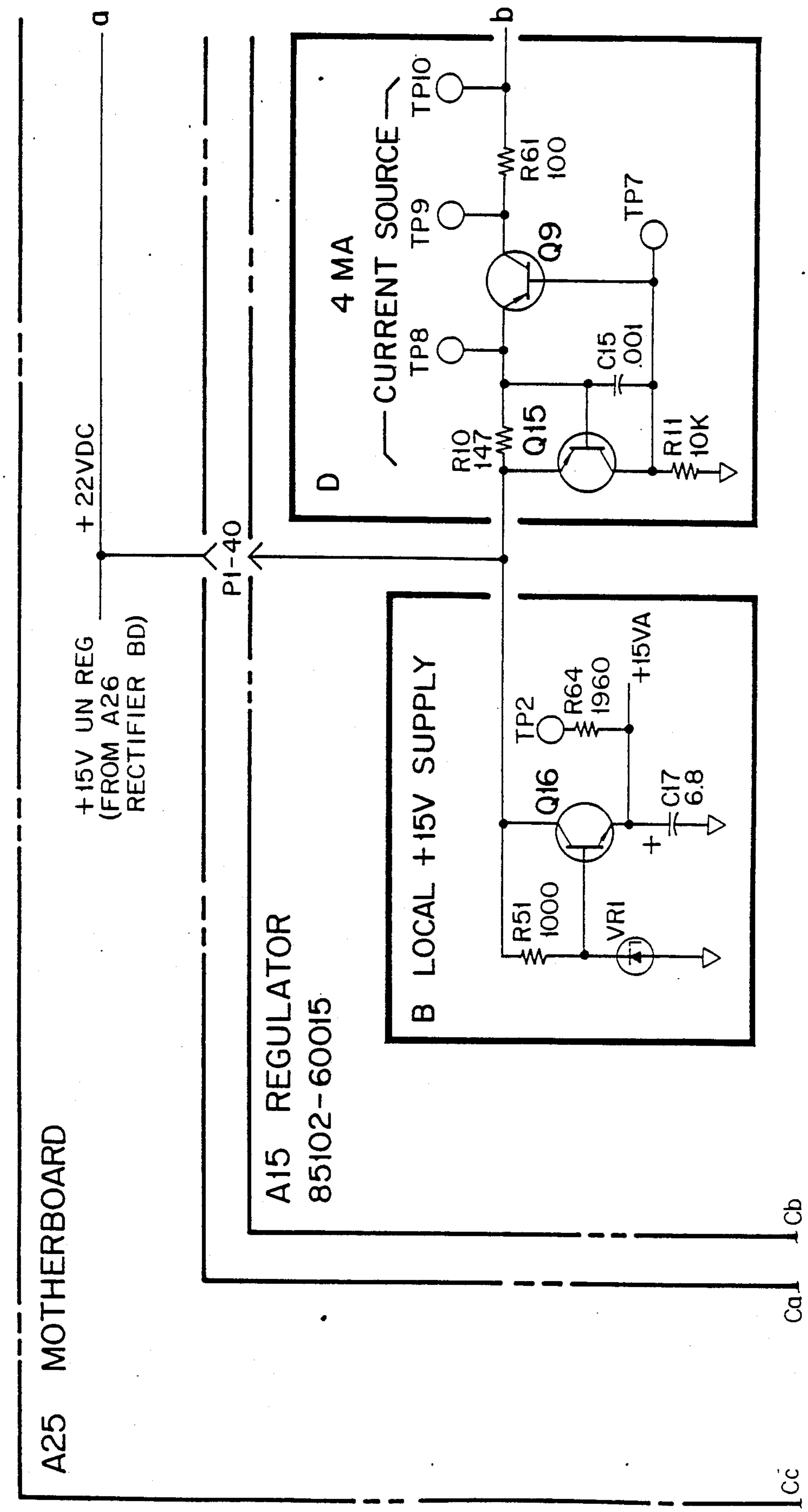
FIG 27.30A

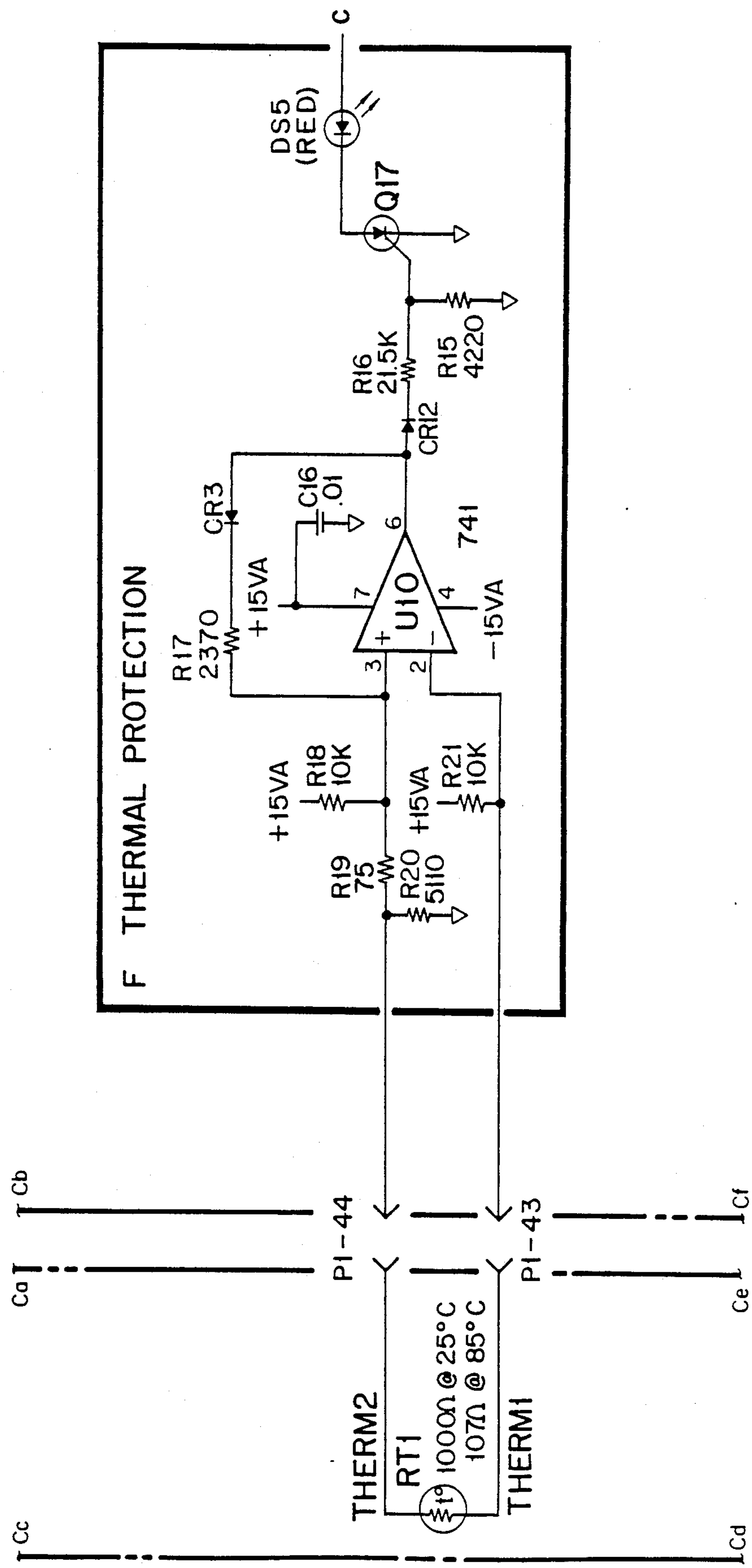
FIG 27.30B

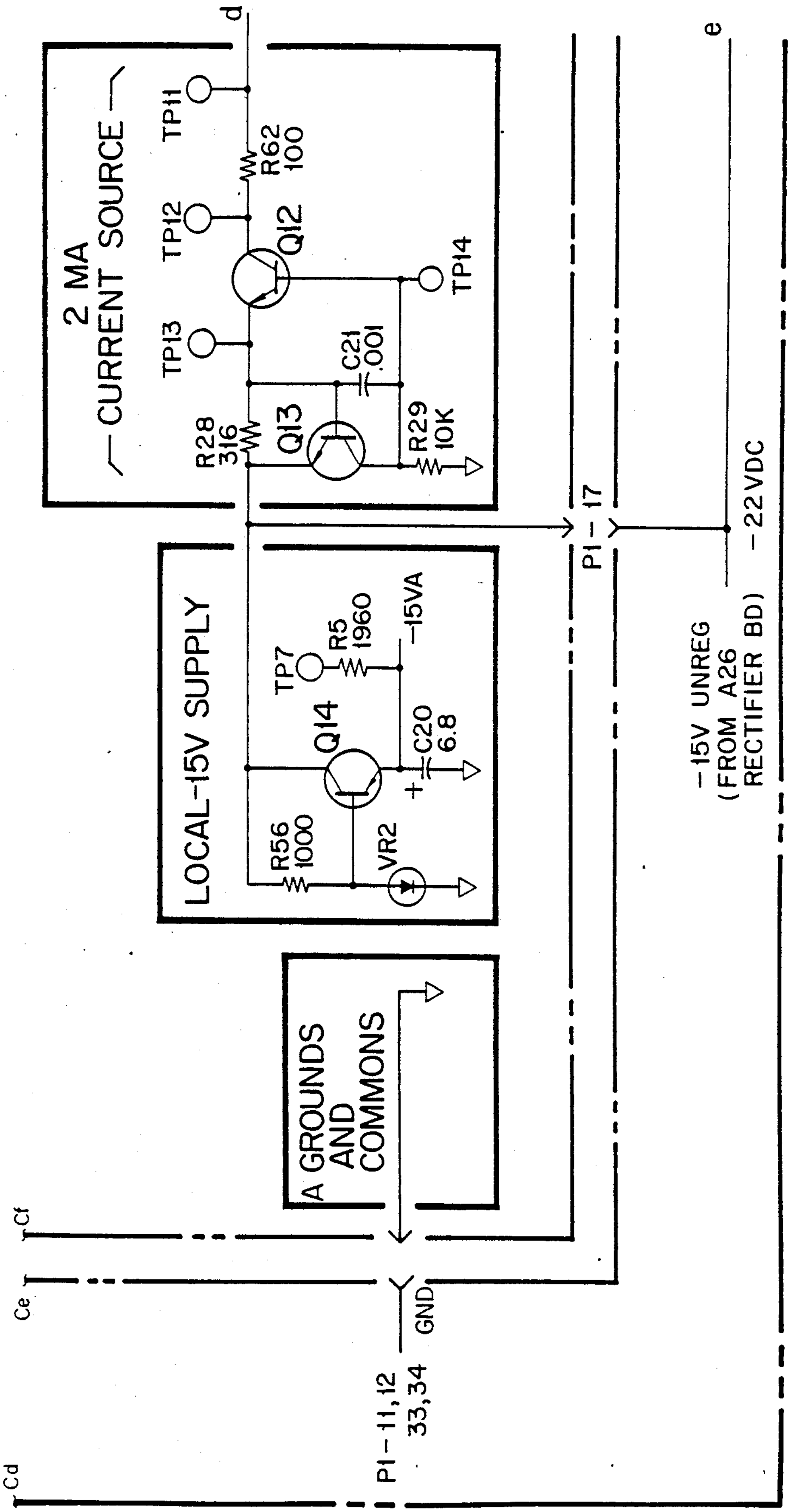
FIG 27.30C

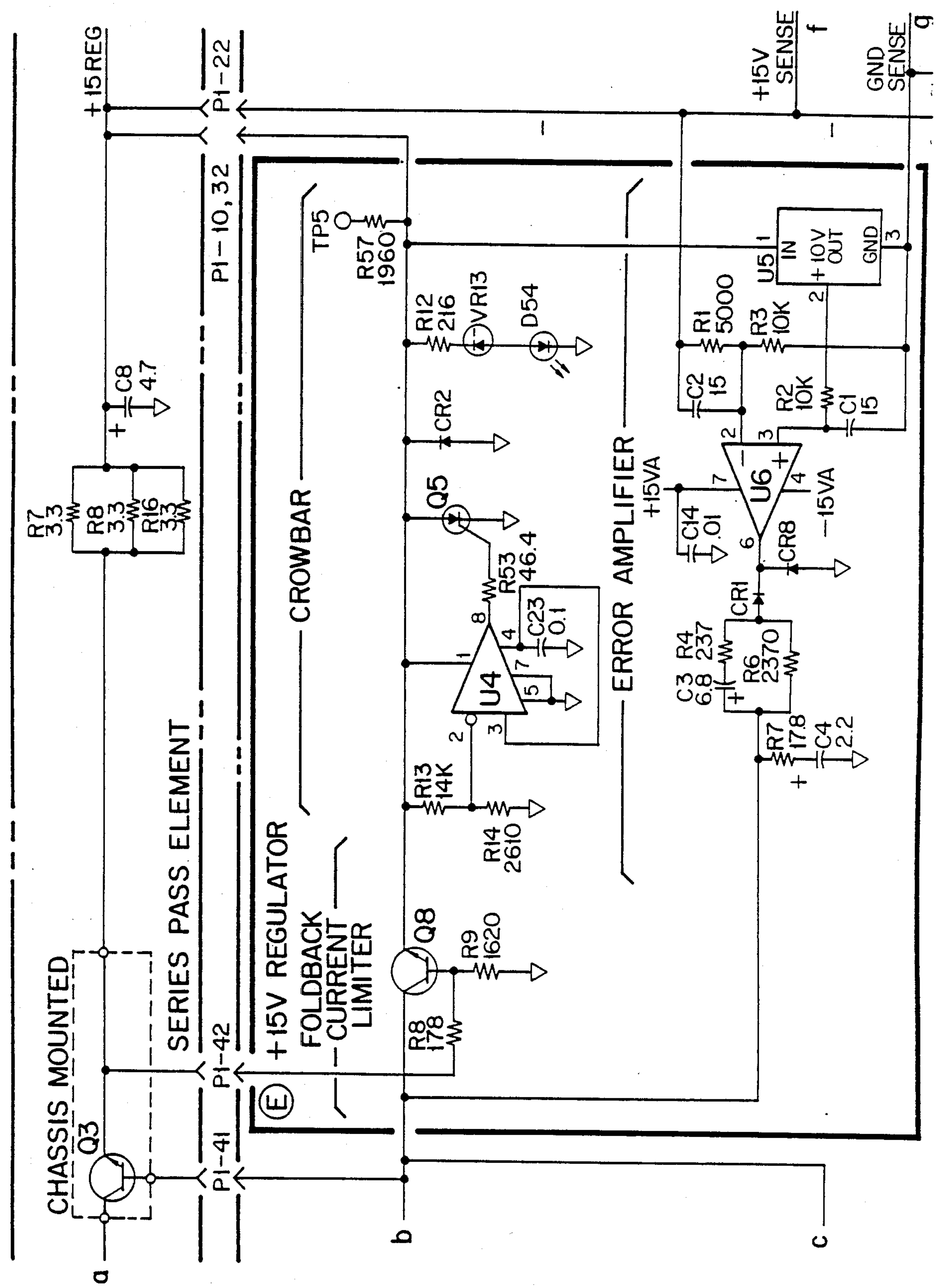
FIG 27.31A

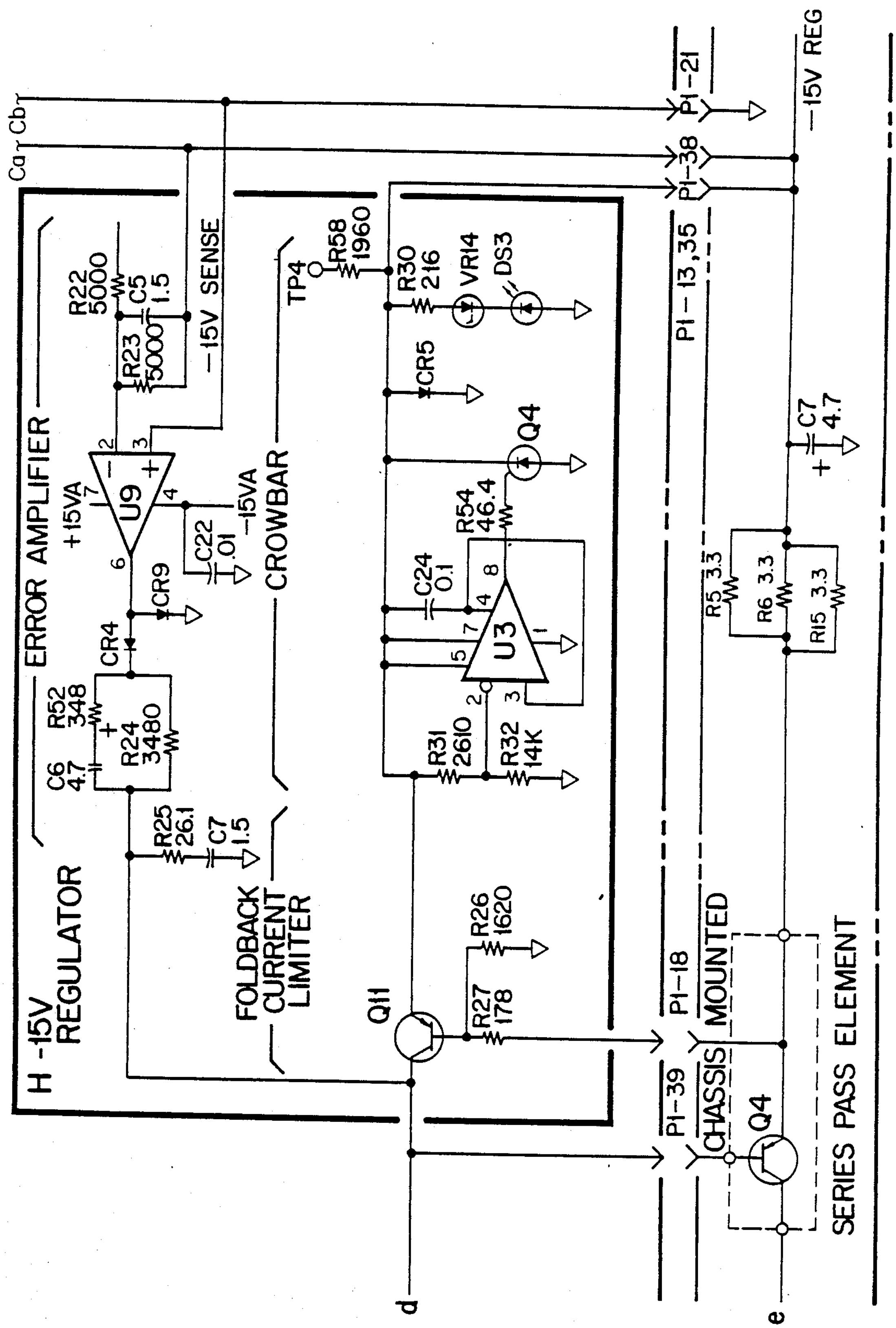
FIG 27.31B

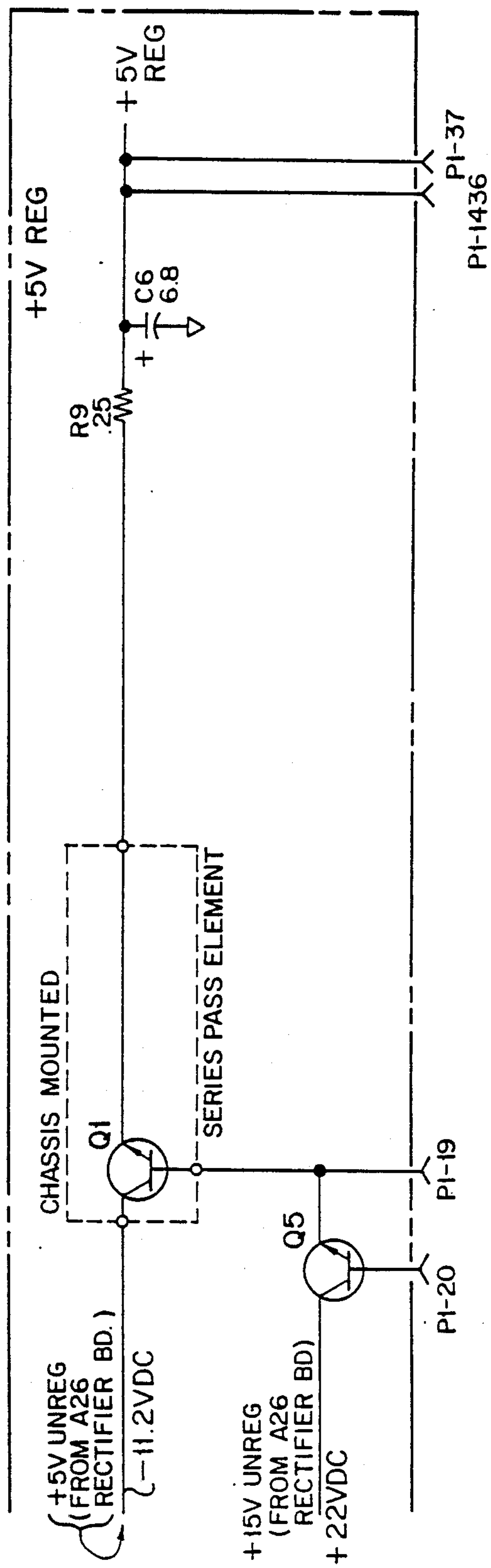
FIG 27.32A

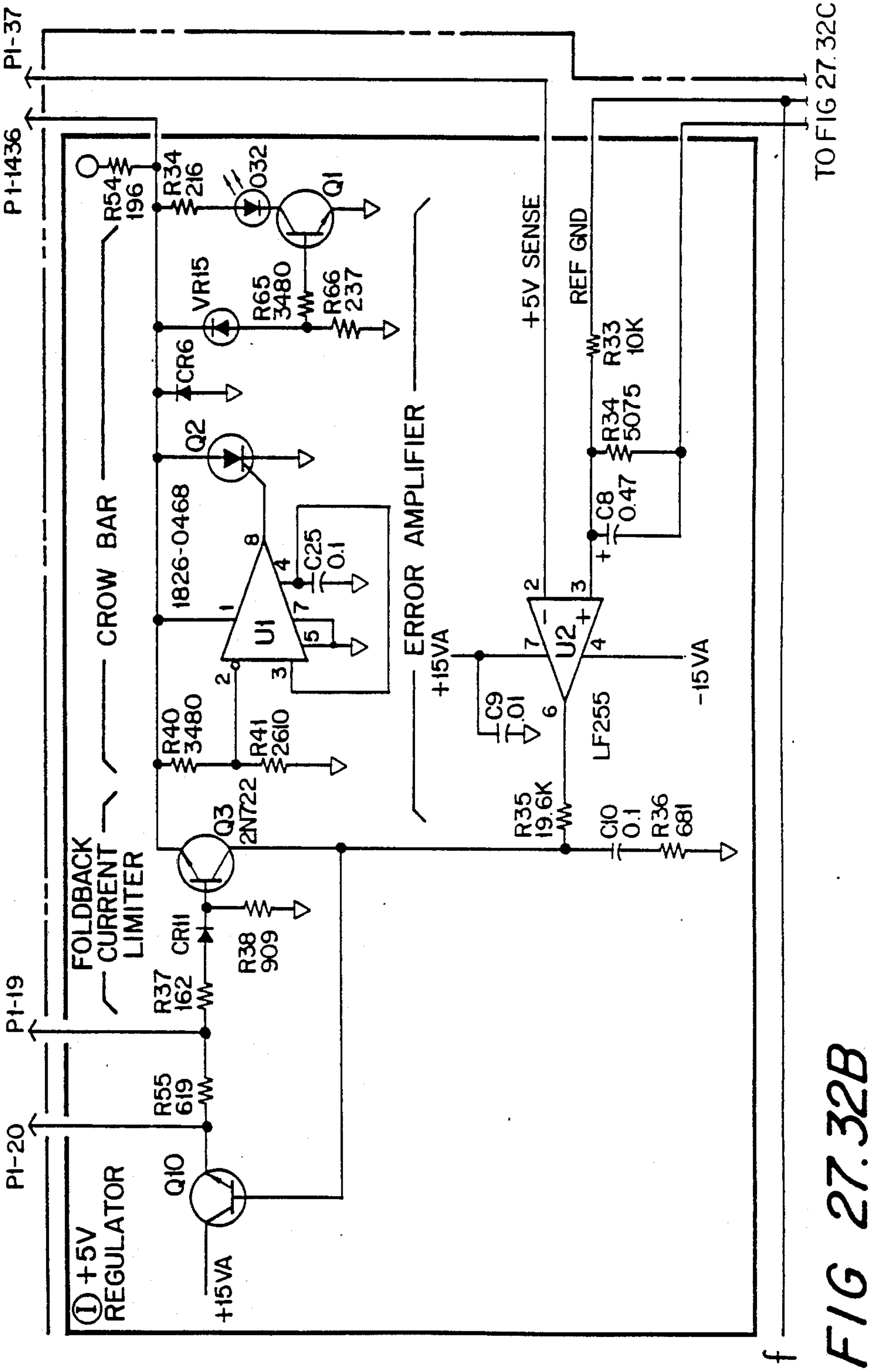
FIG 27.32B

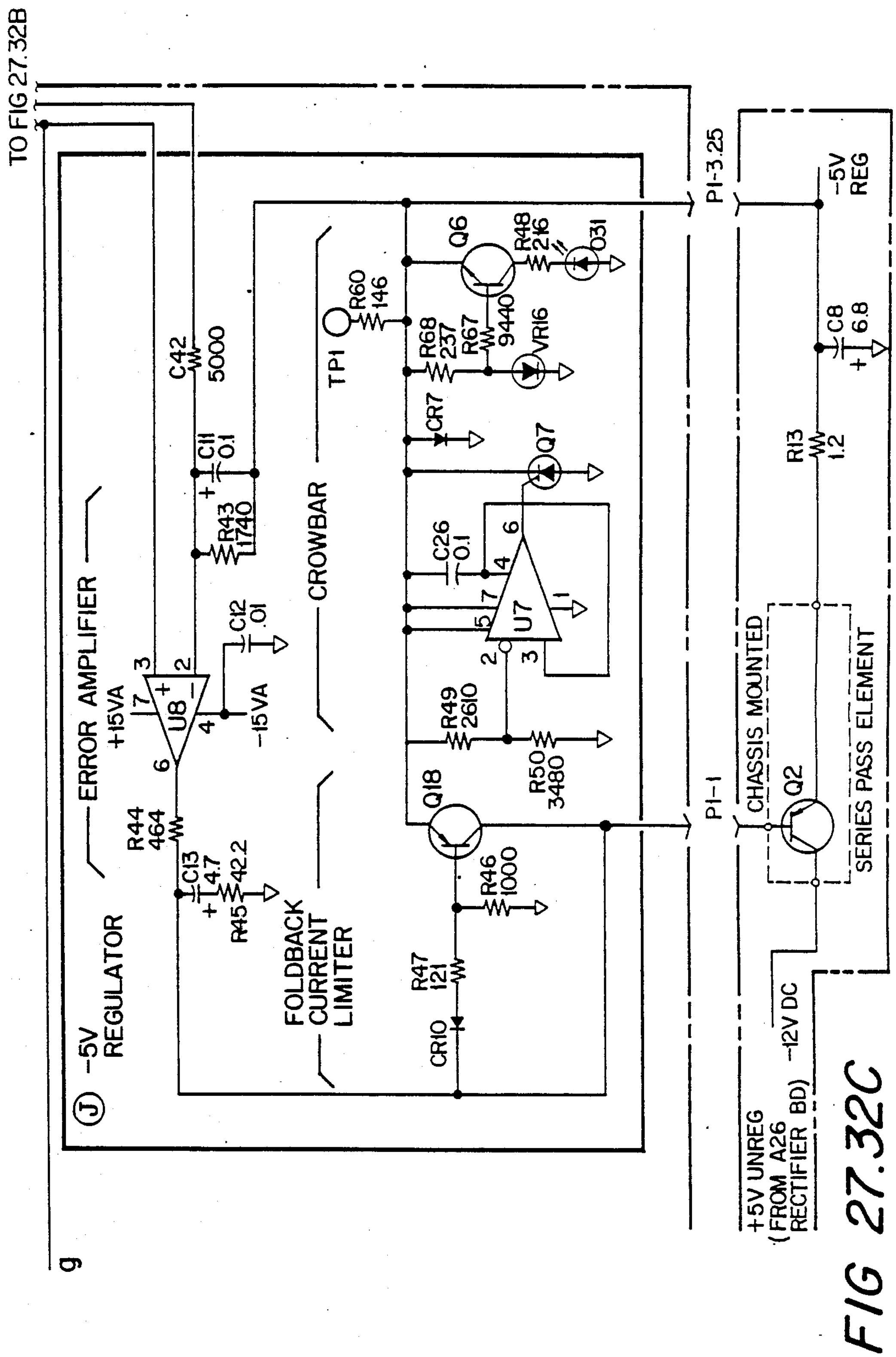
FIG 27.32C

A17

| PIN | SIGNAL | TO/FROM | FUNCTION BLOCK |
|---|---|---|---|
| 1 23 | PLSTSTX<br>TEMP | A16<br>A25 | |
| 2 24 | PLSTSTY<br>+10 VR | A16<br>A18 | |
| 3 25 | PLSREFX<br>LHOLD | A16<br>A19 | |
| 4 26 | PLSREFY<br>NOT USED | A16 | |
| 5 27 | LLOST<br>LIFSRQ | ADR BUS<br>A24 | NOT USED |
| 6 28 | CLK<br>LRDS | A6<br>A24 | NOT USED |
| 7 29 | LADCSRQ<br>AB0 | A24<br>ADR BUS | NOT USED |
| 8 30 | AB1<br>AB2 | ADR BUS<br>ADR BUS | |
| 9 31 | AB3<br>AB4 | ADR BUS<br>ADR BUS | |
| 10 32 | +15V REG<br>+15V REG | PWR BUS | |
| 11 33 | GND | | |
| 12 34 | GND | | |
| 13 35 | -15V REG<br>-15V REG | PWR BUS | |
| 14 36 | + 5V REG<br>+ 5V REG | PWR BUS | |
| 15 37 | DB0<br>DB1 | DATA BUS<br>DATA BUS | |
| 16 38 | DB2<br>DB3 | DATA BUS<br>DATA BUS | |
| 17 39 | DB4<br>DB5 | DATA BUS<br>DATA BUS | |
| 18 40 | DB6<br>DB7 | DATA BUS<br>DATA BUS | |
| 19 41 | DB8<br>DB9 | DATA BUS<br>DATA BUS | |
| 20 42 | DB10<br>DB11 | DATA BUS<br>DATA BUS | |
| 21 43 | SEL1<br>SEL2 | A19<br>A19 | |
| 22 44 | NOT USED<br>NOT USED | | |

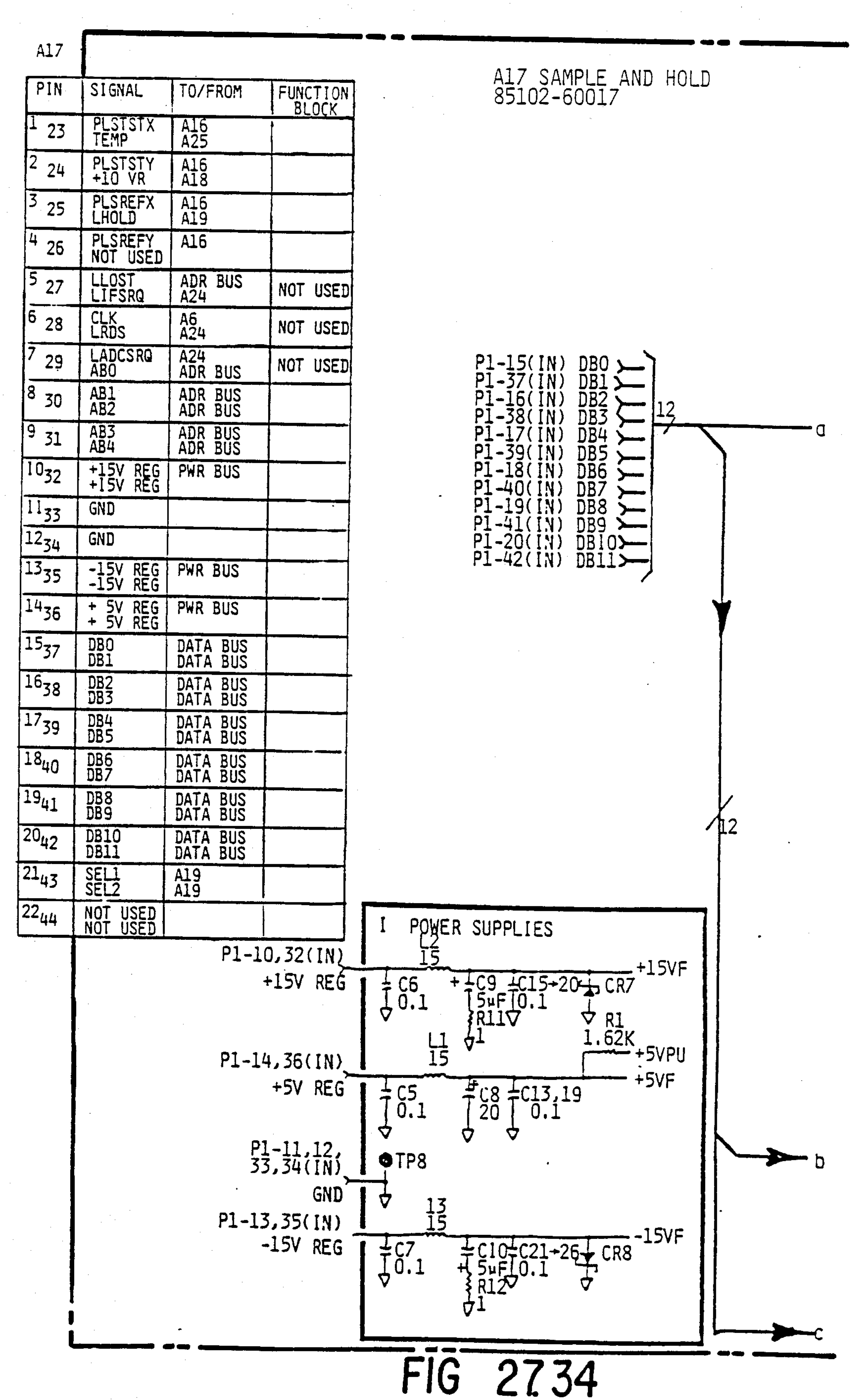

FIG 2734

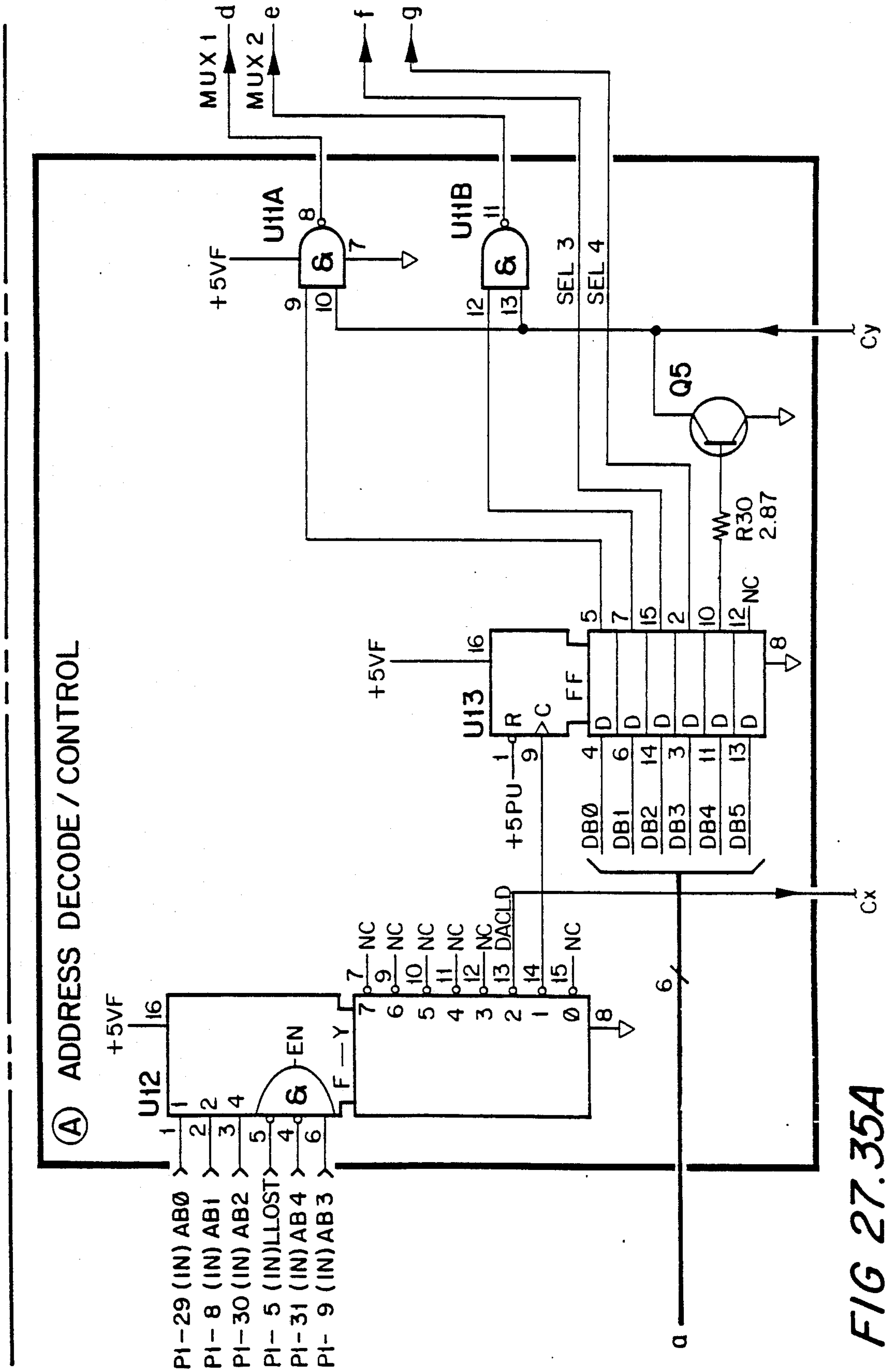
FIG 27.35A

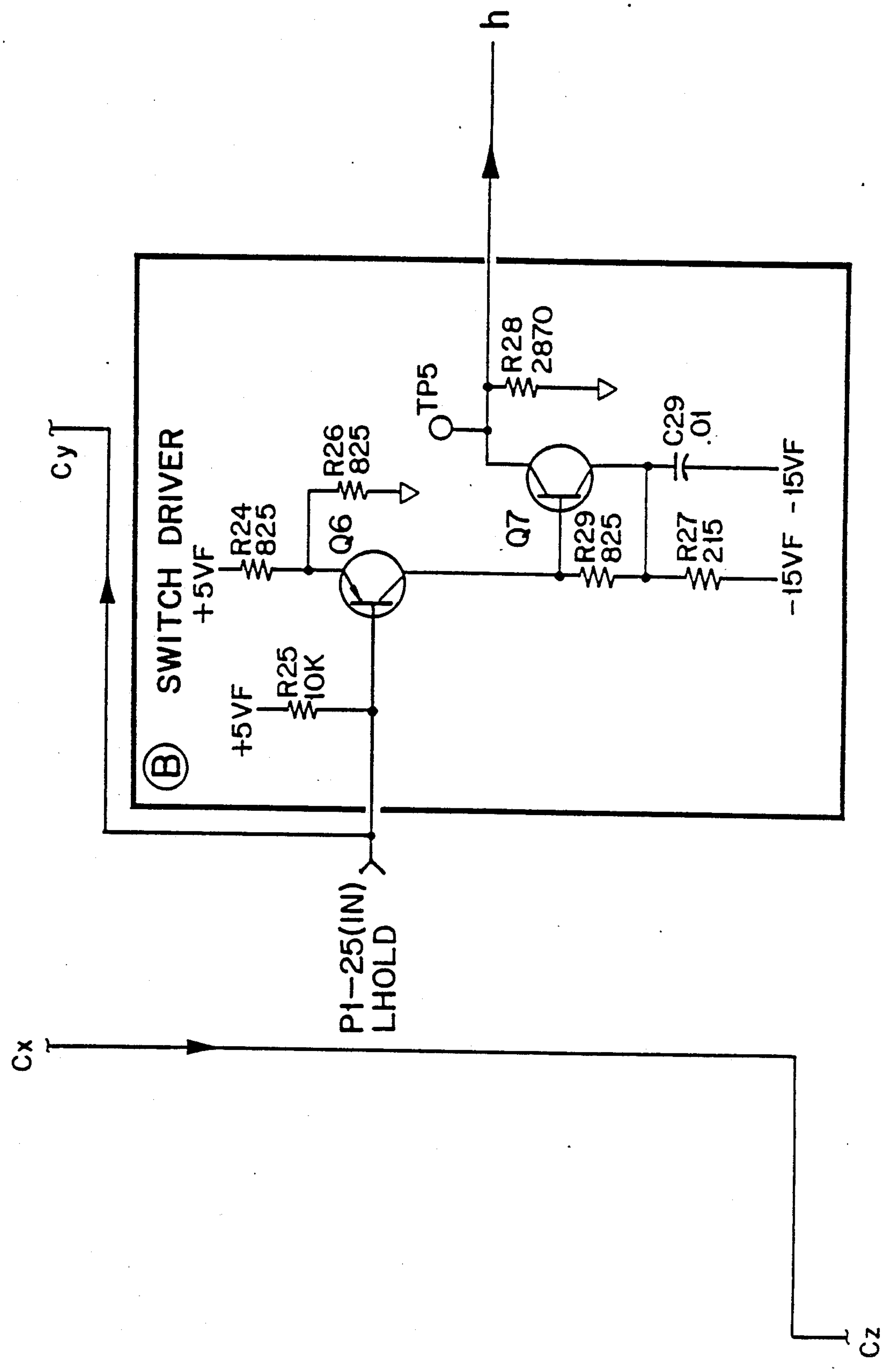
FIG 27.35B

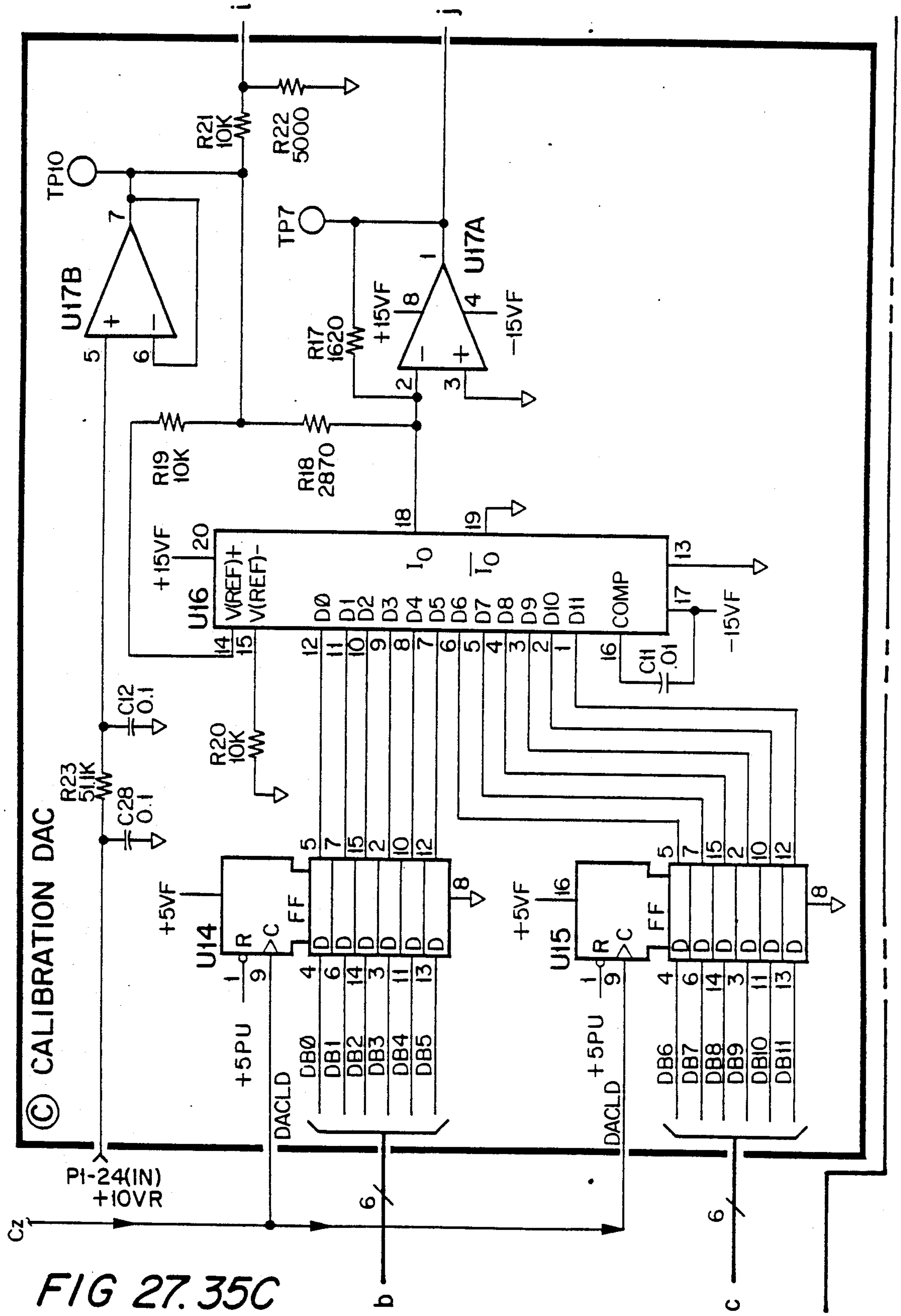
FIG 27.35C

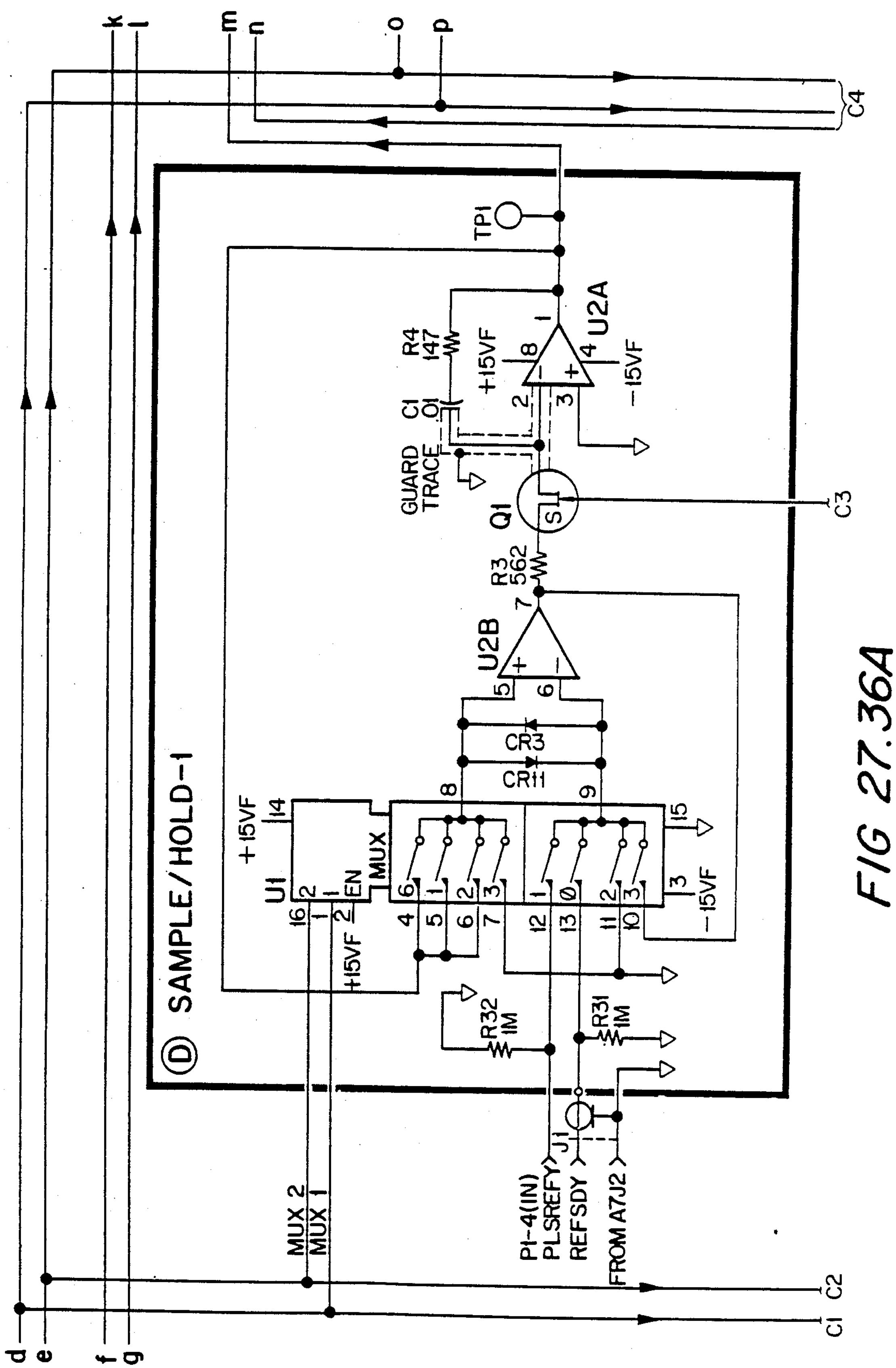
FIG 27.36A

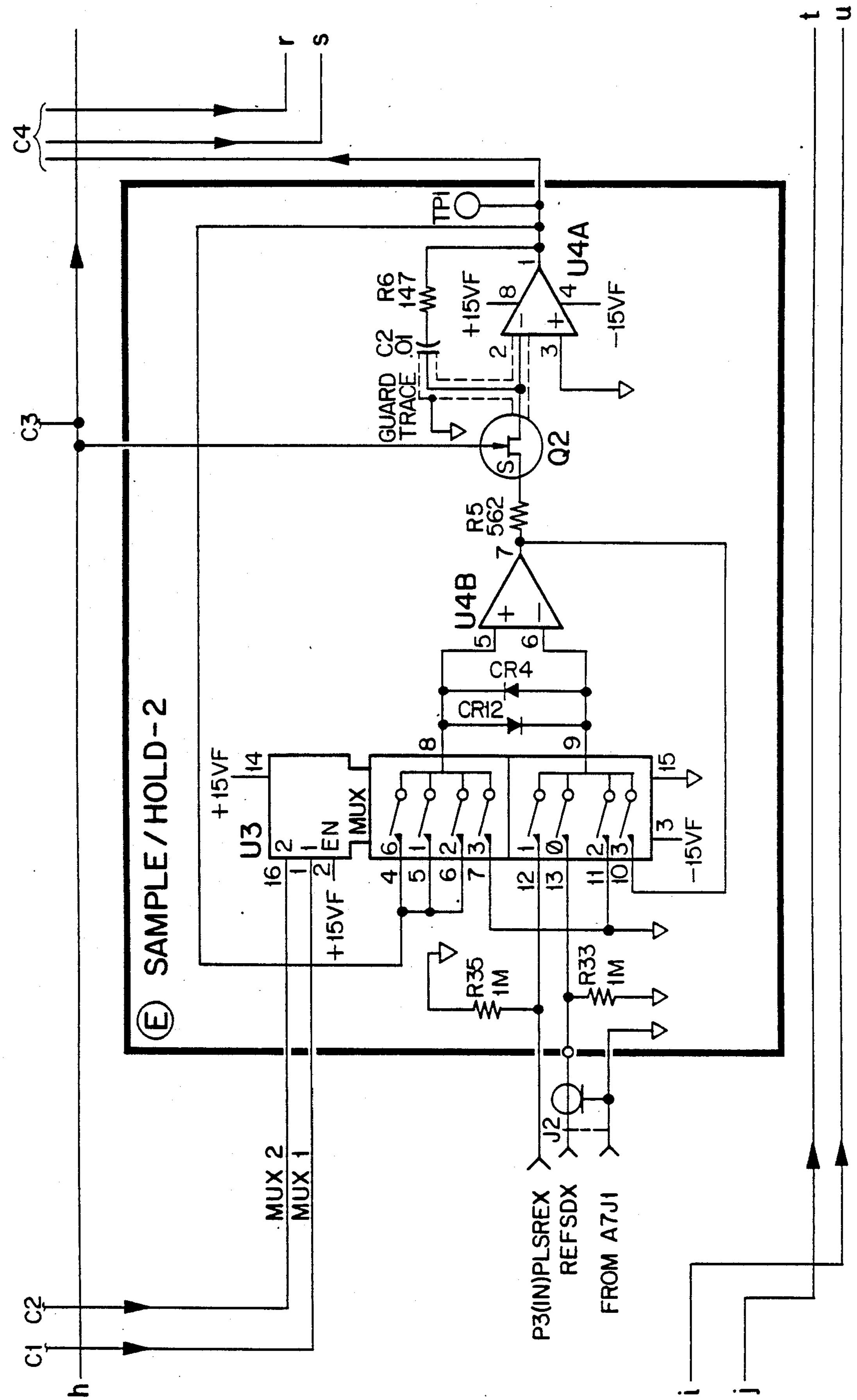
FIG 27.36B

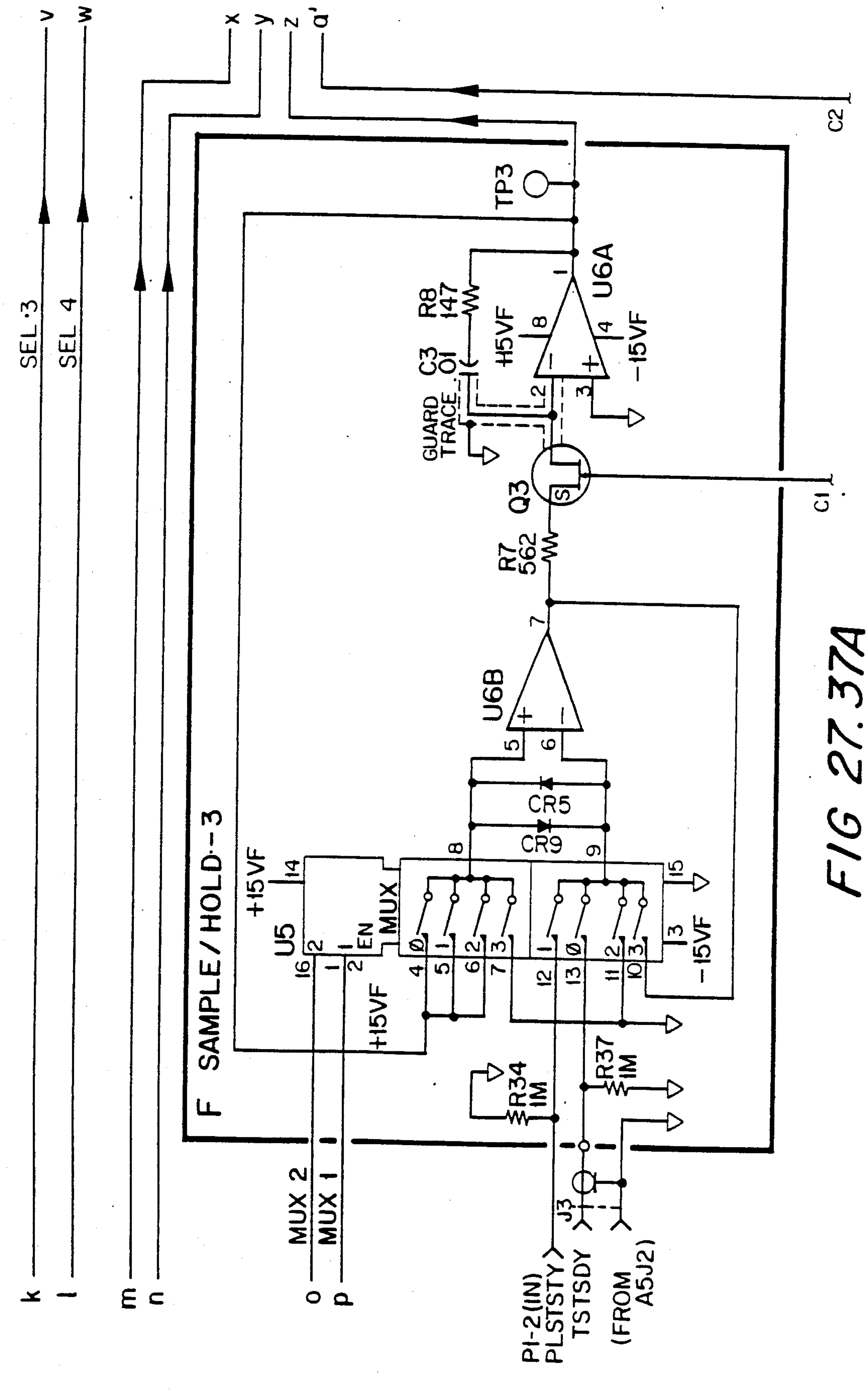
FIG 27.37A

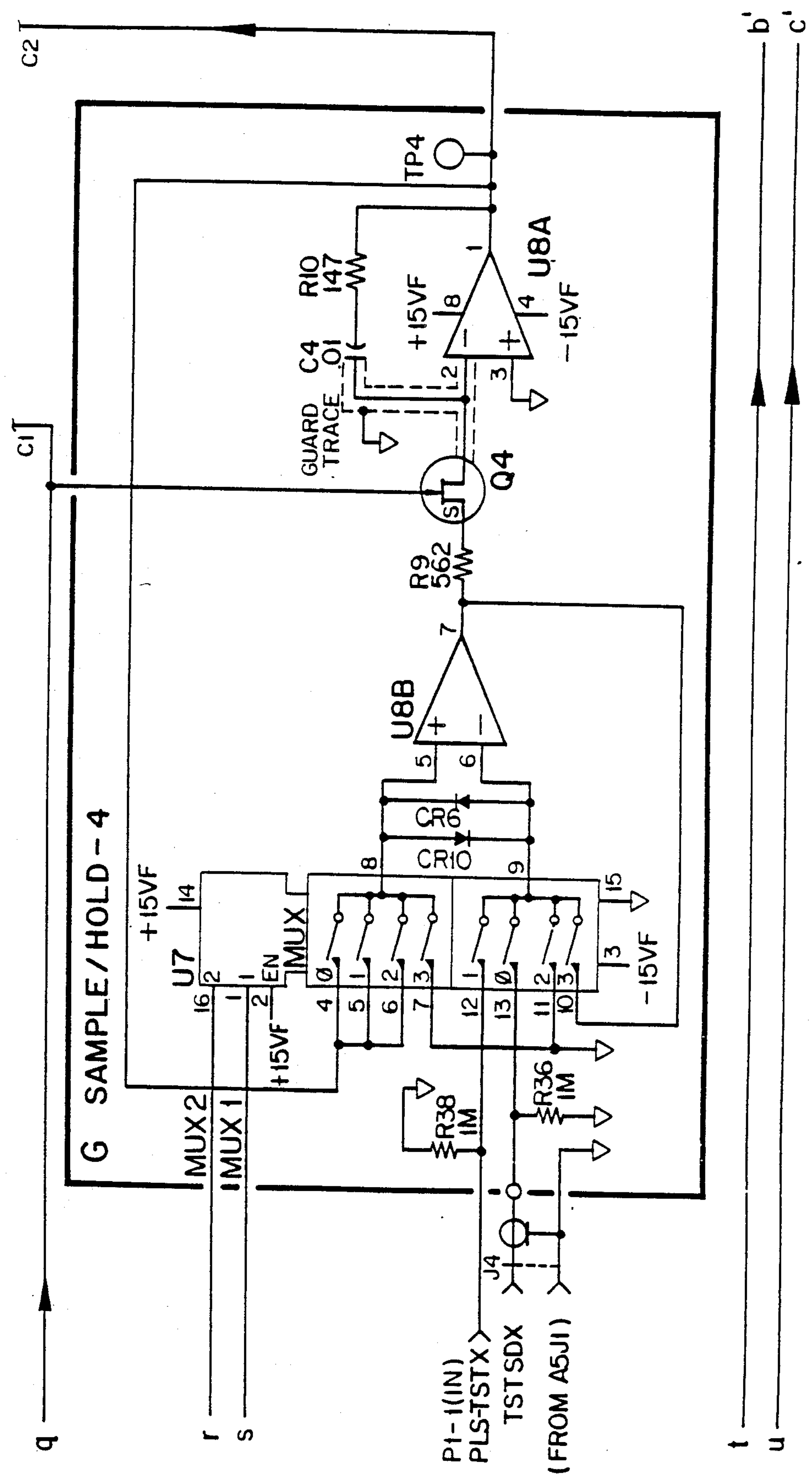
FIG 27.37B

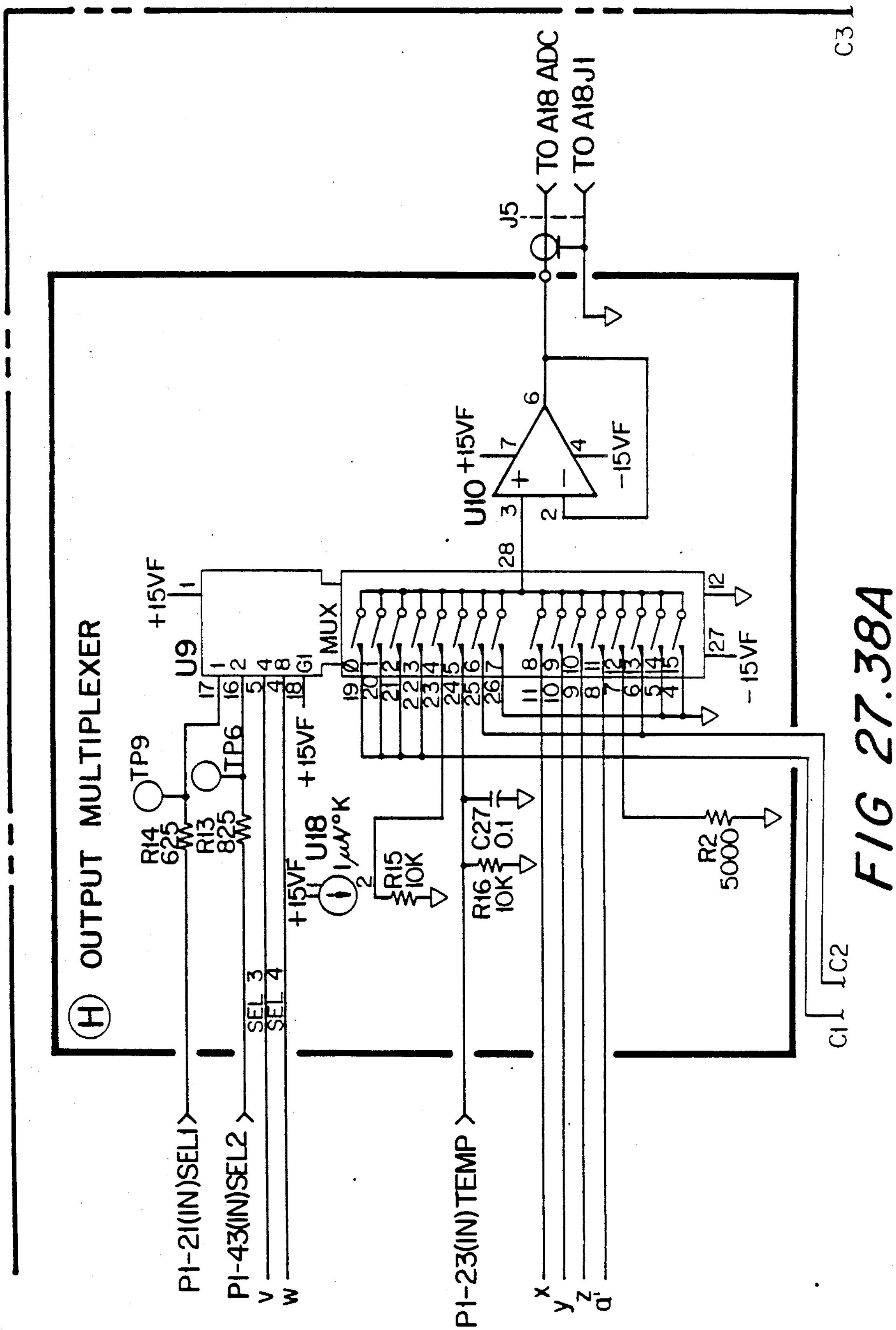
FIG 27.38A

C1 C2 C3

A17 ACTIVE COMPONENTS PARTS LISTS (U's and Q's)

| REFERENCE DESIGNATORS | PART NUMBER | MANUFACTURERS PART NUMBER |
|---|---|---|
| | | |
| Q1, 2, 3, 4 | 1855-0420 | 2N4391 |
| Q6 | 1853-0007 | 2N3251 |
| Q5, Q7 | 1854-0477 | 2N2222A |
| | | |
| | | |
| U1, 3, 5, 7 | 1826-0590 | LF13509 |
| U2, 4, 6, 8, 17 | 1826-0785 | LF353A |
| U9 | 1826-0998 | MUX-16E |
| U10 | 1826-0601 | OP-16F |
| U11 | 1820-1197 | 74LS00 |
| U13, 14, 15 | 1826-1196 | 74LS174 |
| U16 | 1826-0705 | Am6012 |
| U12 | 1820-1216 | 74LS138 |
| U18 | 1826-0661 | AD590K |
| | | |
| | | |
| CR1, 2, 7, 8 | 1901-0734 | 1N4004 |
| CR3, 4, 5, 6 | 1901-1098 | 1N4150 |
| | | |
| | | |
| | | | b'
c'

FIG 27.38B

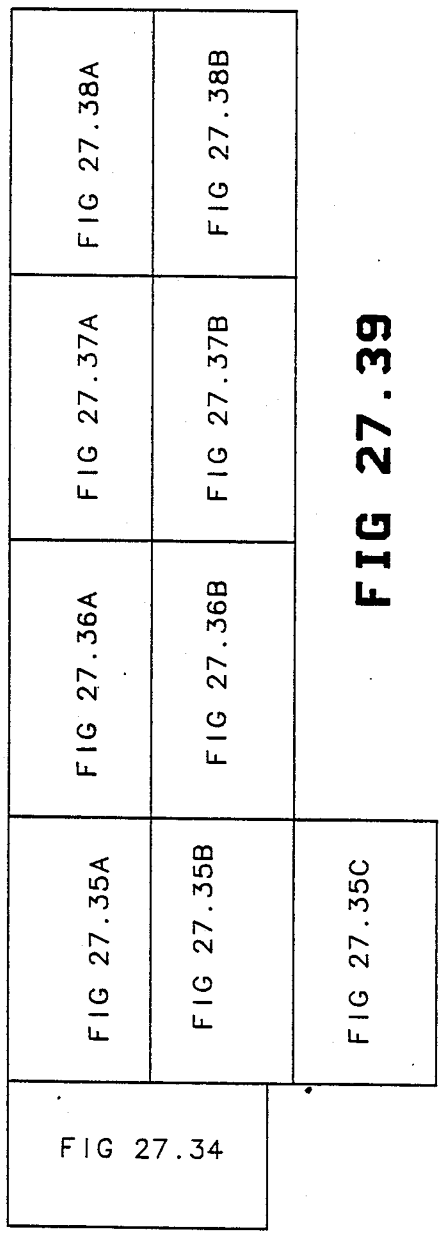
FIG 27.39
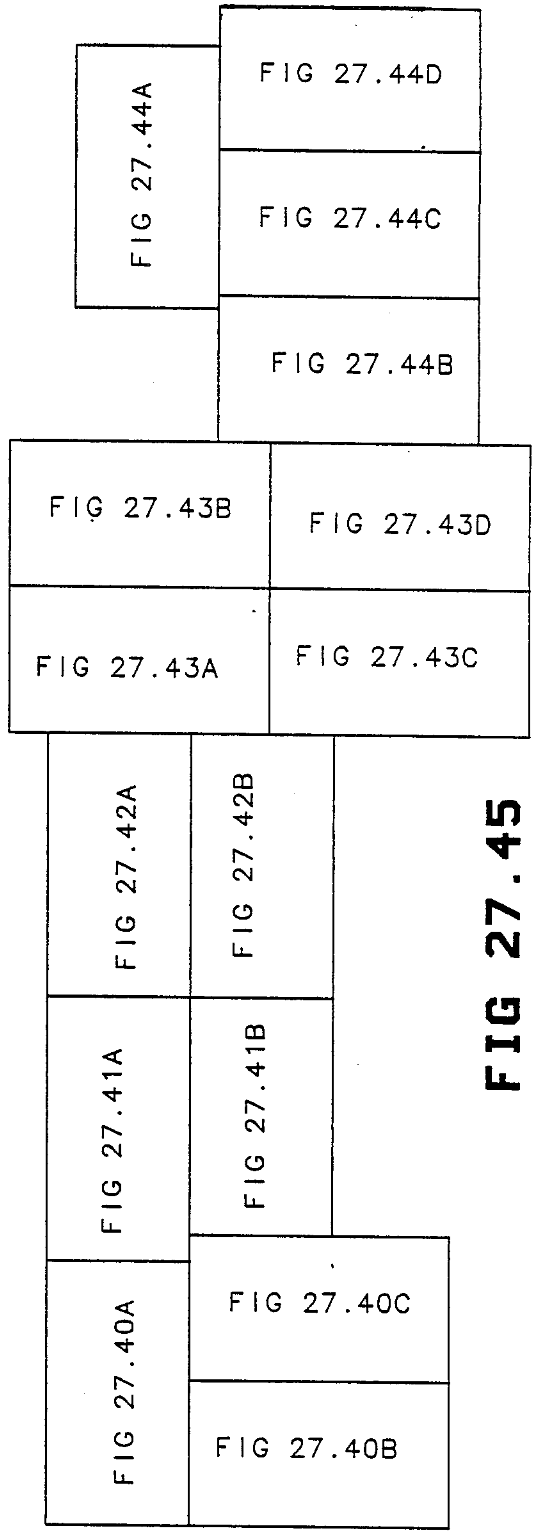
FIG 27.45

| PIN | SIGNAL | TO/FROM | FUNCTION BLOCK |
|---|---|---|---|
| 1<br>23 | | | |
| 2<br>24 | +10VR | A17 | G |
| 3<br>25 | L HOLD<br>H START 2 | A19<br>A19 | NOT USED<br>B E |
| 4<br>26 | L START 1 | A 19 | B |
| 5<br>27 | L LOST<br>LIFSRQ | ADR BUS<br>A24 | A<br>NOT USED |
| 6<br>28 | CLK<br>LRDS | A 6<br>A 24 | B<br>NOT USED |
| 7<br>29 | LADCSRQ<br>AB∅ | A 24<br>ADR BUS | F<br>A F |
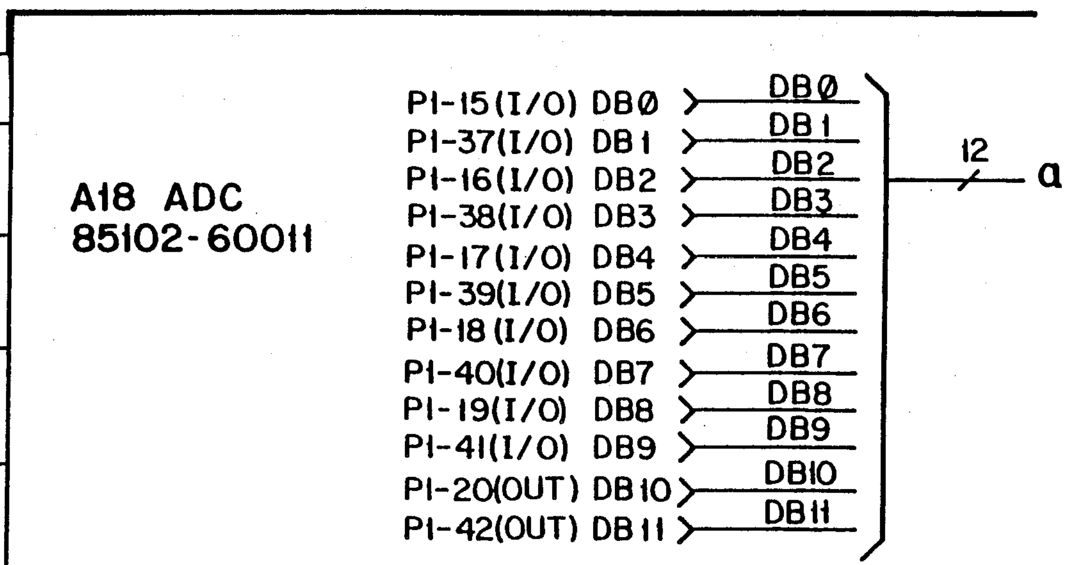
FIG 27.40A

| | | | |
|---|---|---|---|
| 8<br>30 | AB 1<br>AB 2 | ADR BUS<br>" " | A<br>A F ' |
| 9<br>31 | AB 3<br>AB 4 | " "<br>" " | A<br>A |
| 10<br>32 | +15V REG | POWER BUS | G |
| 11<br>33 | GND | | G |
| 12<br>34 | GND | | G |
| 13<br>35 | -15V REG | POWER BUS | G |
| 14<br>36 | +5V REG | " | G |
| 15<br>37 | DB Ø<br>DB 1 | DATA BUS | F<br>F |
| 16<br>38 | DB 2<br>DB 3 | " | B F<br>B F |
| 17<br>39 | DB 4<br>DB 5 | " | B F<br>B F |
| 18<br>40 | DB 6<br>DB 7 | " | B F<br>B F |
| 19<br>41 | DB 8<br>DB 9 | " | F B<br>F B |
| 20<br>42 | DB 10<br>DB 11 | " | F<br>F |
| 21<br>43 | SEL 1<br>SEL 2 | A19<br>A19 | F<br>F |
| 22<br>44 | | | |

FIG 27.40B

FIG 27.41A
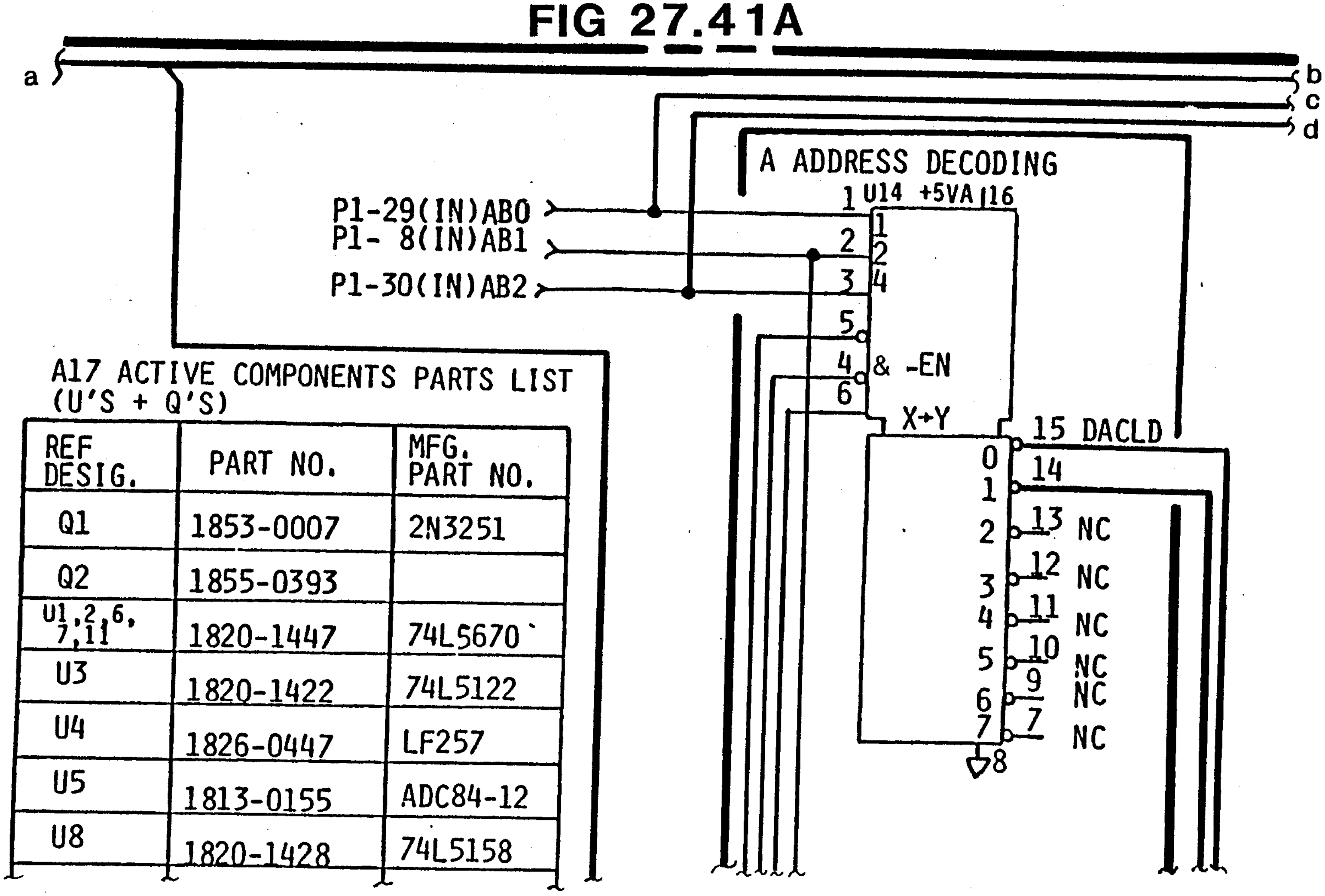
A17 ACTIVE COMPONENTS PARTS LIST (U'S + Q'S)
| REF DESIG. | PART NO. | MFG. PART NO. |
|---|---|---|
| Q1 | 1853-0007 | 2N3251 |
| Q2 | 1855-0393 | |
| U1,2,6,7,11 | 1820-1447 | 74L5670 |
| U3 | 1820-1422 | 74L5122 |
| U4 | 1826-0447 | LF257 |
| U5 | 1813-0155 | ADC84-12 |
| U8 | 1820-1428 | 74L5158 |

| | | |
|---|---|---|
| U9 | 1826-0116 | CMP-01 |
| U12 | 1820-2990 | 25L02 |
| U13 | 1820-1975 | 74L5165 |
| U14,16 | 1820-1216 | 74L5138 |
| U17 | 1820-1197 | 74L500 |
| U18 | 1826-0785 | LF353A |
| U19 | 1826-0742 | AD581d |
| U20 | 1820-1112 | 74L574 |
| U15 | 1826-1091 | DAC-08H |
| | | |
| CR1,CR2 | 1901-0539 | |
| CR3 | 1901-1098 | 1N4150 |
| U10 | 1826-0516 | 17F |
| U21 | 1820-2024 | 74L5244 |
| | | |
| | | |
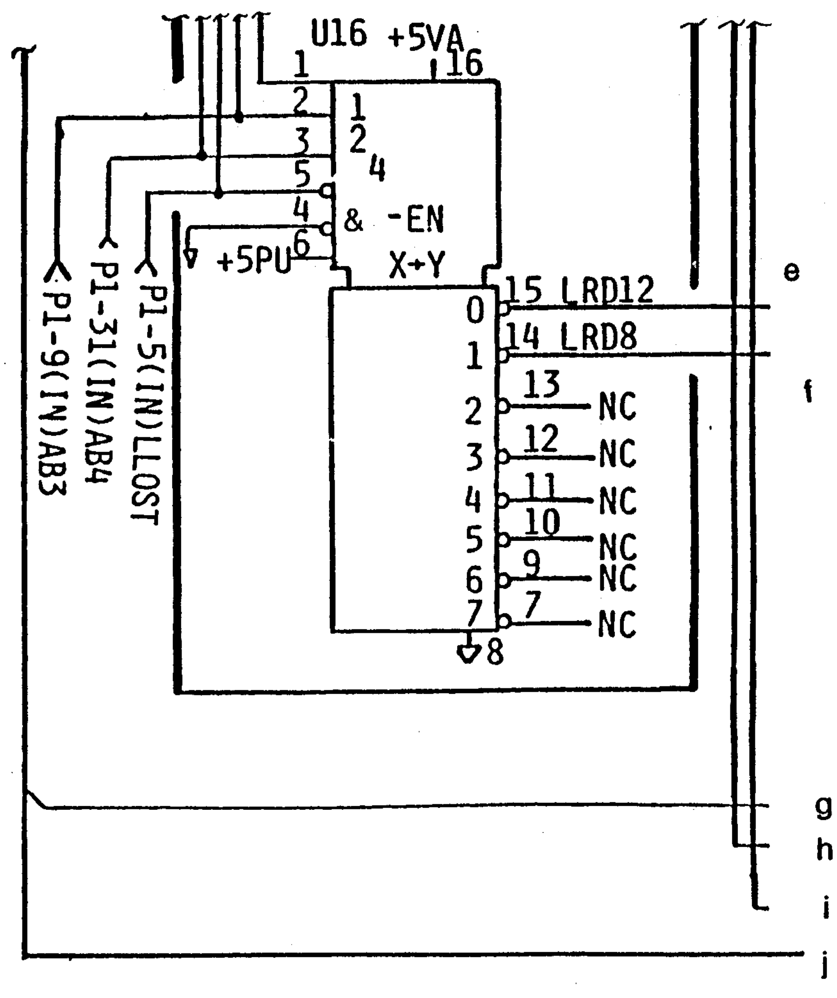
FIG 27.41B

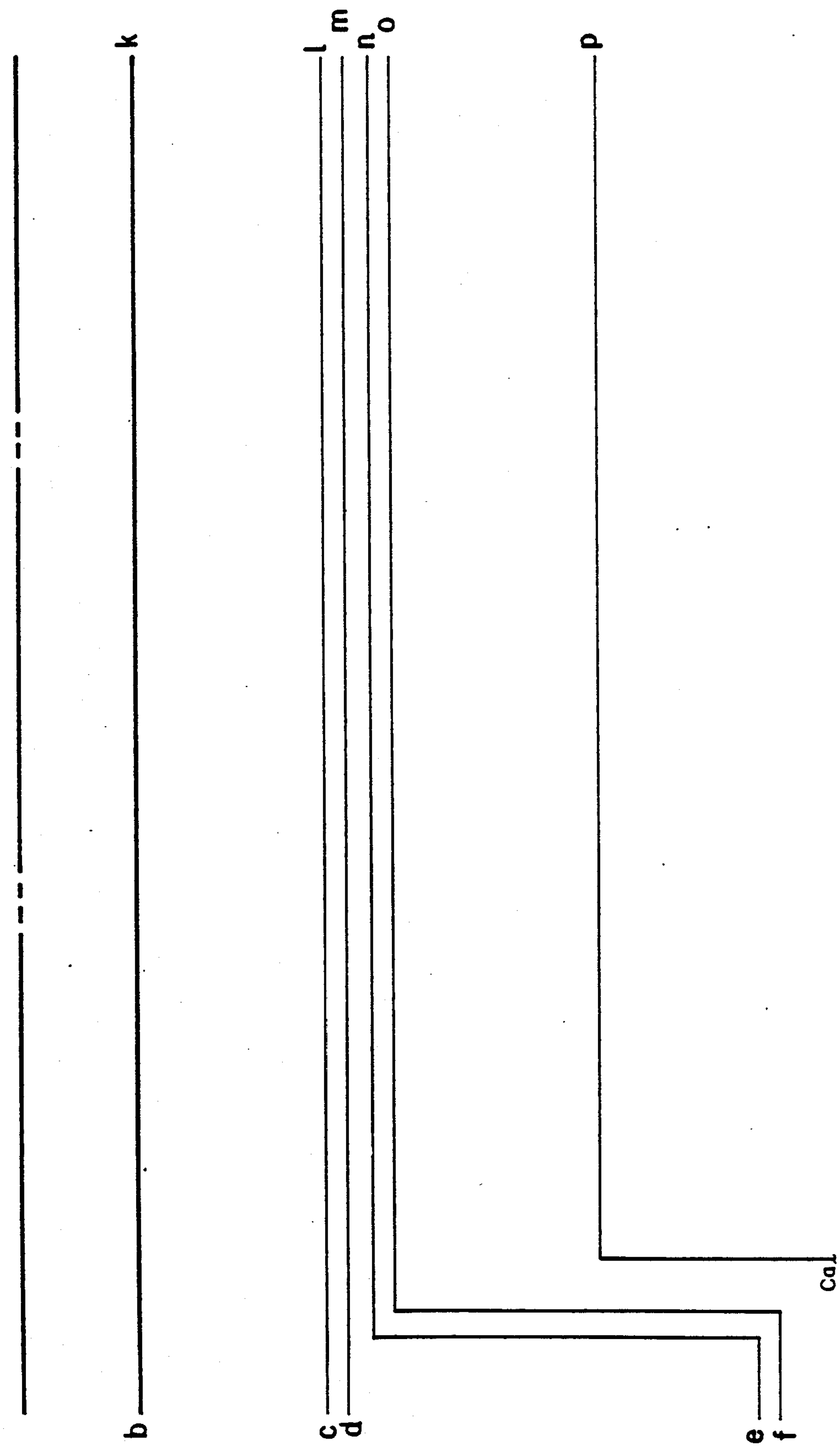
FIG 27.42A

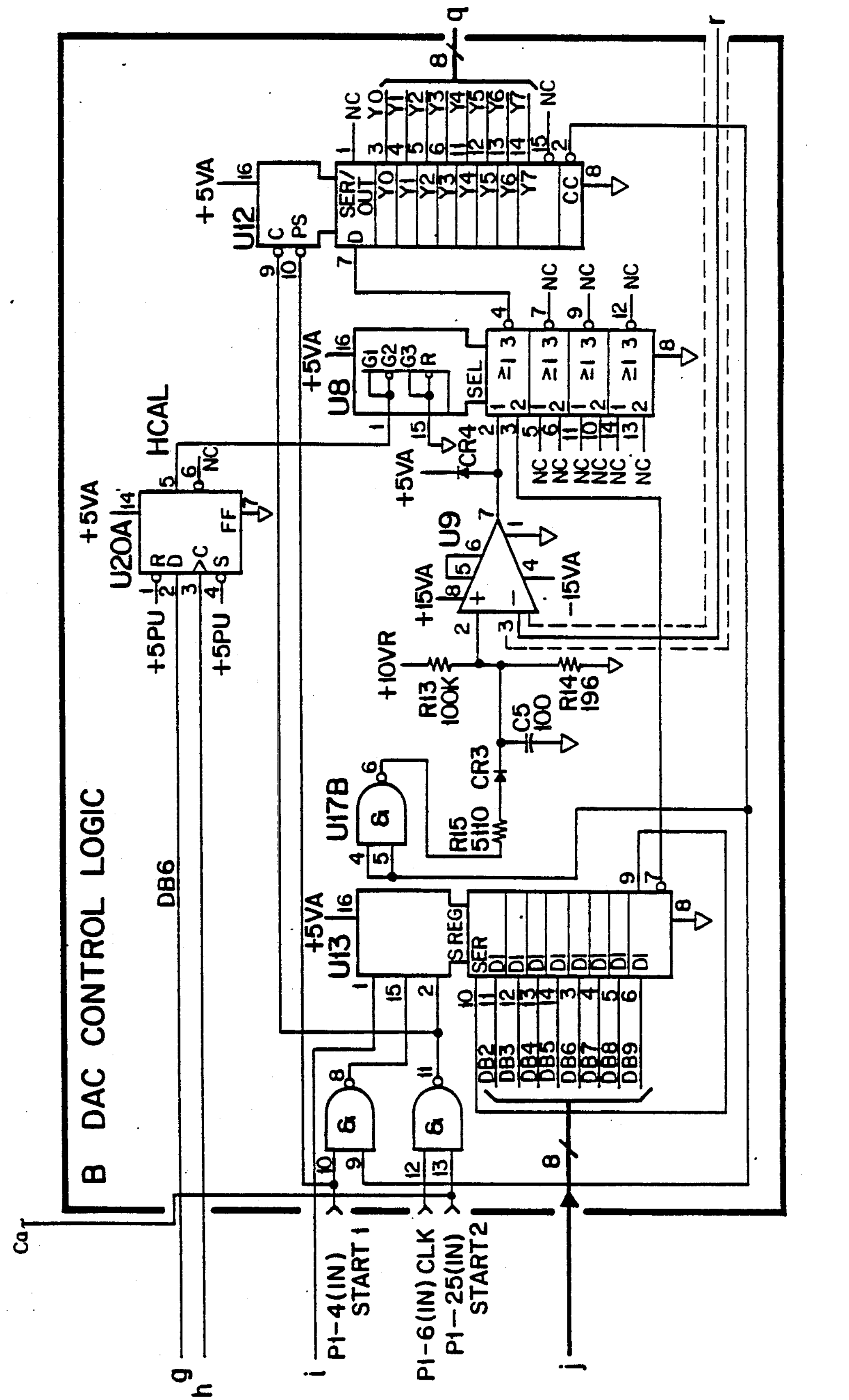
FIG 27.42B

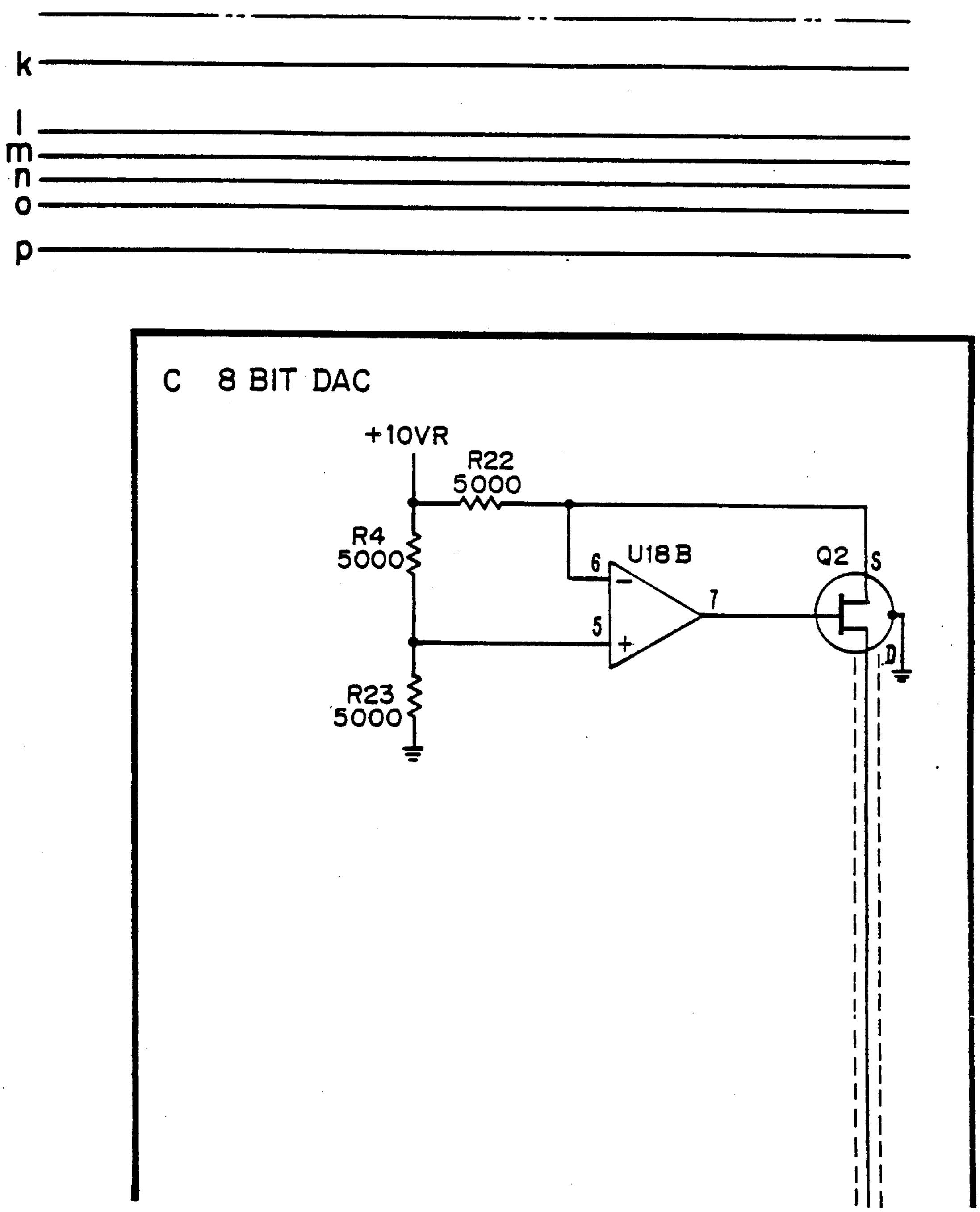
FIG 27.43A

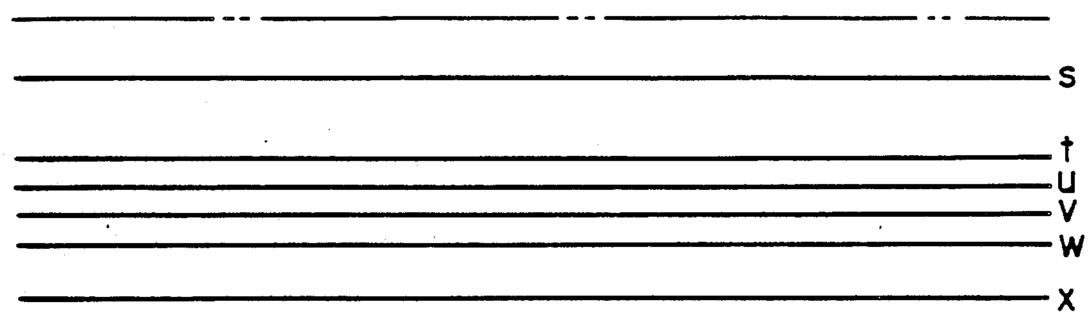
FIG. 27.43B

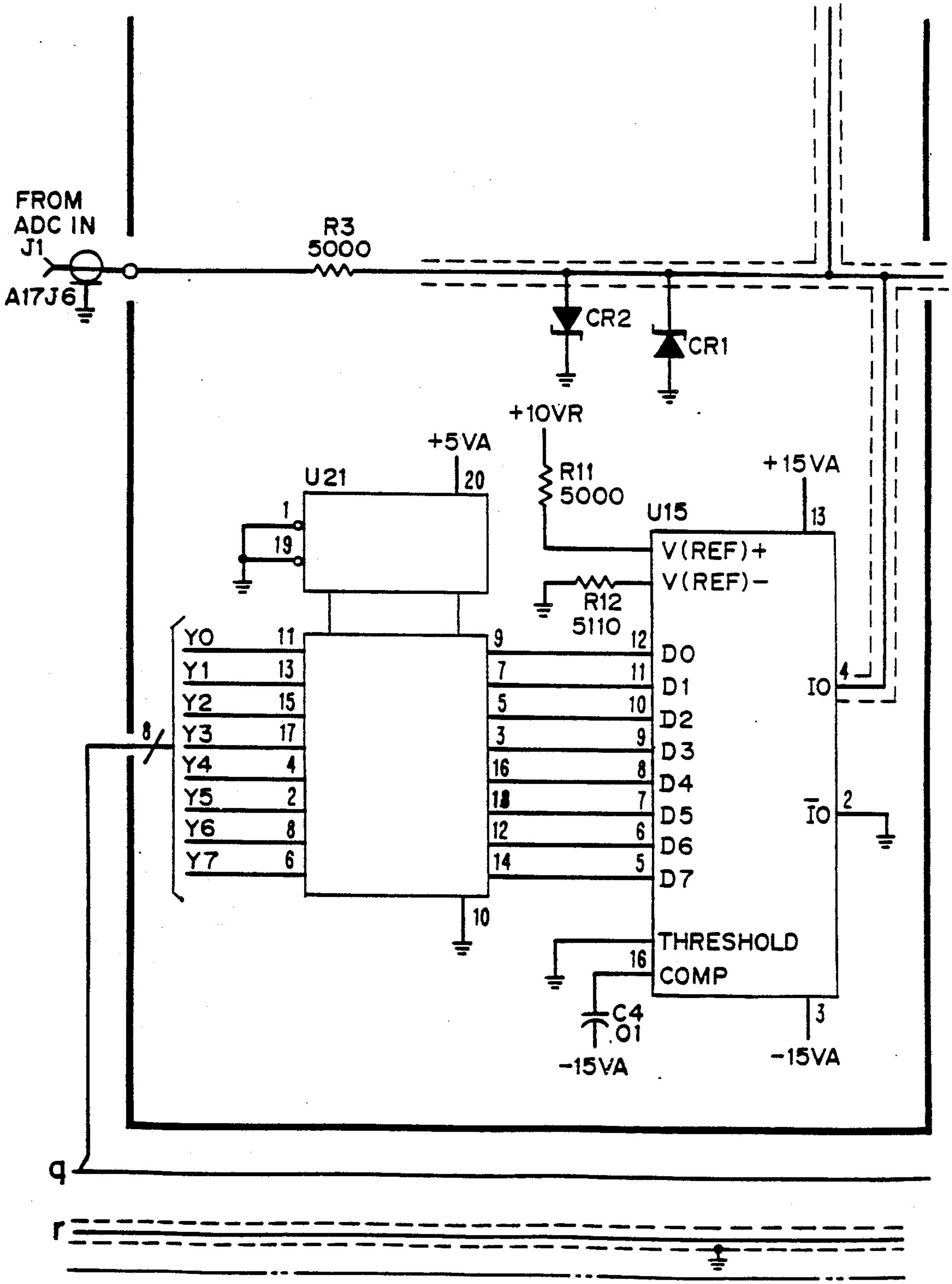
FIG 27.43C

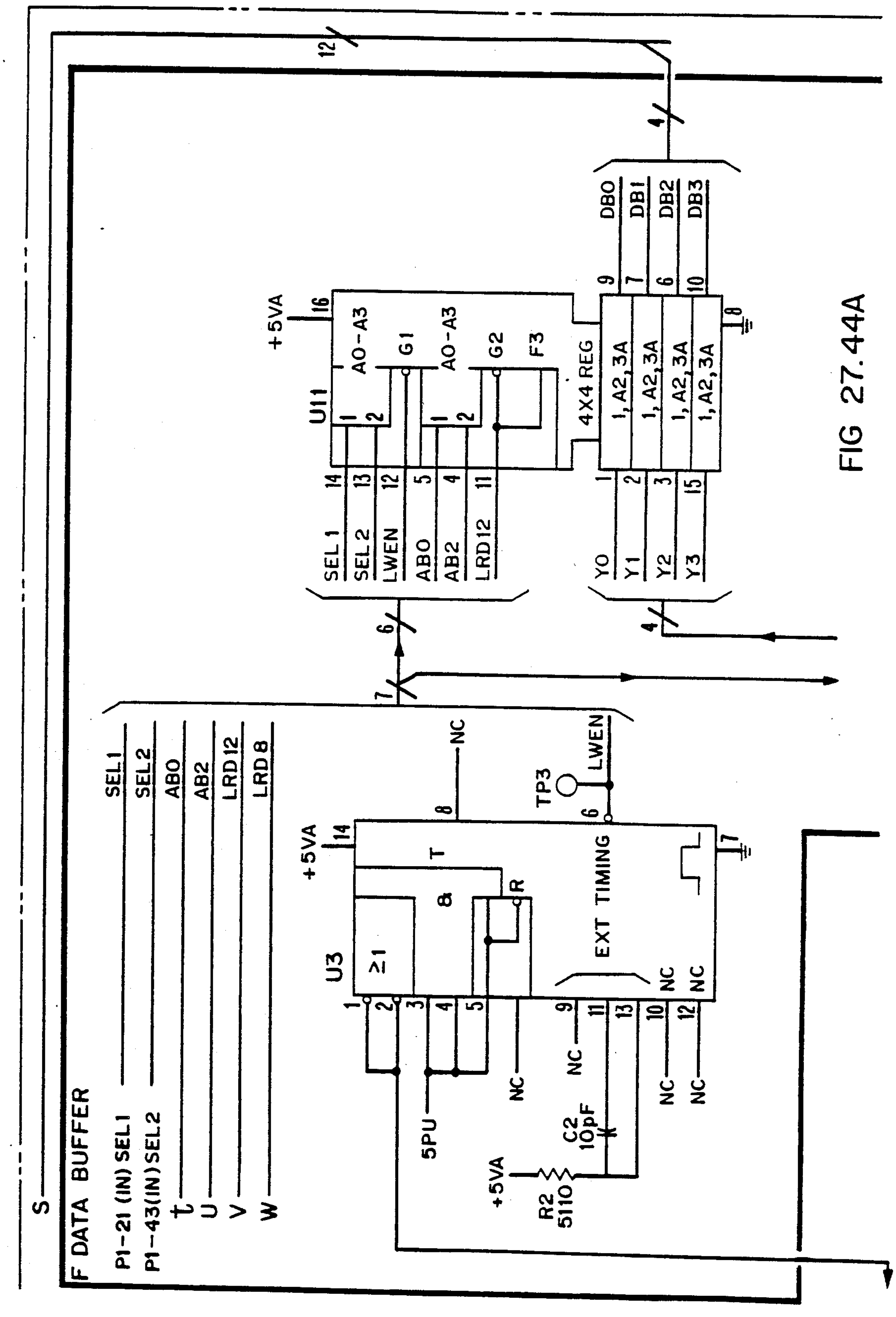
FIG 27.44A

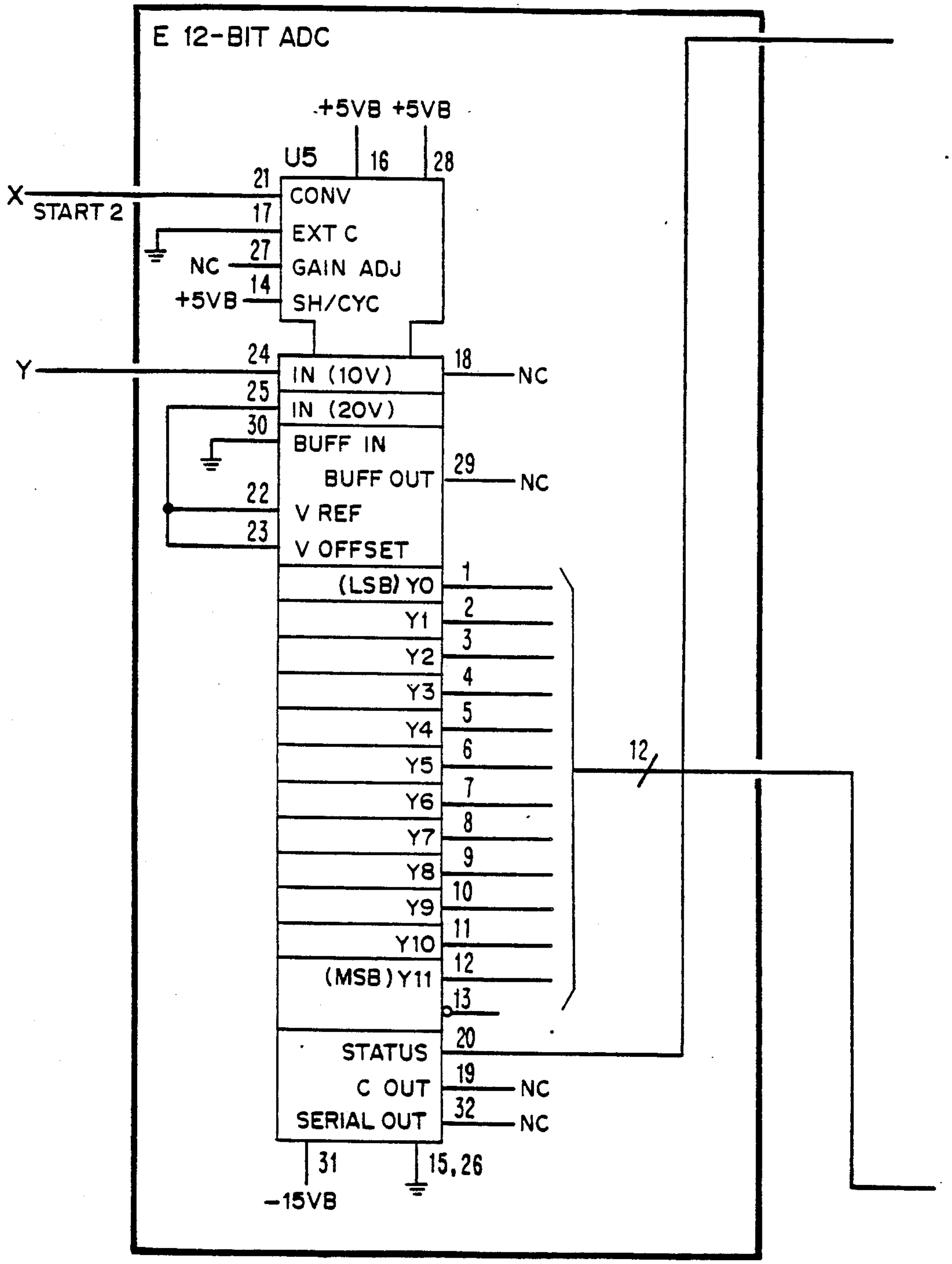
FIG 27.44B

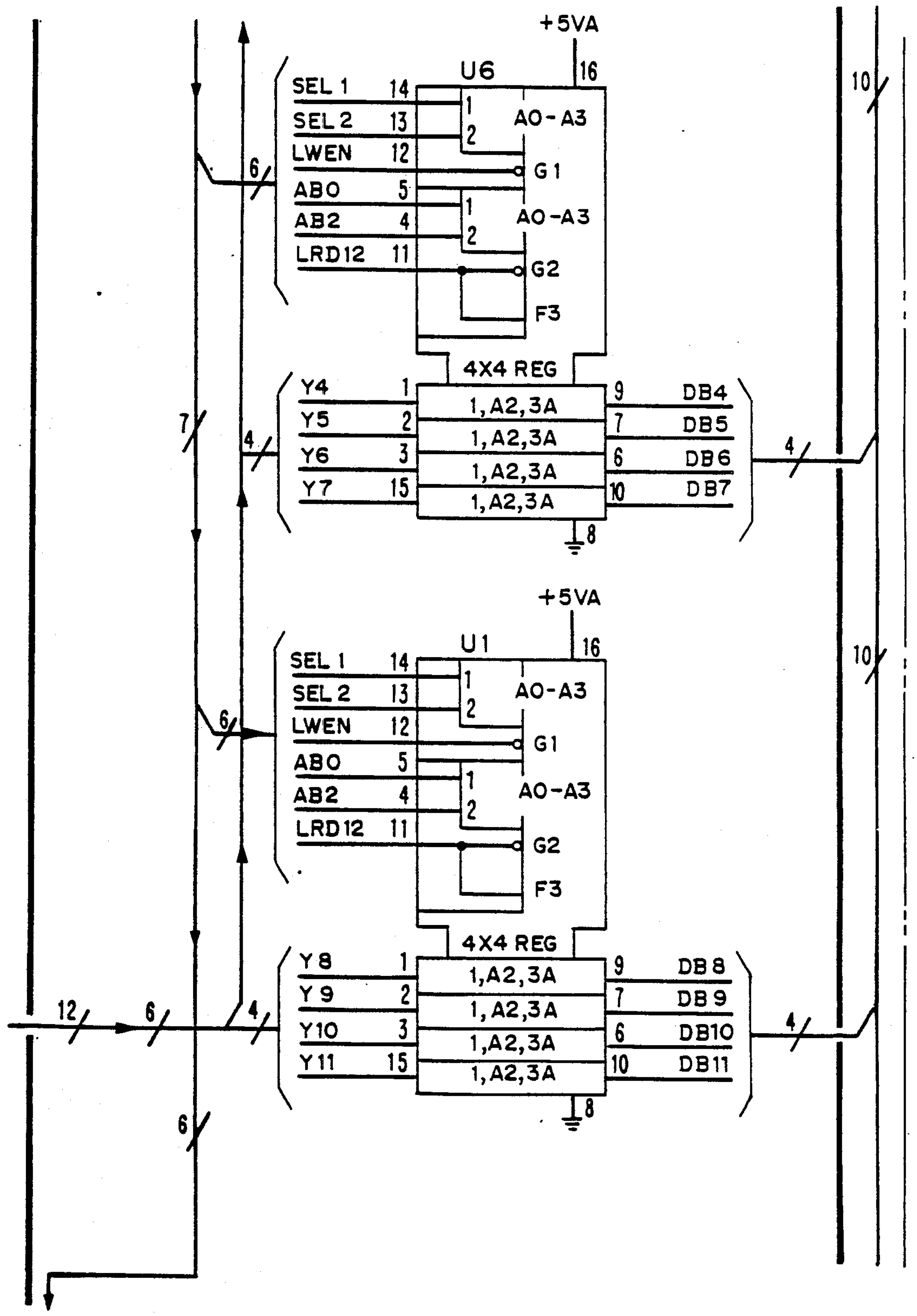
FIG 27.44C

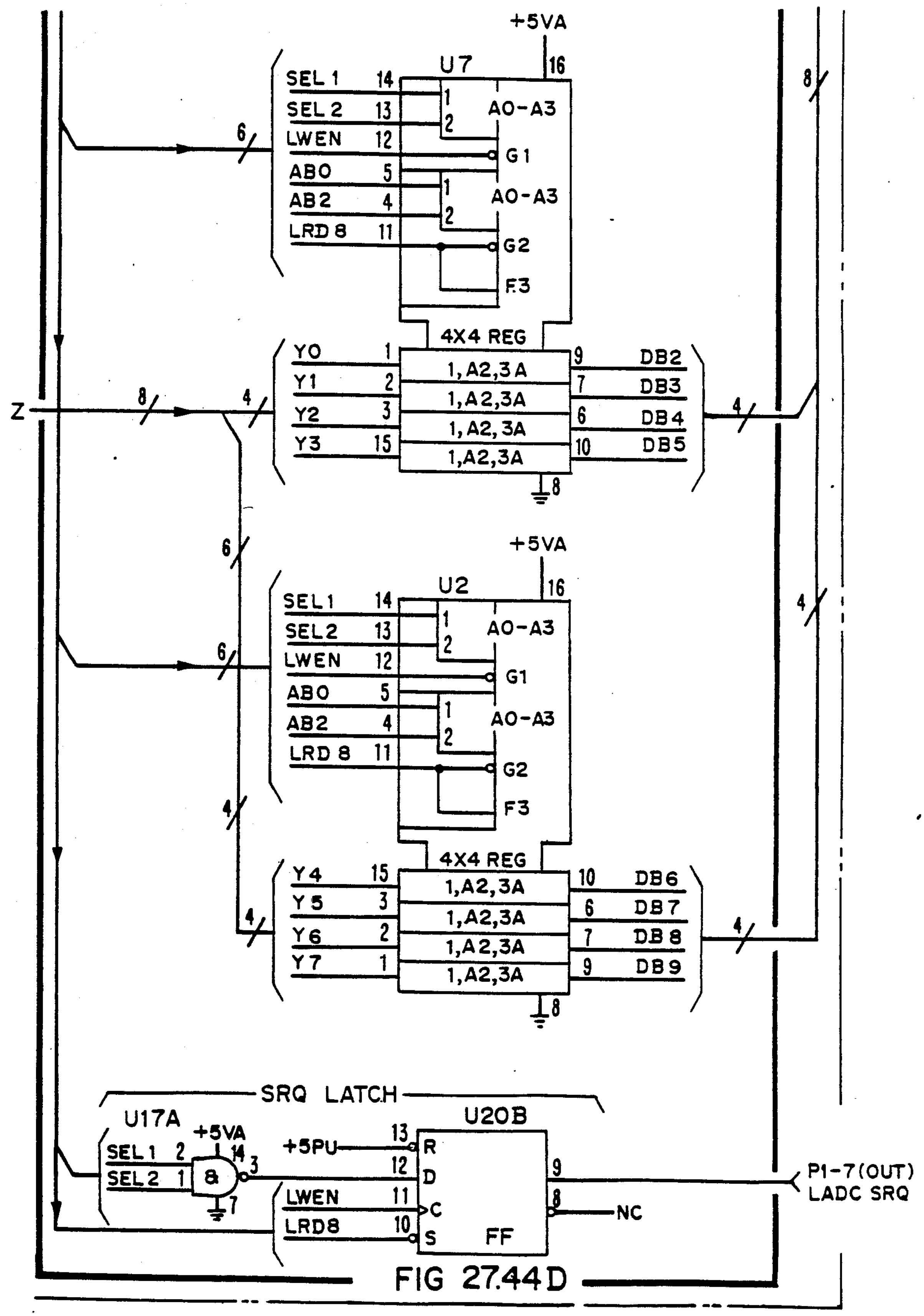
FIG 27.44D

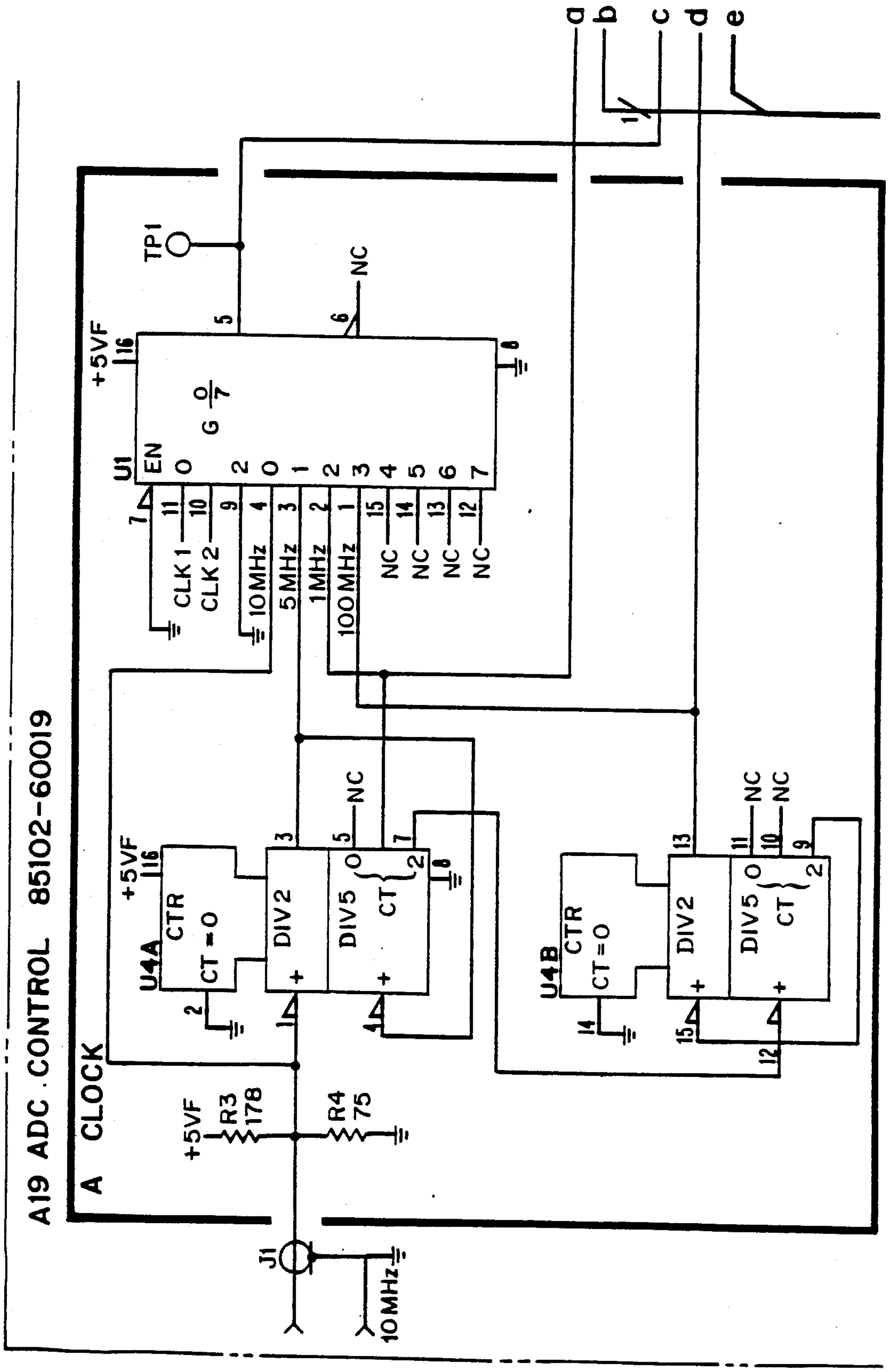
FIG 27.46A

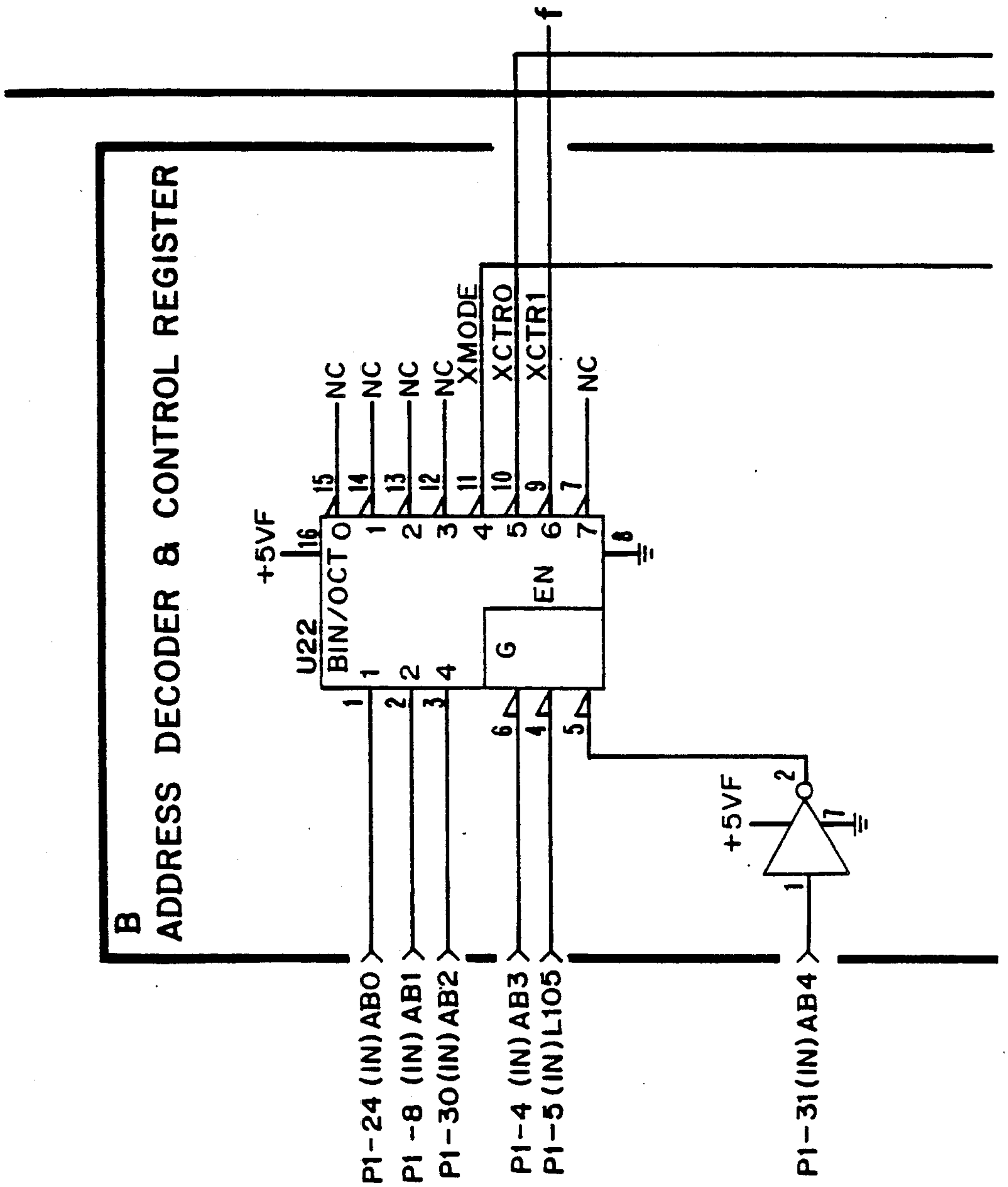
FIG 27.46B

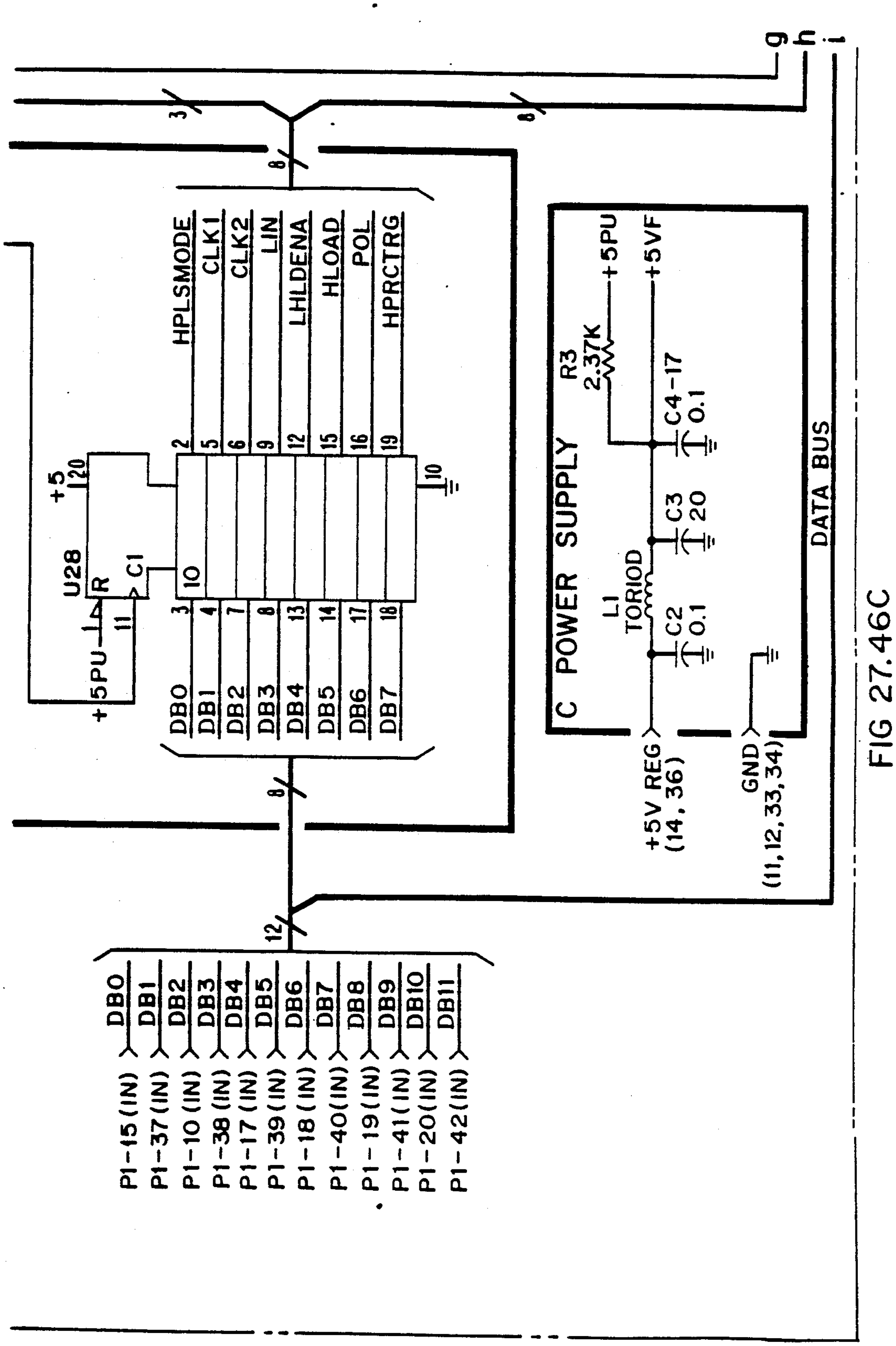
FIG 27.46C

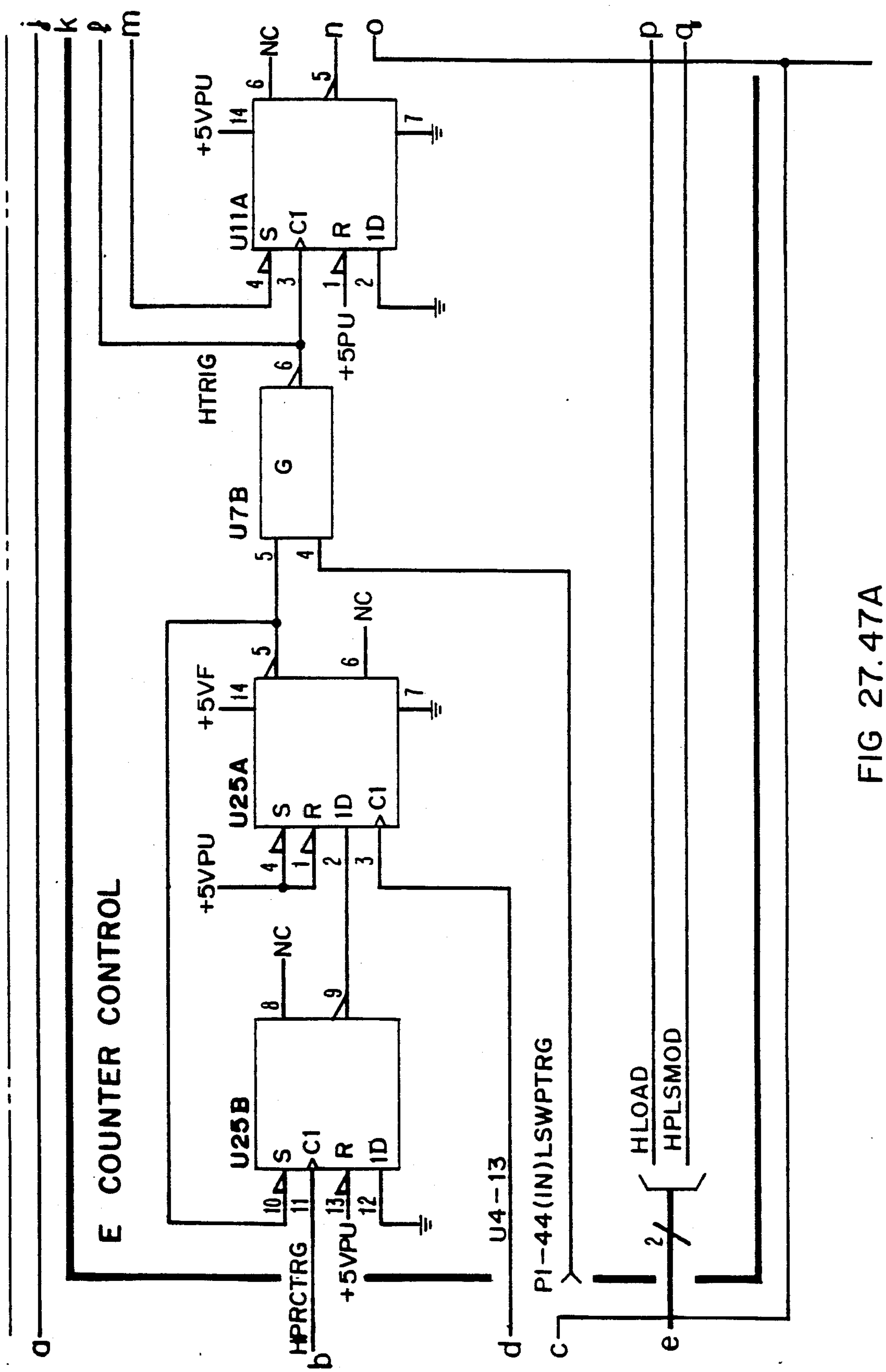
FIG 27.47A

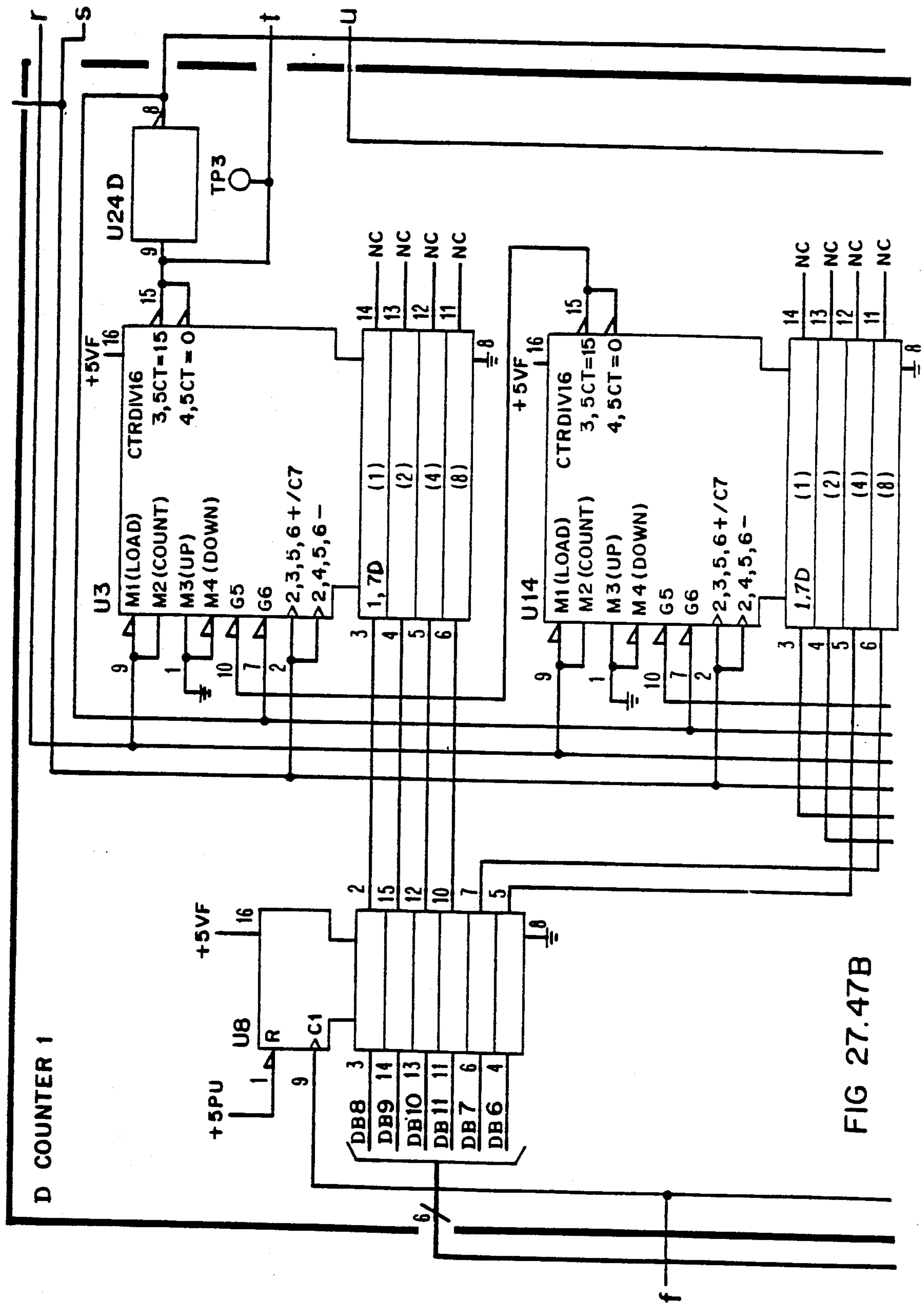
FIG 27.47B

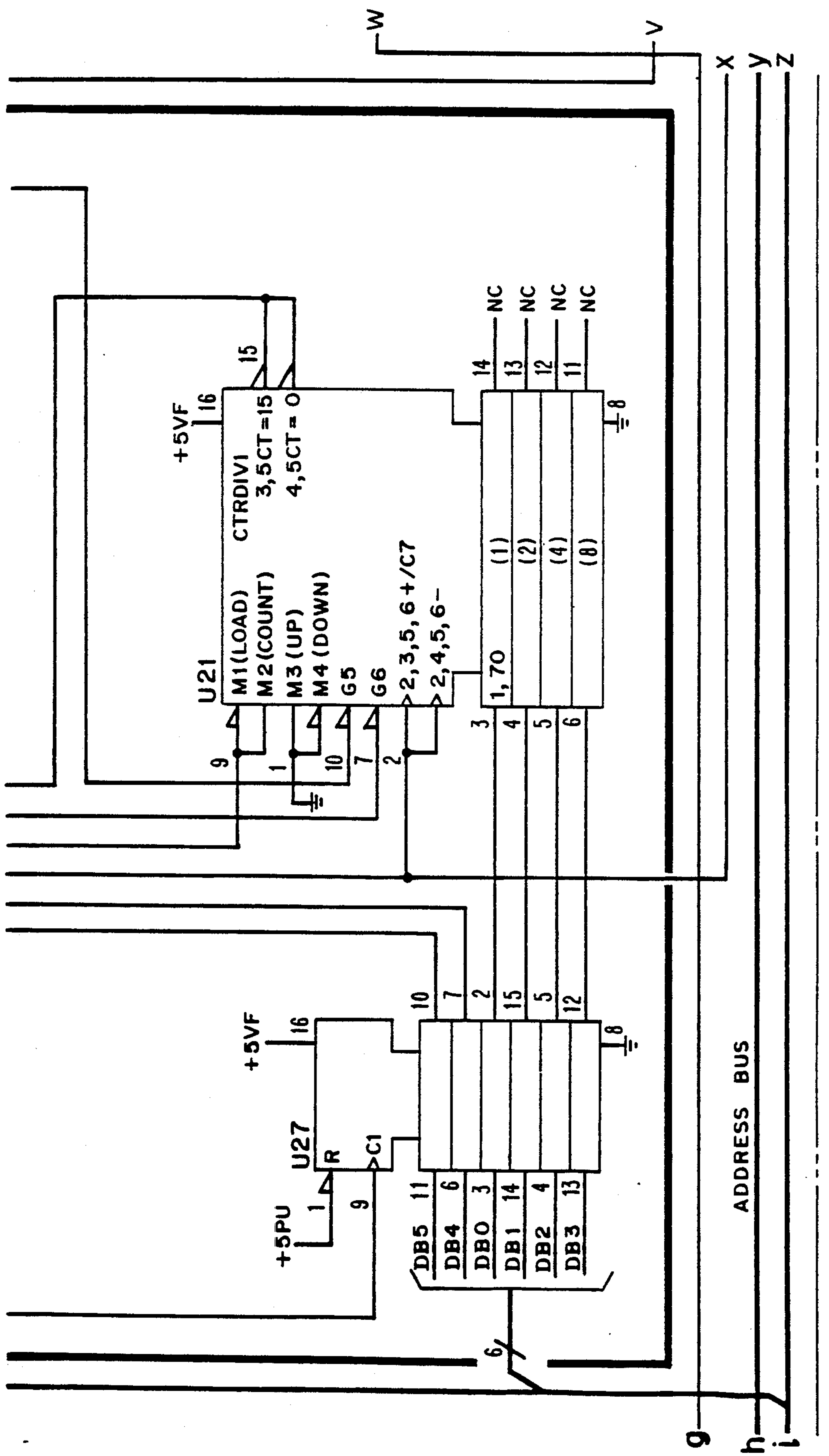
FIG 27.47C

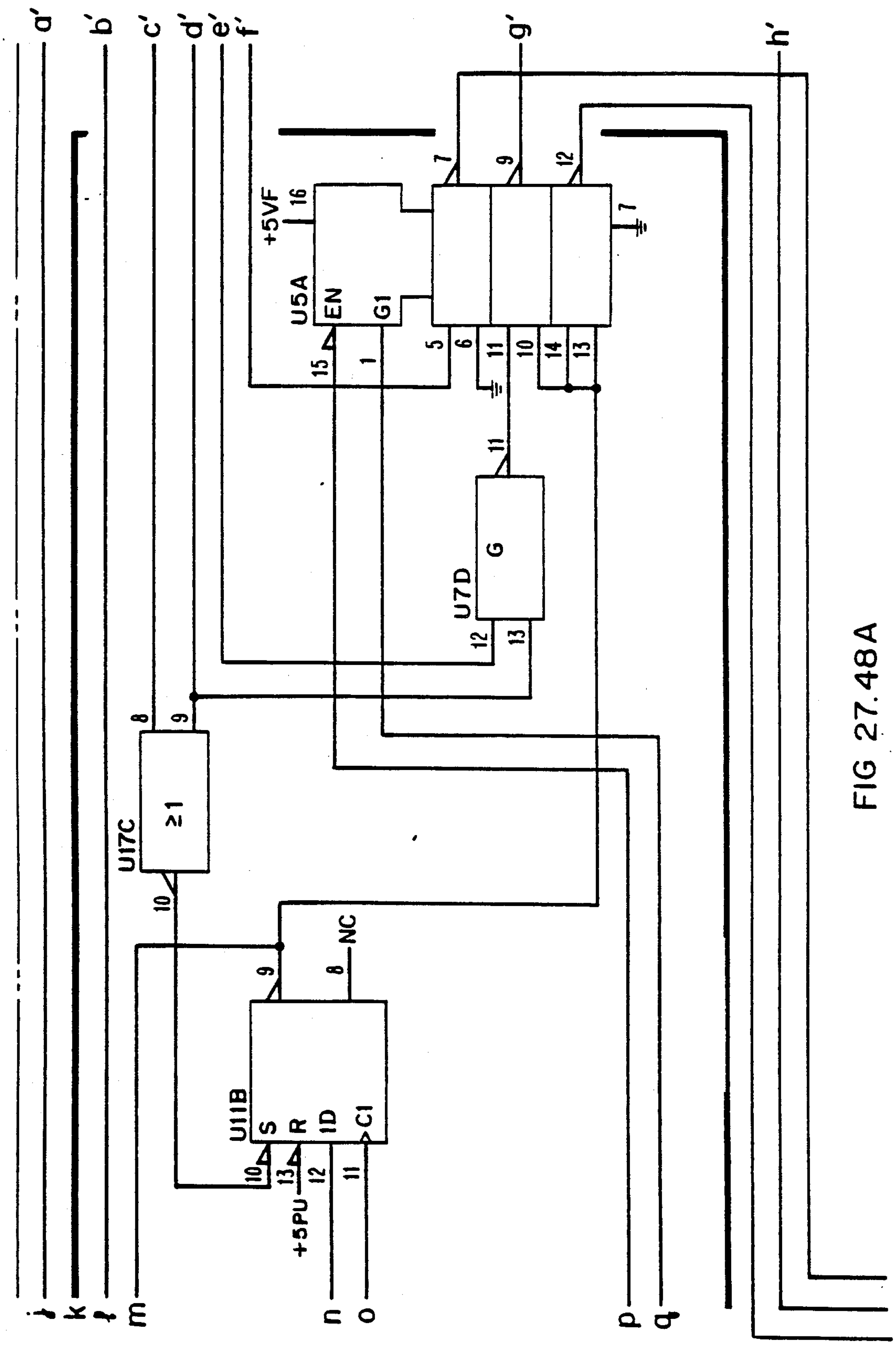
FIG 27.48A

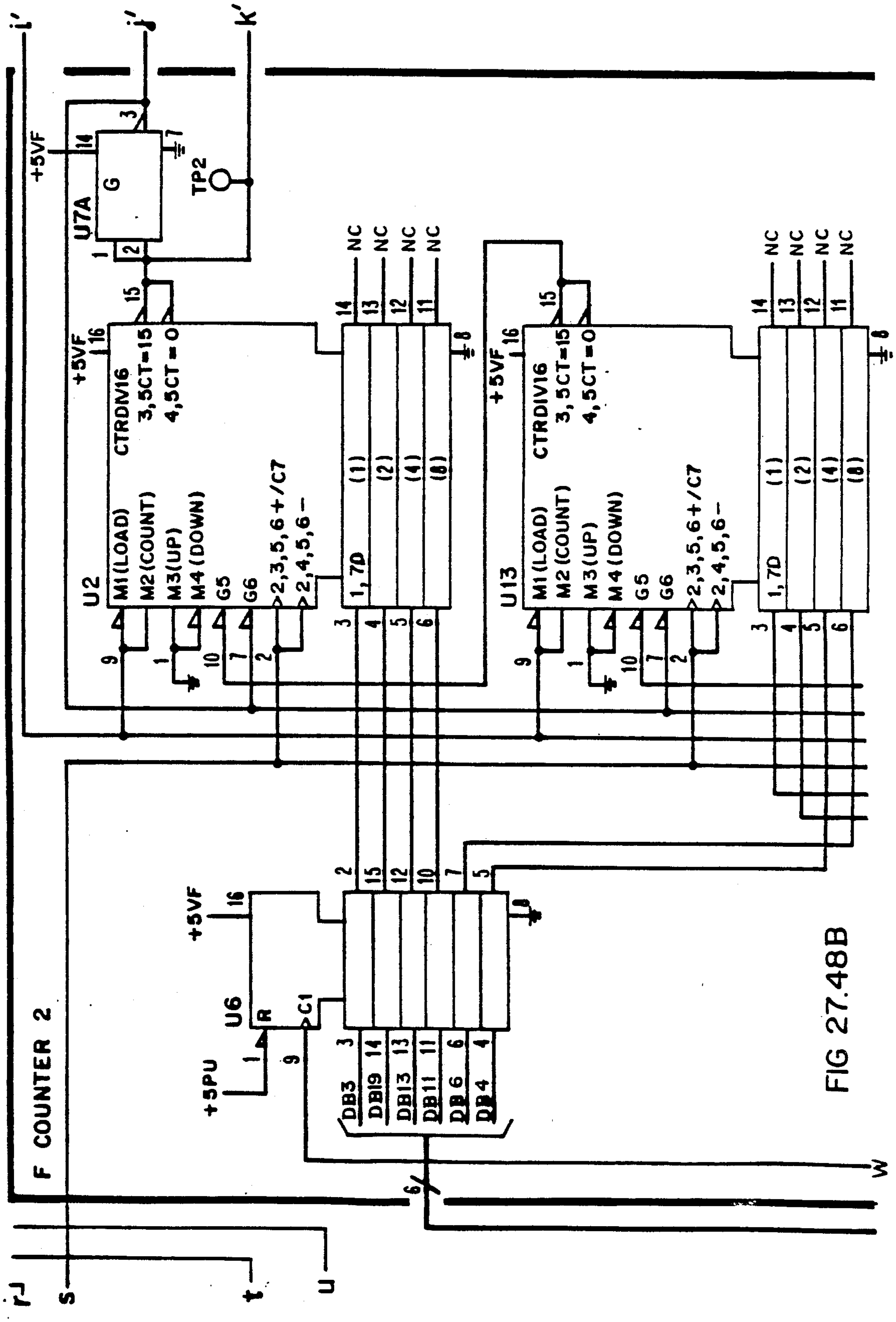
FIG 27.48B

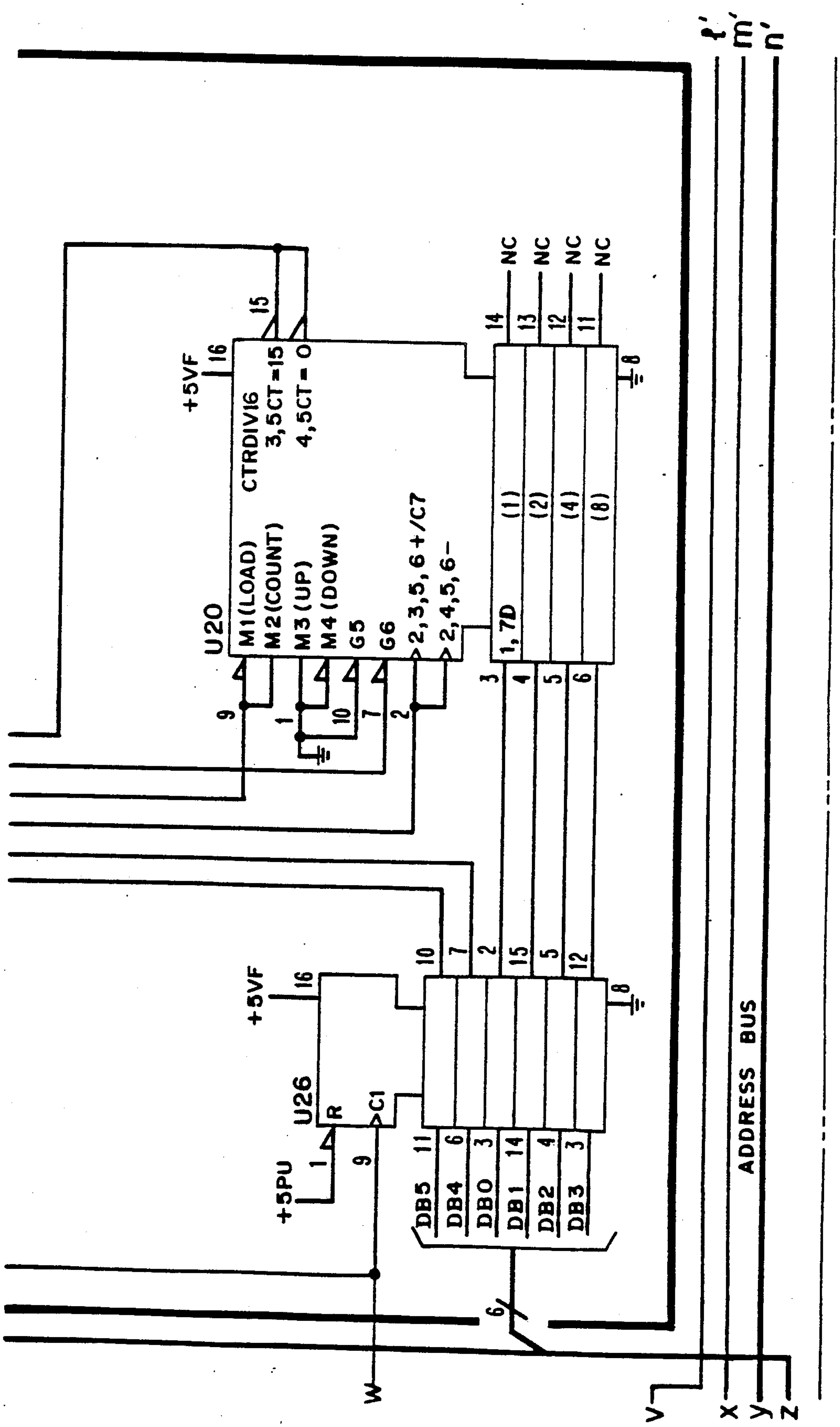
FIG 27.48C

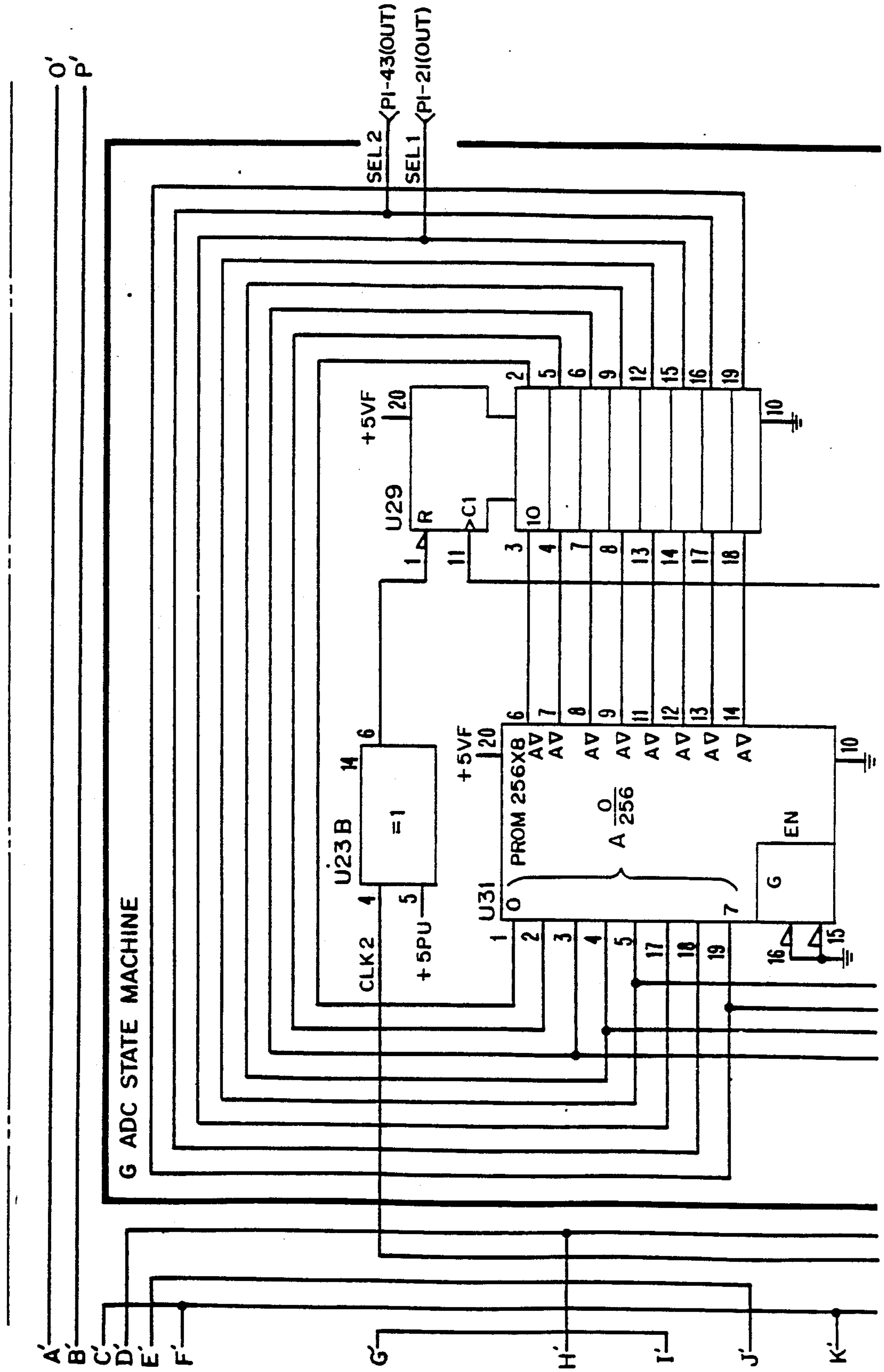
FIG 27.49A

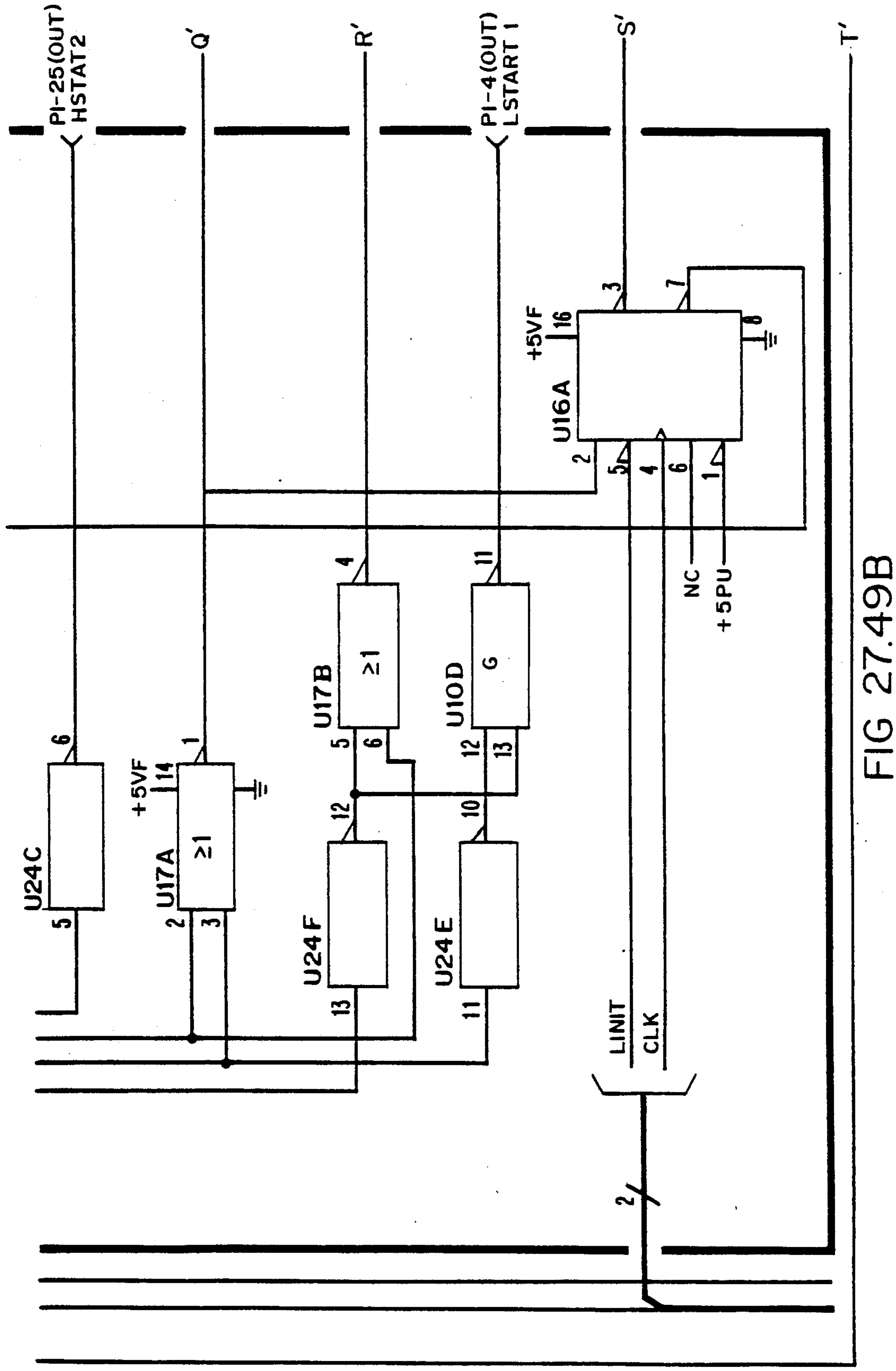
FIG 27.49B

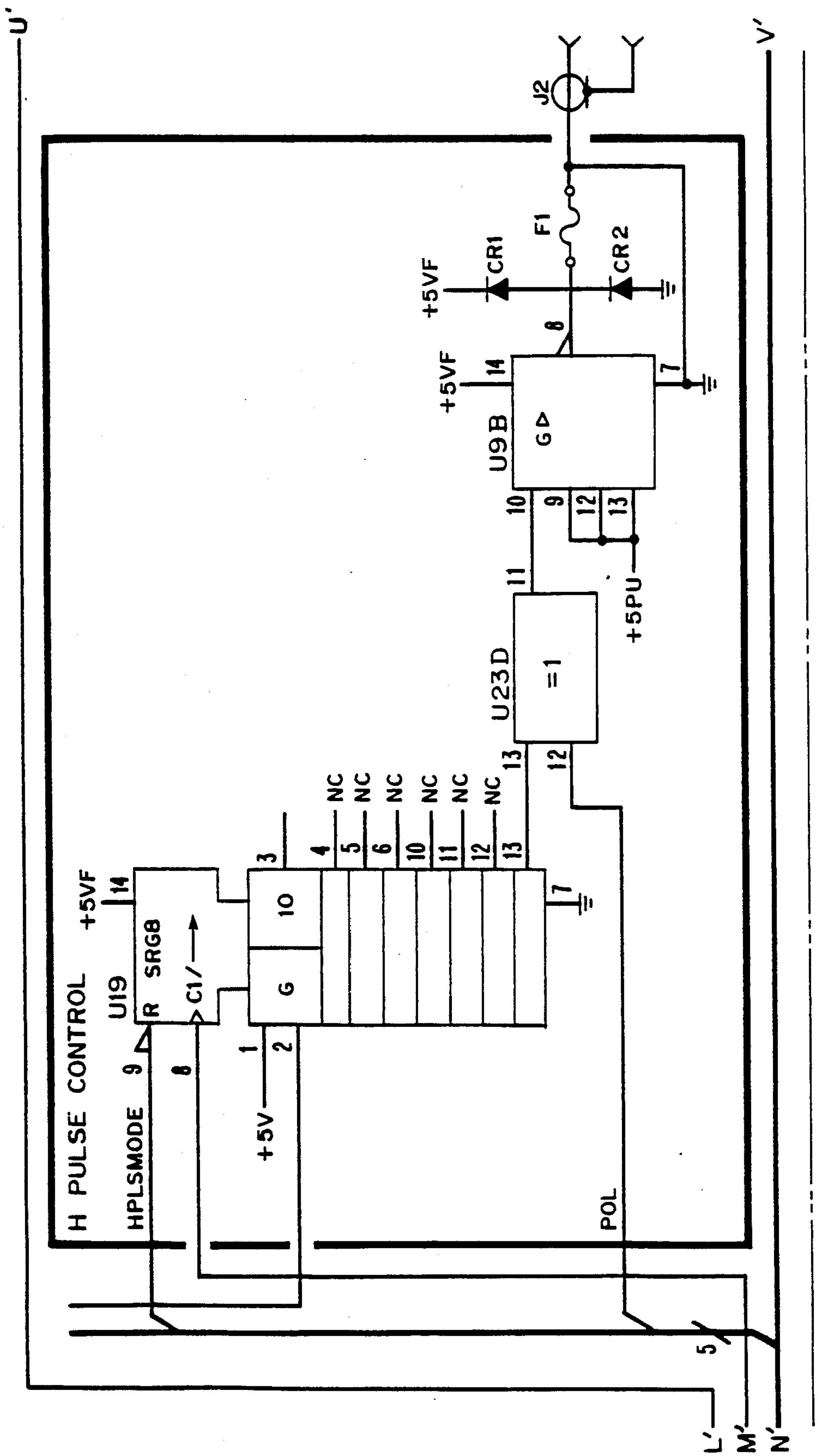
FIG 27.49C

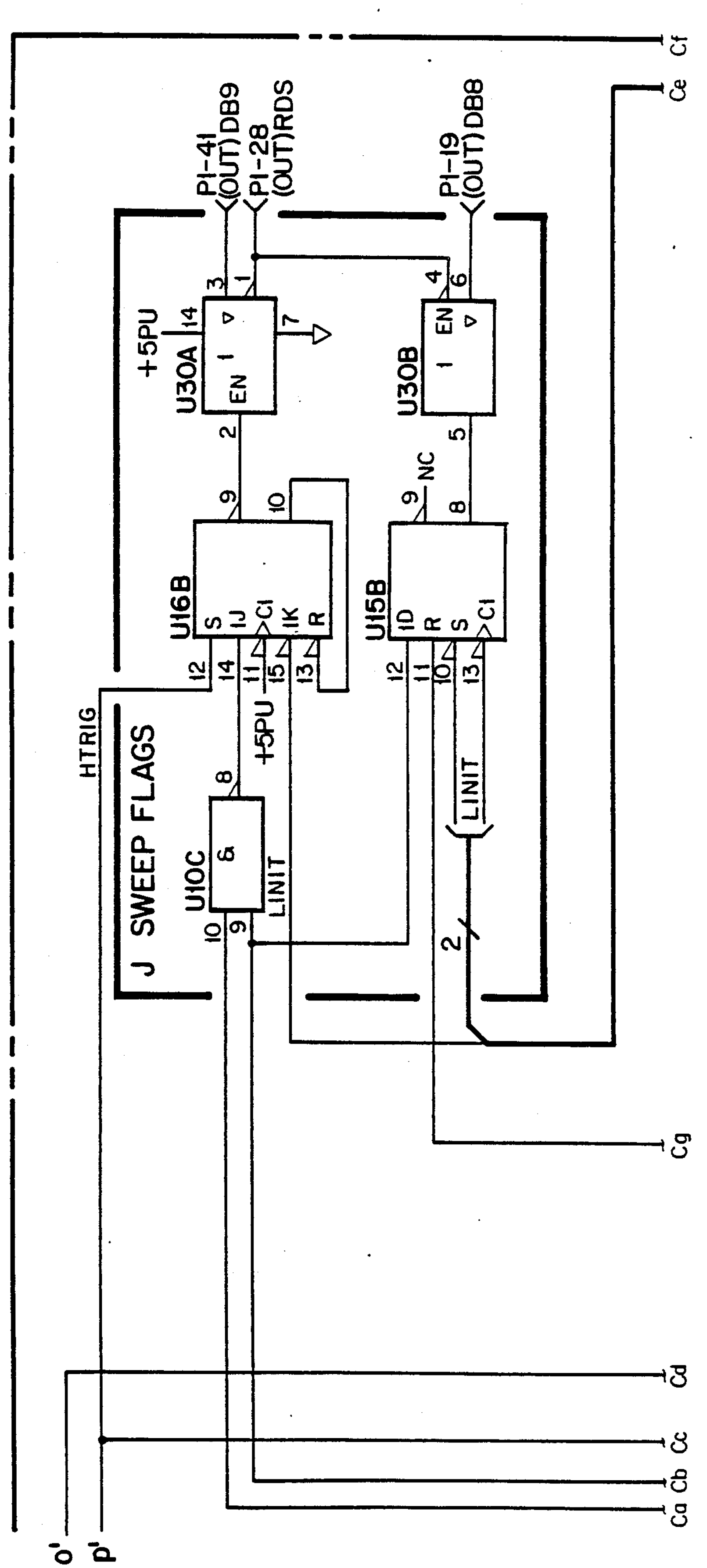
FIG 27.50A

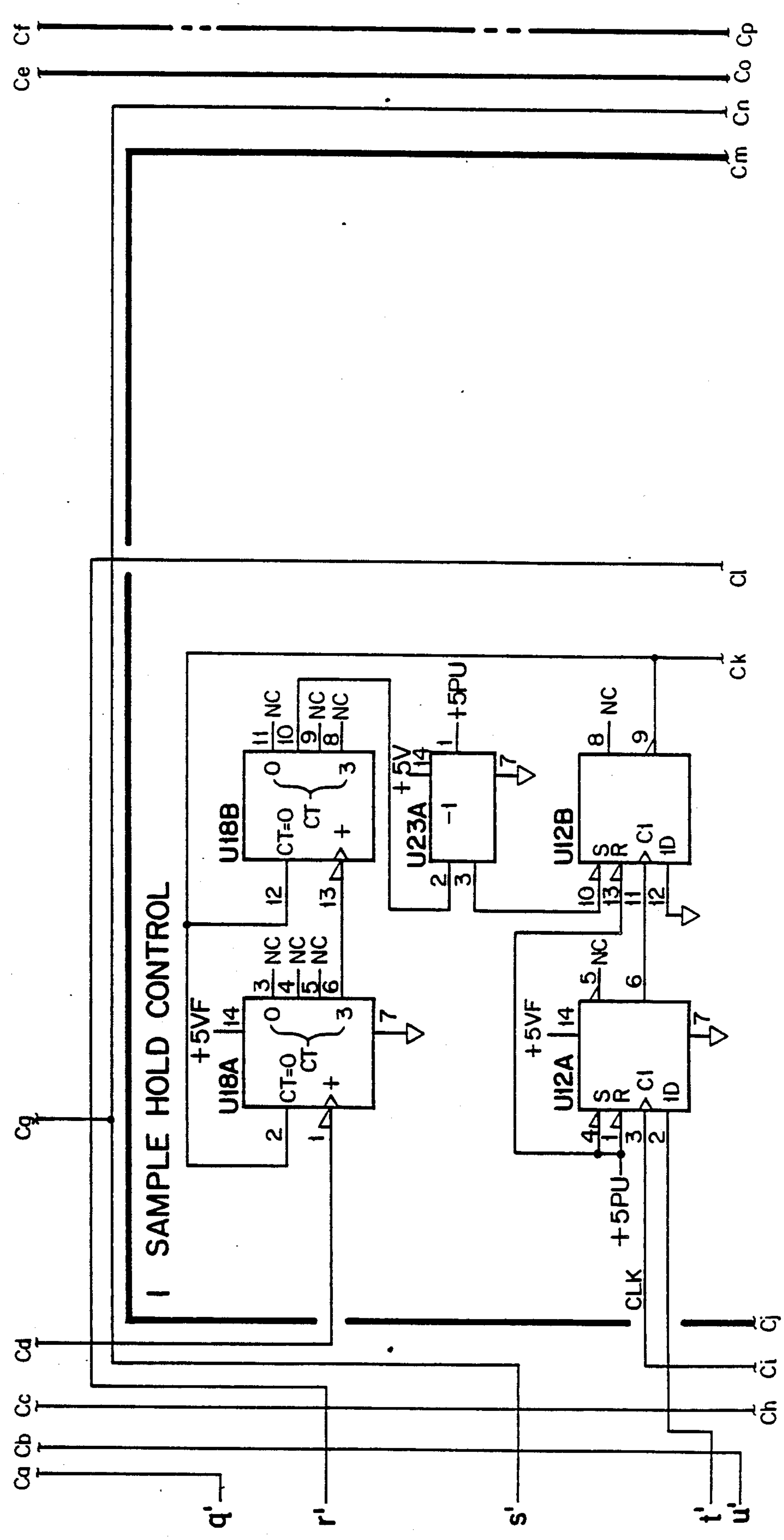
FIG 27.50B

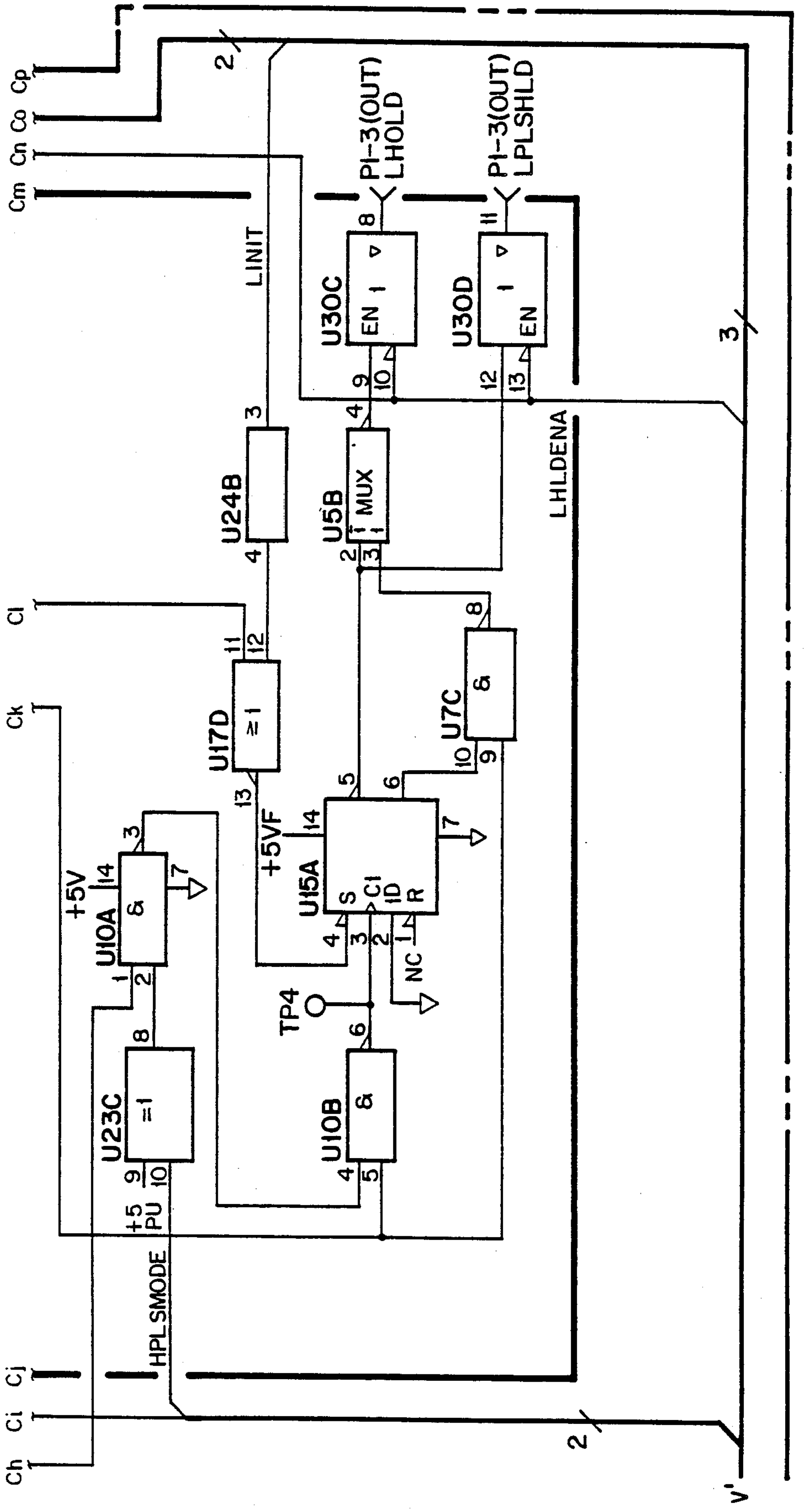
FIG 27.50C

FIG 27.51
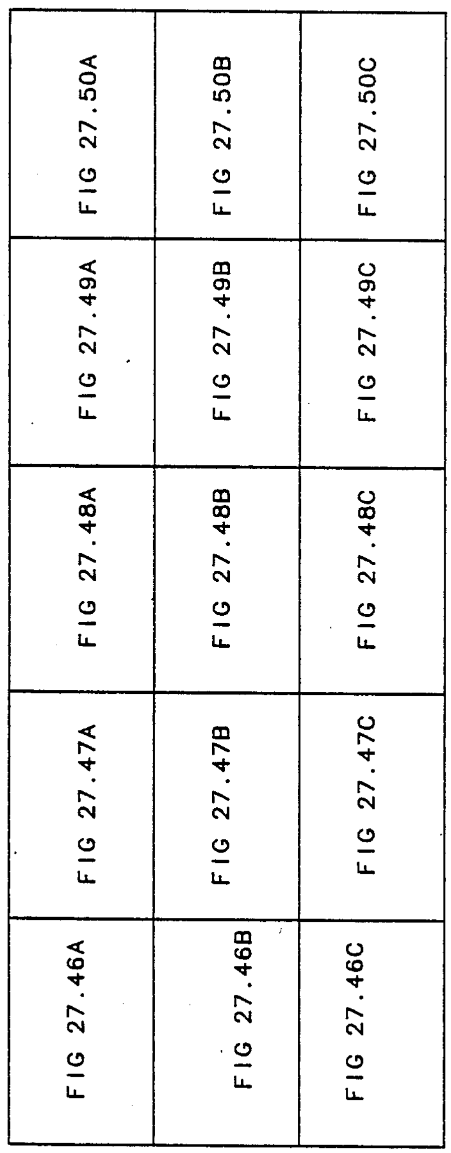
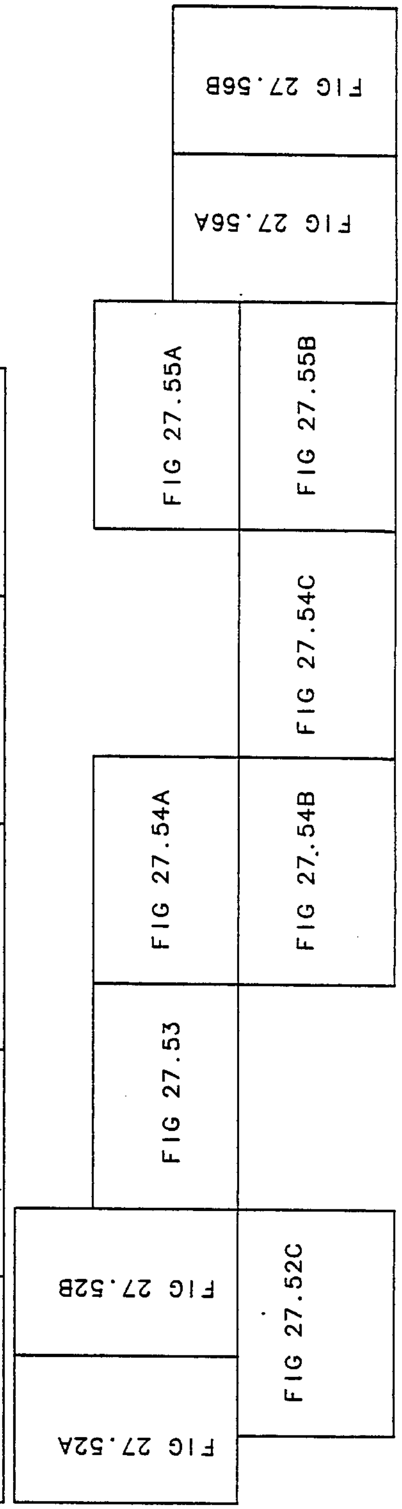
FIG 27.57

A20 SWEEP ADC
85102-60020

Cc

| PIN | SIGNAL | TO/FROM | FUNCTION BLOCK |
|---|---|---|---|
| 1<br>23 | | | |
| 2<br>24 | +10VR<br>LSS | A18<br>A24 | NOT USED |
| 3<br>25 | | | |
| 4<br>26 | | | |
| 5<br>27 | LLOST<br>LIFSRQ | ADR BUSS<br>A24 | |
| 6<br>28 | CLK<br>LRDS | A6<br>A24 | |
| 7<br>29 | LADCSRQ<br>AB0 | A24<br>ADR BUSS | NOT USED |
| 8<br>30 | AB1<br>AB2 | ,,<br>,, | |
| 9<br>31 | AB3<br>AB4 | ,,<br>,, | |
| 10<br>32 | +15V REG<br>+15V REG | POWER<br>BUSS | |
| 11<br>33 | GND<br>GND | | |
| 12<br>34 | GND<br>GND | | |
| 13<br>35 | -15V REG<br>-15V REG | POWER<br>BUSS | |
| 14<br>36 | +5V REG<br>+5V REG | ,,<br>,, | |
| 15<br>37 | DB0<br>DB1 | DATA<br>BUSS | |
| 16<br>38 | DB2<br>DB3 | ,,<br>,, | |
| 17<br>39 | DB4<br>DB5 | ,,<br>,, | |
| 18<br>40 | DB6<br>DB7 | ,,<br>,, | |
| 19<br>41 | DB8<br>DB9 | ,,<br>,, | |
| 20<br>42 | DB10<br>DB11 | ,,<br>,, | |
| 21<br>43 | | | |
| 22<br>44 | LSWPTRG | A19 | |

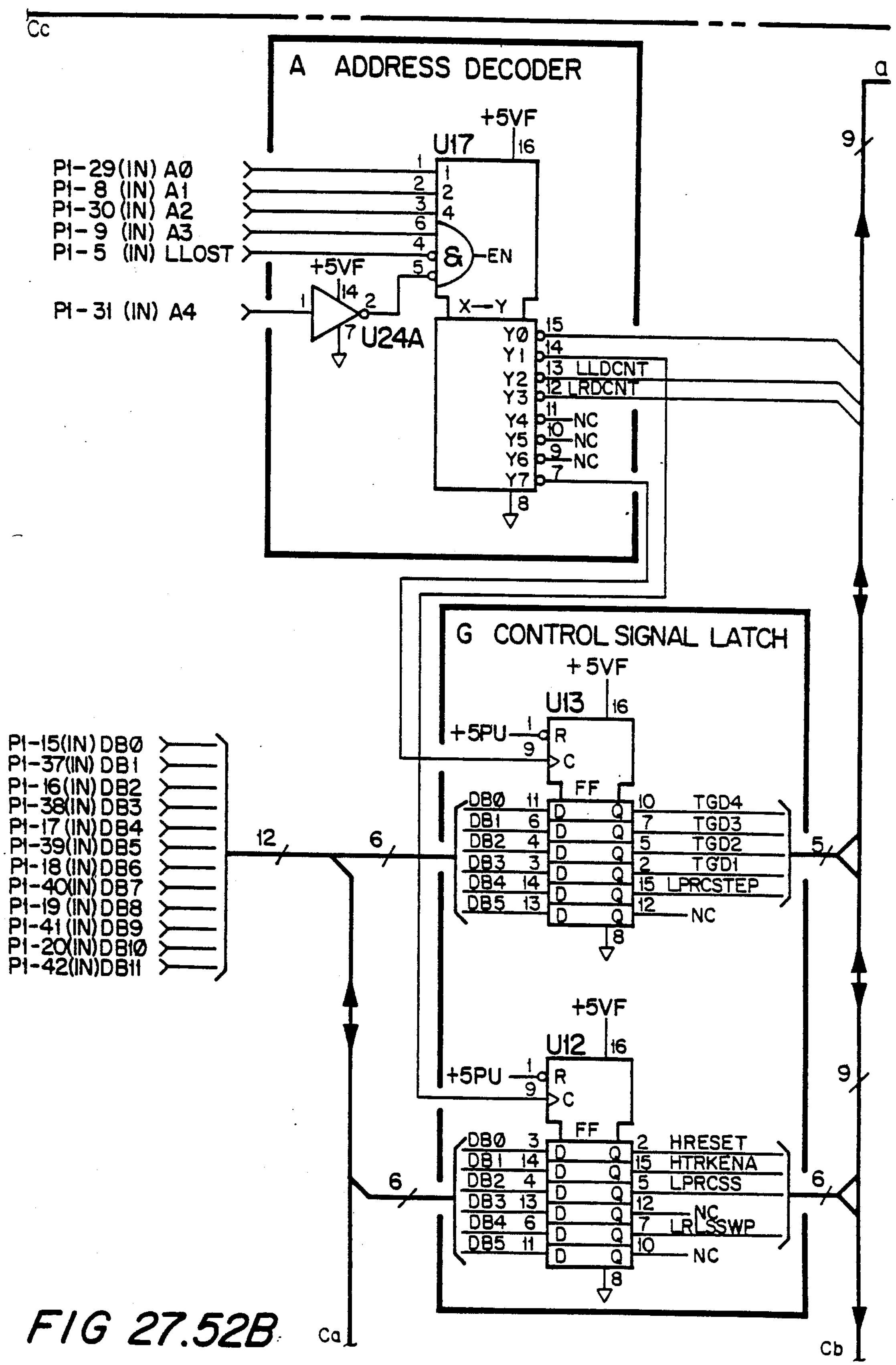
FIG 27.52B

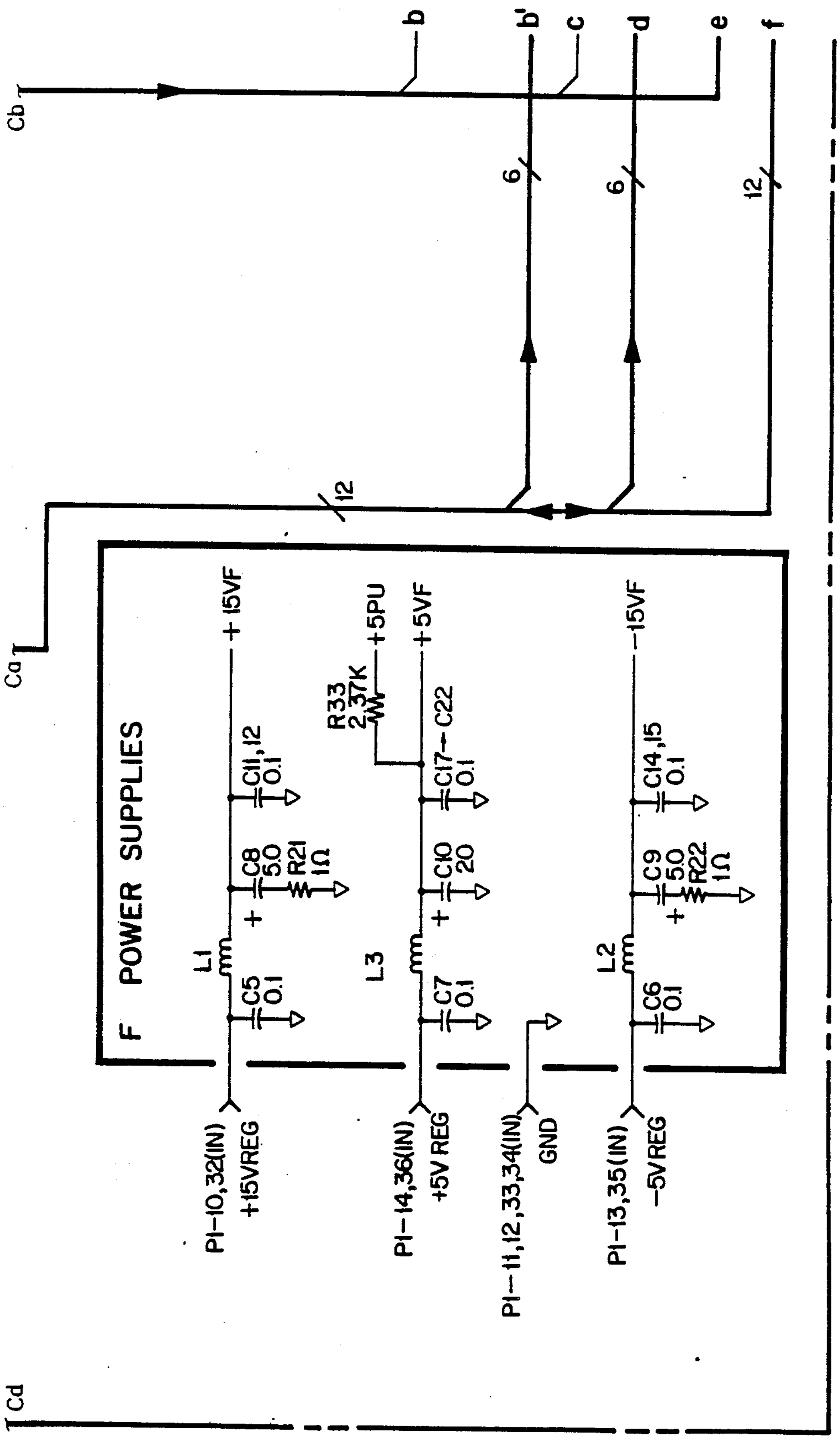
FIG 27.52C

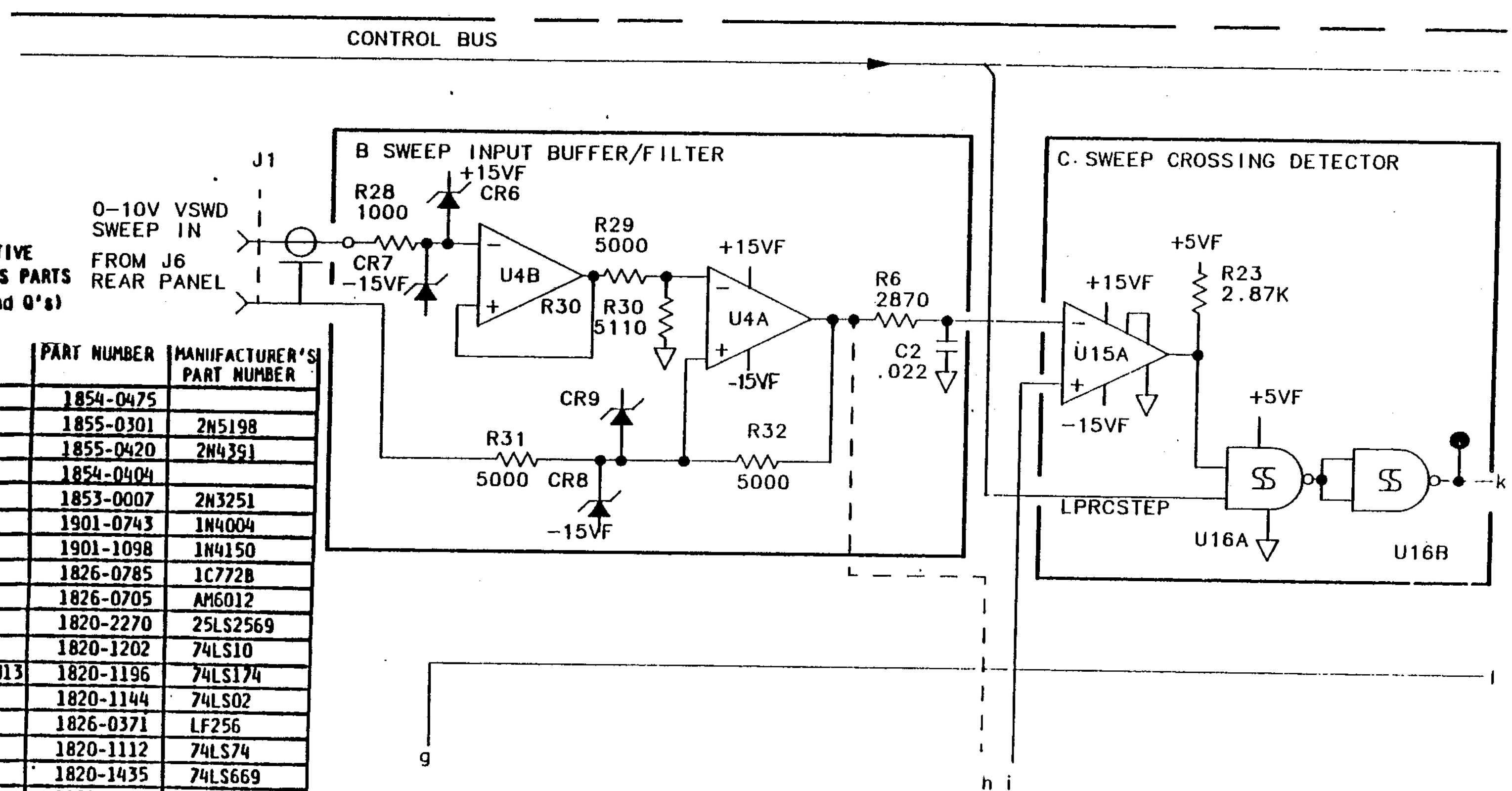
ACTIVE COMPONENTS PARTS LISTS (U's and Q's)
| REFERENCE DESIGNATORS | PART NUMBER | MANUFACTURER'S PART NUMBER |
|---|---|---|
| Q1 | 1854-0475 | |
| Q2 | 1855-0301 | 2N5198 |
| Q3 | 1855-0420 | 2N4391 |
| Q4,Q5 | 1854-0404 | |
| Q6 | 1853-0007 | 2N3251 |
| CR6-CR9 | 1901-0743 | 1N4004 |
| CR1-CR3 | 1901-1098 | 1N4150 |
| U1,U4 | 1826-0785 | 1C772B |
| U2 | 1826-0705 | AM6012 |
| U3 | 1820-2270 | 25LS2569 |
| U5 | 1820-1202 | 74LS10 |
| U6,U7,U12,U13 | 1820-1196 | 74LS174 |
| U8 | 1820-1144 | 74LS02 |
| U9 | 1826-0371 | LF256 |
| U10,U20 | 1820-1112 | 74LS74 |
| U11 | 1820-1435 | 74LS669 |
| U14 | 1820-1568 | 74LS125 |
| U15 | 1826-0026 | LM311 |
| U16 | 1820-1425 | 74LS132 |
| U17 | 1820-1216 | 74LS138 |
| U18,U19,U23 | 1820-1278 | 74LS191 |
| U21,U22 | 1820-1491 | 74LS367 |
| U24 | 1820-1199 | 74LS04 |
| VR1 | 1902-0692 | |
FIG 27.53

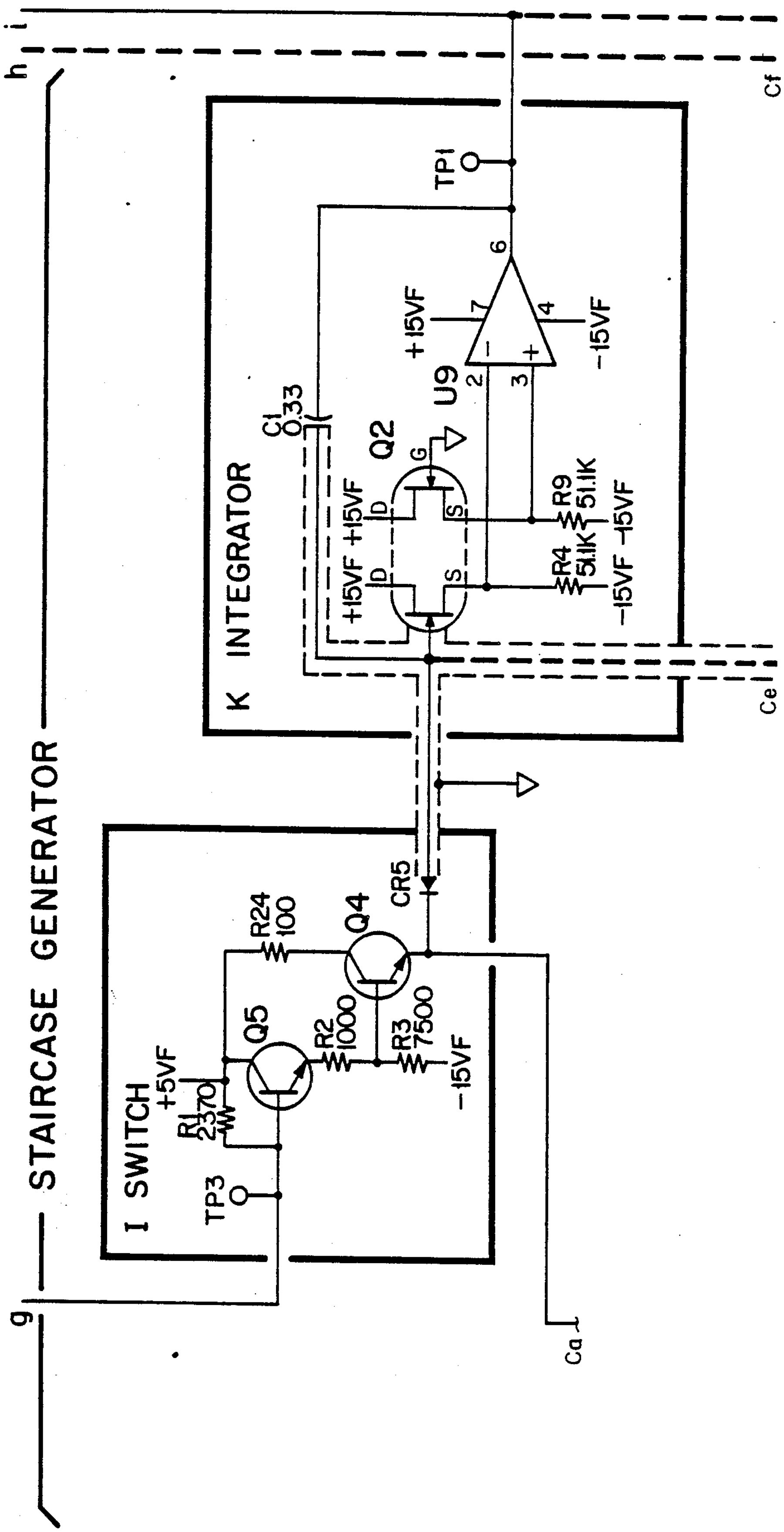
FIG 27.54A

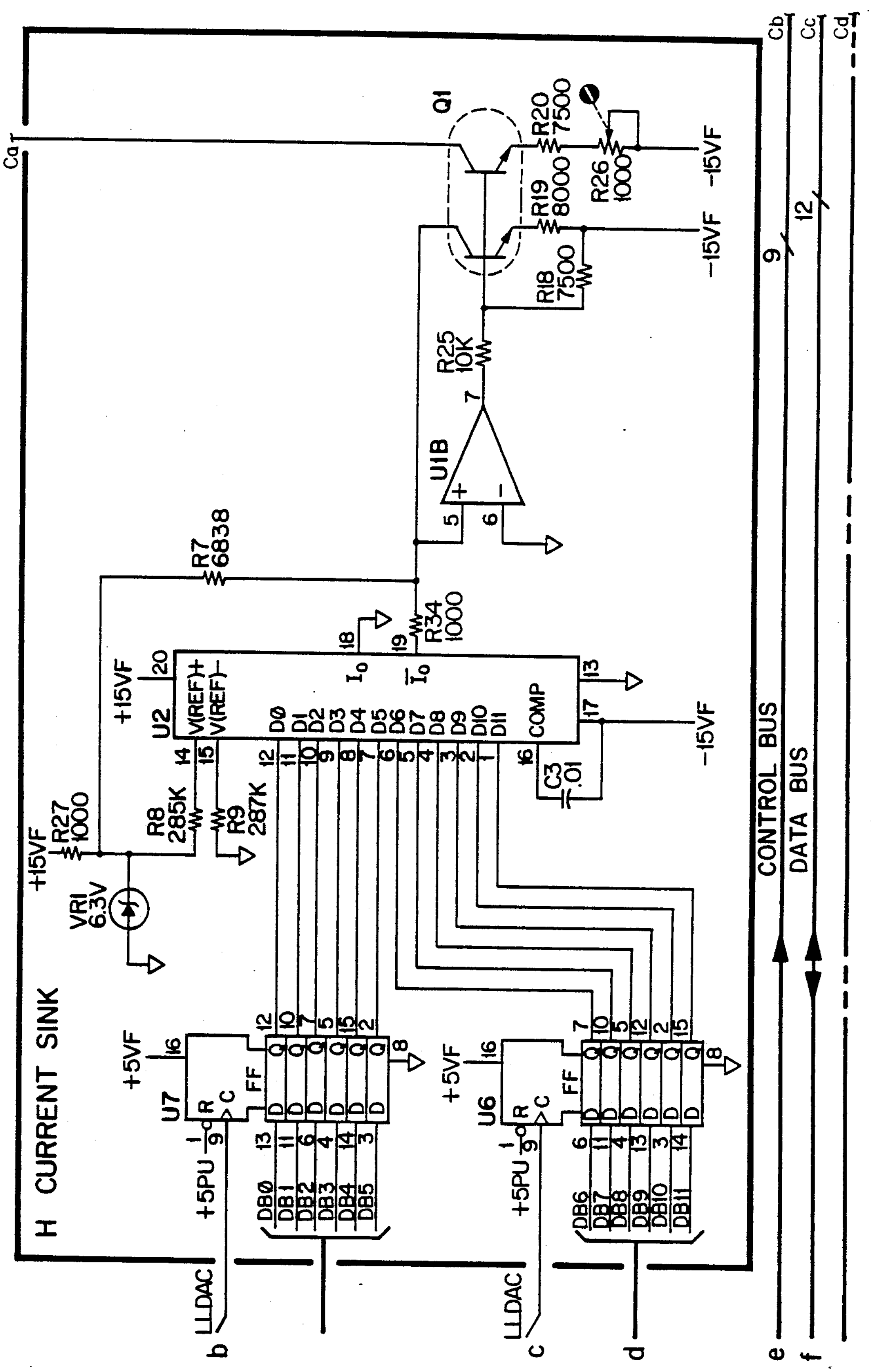
FIG 27.54B

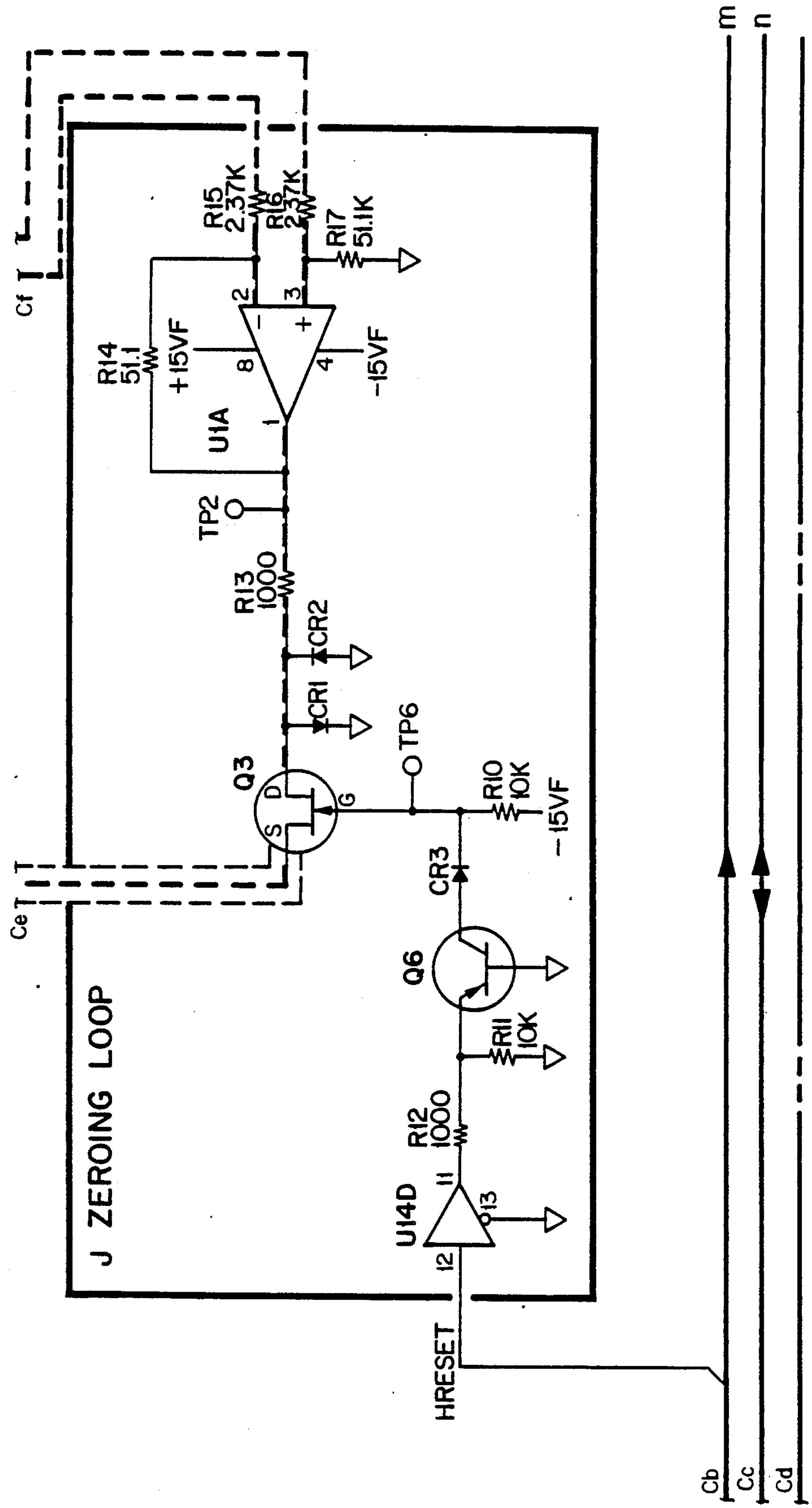
FIG 27.54C

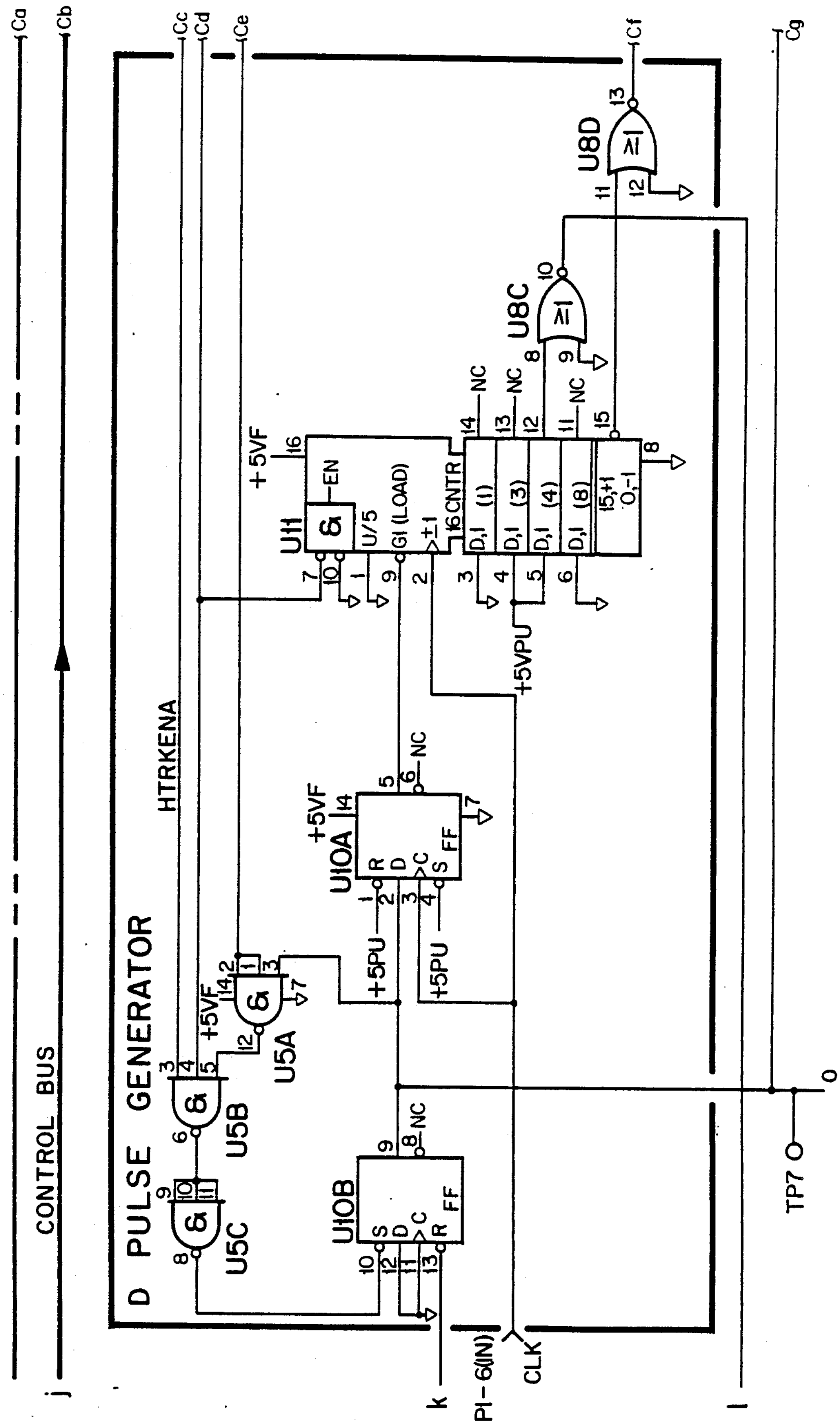
FIG 27.55A

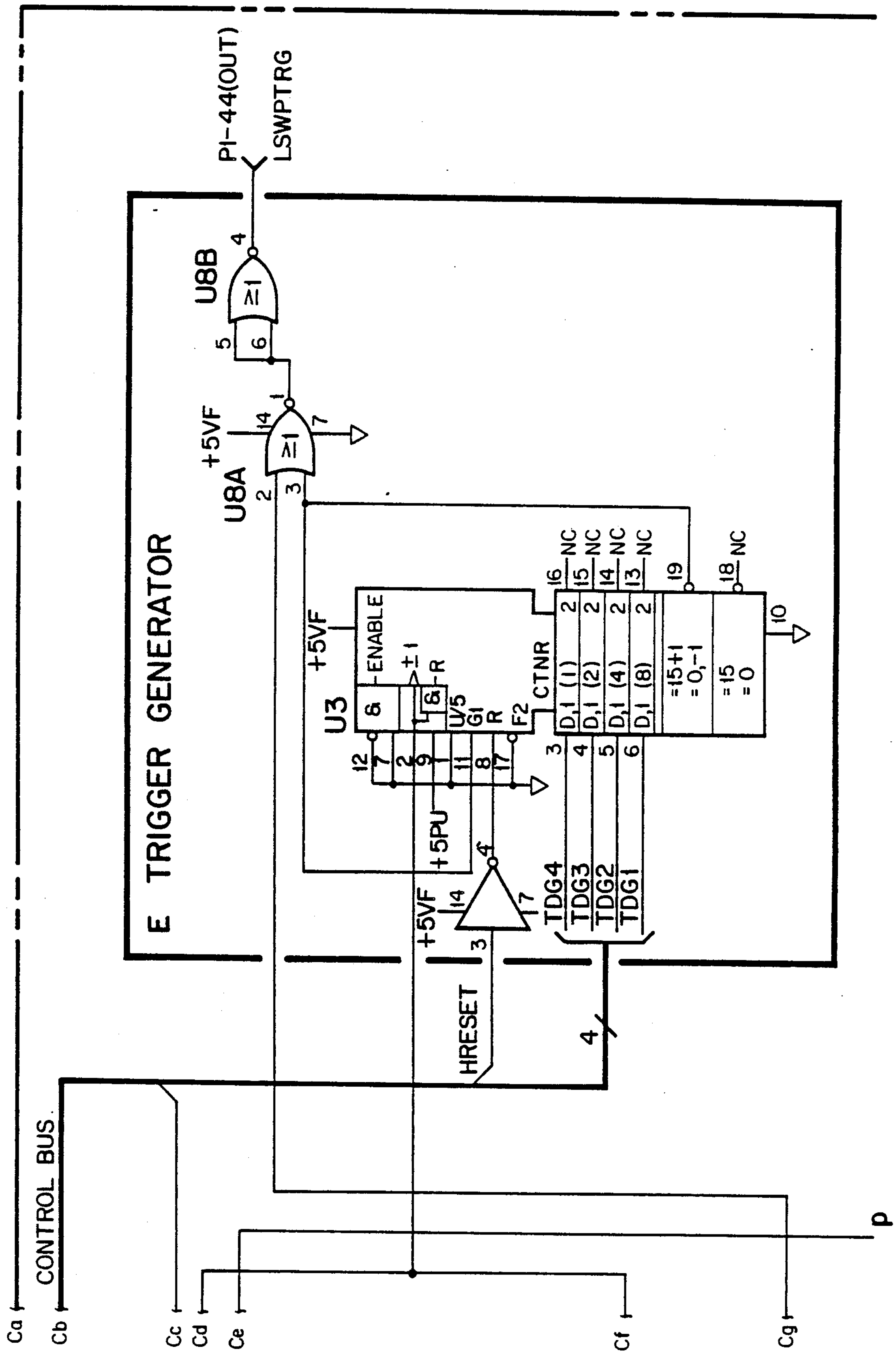
FIG 27.55B

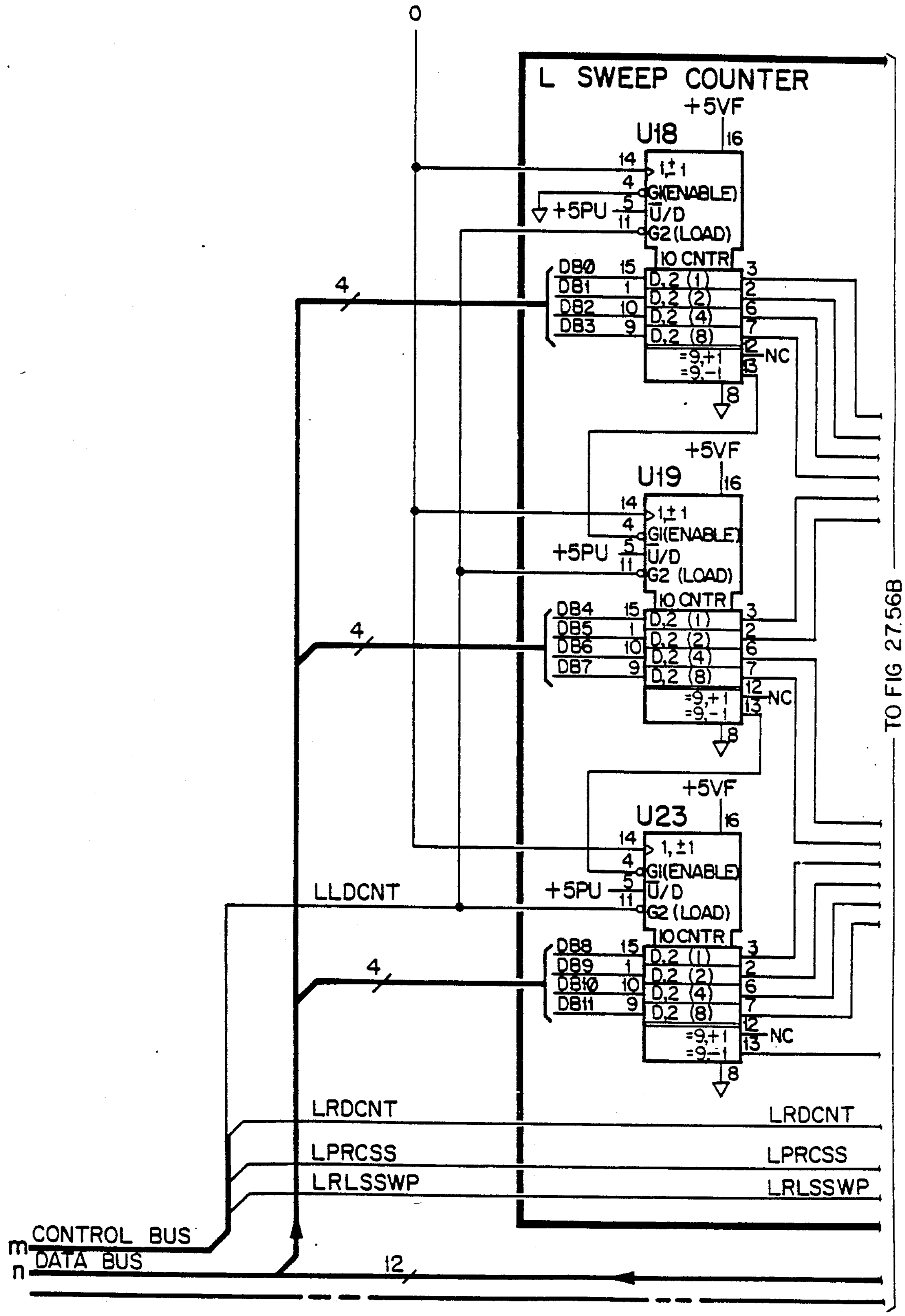
FIG 27.56A

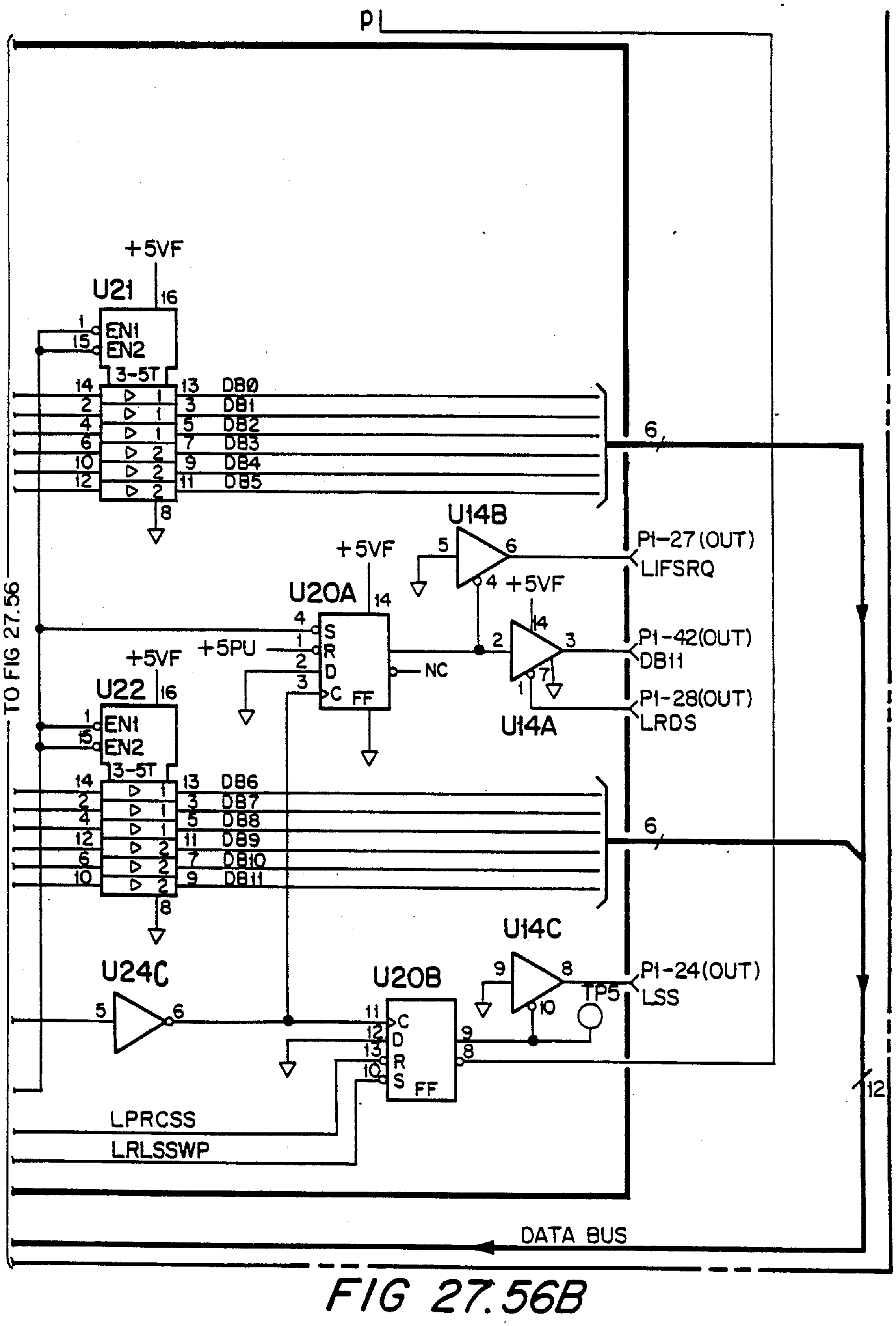
FIG 27.56B

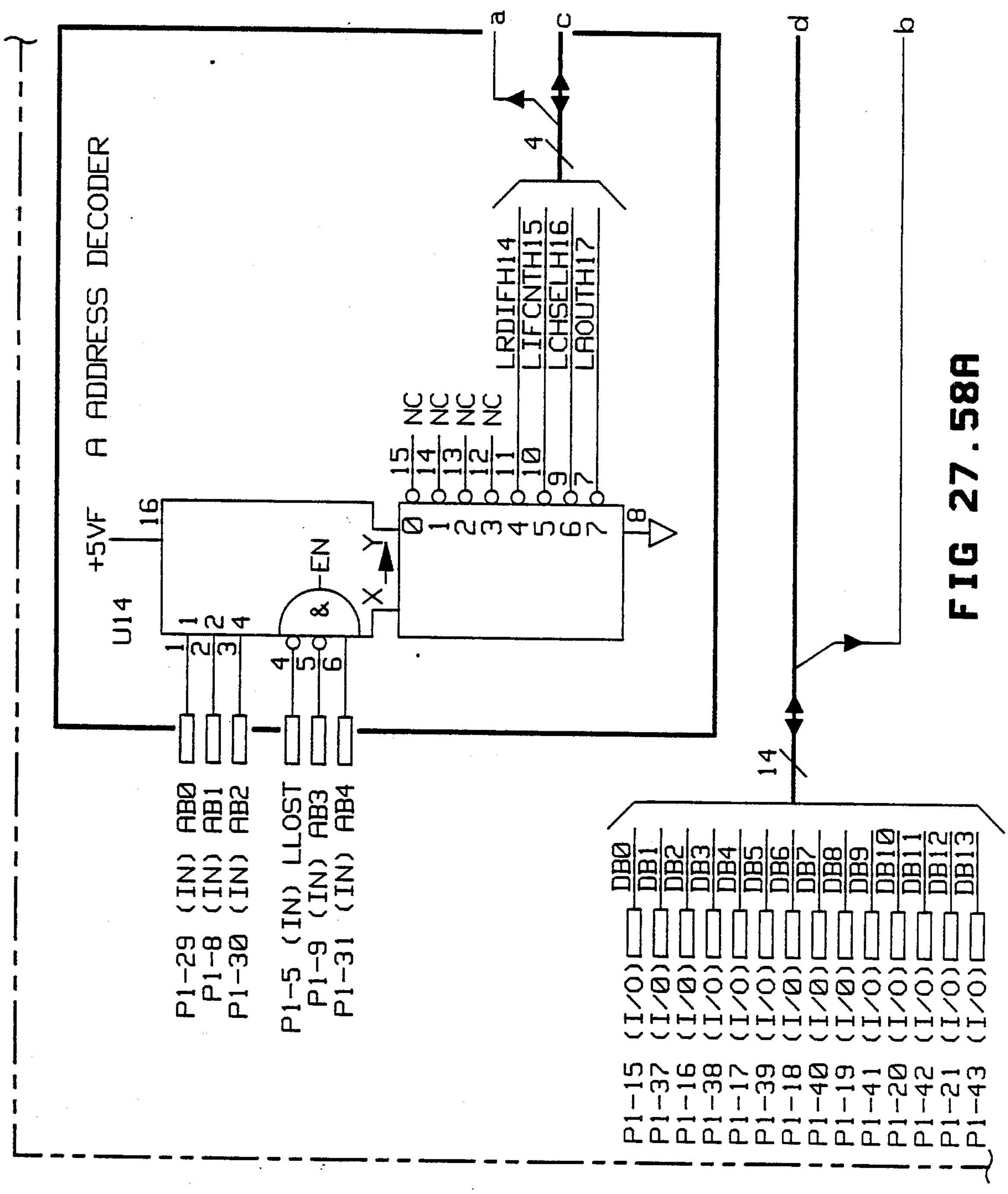
FIG 27.58A

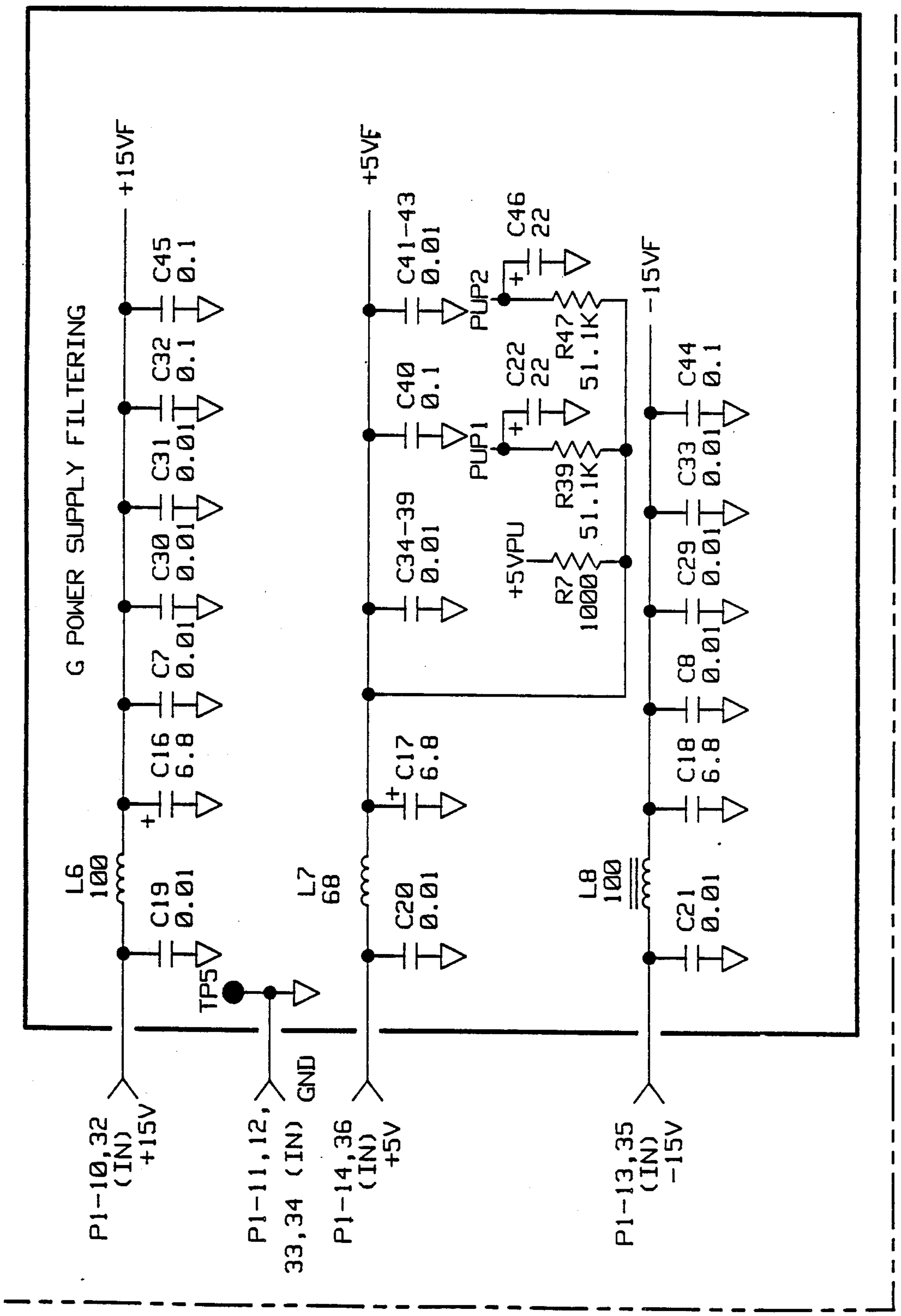
FIG 27.58B

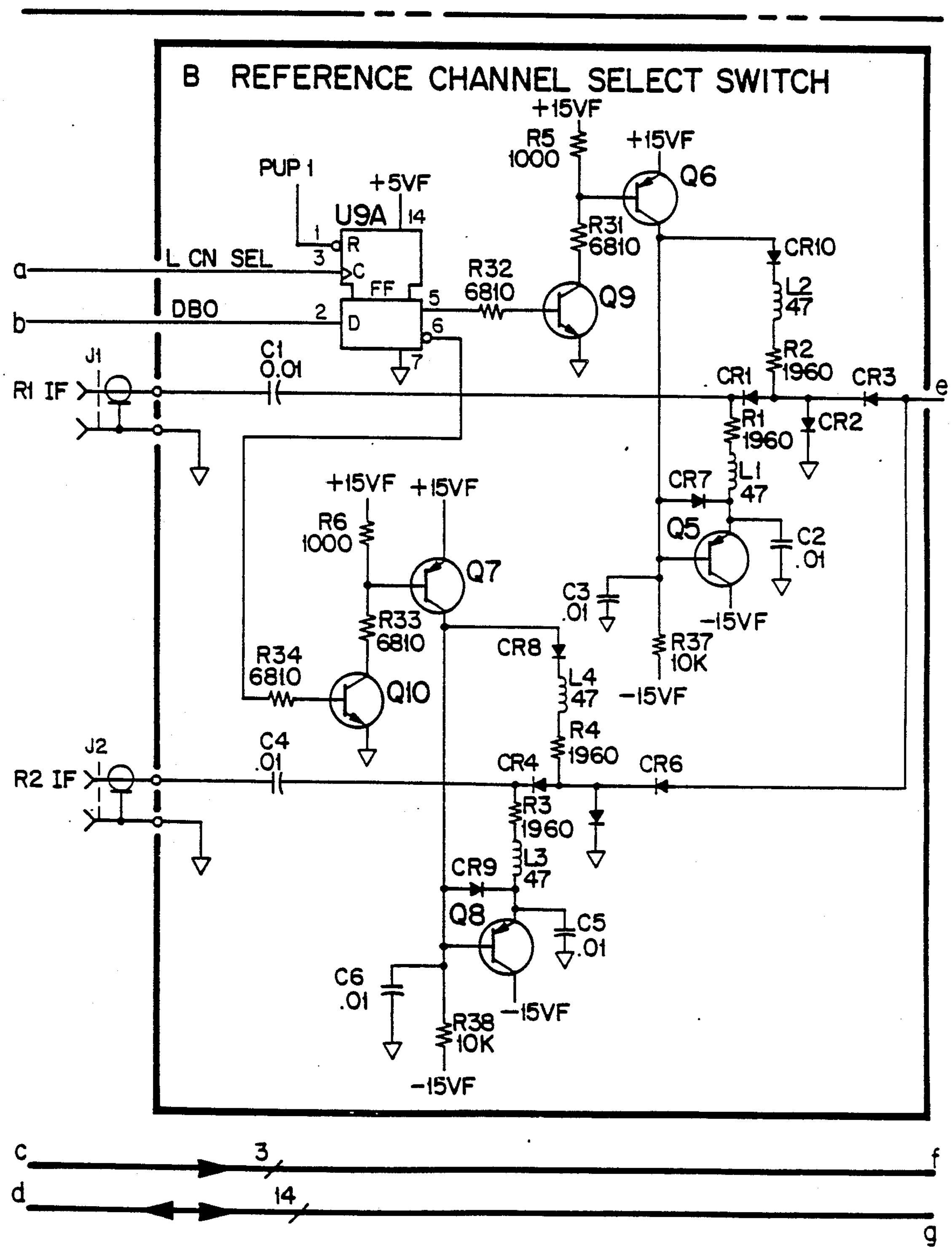
*FIG 27.60A*

ACTIVE COMPONENTS PARTS LISTS (U's and Q's)

| REFERENCE DESIGNATORS | PART NUMBER | MANUFACTURER'S PART NUMBER |
|---|---|---|
| U1 | 1820 – 1308 | MECL 10116 |
| U2 | 1820 – 0026 | LM 311 |
| U3 | 1820 – 1197 | LS 00 (NAND) |
| U4 | 1820 – 1442 | LS 290 (CNTR) |
| U5 | 1826 – 0521 | TL 072 |
| U6 | 1820 – 0693 | S74 (FF) |
| U7 | 1826 – 0316 | LH 0070 (+10V) |
| U8 | 1826 – 0684 | DAC 7541B (DAC) |
| U9 | 1820 – 1195 | LS7A |
| U10 | 1820 – 1112 | LS74 (FF) |
| U11, U15 | 1820 – 1989 | LS393 (CNTR) |
| U12, U13 | 1820 – 1196 | LS174 |
| U14 | 1820 – 1216 | LS138 (DEC) |
| U16 | 1820 – 2024 | LS244 |
| U17 | 1820 – 1491 | LS367 |
| U18 | | LS02 |
| Q1 | 1854 – 0457 | |
| Q2 | 1854 – 0477 | 2N2222A |
| Q3, Q4 | 1853 – 0405 | P 2N4209 |
| Q5 → Q8 | 1853 – 0451 | P 2N3799 |
| Q9, Q10 | 1854 – 0477 | P 2N2222A |
| | | |
| | | |

FIG 27.60B

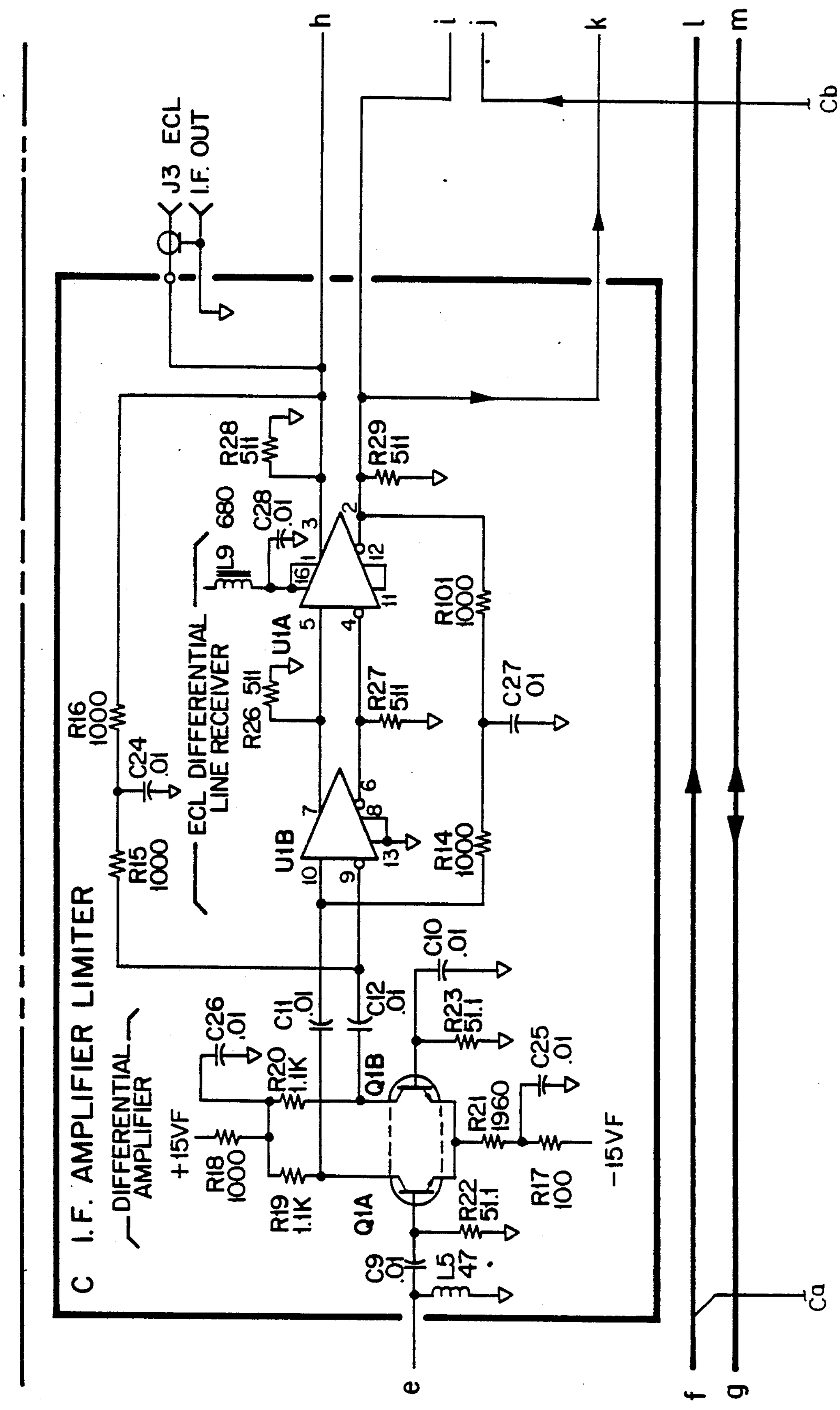
FIG 27.61A

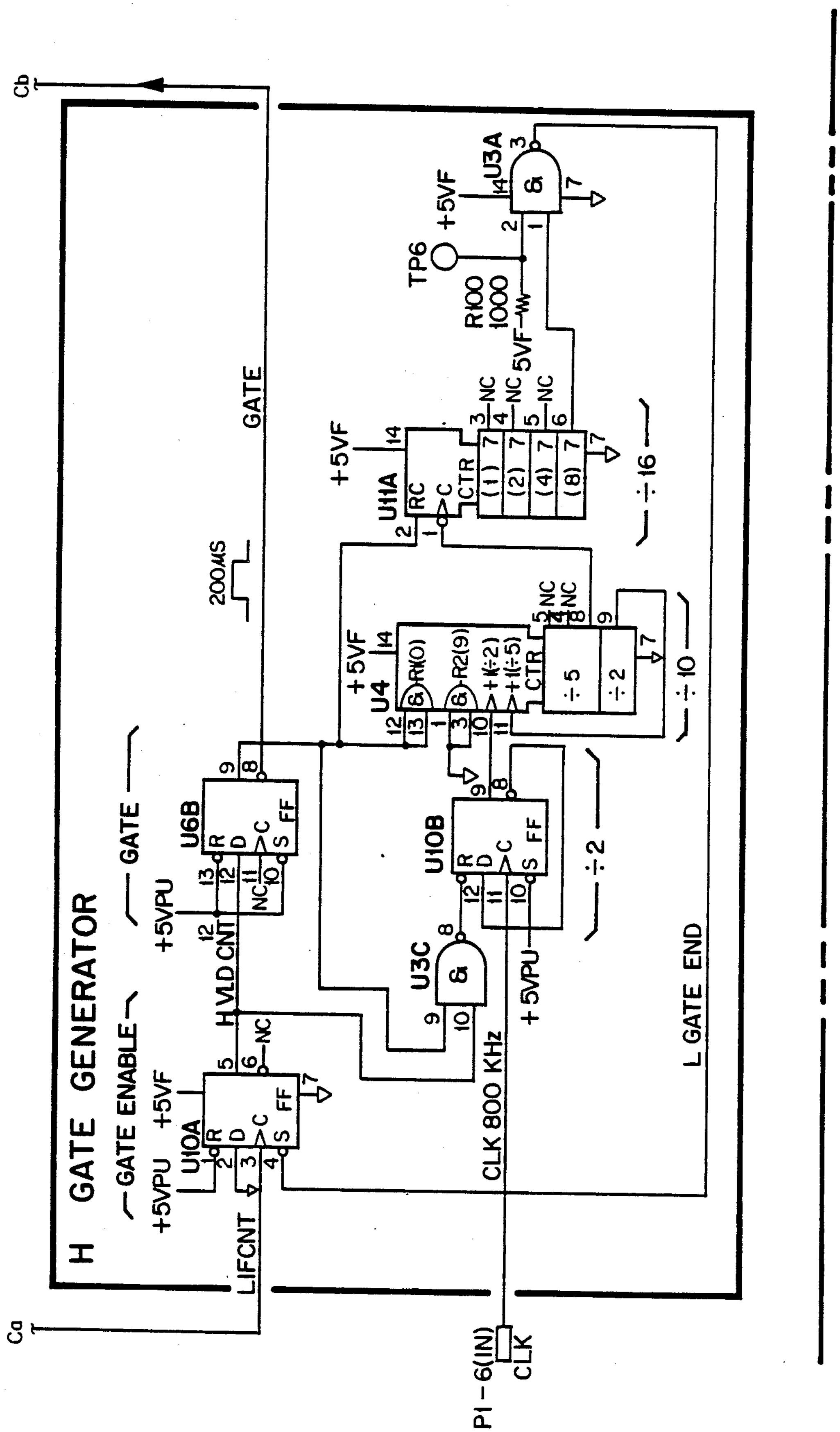
FIG 27.61B

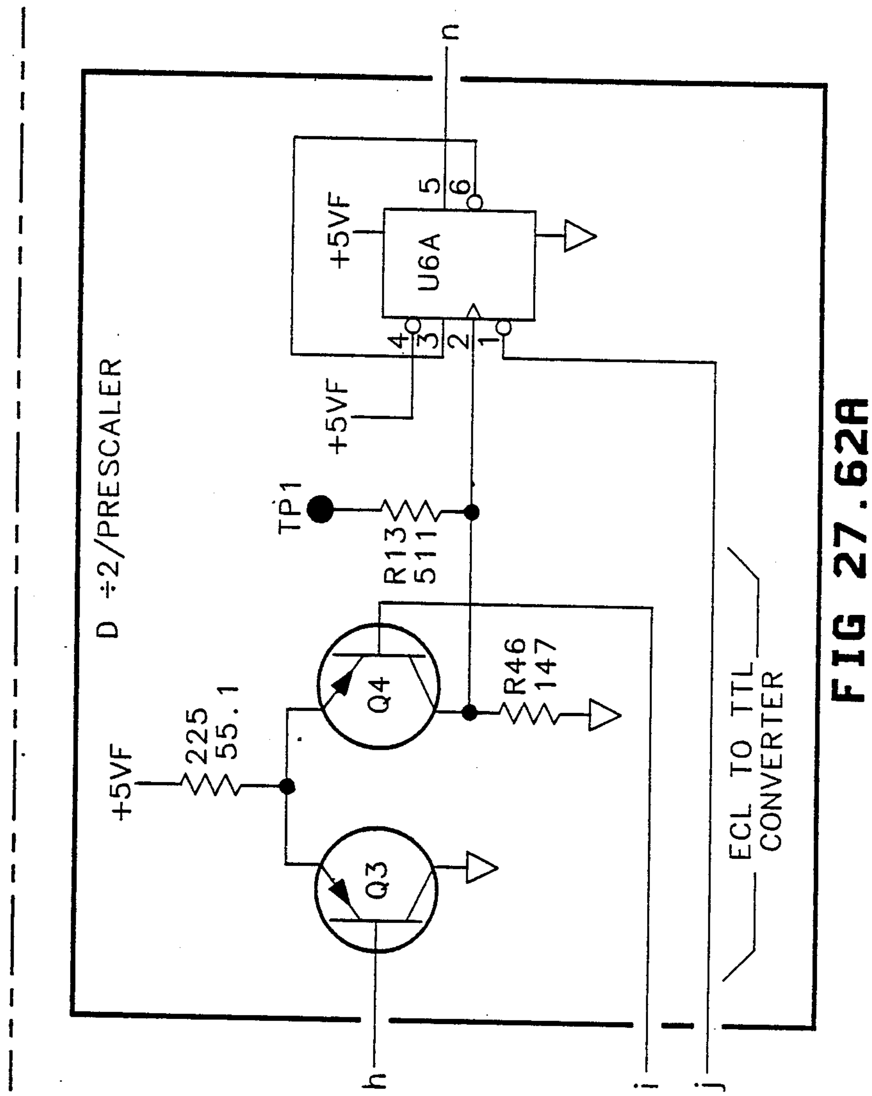
FIG 27.62A

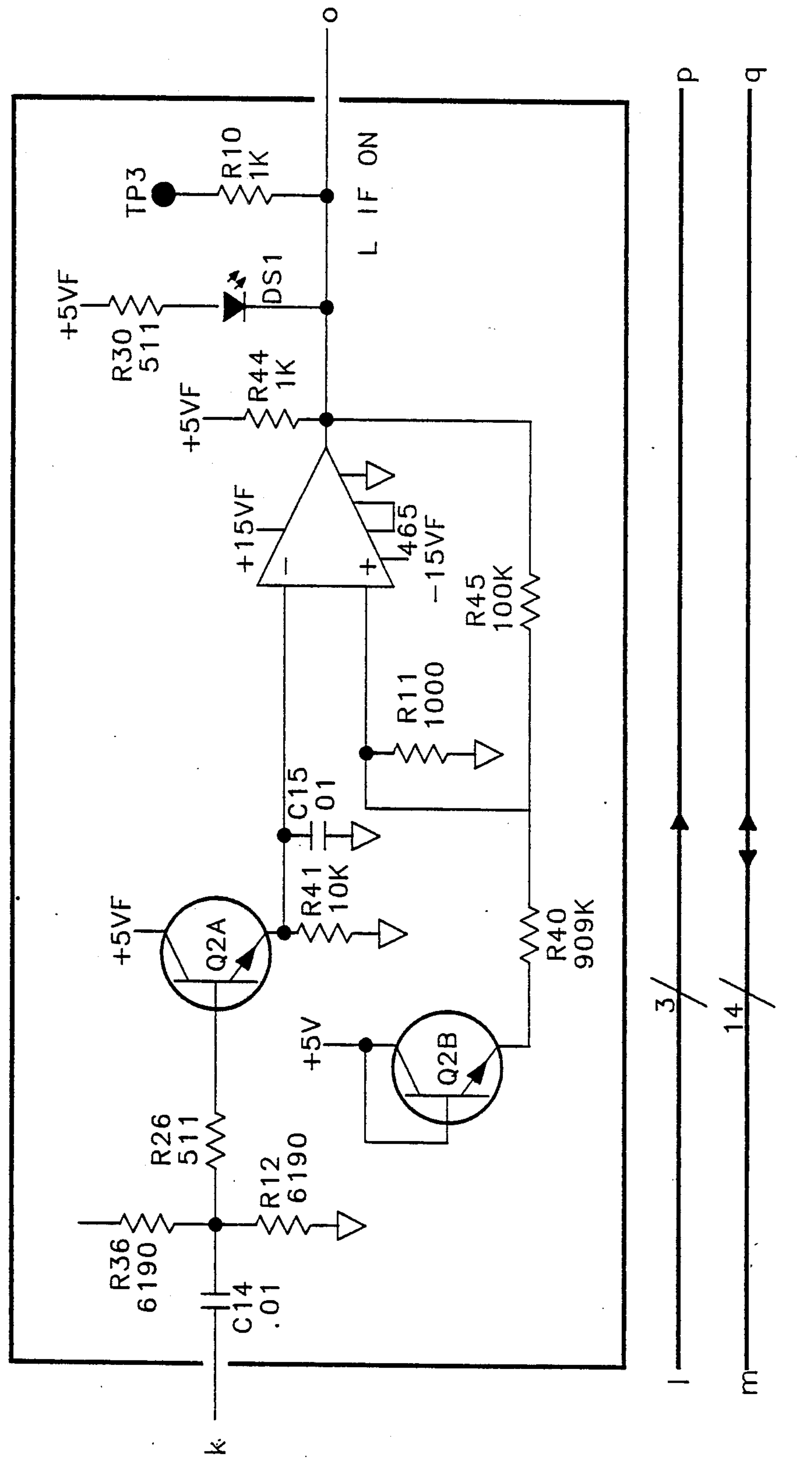
FIG 27.62B

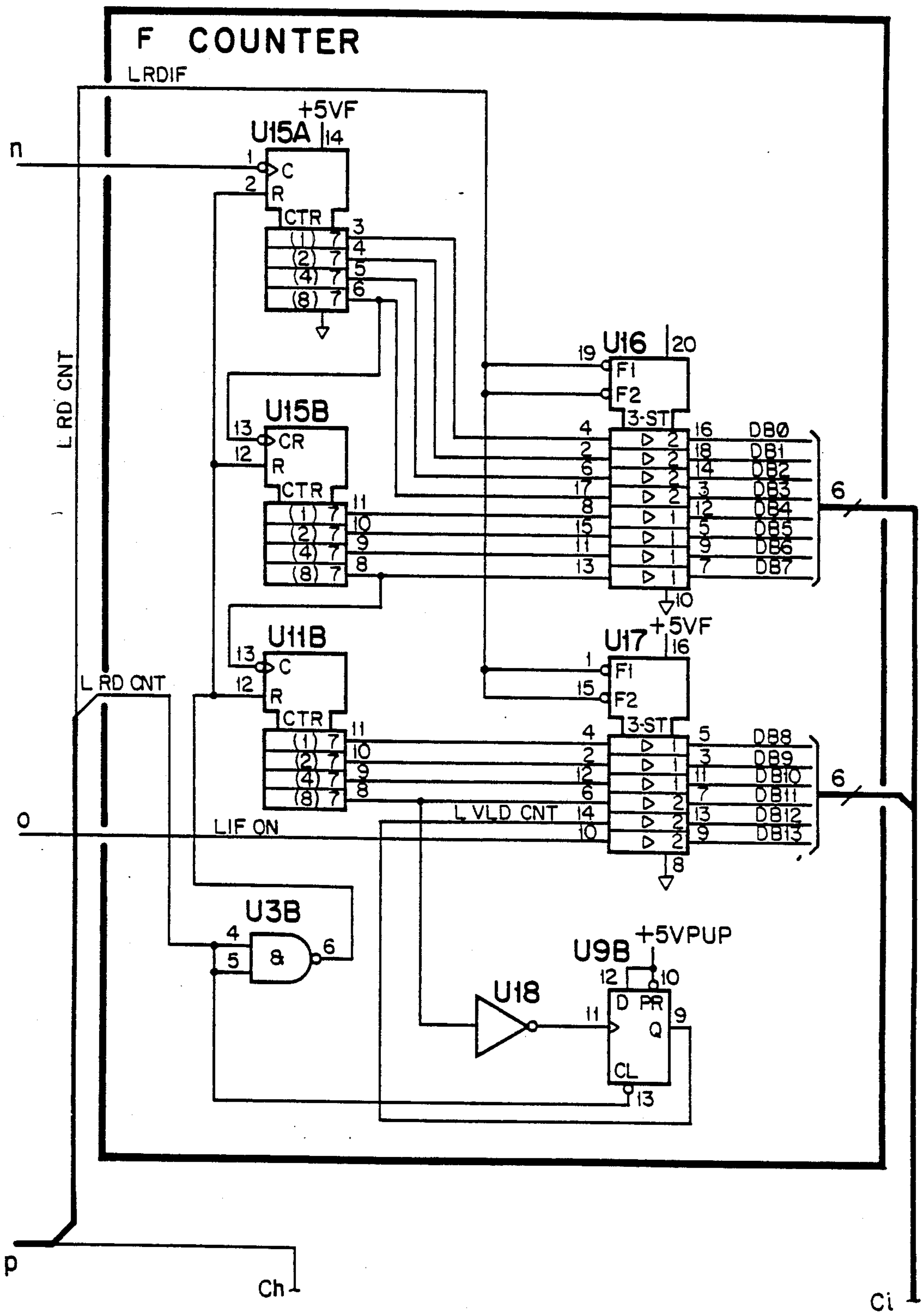
FIG 27.63A

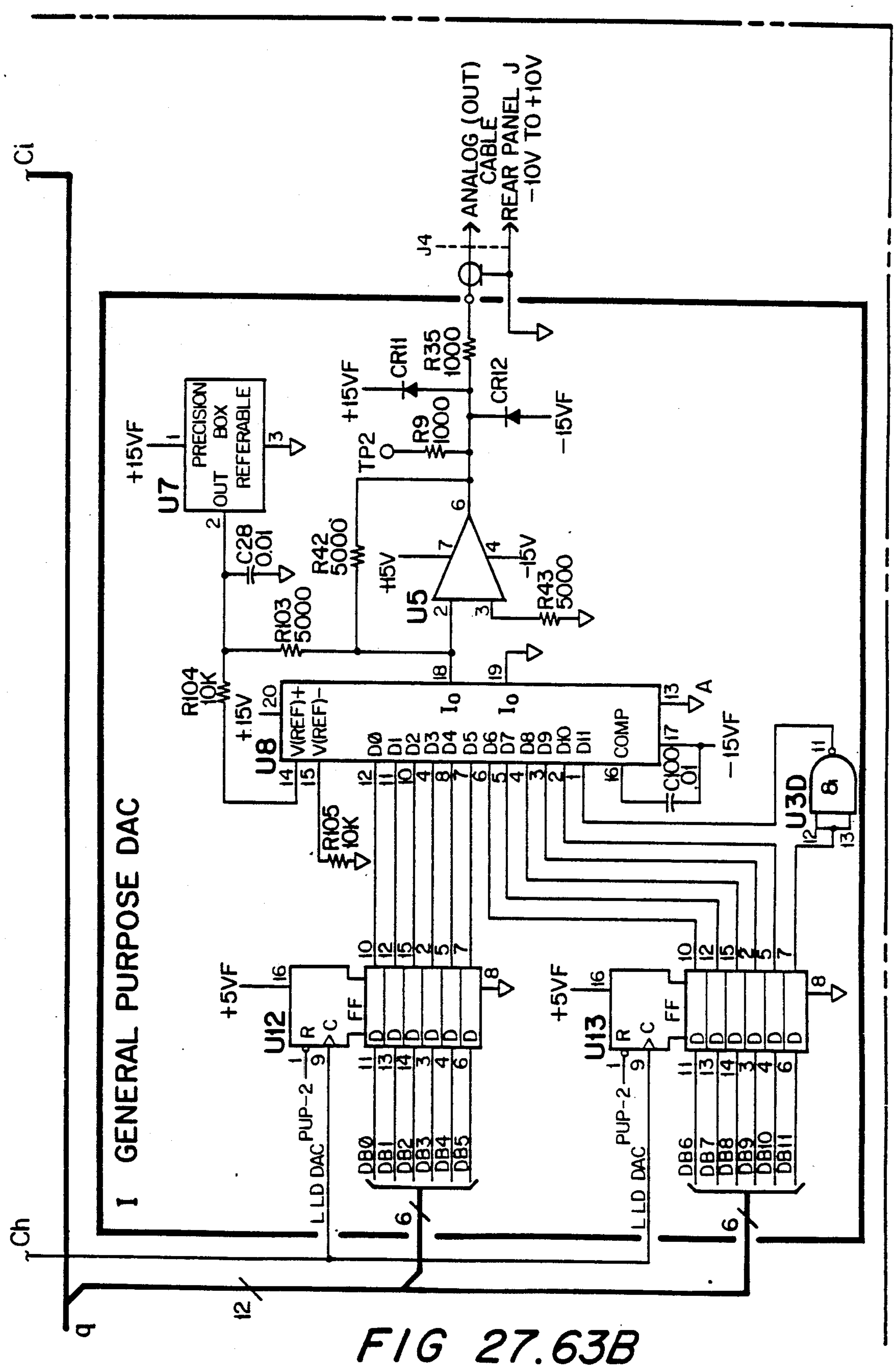
FIG 27.63B

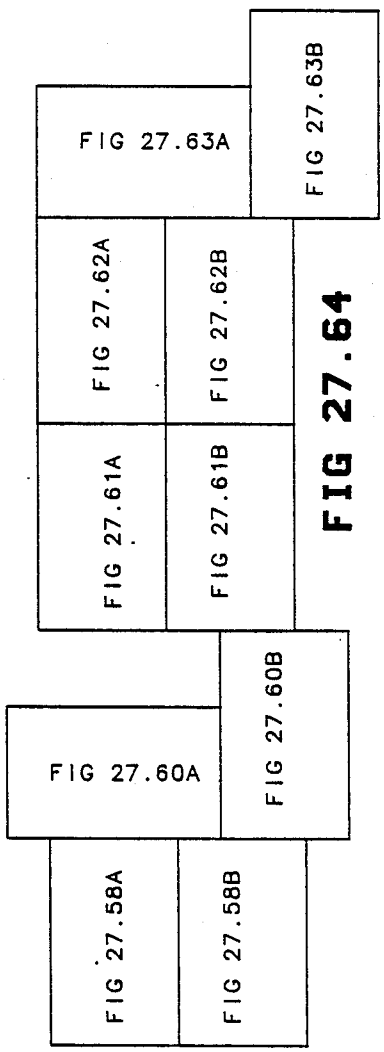
FIG 27.64
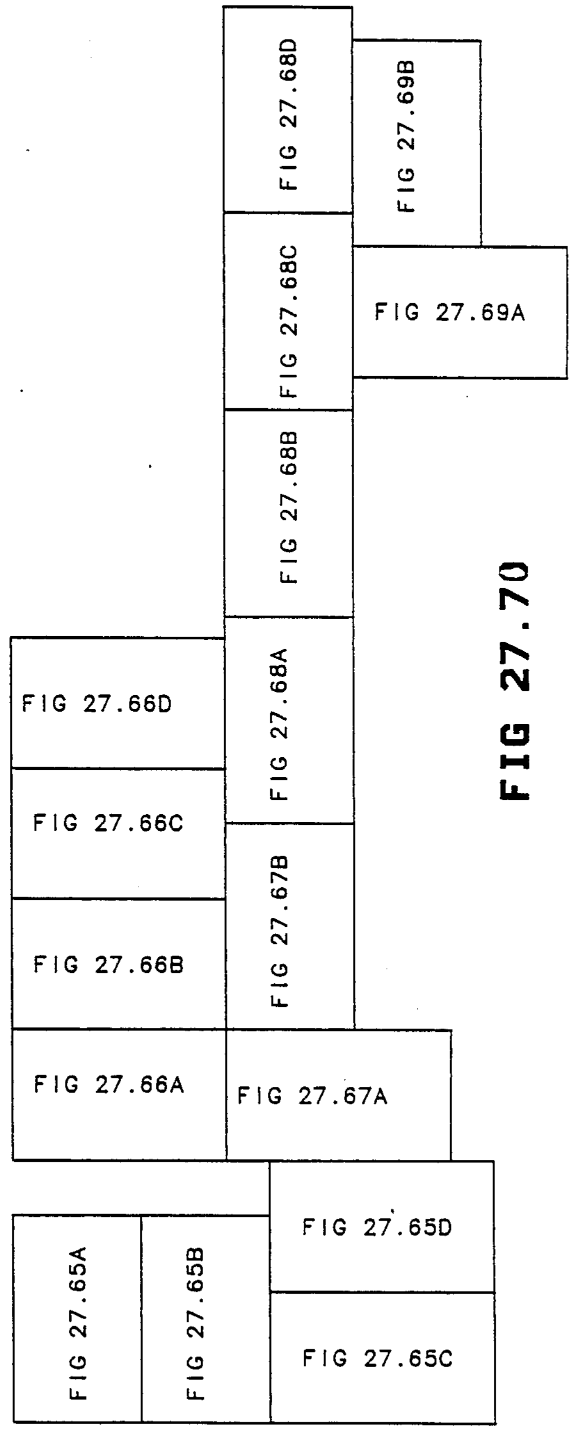
FIG 27.70

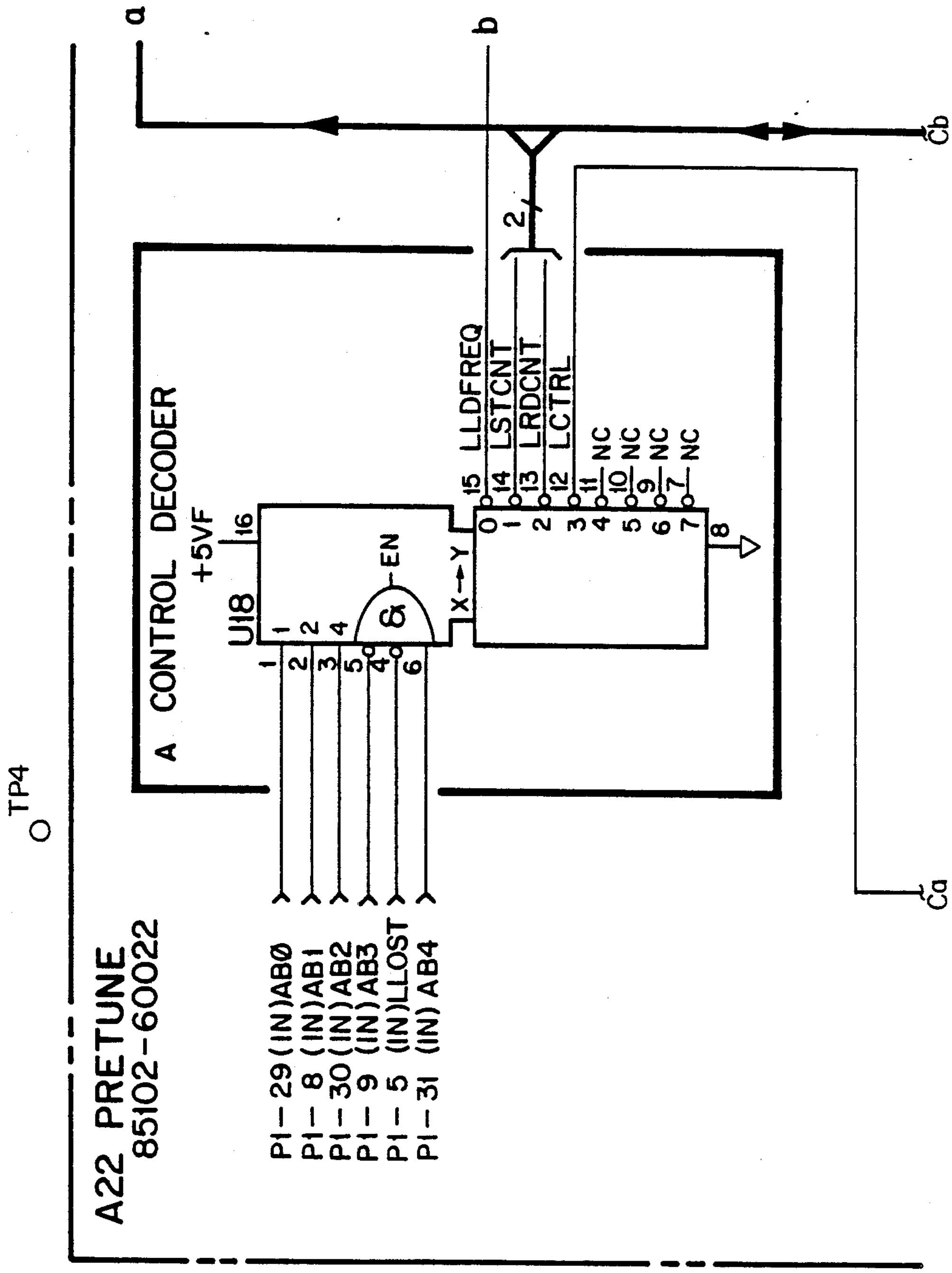
FIG 27.65A

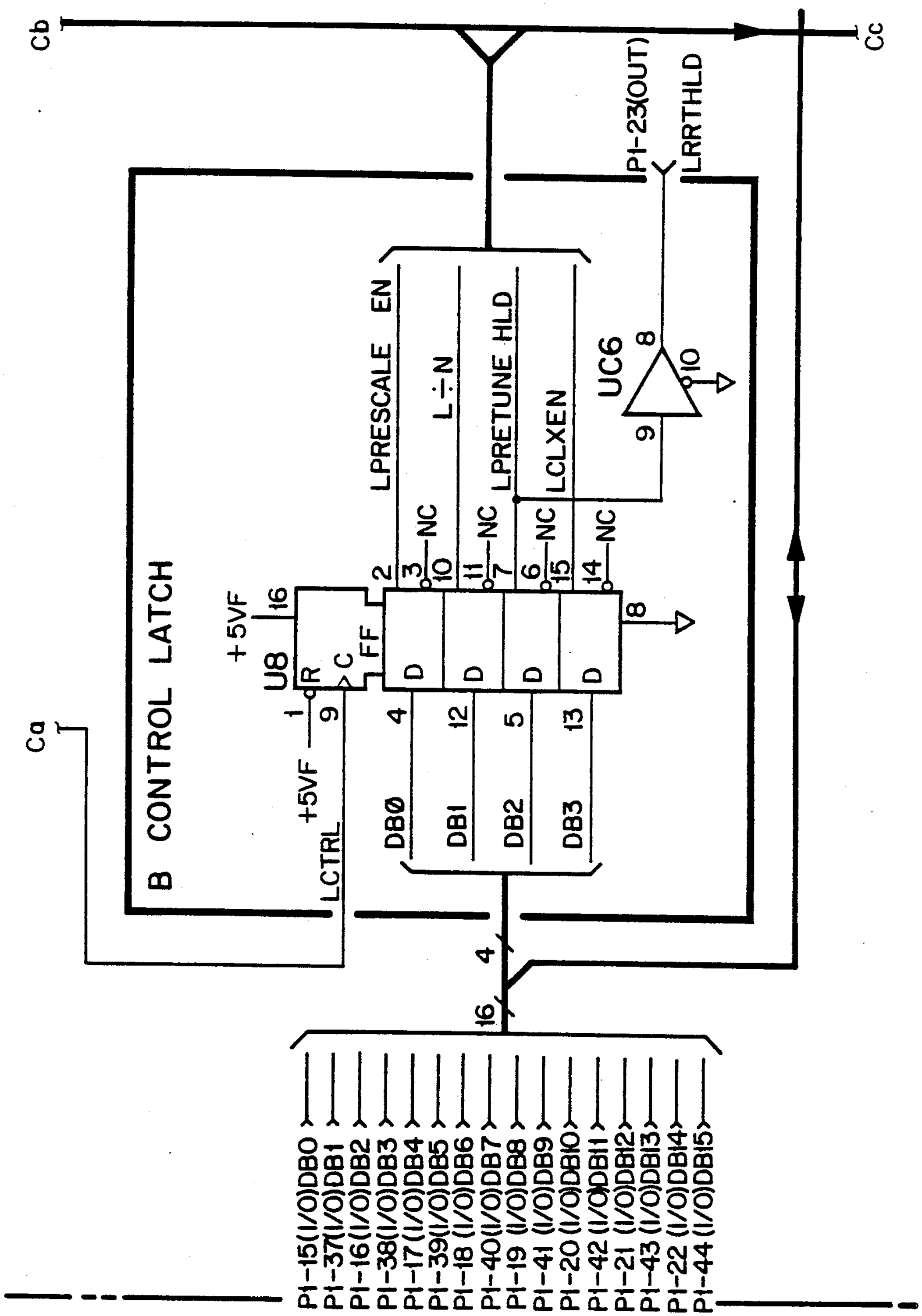
FIG 27.65B

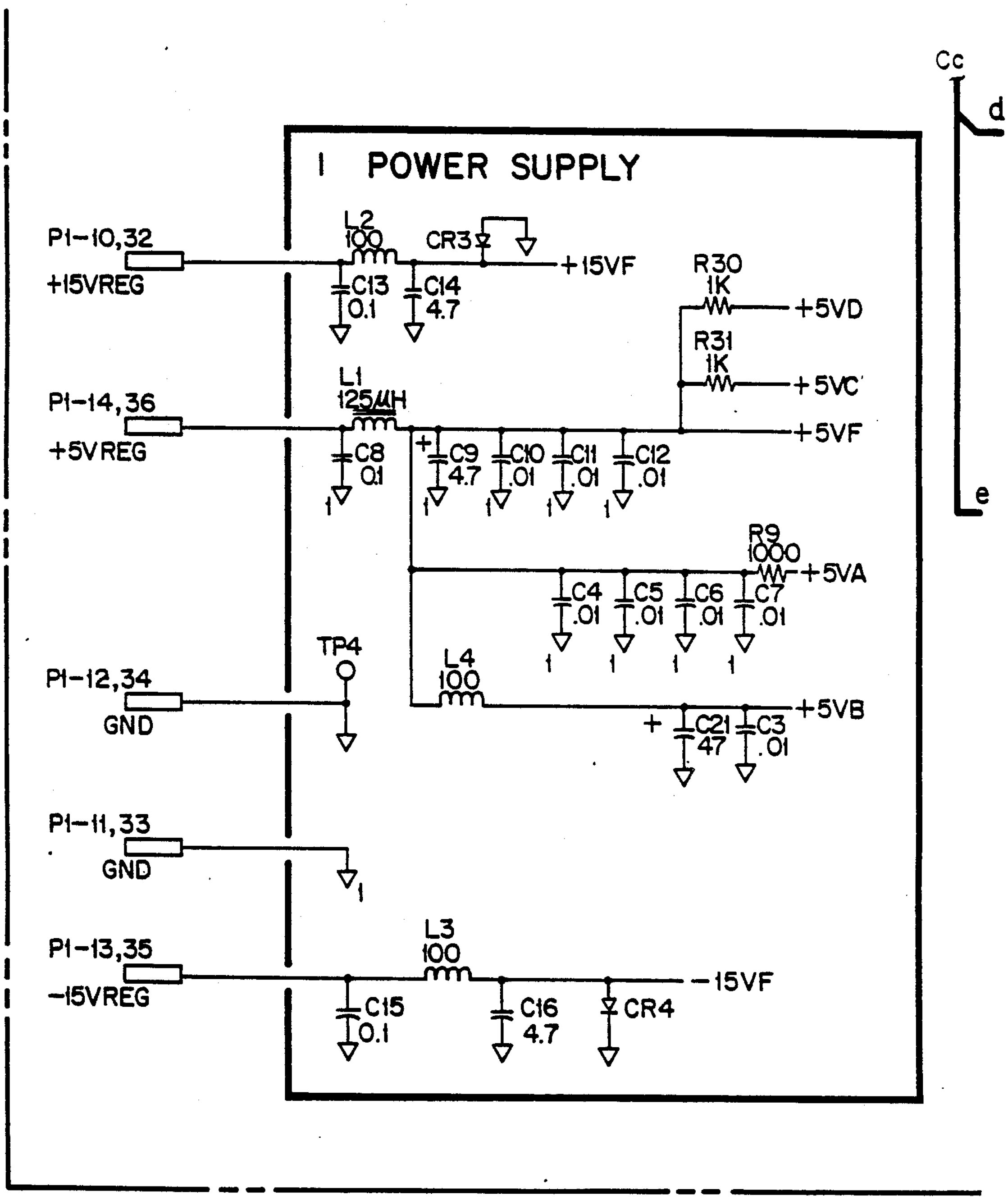
FIG 27.65C

P1

| PIN | SIGNAL | TO/FROM | FUNCTION BLOCK |
|---|---|---|---|
| 1<br>23 | NC<br>LPRTHLD | | <br>B+ |
| 2<br>24 | NC<br>NC | | |
| 3<br>25 | NC<br>NC | | |
| 4<br>26 | NC<br>NC | | |
| 5<br>27 | LLOST<br>LIFSRQ | | |
| 6<br>28 | CLK<br>LRDS | | F<br>G |
| 7<br>29 | LLOST<br>ABO | | +<br>+ |
| 8<br>30 | AB1<br>AB2 | | +<br>+ |
| 9<br>31 | AB3<br>AB4 | | +<br>+ |
| 10<br>32 | +15V REG<br>+15V REG | | B |
| 11<br>33 | GRD<br>GND | | B |
| 12<br>34 | GND<br>GND | | B |
| 13<br>35 | -15V REG<br>-15V REG | | B |
| 14<br>36 | +5V REG<br>+5V REG | | B |
| 15<br>37 | DBO<br>DB1 | | B C<br>B C |
| 16<br>38 | DB2<br>DB3 | | B C<br>B C |
| 17<br>39 | DB4<br>DB5 | | C B<br>C B |
| 18<br>40 | DB6<br>DB7 | | C B<br>C B |
| 19<br>41 | DB8<br>DB9 | | C B<br>C B |
| 20<br>42 | DB10<br>DB11 | | C B<br>C B |
| 21<br>43 | DB12<br>DB13 | | B<br>B |
| 22<br>44 | DB14<br>DB15 | | C B<br>B |
| | | | |

FIG 27.65D

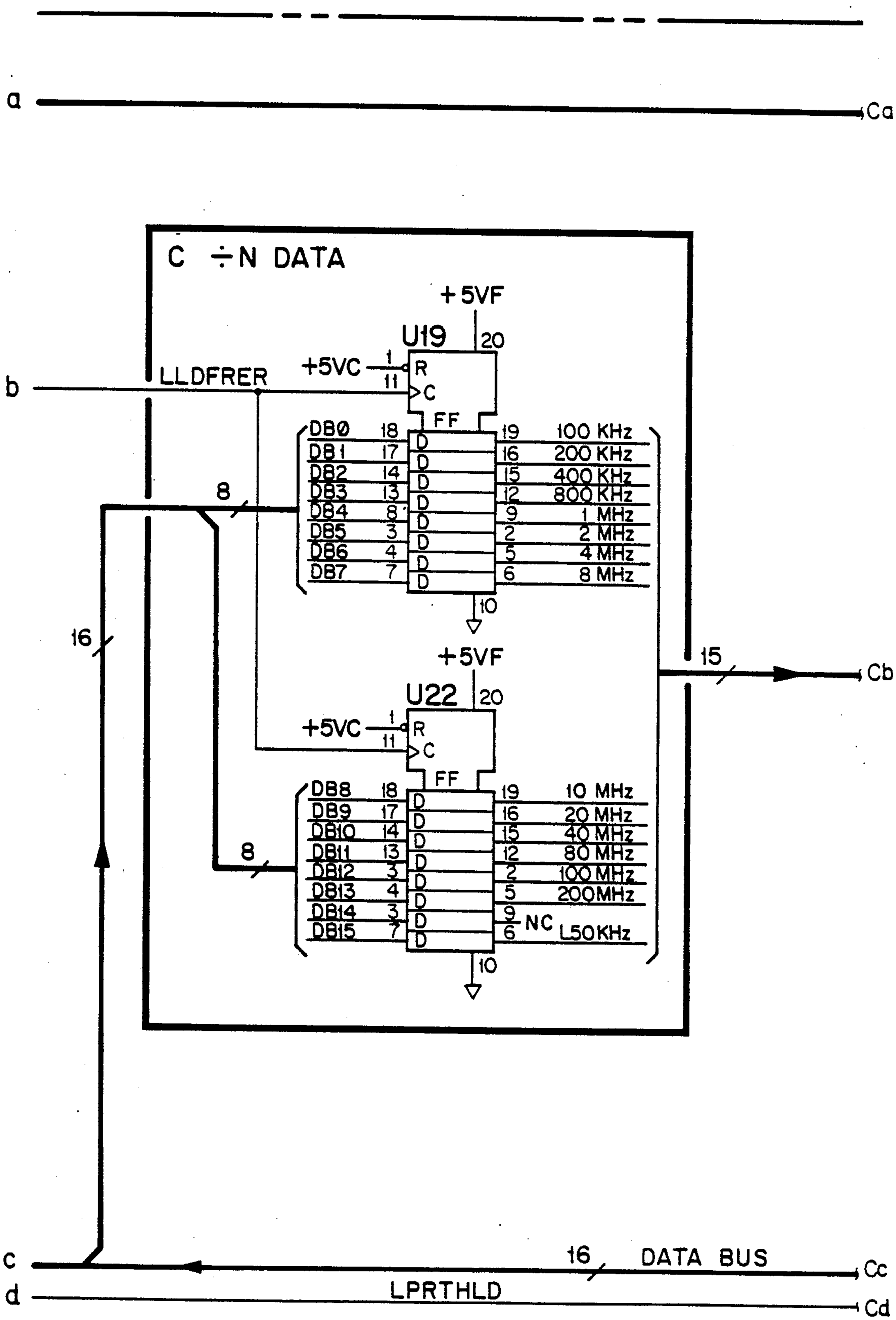
FIG 27.66A

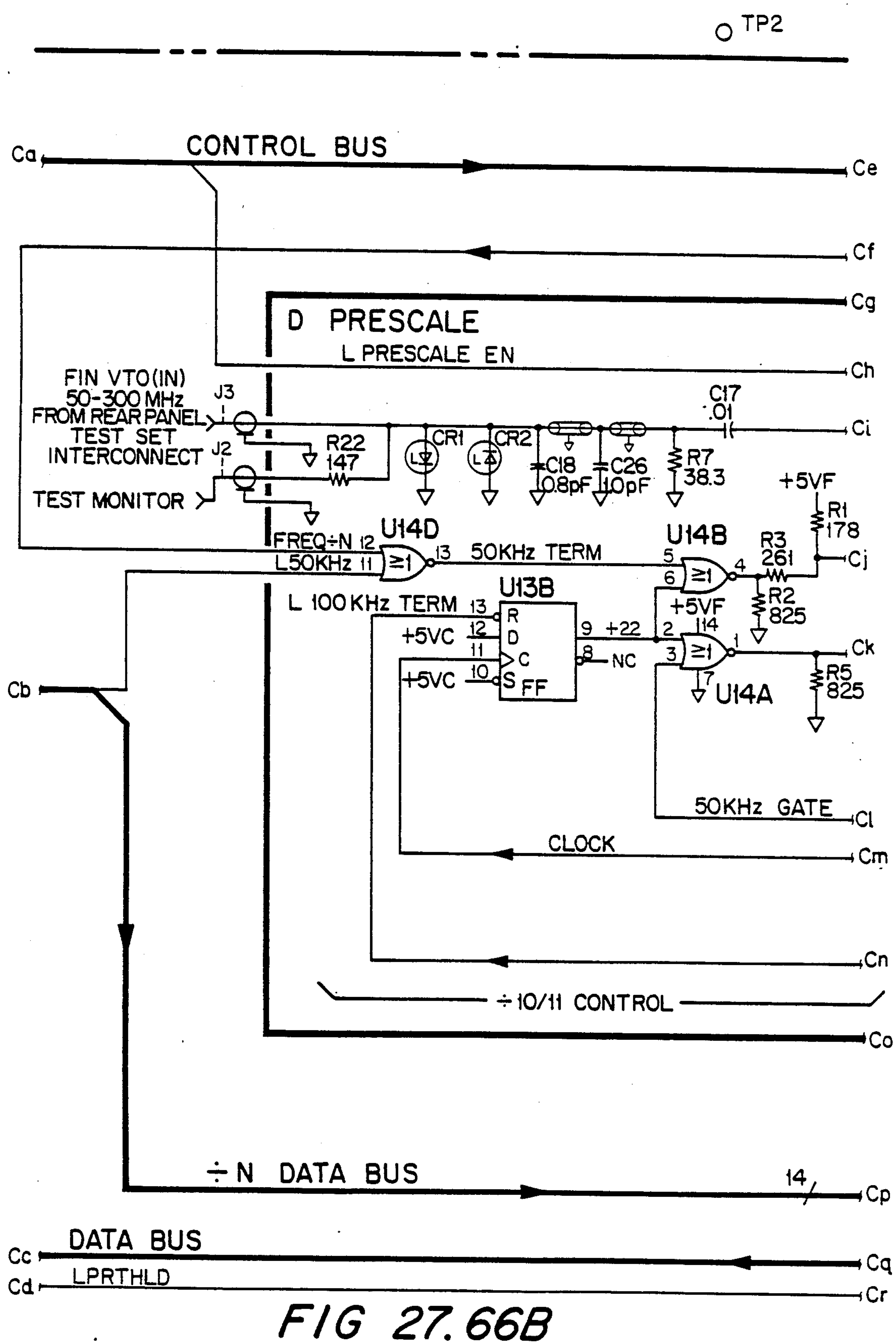
FIG 27.66B

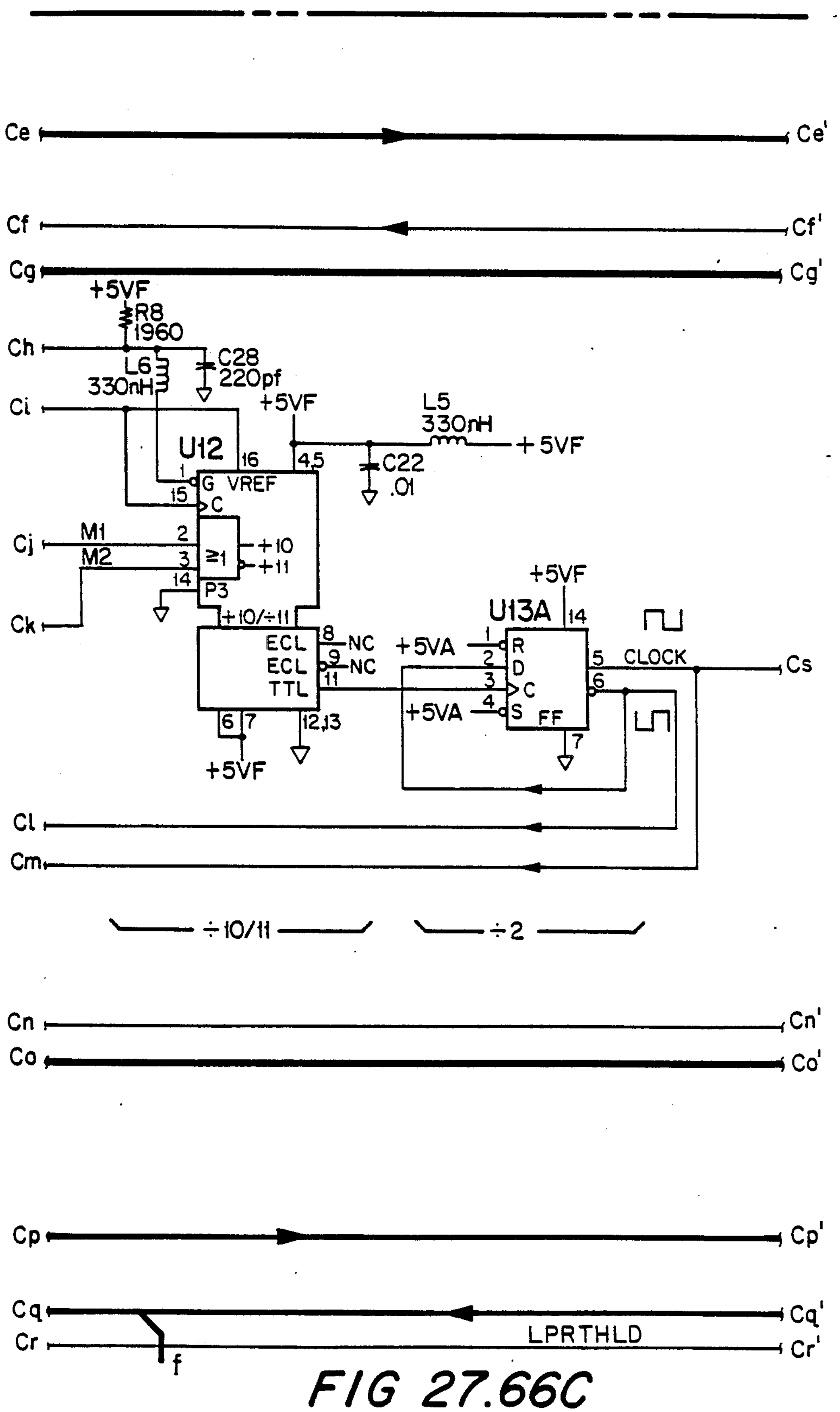
FIG 27.66C

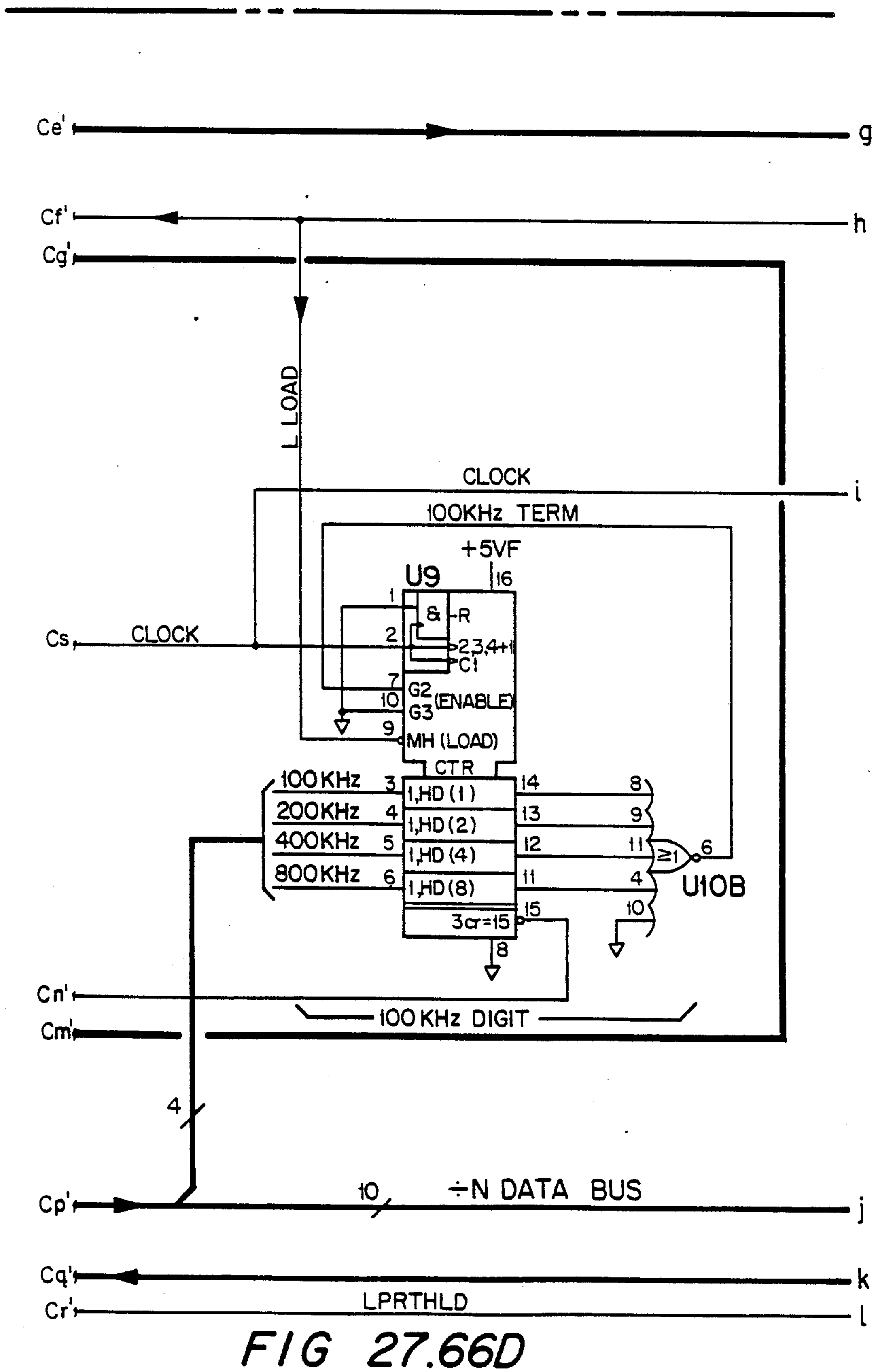
FIG 27.66D

ACTIVE COMPONENTS PARTS LISTS
(U'S AND Q'S)

| REFERENCE DESIGNATORS | PART NUMBER | MANUFACTURERS PART NUMBER |
|---|---|---|
| U1 | 1826-0319 | M10PAMP |
| U2 | 1826-0026 | M1COAMP |
| U3 | 1810-0203 | N-R470 |
| U4 | 1820-1272 | 74LS33 |
| U5 | 1826-0417 | C4-ASW |
| U6 | 1820-1568 | 74LS125 |
| U7,16 | 1820-1112 | 74LS74 |
| U8 | 1820-1195 | 74LS175 |
| U9 | 1820-1434 | 74LS668 |
| U10 | 1820-1275 | 74S260 |
| U11,13 | 1820-0693 | 74S74 |
| U12 | 1820-1780 | 1C11090 |
| U14 | 1820-1322 | 74S020 |
| U15 | 1820-1147 | 74LS00 |
| U17 | 1820-1443 | 74LS293 |
| U18 | 1820-1216 | 74LS138 |
| U19 | 1820-1730 | 74LS273 |
| U20,21,23 | 1820-1013 | 25LS2568 |

FIG 27.67A

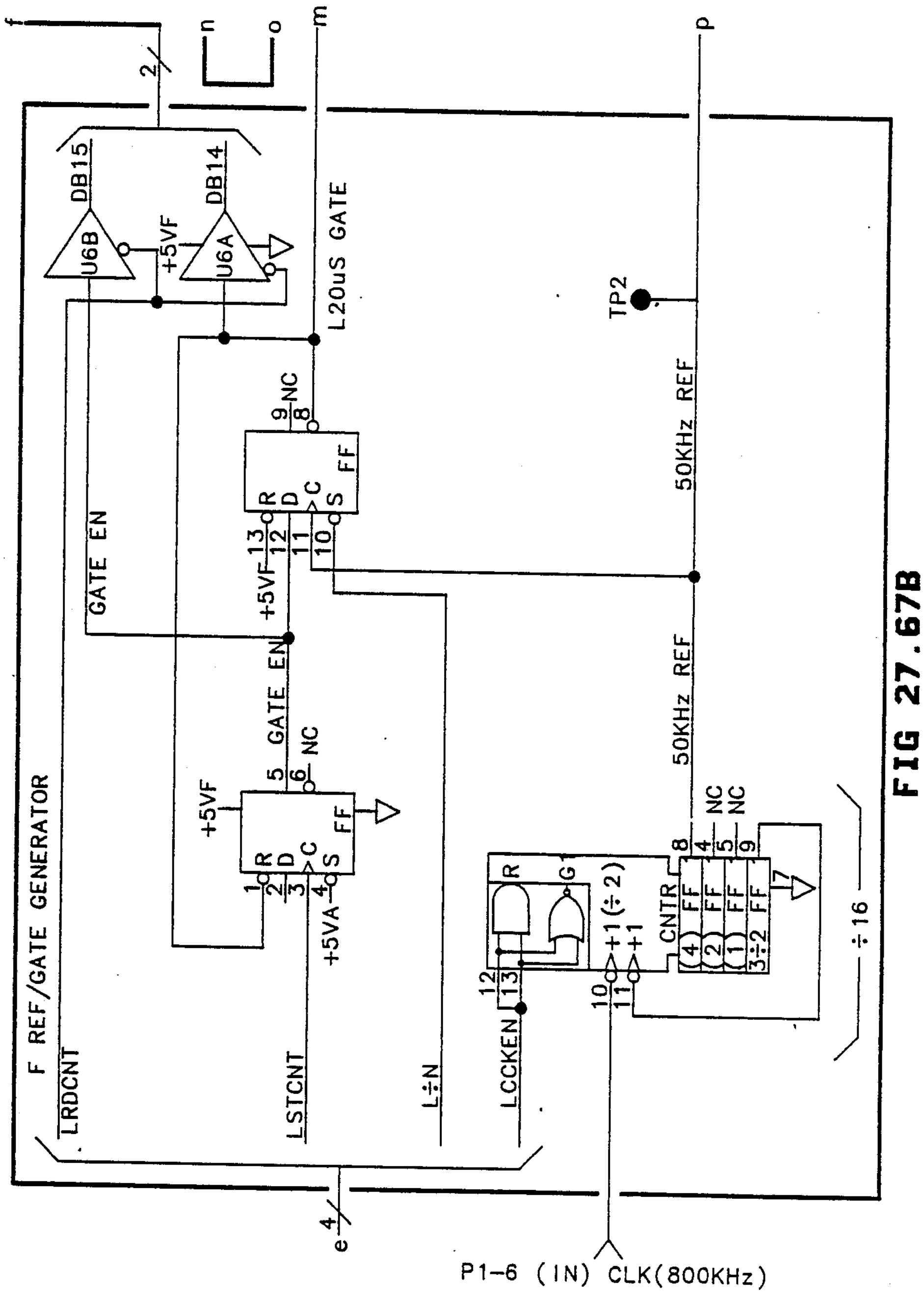
FIG 27.67B

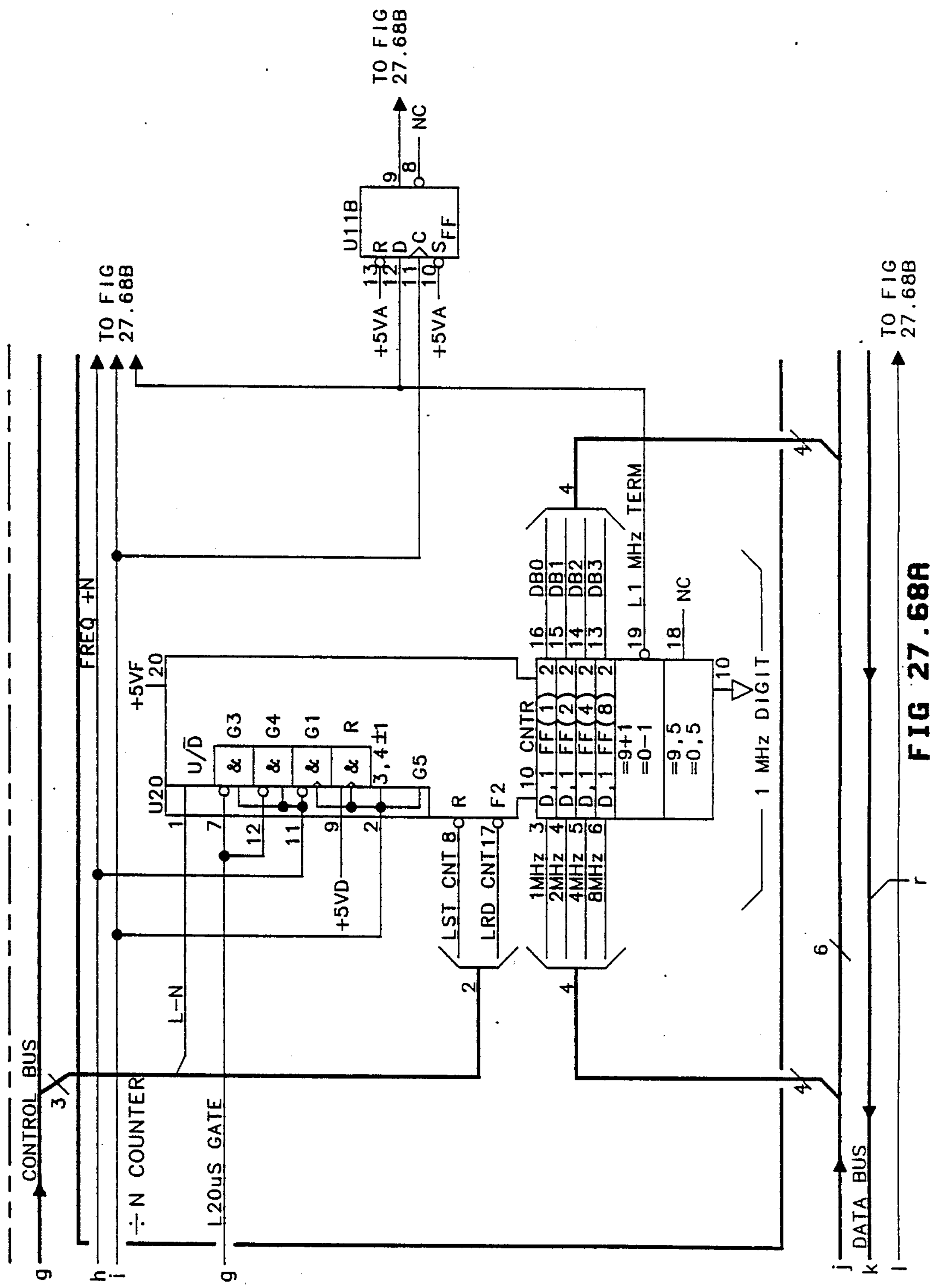
FIG 27.68A

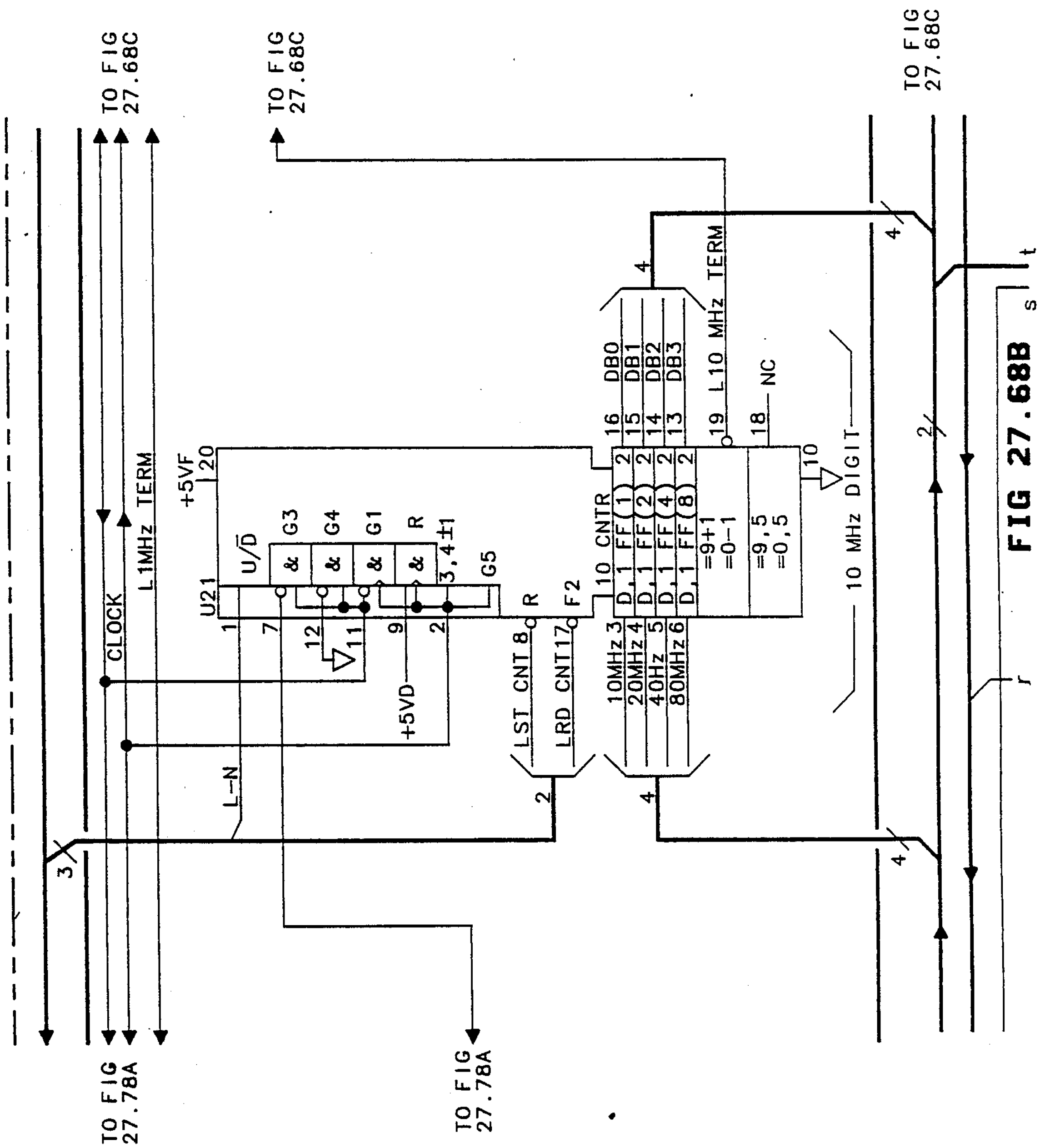
FIG 27.68B

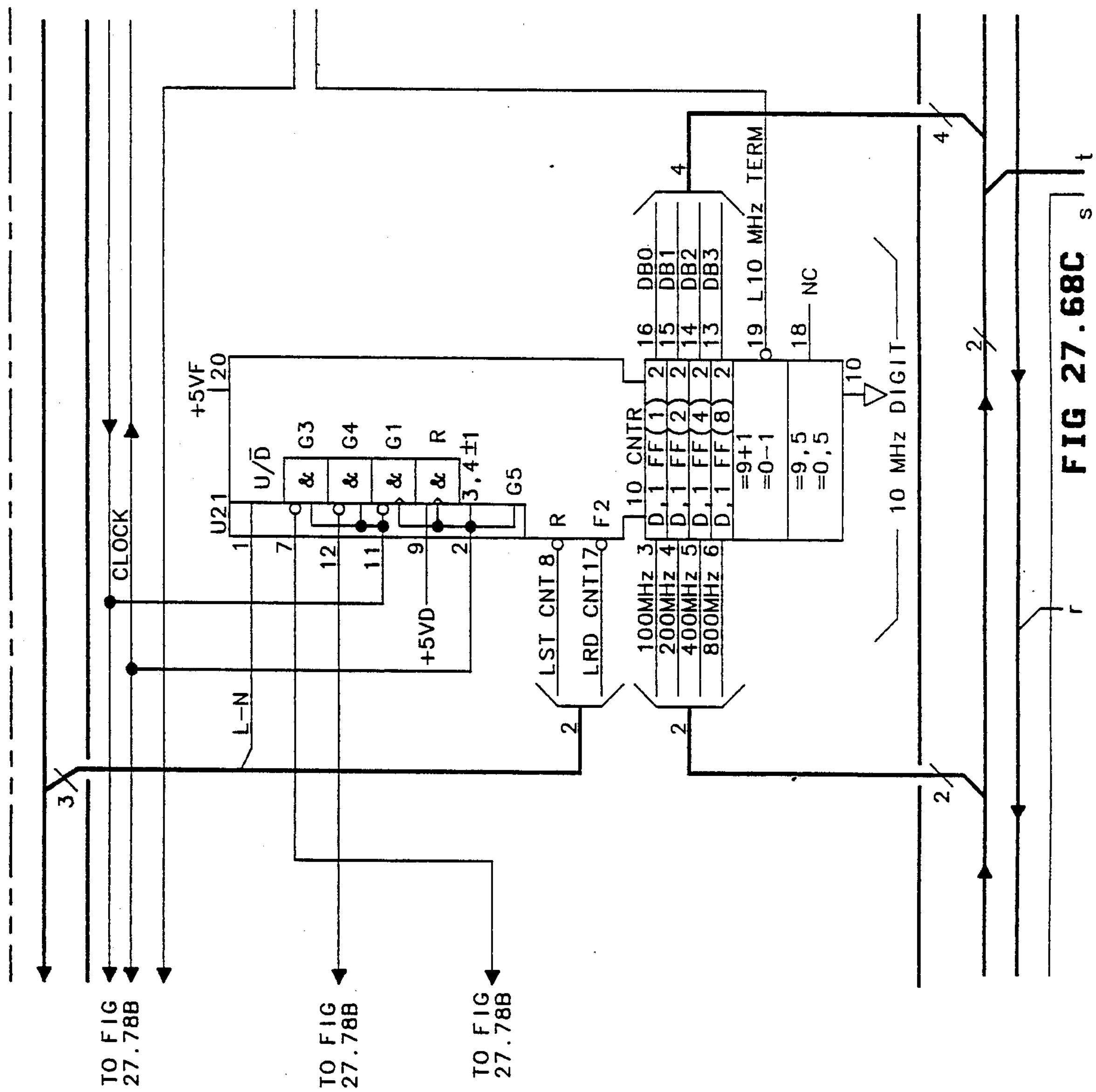
FIG 27.68C

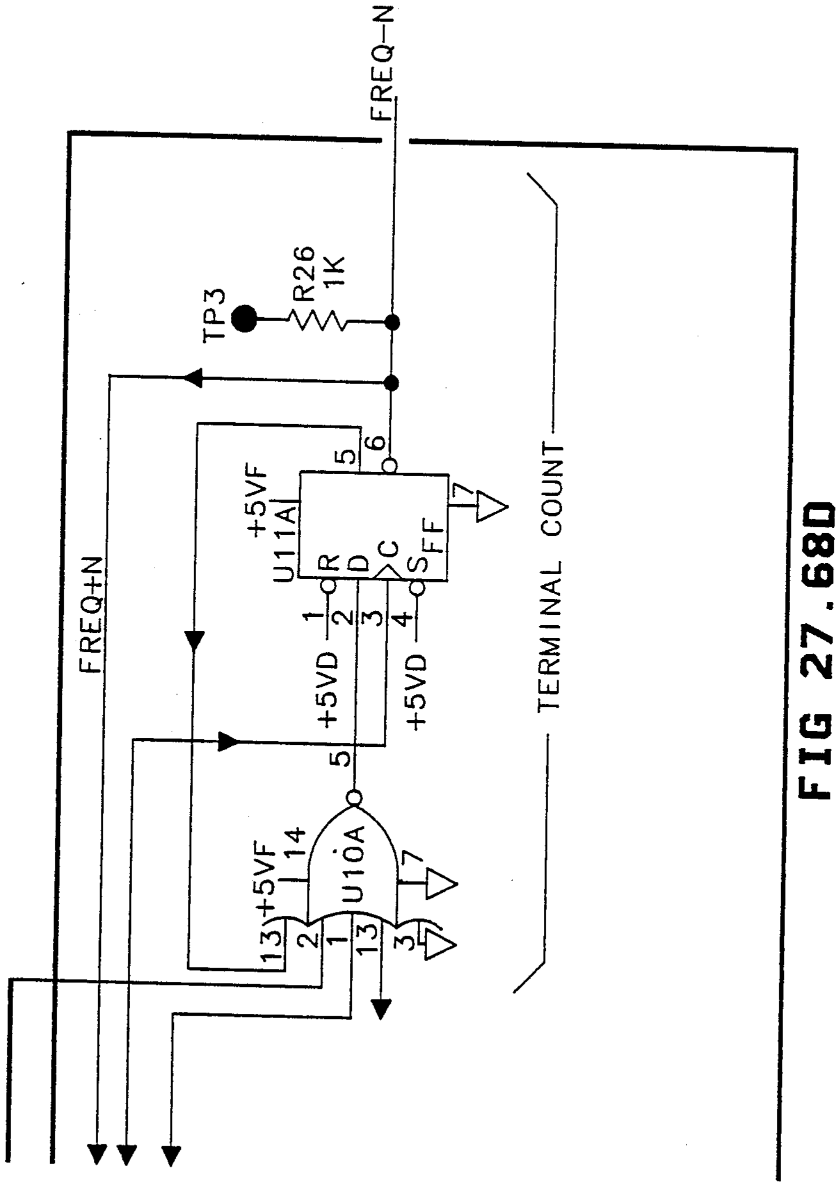
FIG 27.68D

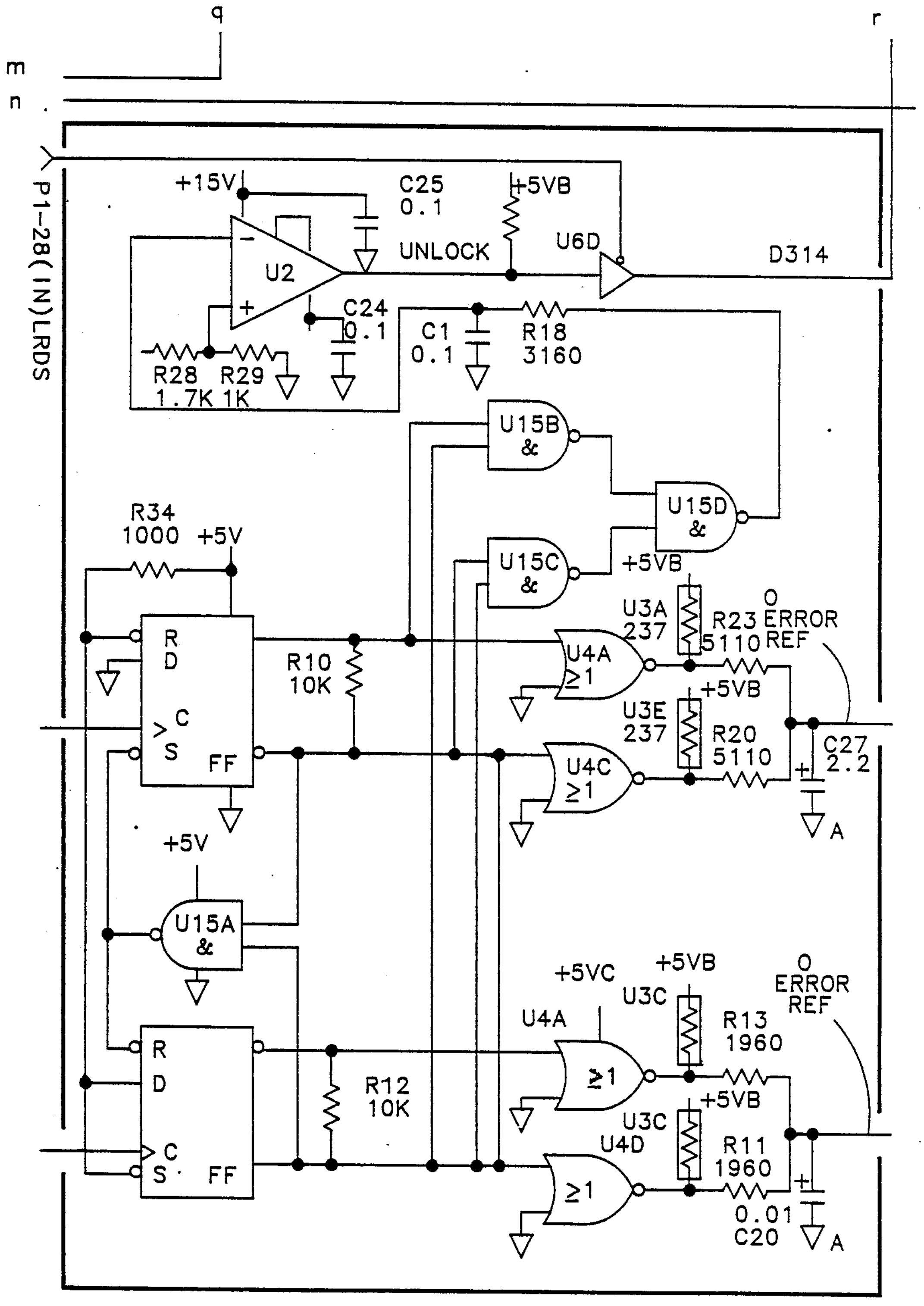
FIG 27.69A

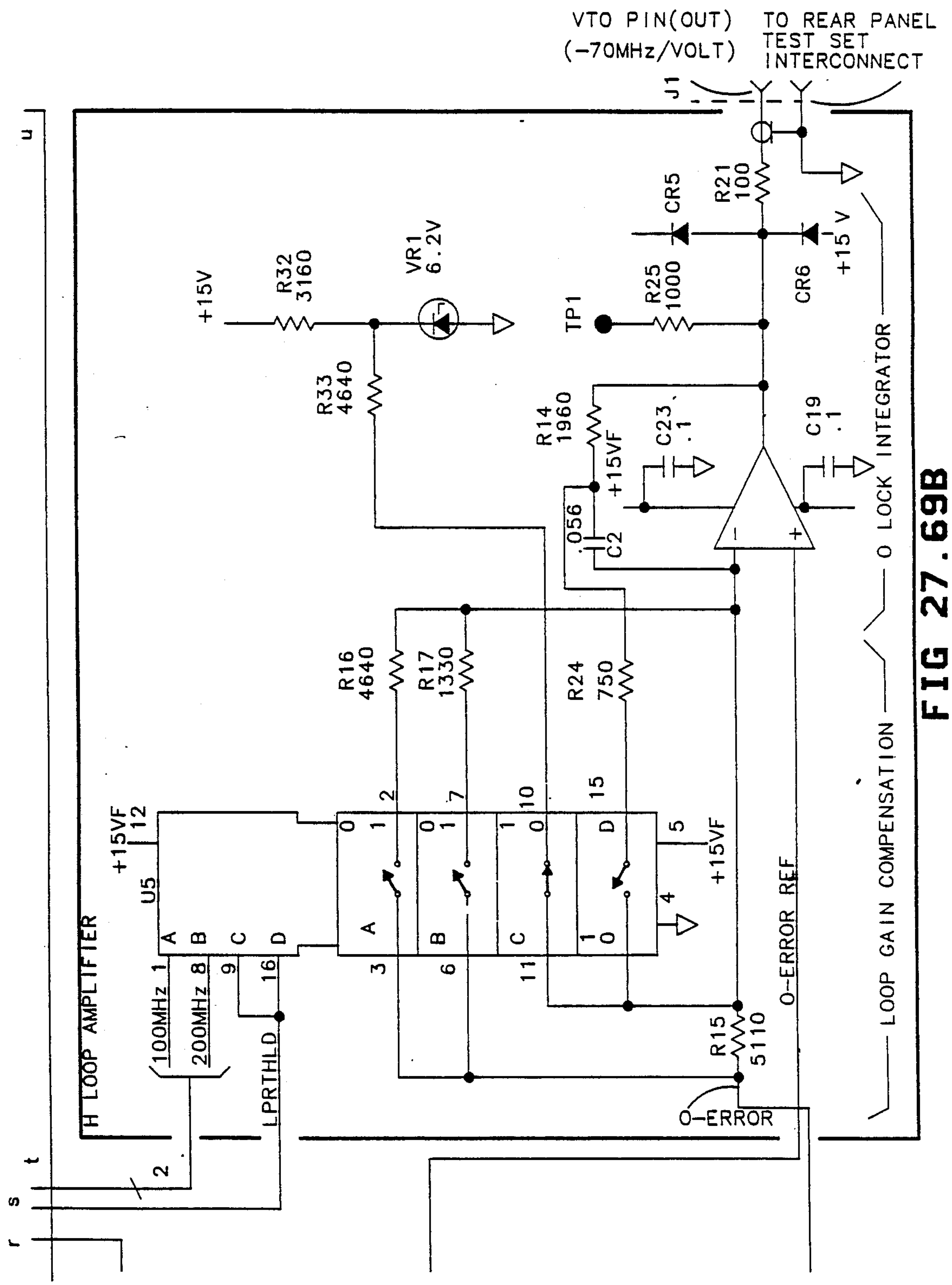
FIG 27.69B

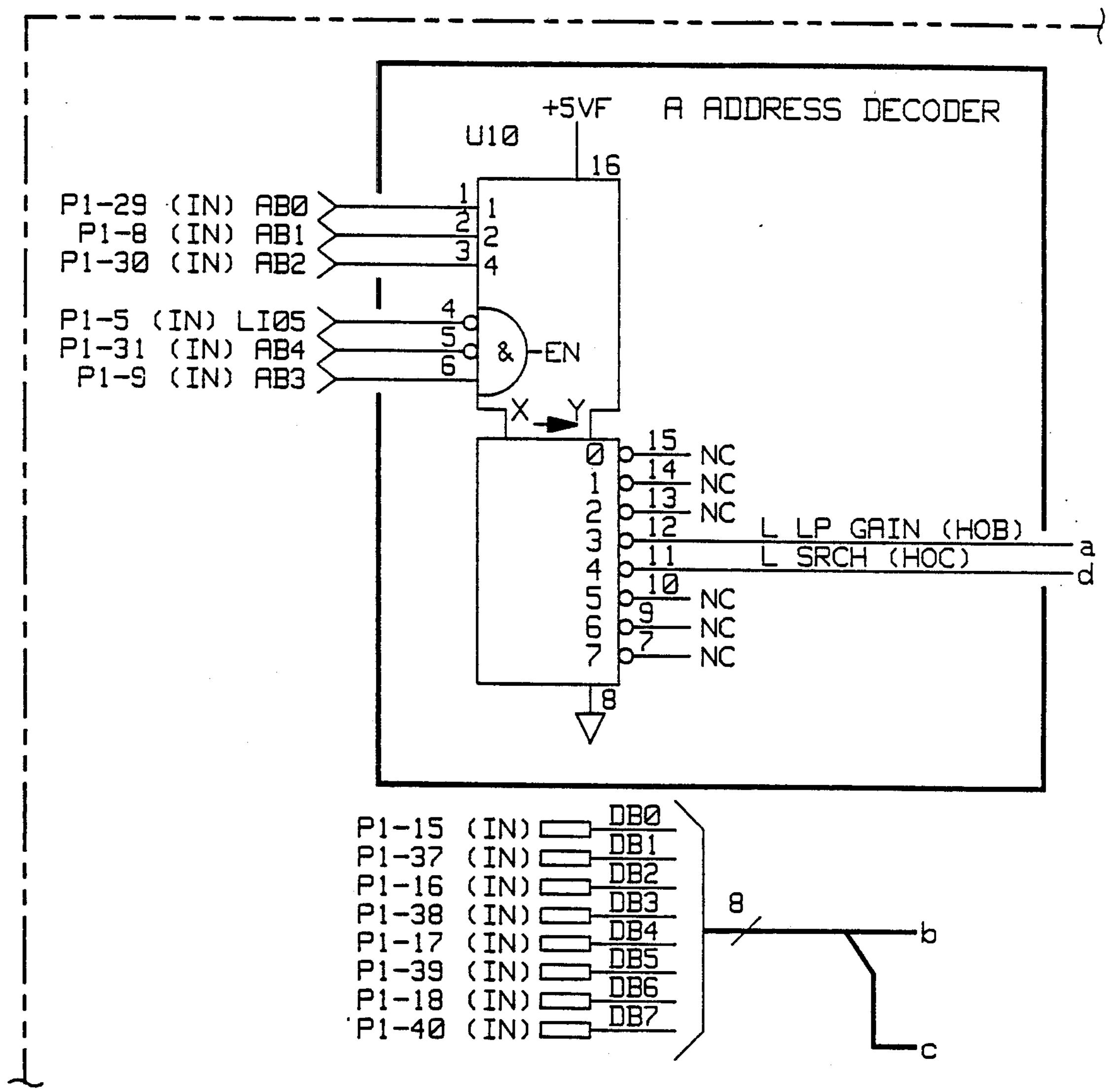
FIG 27.71A

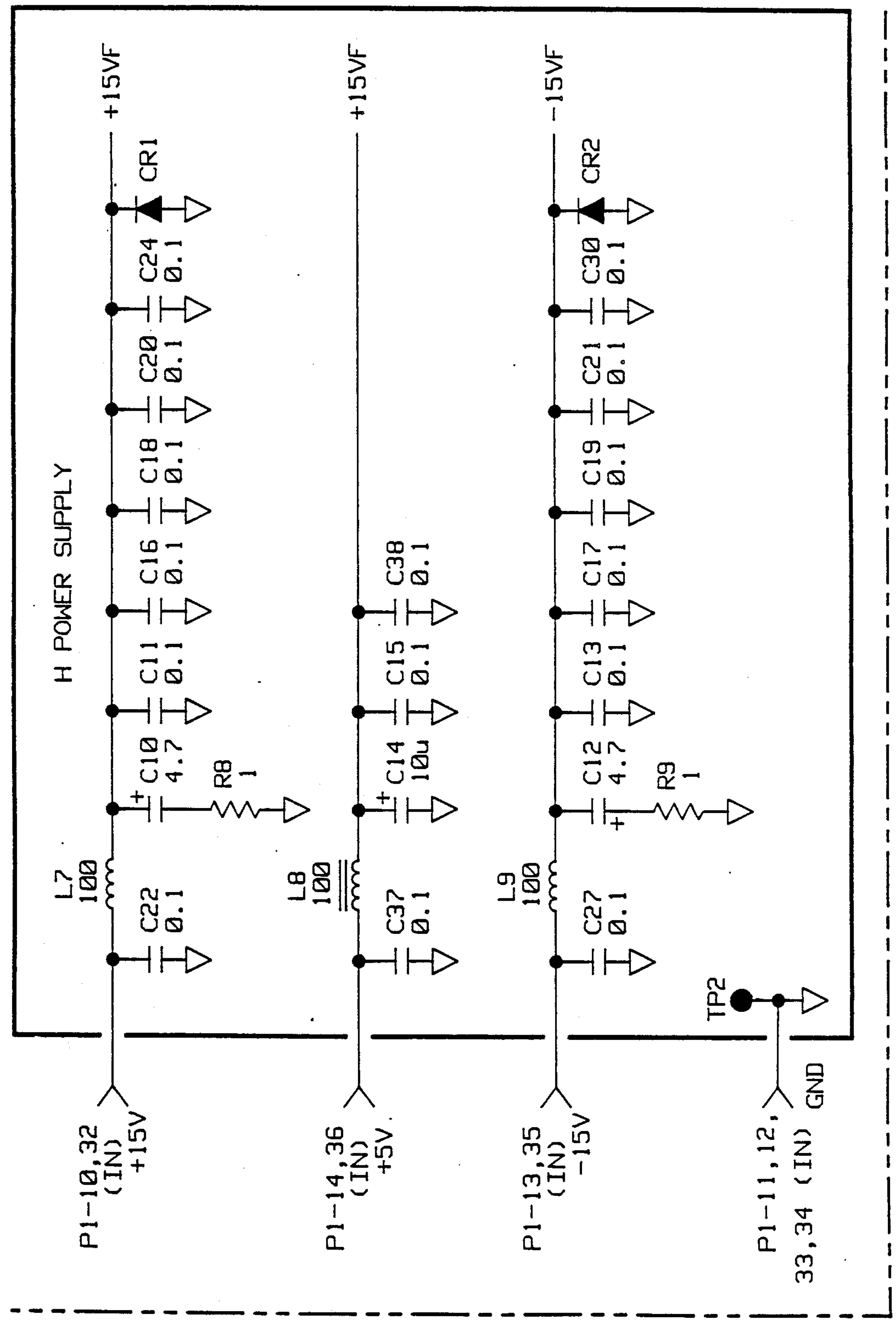
FIG 27.71B

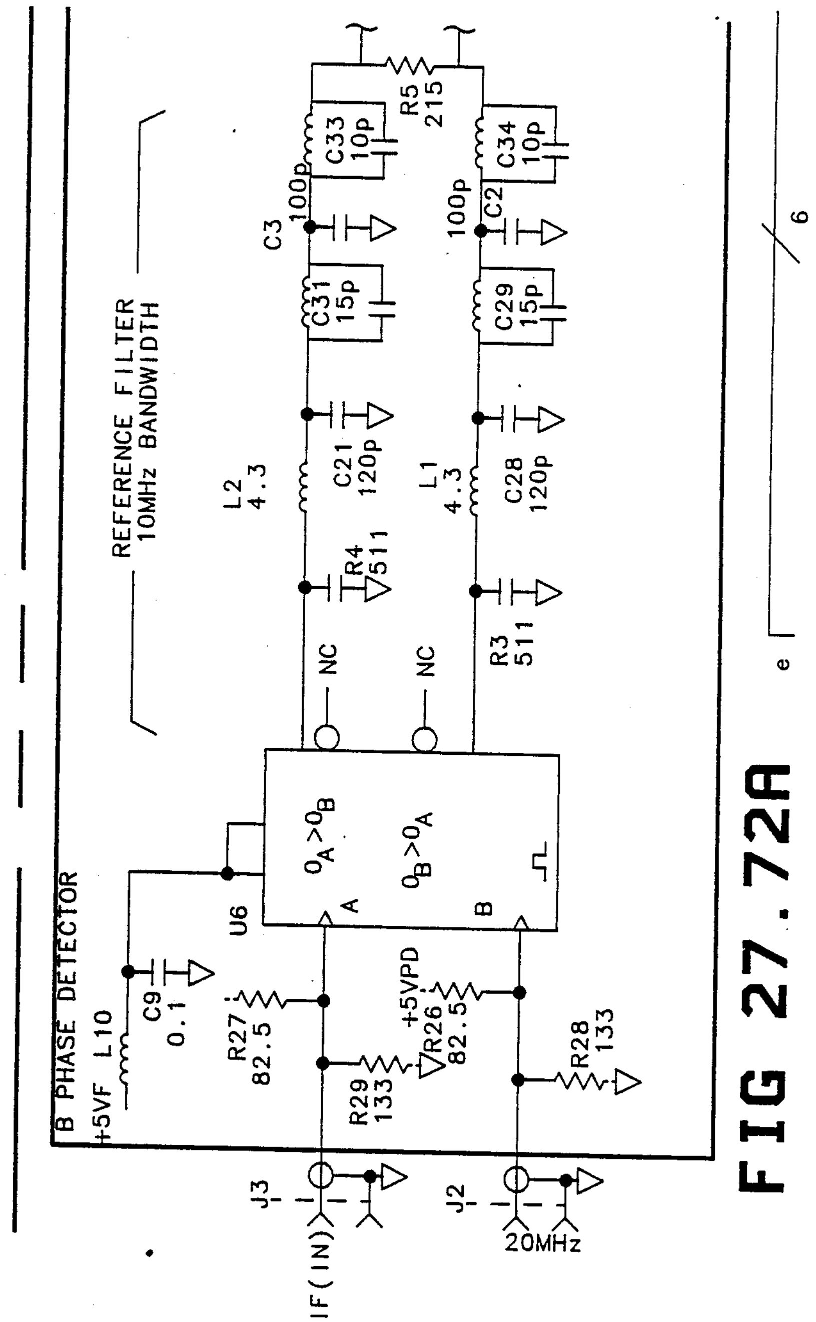
FIG 27.72A

FIG 27.72B
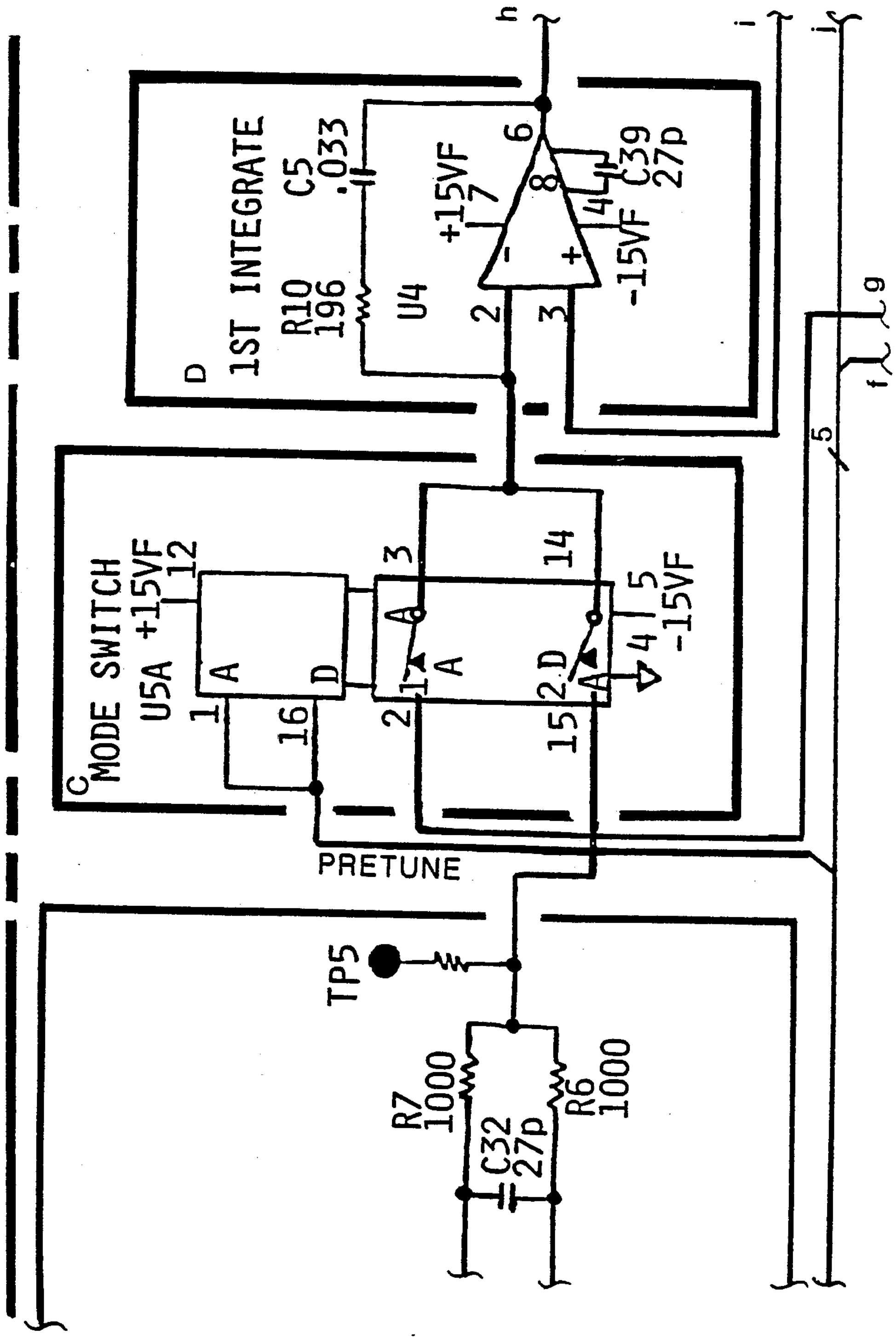

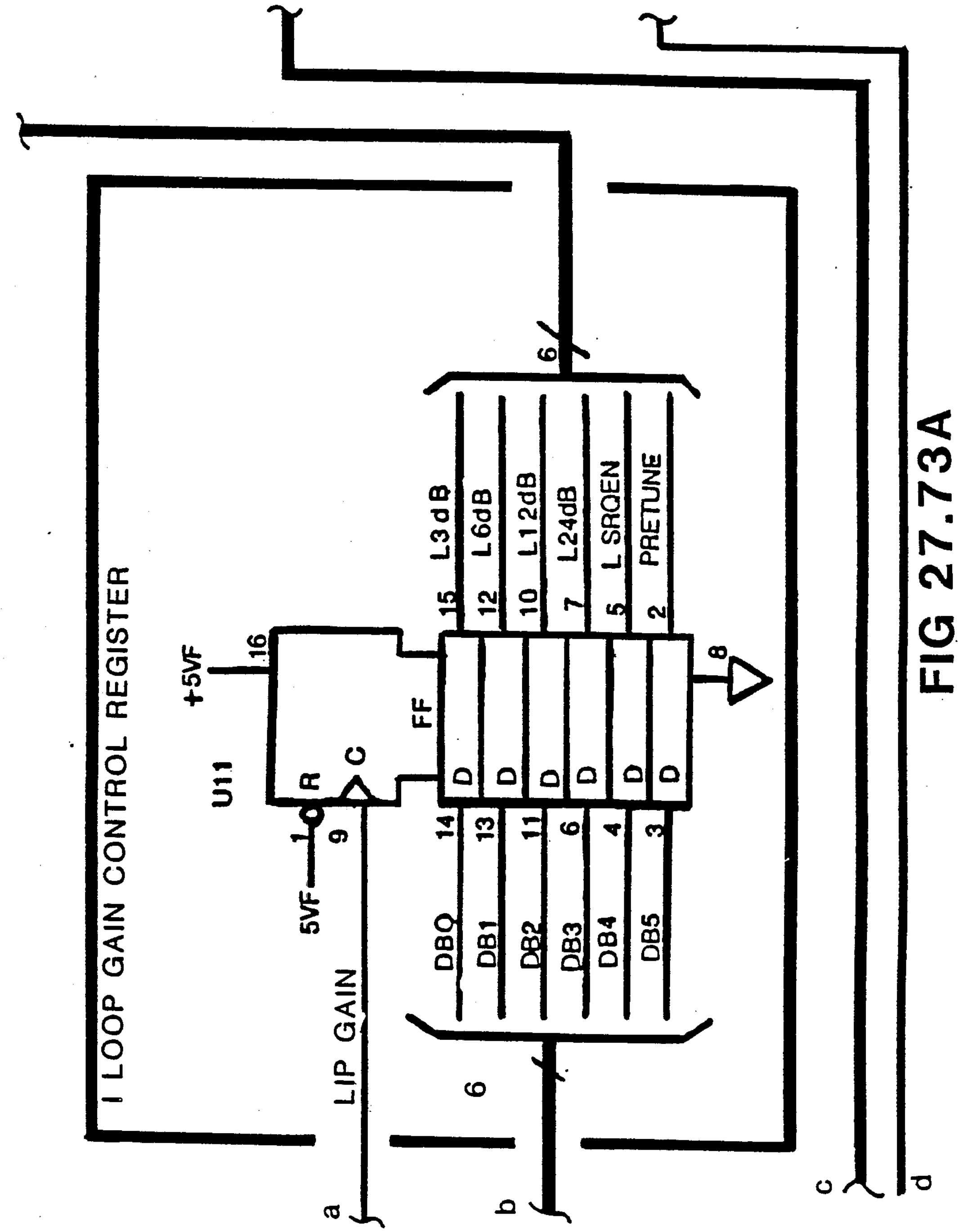
FIG 27.73A

FIG 27.73B
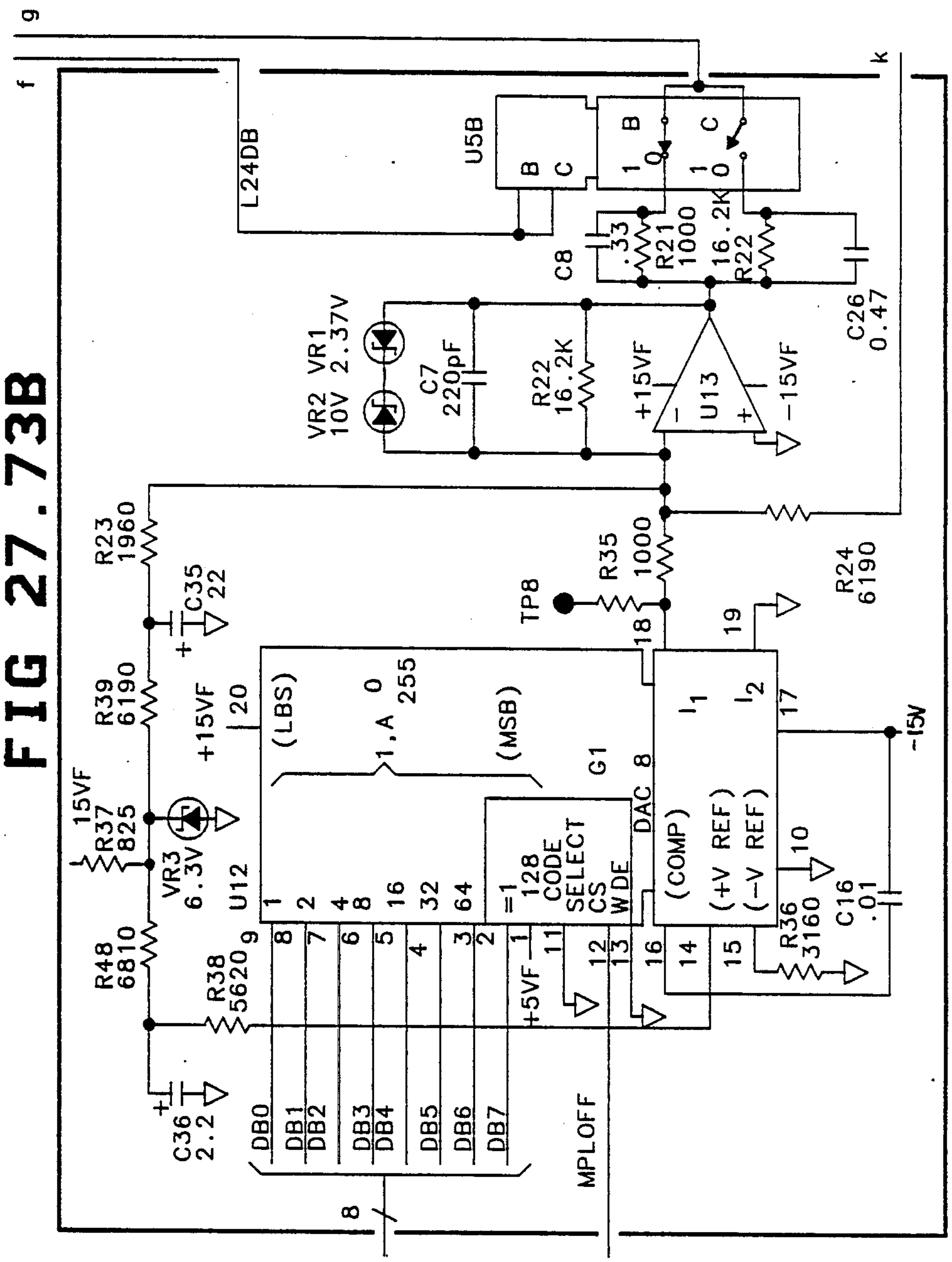

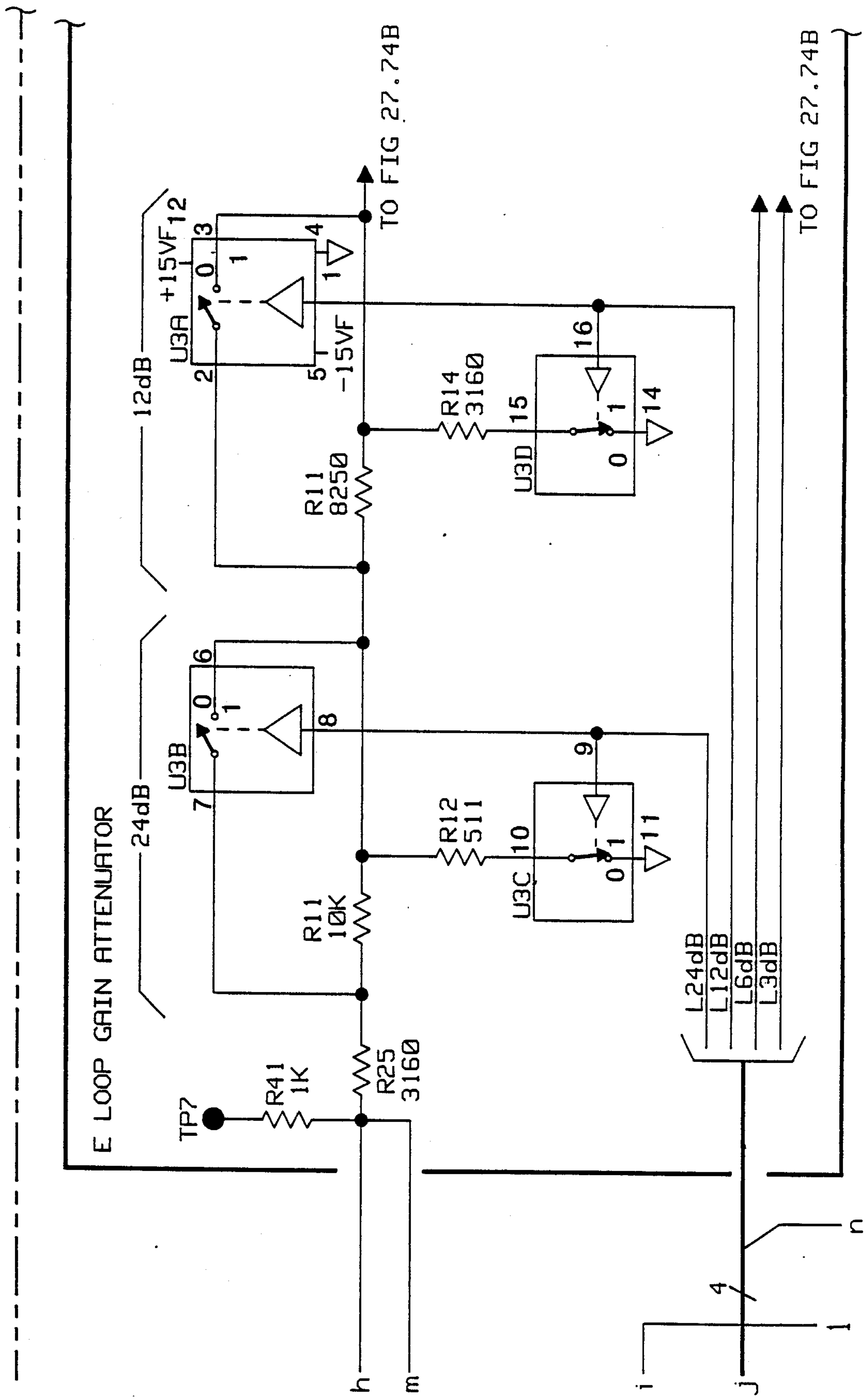
FIG 27.74A

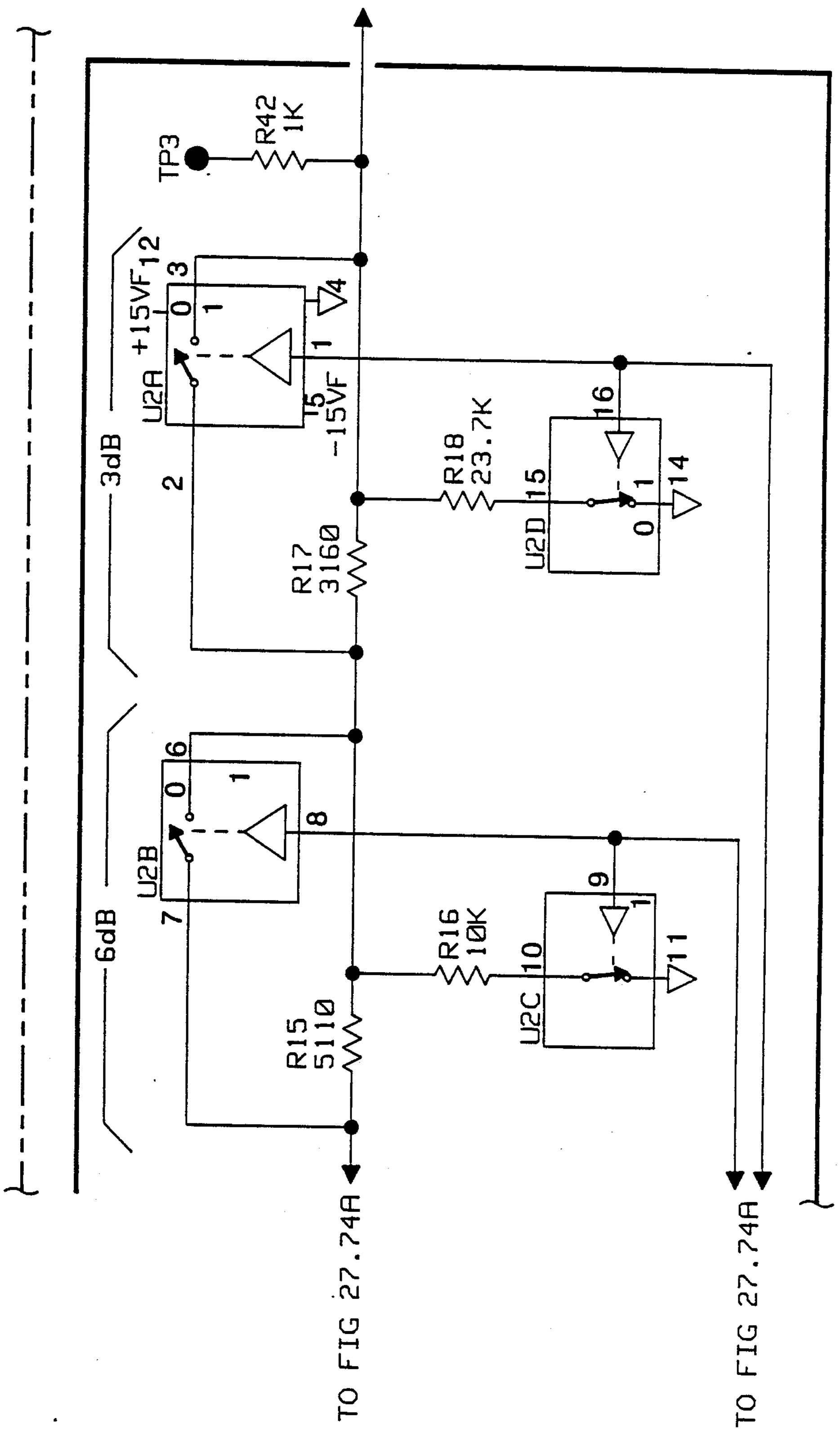
FIG 27.74B

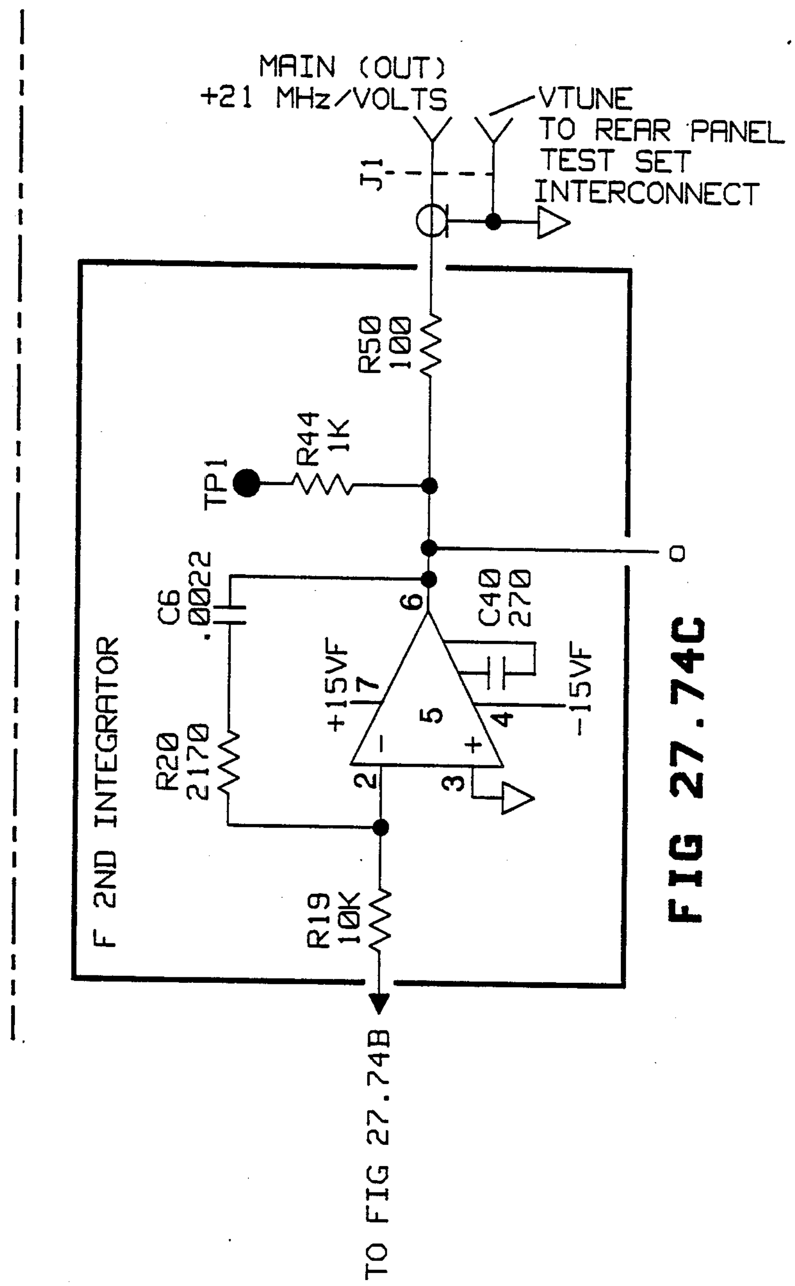
FIG 27.74C

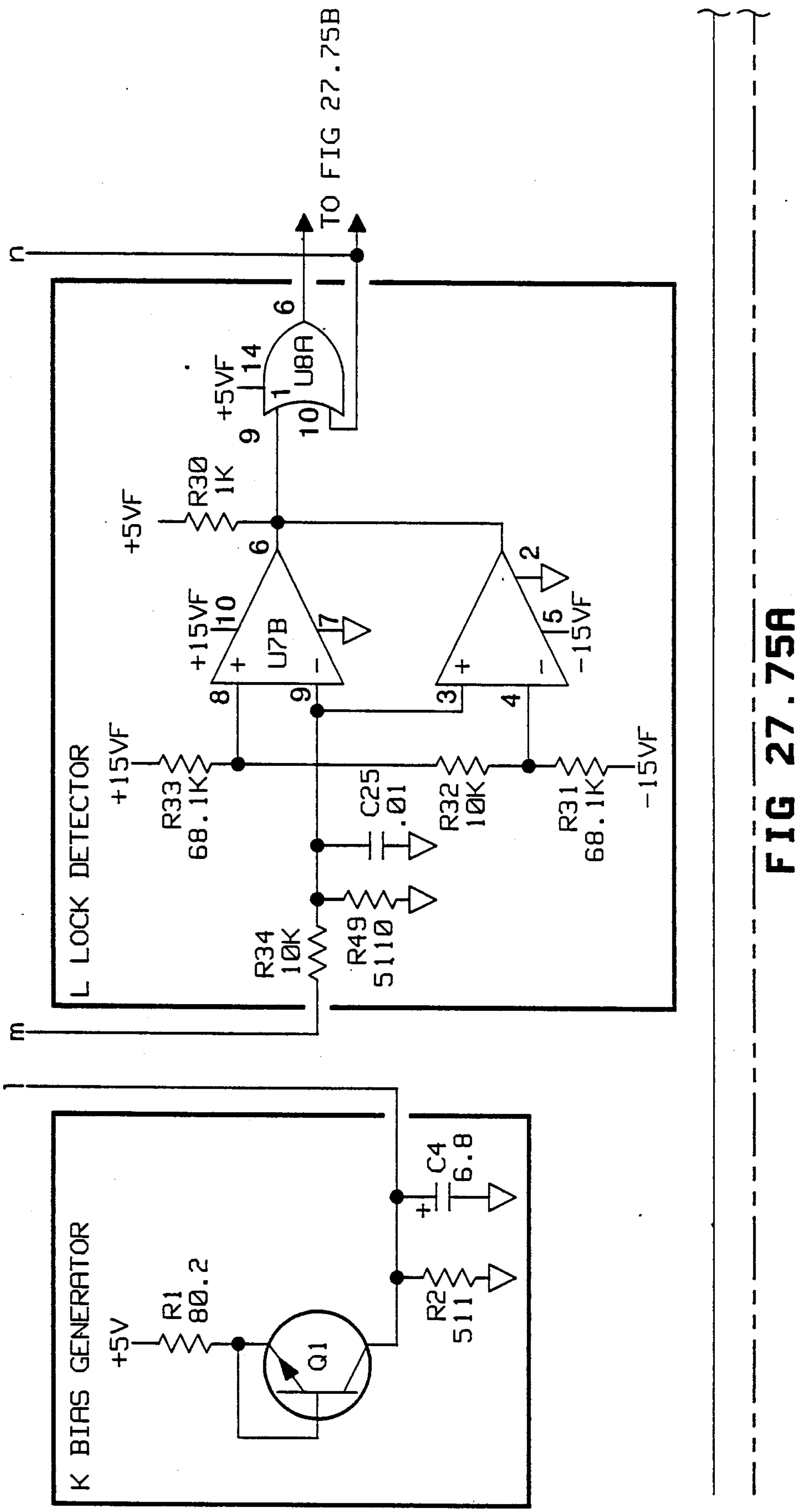
FIG 27.75A

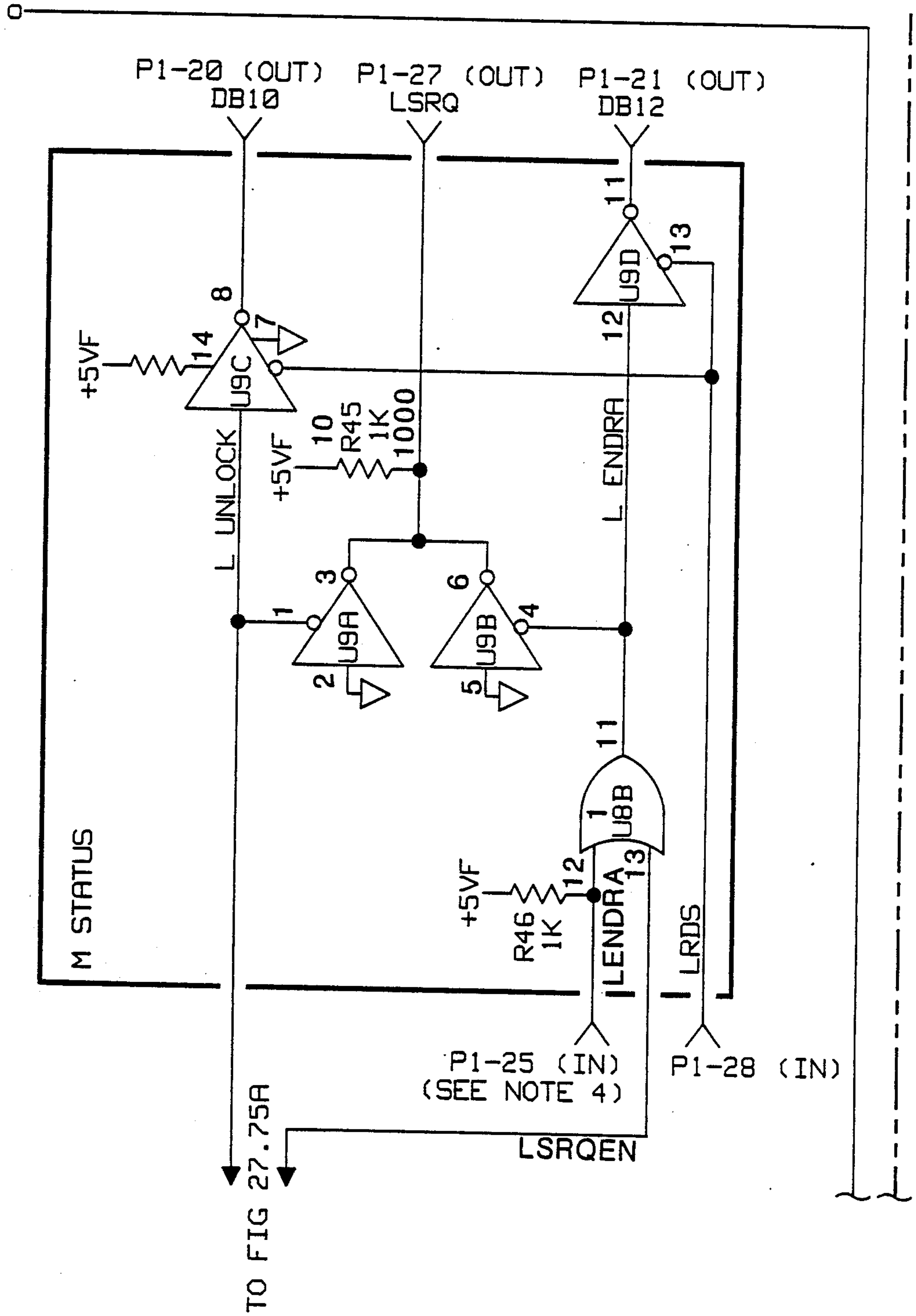
FIG 27.75B

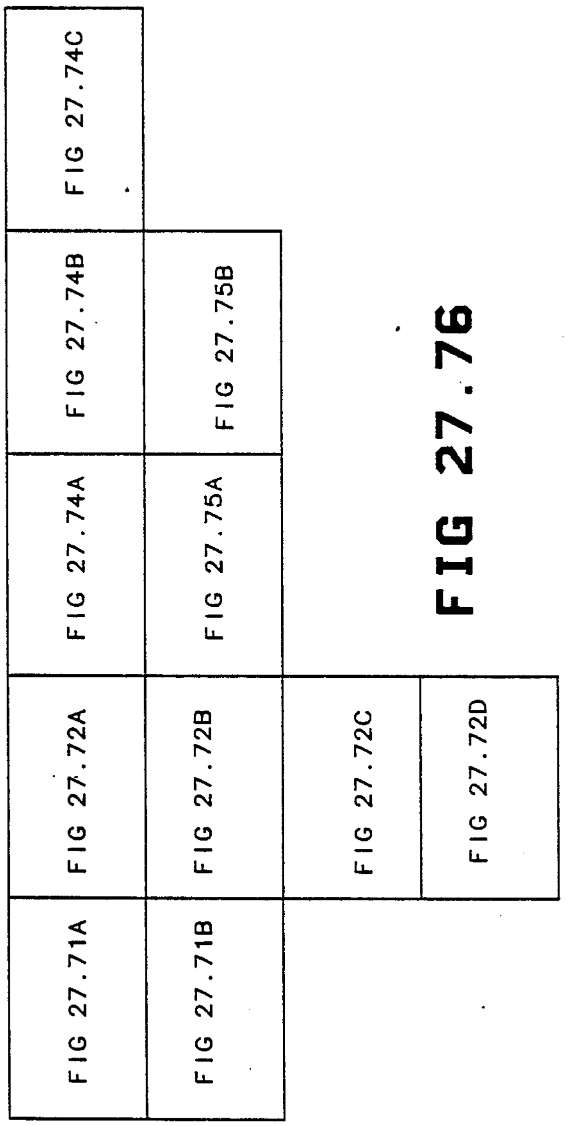
FIG 27.76
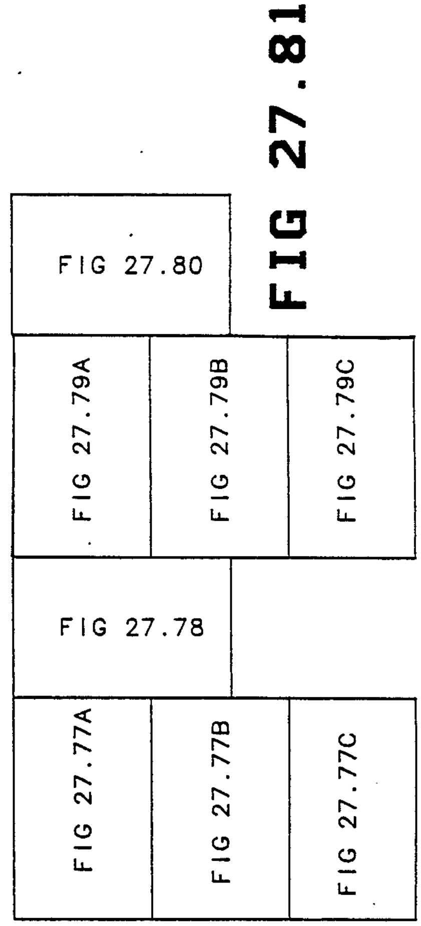
FIG 27.81

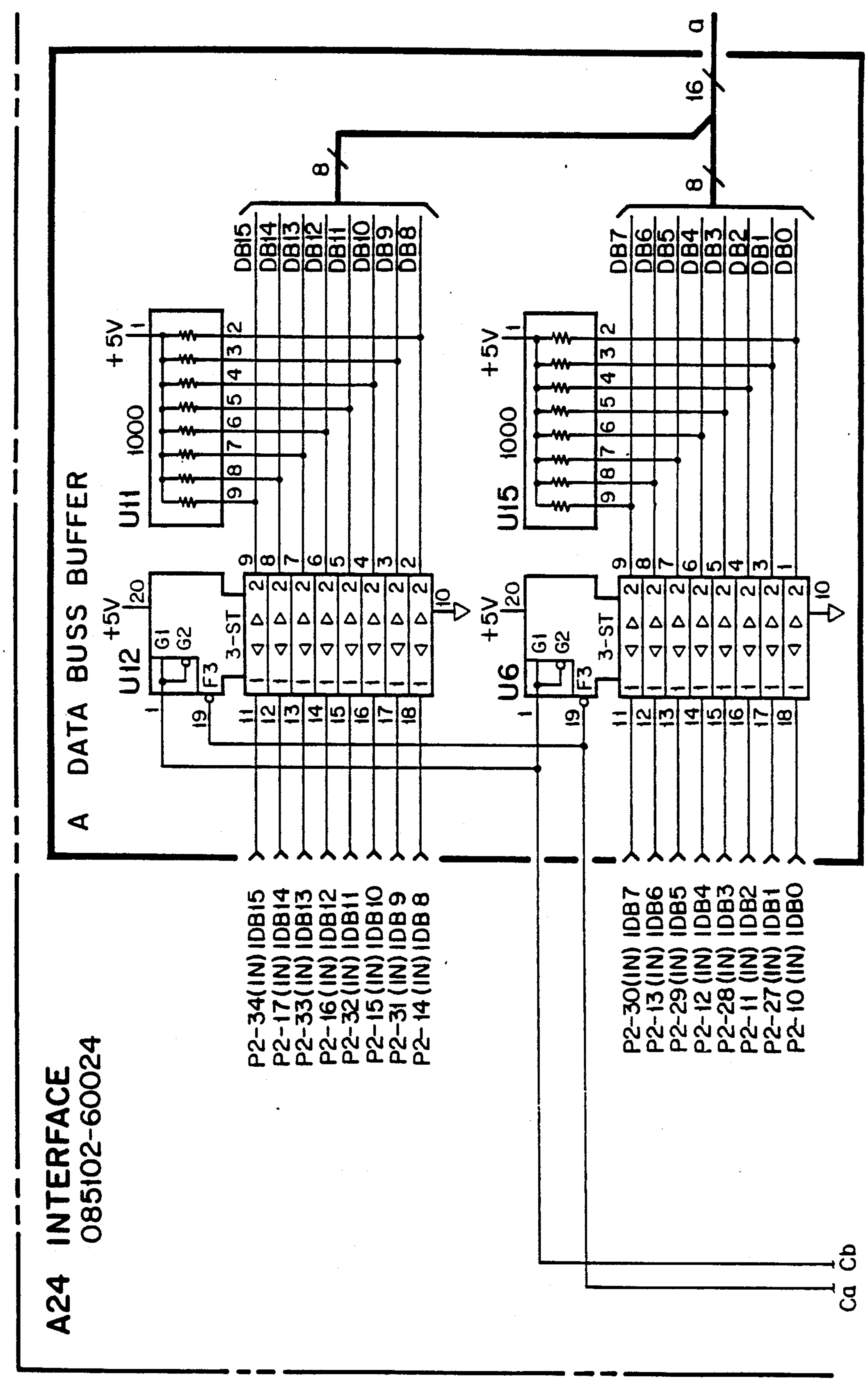
FIG 27.77A

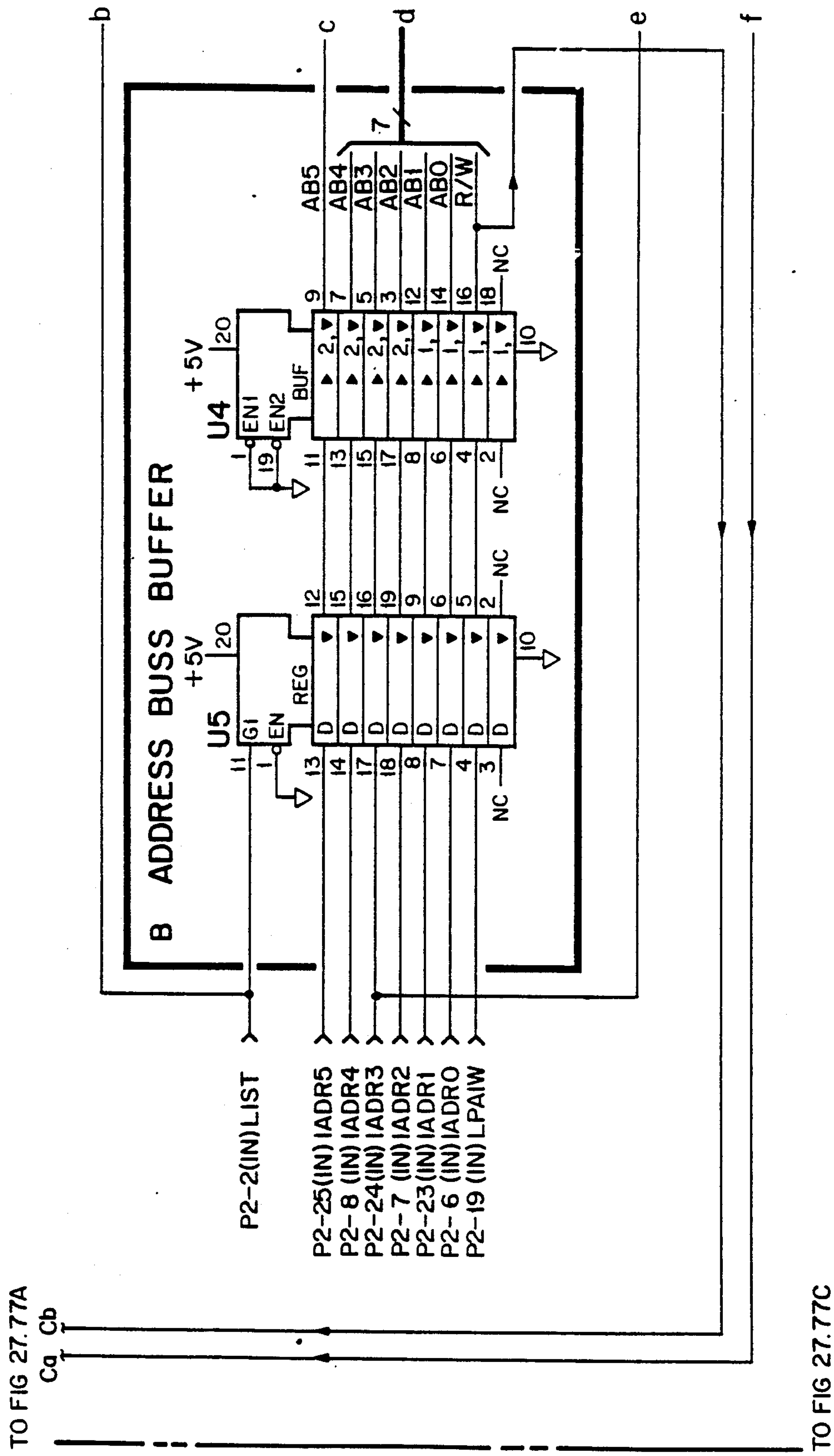
FIG 27.77B

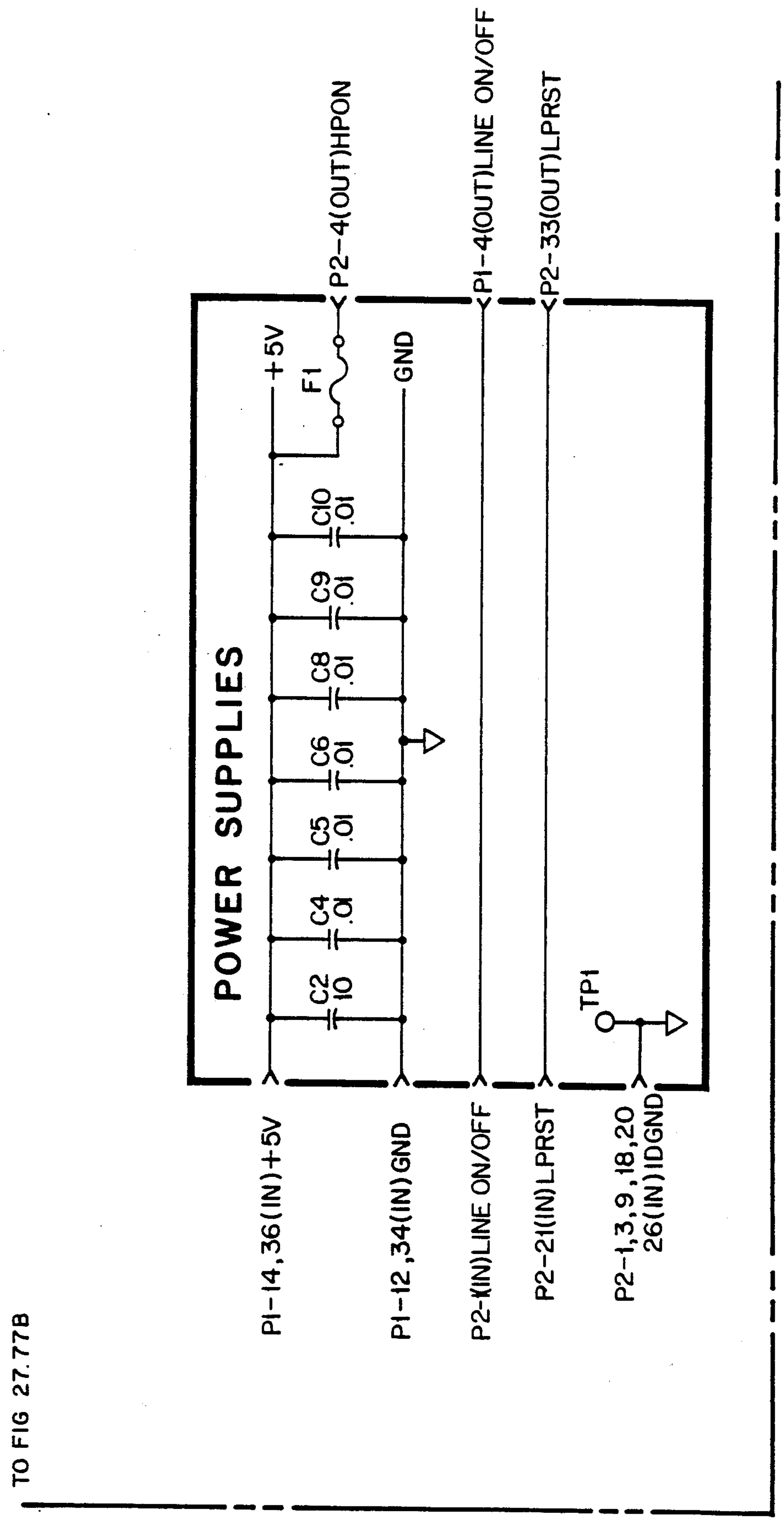
FIG 27.77C

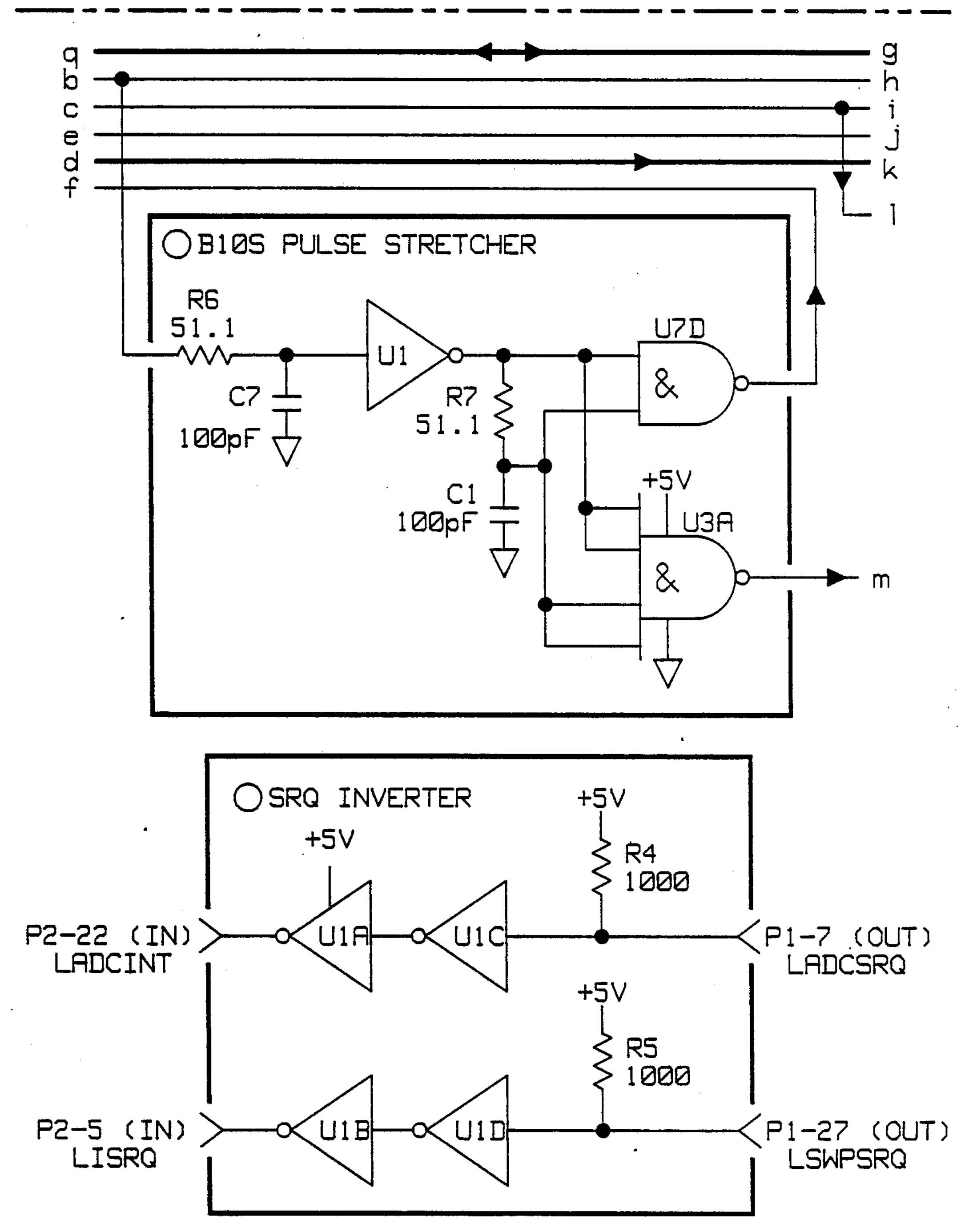
FIG 27.78

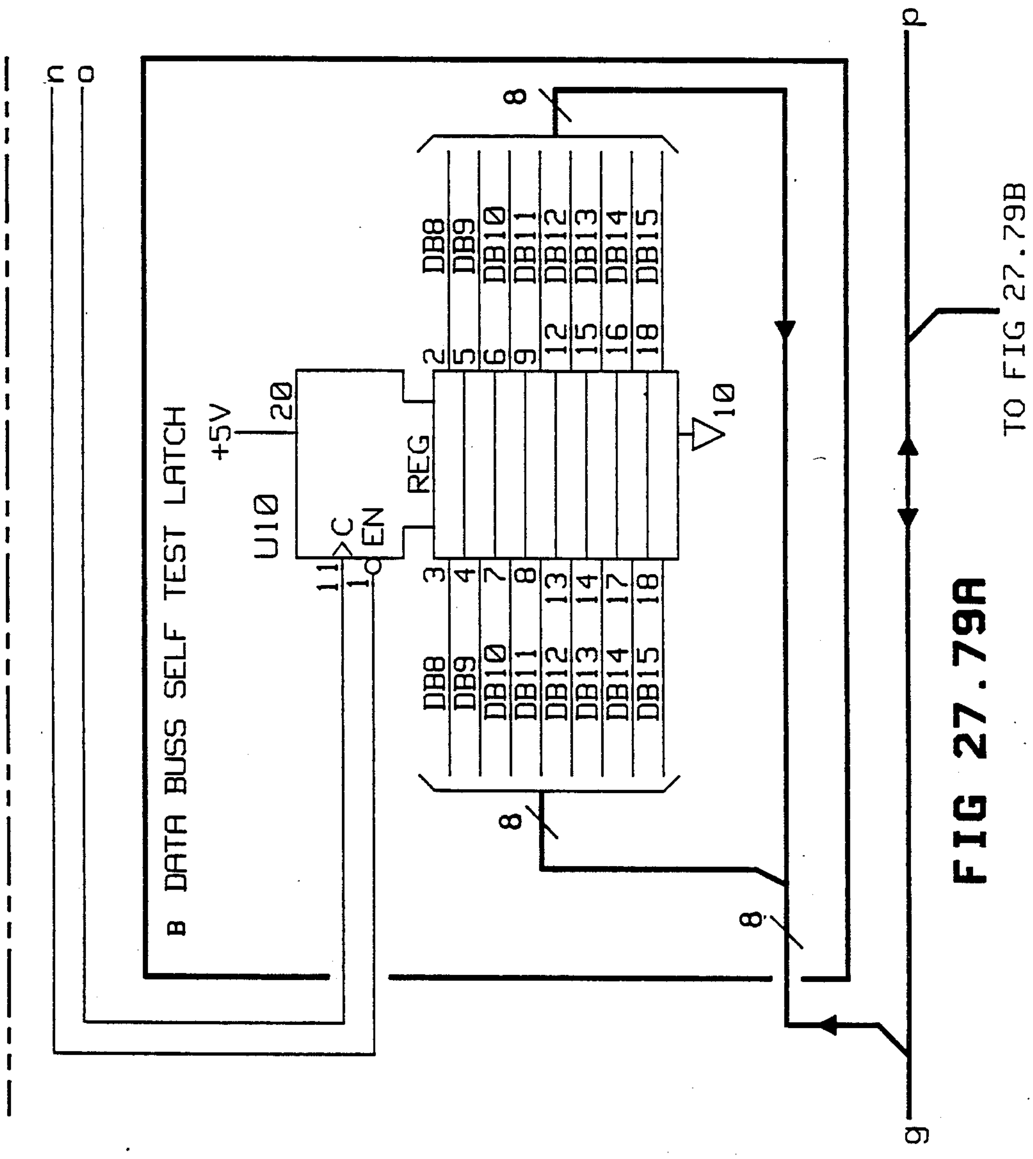
FIG 27.79A

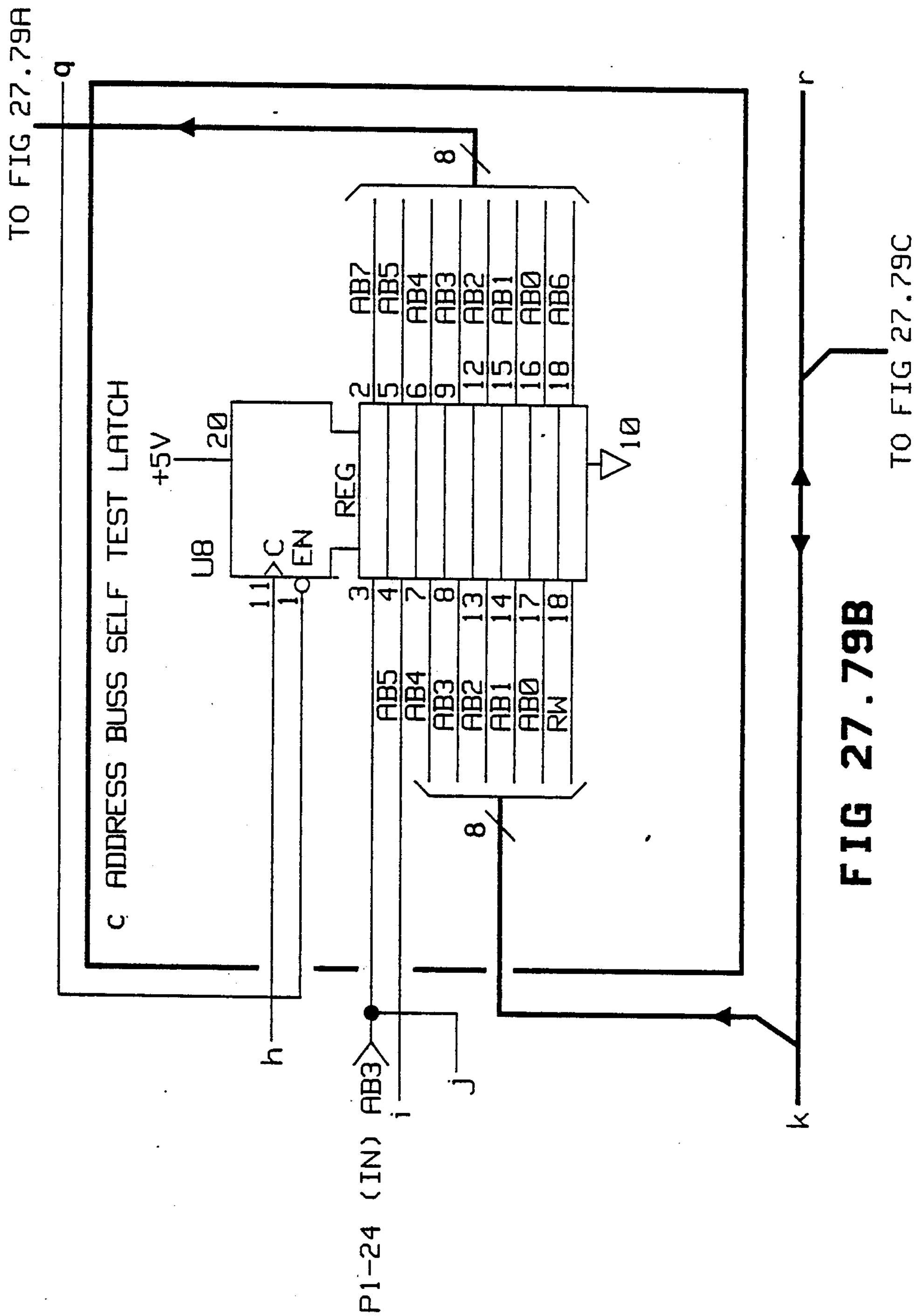
FIG 27.79B

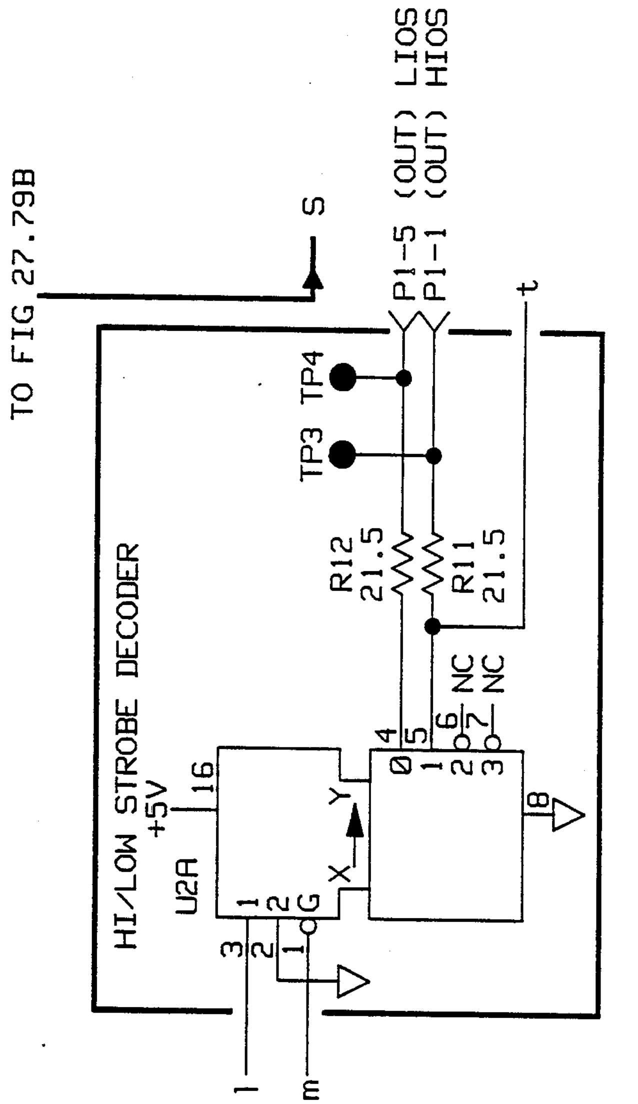
FIG 27.79C

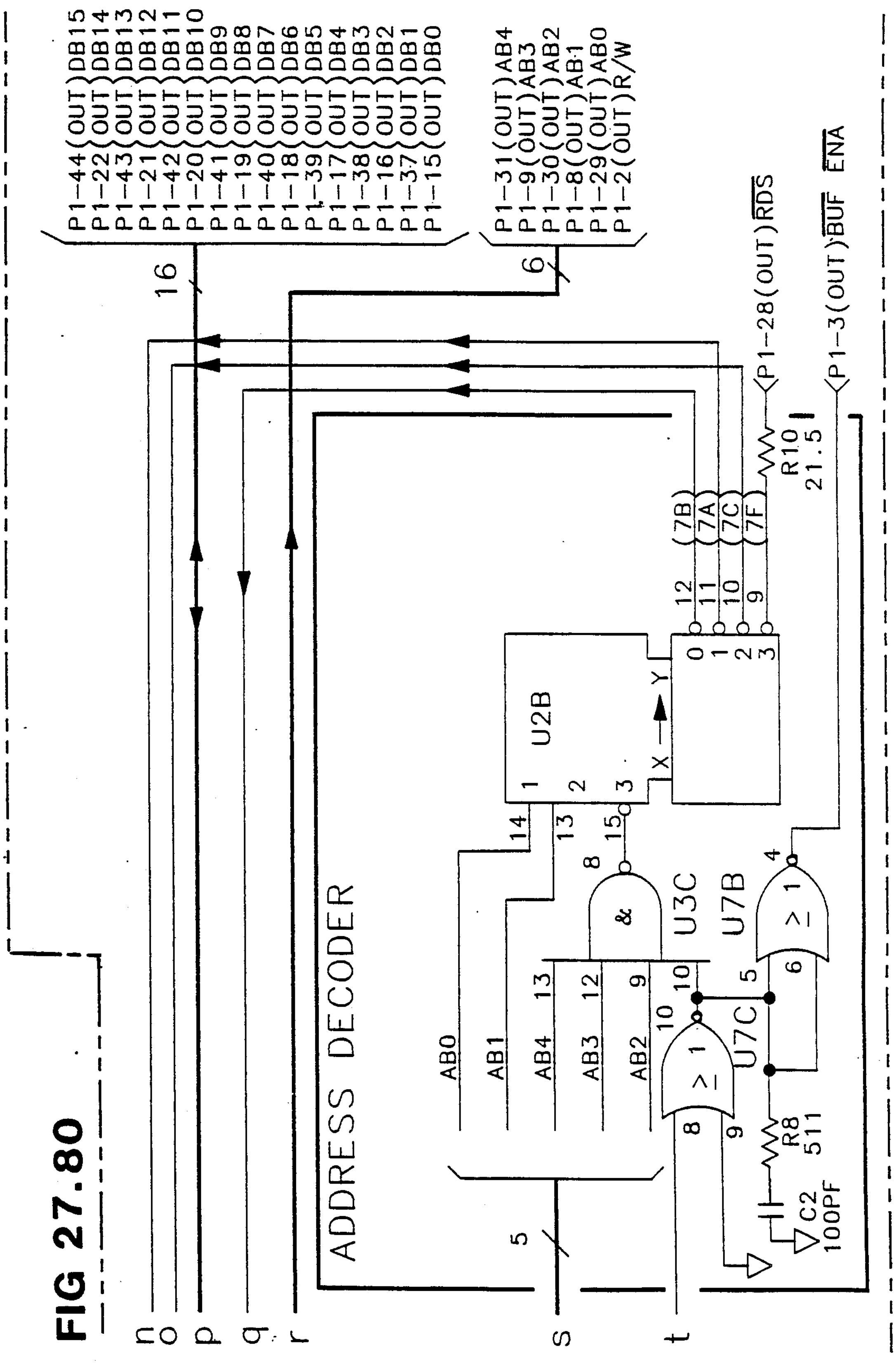
FIG 27.80

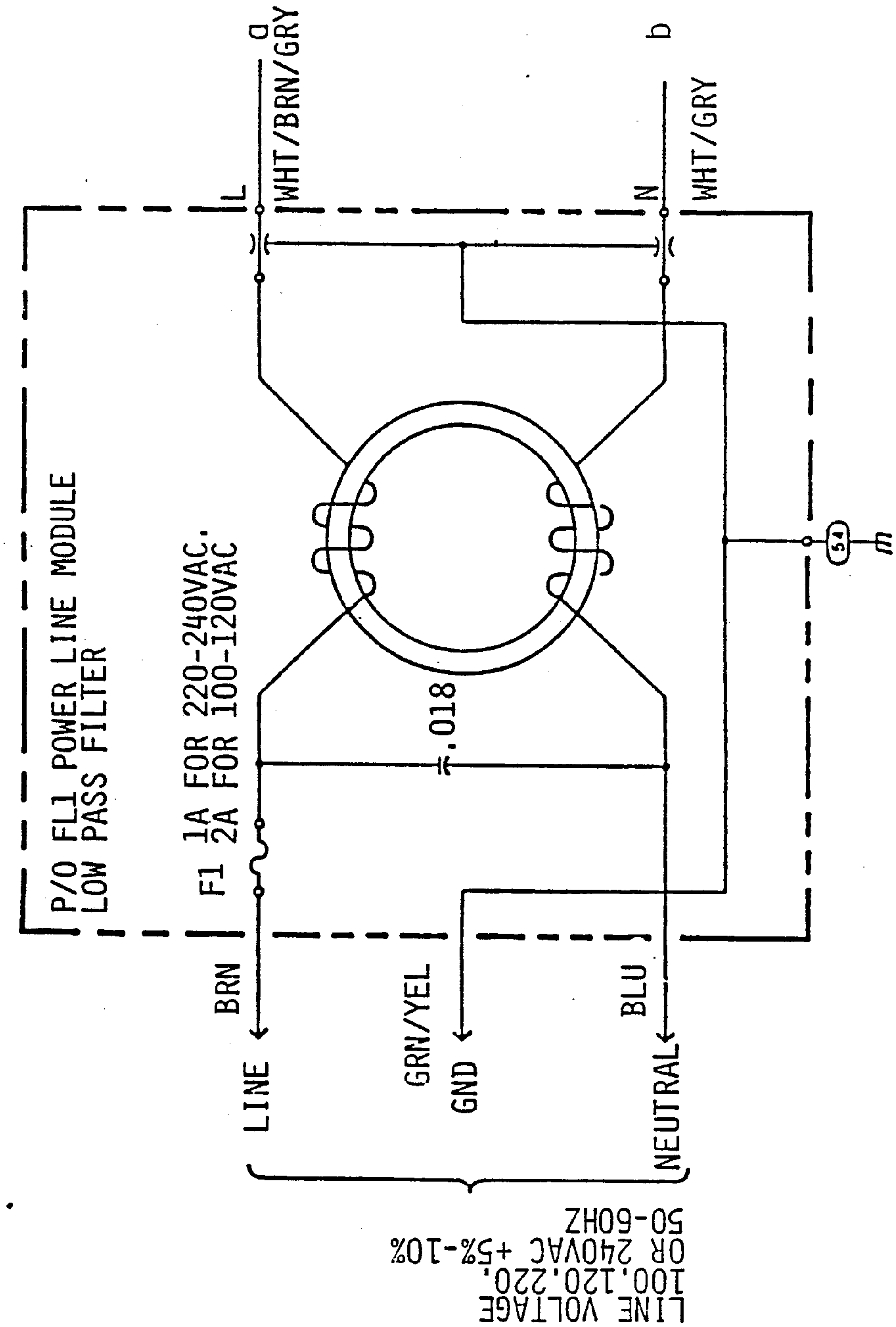
FIG 27.82A

| PIN | SIGNAL | TO/FROM | FUNCTION BLOCK |
|---|---|---|---|
| 1 | 18VAC | T1 | A |
| 2 | 18VAC | T1 | A |
| 3 | 9.7VAC | T1 | B |
| 4 | 18VAC CENTER TAP | T1 | A |
| 5 | 9.7VAC CENTER TAP | T1 | B |
| 6 | 9.7VAC | T1 | B |

| PIN | SIGNAL | TO/FROM | FUNCTION BLOCK |
|---|---|---|---|
| E1 | +5V RAM | A25R1: A25C1 | B |
| E2 | +5V UNREG | A25Q1 | B |
| E3 | -5V RAM | A25R2. A25C2 | B |
| E4 | GND | GND BUS | A |
| E5 | -5V UNREG | A25Q2 | B |
| E6 | +15V UNREG | A15P1-40 A25Q3 | A |
| E7 | +15V RAM | A25R3 A25C3 | A |
| E8 | -15V UNREG | A15P1-17. A25Q4 | A |
| E9 | -15V RAM | A25R4 A25C4 | A |

SEMICONDUCTOR COMPONENTS
PARTS LIST (U'S AND Q'S)

| REF. DESIG. | PART NO. | MFR. PART NO. |
|---|---|---|
| CR1-CR8 | 1901-0662 | MR-751 |
| DS1-DS4 | 1990-0485 | 5082-4984 |
| VR1-VR2 | 1902-0025 | |
| VR3-VR4 | 1902-0049 | |

FIG 27.82B

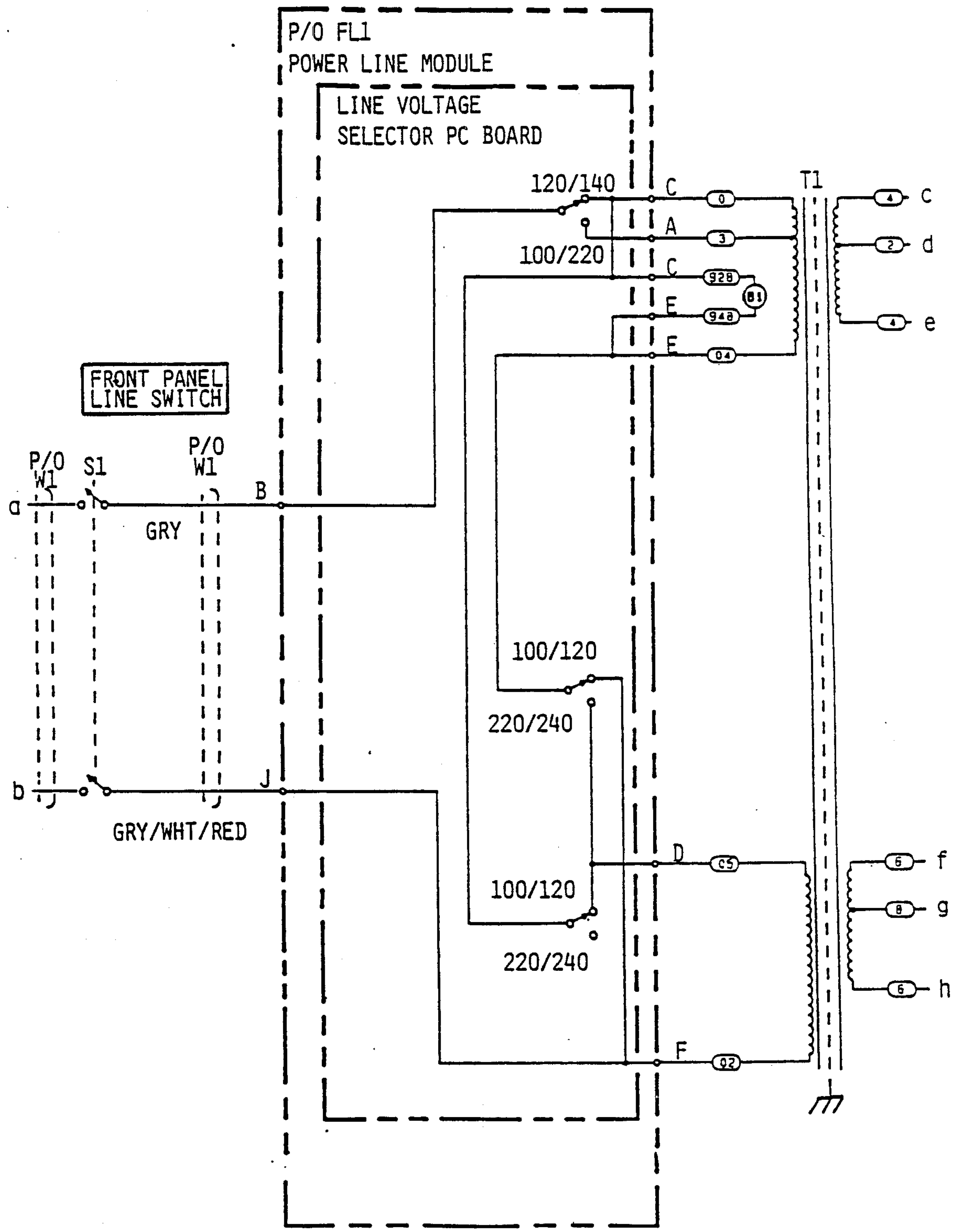
FIG 27.83

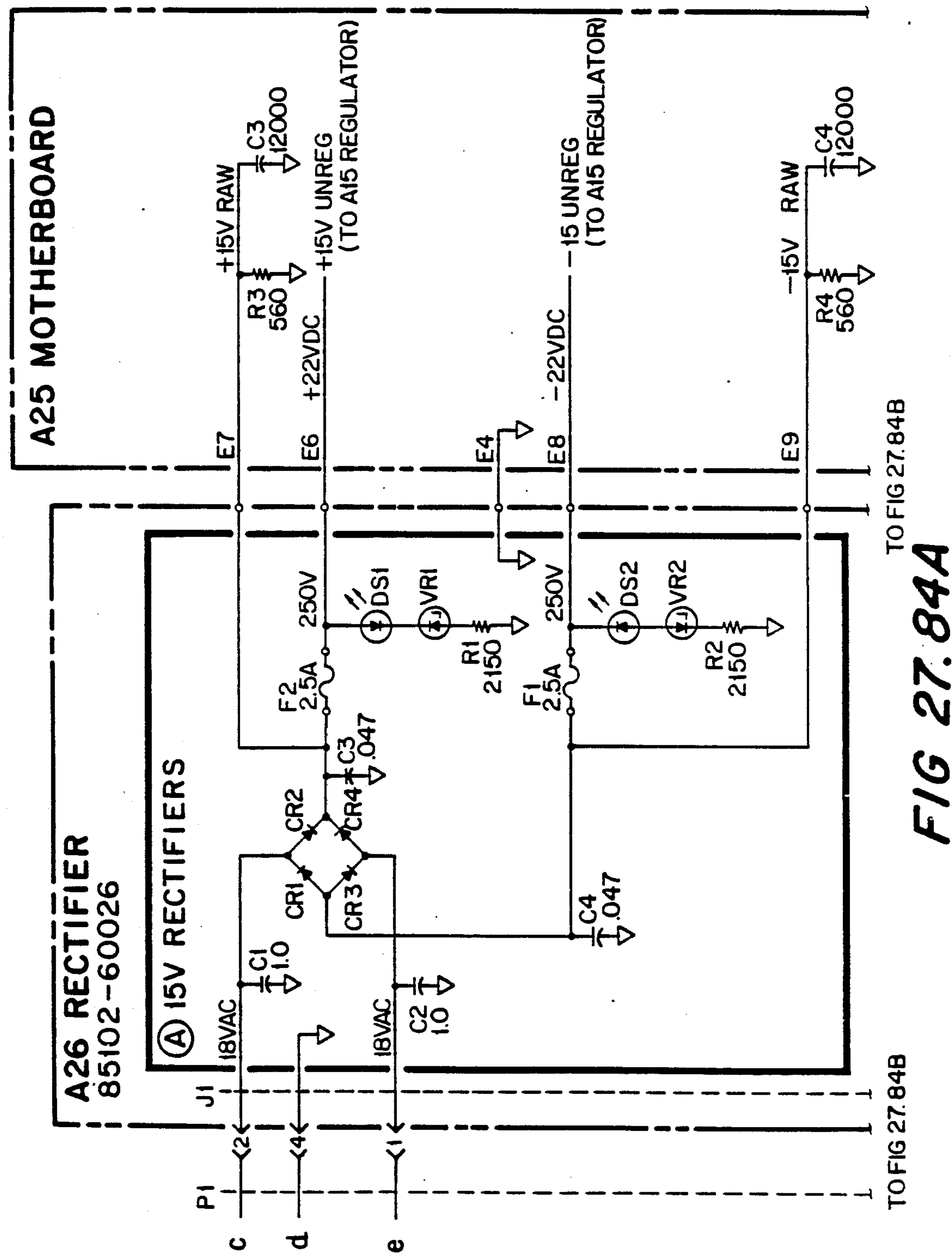
FIG 27.84A

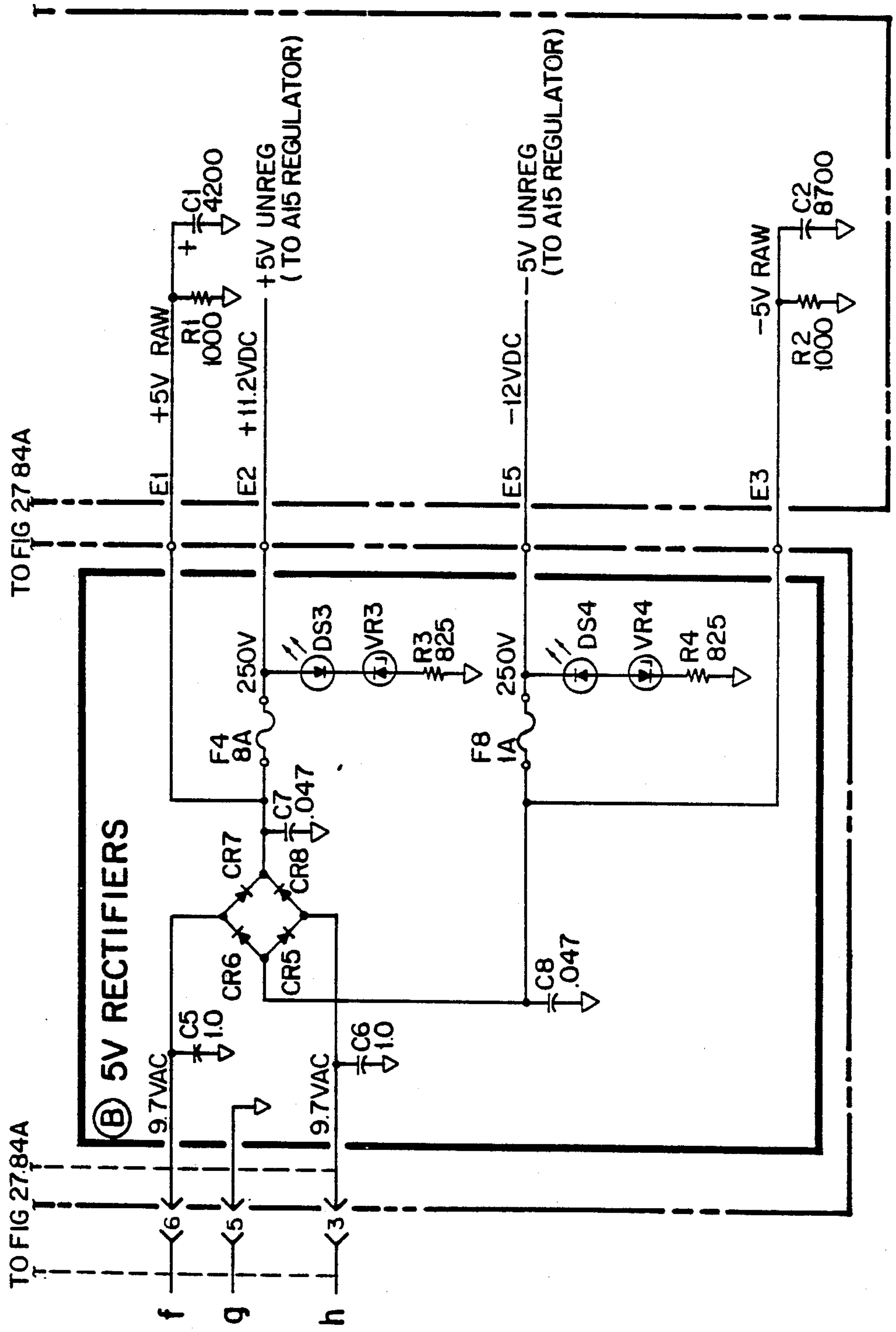
FIG 27.84B

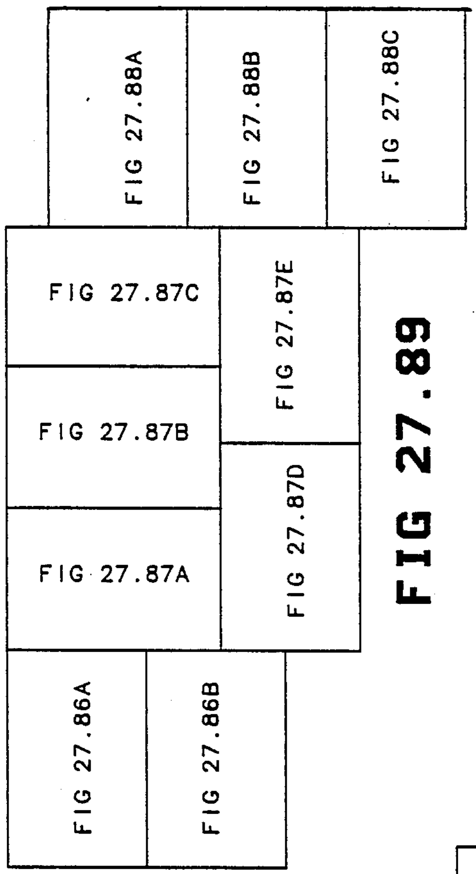
FIG 27.89
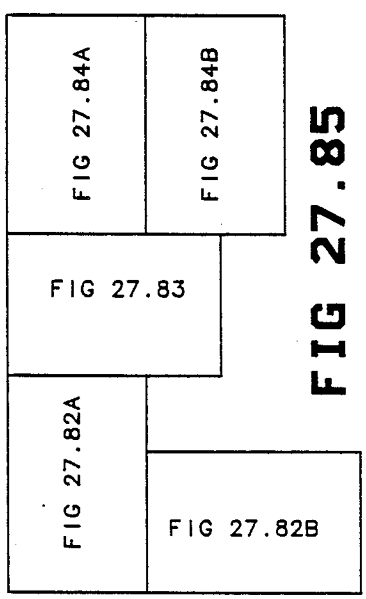
FIG 27.85
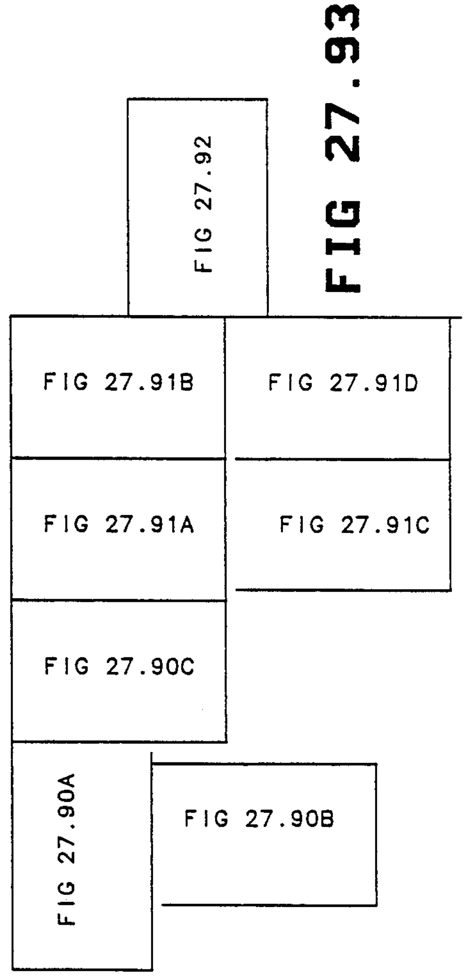
FIG 27.93

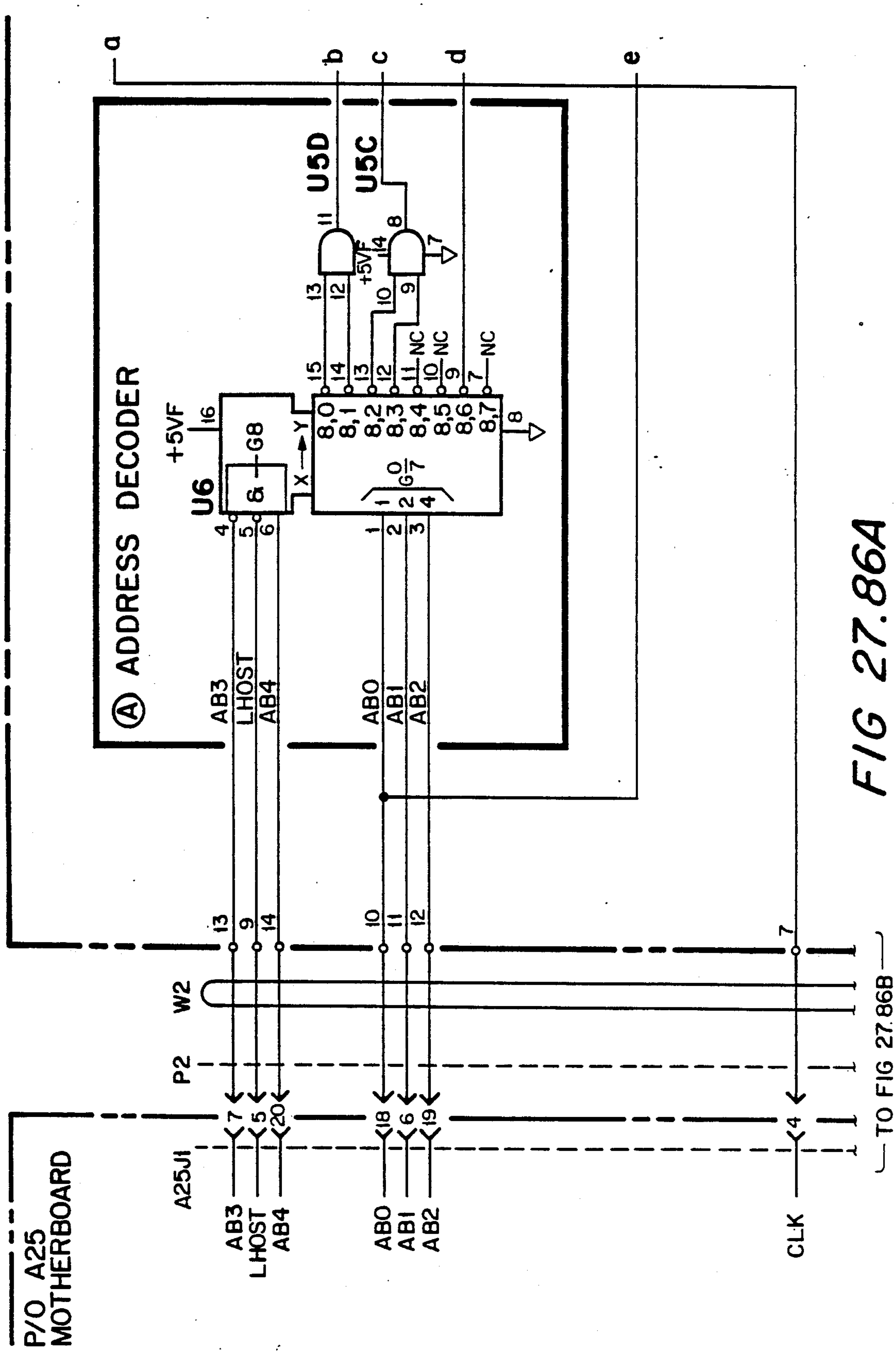
FIG 27.86A

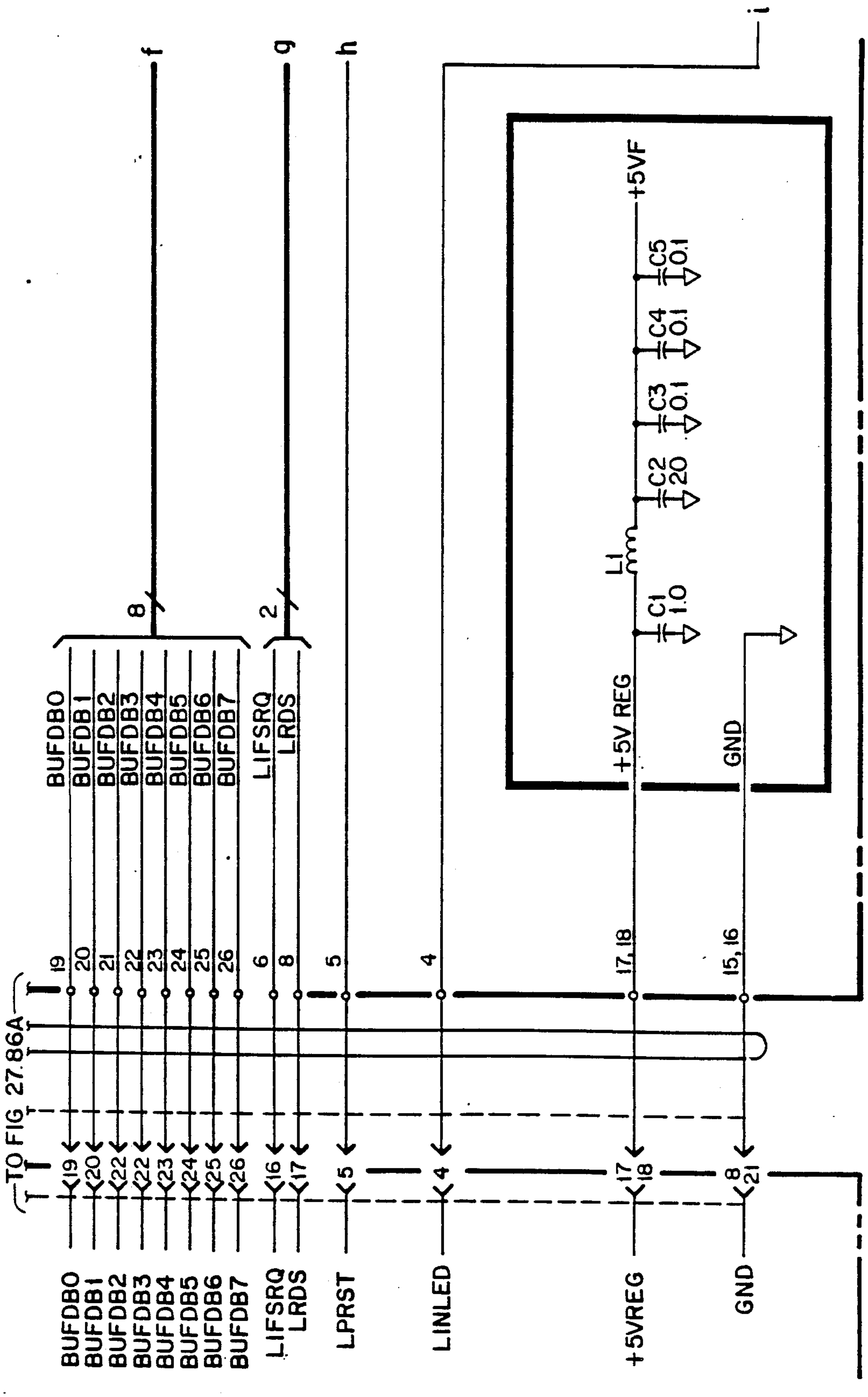
FIG 27.86B

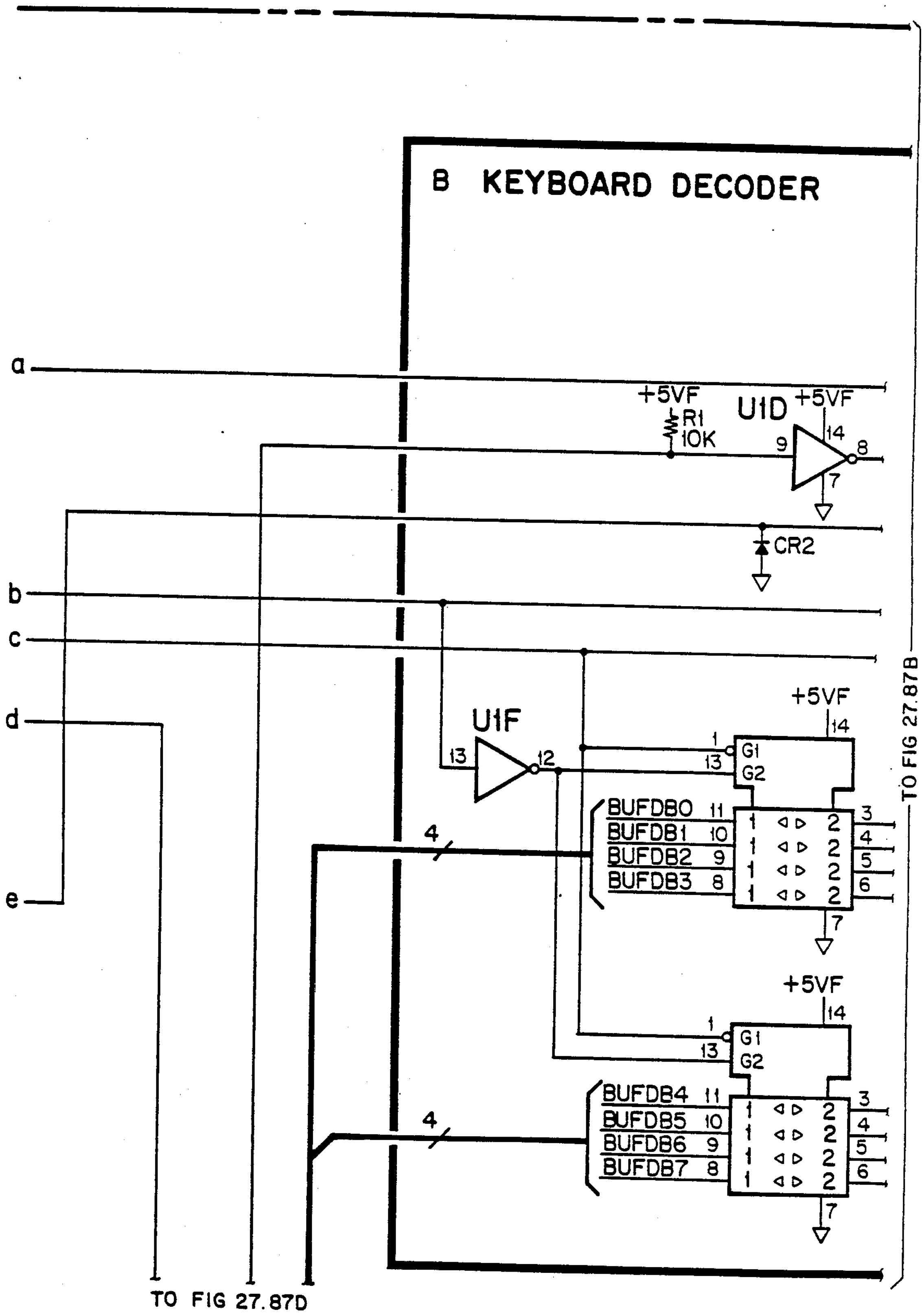
FIG 27.87A

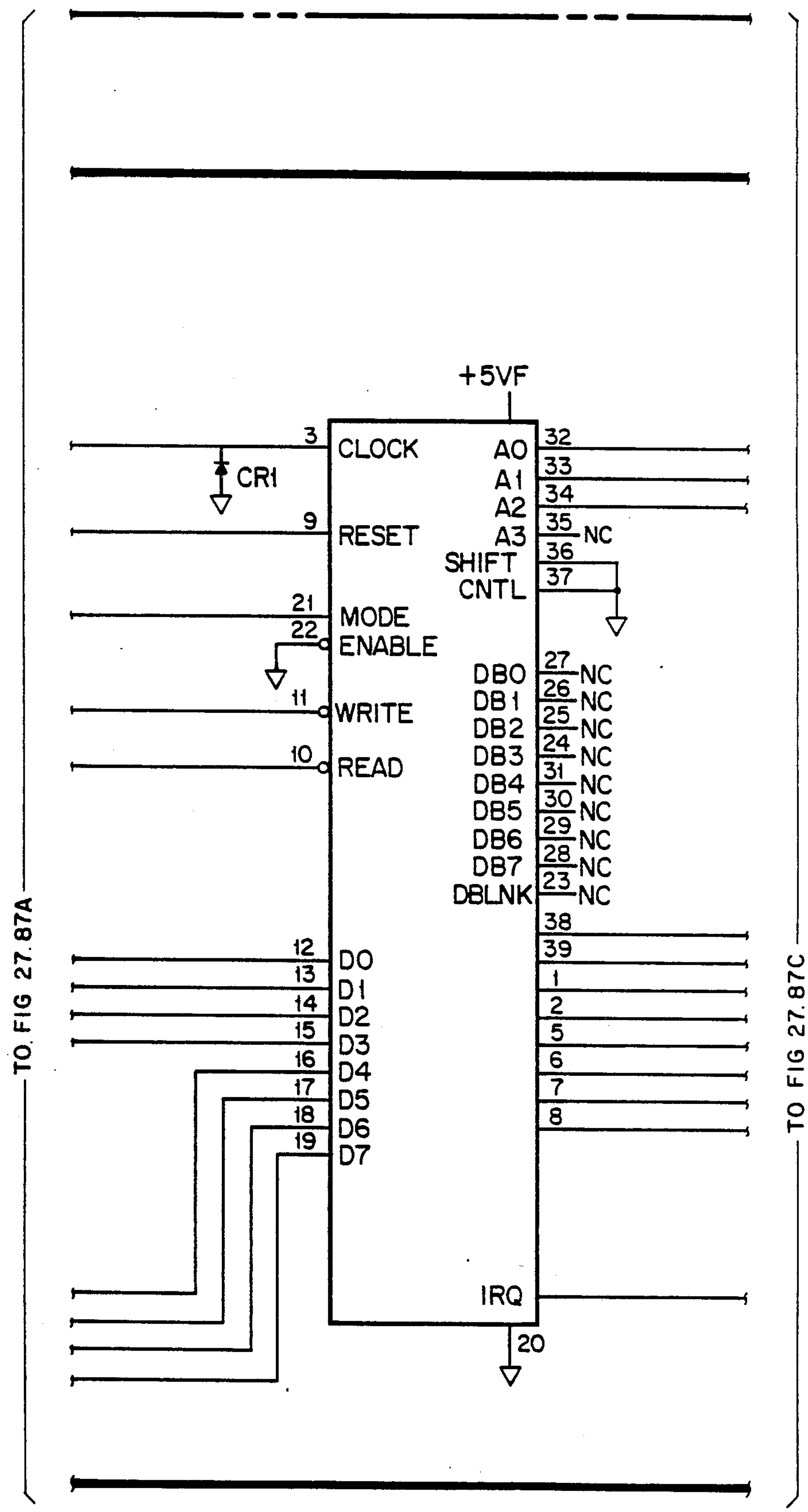
FIG 27.87B

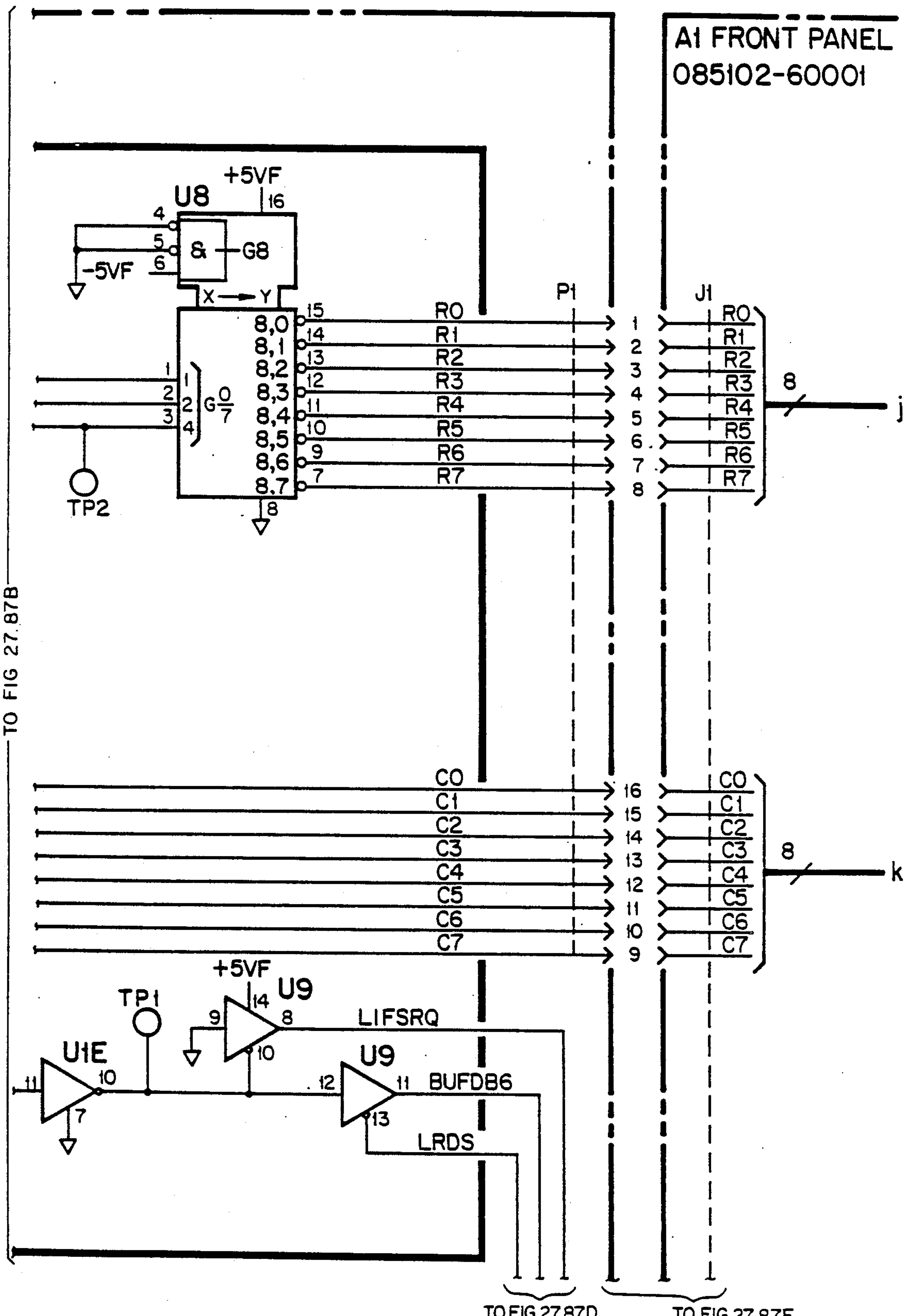
FIG 27.87C

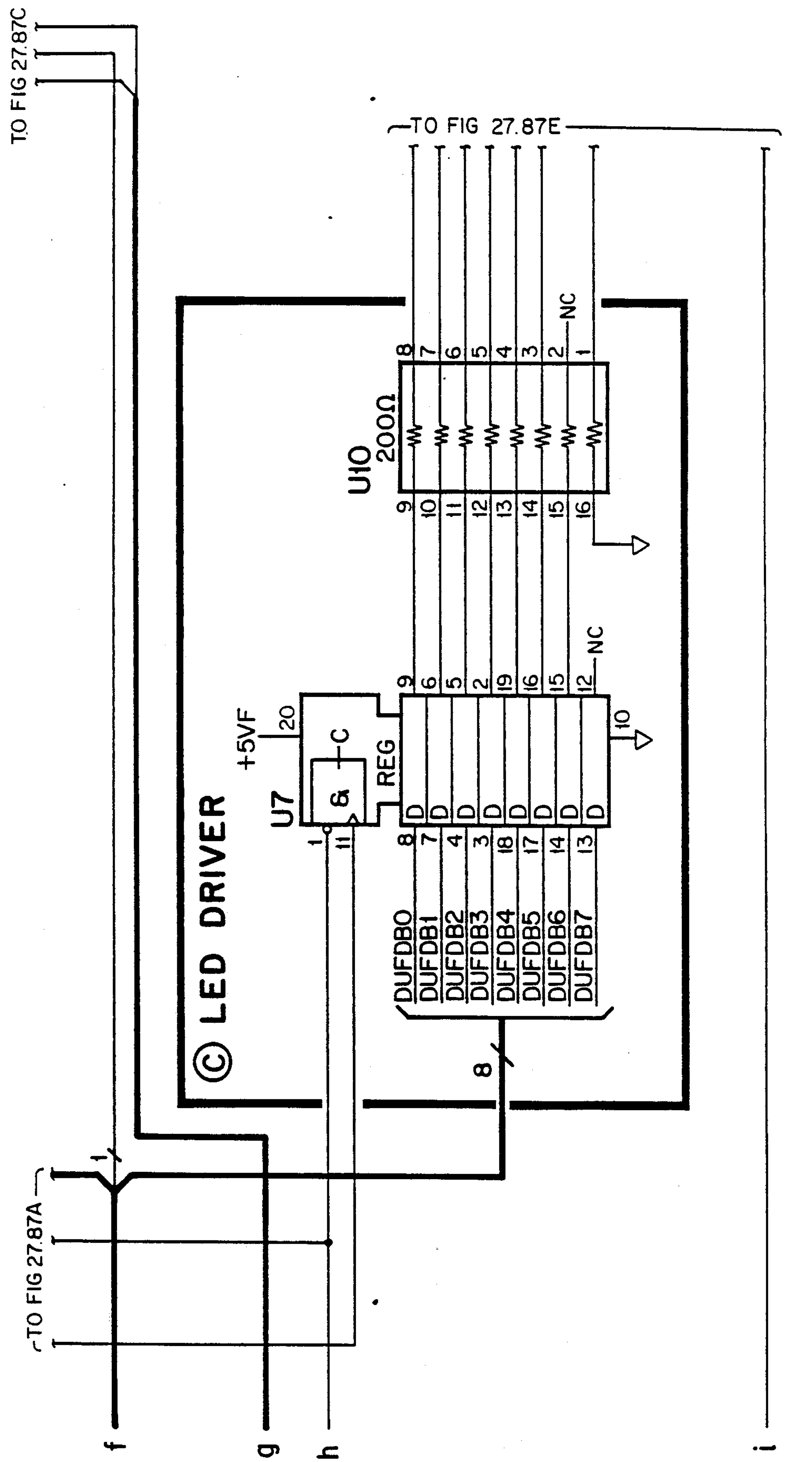
FIG 27.87D

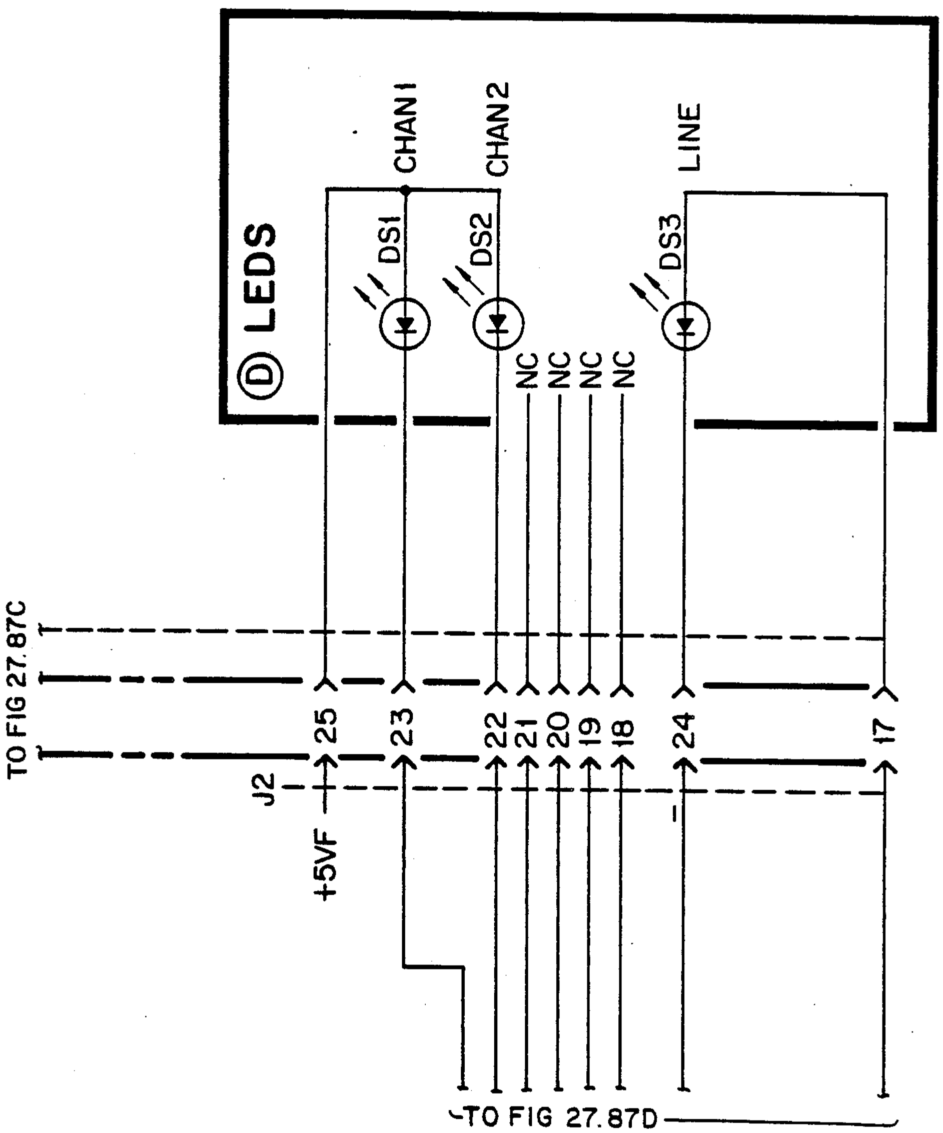
FIG 27.87E

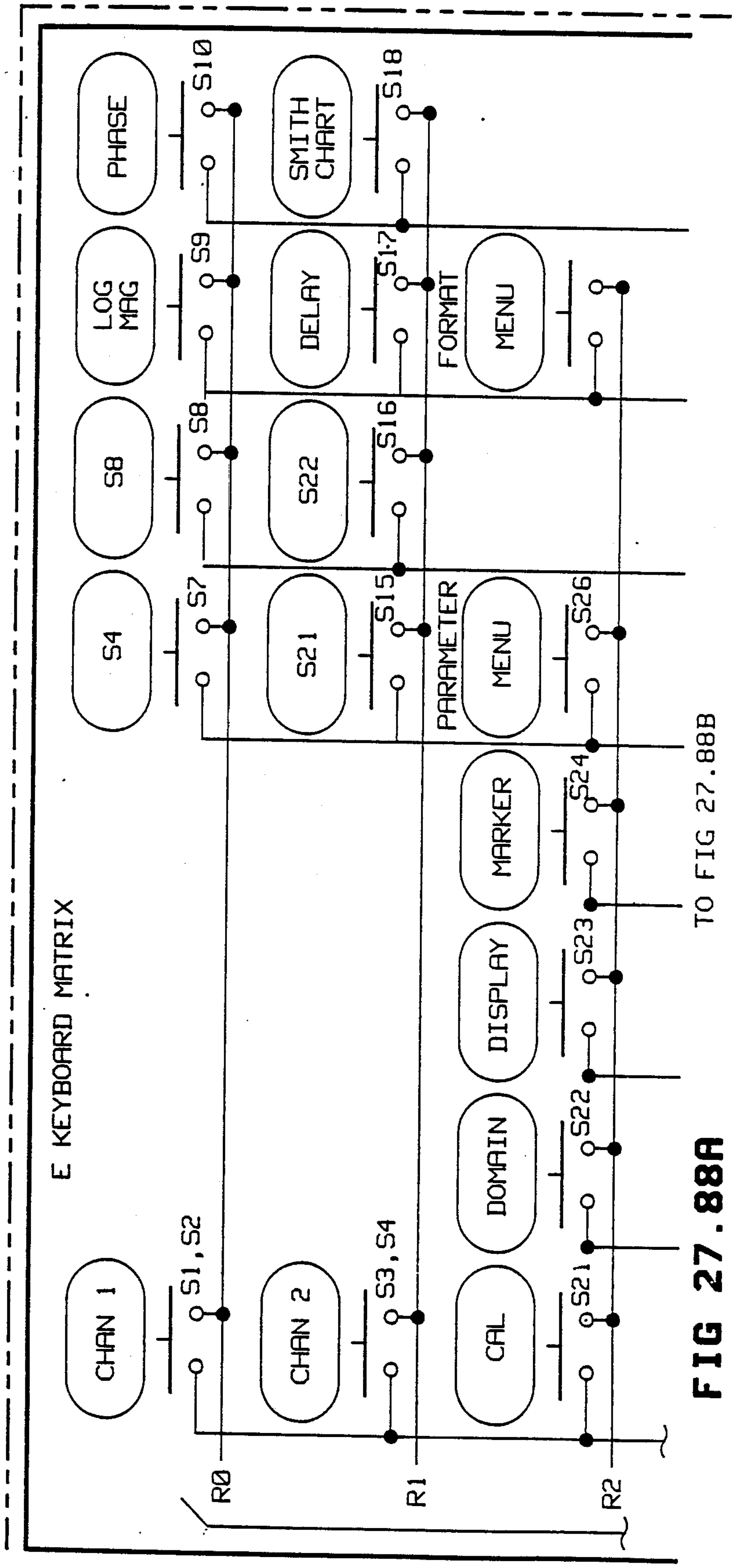
FIG 27.88A

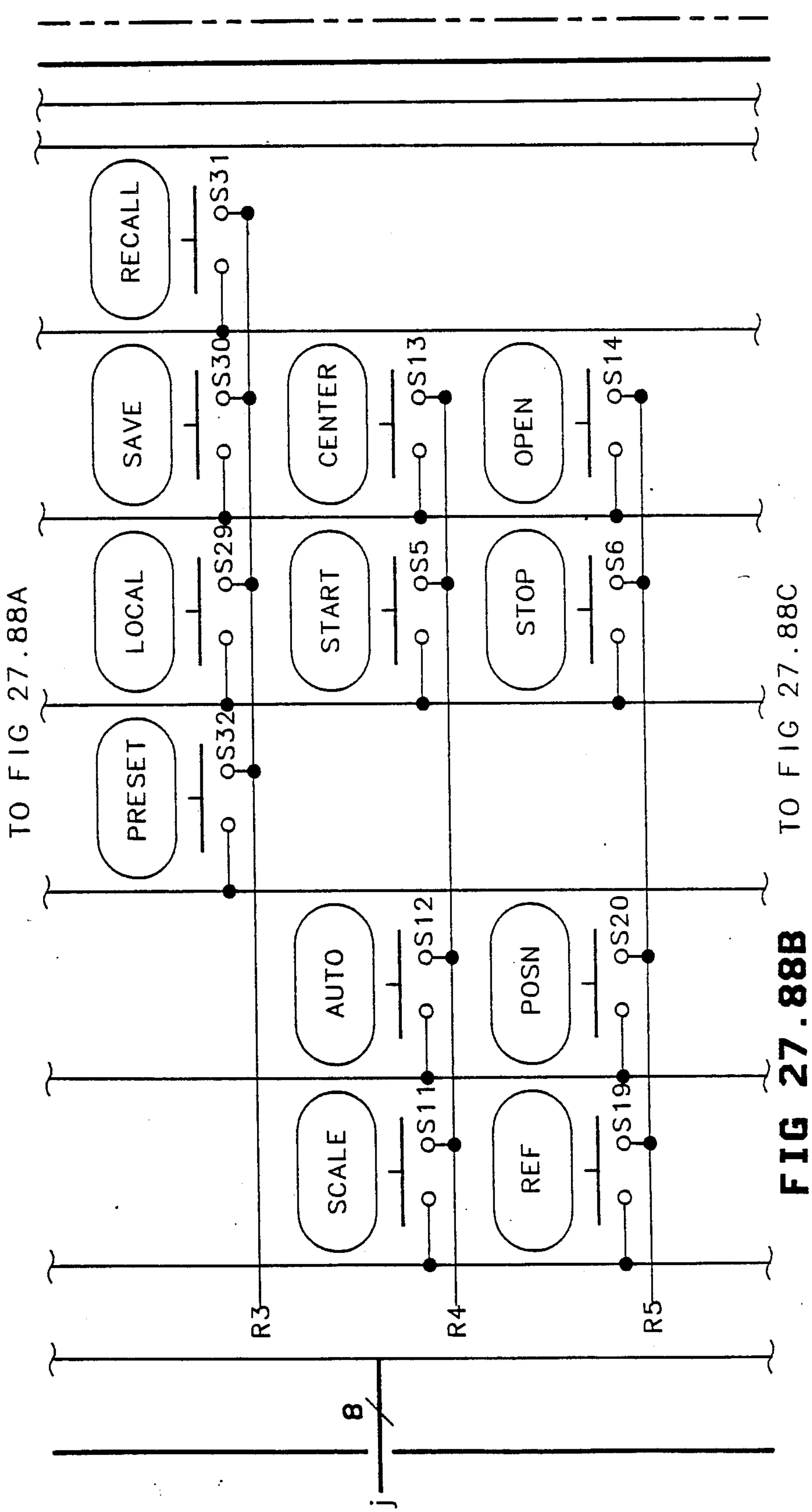
FIG 27.88B

TO FIG 27.88B
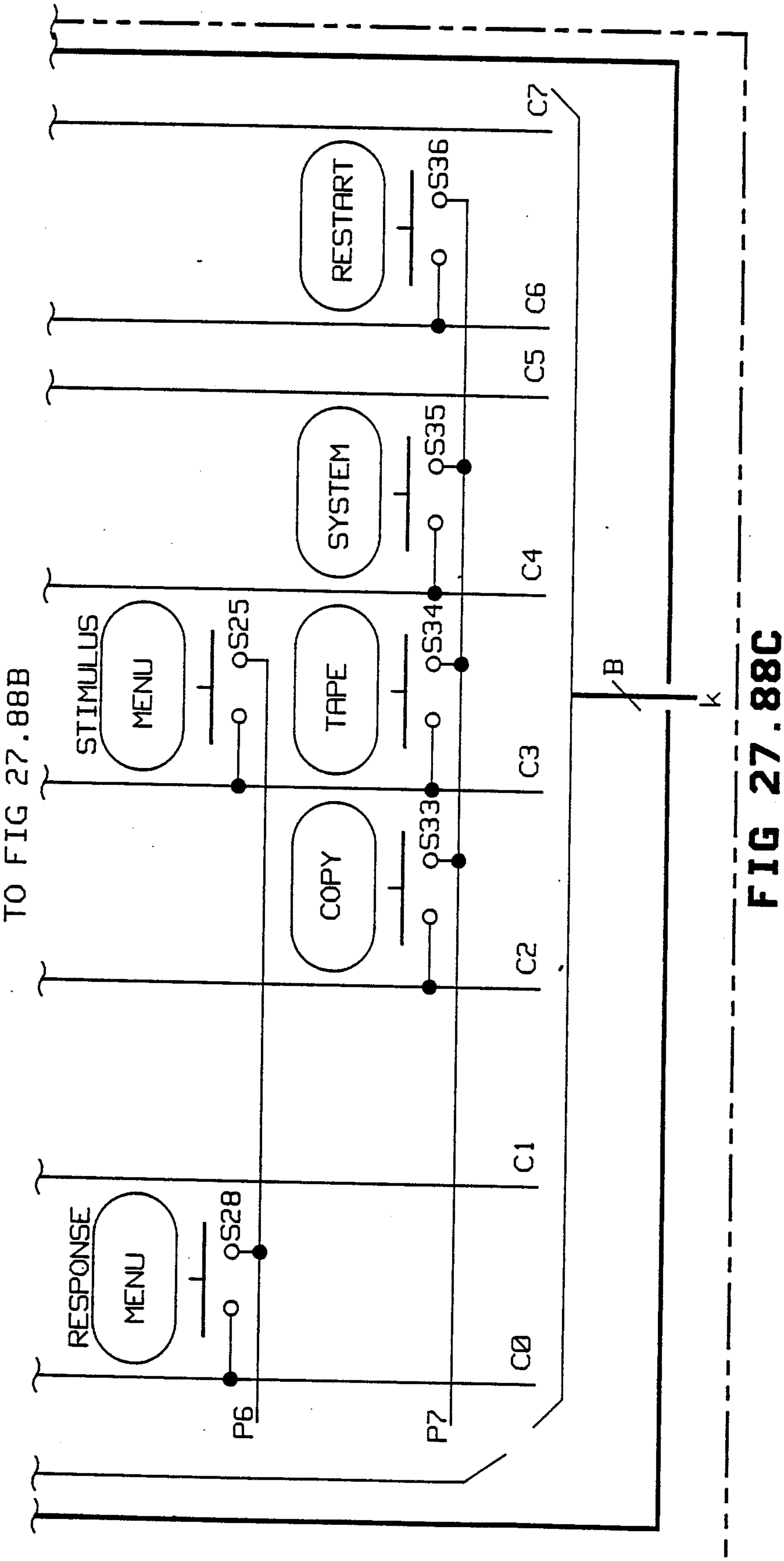
FIG 27.88C

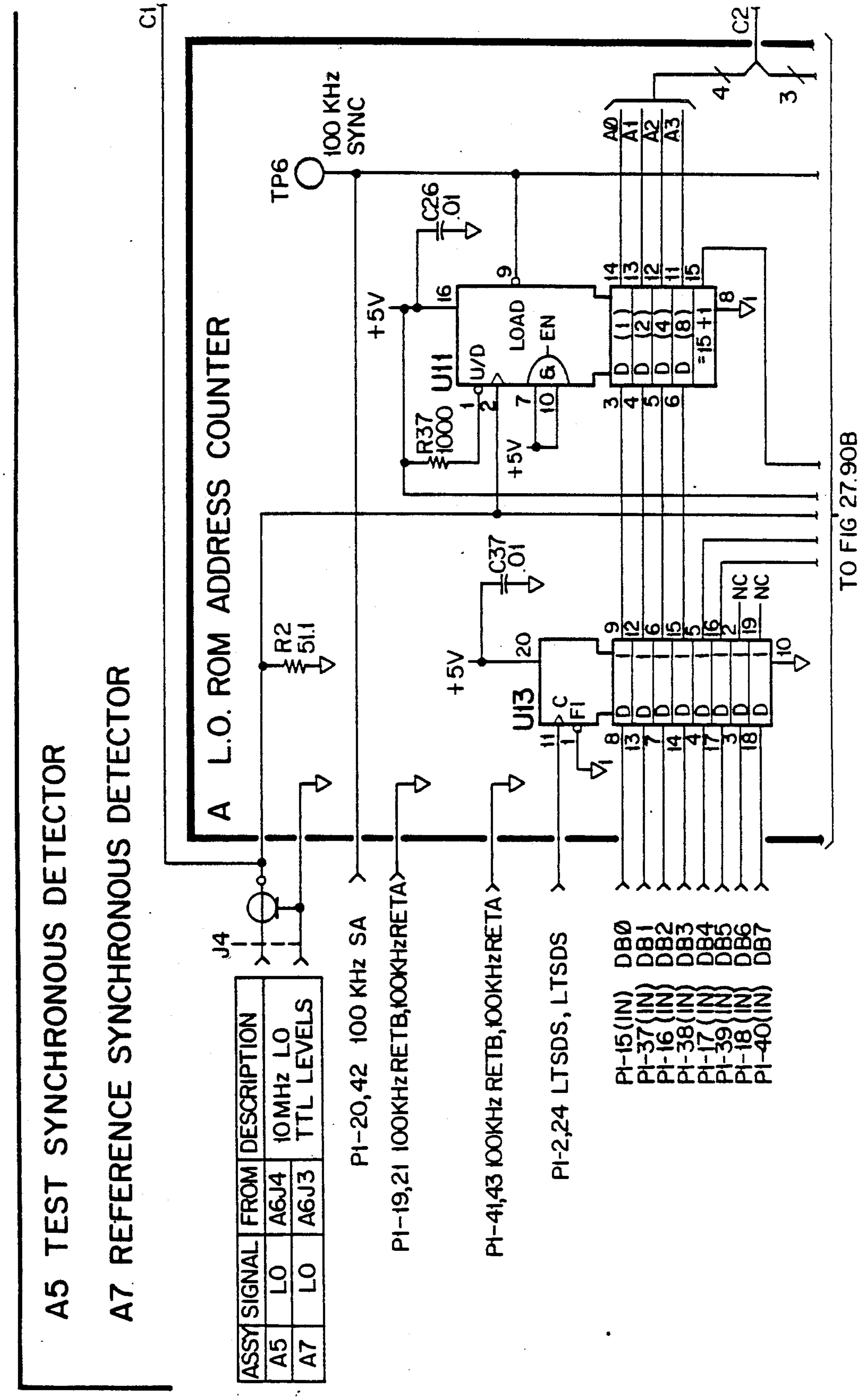
FIG 27.90A

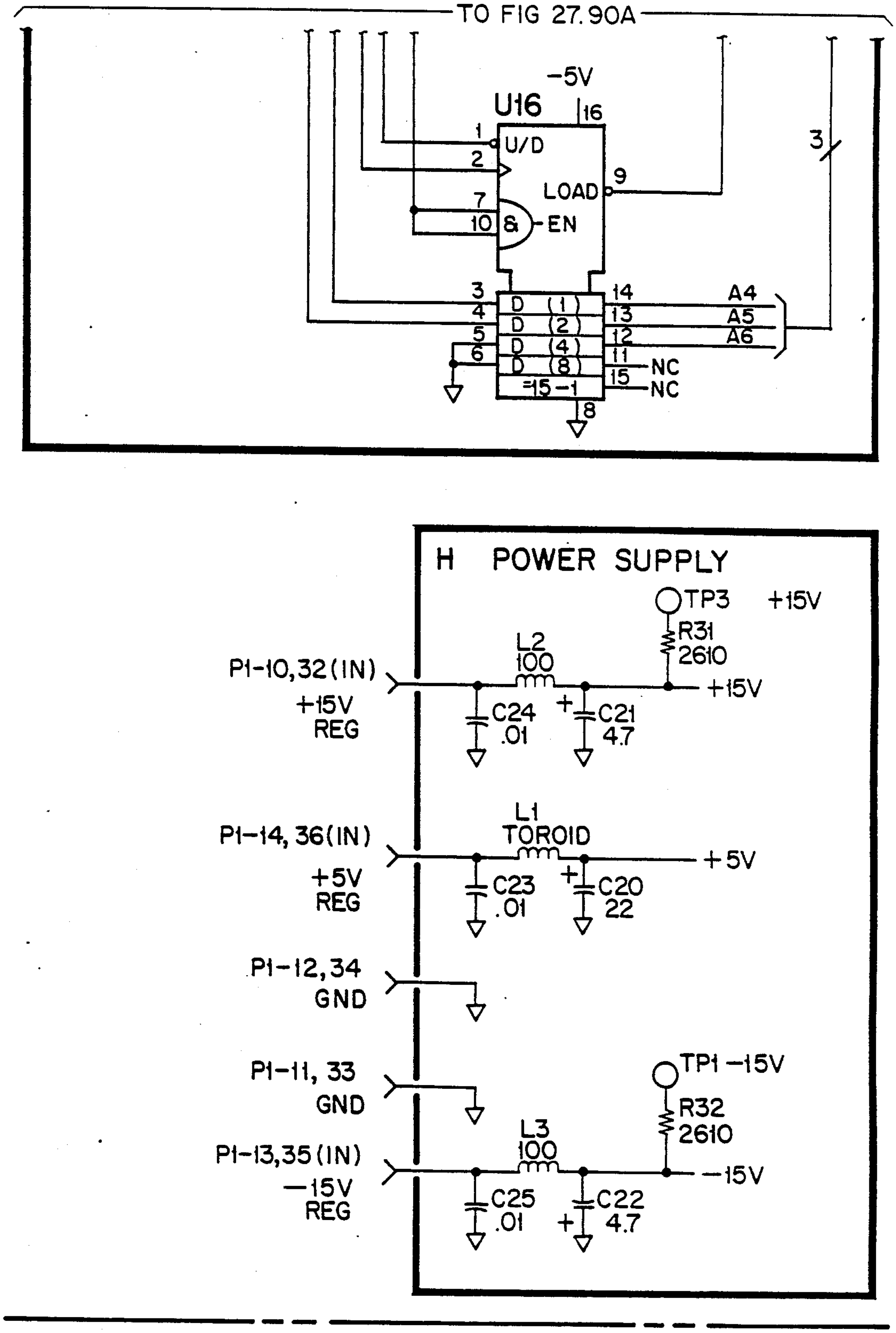
*FIG 27.90B*

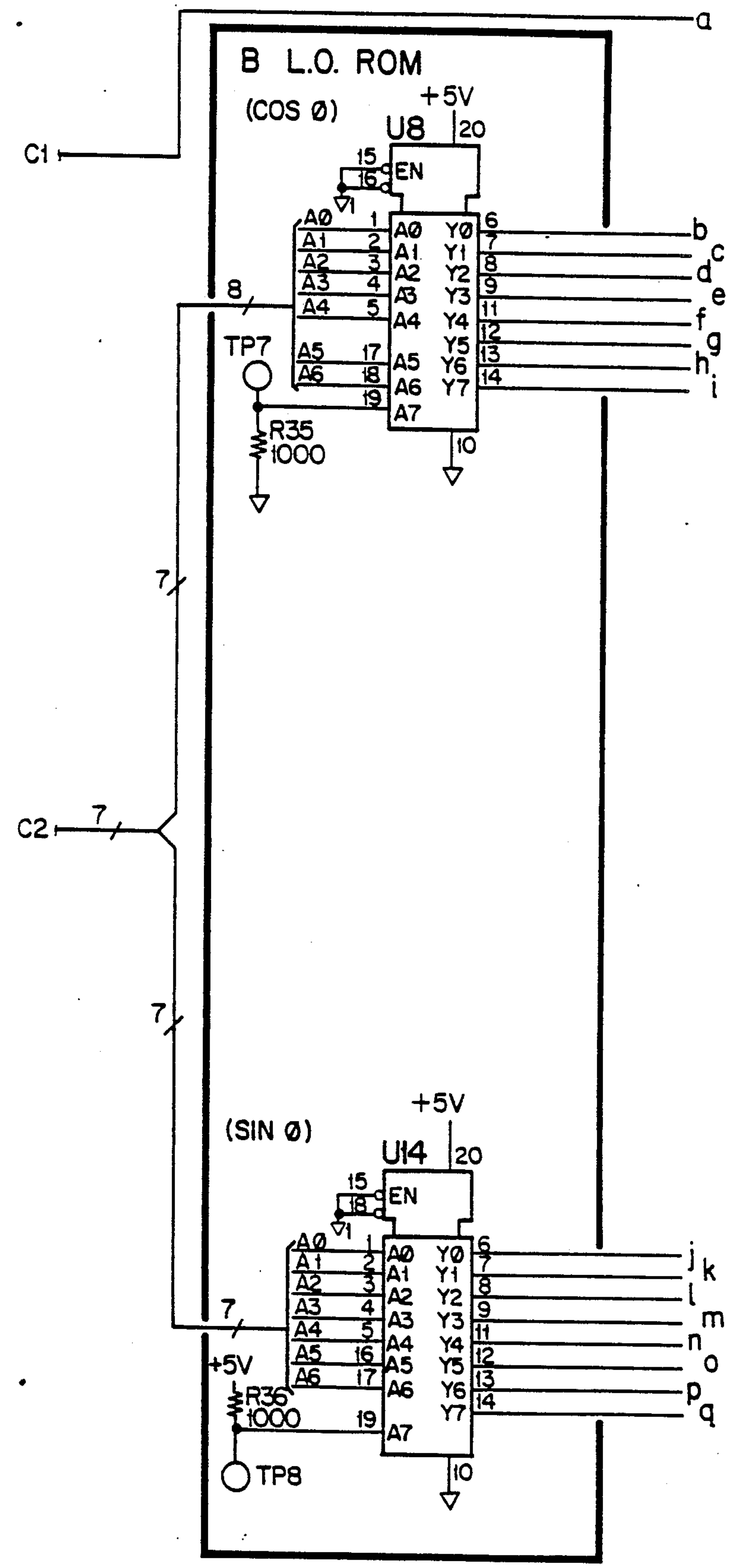
FIG 27.90C

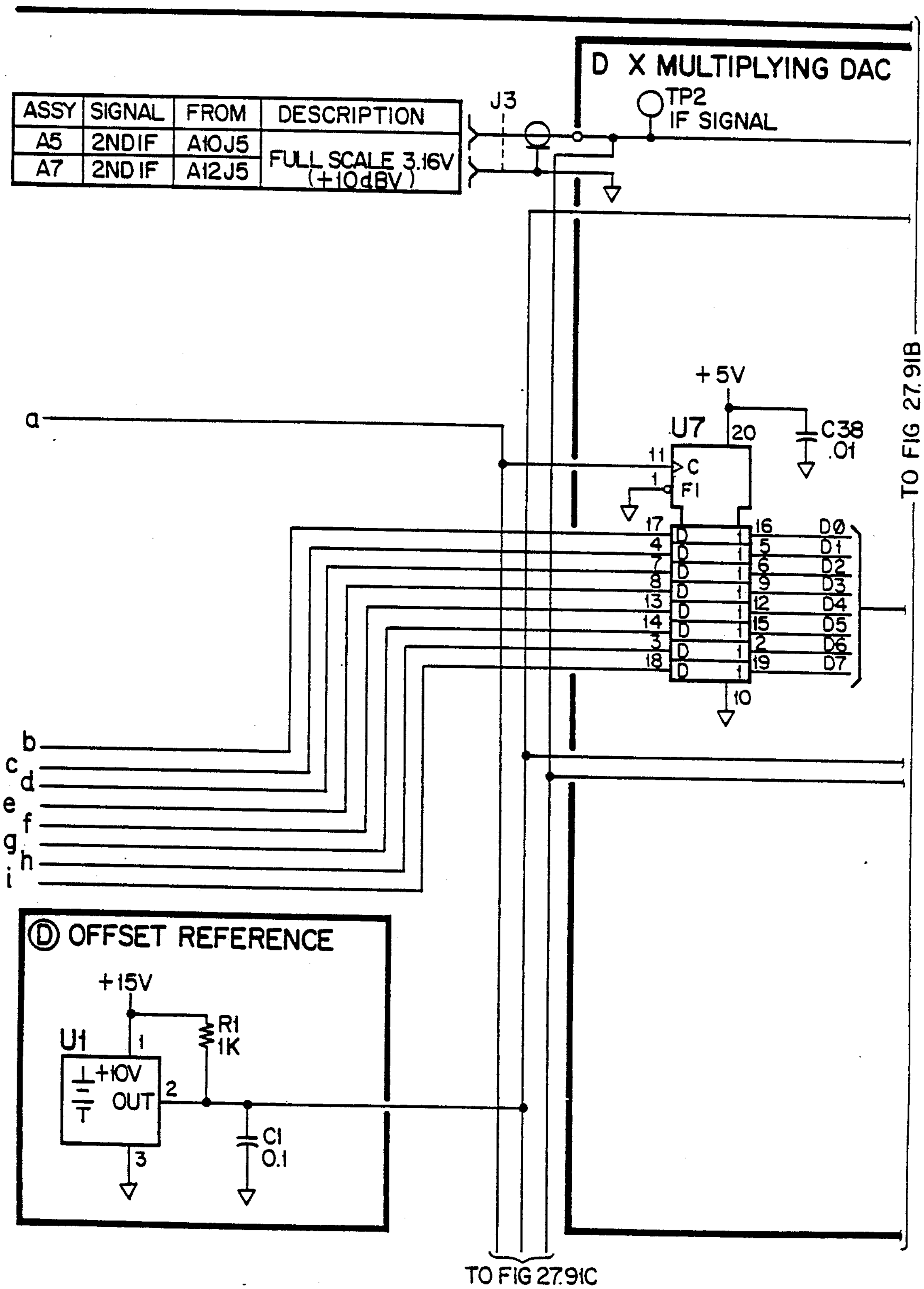
FIG 27.91A

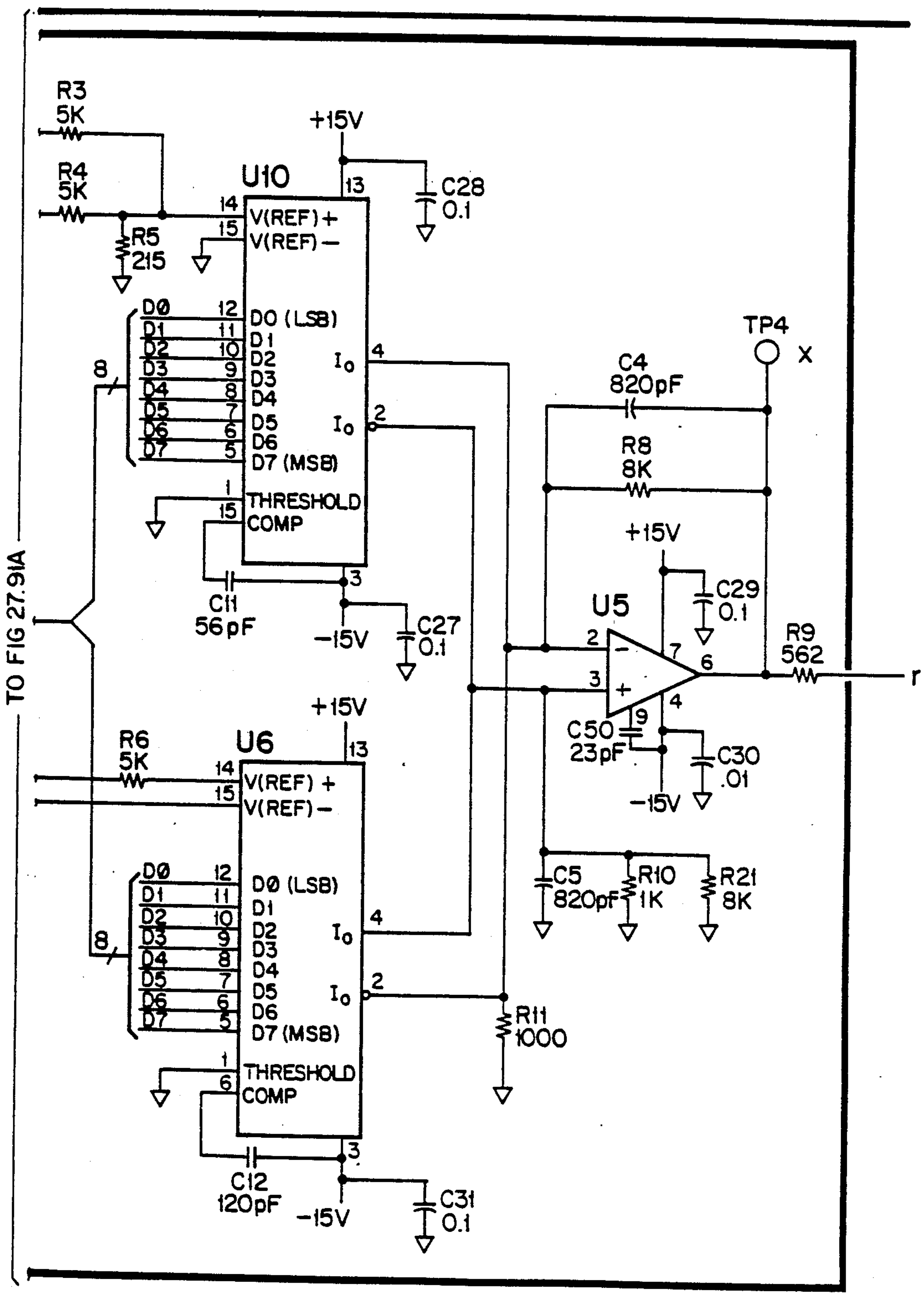
FIG 27.91B

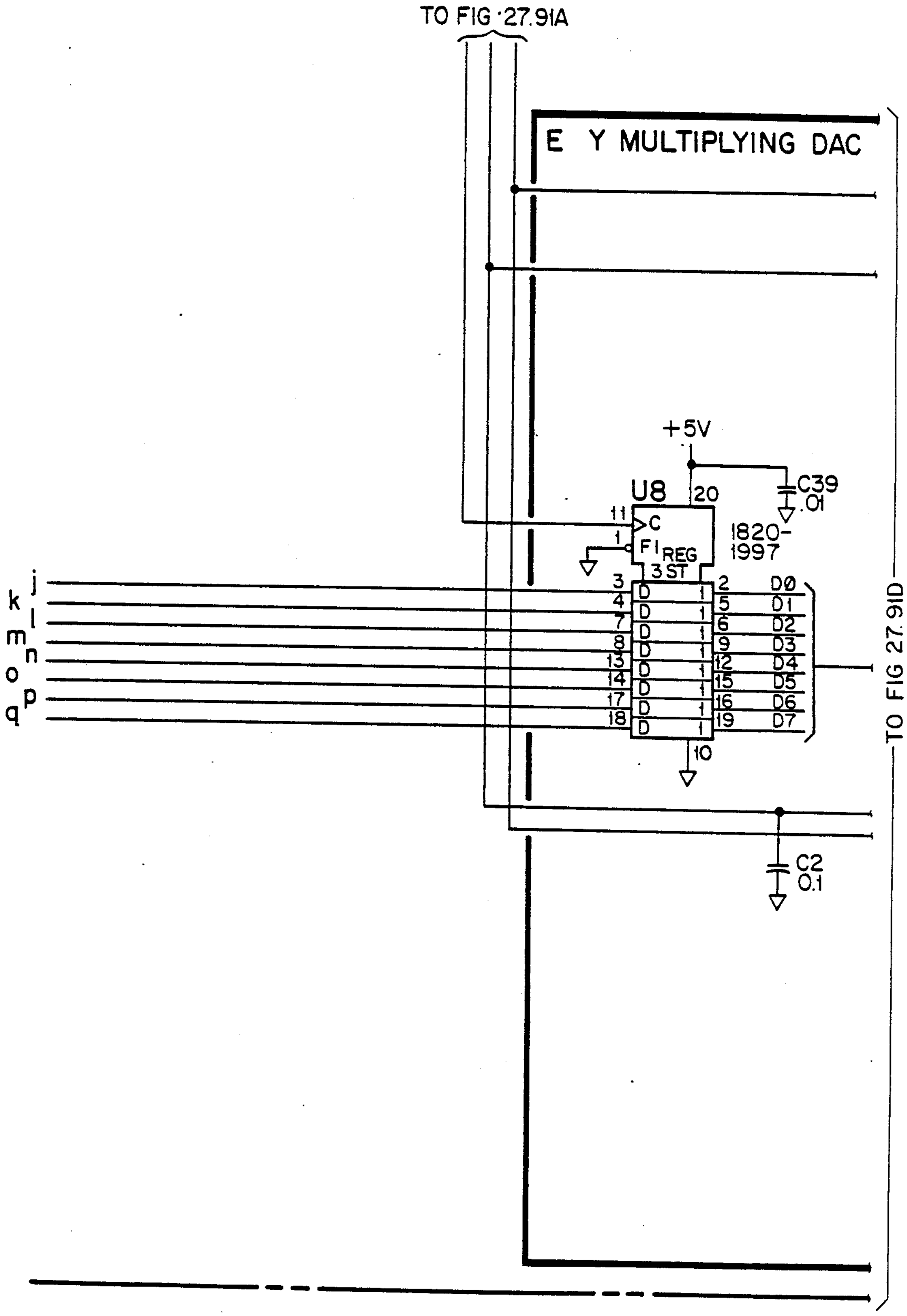
FIG 27.91C

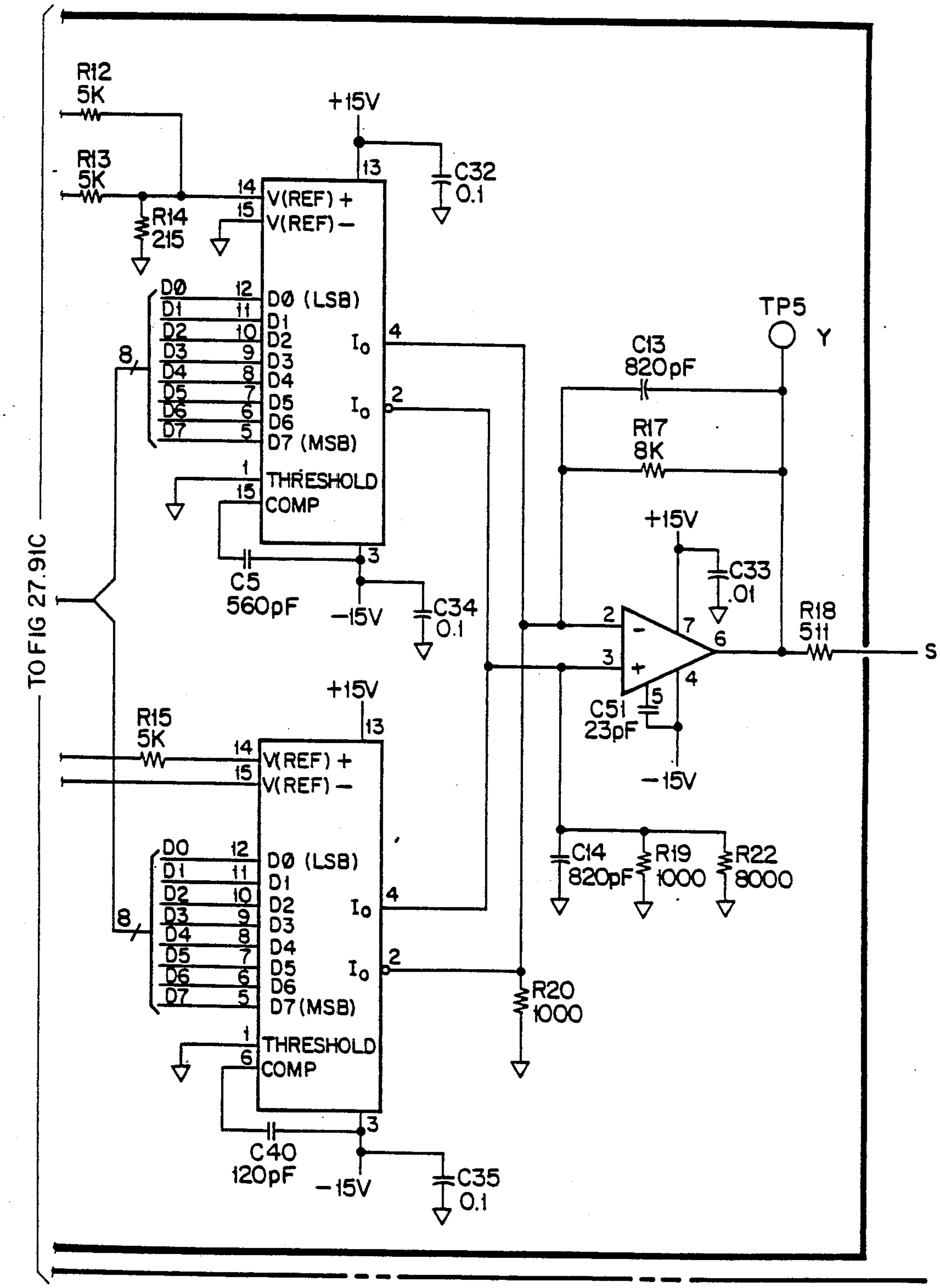
FIG 27.91D

FIG 27.92
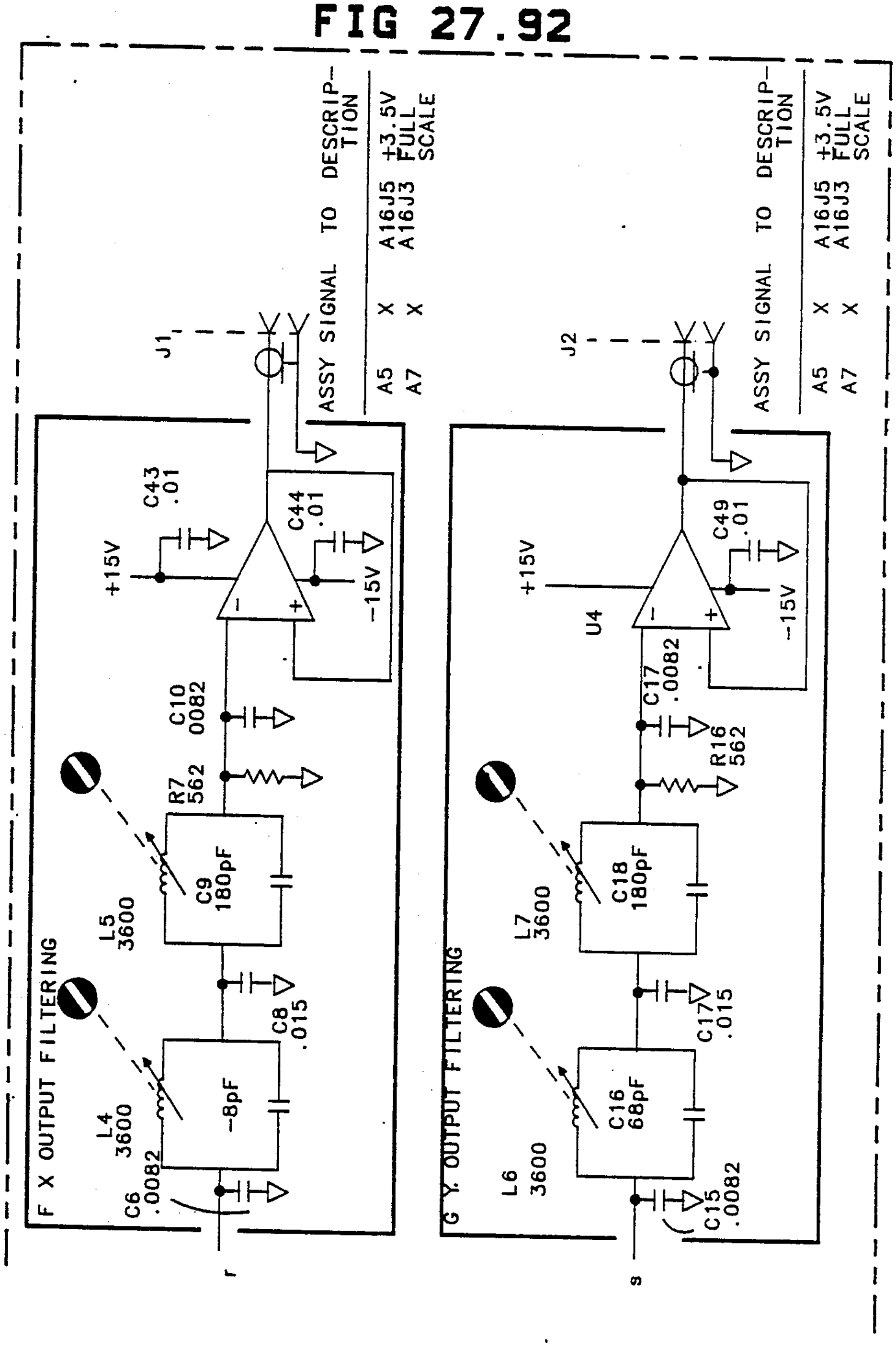

VECTOR NETWORK ANALYZER WITH INTEGRAL PROCESSOR

BACKGROUND OF THE INVENTION

Formerly, most magnitude and phase vector measurements at microwave frequencies have been performed by network analyzers using techniques such as those described in "Automatic Network Analyzer 8542A, Section IV Network Analyzer Fundamentals", Hewlett-Packard Co. 1969 and in U.S. Pat. No. 4,244,024 issued Jan. 6, 1981 by Marzalek et al. Such vector network analyzers characterize networks, including devices, components, and systems by measuring the magnitude and phase of the network's transmission and reflection coefficients versus frequency. The capability to measure group delay, a special form of transmission and also usable in reflection, is also often incorporated in a vector network analyzer.

In general, a vector network analysis measurement system contains several separate modules. First is an RF source to provide the stimulus to the device under test (DUT). The stimulus normally covers a limited range of frequencies, either in a continuous analog sweep, referred to as the swept mode, in discrete steps, referred to as the step mode, or a single point mode. Second is a signal separation network to route the stimulus to the DUT and provide a means for sampling the energy that is reflected from, or transmitted through, the DUT. Also, energy is sampled from the signal that is incident upon the DUT in order to provide a reference for all relative measurements. Third is a tuned receiver to convert the resulting signals to an intermediate frequency (IF) for further processing. The magnitude and phase relationships of the original signals must be maintained through the frequency conversion to IF to provide usable measurements. Fourth is a detector to detect the magnitude and phase characteristics of the IF signals, and fifth is a display on which to present the measurement results.

To improve measurement accuracy, a set of "standard" devices with known characteristics can be measured by a computer controlled system. From this data, a set of complex equations can be solved to determine a model representing many of the errors associated with the network analyzer process. This model is then stored in the computer and later when unknown devices are measured, the model can be used to separate the actual data from the "raw" measured data to provide enhanced accuracy in the microwave measurement by a process known as vector error correction.

Accuracy enhancement is very important in microwave measurements because even with the best signal generating and separating devices manufactured to state of the art tolerances, relatively large errors still occur as compared to low frequency measurements. For example, without vector error correction, a typical vector measuring system will yield errors of 30 percent. If one is willing to forego either the phase or impedance measurement of the unknown device, a modern scalar network analyzer is still only able to reduce the errors to 10 percent. On the other hand with prior implementations of vector error correction, errors can be reduced to about one percent.

Unfortunately, several significant problems remain with prior "automatic" network analyzers: they are very slow in the error correction mode; the systems are often quite awkward to use; they are unable to automatically perform a fully error-corrected measurement of forward and reverse reflection and transmission parameters (e.g., $S_{11}$, $S_{12}$, $S_{21}$, and $S_{22}$); and, broadband vector testing from RF to millimeter bands (e.g., 45 MHz to 26.5 GHz) cannot be performed with high accuracy and resolution without multiple manual reconnections.

Finally, in prior systems the data is usually displayed and analyzed only in the frequency domain, requiring either the use of a separate instrument such as a time domain reflectometer (TDR) in order to directly measure the response of the DUT as a function of time, or a powerful external computer coupled to the network analyzer to take data in the frequency domain and then perform an inverse Fourier conversion using either a truncated Fourier series or the faster Cooley-Tukey algorithm or others. Although the traditional TDR approach is fairly fast, the signal to noise ratio is low and the method is susceptible to both jitter and baseline drift. Conversely, although former computer coupled network analyzers exhibit significant improvements over the TDR method in signal to noise ratio, jitter, and drift, these systems are very slow, requiring several minutes to provide a time domain analysis and display of a DUT.

SUMMARY OF THE INVENTION

The present invention overcomes many of the limitations of the prior art by permitting automatic, high speed, and accurate measurement of the device characteristics of a DUT across a broadband of microwave frequencies. A fully error corrected measurement of four vector transmission and reflection parameters is accomplished in "real time" with the ability to analyze and display over 400 frequency points in less than one second. This speed permits the operator for the first time to view the effects of adjustments on the network under test while performing measurements with high precision. At the same time, measurement accuracies are achieved that are more than ten times as precise than have previously been attainable with commercially available instrumentation. In addition, vector testing using a single set up of a DUT can for the first time be performed across a broadband frequency range from RF to millimeter bands. Although many factors affect overall measurement accuracy, including operator technique, dynamic accuracies of 0.05 dB in magnitude and 0.3 degrees in phase can be accomplished for a device with 50 dB of insertion loss. An overall dynamic range of 100 dB, resolutions of 0.001 dB in magnitude, 0.01 degrees in phase, and 10 picoseconds in group delay, and corresponding measurement stabilities are attained depending on the particular frequency range and test set used. Further, error corrected data can be transformed between the frequency and time domains in real time without sacrificing accuracy or resolution, and can be displayed on a single cathode ray tube (CRT), plotter or other display either in the frequency domain, the time domain, or in both domains at the same time.

The time domain Fourier transforms in the present invention permit the operator to see the response of the DUT as a function of time from the application of the stimulus. While the frequency domain response of the DUT is the integrated response over the test frequency range, the time domain response presents the individual responses as a function of distance, permitting identification of specific discontinuities within the DUT and/or the test set. Responses can then be isolated within settable "gates", making it possible to virtually ignore responses outside of the gates. A response within the gate can then be transformed back into the frequency domain if so desired. It thus is possible to "gate out" measurement system responses from cables, connectors, and fixtures to measure the DUT alone. In addition, time domain data are computed at speeds similar to those of frequency domain measurements, providing the same "real time" capability, flexibility, and convenience. Also, since the time domain data are computed from the error corrected S-parameter measurements, the result is that both time and frequency data have similar accuracies.

Major elements of the present invention are the main analyzer containing the IF, signal processing, internal computing, and display circuitry, plus the operating panel used to select functions and control the entire measurement system; an RF test set and microwave to IF frequency conversion unit; and a source for test signals, such as a synthesized or swept oscillator with the desired frequency coverage. A dedicated interface between the main analyzer and the source is provided to facilitate the necessary control functions and data exchanges (handshakes) so that all source controls and monitoring can be performed from the main analyzer. Several test sets which incorporate broadband signal separation devices, balanced broadband power splitters, and high conversion efficiency samplers with flat frequency response and low crosstalk, are provided for optimized performance for different frequency ranges and connector types. A dedicated interface provides control from the main analyzer.

The main analyzer is a microprocessor based instrument that performs the signal processing and all computation associated with error correction, data formatting, and transformations. A variety of display modes are provided including log and linear magnitude versus either frequency or time, linear phase, deviation from linear phase, group delay versus frequency, standard Smith Chart, compressed Smith Chart, expanded Smith Chart, inverted Smith Charts, and "Bull's Eye" polar chart. A variety of marker read out formats are also provided. Examples of the display flexibility provided include a split screen CRT with two independent formats or two responses overlaid on a common format. In addition, any or all of the CRT displays can be directly transferred to a digital printer or plotter without need of an external computer.

The main analyzer's control panel uses a number of buttons arranged in a unique hierarchal structure to specify the complete measurement process. Several control buttons are dedicated for functions most commonly used in typical measurement applications, while less common functions are available through a series of logical menus which are accessed via several "softkeys" under control of internal firmware. Altogether, over 70 menus with over 320 functions can be reached by means of the softkeys to provide a wide range of microwave network measurements.

DESCRIPTION OF THE DRAWINGS

FIGS. 1A and 1B show a simplified block diagram of the preferred embodiment of the present invention.

FIGS. 24.1A through 24.33 show detailed schematics for the block diagrams shown in FIGS. 20 through 23.

FIGS. 25.1A through 25.6 show a detailed block diagram a section of the present invention as shown in FIG. 1.

FIGS. 26.1 through 26.6 show a block diagram and the related equations used for adjusting offset and gain errors in the IF section of the present invention.

DETAILED DESCRIPTION OF THE INVENTION

Description of the Block Diagram

Figure 1B:
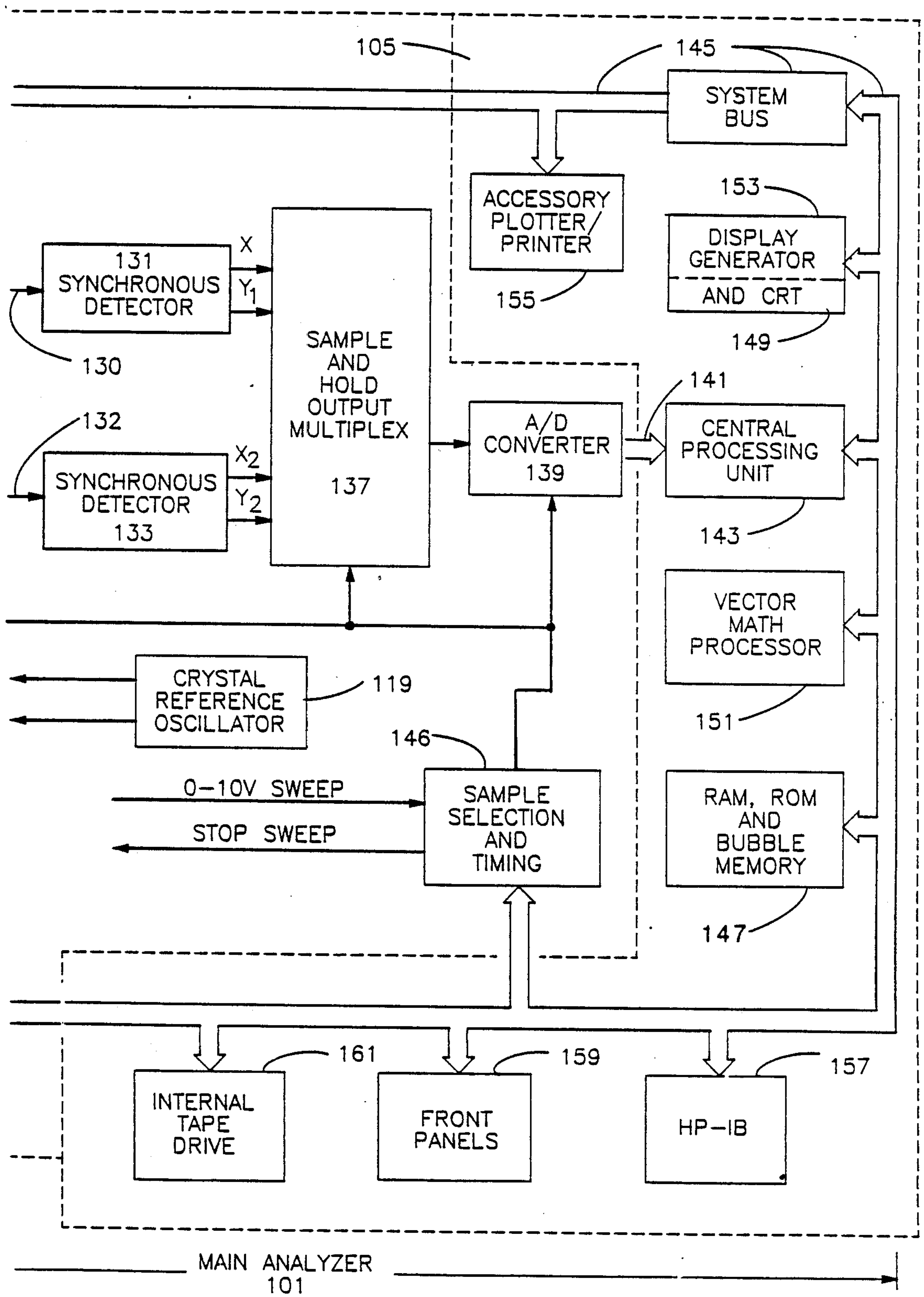

Referring to FIGS. 1A and 1B, there is shown a block diagram of the preferred embodiment. The measurement system consists first of a main network analyzer 101 with a second IF/detector section 103 and a data processor/display section 105. The main network analyzer 101 is fed by one of four configured test sets 107 which provide the signal separation circuitry 108 and first IF frequency conversion circuitry 113 for reflection/transmission (one incident signal) or S-parameter (two incident signals) measurements up to either 18 or 26.5 GHz. The frequency converter 113 alone is also available to permit the addition of user supplied signal separation devices 108 for specially configured test needs. The third main component of the measurement system is a compatible RF source 109 such as an HP 8340A synthesized sweeper, available from the Hewlett-Packard Co., Palo Alto, Calif., which can be used in either a stepped frequency mode, in which synthesizer class frequency accuracy and repeatability can be obtained by phase locking the source 109 at each of the over 400 frequency steps over the frequency range selected by the main analyzer 101 or the swept frequency mode for applications where extreme frequency range, high stability, and spectral purity are important such as in narrow band measurements over sweeps of less than 5 MHz. An HP 8350B sweeper with HP 83500 series RF plug-ins covering the entire desired frequency range or with lesser spans can also be used in applications where a more economical source is sufficient. Both the HP 8340A and the HP 8350B include the necessary analog interface signals as well as full digital handshake compatibility with the main analyzer 101. This digital handshake compatibility allows the main analyzer 101 to act as the controller for the entire system by directly managing the source 109 to provide all of the inputs such as start frequency, stop frequency, centering, span, and modulation, as well as constraints that the source 109 normally places on itself internally. For example, if a user by means of the main analyzer 101 requests the source 109 to sweep to an incompatible frequency such as 50 GHz, the source 109 will respond to the main analyzer 101 that such a frequency cannot be accommodated and the main analyzer 101 in turn informs the user of the situation. Therefore, the user need only be concerned with his interface to the main analyzer 101 and can use any source 109 that has implemented the required handshake protocols. Because the main analyzer 101 is in control of the source 109, it is also possible to automatically select a different frequency range or mode (stepped or swept) to be applied to each of the ports 1 and 2.

Integrated within each test set 107 is the first IF frequency converter 113 with three channels 113*a*, 113*b*, and 113*c* for reflection/transmission measurements and four channels 113*a*, 113*b*, 113*c*, and 113*d* for S-parameter measurements. RF to IF conversion is achieved through a sampling technique equivalent to harmonic mixing. An harmonic of a tunable local oscillator 115 is produced by an harmonic generator 116 to mix with the incoming RF signal to provide the first IF signal at 20 MHz for the incident signal a1 on the input port 1, the incident signal a2 on the output port 2, the reflected or transmitted signal b1 on the input port 1, and the reflected or transmitted signal b2 on the output port 2. Frequency tuning for the local oscillator 115 is controlled by a phase lock loop 117 that compares the signal al or a2 in the reference channel first IF to an IF reference oscillator 119 in the IF/detector section 103. Any difference between the frequency of the signal a1 or a2 in the reference channel first IF and the IF reference oscillator 119 results in an error voltage on the error voltage signal line 121 via switch 123 that tunes the local oscillator 115 to the frequency that produces the desired first IF. Switch 123 is toggled to select the most appropriate signal a1 or a2 to lock on to based either on internal criteria within the system or as defined by the user. When using the internal criteria, if the incident signal port is port 1, a1 is selected by switch 123, and if the incident signal port is port 2, a2 is selected by switch 123. This scheme allows the local oscillator 115 to track the incoming RF when the RF frequency is changing with time as in the swept mode. The integrated test set 107 permits high RF to first IF conversion efficiency even at 26.5 GHz, making possible both high sensitivity and wide dynamic range measurements. The test set architecture eliminates the extensive RF switching needed in previous test sets, removing the significant uncertainties caused by the lack of repeatability of mechanical switches. The reflection/transmission test sets 107 require no internal switching since the fourth channel 113*d* is not required, and the S-parameter test sets 107 use only one electronic PIN diode switch located inside of the test set 108 such that it cannot contribute to uncertainties as it is switched prior to the ratio node of the power splitter.

Several new concepts have been incorporated in the IF/detector section 103 of the main analyzer 101 to increase the precision of IF processing and signal detection. Most of the phase lock hardware 125 in the phase lock loop resides in this section 103. Harmonic mixing number and local oscillator pretuning are controlled digitally via lines 127 and 129 and offer phase lock and tracking performance that is precisely repeatable from sweep to sweep. Before the first IF signals proportional to a1, a2, b1, and b2 are sent to the synchronous detectors 131 and 133, they are down converted to a second IF at 100 KHz by mixers 138 and go through a pair of multiplexers 136 and variable gain amplifiers 134 in the second IF section 135. Amplifier gain is controlled and calibrated digitally and is varied by autoranging to optimize the second IF signal levels 130 and 132 available to the synchronous detectors 131 and 133 resulting in an order of magnitude improvement in signal to noise performance and dynamic accuracy for the detector output signals x1, y1, x2, and y2. Likewise, the synchronous detectors 131 and 133 employ a digital architecture that allows for precise control of their 90 degree phase shift function which results in improved accuracy as well as common mode rejection of local oscillator phase noise effects. Finally, the detected signals x1, y1, s2, and y2 are multiplexed with a sample-and-hold/multiplexer (MUX) 137 and then digitized by an analog-to-digital converter (ADC) 139 with 19 bits of resolution. Each ADC conversion takes approximately 40 microseconds and four readings are made for each RF frequency data point to provide the real and imaginary data for both the reference signal 130 and test signal 132.

The output of the ADC 139 is then passed on a 16 bit bus 141 to a high speed central processor (CPU) 143 which includes a microprocessor such as a Motorola 68000 as well as the associated microprocessor system interrupt and I/O control circuitry. Because the CPU 143 is integrated into the main network analyzer 101 it is possible to utilize a multi-tasking architecture to make more efficient use of time than has previously been possible. This architectural integration also permits substantial increases in data processing flexibility and system control performance. Via a dedicated system interface 144 and bus 145, the CPU 143 controls the RF source 109, the test set 107, and, along with the sample selection and timing circuitry 146, all of the IF processing functions including the phase lock hardware 125, autoranging in the IF amplifiers 134, detection by the synchronous detectors 131 and 133, and digitization by the ADC 139. The CPU 143 periodically initiates a self calibration sequence for the IF amplifiers 134, synchronous detectors 131 and 133, and the ADC 139 and the resulting gain, offset, and circularity changes are stored in memory 147, so that the changes in the IF amplifiers 134 can be subtracted from measured results. The CPU 143 also performs data processing functions for the system. The signals in the IF section 103 are detected as linear real and imaginary components of a vector quantity and the CPU 143 processes the detected data into a variety of formats for presentation on the CRT display 149. By digitally computing the various measurement formats, improvements in dynamic range and meaningful resolution are gained over traditional analog circuit processing techniques.

With past network analyzer systems, an external computer was required in order to characterize and remove systematic errors.

With the present invention, this capability exists internally with enough storage capacity (i.e., 256K bytes of random access memory (RAM) and 256K bytes of bubble memory) in the memory 147 to retain up to two 401 point 12-term error corrected traces of data. (Note: each byte of memory consists of eight bits of data storage.) In addition, the measured data can be converted to show the response of the DUT 111 as a function of time (time domain) using an internal Fourier transform process. All data processing takes place virtually in real time by means of parallel data processing in the CPU 143 aided by the incorporation of a dedicated, floating point, complex number, vector math processor 151 designed specifically for fast vector computations The multiplication of two complex numbers by the vector math processor 151 requires only one operation with the product available within 20 microseconds, so that error corrected measurement results are available 1000 times faster than in the prior art. By means of an internal vector graphics generator 153, the real time processed data is then immediately presented on the CRT 149, on a digital printer/plotter 155, or via an IEEE-488 (HP-IB) interface and bus 157 to external devices. Present as well as past states of front panel controls 159, past and present traces of data, and entire system calibrations can also be stored in and recalled from the memory 147 or loaded and read from a built-in tape drive 161 by means of the system interface and bus 157 under control of the CPU 143.

Integrated Processor

As explained previously and shown in more detail in FIG. 2, the built-in CPU 143 with its 16-bit multi-tasking microprocessor 201, I/O interface circuitry 203, and interrupt system and I/O control circuitry 205, and the vector math processor 151 with its math processor circuitry 207 and math controller 209 are key to the high speed performance of the present invention. The variable precision and variable function architecture of the vector math processor 151 make it adaptable to perform both floating point and complex number math operations. The vector math processor 151 operates on a 16 MHz clock 208 generated within microprocessor 201 and is controlled, by a state machine 210 (not shown) with 1K byte of read only memory (ROM) for storage of microcode as shown in Appendix C of U.S. Pat. No. 4,636,717 (issued 1-13-87) and incorporated here by reference.

To insure maximum processing speed, processing power is distributed among several internal controllers in addition to the microprocessor 201 and the math processor 207. An additional state machine with 1K byte of microcode is used by the display generator 153 to create the display of both data and display formats from a list in the display RAM 217 which drives the CRT 149 in the display section 218 from a line generator 219 which positions a new X-Y point pair approximately every four microseconds. Likewise both the system bus 145 and the external HP-IB bus 157 have their own internal processors 221 and 223. Finally, controllers 225, 227, and 229 are dedicated to the tape drive 161, the bubble memory 231 within memory 147, and the front panel 159 respectively.

Memory is also distributed according to functional need. 16K bytes of ROM 233 within memory 147 are used for internal test software and boot-up of the system. The main system software is taken from a first 128K bytes of non-volatile bubble memory 235 within memory 147 and placed into 128K bytes of main RAM 237 also within memory 147. 8K bytes of ROM 239 are dedicated to the bubble memory 231 for use in test and boot-up. 60K bytes from the second 128K bytes of bubble memory 235 are used to store equation coefficients used in vector error correction. The remaining 68K bytes of bubble memory 235 contain recallable instrument states, measurement memory data and additional system software. The contents of the CRT display are stored in 32K bytes of display RAM 217. The remaining 96K bytes of display RAM 217 are used for data, coefficients, and control tables. Personal back-up storage, test software, additional system software, and data can be stored and accessed as desired on cartridges in the tape drive 241.

Figure 2:
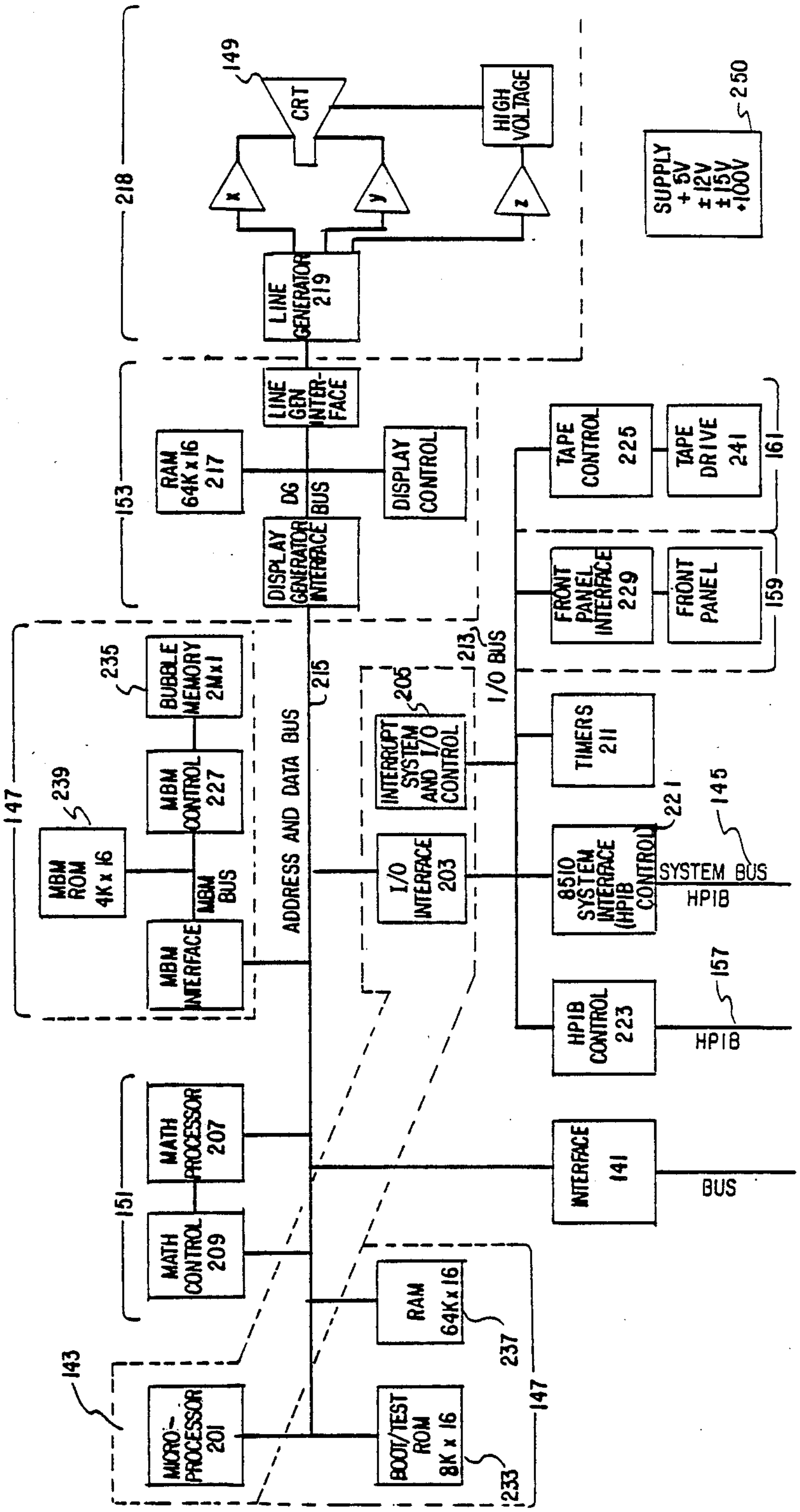
FIG. 2 shows a detailed block diagram of a portion of the preferred embodiment shown in FIG. 1.
Figure 335A:
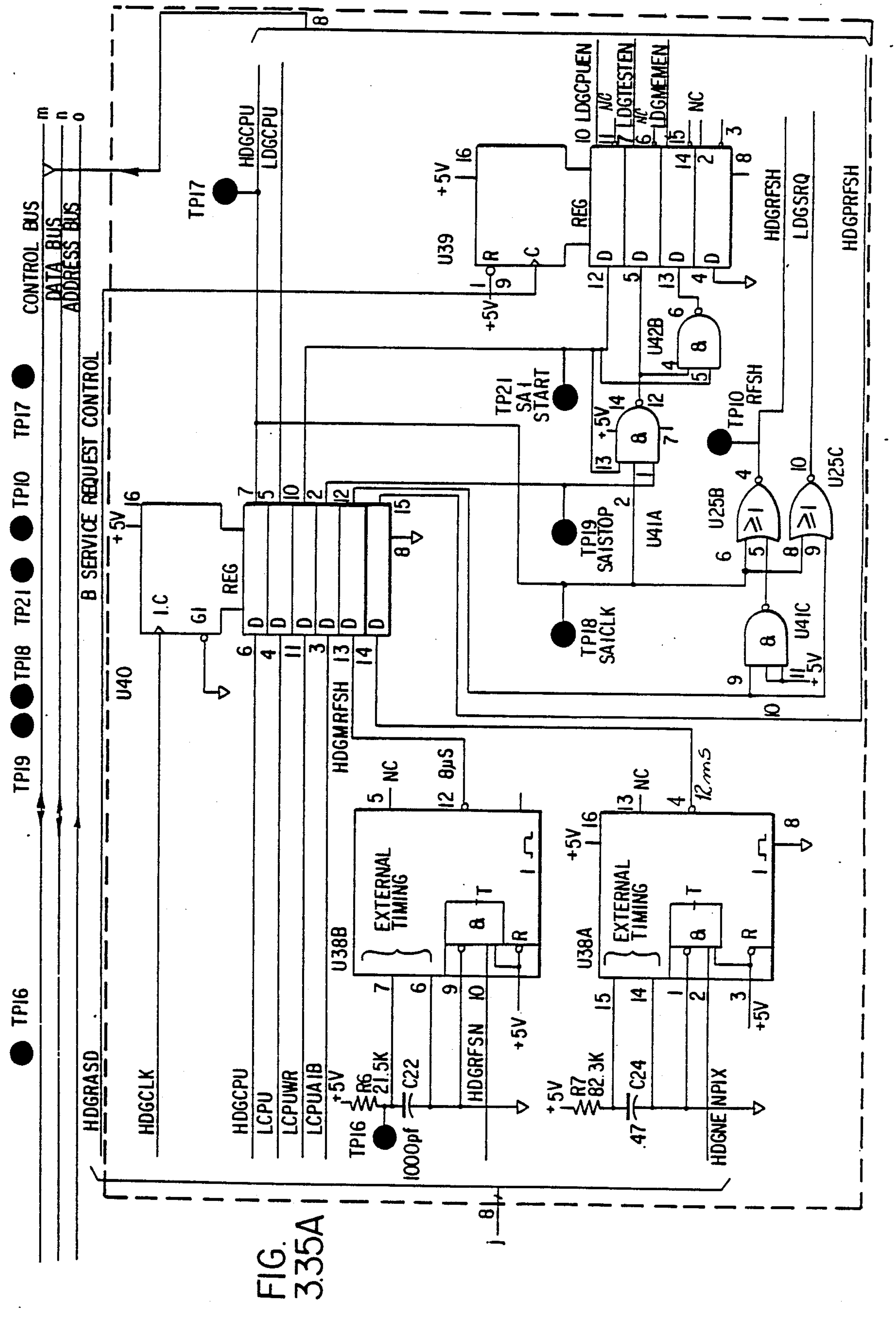
Figure 356B:
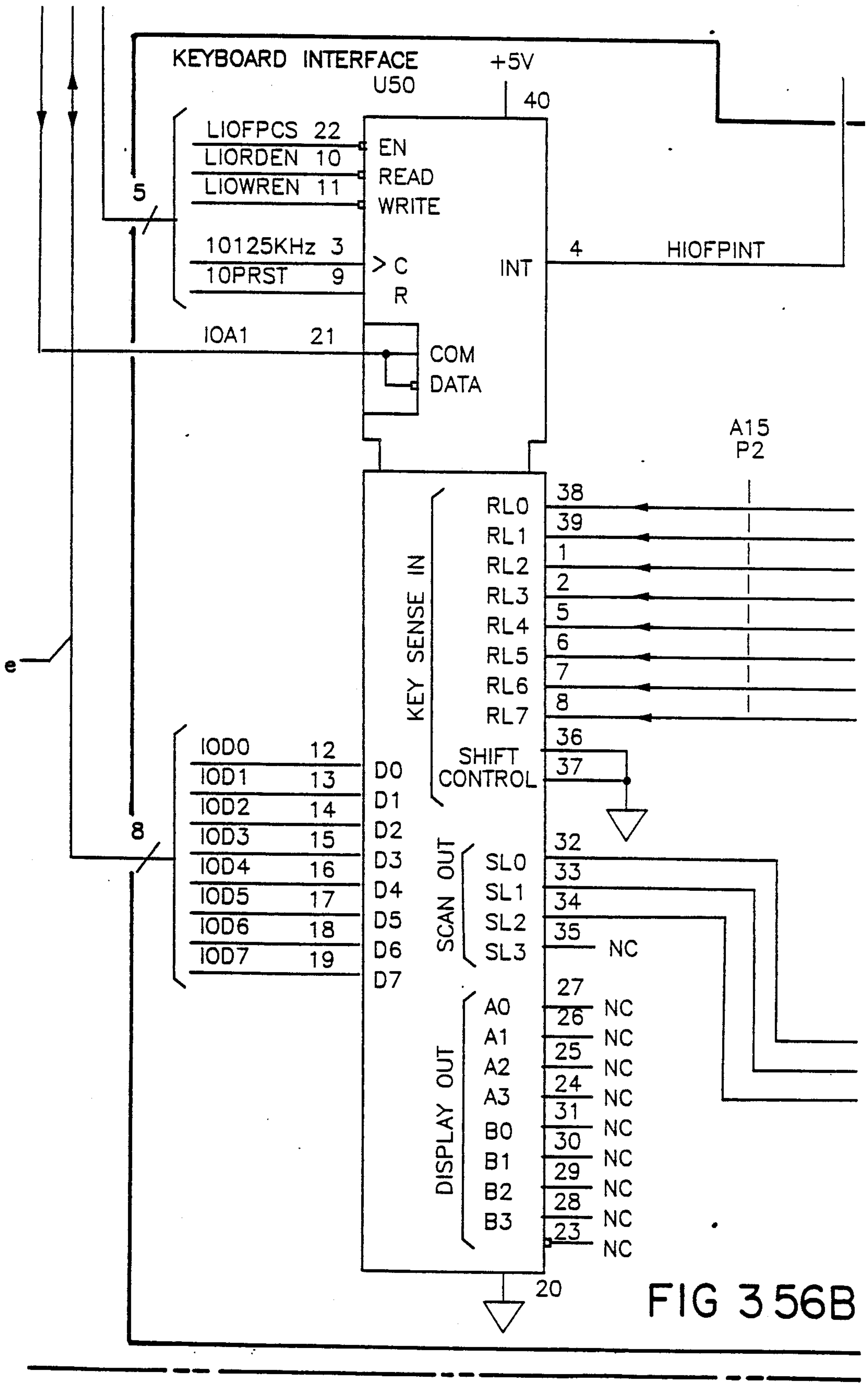
Figure 362A:
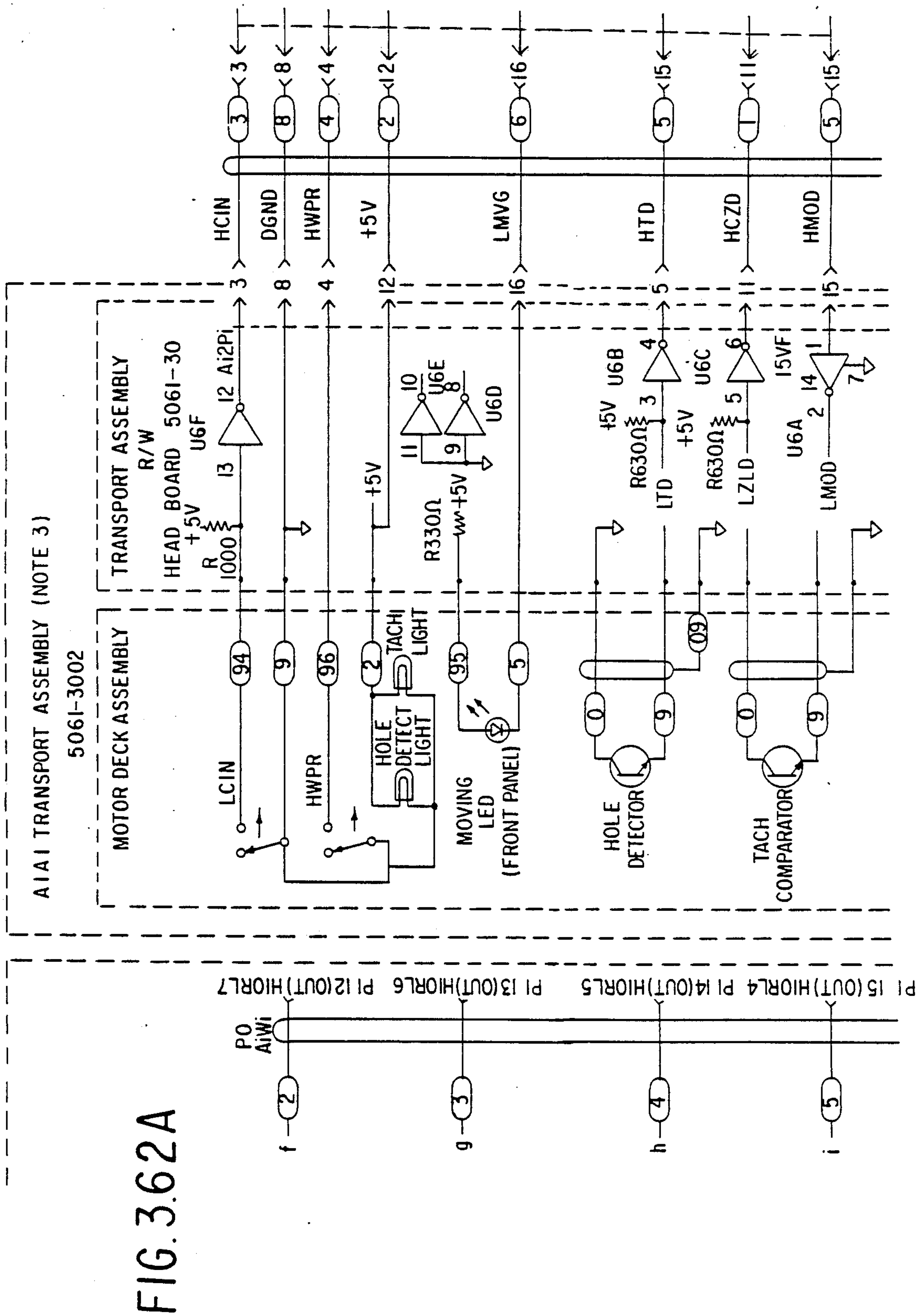
Figure 3:
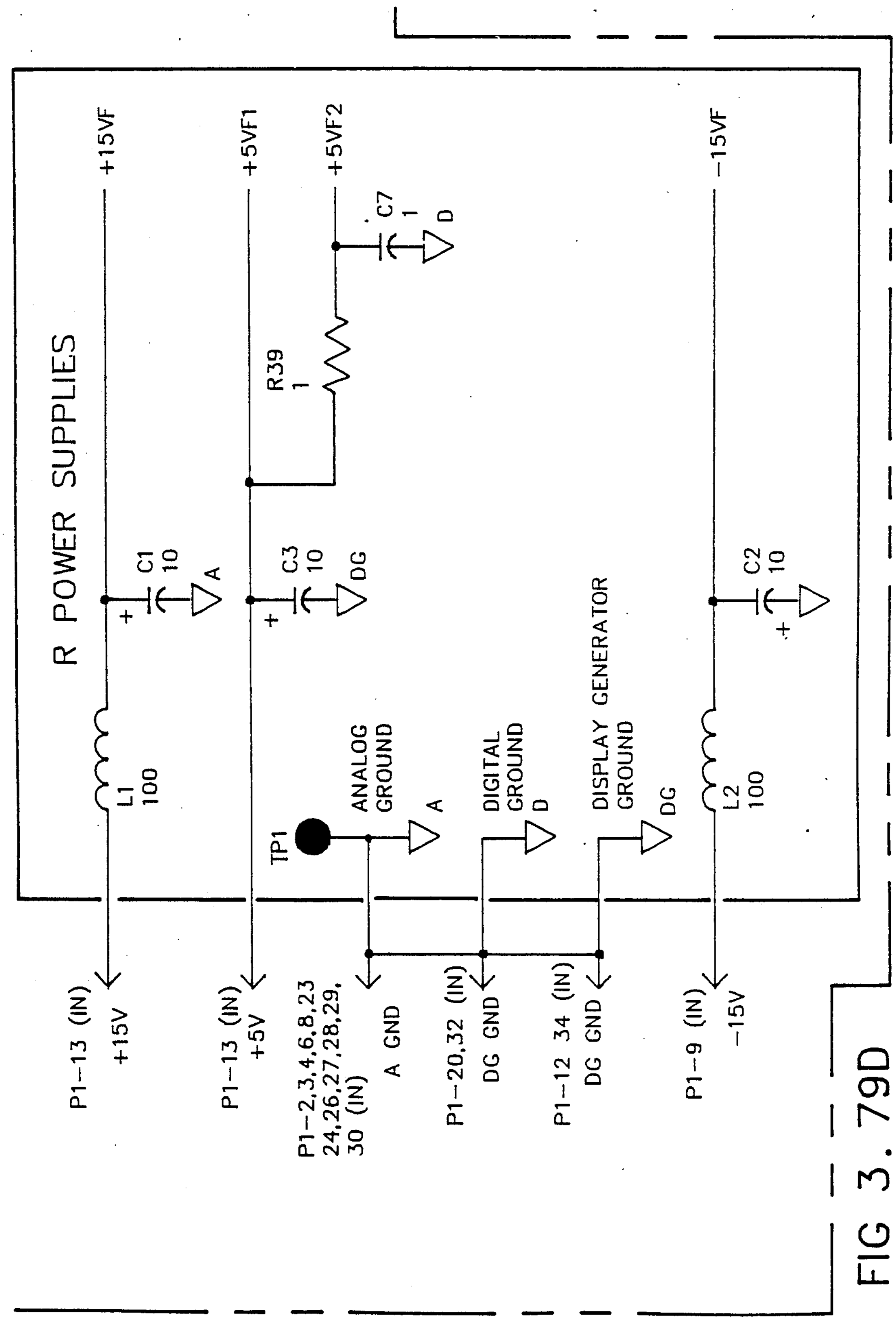
FIGS. 3.1A through 3.102 show the schematics for the detailed block diagram as shown in FIG. 2.

FIGS. 3.1A through 3.102 show the detailed schematics of the block diagram shown in FIG. 2. The CPU 143 is shown in FIGS. 3.1A–3.12 and 3.49A–3.54, with the microprocessor 201 at FIG. 3.2 and the I/O interface and Interrupt 203 and 205 at FIGS. 3.49A–3.54. The ROM 233 is shown at FIGS. 3.5A and 3.5B, RAM 237 is at FIGS. 2.19A–3.11, and bubble memory 147 is at FIGS. 3.24A–3.32. The display generator 153 is shown on FIGS. 3.33–3.48, the display section 218 is shown on FIGS. 3.64A–3.90 with the line generator 219 at FIGS. 3.79A–3.90. Interface 144 is shown on FIG. 3.51 and the external HP-IB interface 233 and the system interface 221 are shown on FIGS. 3.5A through 3.58D. The timers 211 are shown on FIG. 3.52. The front panel interface 229 is shown on FIGS. 3.55A–3.56 and the remainder of the front panel 159 is shown on FIG. 3.60A–3.63. The tape drive 161 is shown on FIGS. 3.57A through 3.57D. Finally, the various low voltage power supplies 250 for data processor/display section 105 are shown in FIGS. 3.91A–3.102.

The vector math processor 151 as shown in FIGS. 3.13–3.22B is constructed from a series of commercially available medium scale integrated circuits as follows: U56, U74, and U97 are 74S153 multiplexers, U37 is a 74S175 D-type flip flop, U91 is a 74LS385 adder, U65–68 and U82–85 are 25LS14 multipliers, and U69–72 and U86–89 are 25LS299 shift registers. The 16 MHz clock 208 is shown in detail in FIGS. 3.1A and 3.1B and the state machine 210 is shown in detail in FIGS. 3.13–3.14C.

DESCRIPTION OF THE FRONT PANEL, MENUS, AND DISPLAYS

Figure 4A:
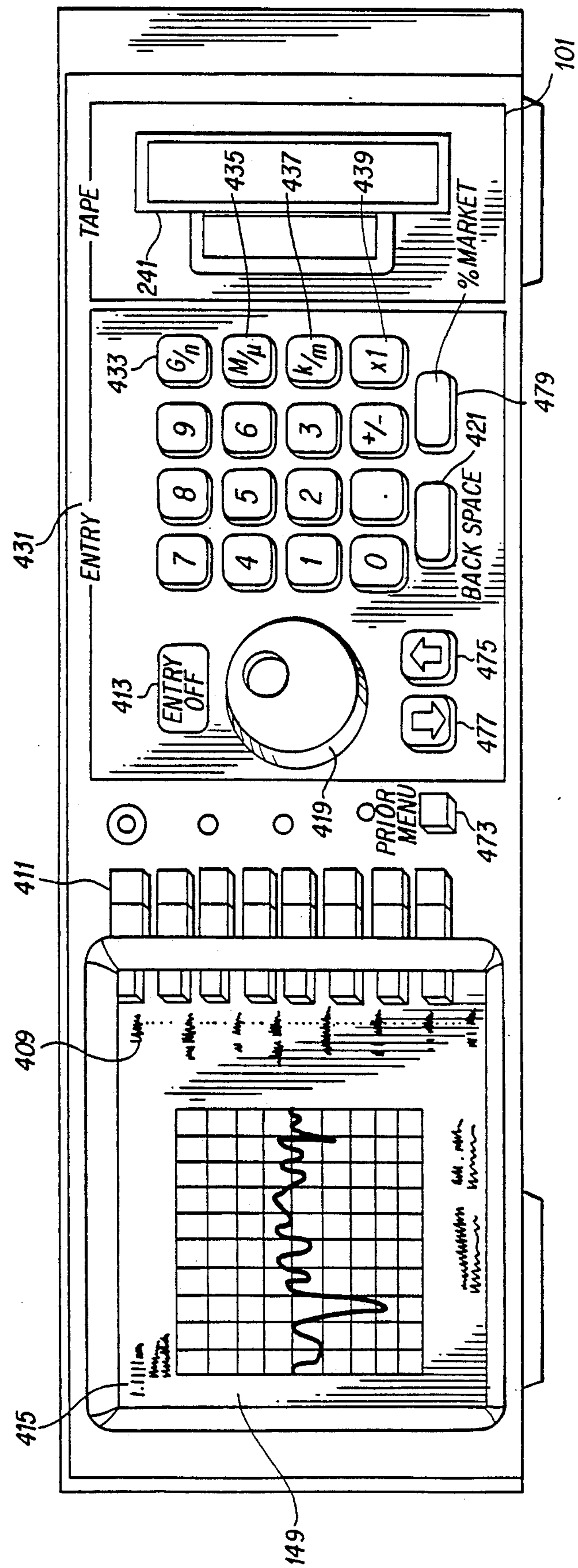
FIGS. 4A through 4C show the front panel controls of the preferred embodiment of the present invention.
Figure 4B:
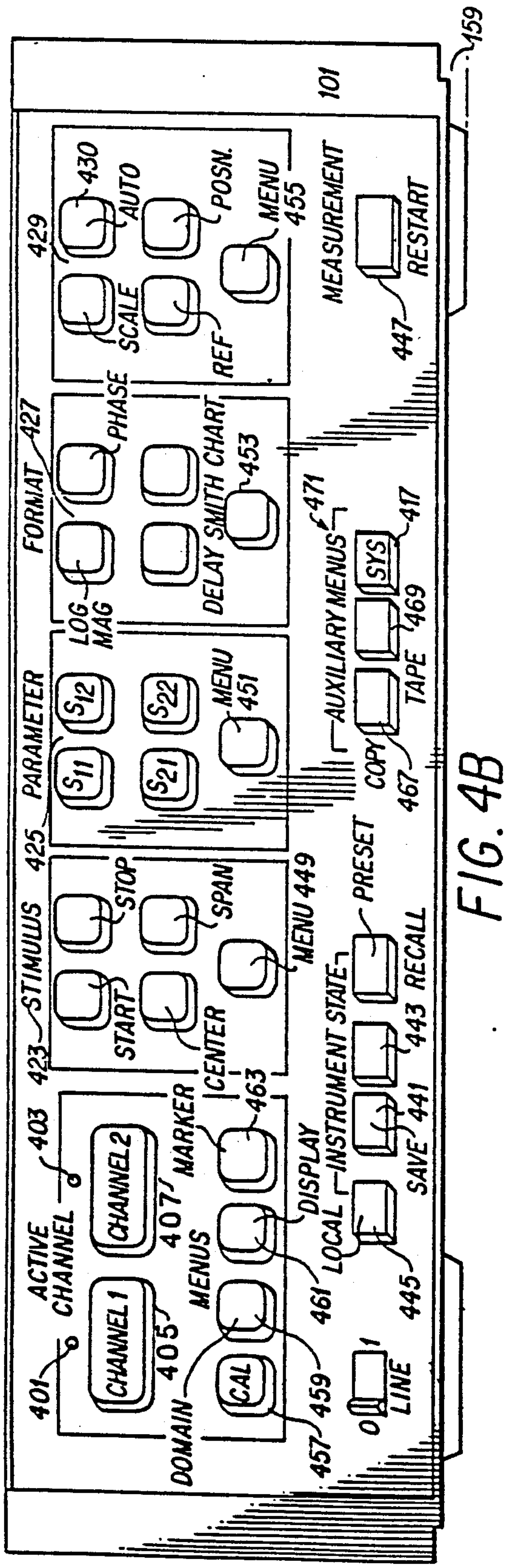
Figure 4C:
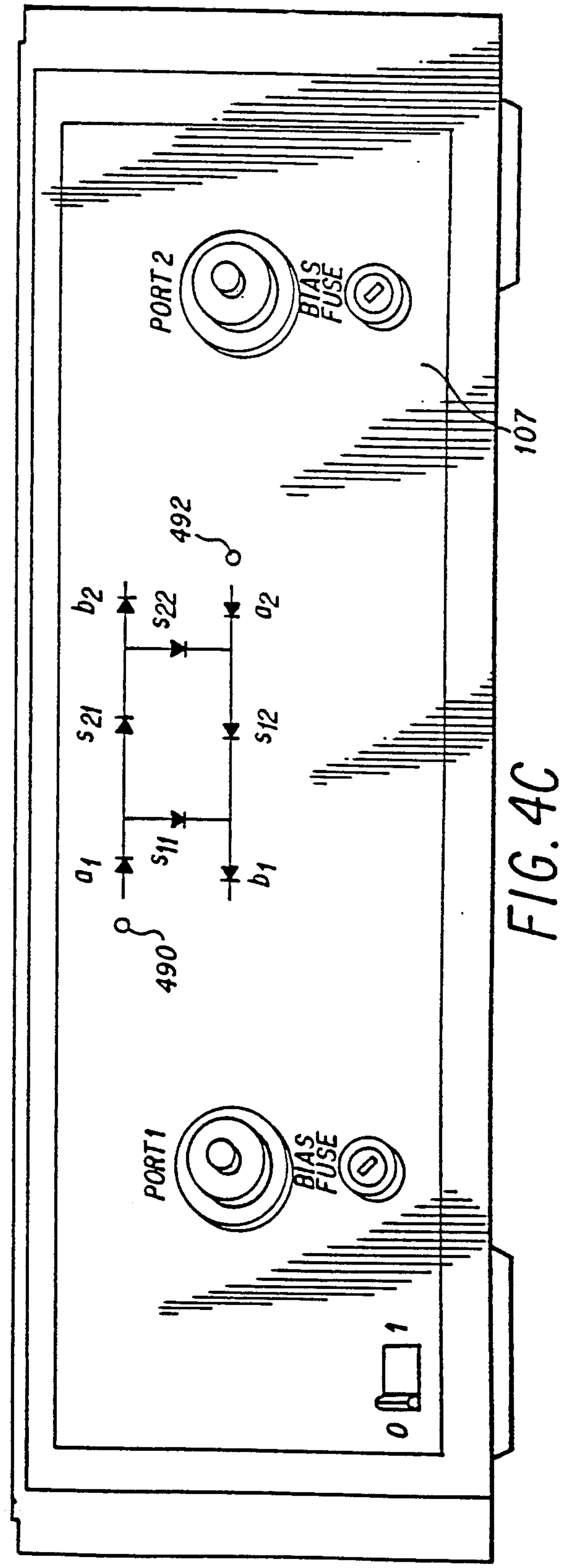

FIGS. 4A through 4C show the front panel 159 of the present invention with capability to set up and control two independent measurements with two measurement channels selected by channel buttons 405 and 407. When the indicator 401 or 403 above the channel buttons 405 and 407 is lit, the respective channel is selected as the channel controlled by the front panel 159. The CRT 149 is also available for viewing on the front panel 159. Annotation on the CRT 149 includes graticules if desired, labels for one or two data side by side or overlaid data traces, reference line position symbols, and channel labels for the parameter being shown, the format of the display, reference line value, horizontal and vertical scales, and the value of any markers being used. Source frequency or other stimulus information is shown on the CRT 149. An active entry menu area 409 in which no data traces are displayed is also provided on the CRT 149 for identification of the current active functions which may be selected via the CRT softkeys 411. The softkeys 411 therefore extend the accessible instrument capabilities by adding selectable functions without adding to front panel complexity. An Entry Off key 413 clears the active entry state. Prompts, indications of instrument functions, procedural instructions, error messages, and procedural advisories also appear on the CRT 149. If a message is important to the measurement, a beep sound signals the operator to look at the message. A title area 415 is also provided for up to 50 characters of information about the measurement being viewed. To use the title function, the Auxiliary Menus System button 417 is pressed, followed by one of the softkeys 411 which will be labeled Title. The RPG knob 419 is then rotated to position an arrow symbol below the first letter desired and displayed on the CRT 149. The user then presses a Select Letter softkey 411 and the selected letter will appear in the title area 415. This process is repeated as desired along with desired Space softkeys 411 and Backspace keys 411, terminated with the Done softkey 411 and cleared with the Clear Softkey 411.

All basic measurement functions are controlled by the four groups of keys (SPFR) labeled Stimulus 423, Parameter 425, Format 427, and Response 429 which respectively are used to set the stimulus, select the parameter, select the format, and adjust the response for the desired measurement. The Stimulus keys 423 provide direct control of the source 109 to set the frequencies, source power, sweep time, and other related functions. The Parameter keys 425 select the parameter to be measured. With the source 109 applied to port 1, $S_{11}$ is selected for reflection (return loss) and $S_{21}$ is selected for transmission (insertion loss or gain). Likewise, with the source 109 applied to port 2, $S_{22}$ is selected for reflection and S12 is selected for transmission. Appropriate control of the test set 107 is enabled automatically depending on the parameter selected. The Format keys 427 place measured parameter data in the desired format: logarithmic (dB), phase, group delay, and Smith Chart, or, alternatively, SWR, linear magnitude, $R+jX$ impedance, and others. The Response keys 429 set the scale per division, reference value, or reference position, or let the AUTO function via the Auto key 430 automatically place all the measured data on the entire display 149 with pleasing values for a reference value and scale. Additional Response functions include averaging, smoothing, and an electronic line stretcher.

Figure 5:
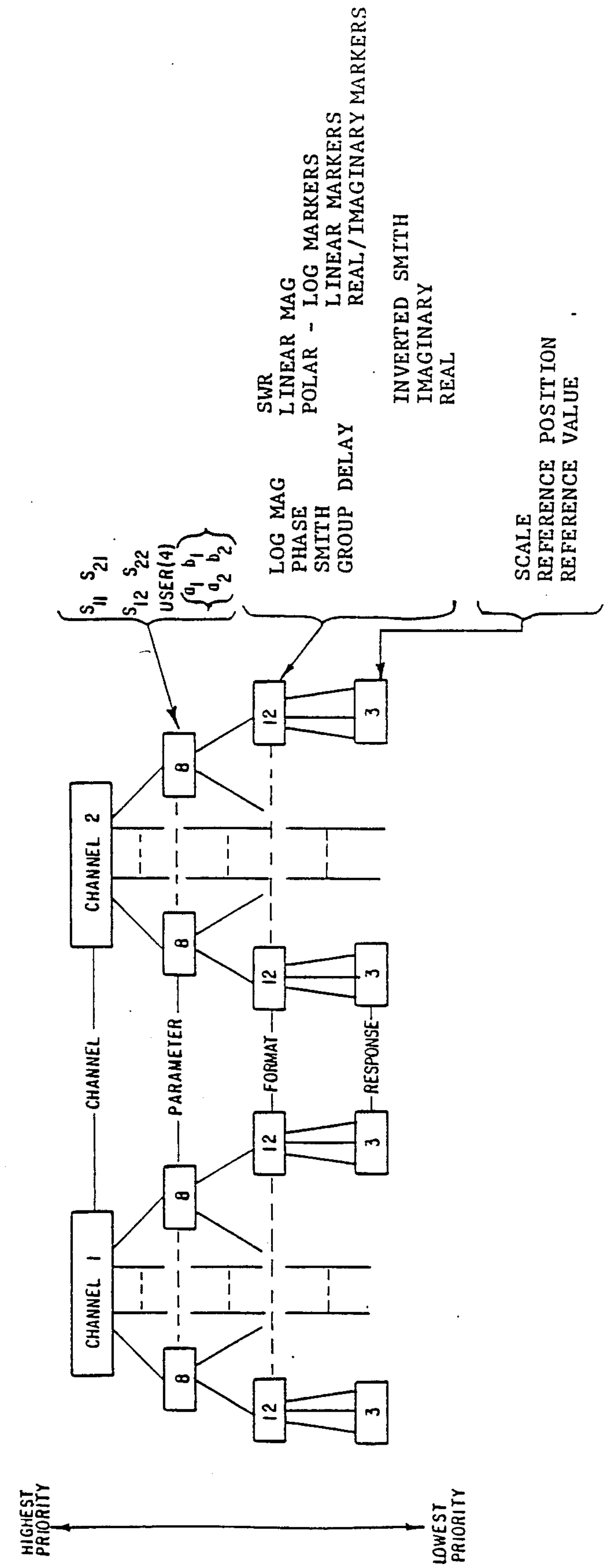
FIG. 5 shows a hierarchal SPFR structure used in the preferred embodiment of the present invention.

The hierarchal Channel-Parameter-Format-Response (CPFR) structure used in the present invention is shown in FIG. 5. Once a particular path through the CPFR structure has been chosen, this path is stored in the memory 147 for latter reference. Then, when one of the CPFR structure items is changed, such as changing the Parameter from $S_{11}$ to $S_{22}$, the entire path previously associated with the new item is automatically reestablished for use by the entire system. Thus, for example, if Channel 1 is presently being used to measure the Parameter $S_{11}$ with the display in log magnitude Format and a 0.2 dB/division vertical Scale, and if Channel 1 was previously used to measure the Parameter $S_{22}$ with the display in linear magnitude Format and a 5 milliunits/-division vertical Scale, then when the Parameter is changed from $S_{11}$ to $S_{22}$ the Format automatically changes from log magnitude to linear magnitude and the Scale automatically changes from 0.2 dB/division to 5 milliunits/division. In addition, since the CPFR structure is an hierarchal tree and since Parameters are lower in the hierarchy than Channels, the Channel number will not be changed when the Parameter is changed as in the present example. Similarly, if the Channel is changed, the Parameter, Format, and Response are all subject to automatic reestablishment, and if only the Format is changed, only the Response is subject to automatic reestablishment. Naturally, any of the SPFR values may be altered from the front panel 159 as desired by the user. The result of this hierarchal SPFR structure is a substantial added degree of speed and convenience for the user.

The numeric Entry keys 431 are used when a numeric value is to be entered, which entered value is terminated by one of the four terminator keys G/n 433, M/u 435, k/m 437, and xl 439. The four terminator keys 433–439 are used when the entered value being terminated has the order of magnitude respectively of either Giga ($10^{+9}$) or nano ($10^{-9}$), Mega ($10^{+6}$) or micro ($10^{-6}$), kilo ($10^{+3}$) or milli ($10^{-3}$), or a basic unit ($10^{0}$) such as dB, degree, second or hertz. The four terminator keys 433–439 are therefore unique in that no particular set of measurement units is permanently assigned to any of the keys, so that substantially fewer terminator keys are required than in the prior art.

Pressing the Save key 441 followed by one of the CRT softkeys 411 saves the current complete state of the network analyzer 101, and the controlled functions of the source 109 and the test set 107. The Recall key 443 followed by a CRT softkey 411 is used to recall the previously stored instrument state. The hierarchal SPFR structure is an integral part of the instrument state.

The Tape key 469 in the Auxiliary Menu Block 471 displays soft keys 411 for controlling the internal tape drive 241. The tape functions allow initialization of cassette tapes, storing data to tape, loading data from tape, deleting data on tape, erasing the last deletion of data, and display of a directory of tape contents on the CRT 149. Tape data can be a combination of any of the following:

1. Measurement data after second IF and detector correction (raw data), after error correction and/or time domain conversion (data), or after formatting (formatted data) for either or both measurement channel.

2. Memory data stored after time domain conversion and before formatting from an earlier measurement, individually or all at once.

3. Graphics that the user has created on the CRT 149 FIG. 4.

4. One or all sets of machine states stored by pressing the Save key 441 FIG. 4B.

5. One or all sets of error coefficients measured and stored by pressing the CAL key 457, and the subsequent Calibrate soft keys 411 labeled in the area 409.

6. One or all sets of calibration standard descriptions (Cal Kits)

7. A complete machine dump consisting of all sets of all data described in 1 through 6.

8. System, service, or demo software, including options, revised versions, and new software.

When measurement data is loaded from tape to any point in the Data Processing path, the display on the CRT 149 is updated to show the loaded data with subsequent data processing.

If an external device has control of the system using the HP-IB interface 157, pressing the Local key 445 returns control of the system to the front panel 159.

The Restart key 447 is used to restart any previously started measurement or data handling operation such as sweeping or averaging.

Three blocks of the front panel keys along with the softkeys 411 provide an additional feature called MENUS for functions which are used less frequently than the functions to which dedicated keys are assigned. The four Menu keys 449, 451, 453, and 455 provide extensions of the SPFR keys 423, 425, 247 and 429; the keys labeled Cal 457, Domain 459, Display 461, and Marker 463 in the Menus block 465 allow selection of various measurement and display modes; and the keys labeled Copy 467, Tape 469, and System 417 under the Auxiliary Menus block 471 provide measurement related input and, output operations. Shown in U.S. Pat. No. 4,636,717 Appendix A is a list of the various MENUS along with the softkey labels, shown in quotation marks, as displayed in the menu area 409 of the CRT 149 opposite the related softkeys 411. Also shown for the softkey labels in Appendix A are the names of the constants assigned to the softkey labels as found in the system source code in said U.S. Pat. No. 4,636,171 Appendix B.

When a MENU is displayed on the CRT 149 any current choices are indicated by a line under the labels and mutually exclusive and/or closely related choices are connected by dots. Pressing the softkey 411 beside any label in area 409 either executes the function or presents another set of MENU labels. If the selected function requests an input, the RPG knob 419 and Entry keys 431 are used to respond. Additional functions are selected by pressing another key. A Prior Menu key 473 is used to return to the previously displayed MENU in a series of menus. If the previously displayed MENU was the first in a series of MENUS, the MENU is cleared from the CRT 149.

Figure 6:
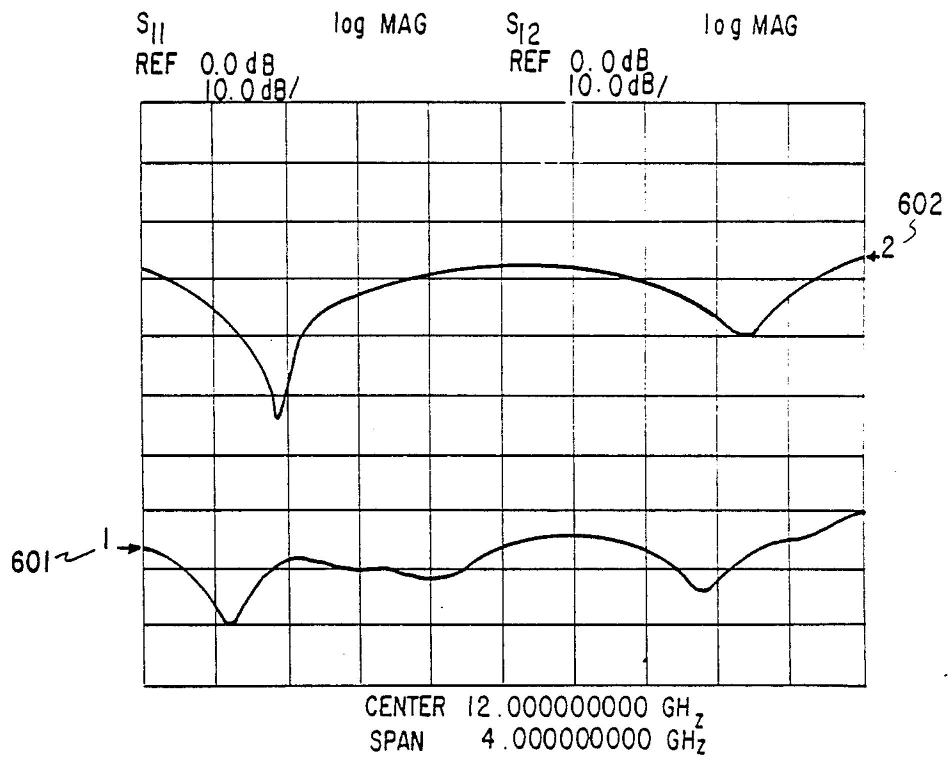
FIGS. 6 through 15, 17, and 18 show several of the measurements which can be performed with the preferred embodiment of the present invention.
Figure 7:
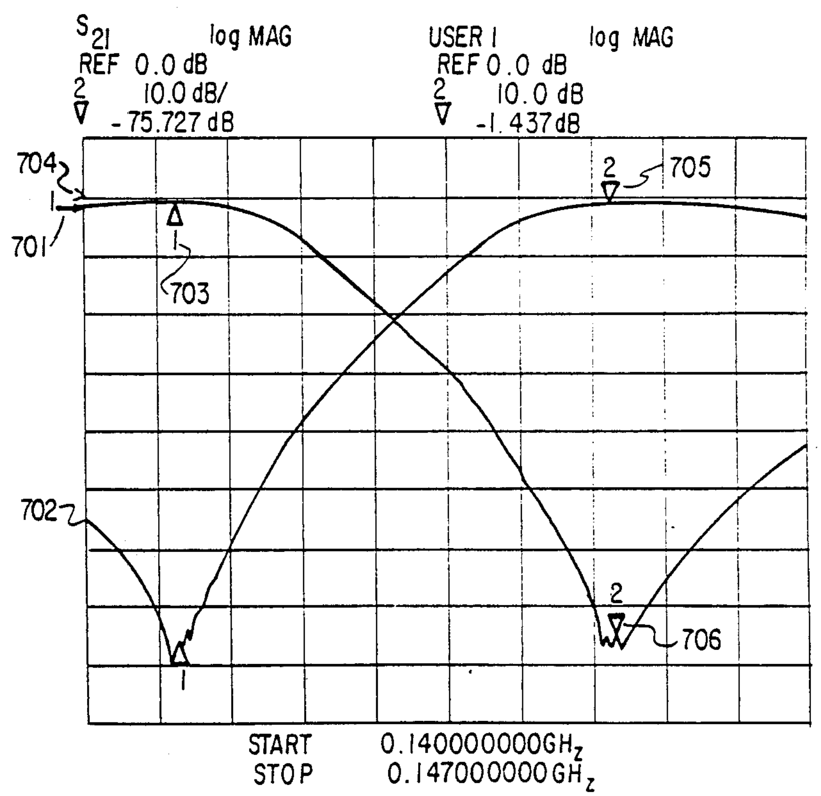
Figure 8:
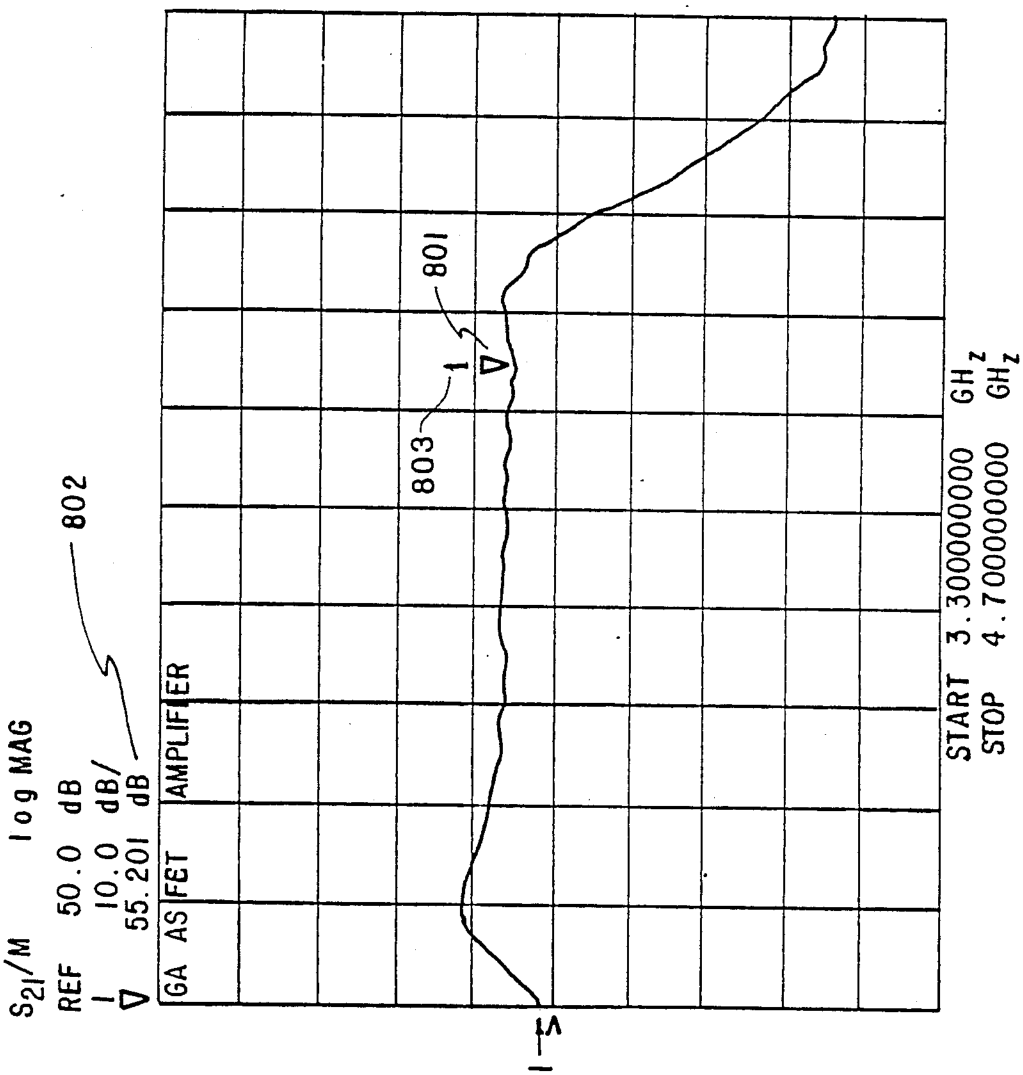
Figure 9:
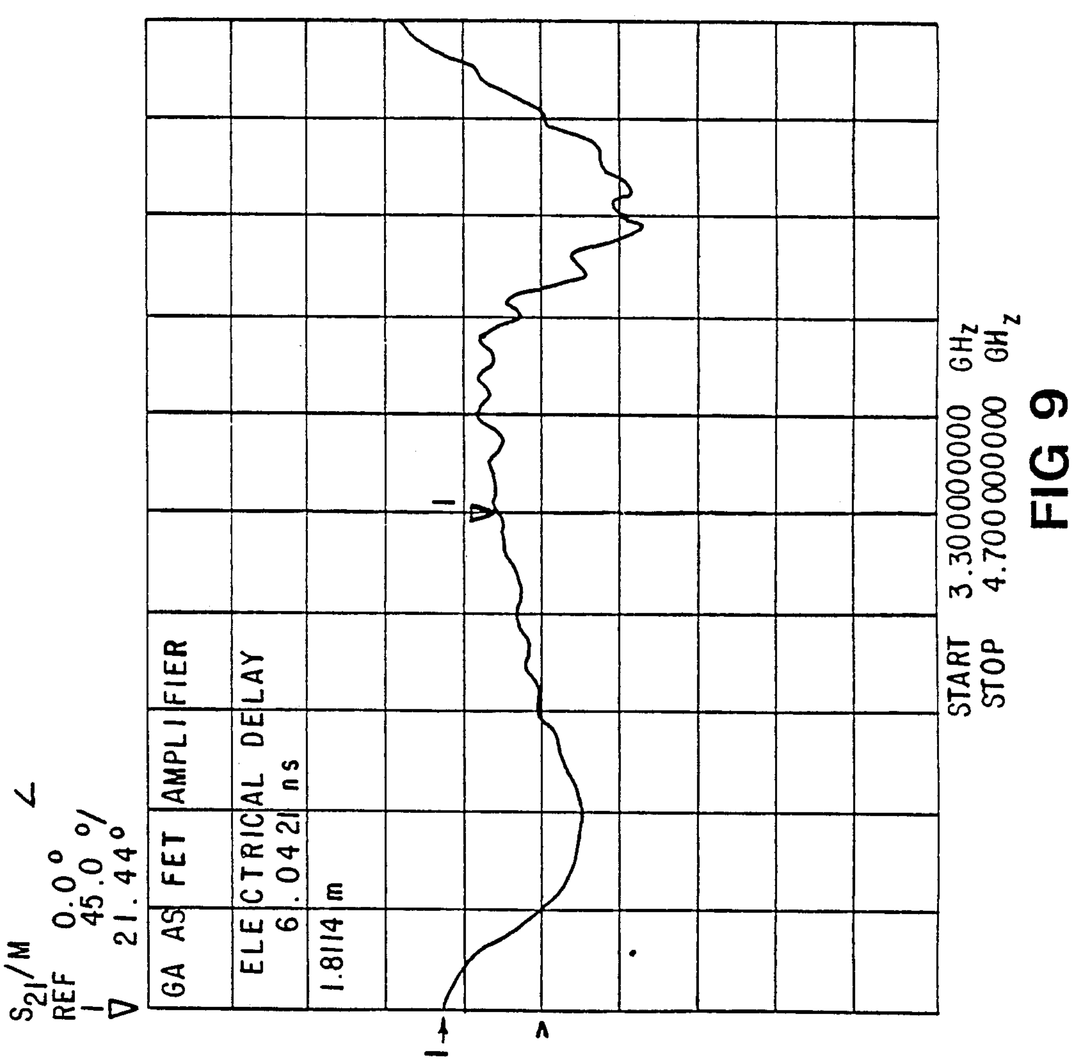
Figure 10:
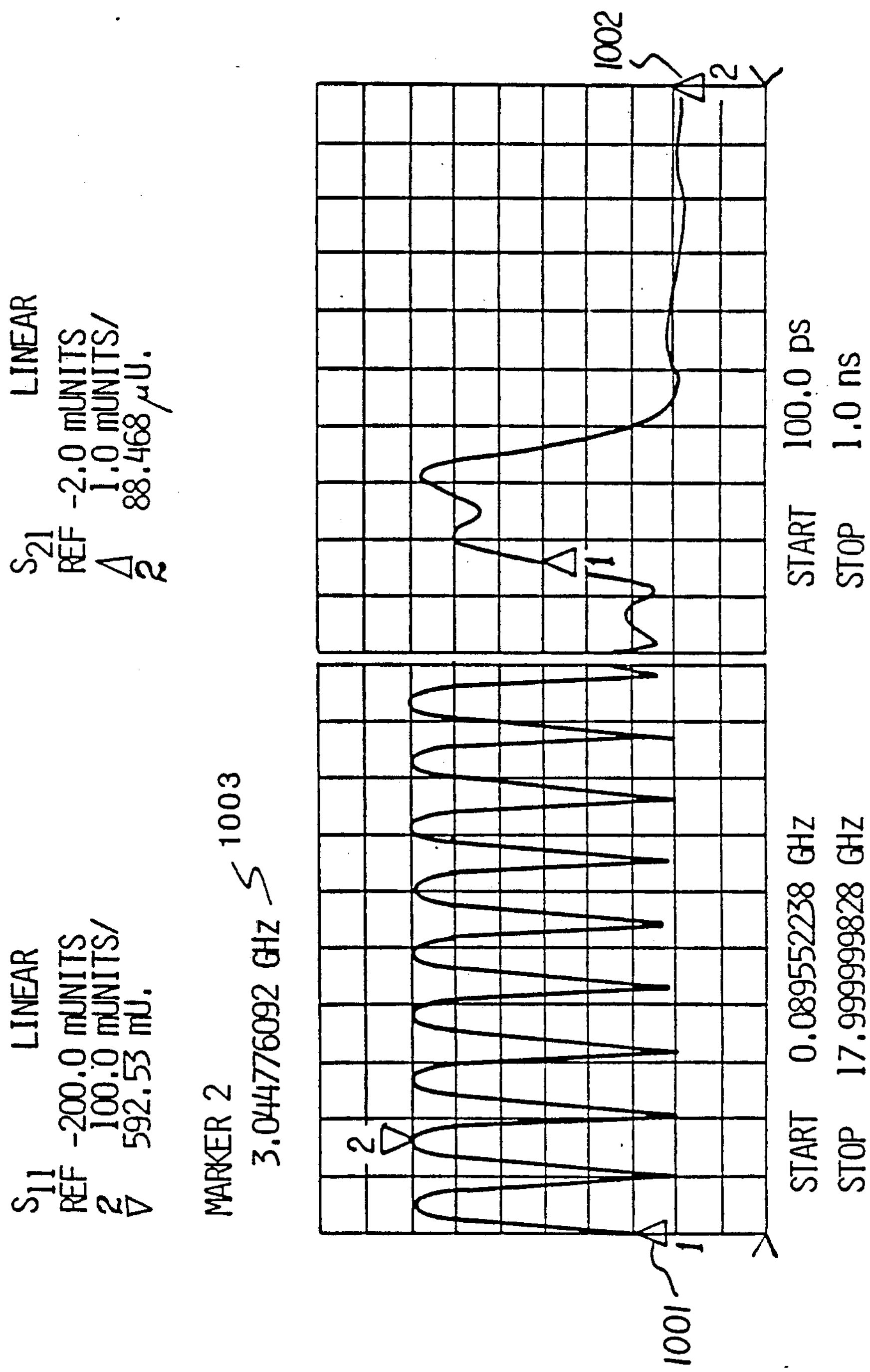
Figure 11:
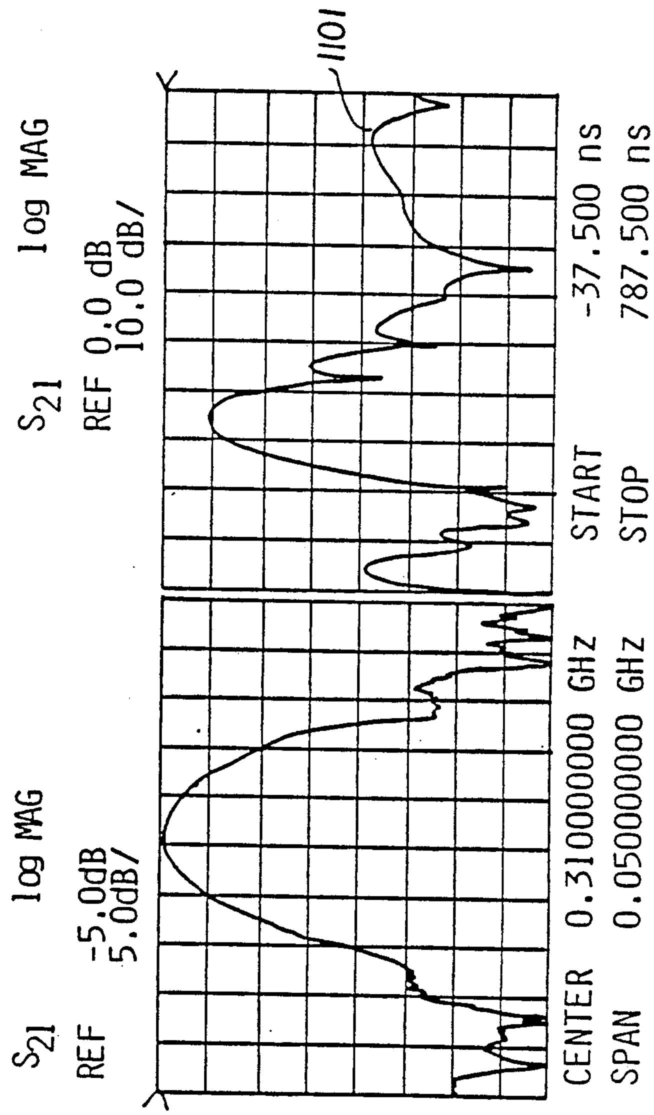
Figure 12:
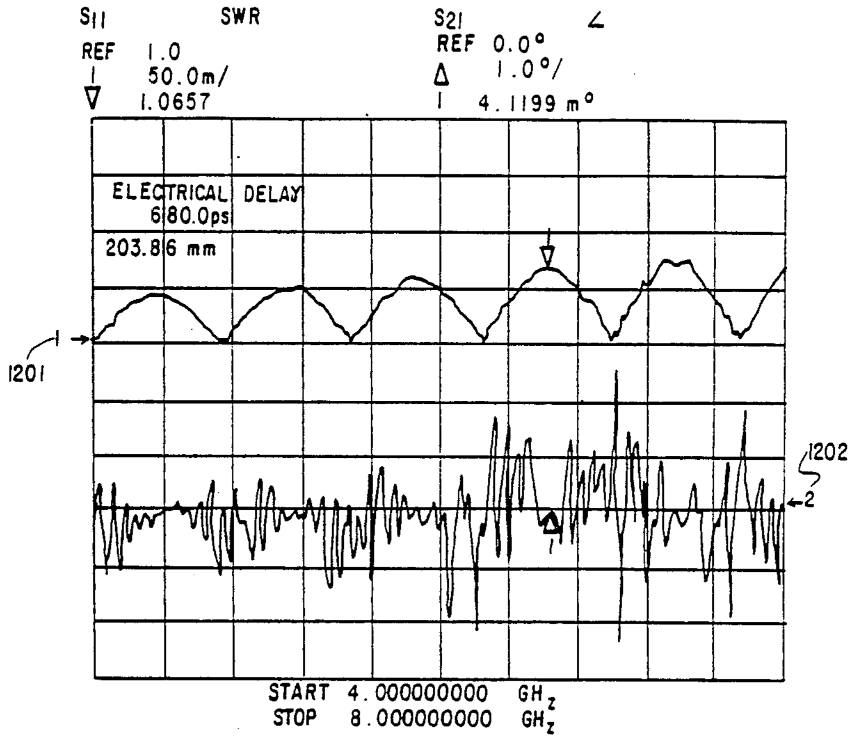
Figure 13:
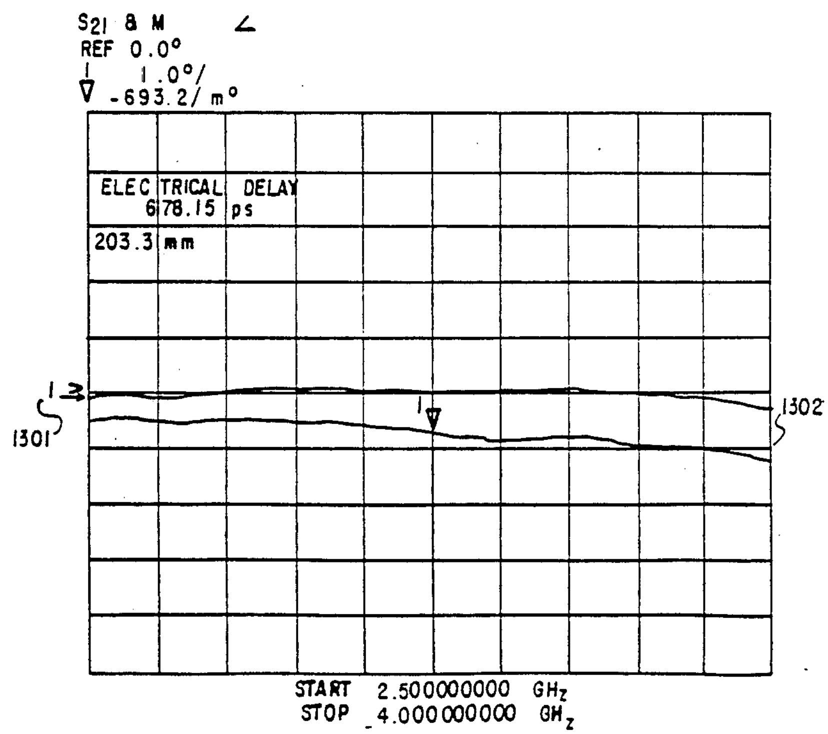
Figure 14:
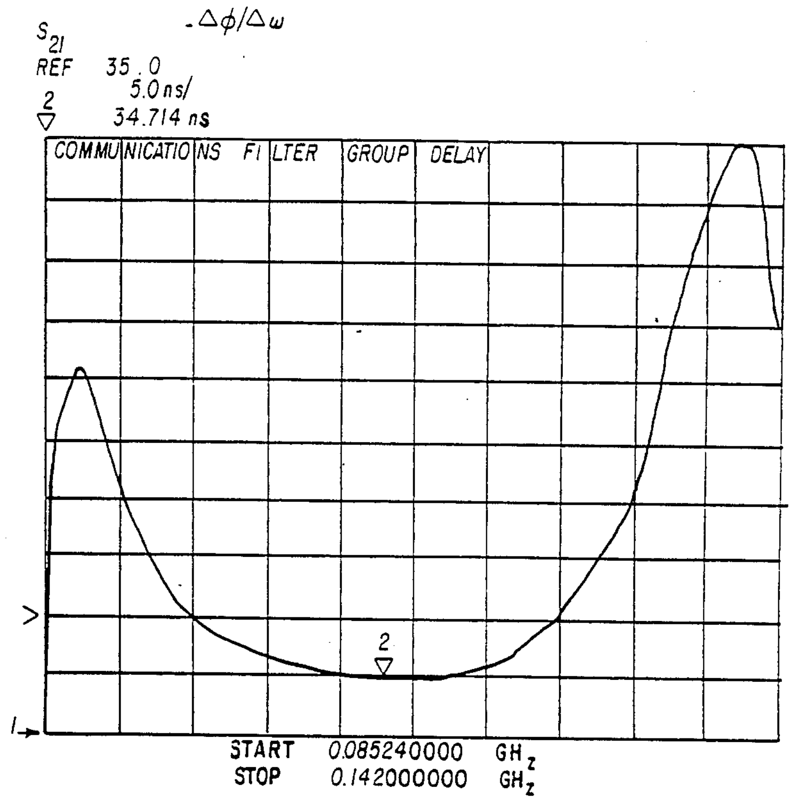
Figure 16:
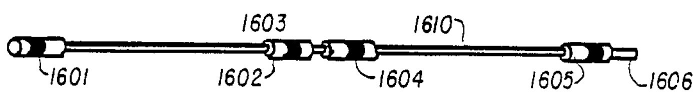
FIG. 16 shows a coaxial line as measured and displayed in FIG. 15.
Figure 15:
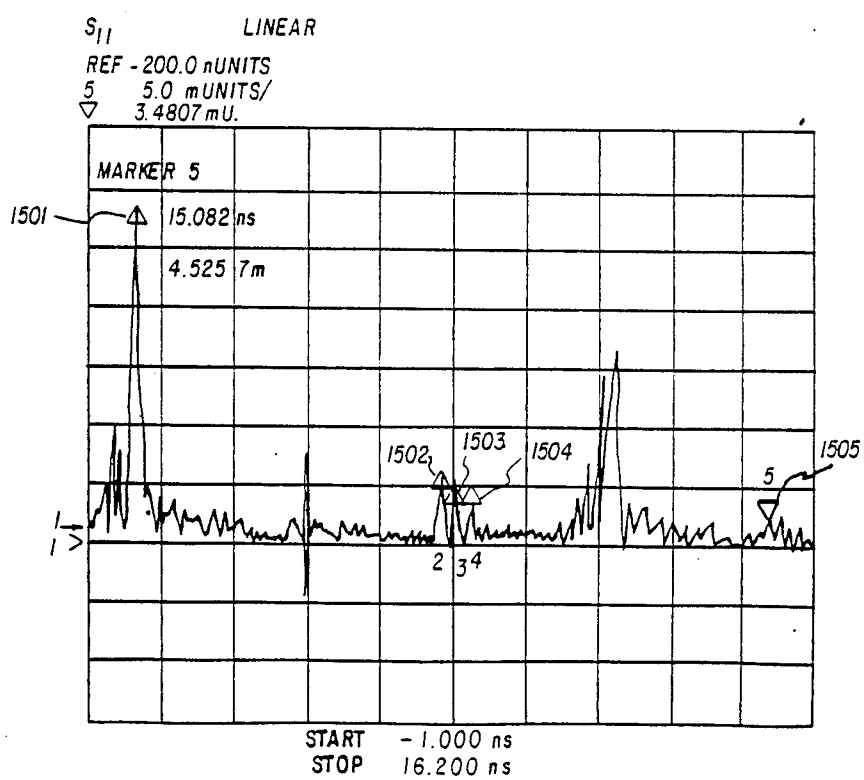
Figure 17:
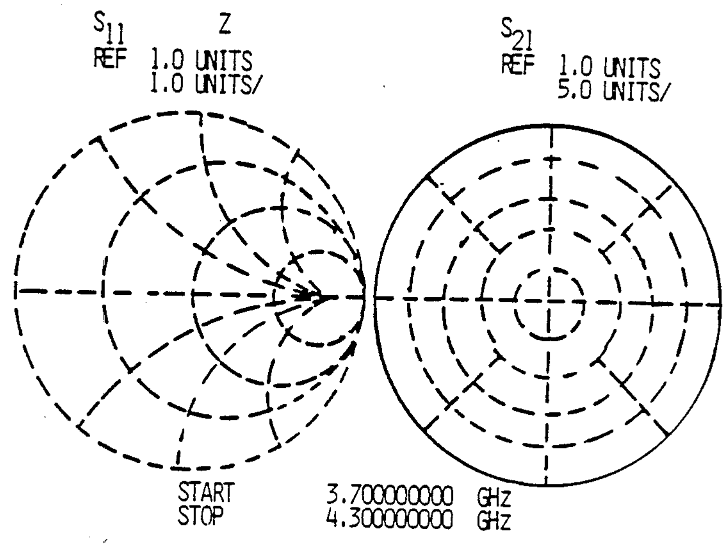
Figure 18:
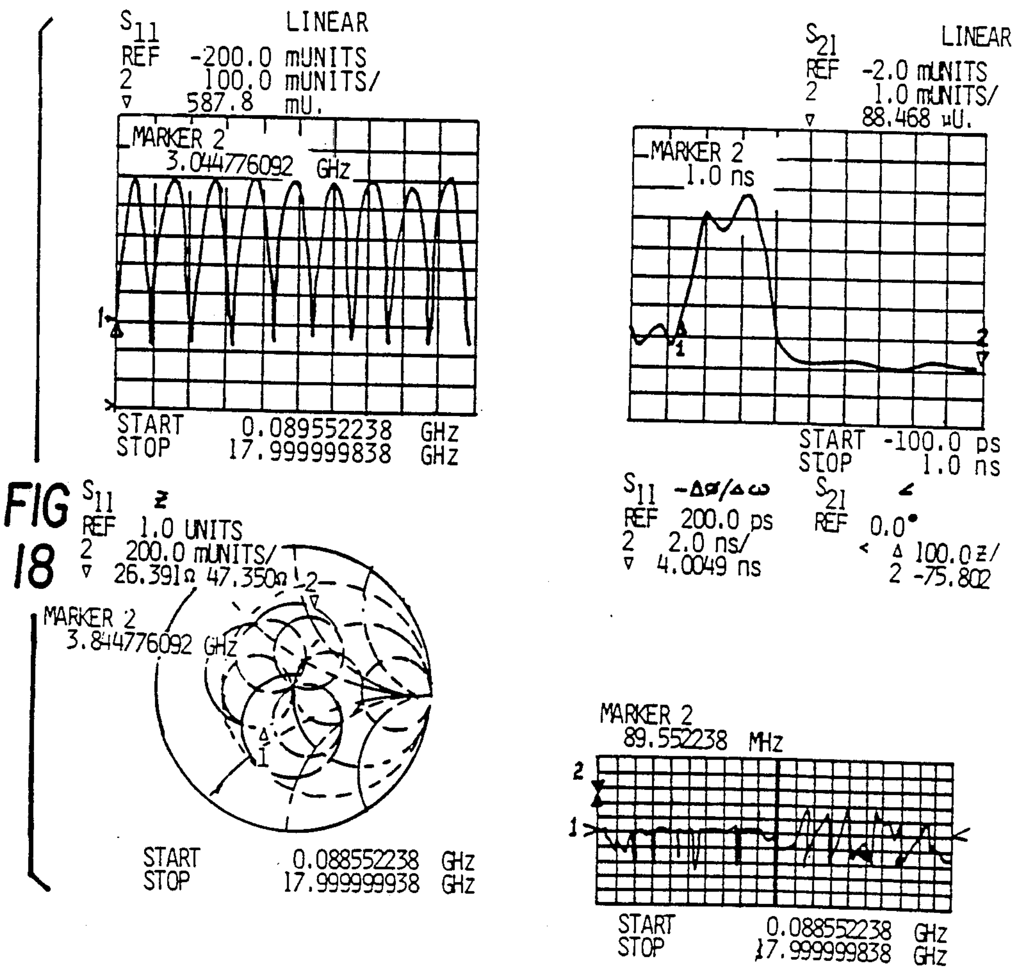

Several of the wide variety of displays available either on the CRT 149 or on the printer/plotter 155 are shown in FIGS. 6 through 15, 17 and 18. FIG. 6 shows a typical dual trace measurement of two different parameter $S_{11}$ and $S_{12}$ signified by trace number 601 and 602 respectively with the same log magnitude format used for example to adjust a circulator's impedance and isolation simultaneously in real time. FIG. 7 shows two overlaid traces 701 and 702 for ports 2 and 3 respectively of a three port multiphase filter. FIG. 8 shows a single trace of an amplifier and an attenuator combined to show the total closed loop response of the active circuit. FIG. 9 shows a measurement trace of the same active amplifier as in FIG. 8 calibrated in a user defined reference plane with an electrical delay of 6.0421 nanoseconds making use of the electronic line stretcher. FIGS. 10 shows a unique split screen of two simultaneous measurements of two different parameters $S_{11}$ and $S_{21}$ as displayed on the CRT 149. FIG. 11 shows another version of the split screen display, split to simultaneously show the response of a surface acoustical wave filter (SAW device) in both the frequency and time domains. Note the appearance of the triple travel peak 1101 on the time domain response. FIG. 12 shows two different parameters displayed with two different formats (i.e., SWR and deviation from linear phase) for traces 1201 and 1202. FIG. 13 shows a previous measured trace 1301 from "memory" and the current measurement trace 1302 of the same parameter $S_{21}$ which can be used for matching transmission lines within 0.01 degrees. FIG. 14 shows the display of group delay for a typical RF communications filter which with the present invention can be viewed and adjusted for optimum group delay flatness in real time. FIG. 15 shows a linear display of an RF circuit in the transformed time domain along with a series of five markers 1501–1505 to mark the five different corresponding discontinuities respectively (i.e., connector 1601, connector 1602, adapter 1603, connector 1604, and termination 606) of a coaxial line 1610 as shown in FIG. 16 . FIG. 17 shows a split screen of two polar plots as displayed simultaneously on the CRT 149. Each of the FIGS. 6 through 15 and 17 are displays of actual RF devices as shown in real time on the CRT 149. These same displays can also be printed on the printer/plotter 155 as they are shown on the CRT 149 with whatever size change is desired and in a variety of colors. If desired, various of the CRT displays can also be combined on the printer/plotter 155 as a four quadrant plot as shown in FIG. 18.

Up to five different markers for the traces on the CRT 149 are accessed via the Marker key 463 along with the softkeys 411 as shown in FIG. 15 by markers 1501–1505. The markers are controlled in a number of different ways. The numeric entry keys 431 are used to set the markers to an exact numeric position, the RPG knob 419 is used to move the markers along the traces on the CRT 149, the Up Step key 475 and the Down Step key 477 move the markers right and left one horizontal division. The precise value of the marker position is also immediately displayed on the CRT 149 as shown in FIG. 8 by marker 801 and the displayed value 802. The marker annotation 803 is displayed adjacent to the marker 801. In addition, as the markers are moved along the traces, the marker annotation moves with the markers so that the user can always immediately identify which marker and related annotation is which. A further function available through the softkeys 411 is Delta Markers for reading the difference in the trace value between an Reference Marker and a Delta Marker as shown by markers 703 and 706 in FIG. 7. The RPG knob 419 is used to sequentially position the Reference Marker and the Delta Marker and the difference in trace value is immediately displayed on the CRT 149. Also available with the aid of the softkeys 411 are Marker to Minimum and Marker to Maximum functions to move a selected marker to the minimum or maximum value of the displayed trace as shown by markers 1001 and 1002 in FIG. 10. A further function is the display of marker frequency, as shown by 1003 in FIG. 10, or other stimulus value, as shown by 1505 and the corresponding interface due to corrector 1605 in FIG. 15. FIG. 16

The equal marker key 479 enters the current stimulus or amplitude value, as appropriate, of the most recently active marker for the current active function. For example, selecting the reference value key (429 FIG. 4B) followed by the equal marker key 479 causes the amplitude of the marker to be entered for the reference value. Similarly, selecting the stimulus start key (423 FIG. 4B) followed by the equal marker key 479 causes the frequency, or other stimulus value, of the marker to be entered for the start function.

Description of the Test Sets

Figure 19B:
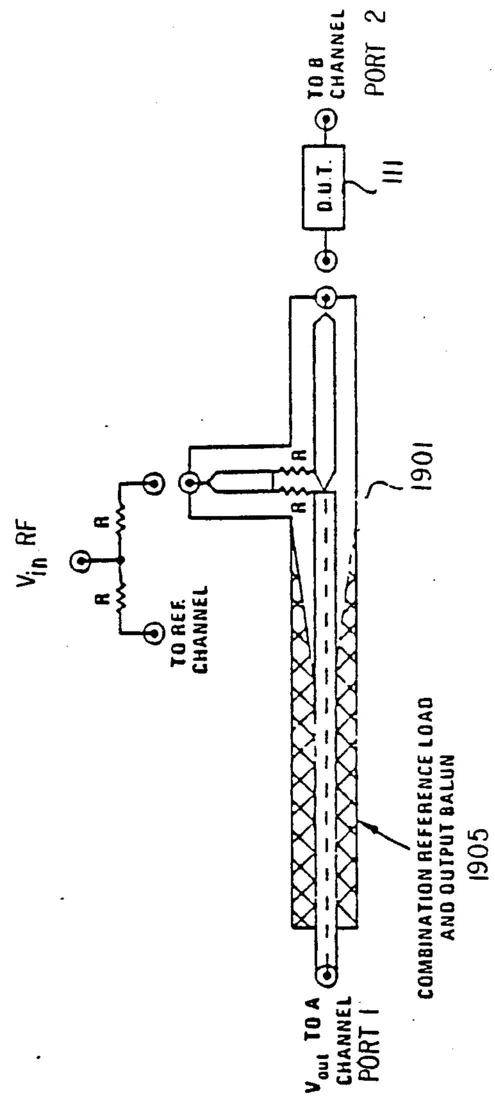
FIGS. 19*a* and 19*b* show a schematic and a cross sectional view respectively of a wideband RF directional bridge for use in a preferred embodiment of the present invention.
Figure 19A:
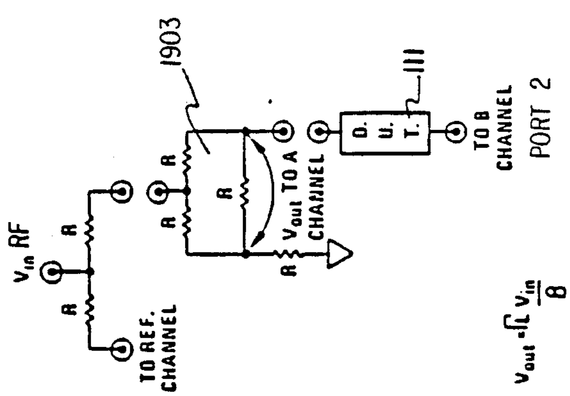
Figure 20:
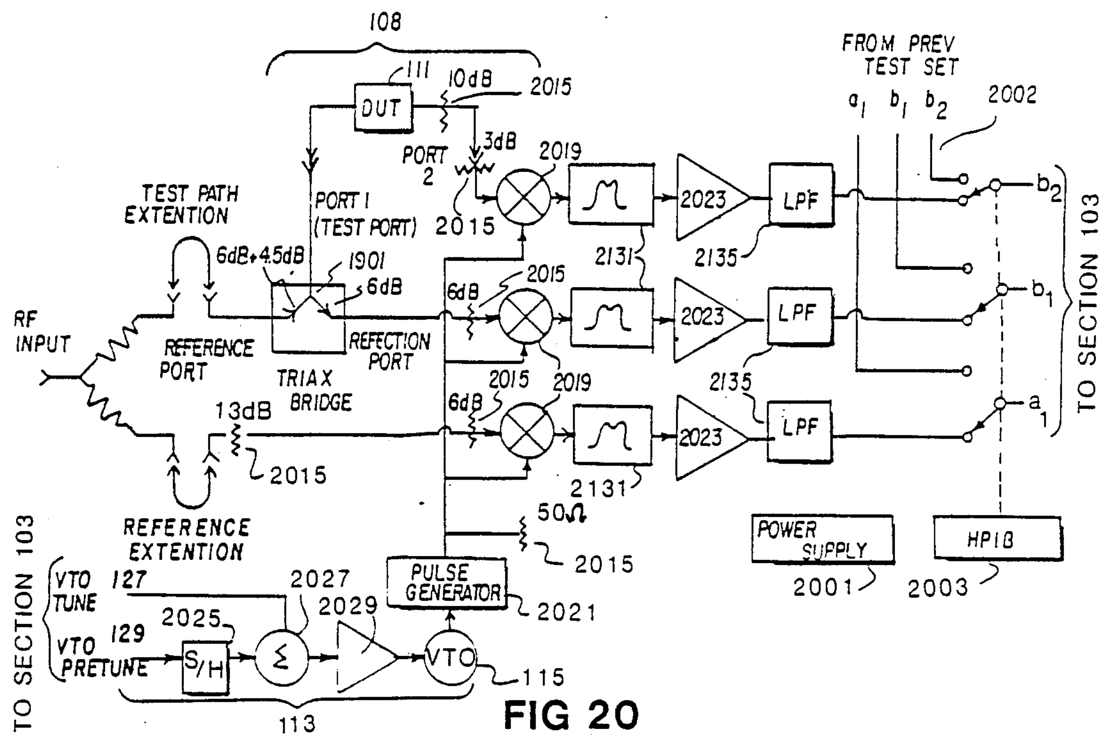
FIGS. 20 through 23 show detailed block diagrams of four test sets as shown in FIG. 1.
Figure 22:
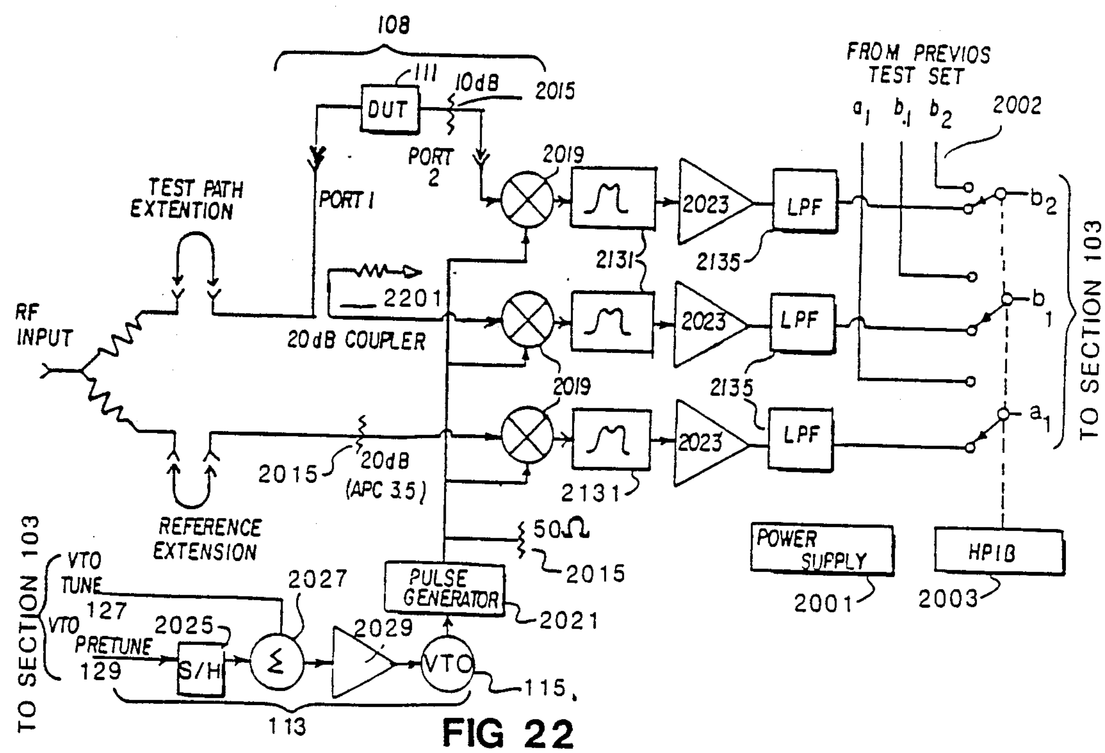
Figure 23:
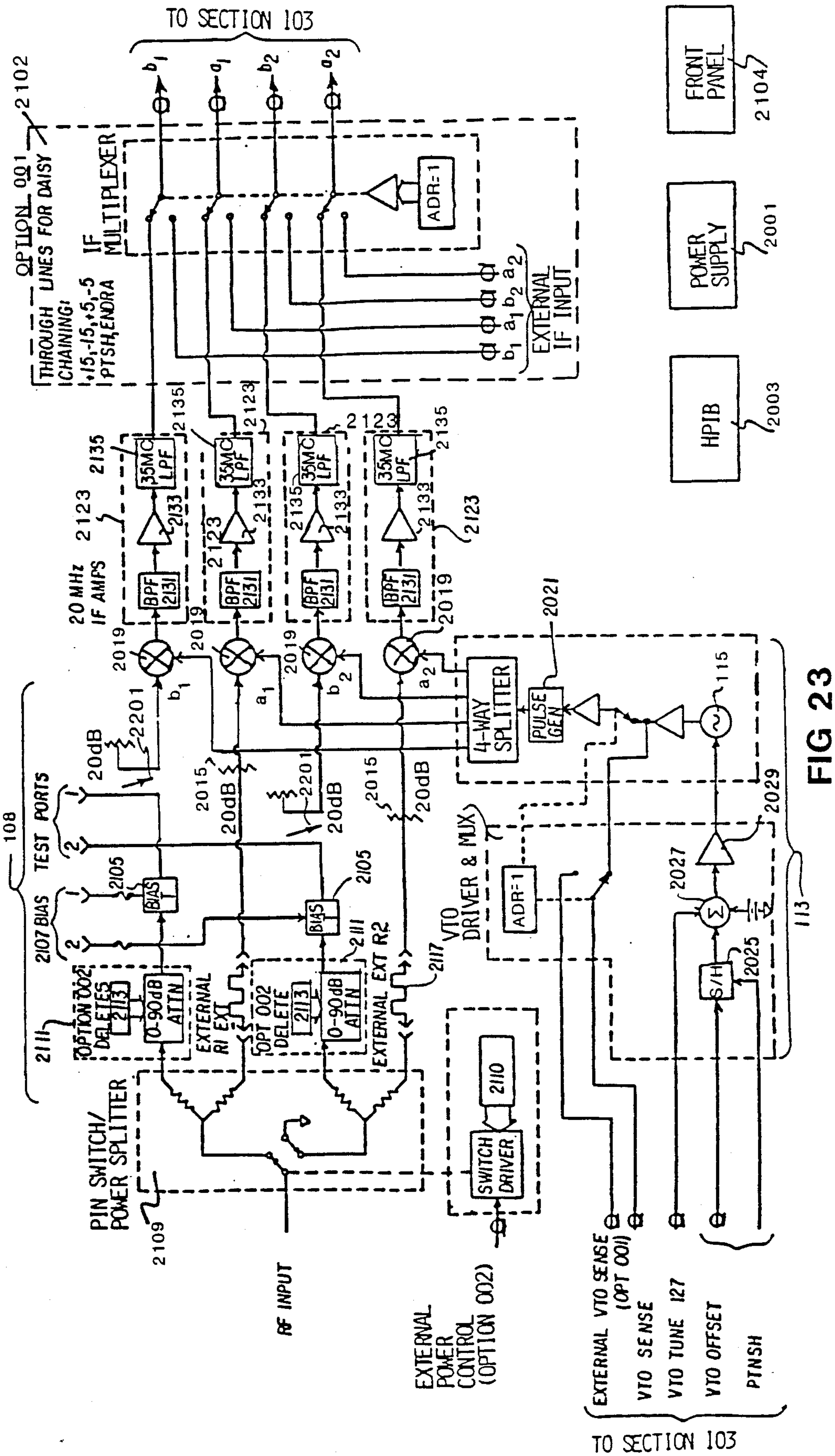

The wideband test sets 107 include a high performance RF triaxial directional bridge 1901 as described in U.S patent application Ser. No. 06/568,986 entitled "RF Triaxial Directional Bridge" filed Jan. 9, 1984 by Botka et al. and shown in FIGS. 19*a* and 19*b* coupled to each of the DUT ports 1 and 2 as shown in FIGS. 20 and 21. The directional bridge 1901 is a balanced Wheatstone bridge 1903 that extracts a floating vector signal for measurement in a single ended detector system without disturbing the balanced configuration. Included in this high performance RF directional bridge 1901 is a combination reference load and balun 1905 which provides signal separation over the entire frequency range from 45 MHz to 26.5 GHz, and also permits the application of a DC bias as part the RF input $V_{in}$ to the DUT 111 via a conventional RF bias tee 2105. In contrast, the narrower band test sets 107 as shown in FIGS. 22 and 23 utilize a conventional directional coupler 2201 for each port to cover the frequency range of 0.5 to 18 GHz. By incorporating the signal separation devices 108 in the test sets 107, broadband vector measurements are made possible with just one connection of the DUT 111 between port 1 and port 2.

Figure 21:
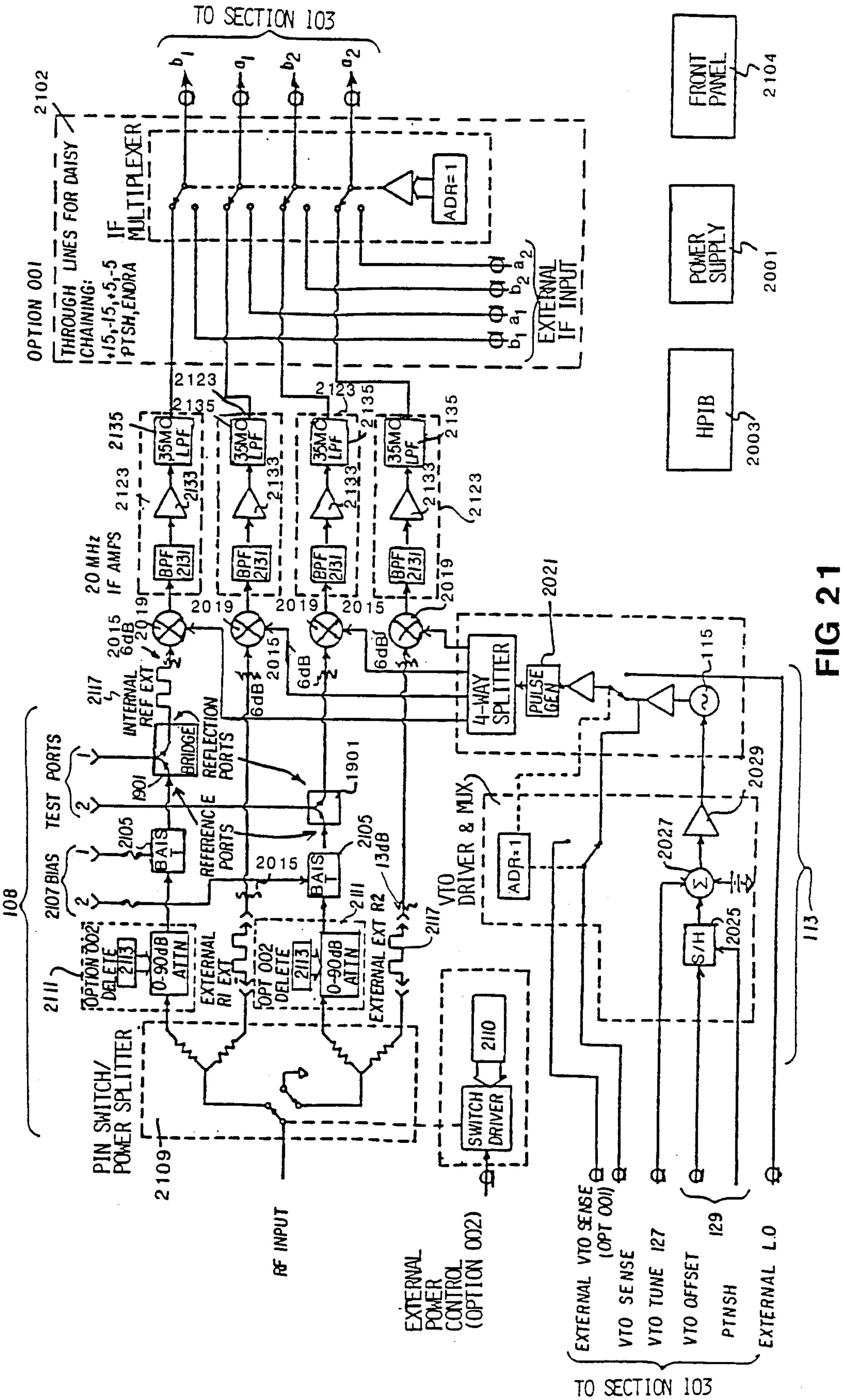

Each of the test sets 107 contains its own built in power supplies 2001, to simplify various system configurations and each of the test sets 107 has its own HP-IB interface 2003, coupled to the system bus 145 in order to provide control and identification to the main analyzer 101. Each of the test sets 107 is connected respectively to section 103 via a first IF multiplexer 2002 or 2102 to provide daisy chaining of several test sets. The first IF multiplexer 2002 and 2102 are in turn connected respectively to the a1, b1, and b2 connections for the reflection/transmission test sets in FIGS. 20 and 22, and the a1, a2, b1, and b2 connections for the S-parameter test sets in FIGS. 21 and 23. The S-parameter test sets also include: front panel indicators 2104 (i.e., lights 490 and 492 in FIG. 4) to signal the active test port, a conventional bias tee 2105 on each of the test channels to provide voltage bias 2107 needed in the testing of active devices, PIN diode transfer switches 2109 under control of the main analyzer 101 via the system bus 145 and a switch interface 2110 for switching the RF input between the ports 1 and 2, and variable attenuators 2111 under control of the main analyzer 101 via the system bus 145 and an attenuator interface 2113. Various RF pads 2015 and test and reference extentions 2117 are provided to adjust and balance the RF power levels.

Each of the test sets has a frequency converter 113 to provide the first IF conversion of the RF signals in immediate proximity to the RF input and the test ports. Within the frequency converters 113 are the VTOs 115, the first IF samplers 2019, pulse generators 2021 to drive the first IF samplers 2019, and first IF amplifiers 2023 and 2123. The first IF amplifiers 2123 also include an input band pass filter 2131, a filter amplifier 2133, and an output low pass filter 2135 to provide additional signal shaping. Each of the VTOs 115 is driven by a sample/hold circuit 2025, a summing node 2027, and a buffer amplifier 2029 coupled to the phase lock circuitry 125 in section 103.

FIGS. 24.1A through 24.33 show the detailed schematics for the circuitry associated with the test sets 107 as shown in FIGS. 20 through 23. FIGS. 24.1A through 24.4 show the front panel indicators 2104, FIGS. 24.5A through 24.8 show the first IF multiplexers 2002 and 2102, FIGS. 24.9A through 24.14 show the VTO 115 and related drivers, FIGS. 24.15A through 24.20 show the HP-IB interface 2003, FIGS. 24.21 through 24.25 show the attenuators 2111 and the PIN diode switch 2109, FIGS. 24.26A through 24.28 show the first IF samplers 2019 and the first IF amplifiers 2023 and 2123, and FIGS. 24.29 through 24.33 show the test set power supplies 2001.

Second IF

A detailed block diagram of the second IF/detector section 103 as shown in FIG. 1 is illustrated in FIGS. 25.1A through 25.6. After the signals $a_1$, $a_2$, $b_1$, and $b_2$ have been converted to the second IF frequency by the second IF mixers 138, the resulting signals $a_1'$, $a_2'$, $b_1'$, and $b_2'$ are sent to the second IF MUXs 136 as shown in FIG. 25.2. A 100 KHz calibration frequency 2501 produced by clock 119 and a ground input 2502 are also sent to the second IF MUXs 136 so that the second IF channels can be automatically calibrated for both gain and offset errors. This automatic calibration is performed by individually measuring the vector gains of the four cascaded 12 dB amplifiers that make up the amplifiers 2503 each to within 0.001 dB with the help of the ADC 139. Offset errors are removed by applying the ground input 2502 to the MUXs 136, turning off all gain in the amplifiers 2503, and measuring the resulting signal with the ADC 139 for each of four phase offsets (i.e., 0, 90, 180, and 270 degrees) of the synchronous detectors 131 and 133, thus rotating the measurement plane used in the synchronous detectors 131 and 133. This change in phase offset and rotation of the measurement plane in the synchronous detectors 131 and 133 is accomplished by adjusting the phase angle of the demodulating signal used for synchronous detection by means of the adjustable phase shifters 2505 as shown in FIG. 25.3.

Referring to FIGS. 26.1 through 26.6 it can be seen that the true values of X and Y can be determined from the measured values of $X_m$ and $Y_m$ from the equation shown in FIG. 26.2. First, the offsets $X_0$ and $Y_0$ are determined by grounding the input of MUX 136 as shown in FIG. 26.1, turning off all gains $G_1$, $G_2$, $G_3$, and $G_4$, and measuring $X_m$ and $Y_m$ for each of four phase offsets 0, 90, 180, and 270 degrees. $X_0$ and $Y_0$ are then calculated by the relationship shown in FIG. 26.3. H is determined by selecting the calibration signal 2501 and turning on the gain $G_4$. $X_m$ and $Y_m$ are then measured for each of the four phase offsets and the offsets $X_0$ and $Y_0$ are subtracted. H can then be calculated using the four quadrature relationships shown in FIG. 26.4 and performing a least squares error fit to each of the four measured data points as shown in FIG. 26.5, where A is the level of the calibration signal 2501, the X and Y terms correspond to $X_m-X_0$ and $Y_m-Y_0$, and Sigma is the summation of the four quadrature measurements. Determining the gain and phase of the four amplifiers $G_1$ through $G_4$ requires that each be independent of one another since $H=G_1*G_2*G_3*G_4$. First with only $G_1$ on, $X_m$ and $Y_m$ are measured for each of the four phase offsets and a corrected X' and Y' are calculated using the correction coefficients previously determined during the offset correction. Using the equations shown in FIG. 26.6 the complex gain (a+jb) can be calculated that will best translate the four X' and Y' data points into the quadrature relationships shown in FIG. 26.4 The measurement of $X_m$ and $Y_m$ and calculation of $a_1$ and $b_1$ as above is repeated sequentially with each of the amplifiers $G_2$, $G_3$, and $G_4$ on one at a time.

Figure 27:
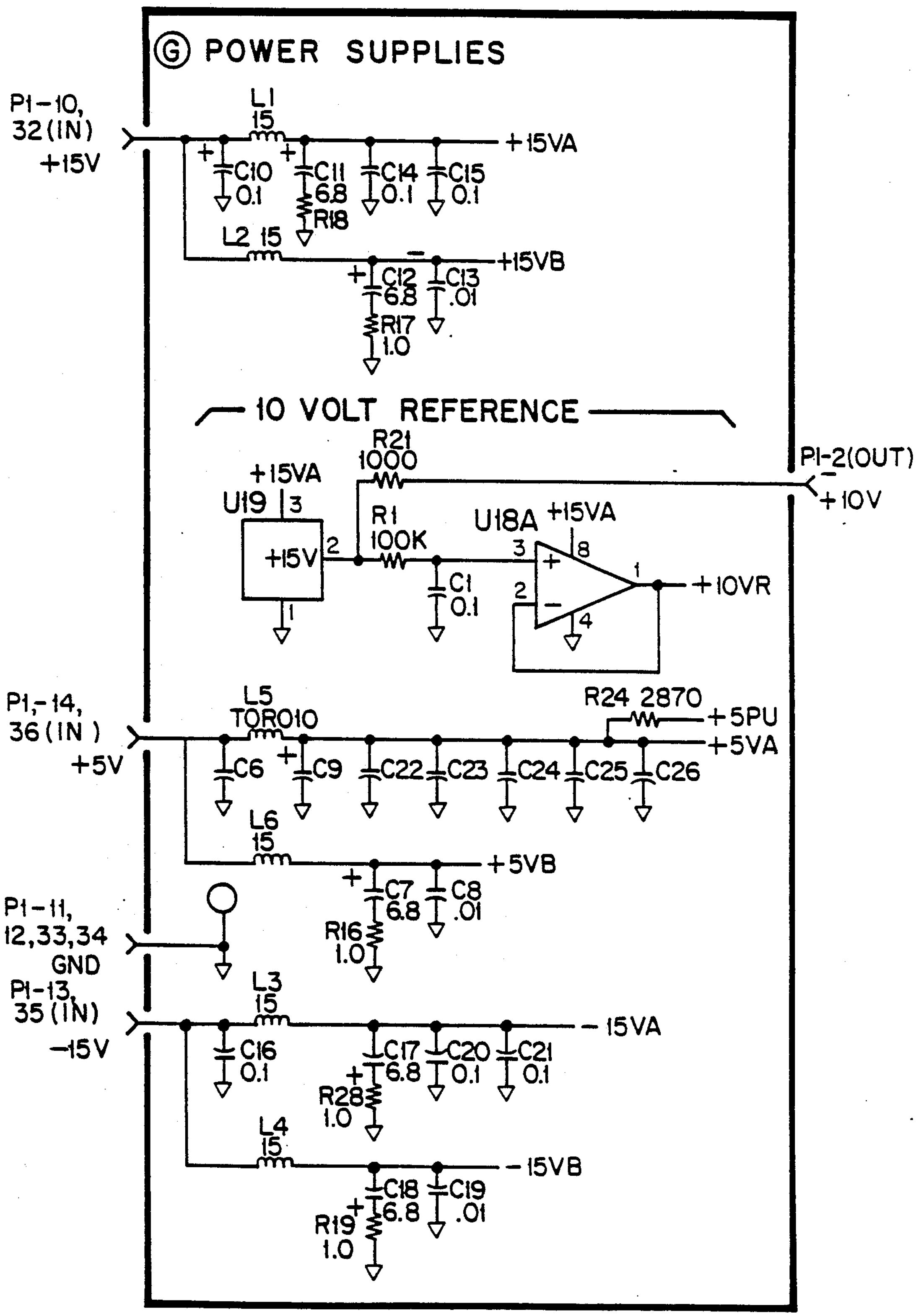
FIGS. 27.1A through 27.58B and 27.60A through 27.93 show the detailed schematics for FIGS. 25.1 through 25.6.
Figure 27:
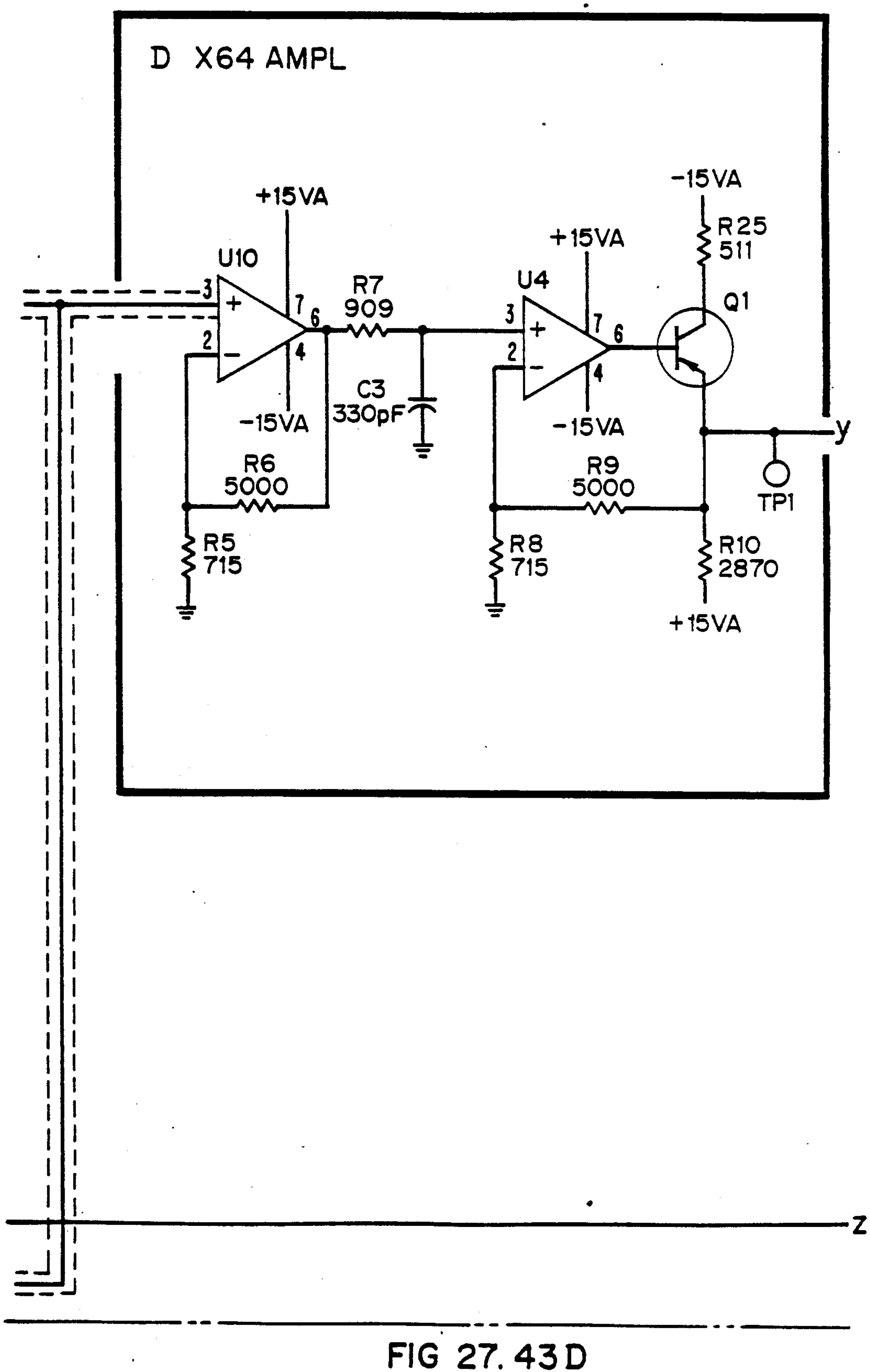

FIGS. 27.1A through 27.93 show the detailed schematics for the block diagrams shown in FIGS. 25.1A through 25.6. FIGS. 27.1A through 27.7 show the clock 119, FIGS. 27.8A through 27.12 show the 19.9 MHz local oscillator 2511, FIGS. 27.13 through 27.16 show the second IF mixer 138, FIGS. 27.17A through FIG. 27.27 show the second IF amplifiers 134, FIGS. 27.29 through 27.33 and FIGS. 27.82A through 27.85 show the regulators used in section 103, FIGS. 27.34 through 27.39 show the sample/hold amplifiers 137, FIGS. 27.40A through 27.57 show the ADC 139, FIGS. 27.58A through 27.64 show the IF counter 2513, FIGS. 27.65A through 27.70 show the VTO pretune circuitry 2515, FIGS. 27.71A through 27.76 show the main phase lock circuitry 2517, FIGS. 27.77 through 27.81 show the processor interface 145 to section 103, FIGS. 27.86A through 27.89 show the front panel circuitry 159 for section 103, and FIGS. 27.90A through 27.93 show the synchronous detectors 131 and 133.

Software Signal Processing

Figure 28:
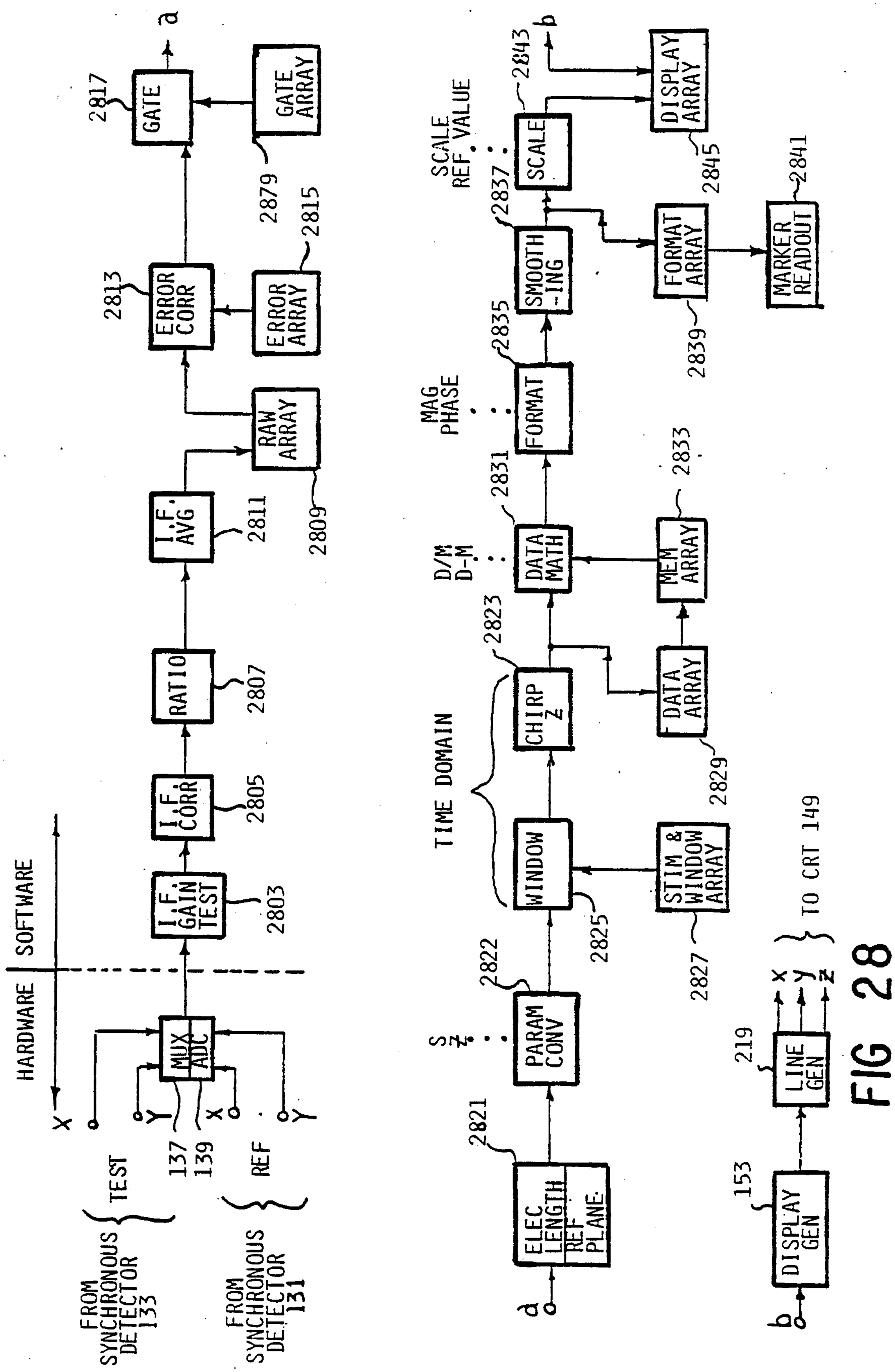
FIG. 28 shows the software signal processing flow used in the present invention.

As shown in the software listing in said U.S. Pat. No. 4,636,171 Appendix B and in figure 28, signal processing in the present invention begins at the output of the synchronous detector pair 131 and 133 which provide the real (X) and imaginary (Y) parts of the test and reference signals. As explained previously, offset, gain, and quadrature errors are corrected for both of the IF/detector chains via software which is arranged as blocks IF gain test 2803 and IF Correction 2805. The resulting test and reference data is then ratioed in block 2807 to produce the appropriate S-parameters and stored in the Raw Array 2809. If requested by the user, subsequent data taken at the same frequency are averaged together in the IF Averaging block 2811 to lower system noise and thus enhance dynamic range.

While the Raw Array 2809 is continually filled under control of the data acquisition software which will be discussed shortly, the data processing software concurrently removes data from the Raw Array 2809 and performs additional signal processing. Using a one term model (vector frequency response normalization), a three term model (one port model), and up to a twelve term error correction model (comprehensive two port) of the microwave measurement hardware, the Vector Error Correction software 2813 in conjunction with the Vector Math Processor 151 provides corrected data through application of the Error Array 2815 to the Raw Array. Further data manipulation are provided as desired by the user through Gating 2817 along with the separate Gate Array 2879, Electrical Length/Reference Plane Extension 2821, and Parameter Conversion 2822. The corrected data may also be converted from the frequency domain to the time domain using Chirp Z transforms. Windows 2825 and Window Array 2827 are used to remove the ringing in time domain due to band limited frequency domain input signals and then using the Chirp Z transforms 2823 to transform into the time domain. The data in the Data Array 2829 may be stored into memory in the Memory Array 2833 and used in vector computations with data from a second device. Comparisons of present data (D) and memory data (M) is accomplished through vector computations to provide all four mathematical functions of D*M, D/M, D+M, and D−M. Storage of the corrected and processed data D in the Data Array 2829 and the trace math data M in the Memory Array 2833 allows rapid response to the user when making format or trace math changes.

The vector data is then formatted in the Format block 2835 into magnitude, phase, group delay, or other formats as desired. Adjacent formatted points can then be combined if desired in the Smoothing block 2837. The resulting formatted data is stored into the Format Array 2839 which provides convenient access for scale and offset changes provided by the Scale block 2843. Markers are also applied as desired to the formatted data via the Marker Readout block 2841. Scaled data is stored in a Display Array 2845 in the Display Ram 217 from which the display genertor 153 hardware repetitively creates a plot on the CRT 149 for a flicker-free display.

Input and output access is provided to and from all of the arrays via the HP-IB interface 157 and via tape 161 with S-parameters available from the Data Array 2829 in addition to other applicable arrays. Direct printer output for the printer 155 is made from the Format Array 2839. Direct plotter output for plotter 155 is made from the Display Array 2845. The user may also trade off the data update rate against the number of data points used by selecting resolutions from 51 to 401 points.

The software is structured as a multi-tasking system to provide a rapid data update rate by allowing data processing to take place when the data acquisition software is not busy. Overlying command and control tasks interleave data processing with data acquisition cycles to provide both two port error correction and dual channel display modes.

Figure 29:
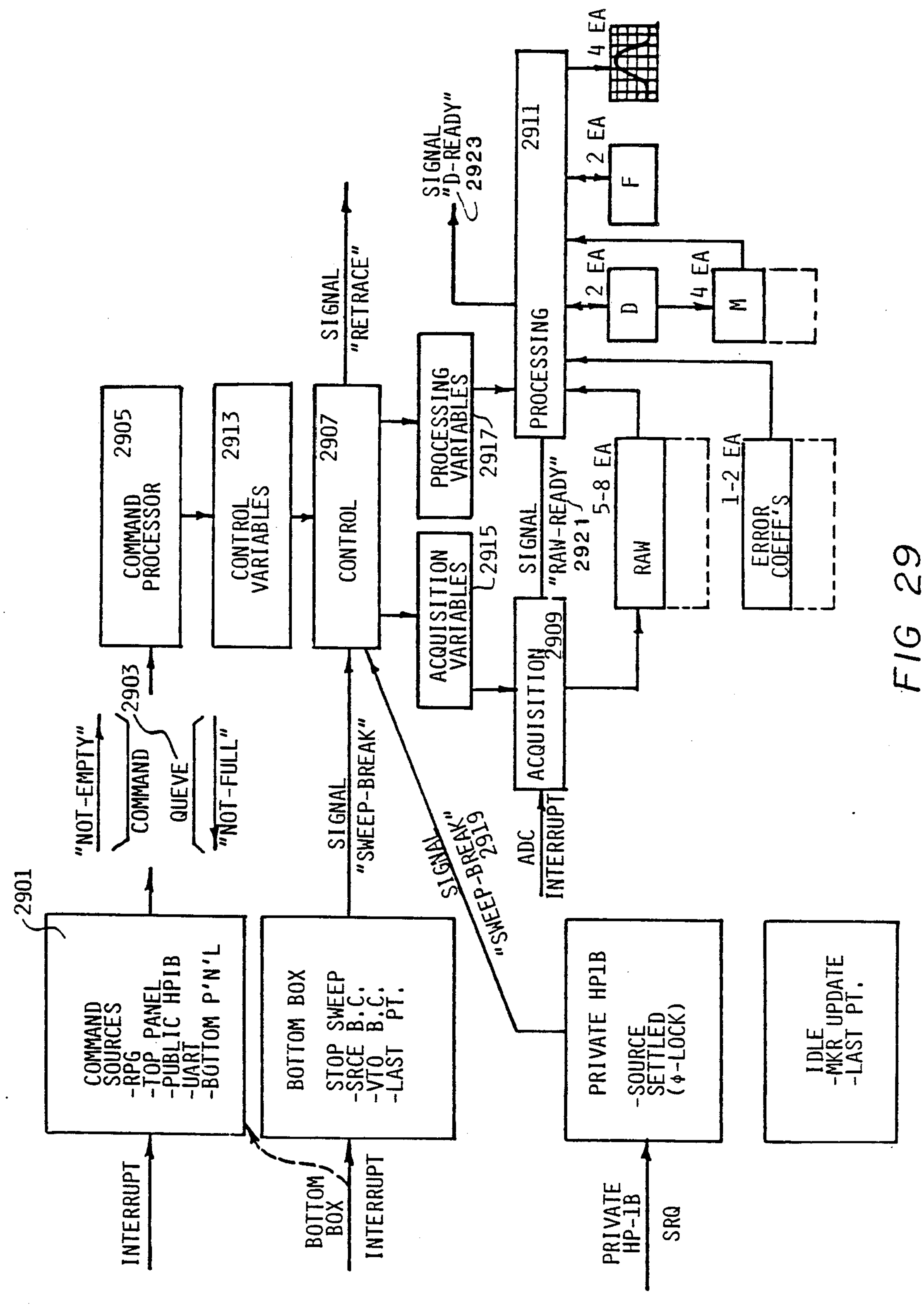
FIG. 29 shows the software process controller for use in the preferred embodiment of the present invention.

The software signal process discussed previously is controlled by a process structure as shown in FIG. 29. This process structure is one of the reasons the present invention can process RF data essentially in real time. For example, low priority processes such as controlling the source 109, controlling the test set 107, and formatting the display 149 are only performed when the data acquisition process is not busy. Previous systems would take data, process it completely through to the display and when the end of each sweep is reached, the processor had to wait for the hardware to reset. Instead, the present invention actually performs processing while the control functions such as resetting for a subsequent sweep or while switching S-parameter are proceeding. The Command Sources 2901 accept user commands via the front panels 159 and the HP-IB interface 157, parses and converts the commands to a common internal command token regardless of source and puts the commands into a command queue 2903. The Command Processor 2905 takes the commands from the command queue 2903 and implements them. Any one time precomputation that will later improve run time efficiency is done at this time. The Command Processor 2905 modifies the instrument state and performs one time operations, such as updating a trace after a scale change, outputting an array of data, and copying the Data Array into the Memory Array. Based on the instrument state, Control 2907 is responsible for insuring that the desired data is acquired in the specified manner and conditions. This includes control of source 109, test set 107, phase lock 125, IF multiplexers 136, ADC 139, and set up of the data acquisition and processing. Swept and stepped, alternate and chopped, single and continuous signal sweeps are implemented within Control 2907. Sweep maintenance is also managed in the Control 2907 to keep track of bandcrossings and frequency stepping. Acquisition 2909 services the ADC 139 interrupt, IF gain autoranging, ratioing, averaging and storing data into the Raw Array 2809. Processing 2911 processes data from the Raw Array 2809 until the data is displayed on the CRT 149 including vector error correction of external errors, parameter conversion, time domain processing (gating and transformation), trace math (D*M, D/M, D+M, D−M), formatting (log, linear, and delay), and response (scale, reference value, and split screen).

The machine state variables that are used to derive control variables 2913 include: parameter descriptions such as test set set-up, receiver set-up, and ratio/non-ratio; user selections for frequency, power, sweep time, formats, scale per division, averaging information, number of points to be taken, error correction type, and time domain factors; and, internal housekeeping pointers to the data, raw, error coefficients, corrected data, formatted data, memory data, and display data arrays. Acquisition variables 2915 provide data reduced from the control variables 2913 for efficiency that are related to controlling the ADC 139 until the data is stored in the raw array. The Acquisition variables 2915 include: IF gain, receiver error, ratioing, averaging, and current pointer position in the raw array. The Processing variables 2917 provide data reduced from the group control variables for efficiency that are related to controlling the processing of data from the raw array through the display. The Processing variables 2917 include: current position pointers for the arrays, error correction type, time domain information, trace math, format, and response. The Signals 2919 provide synchronization between programs that otherwise function independently of one another.

Several of the software functions previously mentioned will now be discussed. In stepped sweep, Averaging 2811 computes the linear average of a block of data points taken while the frequency is held fixed. This is repeated for each frequency in the stepped sweep. In swept frequency sweeps Averaging 2811 computes the weighted exponential running average of the synchronous incoming data, and therefore decreases the input noise bandwidth, thereby reducing noise and extending dynamic range. Each time Averaging is restarted the averaging starts with a small averaging factor, increasing it every one to eight sweeps to the selected averaging factor, thus allowing fast convergence to the final value. Smoothing 2837 on the other hand operates on processed data by providing a linear moving average of adjacent data points as a percentage of the display. The result is like a video filter, reducing peak to peak noise such as on a baseline trace, but not improving the dynamic range of the signal. In addition, smoothing in the present invention has a novel use for group delay measurements. Group delay (i.e. $t_g$=change in phase in degrees/(360 degrees * change in frequency in Hertz) is a differential measurement and unfortunately noise is therefore emphasized. Classically the frequency over which the group delay measurement is made, called aperture, is therefore increased to provide a more useful group delay measurement. In the present invention, this same result is achieved by smoothing the processed group delay data. Thus, smoothing (i.e., averaging of adjacent data points) of group delay data achieves the same effect as is achieved by utilizing a classical variable group delay aperture. This also allows a phase change greater than 180 degrees across the aperture when smoothing is applied to 3 or more adjacent data points.

The RF vector error correction in the present invention also is adapted to speed and facilitate calibration. Measurements are data 2809 is stored in the Error Array 2815. Many different types of calibration standards can be used including the open-load-short approach as used in coaxial connectors, offset-short-load approach as used in waveguide technologies, and multiple offset shorts as used in microstrip devices. The calibration standards need not be used in any particular order since all data is stored digitally, and the display format which is updated in real time even during calibration, can be changed at any time without effecting the calibration itself. IF Averaging can also be used during calibration since Averaging operates on the Raw Array 2809. Multiple fixed and sliding loads as desired can also be utilized. Since the correction data sets themselves are stored in memory, several correction data sets can be stored in the machine at one time (e.g., different correction data sets can be stored for different S-parameters and correction data sets over different frequency ranges can be stored for the same S-parameter). Because of the trace math 2831 and the memory array 2833, both corrected and uncorrected traces can be viewed and used at the same time.

Gating 2817 is used to look at certain portions of the display as specified by the user. Gating can be used either in the time or frequency domains and provides a gate through which the data can be viewed. This gate is selected by setting a center time and a span (or a start time and a stop time) about which to view the displayed data. When gates are desired, rather than removing time domain data outside of the gate from the data being used to calculate the displayed data, in the present invention the frequency domain shape of the gate is calculated and convolved directly with the incoming frequency data as a frequency operation. The result is that no data is eliminated from within the gated region, and when the frequency to time transformation is performed there is no problem with undersampling of the bandlimited time data. The result is that the gated time domain data maintains its full spectrum of information and can be transformed back into the frequency domain if so desired, without loss of information. Thus, even though the user can perform the setting of gates while viewing the time domain data, the actual gating is performed in the frequency domain by means of convolution.

Electrical delay and reference plane extension 2821 are used, respectively, to change the electrical delay, for example in order to measure the electrical delay of an air line or to move the measurement plane used in S-parameter measurements to other than the physical plane of the test set ports 1 or 2. Although both electrical delay and reference plane extension are both defined in units of time (i.e., plus or minus up to 100 seconds) and both use the same mathematical formula, electrical delay varies per parameter while reference plane extension varies per port. An equivalent readout in distance is made along with the electrical delay.

Time Domain Processing

The usual microwave DUT 111 consists of multiple elements with transmission line sections in between. When tested using conventional frequency domain techniques, a composite response is generated. The specific discontinuities cannot be examined individually. In the time domain, the present invention takes its normal frequency domain data and applies for the first time the little known Chirp Z transform, as described by Rabiner and Gold in "Theory and Application of Digital Signal Processing", pages 393–398, 1975, to convert from the frequency to the time domain. Prior time transform methods have usually used a conventional fast Fourier technique which required the application of harmonically related frequency inputs and in which the entire frequency window is transformed into the entire time window. For example, when a 10 nanosecond wide time window is viewed with 101 data points, each data point is separated by only 0.1 nanoseconds and any attempt to view only a portion of the data in the 10 nanosecond wide time window suffers from the availability of only a few data points. This can be overcome by taking more data points, but at a drastic reduction in speed. Other workers have instead used the classical complete Fourier series expansion of the frequency data to achieve an arbitrary number of viewable data points, but such a method is extremely slow, requiring several minutes to do the necessary calculations. As with the complete Fourier series expansion, the Chirp Z transform also provides an arbitrary number of data points for viewing in any given time window, but this transform can be calculated in less than one second.

The present system provides two time domain operating modes. The first is called low pass and is used to simulate the traditional time domain reflectometer (TDR) but using the Chirp Z transform. Like the traditional TDR, low pass requires harmonically related frequency data from DC, which is extrapolated from the lowest available frequency data point to the maximum frequency available. Low pass provides the fastest rise time and best time domain resolution and may be used with either step or impulse excitation. By taking the integral of the low pass impulse response, the response of stimulating the DUT with a step is generated. The second time domain operating mode is called band pass and may be used in any frequency span without the need to include DC. Because of the use of the Chirp Z transform, band pass mode does not require harmonically related frequency data, but only requires excitation frequency steps of equal size (e.g., 10 MHz steps across a span of 1 to 2 GHz). Band pass mode is used for either reflection or transmission measurements, typically on bandlimited devices and only impulse excitation may be used.

Figure 30A:
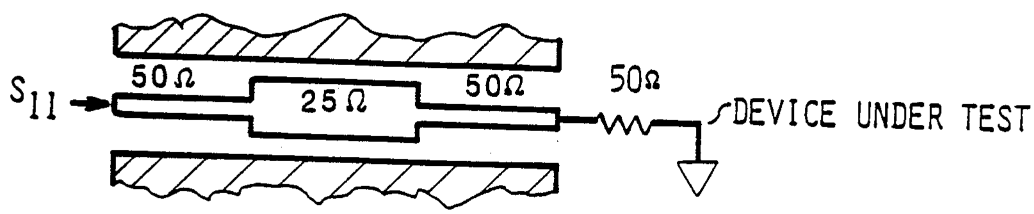
FIGS. 30*a* through 30*e* show the time domain modes used in the present invention.
Figure 30B:
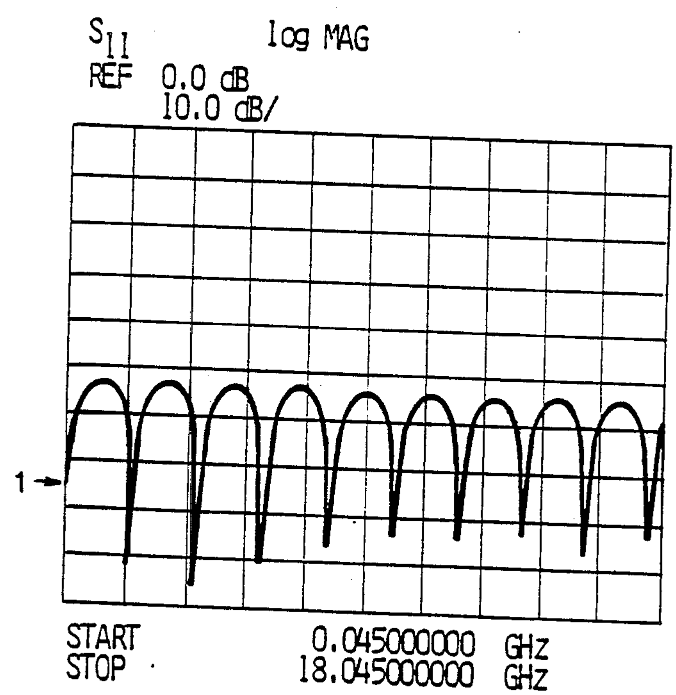
Figure 30C:
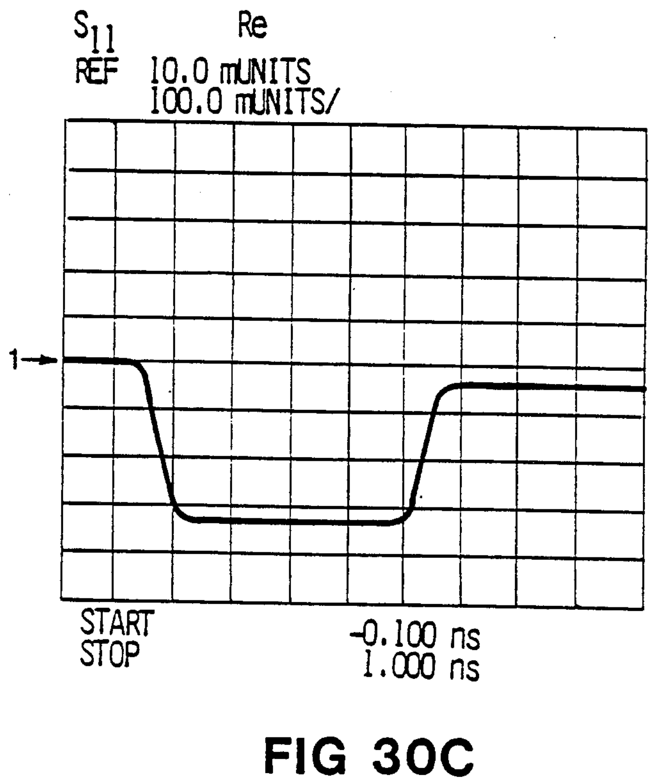
Figure 30D:
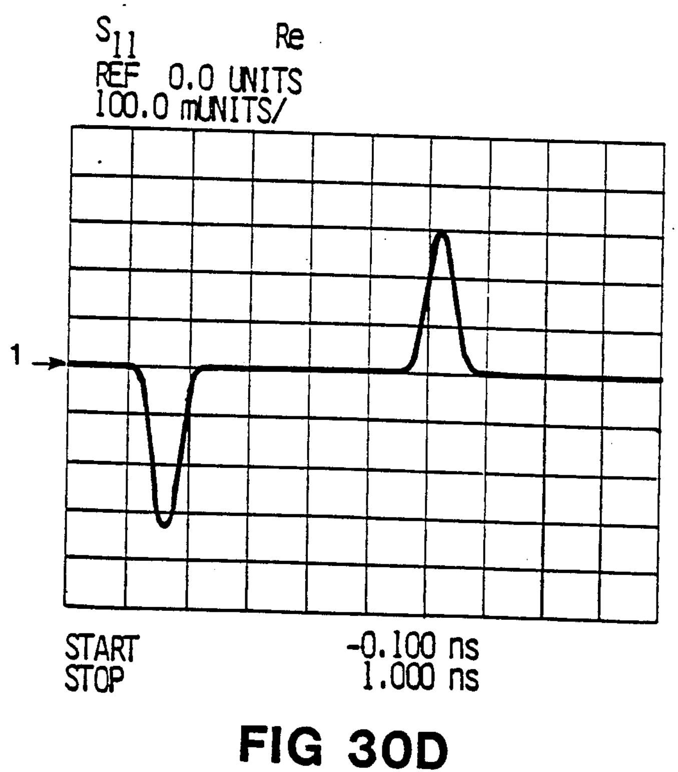
Figure 30E:
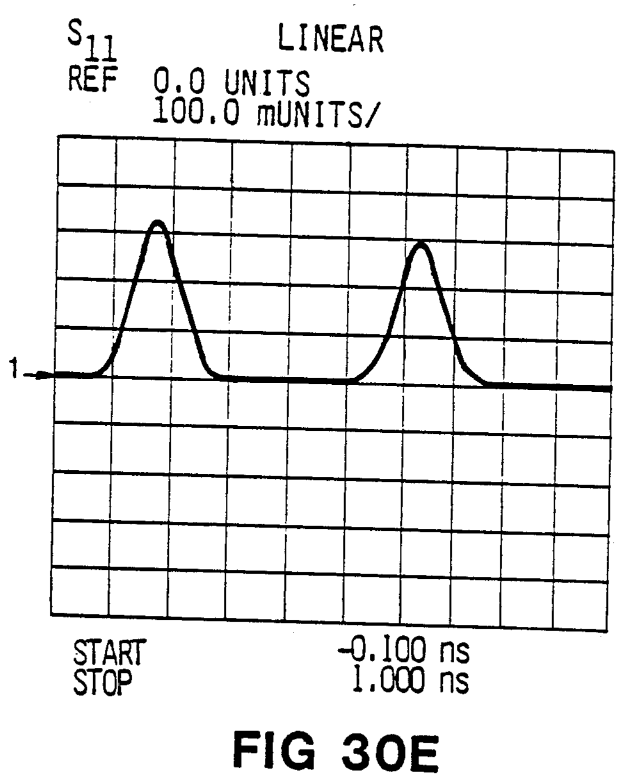
Figure 31A:
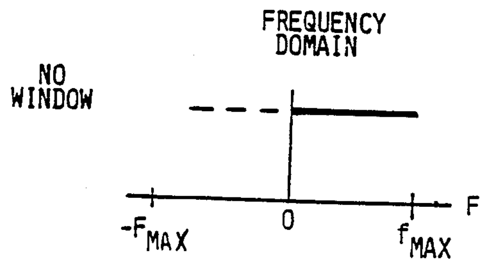
FIGS. 31*a* through 31*d* show the effect of windowing on time domain data.
Figure 31B:
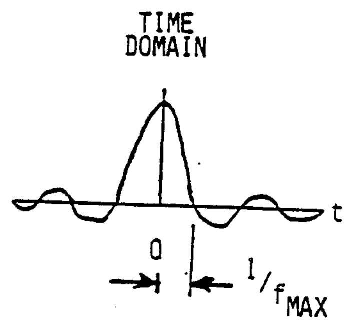
Figure 31C:
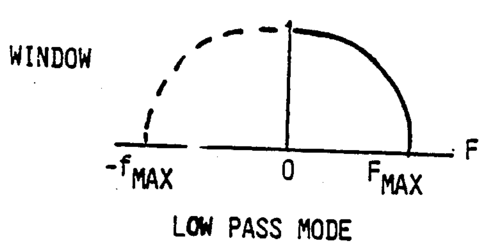
Figure 31D:
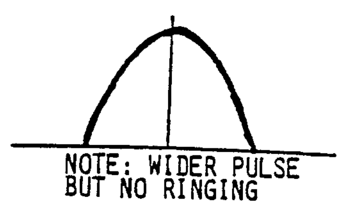

An illustration of the low pass and band pass modes and the excitations used is shown in FIGS. 30*a*–30*e*. The frequency domain response for the DUT as shown in FIG. 30*a* is shown in FIG. 30*b*, while a time domain low pass mode step excitation is shown in FIG. 30*c*, a time domain low pass mode impulse excitation is shown in FIG. 30*d*, and a time domain band pass mode impulse excitation is shown in FIG. 30*e*. Since there is an upper frequency limit to the data, and at that limit, an abrupt transition occurs from data to no data, time domain responses are subject to ringing and overshoot called the Gibbs phenomena. Ringing interferes with a user's ability to distinguish between two closely spaced real device responses and also creates confusion in separating actual and data reduction produced responses. The present invention provides a window capability (not to be confused with gating) to modify and filter the frequency domain data to reduce this ringing in a controlled way as shown in FIGS. 31*a*–31*d*. A Kaiser-Bessel window with three different levels of windowing, for three levels 0, 6, and 13 of the Kaiser-Bessel parameter, may be used to attenuate and roll off the higher frequency data, thereby trading resolution for ringing reduction, since the best rise time occurs at minimum (i.e., zero) windowing and the best sidelobe suppression occurs at maximum windowing. The minimum windowing provides sidelobes of −14 dB for minimum impulse stimulus width, the normal amount of windowing provides side lobes of −50 dB with an increase of a factor of two in the width of the primary response, while the maximum windowing provides side lobes of −90 dB with an increase of a factor of four in the width of the primary response.

Figure 32A:
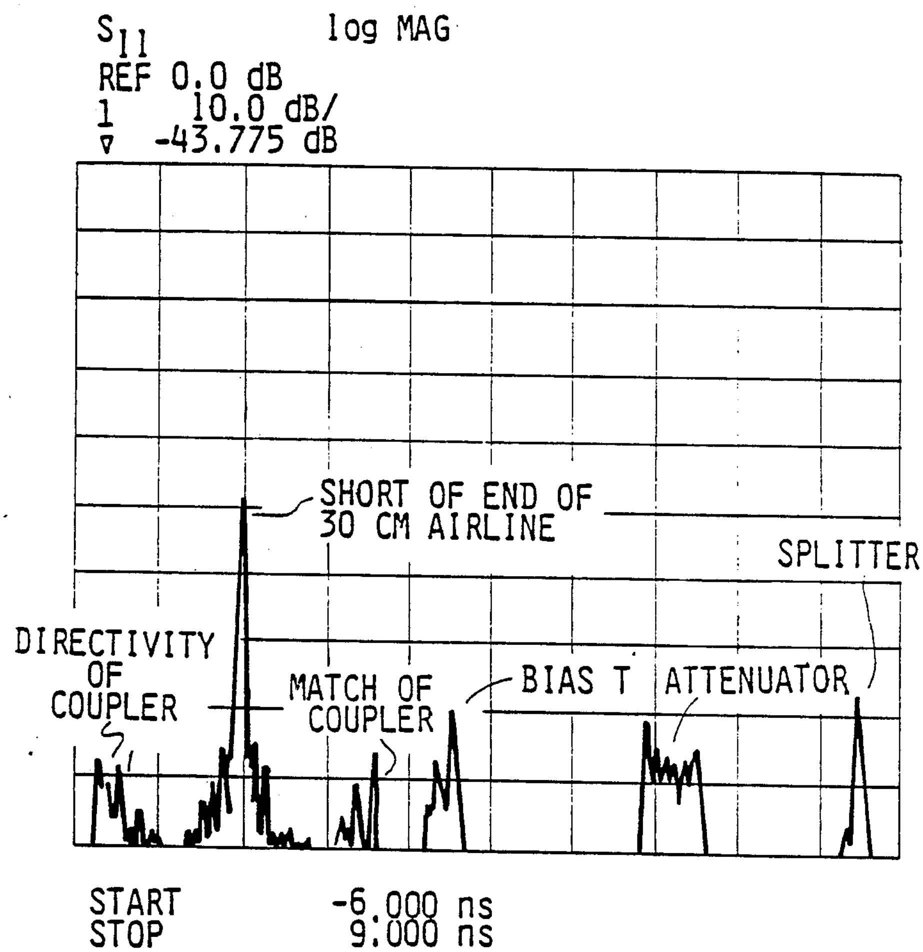
FIGS. 32*a* and 32*b* show a time domain response without and with vector error correction.
Figure 32B:
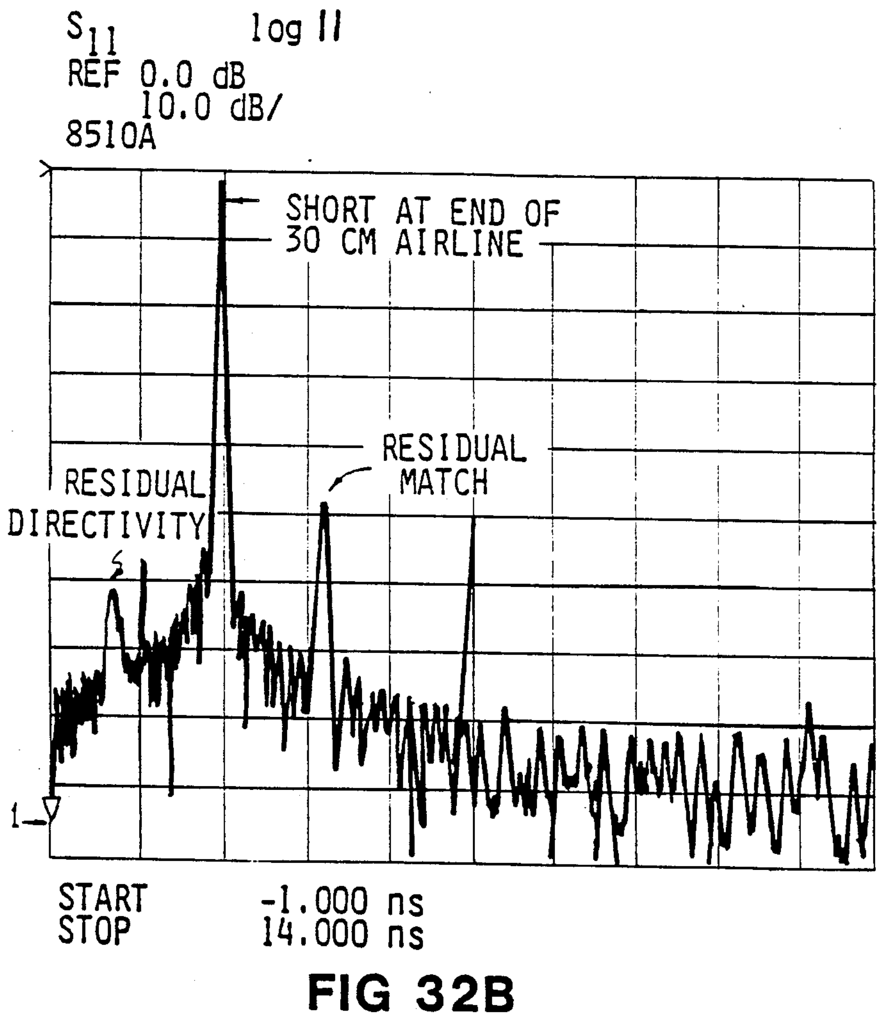

The ability to make vector error corrected measurements has a significant effect on the quality of the time domain presentation. An example of this is shown in FIGS. 32*a* and 32*b*, contrasting time domain measurements of a short at the end of thirty centimeters of airline without and with correction, respectively. Equivalent source match of the coupler is increased to 40 dB and equivalent coupler directivity is raised to well over 50 dB.

Figure 33A:
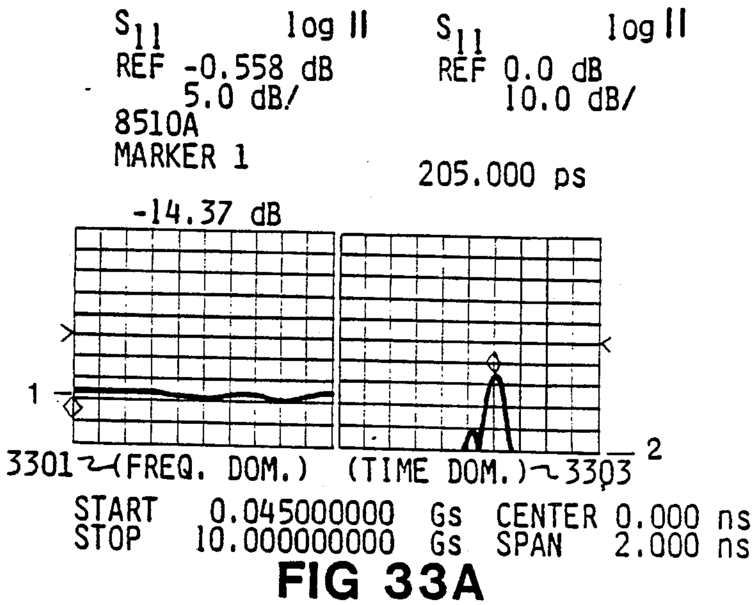
FIGS. 33*a* through 33*d* show the effect of gating on time domain data in the present invention.
Figure 33C:
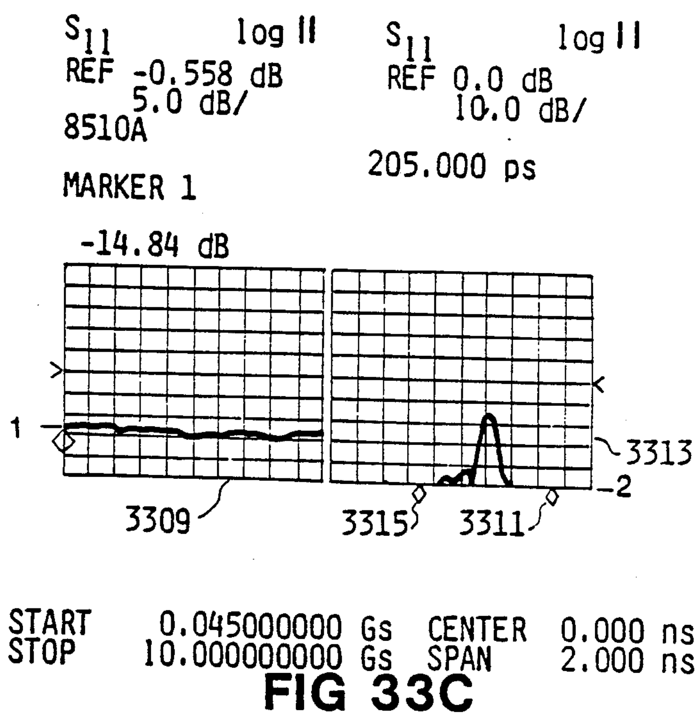
Figure 33B:
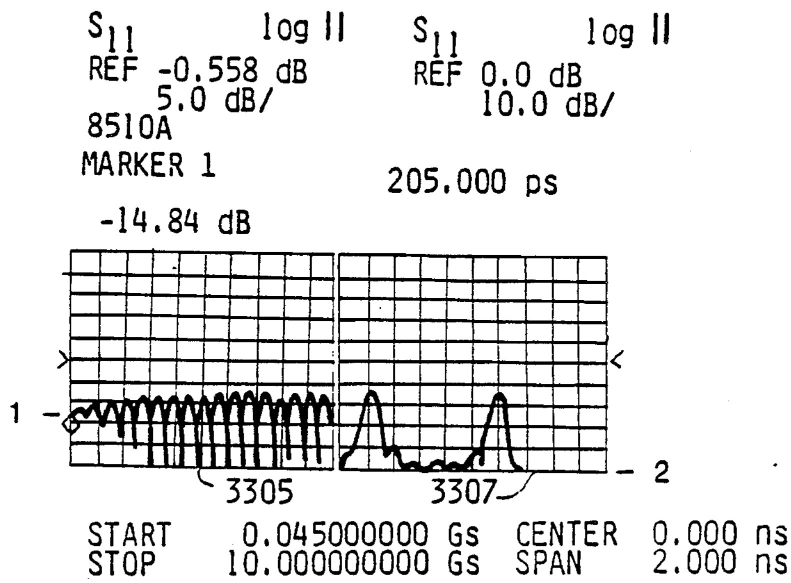
Figure 33D:
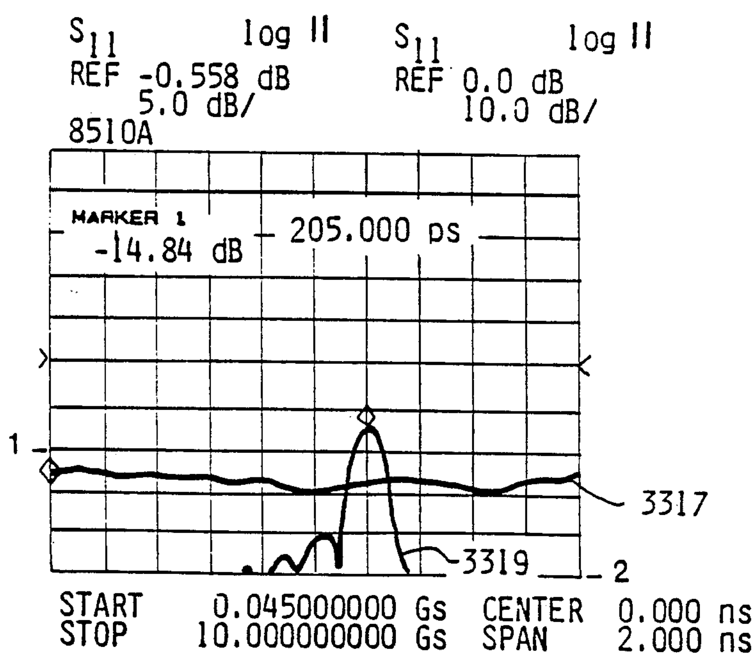

As mentioned previously, gating is a further powerful feature of the time domain capability in the present invention and is illustrated in FIGS. 33*a*–33*d*. FIG. 33*a* shows a split screen view of the frequency and time display 3301 and 3303 with gating for a 1.5 standing wave ratio (SWR) load. FIG. 33*b* shows the effect of adding in a reactive mismatch of 12 dB creating a large ripple effect in the frequency domain 3305. FIG. 33*c* shows the effect of gating around the load, highlighted with markers 3311 and 3315. Note the high degree of comparison between the frequency domain data 3309 in FIG. 33*c* with the data 3301 in FIG. 33*a*. FIG. 33d shows this same data from FIG. 33*c* with the traces 3309 and 3313 overlaid as traces 3317 and 3319 respectively.

We claim:

1. An RF network analyzer system for analyzing responses of a device under test (DUT) in real time to a stimulus of RF output signals from an RF signal source having a sweep system for automatically varying the RF signal source output frequency and for returning the RF signal source output frequency to an intitial start frequency, said RF signal source providing said RF output signals with at least one period of idle time, comprising:

IF converter means for being coupled to said RF signal source and said DUT, for simultaneously providing a plurality of parallel intermediate frequency analog output signals corresponding to a reference signal and at least one of a reflected signal and a transmitted signal from said DUT in response to said stimulus of RF output signals;

signal means coupled to said IF converter means for providing digital data acquisition points which are representative of both the real and imaginary parts of said intermediate frequency analog output signals, said coverter means providing said points at a speed high enough to achieve said analysis of DUT responses in real time;

distributed high speed processing means integrated into said RF network analyzer comprising;

central procesing means for calculating and storing S-parameters corresponding to characteristics of said DUT, substantially in real time based on said digital data acquisition points;

vector error correction means for providing corrections to data in substantially real time to remove systematic errors in said stored S-parameters;

Input/Output control means for processing and formatting commands to and from said central processing means;

and display means for calculating and storing display information based on said corrected data; and said central processing means operating in a multitasking systems environment for controlling at least one of said RF signal source, said IF converter means, said signal means, and said display means during said period of idle time.

2. A system as in claim 1 further comprising a dedicated high speed data bus for communication between said central processing means and said RF signal source and said signal means.

3. A system as in claim 1 wherein said vector error correction means comprises a separately functioning vector math processor means coupled to and controlled by said central processing means for providing said corrected data, said vector math processor means configured for manipulating said stored S-parameters as vector quantitites so that both real and imaginary parts of said stored S-parameters are operated on simultaneously to provide high speed calculation of said corrected data.

4. A system as in claim 1 wherein said display means comprises:

a visual display;

a display controller for manipulating said corrected data according to a set of stored instructions;

a display memory for storing said set of instructions.

* * * * *